(12) United States Patent
Kim et al.

(10) Patent No.: US 12,114,561 B2
(45) Date of Patent: Oct. 8, 2024

(54) PLURALITY OF LIGHT-EMITTING MATERIALS AND ORGANIC ELECTROLUMINESCENT DEVICE COMPRISING THE SAME

(71) Applicant: ROHM AND HAAS ELECTRONIC MATERIALS KOREA LTD., Chungcheongnam-do (KR)

(72) Inventors: Chi-Sik Kim, Gyeonggi-do (KR);
Soo-Yong Lee, Gyeonggi-do (KR);
Seung-Hoon Yoo, Gyeonggi-do (KR);
Dong-Hyung Lee, Gyeonggi-do (KR);
Tae-Jin Lee, Gyeonggi-do (KR)

(73) Assignee: Rohm and Haas Electronic Materials Korea Ltd. (KR)

( * ) Notice: Subject to any disclaimer, the term of this patent is extended or adjusted under 35 U.S.C. 154(b) by 555 days.

(21) Appl. No.: 17/287,953

(22) PCT Filed: Oct. 25, 2019

(86) PCT No.: PCT/KR2019/014106
§ 371 (c)(1),
(2) Date: Apr. 22, 2021

(87) PCT Pub. No.: WO2020/085829
PCT Pub. Date: Apr. 30, 2020

(65) Prior Publication Data
US 2022/0006019 A1  Jan. 6, 2022

(30) Foreign Application Priority Data

Oct. 26, 2018 (KR) .......... 10-2018-0129372
Oct. 24, 2019 (KR) .......... 10-2019-0132811

(51) Int. Cl.
*H10K 85/60* (2023.01)
*H10K 50/15* (2023.01)

(52) U.S. Cl.
CPC ......... *H10K 85/626* (2023.02); *H10K 85/622* (2023.02); *H10K 85/624* (2023.02); *H10K 85/636* (2023.02); *H10K 85/653* (2023.02); *H10K 85/6572* (2023.02); *H10K 85/6574* (2023.02); *H10K 85/6576* (2023.02); *H10K 50/15* (2023.02)

(58) Field of Classification Search
CPC .. H10K 85/626; H10K 85/622; H10K 85/624; H10K 85/636; H10K 85/653; H10K 85/6572; H10K 85/6574; H10K 85/6576; H10K 50/15; H10K 50/11; H10K 85/322; H10K 85/631; H10K 85/615; H10K 85/657; C09K 11/06; C09K 2211/1011; C09K 2211/1022; C09K 2211/1033; C09K 2211/1088
See application file for complete search history.

(56) References Cited

U.S. PATENT DOCUMENTS

| | | | |
|---|---|---|---|
| 10,374,166 B2 | 8/2019 | Hatakeyama et al. | |
| 2010/0187983 A1 | 7/2010 | Herron et al. | |
| 2011/0285274 A1 | 11/2011 | Hamada et al. | |
| 2018/0301629 A1* | 10/2018 | Hatakeyama | C09K 11/06 |
| 2019/0207112 A1 | 7/2019 | Hatakeyama et al. | |
| 2019/0237673 A1 | 8/2019 | Gao et al. | |
| 2021/0053998 A1 | 2/2021 | Kim et al. | |

FOREIGN PATENT DOCUMENTS

| | | |
|---|---|---|
| KR | 20100069216 A | 6/2010 |
| KR | 20140095725 A | 8/2014 |
| KR | 20150102735 A | 9/2015 |

OTHER PUBLICATIONS

Notification of Third Party Observation from KIPO for Korea patent application No. 10-2019-0132811; Application Date: Oct. 24, 2019.
Search Report from JPO for Japanese application No. 2021-520587; Application Date: Oct. 25, 2019.

* cited by examiner

*Primary Examiner* — Kyoung Lee
(74) *Attorney, Agent, or Firm* — G. Creston Campbell

(57) ABSTRACT

The present disclosure relates to a plurality of light-emitting materials comprising at least one of first compounds and at least one of second compounds, wherein the first compound is represented by formula 1, and the second compound is represented by formula 2, and an organic electroluminescent device having improved lifetime properties can be provided by comprising the plurality of light-emitting materials.

18 Claims, No Drawings

PLURALITY OF LIGHT-EMITTING MATERIALS AND ORGANIC ELECTROLUMINESCENT DEVICE COMPRISING THE SAME

TECHNICAL FIELD

The present disclosure relates to a plurality of light-emitting materials and an organic electroluminescent device comprising the same.

BACKGROUND ART

An electroluminescent device (EL device) is a self-light-emitting display device which has advantages in that it provides a wider viewing angle, a greater contrast ratio, and a faster response time. The first organic EL device was developed by Eastman Kodak in 1987, by using small aromatic diamine molecules and aluminum complexes as materials for forming a light-emitting layer (see Appl. Phys. Lett. 51, 913, 1987).

An organic electroluminescent device (OLED) changes electric energy into light by applying electricity to an organic electroluminescent material, and commonly comprises an anode, a cathode, and an organic layer formed between the two electrodes. The organic layer of the OLED may comprise a hole injection layer, a hole transport layer, a hole auxiliary layer, a light-emitting auxiliary layer, an electron blocking layer, a light-emitting layer, an electron buffer layer, a hole blocking layer, an electron transport layer, an electron injection layer, etc., if necessary. The materials used in the organic layer can be classified into a hole injection material, a hole transport material, a hole auxiliary material, a light-emitting auxiliary material, an electron blocking material, a light-emitting material (including a host material and a dopant material), an electron buffer material, a hole blocking material, an electron transport material, an electron injection material, etc., depending on their functions. In the OLED, holes from the anode and electrons from the cathode are injected into a light-emitting layer by the application of electric voltage, and excitons having high energy are produced by the recombination of the holes and electrons. The organic light-emitting compound moves into an excited state by the energy and emits light from an energy when the organic light-emitting compound returns to the ground state from the excited state.

Recently, as displays have become large-scale, there is a need for light-emitting materials capable of exhibiting more delicate and vivid colors. Particularly, in the case of blue light-emitting materials, materials such as ADN and DPVBi are used as host materials, and materials such as aromatic amine-based compounds, copper phthalocyanine compounds, carbazole-based derivatives, perylene-based derivatives, coumarin-based derivatives, pyrene-based derivatives are used as dopant materials, but it is difficult to obtain a deep blue with high color purity, and as the wavelength becomes shorter, the light emission lifetime becomes shorter.

Accordingly, in order to implement a full color display, there is a demand for the development of a deep blue light-emitting material having a long lifetime and development of other organic materials having energy levels matched with the blue light-emitting material.

Korean Patent Appl. Laid-Open No. 2017-0130434 A discloses a combination of anthracene derivatives and boron derivatives. However, the development for improving performances of an OLED is still required.

DISCLOSURE OF INVENTION

Technical Problem

The objective of the present disclosure is to provide an organic electroluminescent device having longer lifetime properties.

Solution to Problem

As a result of intensive studies to solve the technical problem above, the present inventors found that the above objective can be achieved by a plurality of light-emitting materials comprising at least one of first compounds and at least one of second compounds, wherein the first compound is represented by the following formula 1, and the second compound is represented by the following formula 2:

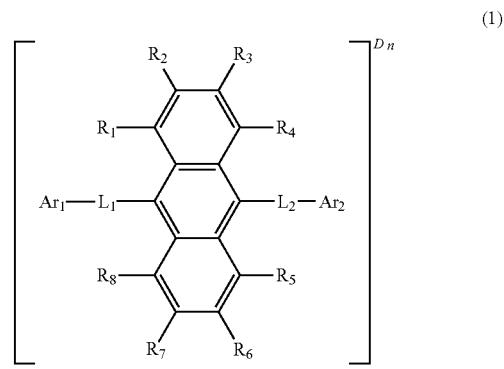

(1)

wherein, $L_1$ and $L_2$, each independently, represent a single bond, a substituted or unsubstituted (C6-C30)arylene, or a substituted or unsubstituted (5- to 30-membered)heteroarylene;

$Ar_1$ and $Ar_2$, each independently, represent a substituted or unsubstituted (C6-C30)aryl, or a substituted or unsubstituted (5- to 30-membered)heteroaryl;

$R_1$ to $R_8$, each independently, represent hydrogen, deuterium, a halogen, a cyano a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino.

$D_n$ represents n hydrogens are replaced with deuterium; and n represents an integer of 8 or more;

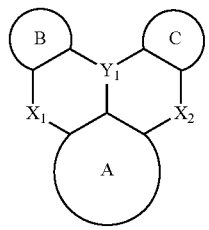

(2)

wherein, ring A, ring B, and ring C, each independently, represent a substituted or unsubstituted (C6-C30)aryl, or a substituted or unsubstituted (3- to 50-membered)heteroaryl;

$Y_1$ represents B;

$X_1$ and $X_2$, each independently, represent NR; and

R represents hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino; or R may be linked to at least one of ring A, ring B, and ring C to form a ring(s).

Advantageous Effects of Invention

By comprising the plurality of light-emitting materials according to the present disclosure, it is possible to provide an organic electroluminescent device having improved lifetime properties.

MODE FOR THE INVENTION

Hereinafter, the present disclosure will be described in detail. However, the following description is intended to explain the disclosure, and is not meant in any way to restrict the scope of the disclosure.

The term "an organic electroluminescent compound" in the present disclosure means a compound that may be used in an organic electroluminescent device. If necessary, the organic electroluminescent compound may be comprised in any layers constituting an organic electroluminescent device.

The term "an organic electroluminescent material" in the present disclosure means a material that may be used in an organic electroluminescent device, and may comprise at least one compound. If necessary, the organic electroluminescent material may be comprised in any layers constituting an organic electroluminescent device. For example, the organic electroluminescent material may be a hole injection material, a hole transport material, a hole auxiliary material, a light-emitting auxiliary material, an electron blocking material, a light-emitting material (including a host material and a dopant material), an electron buffer material, a hole blocking material, an electron transport material, an electron injection material, etc.

The term "a plurality of light-emitting materials" in the present disclosure means a host material(s) and/or a dopant material(s), comprising a combination of at least two compounds, which may be comprised in any light-emitting layer constituting an organic electroluminescent device. It may mean both a material before being comprised in an organic electroluminescent device (for example, before vapor deposition) and a material after being comprised in an organic electroluminescent device (for example, after vapor deposition). For example, the plurality of light-emitting materials of the present disclosure may be a combination of one or more host materials and one or more dopant materials, and may optionally further include a conventional material comprised in organic electroluminescent materials. The two or more compounds comprised in the plurality of light-emitting materials of the present disclosure may be included in one light-emitting layer or may be respectively included in different light-emitting layers by means of the methods used in the art. For example, the two or more compounds may be mixture-evaporated or co-evaporated, or individually deposited.

Herein, the term "(C1-C30)alkyl" is meant to be a linear or branched alkyl having 1 to 30 carbon atoms constituting the chain, in which the number of carbon atoms is preferably 1 to 20, and more preferably 1 to 10. The above alkyl may include methyl, ethyl, n-propyl, isopropyl, n-butyl, isobutyl, tert-butyl, etc. The term "(C3-C30)cycloalkyl" is meant to be a mono- or polycyclic hydrocarbon having 3 to 30 ring backbone carbon atoms, in which the number of carbon atoms is preferably 3 to 20, and more preferably 3 to 7. The above cycloalkyl may include cyclopropyl, cyclobutyl, cyclopentyl, cyclohexyl, etc. The term "(C6-C30)aryl(ene)" is meant to be a monocyclic or fused ring radical derived from an aromatic hydrocarbon having 6 to 30 ring backbone carbon atoms. The above aryl(ene) may be partially saturated, and may comprise a spiro structure. The number of ring backbone carbon atoms is preferably 6 to 20, and more preferably 6 to 15. The above aryl may include phenyl, biphenyl, terphenyl, naphthyl, binaphthyl, phenylnaphthyl, naphthylphenyl, fluorenyl, phenylfluorenyl, diphenylfluorenyl, benzofluorenyl, diphenylbenzofluorenyl, dibenzofluorenyl, phenanthrenyl, benzophenanthrenyl, phenylphenanthrenyl, anthracenyl, indenyl, triphenylenyl, pyrenyl, tetracenyl, perylenyl, chrysenyl, naphthacenyl, fluoranthenyl, spirobifluorenyl, spiro[fluorene-benzofluoren]yl, etc. More specifically, the aryl may include phenyl, 1-naphthyl, 2-naphthyl, 1-anthryl, 2-anthryl, 9-anthryl, benzanthryl, 1-phenanthryl, 2-phenanthryl, 3-phenanthryl, 4-phenanthryl, 9-phenanthryl, naphthacenyl, pyrenyl, 1-chrysenyl, 2-chrysenyl, 3-chrysenyl, 4-chrysenyl, 5-chrysenyl, 6-chrysenyl, benzo[c]phenanthryl, benzo[g]chrysenyl, 1-triphenylenyl, 2-triphenylenyl, 3-triphenylenyl, 4-triphenylenyl, 1-fluorenyl, 2-fluorenyl, 3-fluorenyl, 4-fluorenyl, 9-fluorenyl, benzofluorenyl, dibenzofluorenyl, 2-biphenylyl, 3-biphenylyl, 4-biphenylyl, o-terphenyl, m-terphenyl-4-yl, m-terphenyl-3-yl, m-terphenyl-2-yl, p-terphenyl-4-yl, p-terphenyl-3-yl, p-terphenyl-2-yl, m-quaterphenyl, 3-fluoranthenyl, 4-fluoranthenyl, 8-fluoranthenyl, 9-fluoranthenyl, benzofluoranthenyl, o-tolyl, m-tolyl, p-tolyl, 2,3-xylyl, 3,4-xylyl, mesityl, o-cumenyl, m-cumenyl, p-cumenyl, p-tert-butylphenyl, p-(2-phenylpropyl)phenyl, 4'-methylbiphenylyl, tert-butyl-p-terphenyl-4-yl, 9,9-dimethyl-1-fluorenyl, 9,9-dimethyl-2-fluorenyl, 9,9-dimethyl-3-fluorenyl, 9,9-dimethyl-4-fluorenyl, 9,9- diphenyl-1-fluorenyl, 9,9-diphenyl-2-fluorenyl, 9,9-diphenyl-3-fluorenyl, 9,9-diphenyl-4-fluorenyl, etc.

The term "(3- to 50-membered)heteroaryl(ene)" is an aryl(ene) having 3 to 50 ring backbone atoms, in which the number of ring backbone atoms is preferably 5 to 25, and including at least one, preferably 1 to 4 heteroatoms selected from the group consisting of B, N, O, S, Si, and P. The above heteroaryl(ene) may be a monocyclic ring, or a fused ring condensed with at least one benzene ring; may be partially saturated; may be one formed by linking at least one heteroaryl or aryl group to a heteroaryl group via a single bond(s); and may comprise a spiro structure. The above heteroaryl may include a monocyclic ring-type heteroaryl such as furyl, thiophenyl, pyrrolyl, imidazolyl, pyrazolyl, thiazolyl, thiadiazolyl, isothiazolyl, isoxazolyl, oxazolyl, oxadiazolyl, triazinyl, tetrazinyl, triazolyl, tetrazolyl, furazanyl, pyridyl, pyrazinyl, pyrimidinyl, pyridazinyl, etc., and a fused ring-type heteroaryl such as benzofuranyl, benzothiophenyl, isobenzofuranyl, dibenzofuranyl, dibenzothiophenyl, benzimidazolyl, benzothiazolyl, benzoisothiazolyl, benzoisoxazolyl, benzoxazolyl, isoindolyl, indolyl, benzoindolyl, indazolyl, benzothiadiazolyl, quinolyl, isoquinolyl, cinnolinyl, quinazolinyl, quinoxalinyl, carbazolyl, benzocarbazolyl, dibenzocarbazolyl, phenoxazinyl, phenanthridinyl, benzodioxolyl, etc. More specifically, the heteroaryl may include 1-pyrrolyl, 2-pyrrolyl, 3-pyrrolyl, pyrazinyl, 2-pyridyl, 2-pyrimidinyl, 4-pyrimidinyl, 5-pyrimidinyl, 6-pyrimidinyl, 1,2,3-triazin-4-yl, 1,2,4-triazin-3-yl, 1,3,5-triazin-2-yl, 1-imidazolyl, 2-imidazolyl, 1-pyrazolyl, 1-indolidinyl, 2-indolidinyl, 3-indolidinyl, 5-indolidinyl, 6-indolidinyl, 7-indolidinyl, 8-indolidinyl, 2-imidazopyridyl, 3-imidazopyridyl, 5-imidazopyridyl, 6-imidazopyridyl, 7-imidazopyridyl, 8-imidazopyridyl, 3-pyridyl, 4-pyridyl, 1-indolyl, 2-indolyl, 3-indolyl, 4-indolyl, 5-indolyl, 6-indolyl, 7-indolyl, 1-isoindolyl, 2-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 9-carbazolyl, azacarbazolyl-1-yl, azacarbazolyl-2-yl, azacarbazolyl-3-yl, azacarbazolyl-4-yl, azacarbazolyl-5-yl, azacarbazolyl-6-yl, azacarbazolyl-7-yl, azacarbazolyl-8-yl, azacarbazolyl-9-yl, 1-phenanthridinyl, 2-phenanthridinyl, 3-phenanthridinyl, 4-phenanthridinyl, 6-phenanthridinyl, 7-phenanthridinyl, 8-phenanthridinyl, 9-phenanthridinyl, 10-phenanthridinyl, 1-acridinyl, 2-acridinyl, 3-acridinyl, 4-acridinyl, 9-acridinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrol-1-yl, 2-methylpyrrol-3-yl, 2-methylpyrrol-4-yl, 2-methylpyrrol-5-yl, 3-methylpyrrol-1-yl, 3-methylpyrrol-2-yl, 3-methylpyrrol-4-yl, 3-methylpyrrol-5-yl, 2-Cert-butylpyrrol-4-yl, 3-(2-phenylpropyl)pyrrol-1-yl, 2-methyl-1-indolyl, 4-methyl-1-indolyl, 2-methyl-3-indolyl, 4-methyl-3-indolyl, 2-Cert-butyl-1-indolyl, 4-tort-butyl-1-indolyl, 2-tert-butyl-3-indolyl, 4-tert-butyl-3-indolyl, 1-dibenzofuranyl, 2-dibenzofuranyl, 3-dibenzofuranyl, 4-dibenzofuranyl, 1-dibenzothiophenyl, 2-dibenzothiophenyl, 3-dibenzothiophenyl, 4-dibenzothiophenyl, 1-silafluorenyl, 2-silafluorenyl, 3-silafluorenyl, 4-silafluorenyl, 1-germafluorenyl, 2-germafluorenyl, 3-germafluorenyl, 4-germafluorenyl, etc. "Halogen" includes F, Cl, Br, and I.

In addition, "ortho (o-)," "meta (m-)" and "para (p-)" are prefixes, which represent the relative positions of substituents, respectively. Ortho indicates that two substituents are adjacent to each other, and for example, when two substituents in a benzene derivative occupy positions 1 and 2, it is called an ortho position. Meta indicates that two substituents are at positions 1 and 3, and for example, when two substituents in a benzene derivative occupy positions 1 and 3, it is called a meta position. Para indicates that two substituents are at positions 1 and 4, and for example, when two substituents in a benzene derivative occupy positions 1 and 4, it is called a para position.

In the formulas of the present disclosure, a ring formed by a linkage of adjacent substituents means that at least two adjacent substituents are linked to or fused with each other to form a substituted or unsubstituted mono- or polycyclic (3- to 30-membered) alicyclic or aromatic ring, or the combination thereof; preferably, a substituted or unsubstituted mono- or polycyclic (5- to 25-membered) alicyclic or aromatic ring, or the combination thereof; more preferably, a substituted or unsubstituted mono- or polycyclic (5- to 18-membered) alicyclic or aromatic ring, or the combination thereof. Also, the ring may contain at least one heteroatom selected from B, N, O, S, Si, and P, preferably at least one heteroatom selected from N, O, and S.

Herein, "substituted" in the expression "substituted or unsubstituted" means that a hydrogen atom in a certain functional group is replaced with another atom or another functional group, i.e., a substituent. In the present disclosure, the substituents of the substituted alkyl, the substituted aryl(ene), the substituted heteroaryl(ene), the substituted cycloalkyl, the substituted alkoxy, the substituted trialkylsilyl, the substituted dialkylarylsilyl, the substituted alkyldiarylsilyl, the substituted triarylsilyl, the substituted mono- or di-alkylamino, the substituted mono- or di-arylamino, and the substituted alkylarylamino, each independently, are at least one selected from the group consisting of deuterium; a halogen; a cyano; a carboxyl; a nitro; a hydroxyl; a (C1-C30)alkyl; a halo(C1-C30)alkyl; a (C2-C30)alkenyl; a (C2-C30)alkynyl; a (C1-C30)alkoxy; a (C1-C30)alkylthio; a (C3-C30)cycloalkyl; a (C3-C30)cycloalkenyl; a (3- to 7-membered)heterocycloalkyl; a (C6-C30)aryloxy; a (C6-C30)arylthio; a (5- to 30-membered)heteroaryl unsubstituted or substituted with at least one of a (C1-C30)alkyl(s), a (C6-C30)aryl(s) and a di(C6-C30)arylamino(s); a (C6-C30)aryl unsubstituted or substituted with at least one of a (C1-C30)alkyl(s), a (5- to 30-membered)heteroaryl(s) and a di(C6-C30)arylamino(s); a tri(C1-C30)alkylsilyl; a tri(C6-C30)arylsilyl; a di(C1-C30)alkyl(C6-C30)arylsilyl; a (C1-C30)alkyldi(C6-C30)arylsilyl; an amino; a mono- or di-(C1-C30)alkylamino; a mono- or di-(C6-C30)arylamino unsubstituted or substituted with at least one of a (C1-C30) alkyl(s), a (5- to 30-membered)heteroaryl(s) and a di(C6-C30)arylamino(s); a (C1-C30)alkyl(C6-C30)arylamino; a (C1-C30)alkylcarbonyl; a (C1-C30)alkoxycarbonyl; a (C6-C30)arylcarbonyl; a di(C6-C30)arylboronyl; a di(C1-C30)alkylboronyl; a (C1-C30)alkyl(C6-C30)arylboronyl; a (C6-C30)aryl(C1-C30)alkyl; and a (C1-C30)alkyl(C6-C30)aryl. According to one embodiment of the present disclosure, the substituents, each independently, are at least one selected from the group consisting of deuterium; a (C1-C20)alkyl; a (5- to 20-membered)heteroaryl unsubstituted or substituted with a (C1-C20)alkyl(s); a (C6-C25)aryl unsubstituted or substituted with at least one of a (C1-C20)alkyl(s), a (5- to 20-membered)heteroaryl(s) and a di(C6-C25)arylamino(s); and a mono- or di-(C6-C25)arylamino unsubstituted or substituted with at least one of a (C1-C20)alkyl(s), a (5- to 25-membered)heteroaryl(s) and a di(C6-C25)arylamino(s). According to another embodiment of the present disclosure, the substituents, each independently, are at least one selected from the group consisting of deuterium; a (C1-C10)alkyl; a (5- to 20-membered)heteroaryl unsubstituted or substituted with a (C1-C10)alkyl(s); a (C6-C18)aryl unsubstituted or substituted with at least one of a (C1-C10)alkyl(s), a (5- to 20-membered)heteroaryl(s) and a di(C6-C18)arylamino(s); and a mono- or di-(C6-C18)arylamino unsubstituted or substituted with at least one of a (C1-C10)alkyl(s), a (5- to 20-membered)heteroaryl(s) and a di(C6-C18)arylamino(s). For example, the substituents, each independently, may be at least one selected from the group consisting of a methyl; tert-butyl; a phenyl unsubstituted or substituted with at least one of a carbazolyl(s), a dibenzofuranyl(s), a methyl(s), a diphenylamino(s), a phenoxazinyl(s), a phenothiazinyl(s), and an acridinyl(s) substituted with a methyl(s); a biphenyl; a terphenyls a triphenylenyl; a carbazolyl; a phenoxazinyl; a phenothiazinyl; an acridinyl substituted with a methyl(s); a xanthenyl substituted with a methyl(s); a diphenylamino unsubstituted or substituted with a methyl(s) and/or a diphenylamino(s); a phenylnaphthylamino; and a phenylamine substituted with a phenylcarbazolyl(s) and/or a dibenzofuranyl(s).

Herein, the heteroaryl, the heteroarylene, and the heterocycloalkyl, each independently, may contain at least one heteroatom selected from B, N, O, S, Si, and P. Also, the heteroatom may be bonded to at least one selected from the group consisting of hydrogen; deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri (C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, and a substituted or unsubstituted (C1-C30)alkyl(C6-C30)arylamino.

Hereinafter, a plurality of light-emitting materials according to one embodiment will be explained.

A plurality of light-emitting materials according to one embodiment comprises at least one first compound represented by formula 1 and at least one second compound represented by formula 2. Specifically, the present disclosure provides an organic electroluminescent device exhibiting a long lifetime by comprising the plurality of light-emitting materials in at least one organic layer, for example, at least one light-emitting layer of the organic electroluminescent device. More specifically, the first compound and the second compound may be used together in the light-emitting layer to increase charge mobility and stability, thereby improving device efficiency such as external quantum efficiency and lifetime properties.

According to one embodiment, the present disclosure provides a host/dopant combination, i.e., a combination of the host compound represented by formula 1 and the dopant compound represented by formula 2. Also, the present disclosure provides an organic electroluminescent device comprising the host/dopant combination.

The light-emitting material according to one embodiment includes at least one anthracene derivative represented by formula 1. For example, the compound represented by formula 1 may be a fluorescent host, for example, it may be a blue light-emitting fluorescent host.

In formula 1, $L_1$ and $L_2$, each independently, represent a single bond, a substituted or unsubstituted (C6-C30)arylene, or a substituted or unsubstituted (5- to 30-membered)heteroarylene. Preferably, $L_1$ and $L_2$, each independently, represent a single bond, a substituted or unsubstituted (C6-C25)arylene, or a substituted or unsubstituted (5- to 25-membered)heteroarylene. More preferably. $L_1$ and $L_2$, each independently, represent a single bond, a substituted or unsubstituted (C6-C18)arylene, or a substituted or unsubstituted (5- to 18-membered)heteroarylene.

According to one embodiment of the present disclosure, $L_1$ and $L_2$, each independently, may represent a single bond, or any one selected from the following Group 1.

[Group 1]

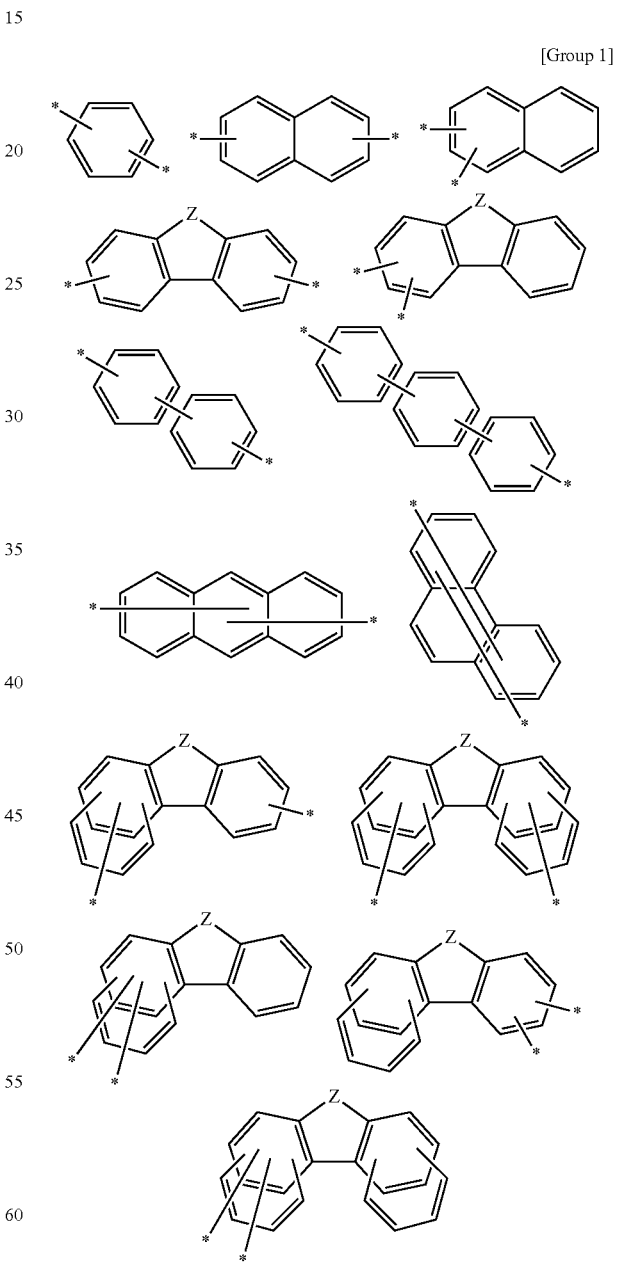

In Group 1, Z represents O, S, $NR_{101}$, $CR_{102}R_{103}$, or $SiR_{104}R_{105}$. Preferably, Z may represent O, S, or $NR_{101}$;

In Group 1, $R_{101}$ to $R_{105}$, each independently, represent a substituted or unsubstituted (C1-C30)alkyl, a substituted or unsubstituted (C6-C30)aryl, or a substituted or unsubstituted (3- to 30-membered)heteroaryl, or may be linked to an adjacent substituent to form a ring(s). Preferably, $R_{101}$ to $R_{105}$, each independently, may represent a substituted or unsubstituted (C1-C10)alkyl, a substituted or unsubstituted (C6-C25)aryl, or a substituted or unsubstituted (5- to 25-membered)heteroaryl. More preferably, $R_{101}$ to $R_{105}$, each independently, may represent a substituted or unsubstituted (C1-C4)alkyl, a substituted or unsubstituted (C6-C18)aryl, or a substituted or unsubstituted (5- to 18-membered)heteroaryl. For example, $R_{101}$ may represent a phenyl.

In any one of Group 1, two *'s represent a bonding site with anthracene backbone, and a bonding site with $Ar_1$ or $Ar_2$, respectively.

For example, $L_1$ and $L_2$, each independently, may represent a single bond, a phenylene, a naphthylene, a biphenylene, a phenanthrenylene, or a benzofluorenylene substituted with a methyl(s).

In formula 1, $Ar_1$ and $Ar_2$, each independently, represent a substituted or unsubstituted (C6-C30)aryl, or a substituted or unsubstituted (5- to 30-membered)heteroaryl. Preferably, $Ar_1$ and $Ar_2$, each independently, represent a substituted or unsubstituted (C6-C25)aryl, or a substituted or unsubstituted (5- to 25-membered)heteroaryl. More preferably, An and $Ar_2$, each independently, represent a substituted or unsubstituted (C6-C25)aryl, or a substituted or unsubstituted (5- to 20-membered)heteroaryl.

According to one embodiment of the present disclosure, $Ar_1$ and $Ar_2$, each independently, represent any one selected from the following Group 2.

[Group 2]

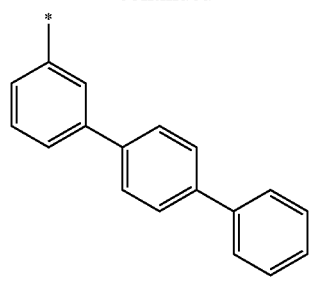
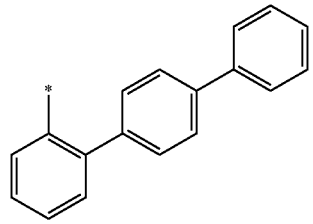
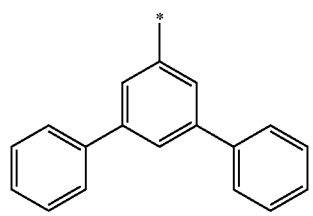
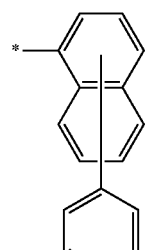
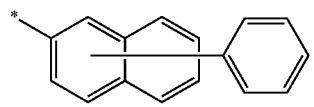
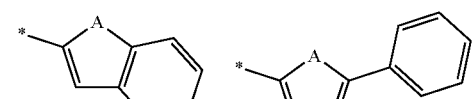
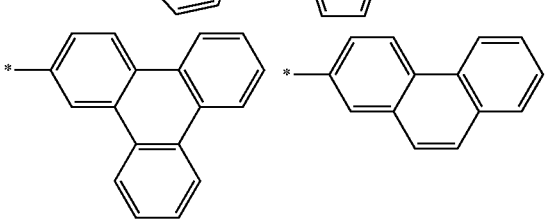
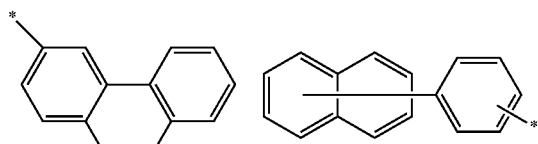
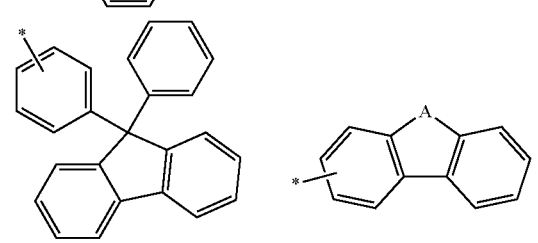

-continued
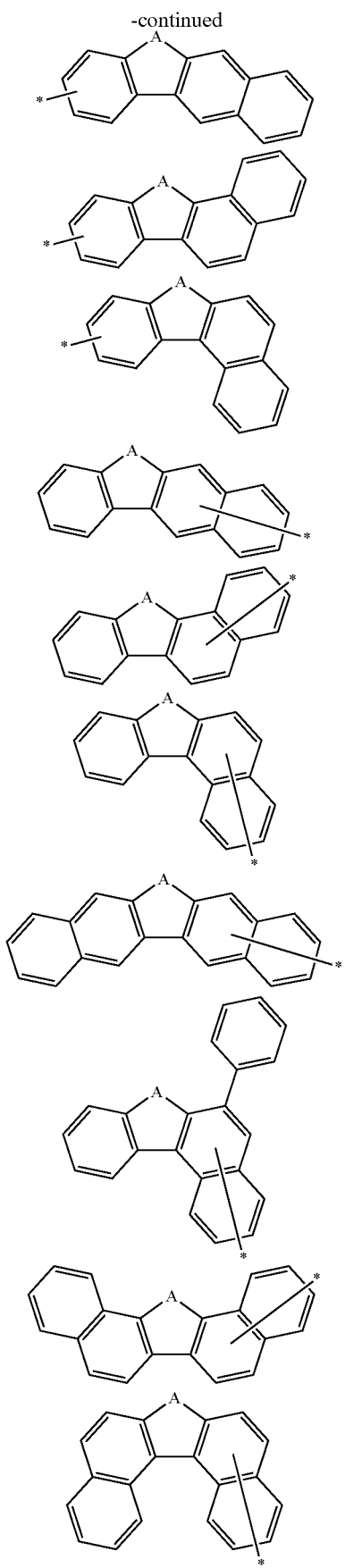
-continued
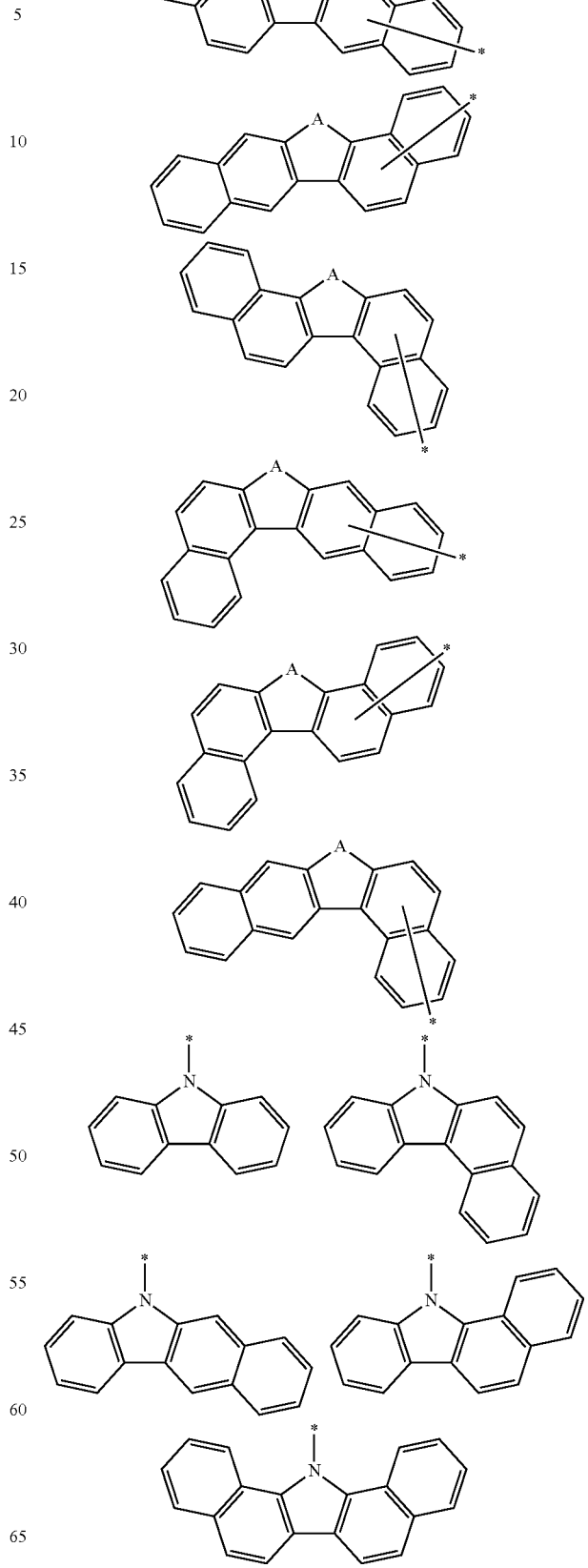

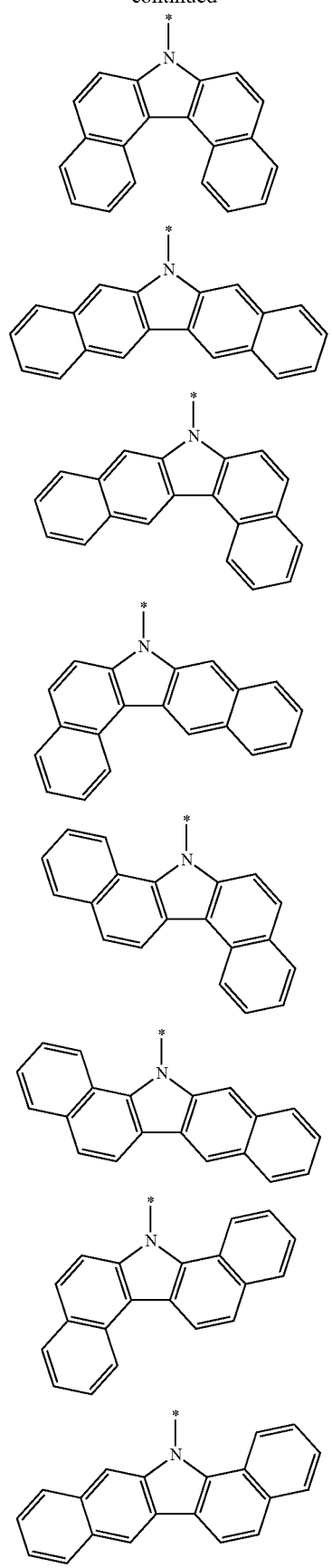
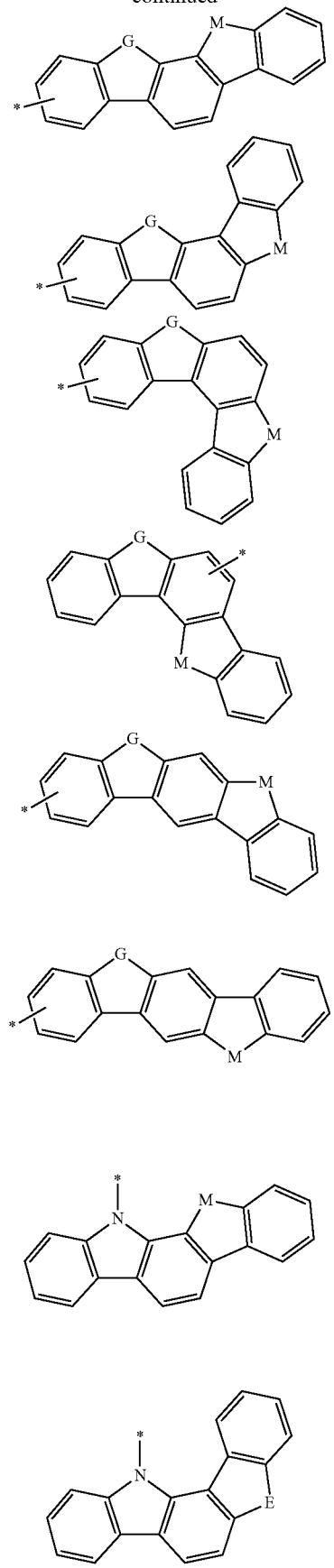

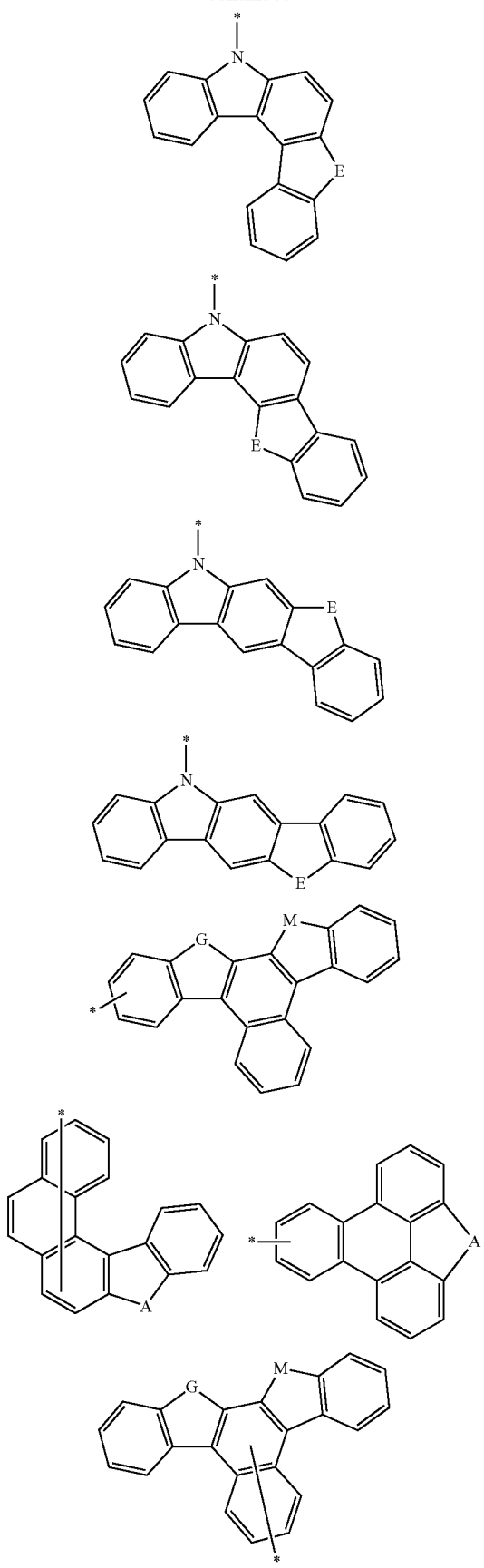

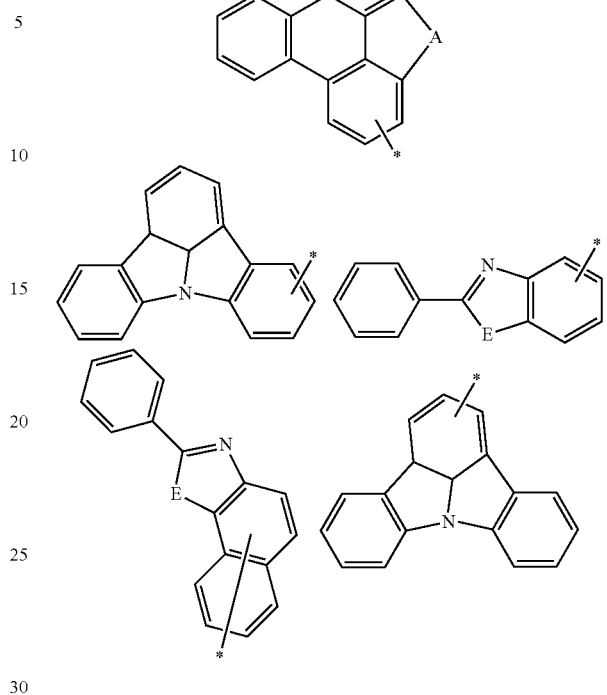

In Group 2, A, G, E, and M, each independently, represent O, S, $NR_{106}$, $CR_{107}R_{108}$, or $SiR_{109}R_{110}$. For example, A may represent O or $CR_{107}R_{108}$; E may represent O or S; and G and M, each independently, may represent O, S, or $NR_{106}$.

$R_{106}$ to $R_{110}$, each independently, represent a substituted or unsubstituted (C1-C30)alkyl, a substituted or unsubstituted (C6-C30)aryl, or a substituted or unsubstituted (3- to 30-membered)heteroaryl; or may be linked to an adjacent substituent to form a ring(s). Preferably, $R_{106}$ to $R_{110}$, each independently, represent a substituted or unsubstituted (C1-C10)alkyl, a substituted or unsubstituted (C6-C25)aryl, or a substituted or unsubstituted (5- to 25-membered)heteroaryl. More preferably, $R_{106}$ to $R_{110}$, each independently, represent an unsubstituted (C1-C4)alkyl, an unsubstituted (C6-C18) aryl, or an unsubstituted (5- to 18-membered)heteroaryl. For example, $R_{106}$ to $R_{110}$, each independently, may represent an unsubstituted methyl, an unsubstituted naphthyl, or an unsubstituted phenyl.

In Group 2, * represents a bonding site with anthracene backbone, or $L_1$ or $L_2$.

For example, $Ar_1$ and $Ar_2$, each independently, may represent a substituted or unsubstituted phenyl, a substituted or unsubstituted naphthyl, a substituted or unsubstituted m-biphenyl, a substituted or unsubstituted p-biphenyl, a substituted or unsubstituted terphenyl, a substituted or unsubstituted triphenylenyl, a substituted or unsubstituted phenanthrenyl, a substituted or unsubstituted fluorenyl, a substituted or unsubstituted benzofluorenyl, a substituted or unsubstituted spirobifluorenyl, a substituted or unsubstituted indenofluorenyl, a substituted or unsubstituted furanyl, a substituted or unsubstituted benzofuranyl, a substituted or unsubstituted dibenzofuranyl, a substituted or unsubstituted benzonaphthofuranyl, a substituted or unsubstituted dinaphthofuranyl, a substituted or unsubstituted dibenzothiophenyl, a substituted or unsubstituted benzonaphthothiophenyl, a substituted or unsubstituted benzocarbazolyl, a substituted or unsubstituted benzofurocarbazolyl, a substituted or unsubstituted benzothienocarbazolyl; a substituted or unsubstituted benzobisbenzofuranyl, a substituted or unsubstituted oxathiaindenofluorenyl, a substituted or unsubstituted dibenzocarbazolyl, a substituted or unsubstituted benzobisbenzothiophenyl, a substituted or unsubstituted carbazolyl, a substituted or unsubstituted indolocarbazolyl, a substituted or unsubstituted benzoxazolyl, a substituted or unsubstituted benzothiazolyl, or a substituted or unsubstituted naphthothiazolyl.

In formula 1, $R_1$ to $R_8$, each independently, represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino. Preferably, $R_1$ to $R_8$, each independently, may represent hydrogen, deuterium, a halogen, a cyano, or a substituted or unsubstituted (C1-C10) alkyl. More preferably, $R_1$ to $R_8$, each independently, may represent hydrogen, deuterium, a halogen; a cyano, or a substituted or unsubstituted (C1-C4)alkyl.

In formula 1, $D_n$ represents that n hydrogens are replaced with deuterium; and n represents an integer of 8 or more; preferably an integer of 10 or more, and more preferably an integer of 15 or more. The upper limit of n is determined by the number of hydrogens that can be substituted in each compound. When being deuterated to the number of the lower limit or more, the bond dissociation energy related to deuteration may increase to exhibit improved lifetime properties.

According to one embodiment of the present disclosure, at least four of $R_1$ to $R_8$ represent deuterium, Anthracene generally is most reactive at positions 9 and 10 due to resonance. For this reason, most fluorescent blue hosts have substituents at positions 9 and 10 of an anthracene. In an anthracene, the next most reactive sites are positions 1, 4, 5 and 8. These positions are susceptible to the following intermolecular cyclization under various reaction conditions. Therefore, although not intended to be limited by theory, if the reactivities of positions 1, 4, 5 and 8 of anthracene are reduced by replacing hydrogen of positions 1, 4, 5 and 8 with deuterium, the lifetime of the fluorescent blue host may be increased.

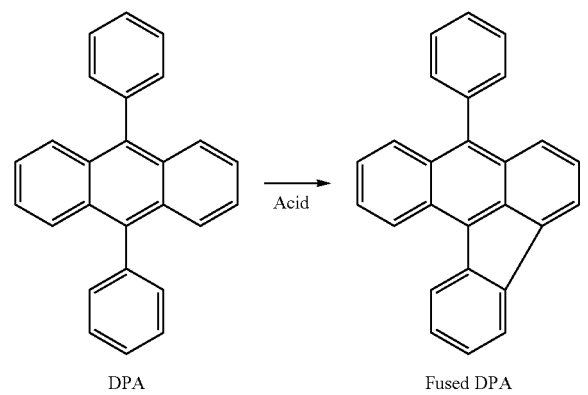

According to one embodiment of the present disclosure, at least four of $R_1$ to $R_8$ represent deuterium, $L_2$ represents a single bond, and $A_2$ represents a naphthyl unsubstituted or substituted with deuterium or a (C6-C30)aryl.

According to one embodiment of the present disclosure, the compound represented by formula 1 may be specifically exemplified by the following compounds, but is not limited thereto

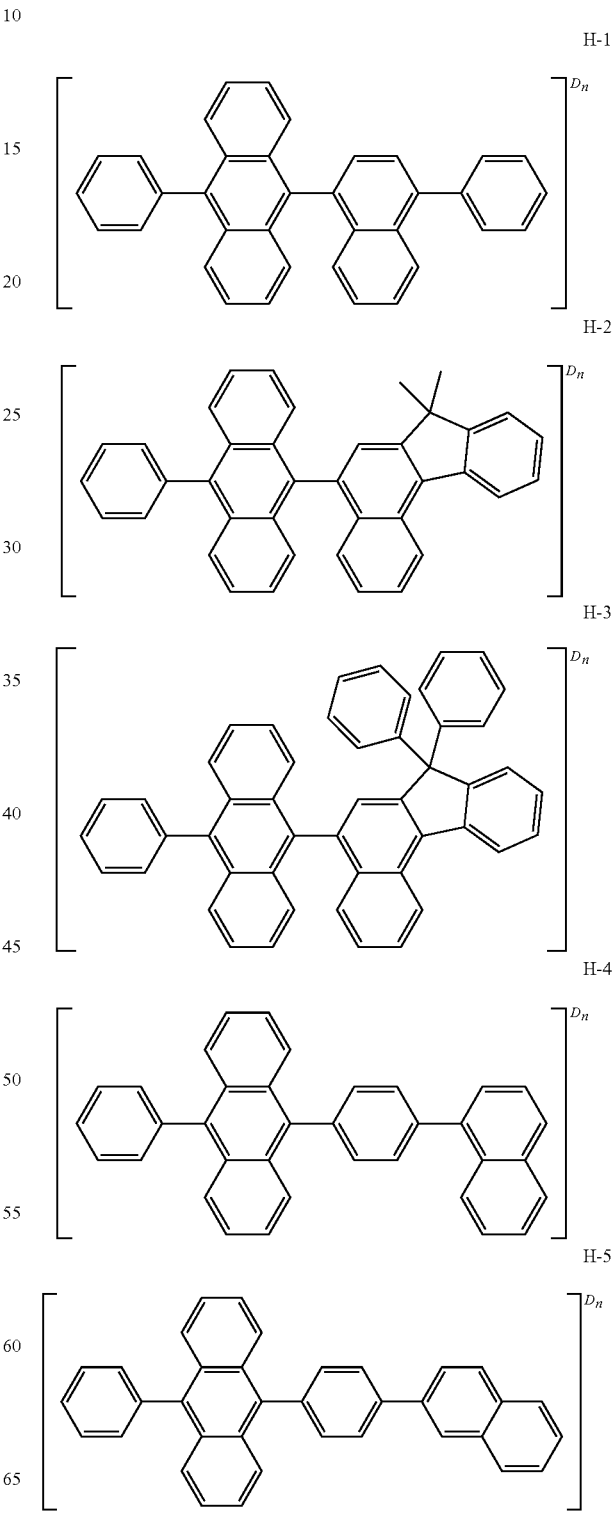

H-6
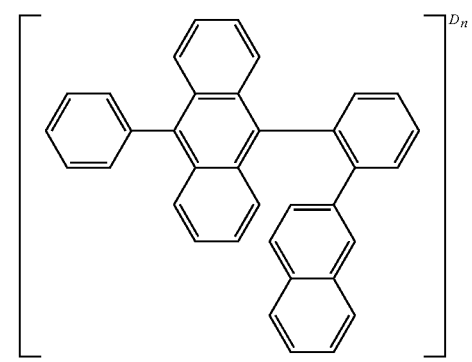
H-7
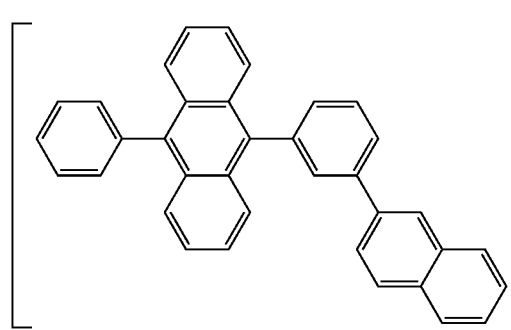
H-8
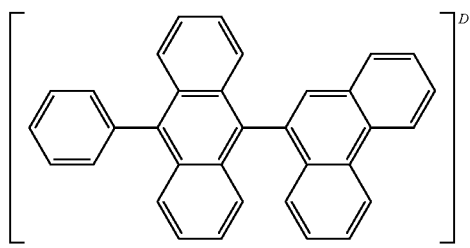
H-9
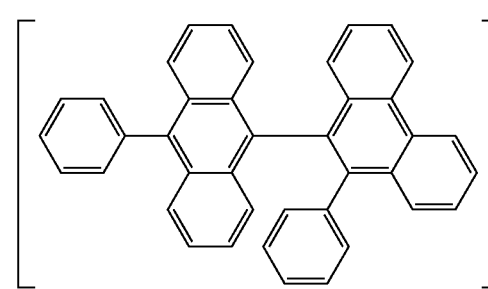
H-10
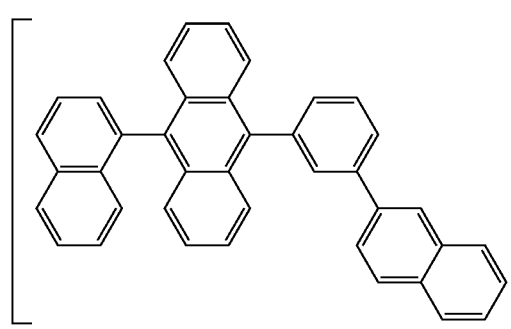
H-11
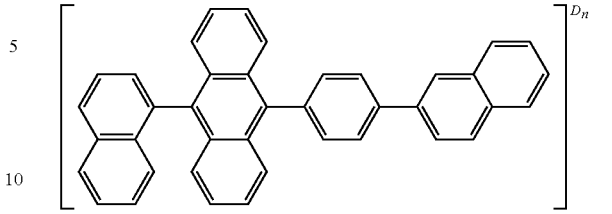
H-12
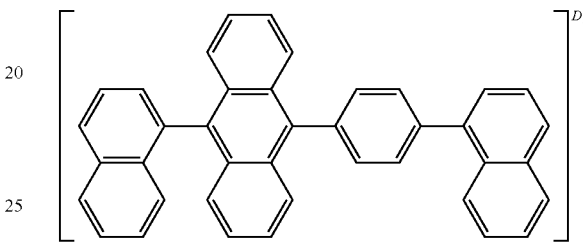
H-13
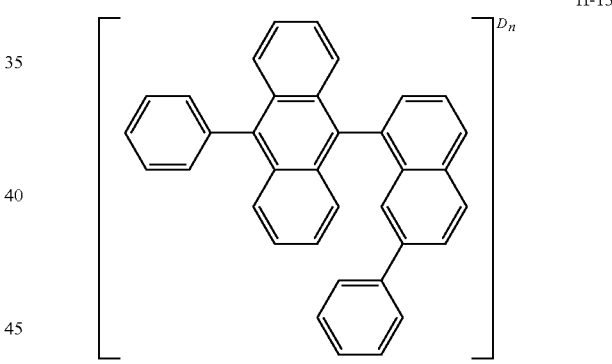
H-14
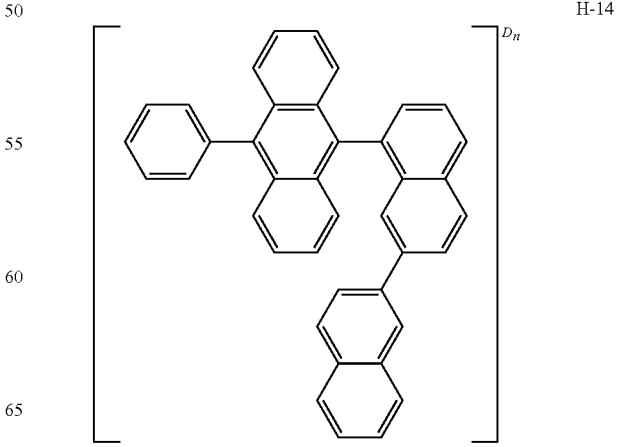

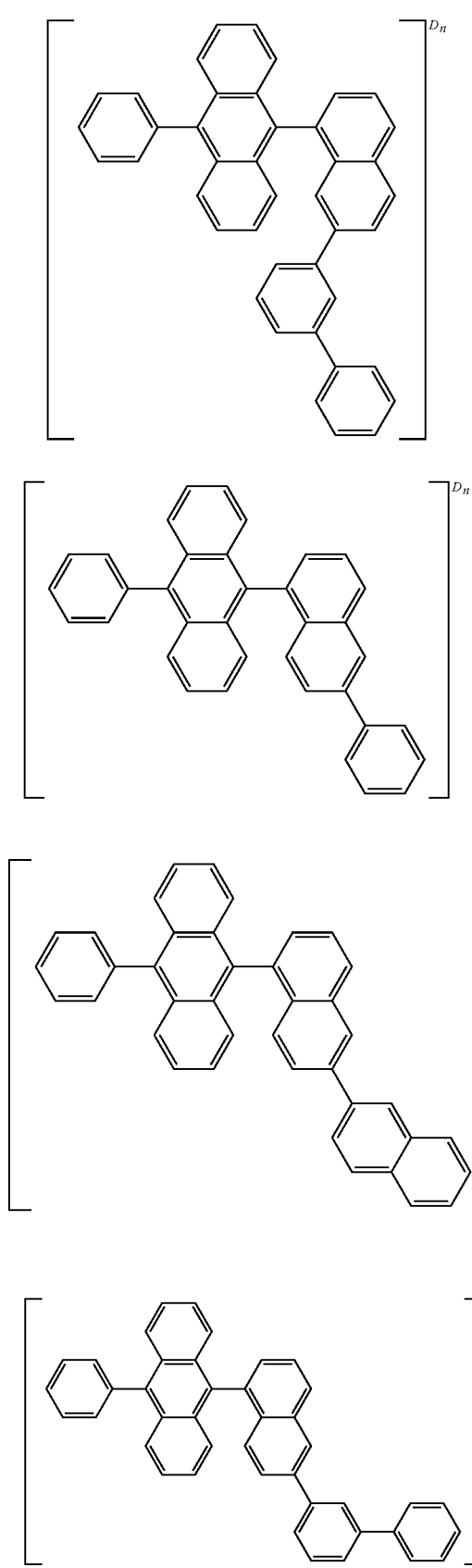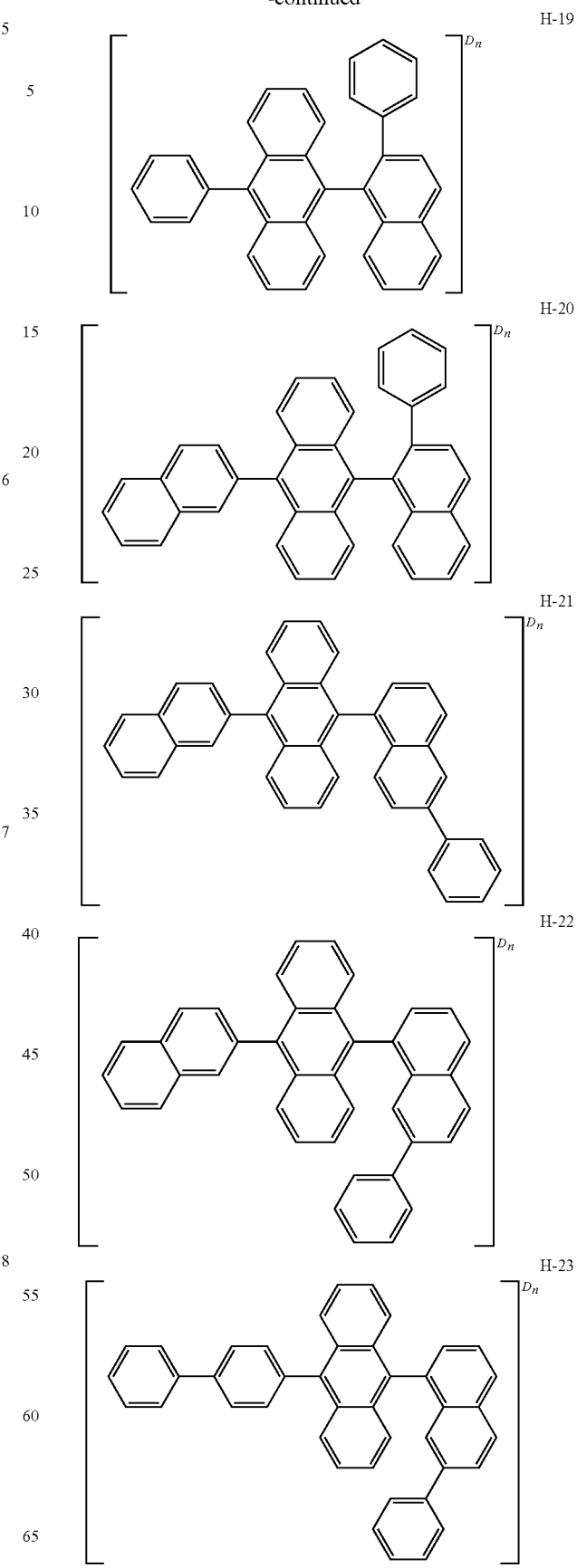

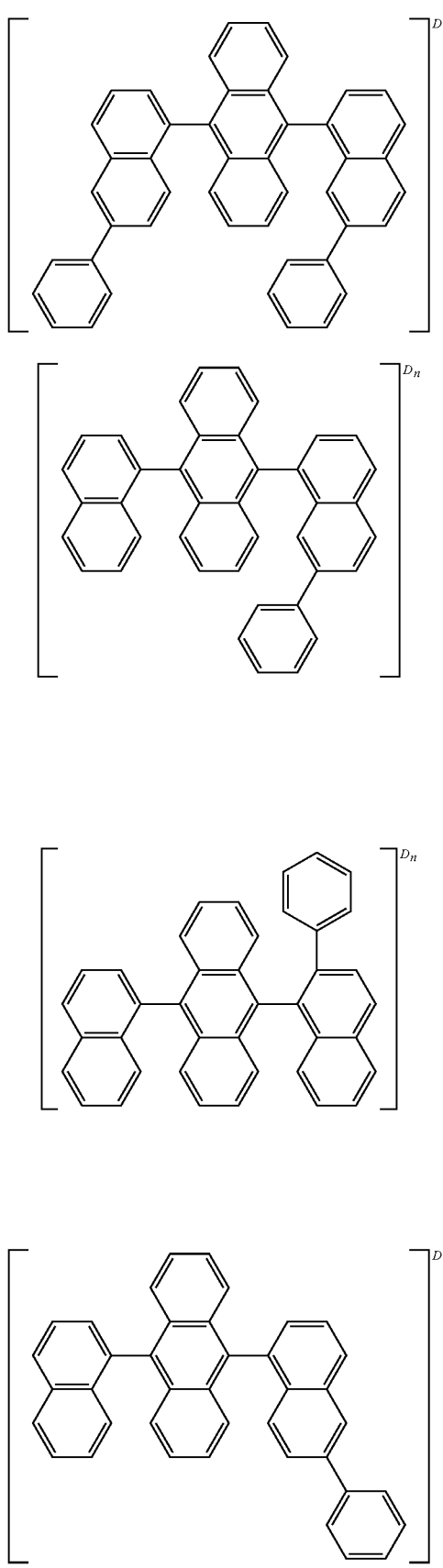
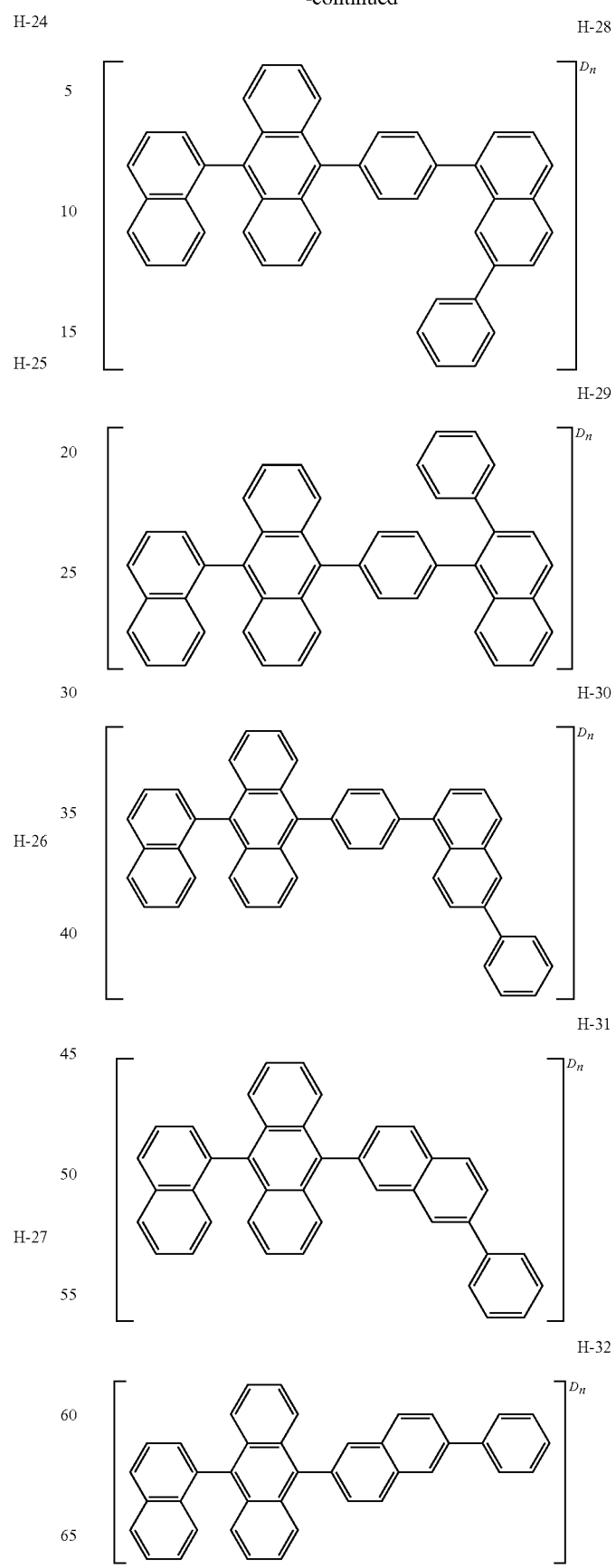

H-33
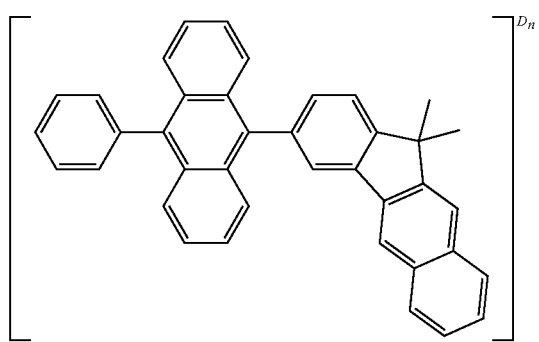
H-34
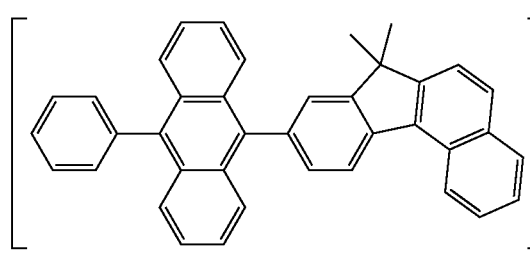
H-35
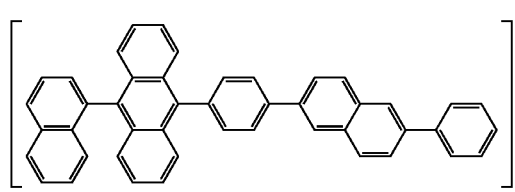
H-36
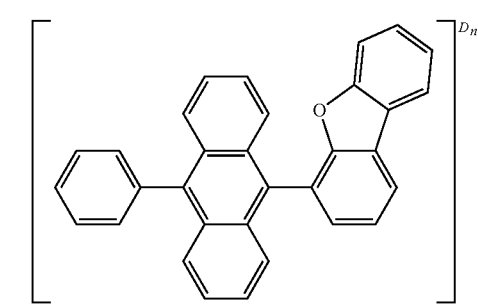
H-37
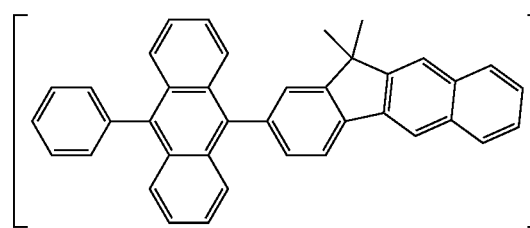
H-38
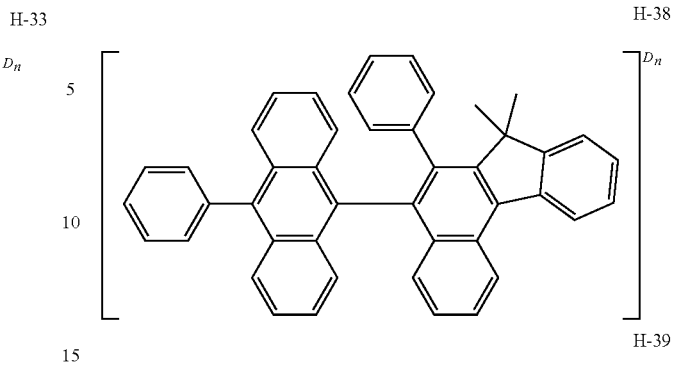
H-39
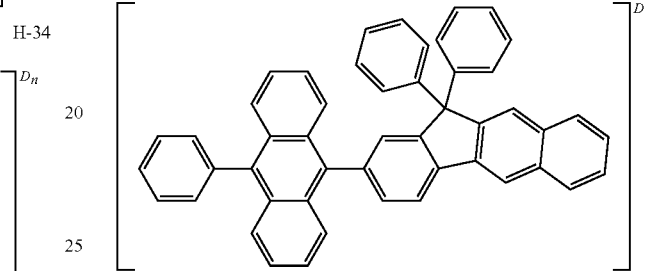
H-40
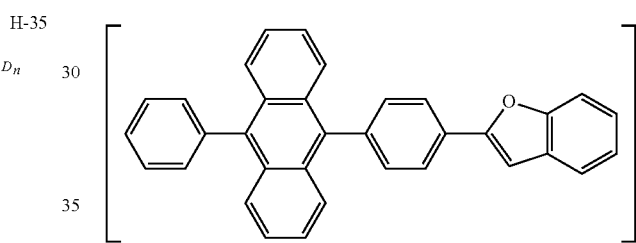
H-41
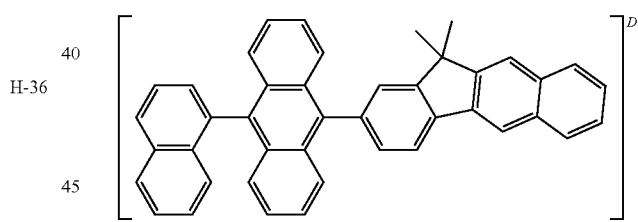
H-42
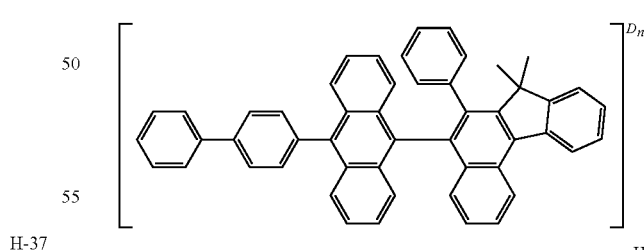
H-43
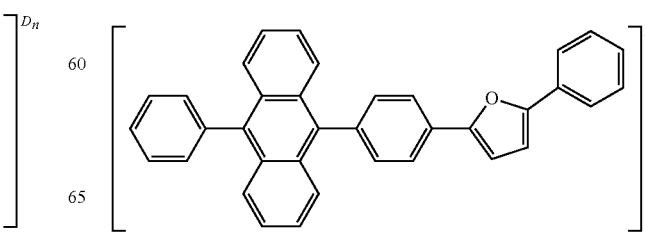

H-44
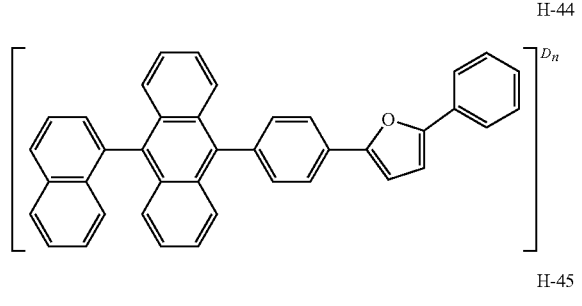
H-45
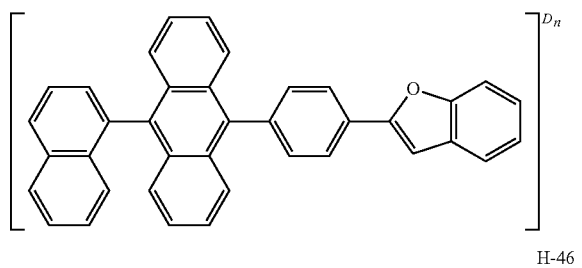
H-46
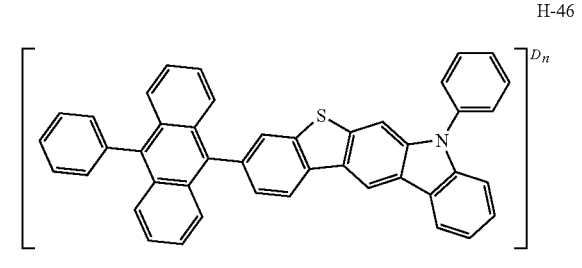
H-47
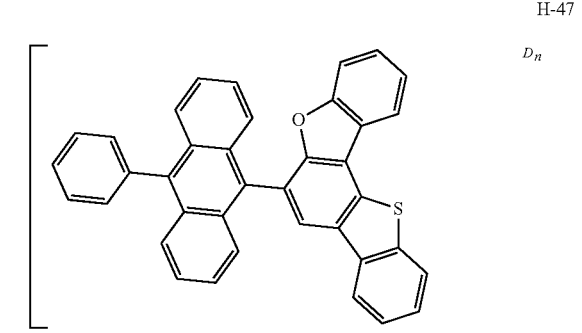
H-48
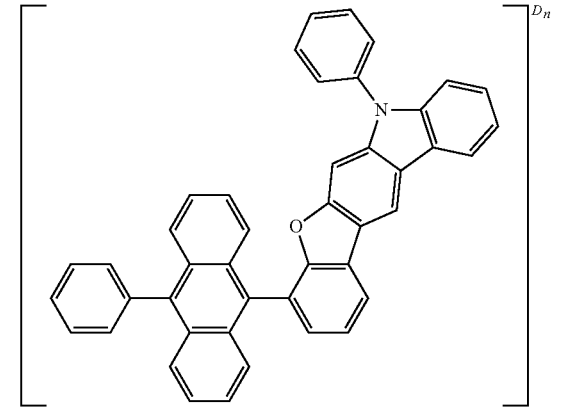
H-49
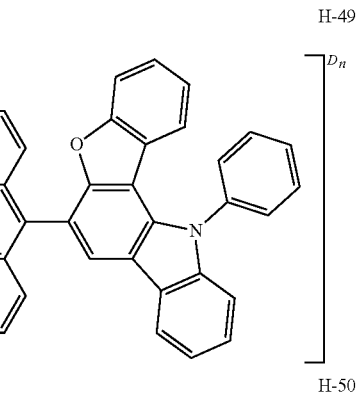
H-50
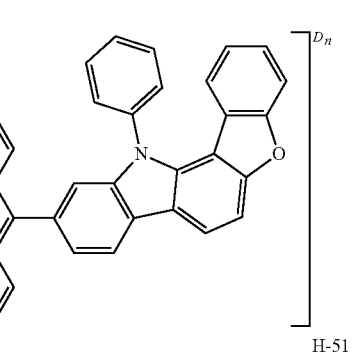
H-51
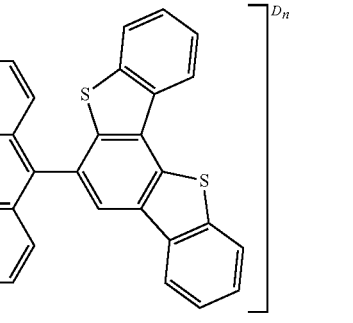
H-52
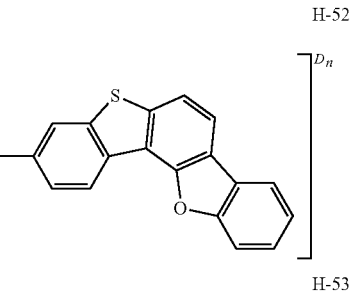
H-53
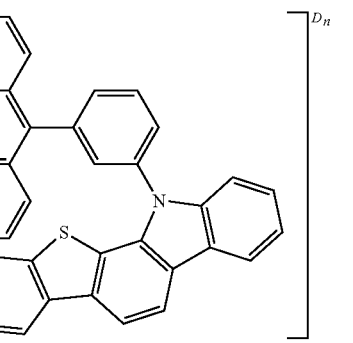

H-54
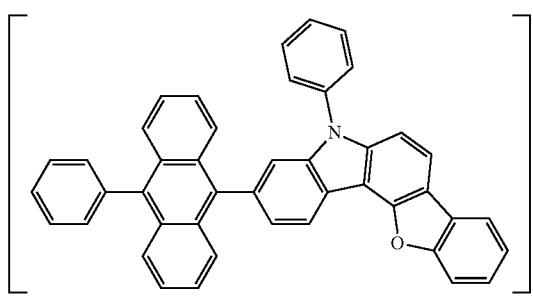
H-59
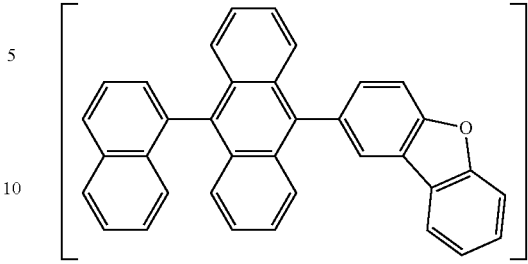
H-55
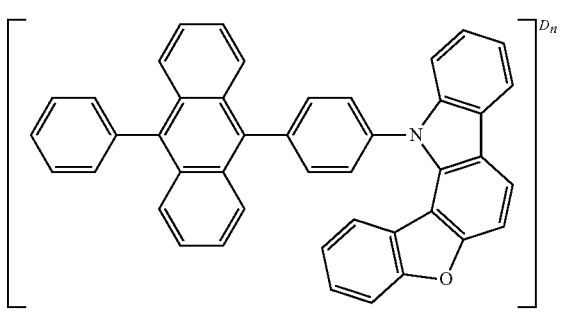
H-60
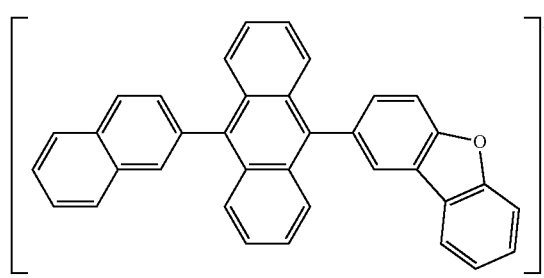
H-56
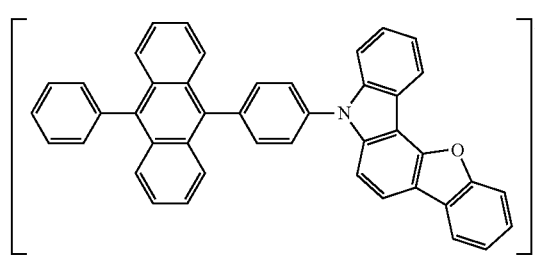
H-61
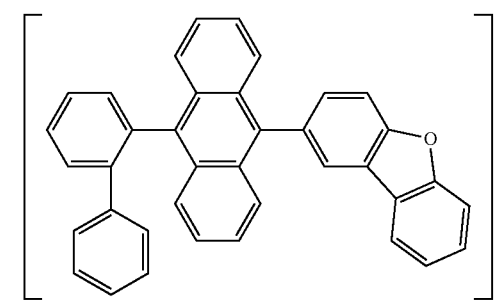
H-57
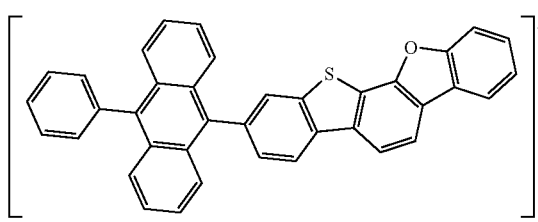
H-62
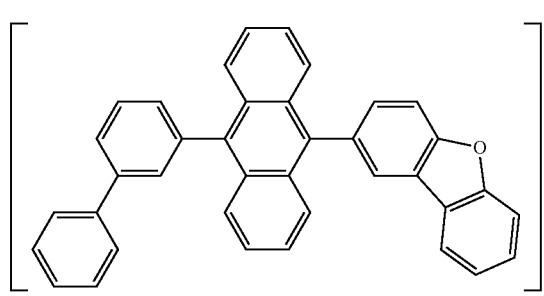
H-58
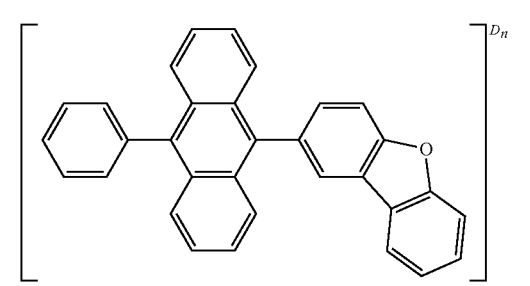
H-63
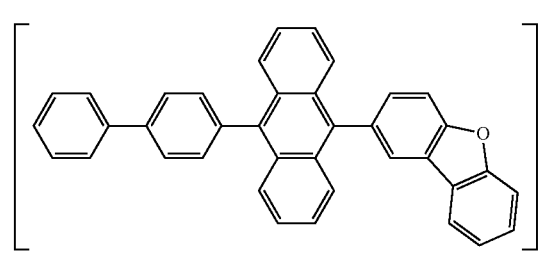

H-64
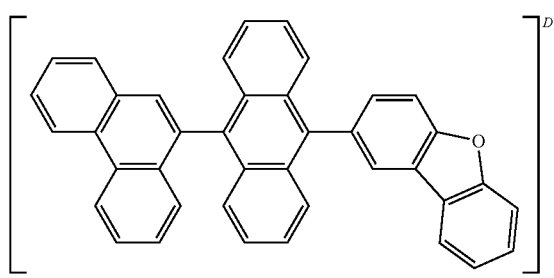
H-65
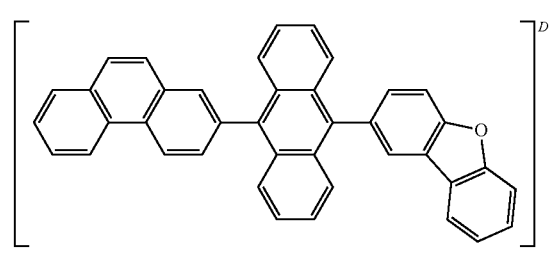
H-66
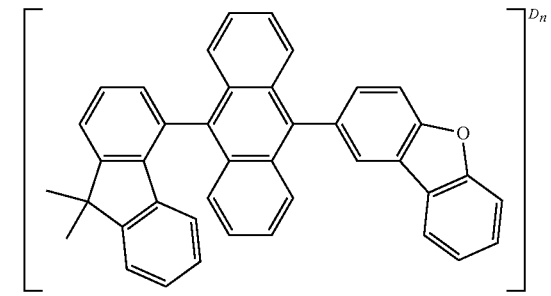
H-67
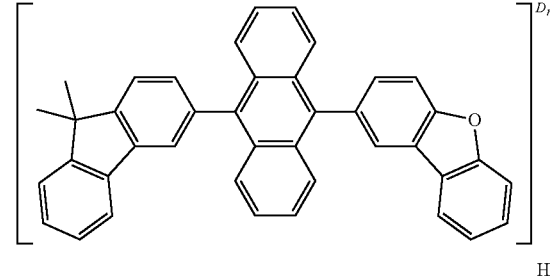
H-68
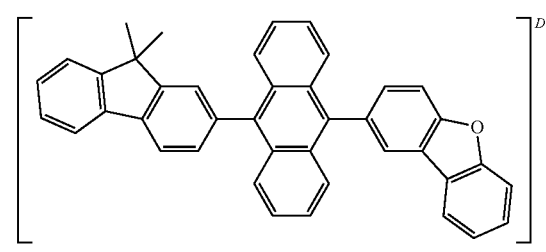
H-69
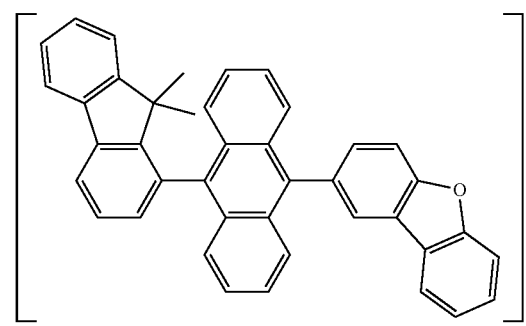
H-70
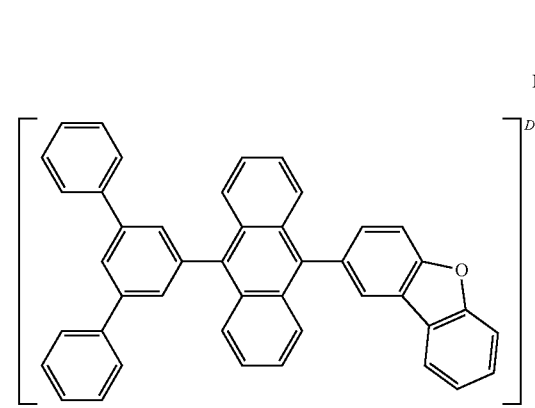
H-71
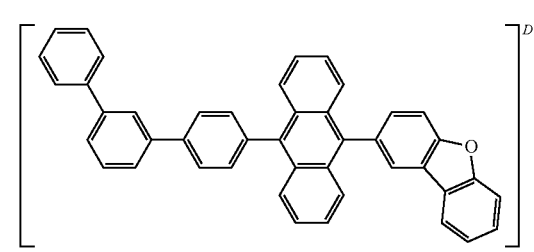
H-72
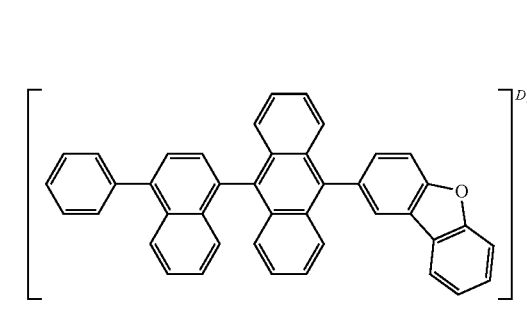
H-73
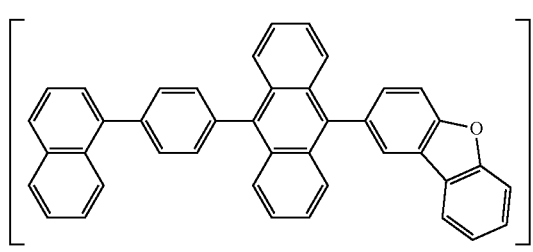

H-74
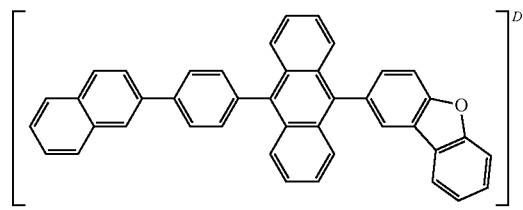
H-75
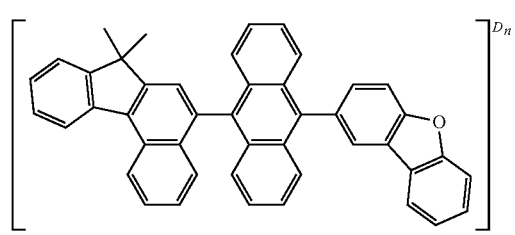
H-76
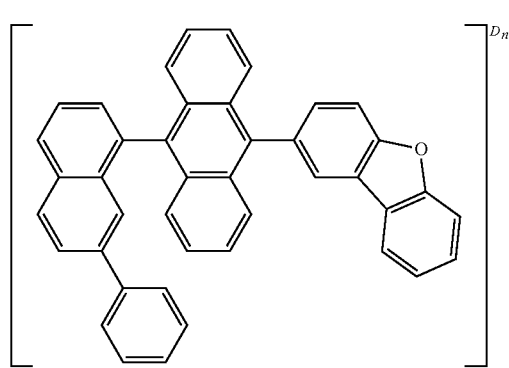
H-77
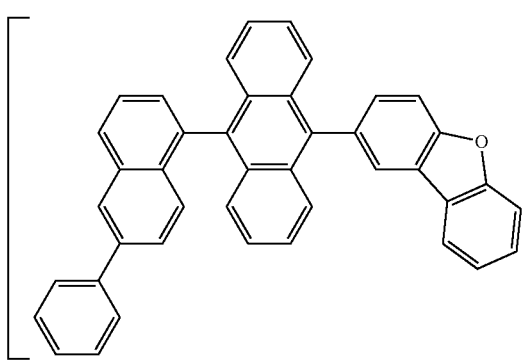
H-78
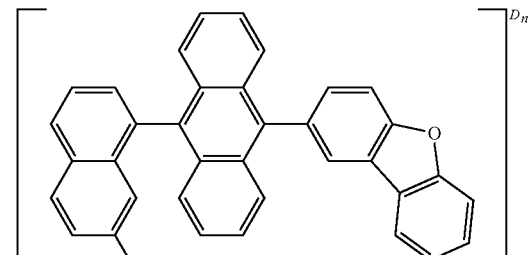
H-79
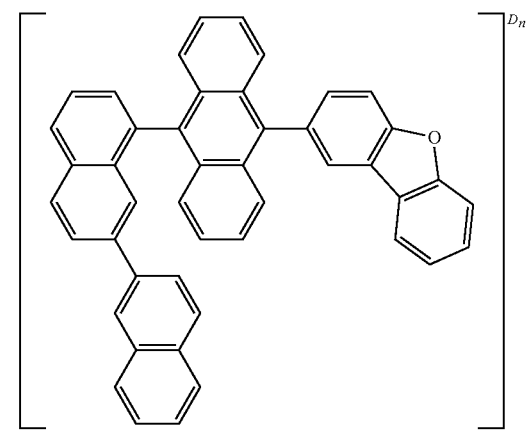
H-80
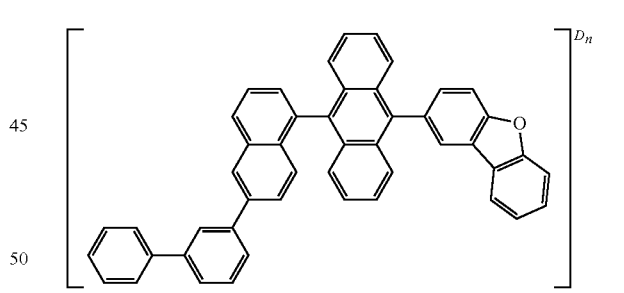
H-81
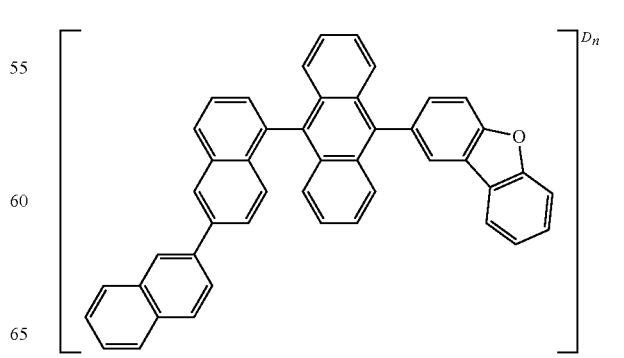

H-82
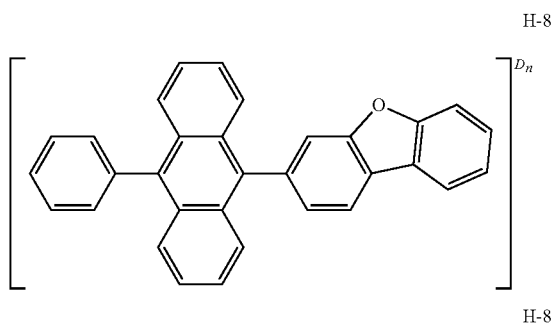
H-83
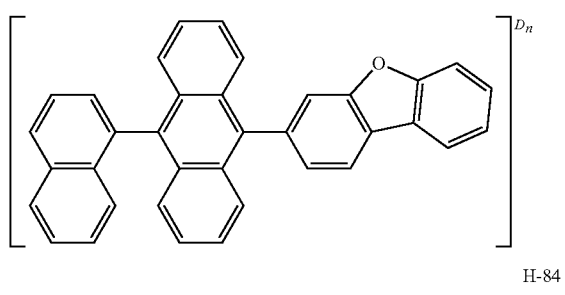
H-84
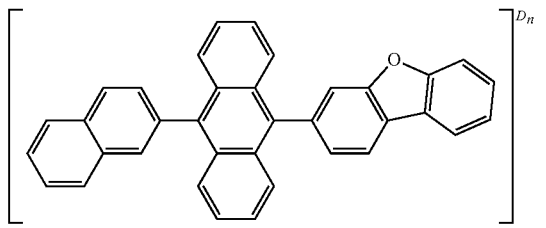
H-85
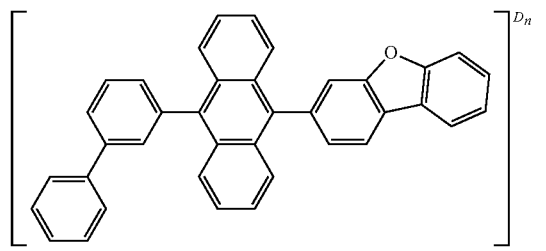
H-86
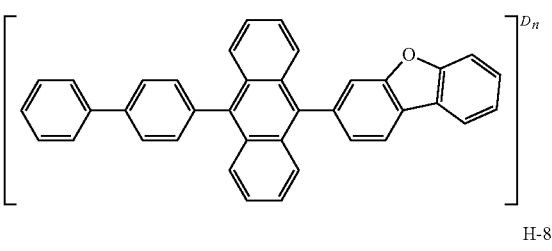
H-87
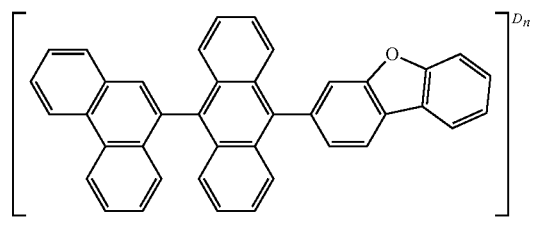
H-88
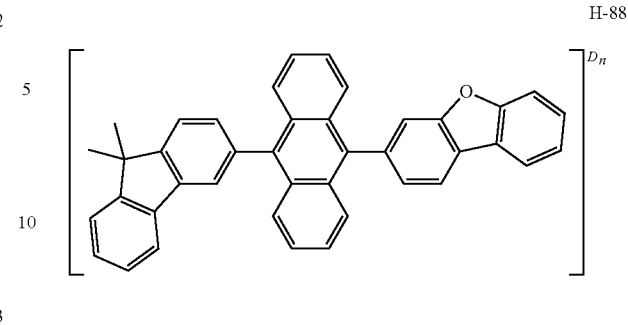
H-89
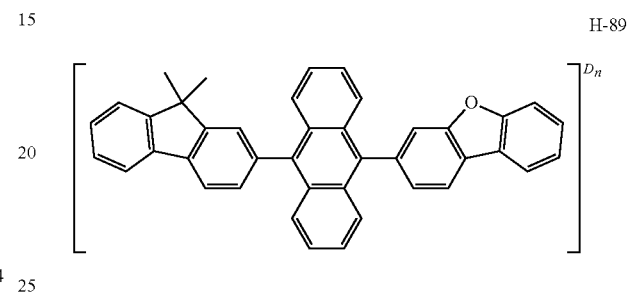
H-90
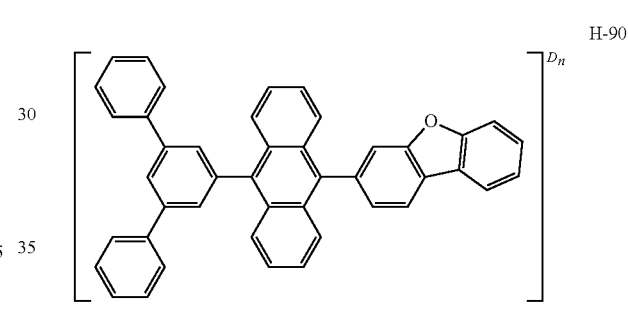
H-91
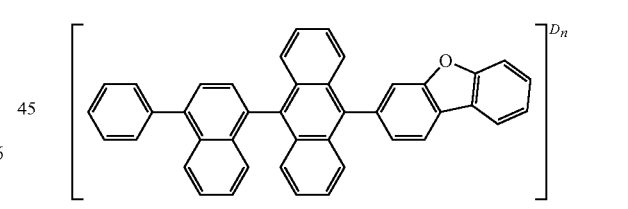
H-92
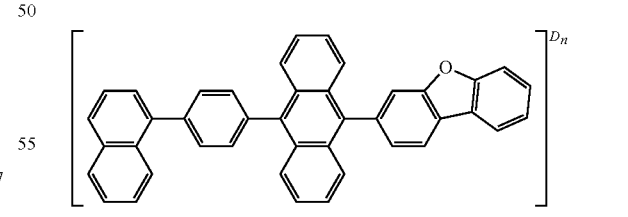
H-93
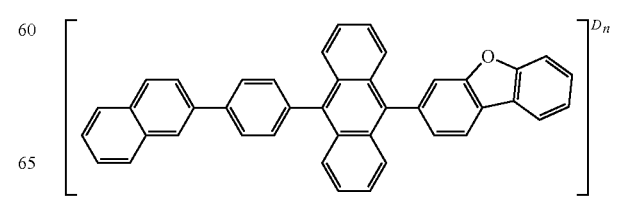

H-94
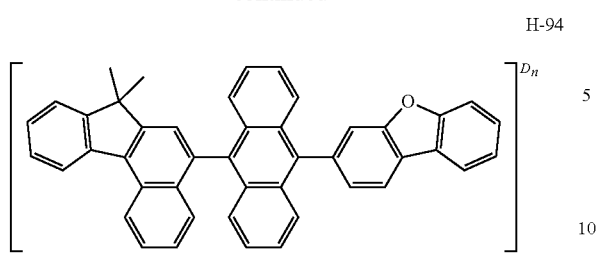
H-95
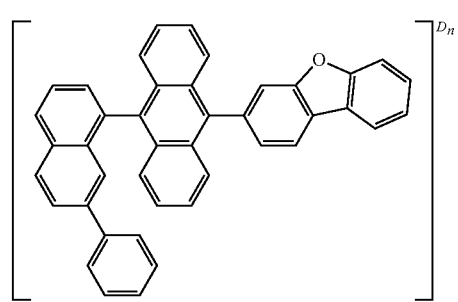
H-96
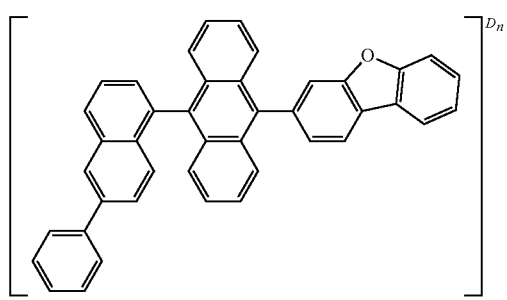
H-97
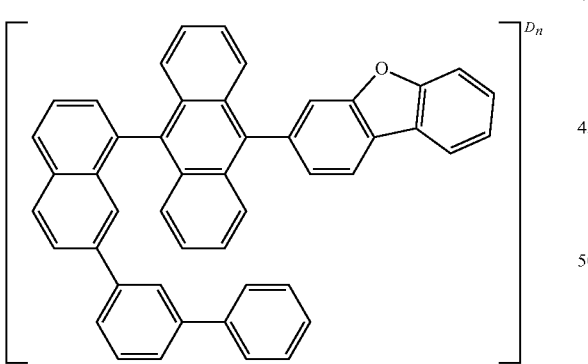
H-98
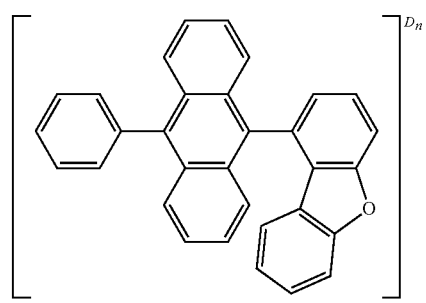
H-99
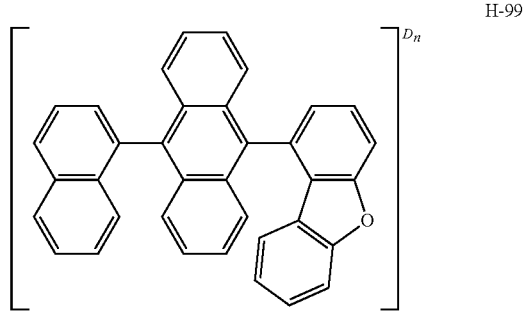
H-100
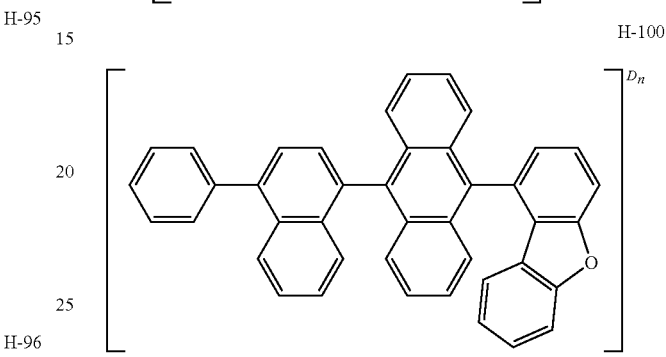
H-101
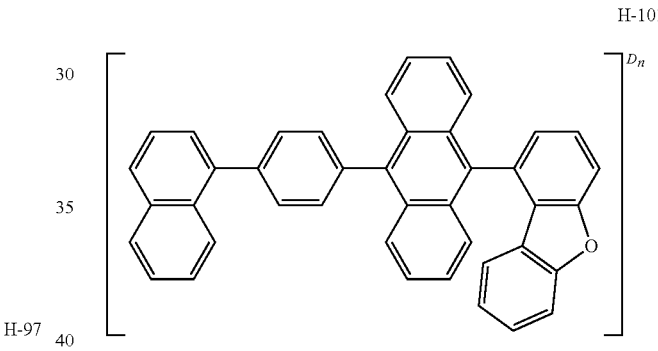
H-102
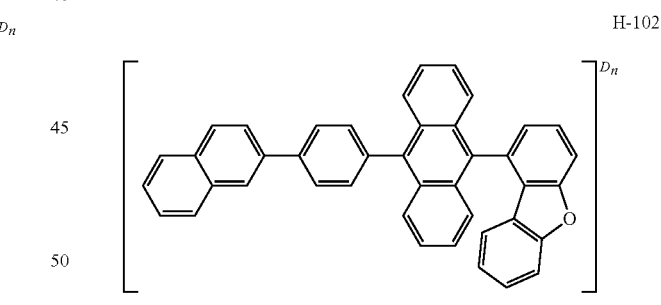
H-103
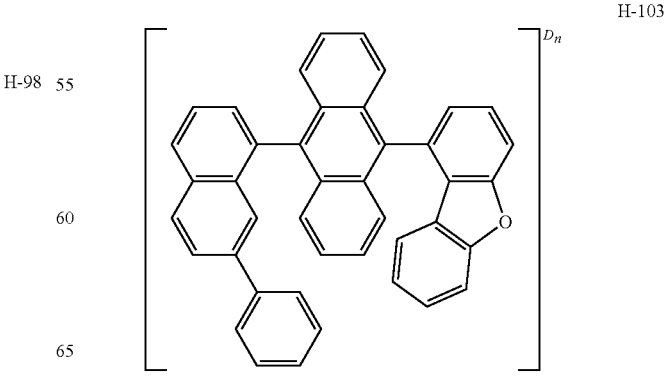

H-104
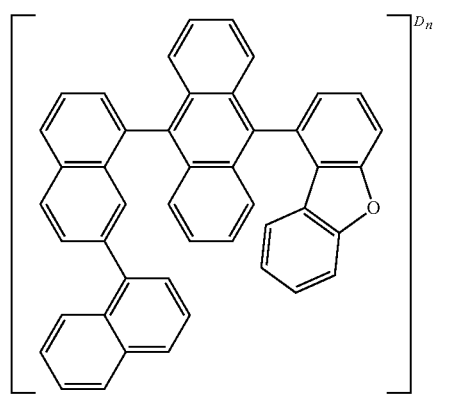
H-105
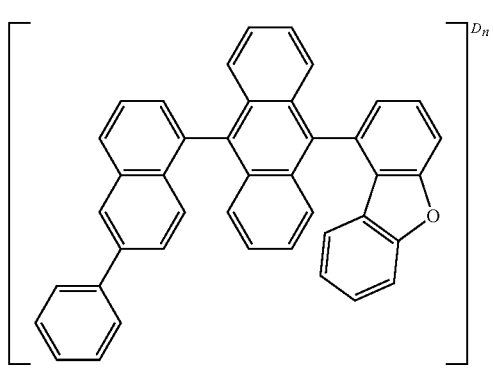
H-106
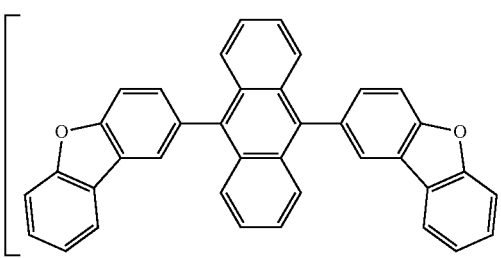
H-107
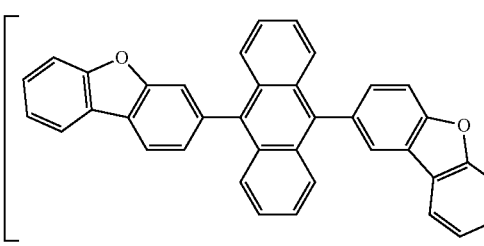
H-108
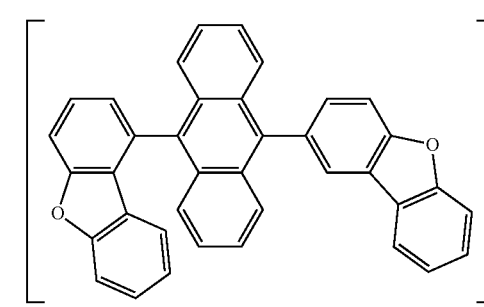
H-109
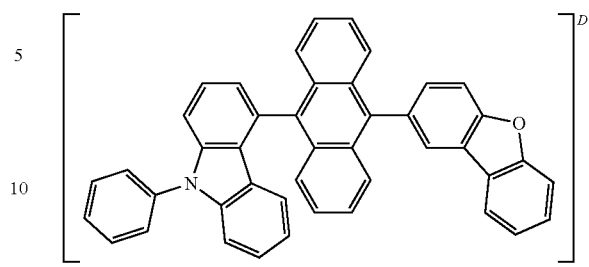
H-110
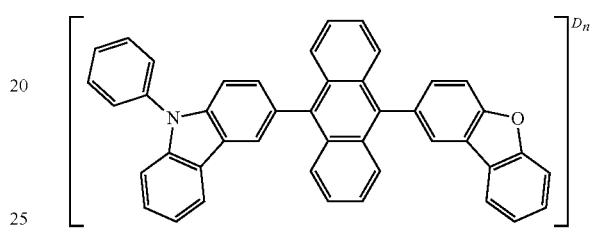
H-111
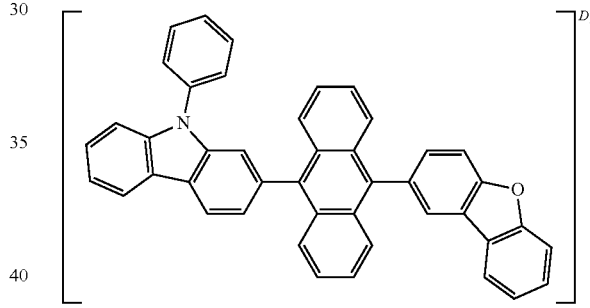
H-112
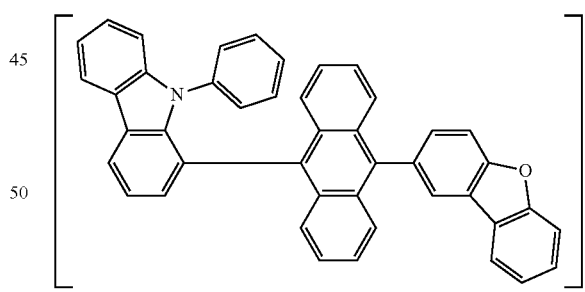
H-113
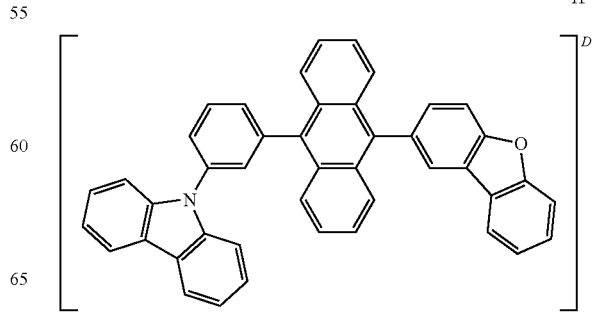

H-114
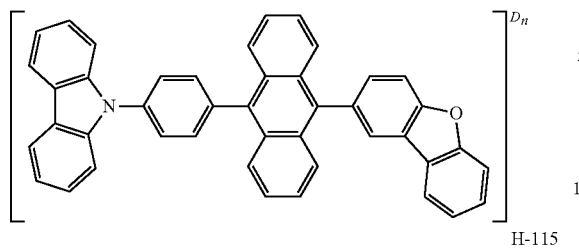
H-120
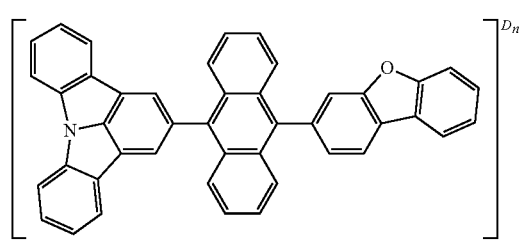
H-115
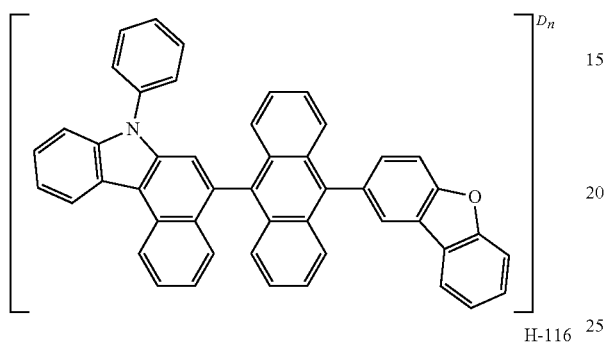
H-121
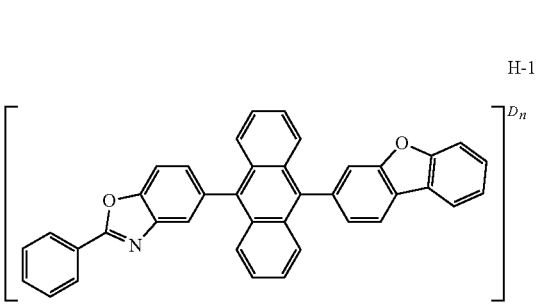
H-116
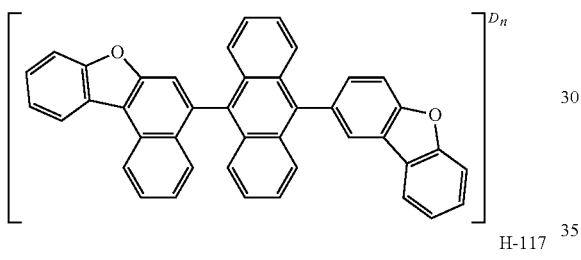
H-122
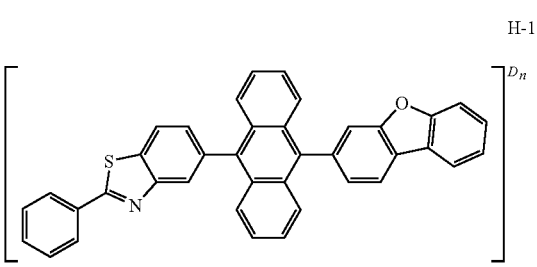
H-117
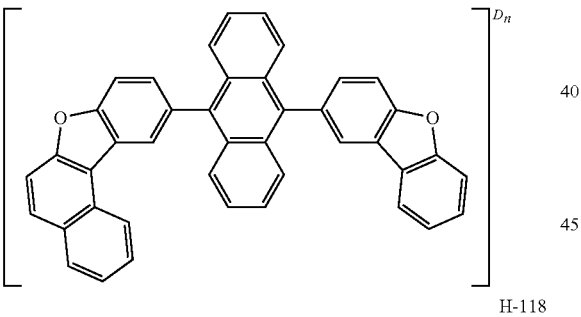
H-123
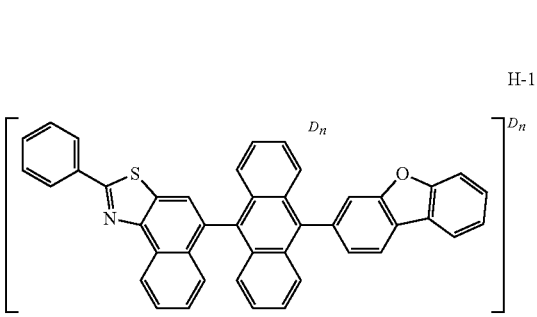
H-118
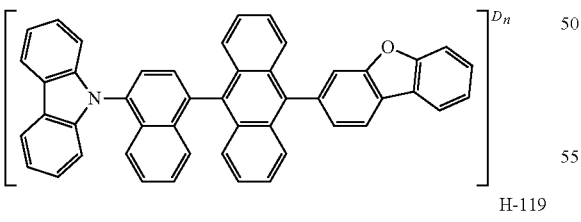
H-119
H-124
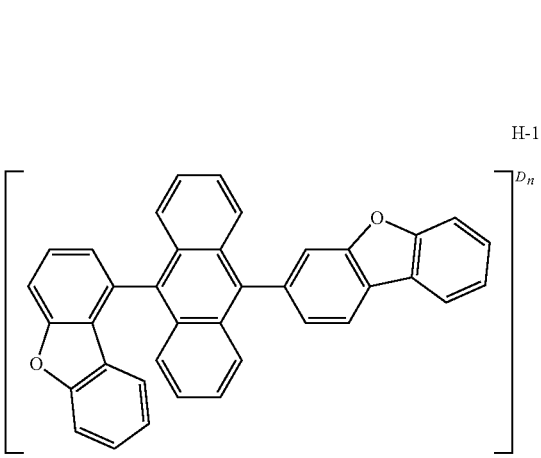

-continued
H-125
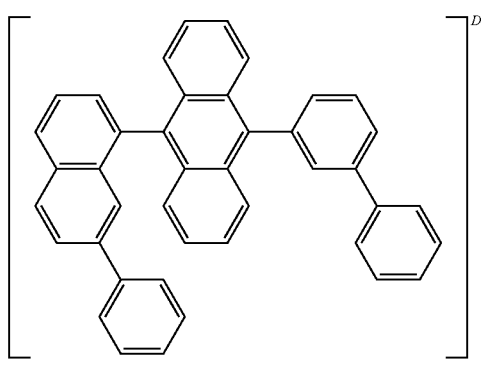
H-126
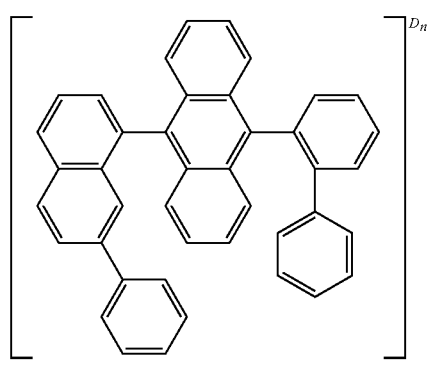
H-127
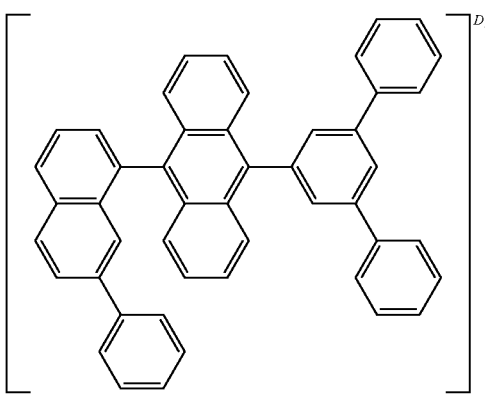
H-128
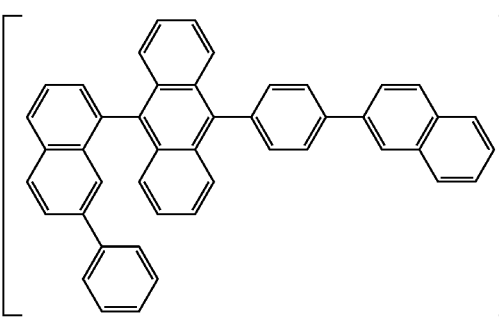
-continued
H-129
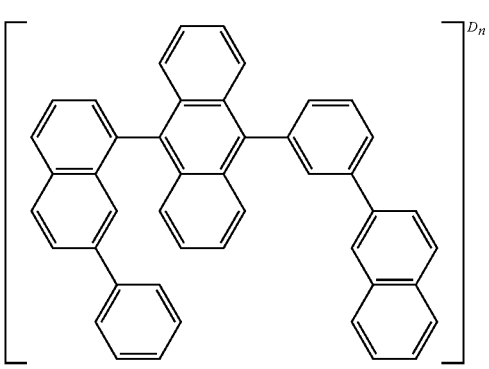
H-130
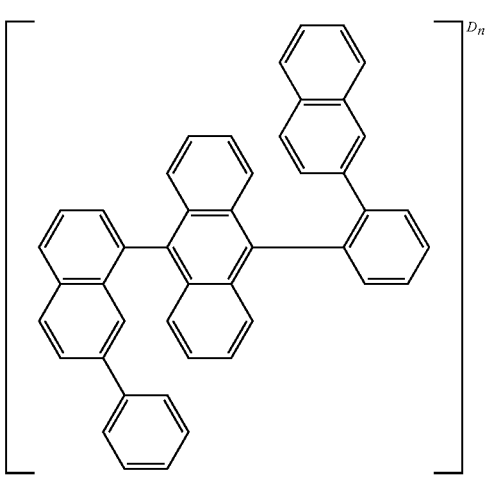
H-131
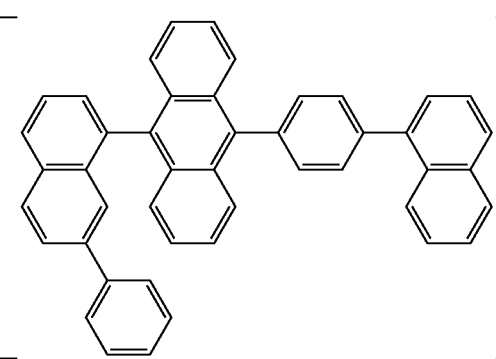
H-132
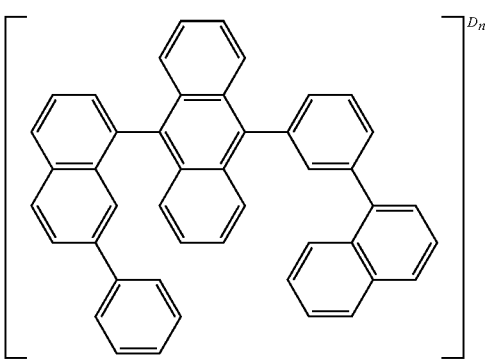

H-133
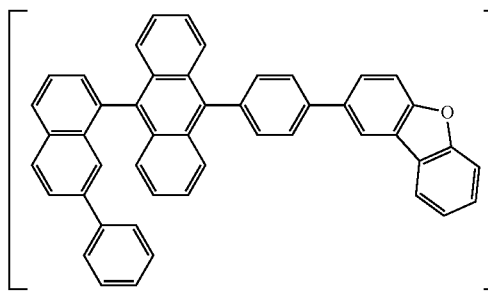
H-137
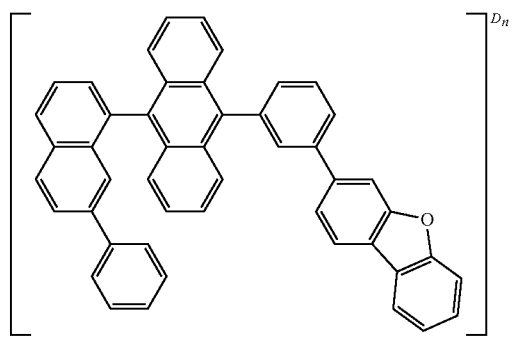
H-134
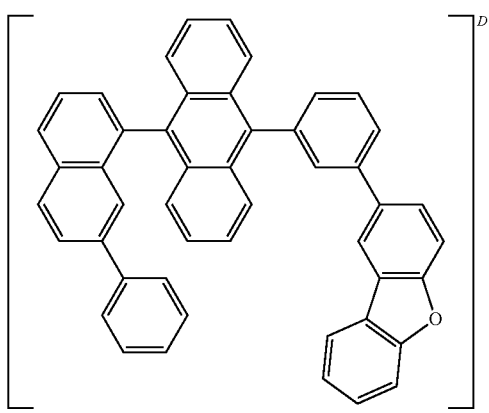
H-138
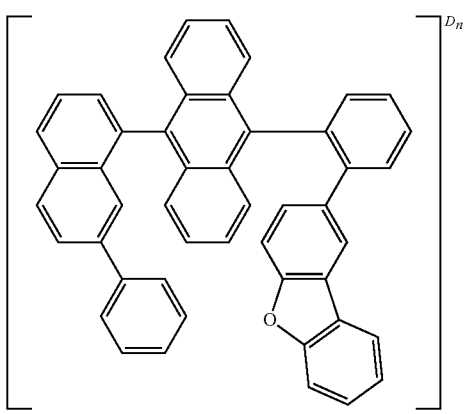
H-135
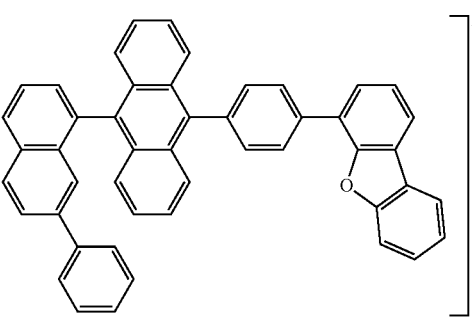
H-139
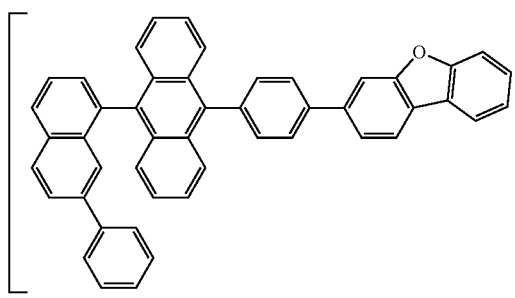
H-136
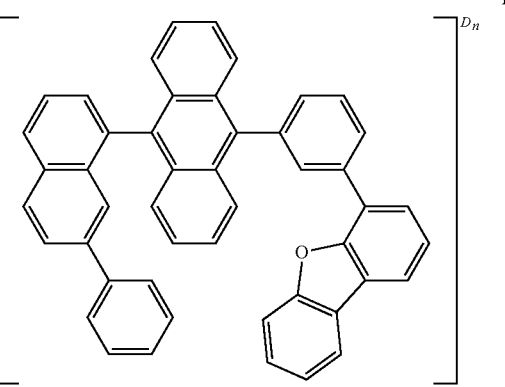
H-140

H-141
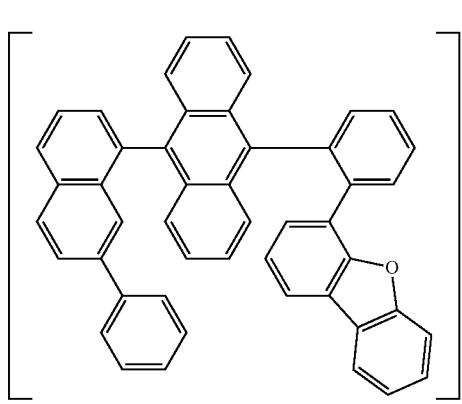
H-142
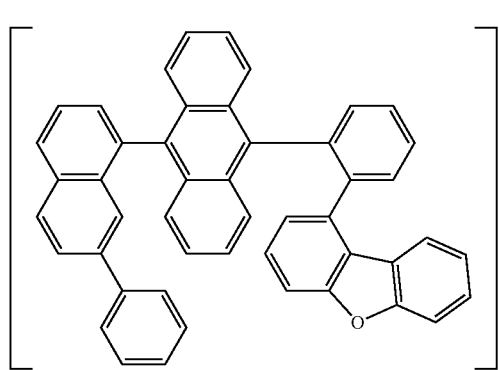
H-143
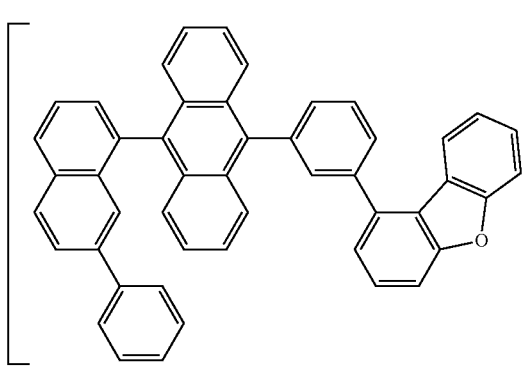
H-144
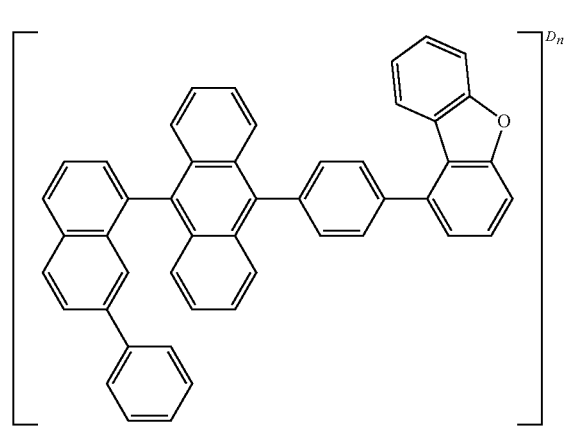
H-145
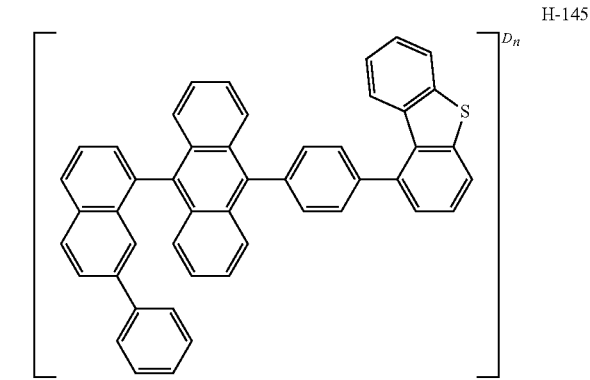
H-146
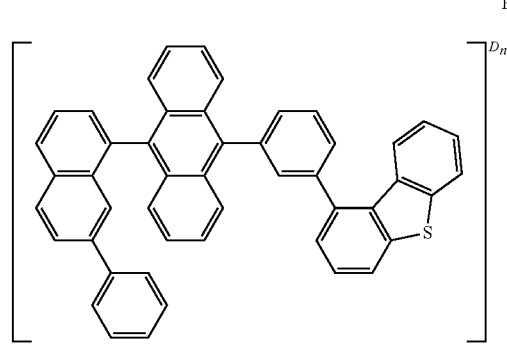
H-147
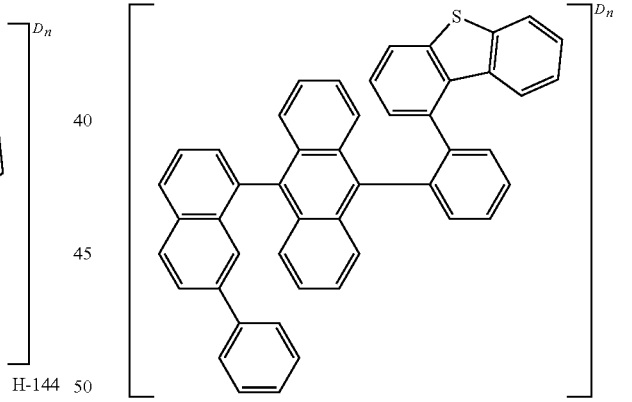
H-148
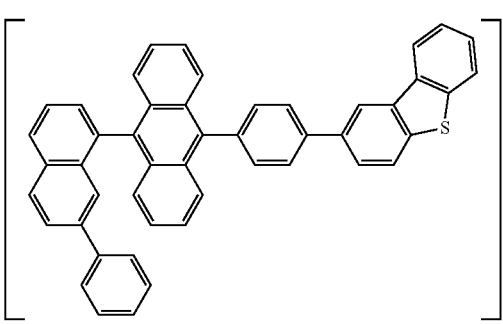

H-149
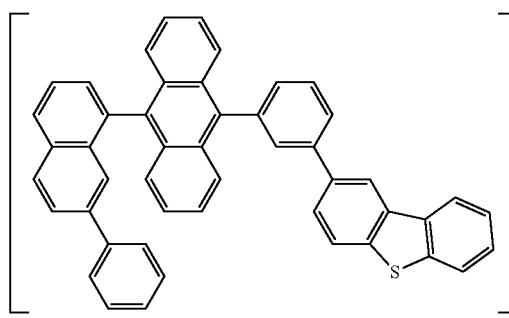
H-153
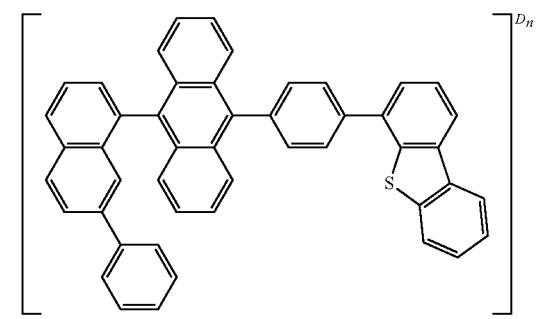
H-150
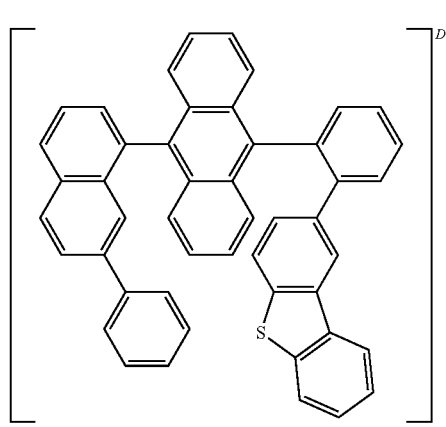
H-154
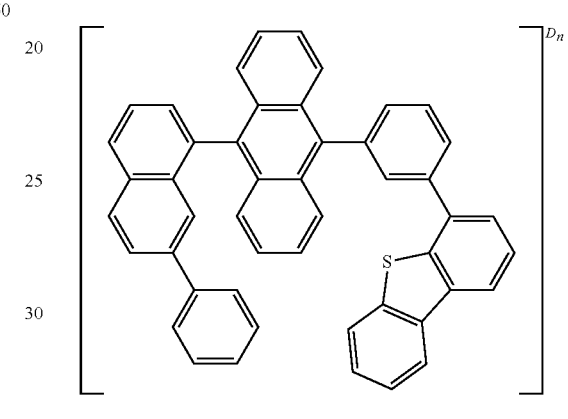
H-151
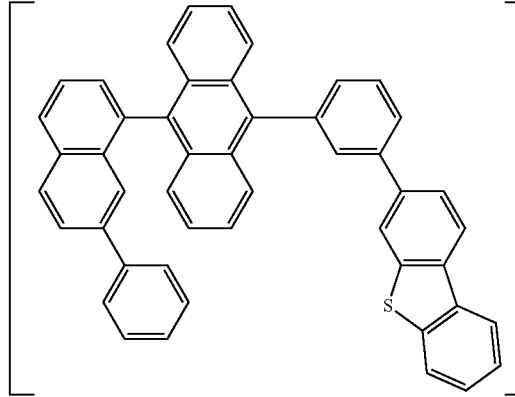
H-155
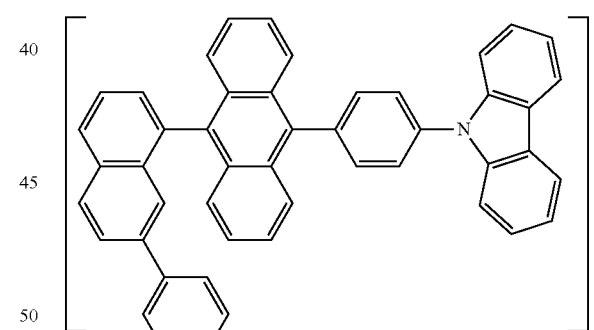
H-152
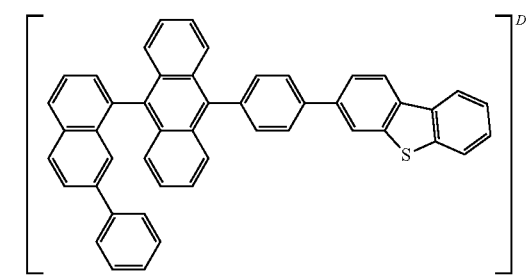
H-156
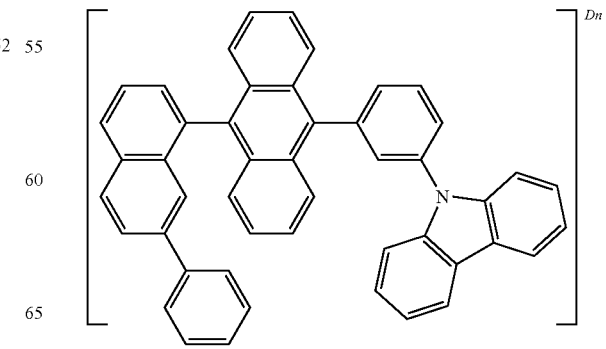

-continued
H-157
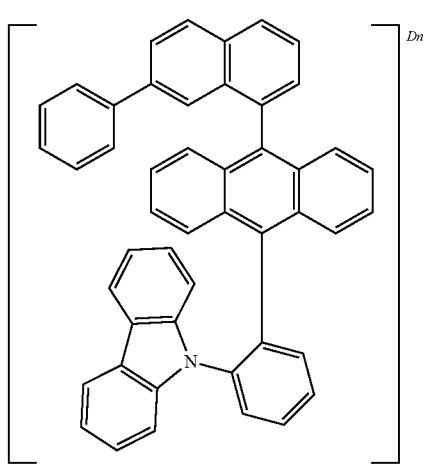
H-158
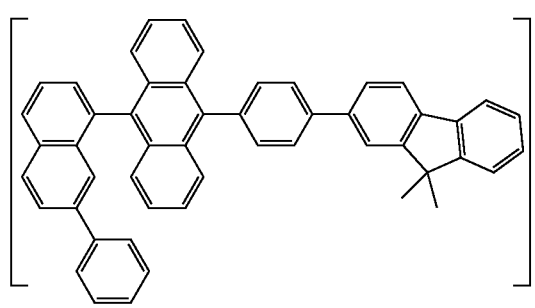
H-159
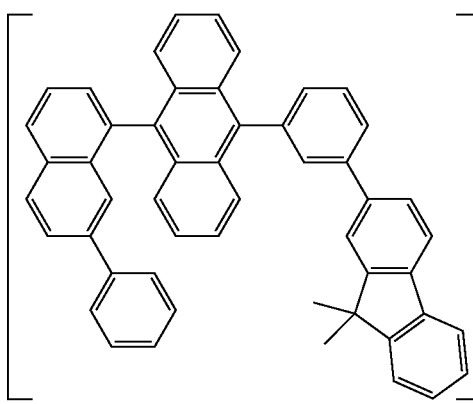
H-160
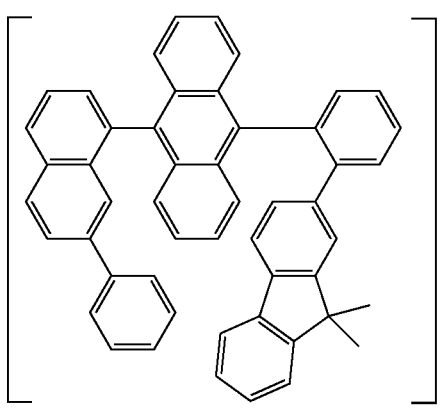
-continued
H-161
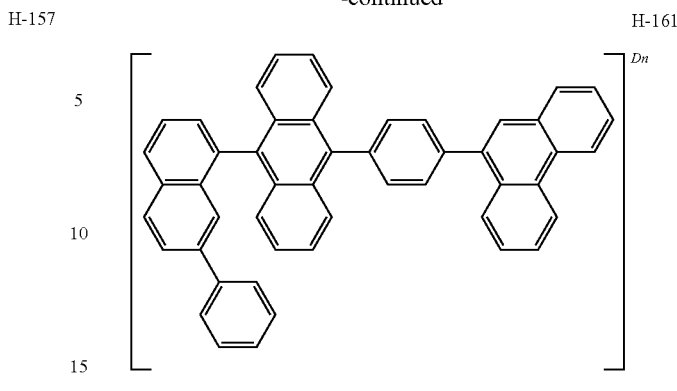
H-162
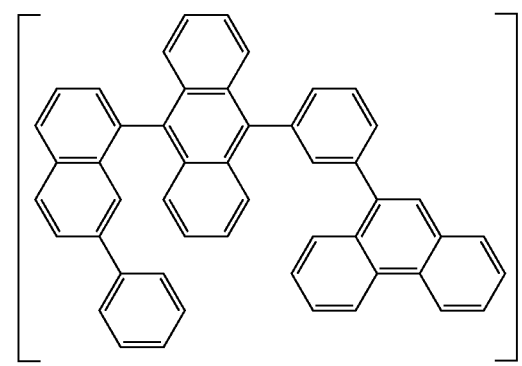
H-163
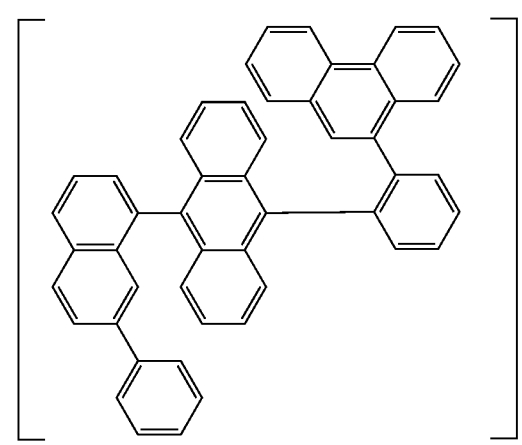
H-164
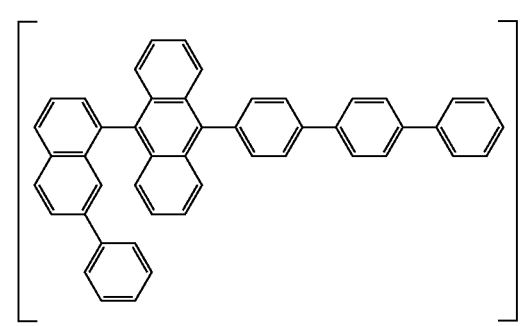

H-165
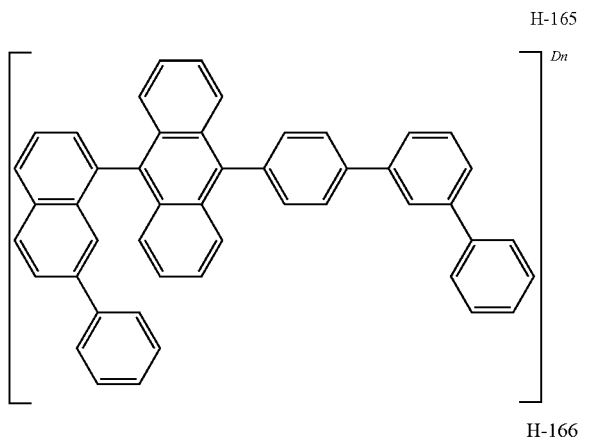
H-166
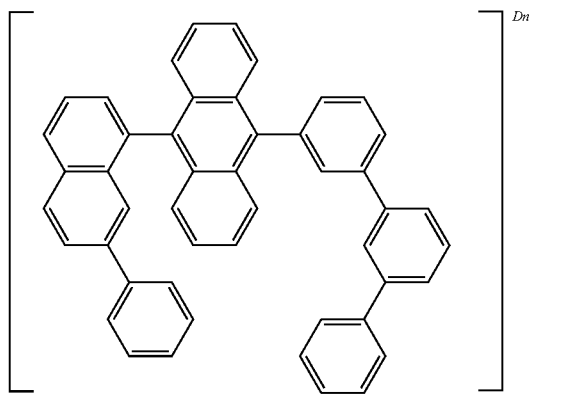
H-167
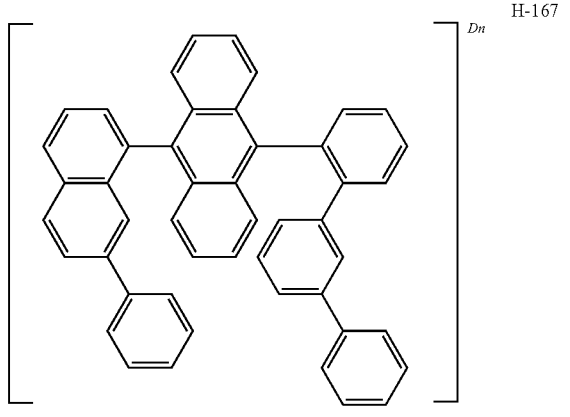
H-168
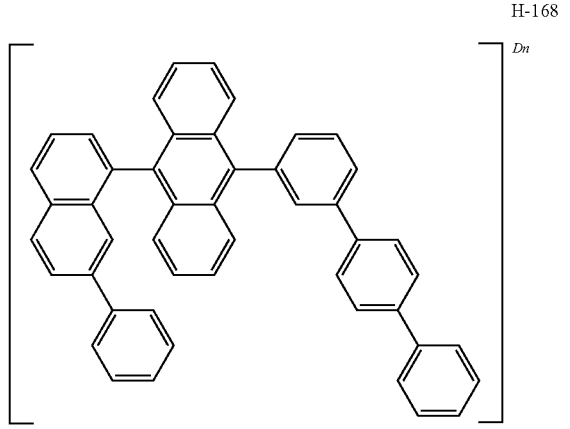
H-169
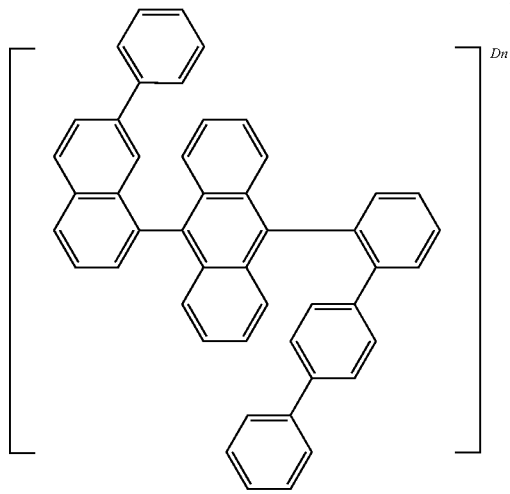
H-170
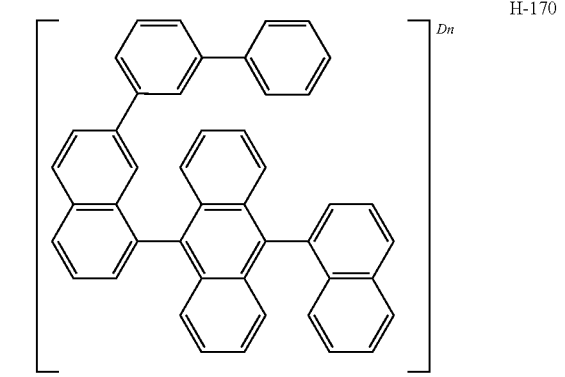
H-171
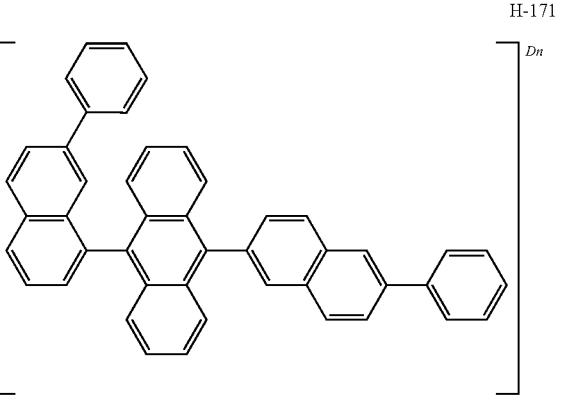

H-172
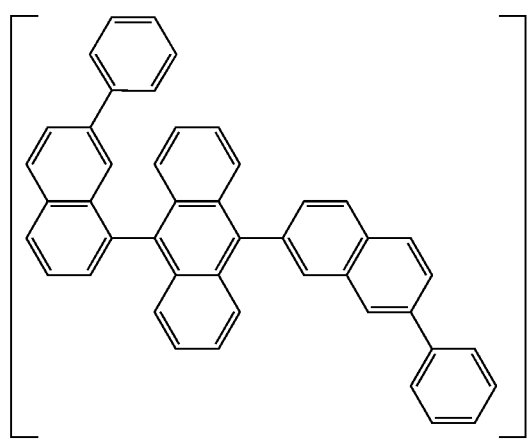
H-173
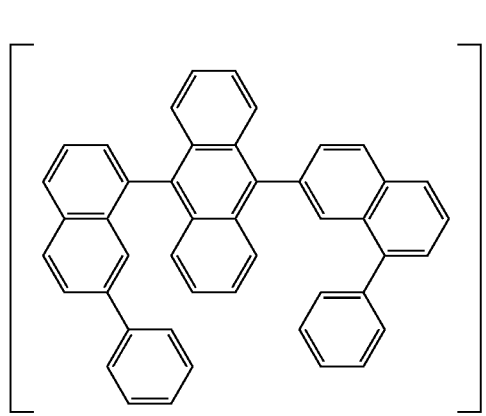
H-174
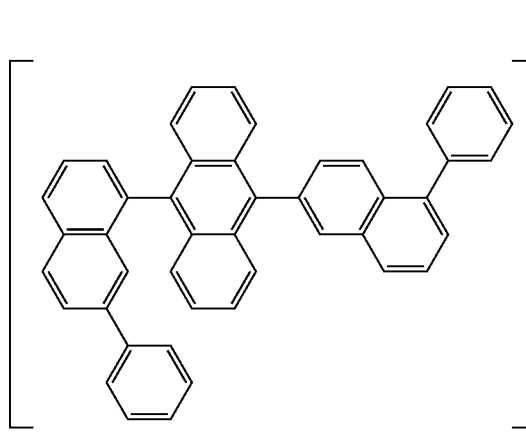
H-175
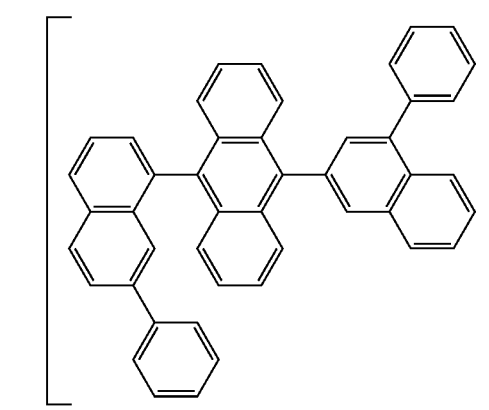
H-176
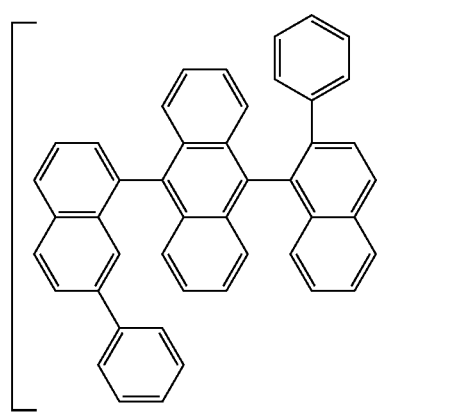
H-177

H-178
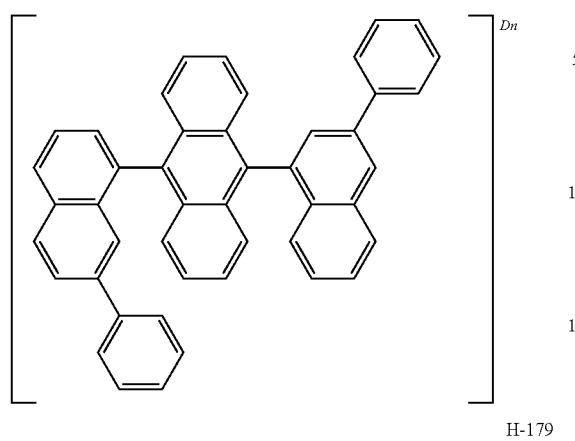
H-179
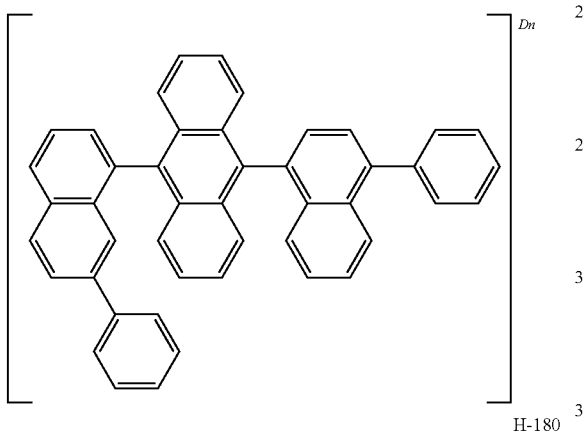
H-180
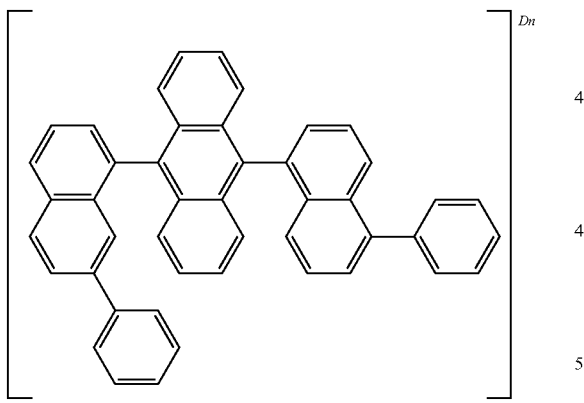
H-181
H-182
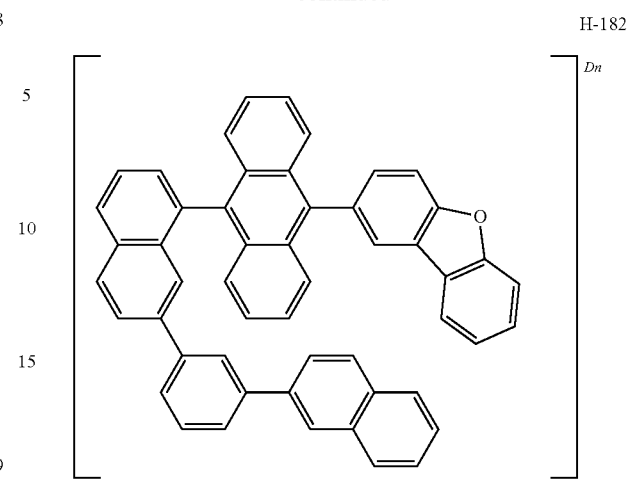
H-183
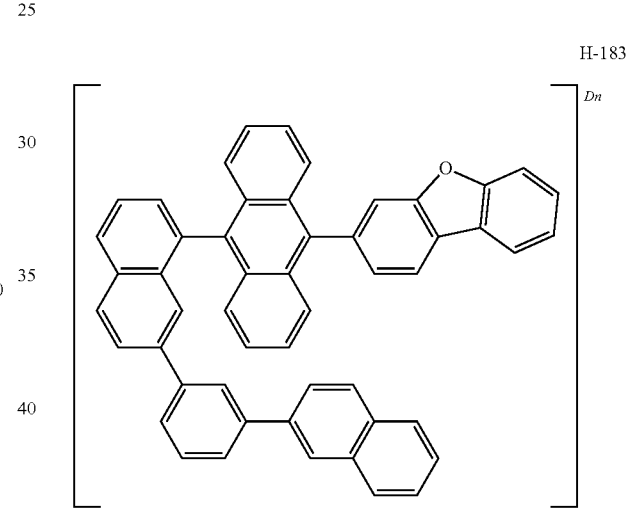
H-184
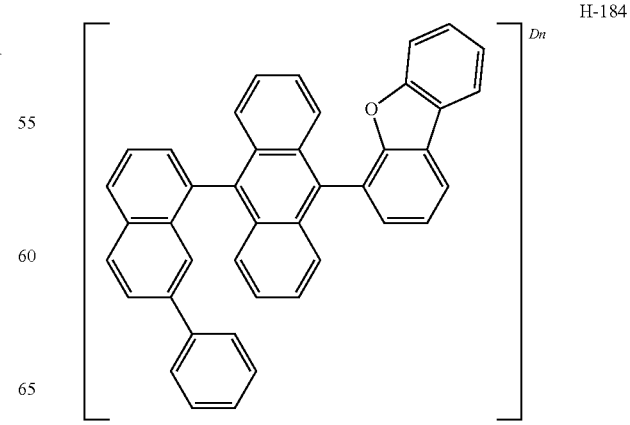

-continued
H-185
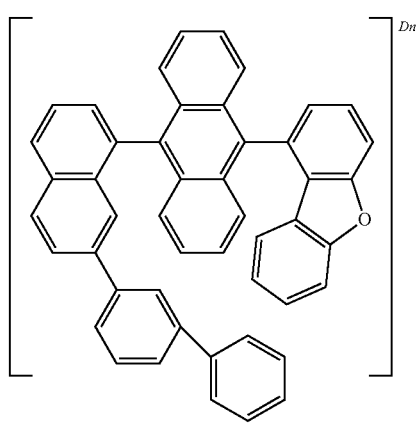
H-186
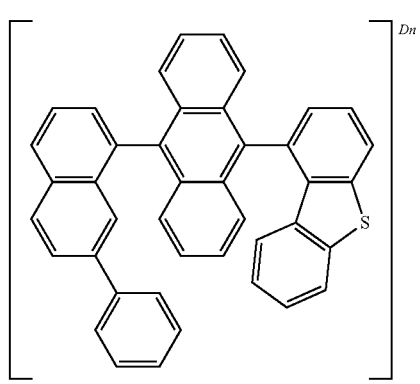
H-187
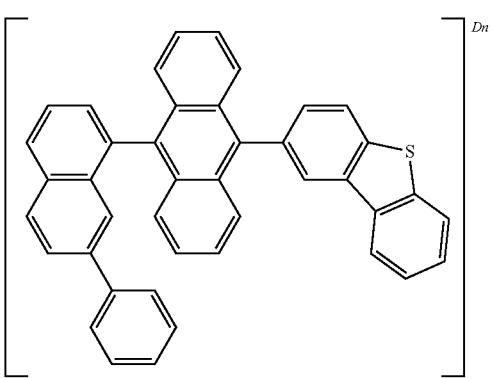
H-188
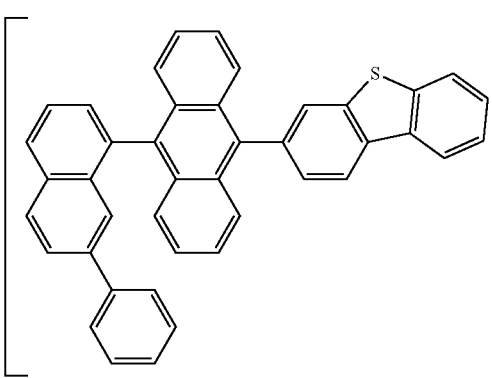
-continued
H-189
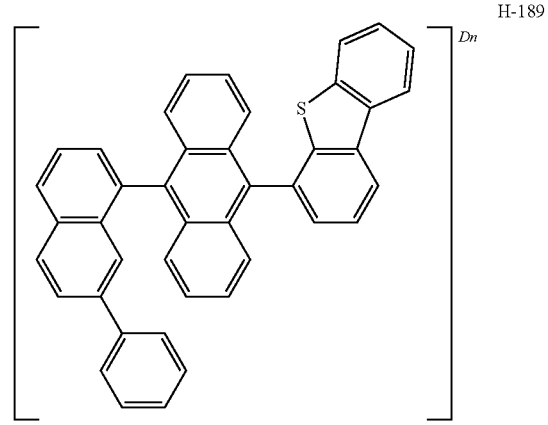
H-190
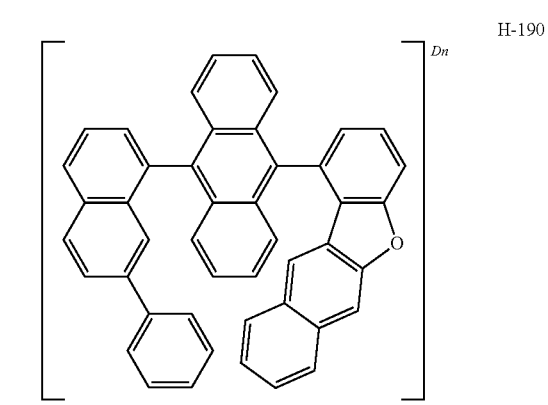
H-191
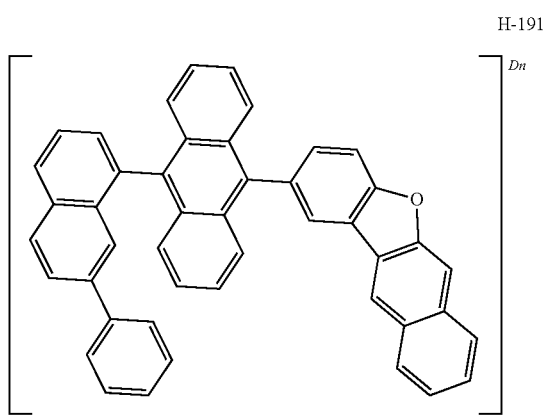
H-192
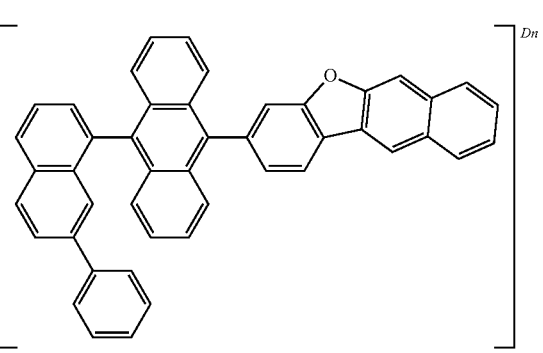

H-193
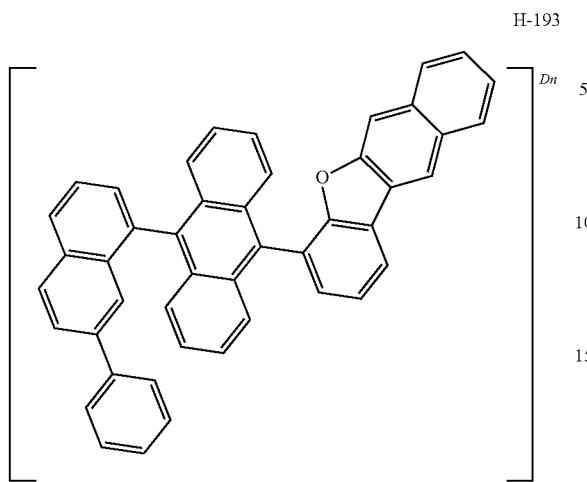
H-194
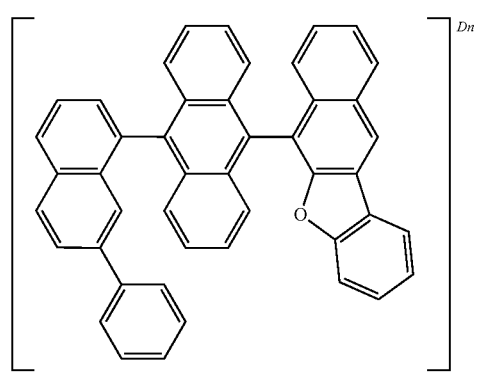
H-195
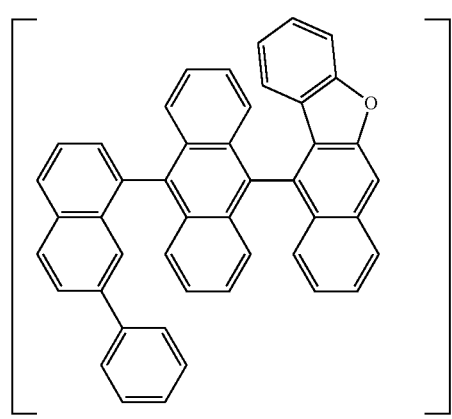
H-196
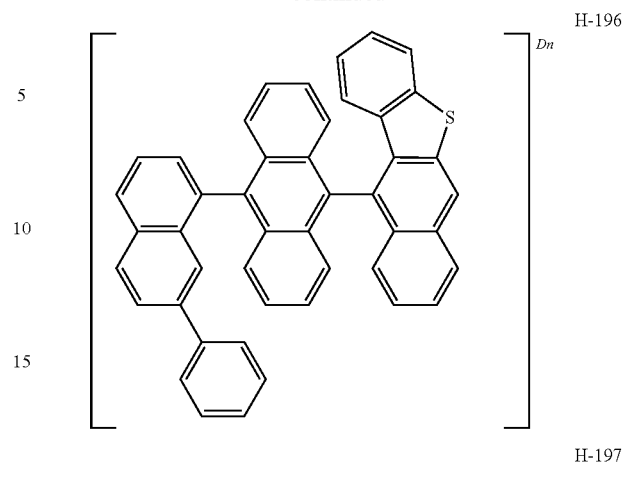
H-197
H-198
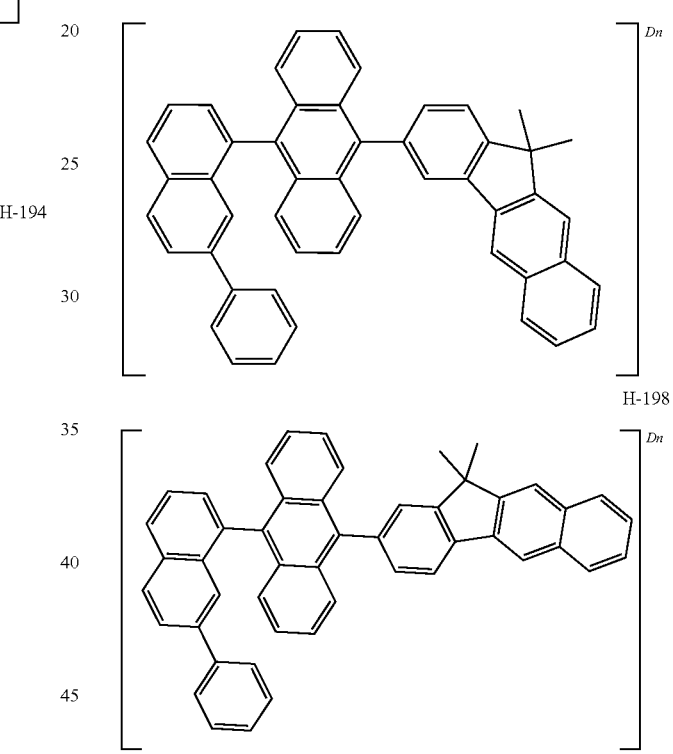
H-199
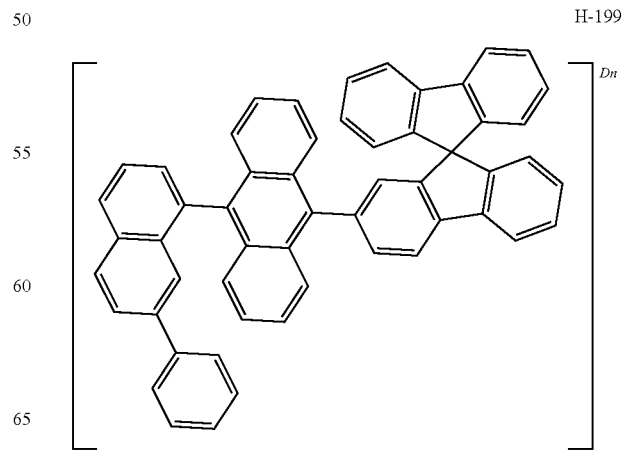

H-200
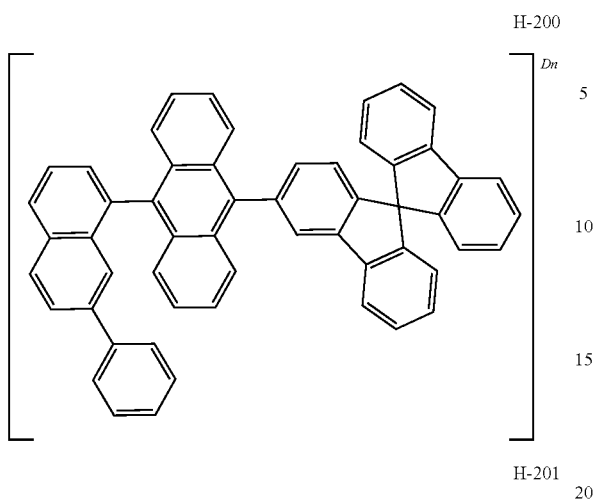
H-201
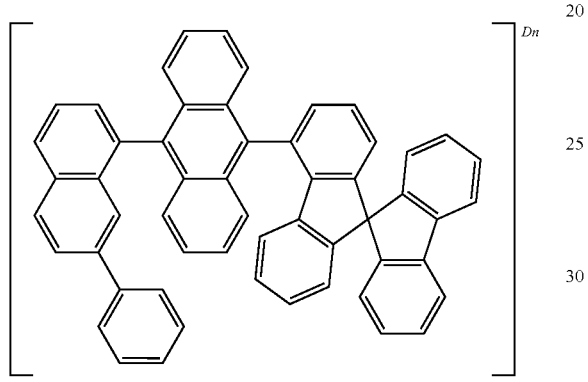
H-202
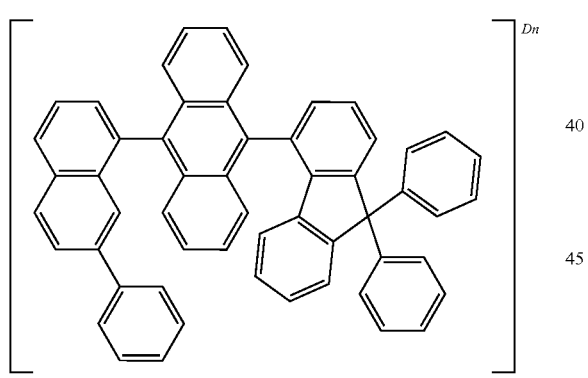
H-203
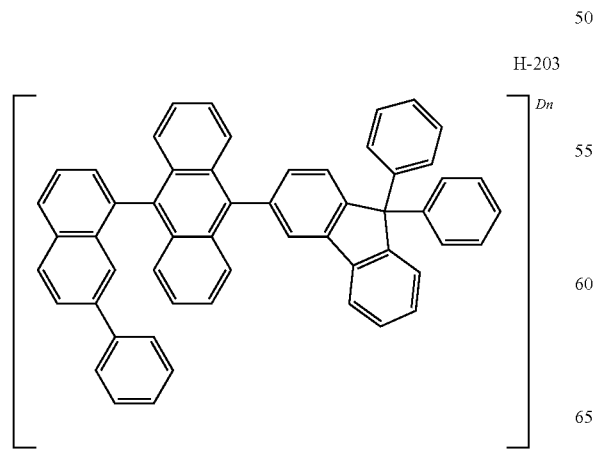
H-204
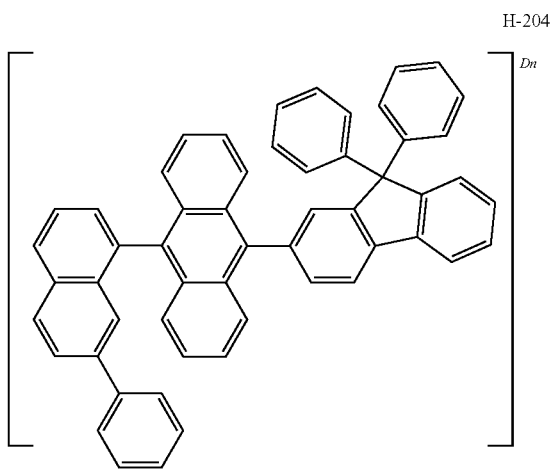
H-205
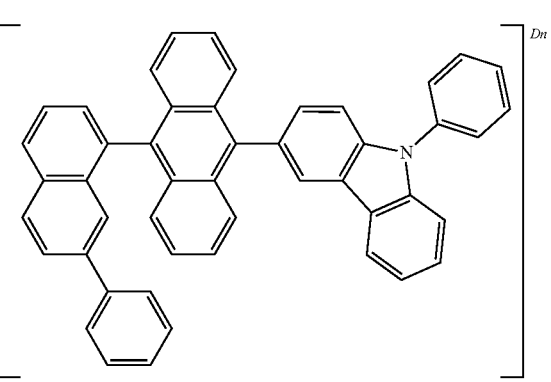
H-206
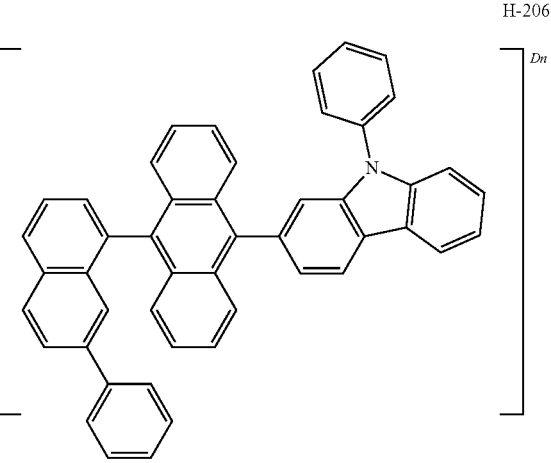

H-207
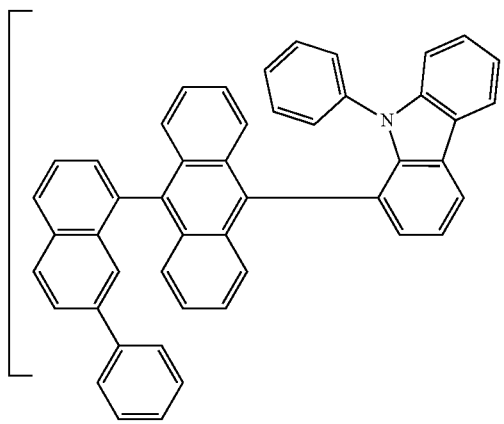
H-208
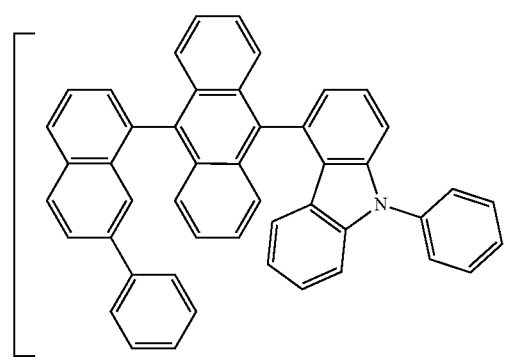
H-209
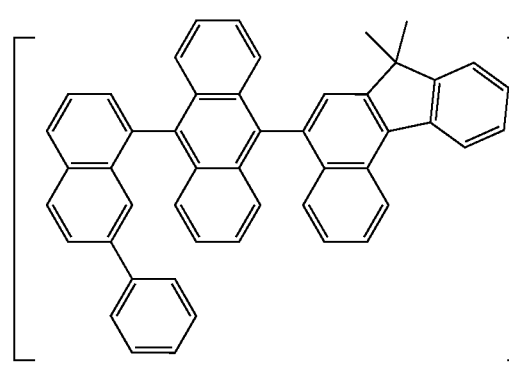
H-210
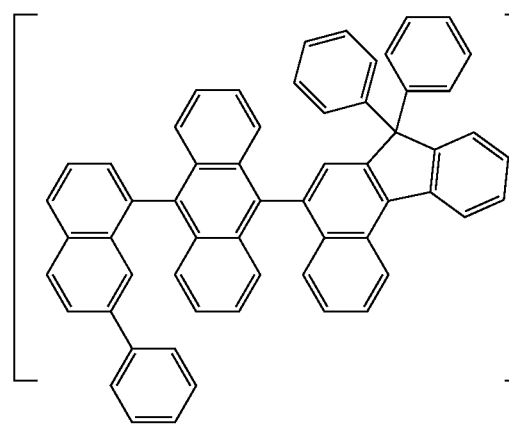
H-211
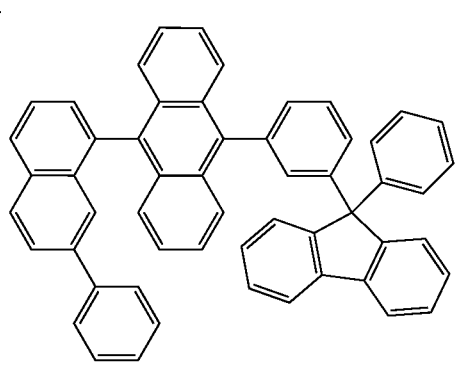
H-212
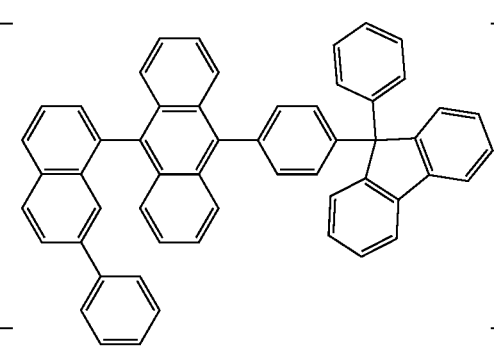
H-213
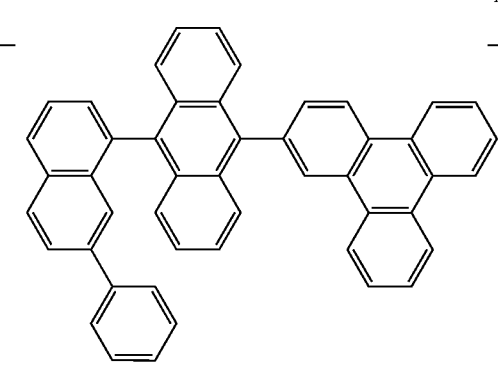
H-214
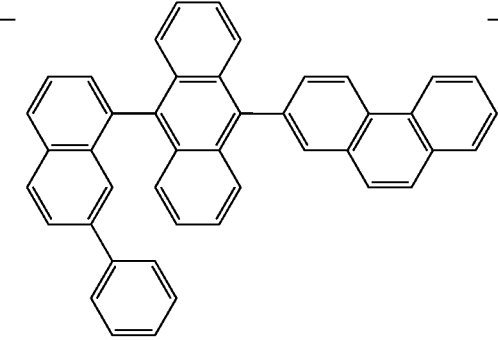

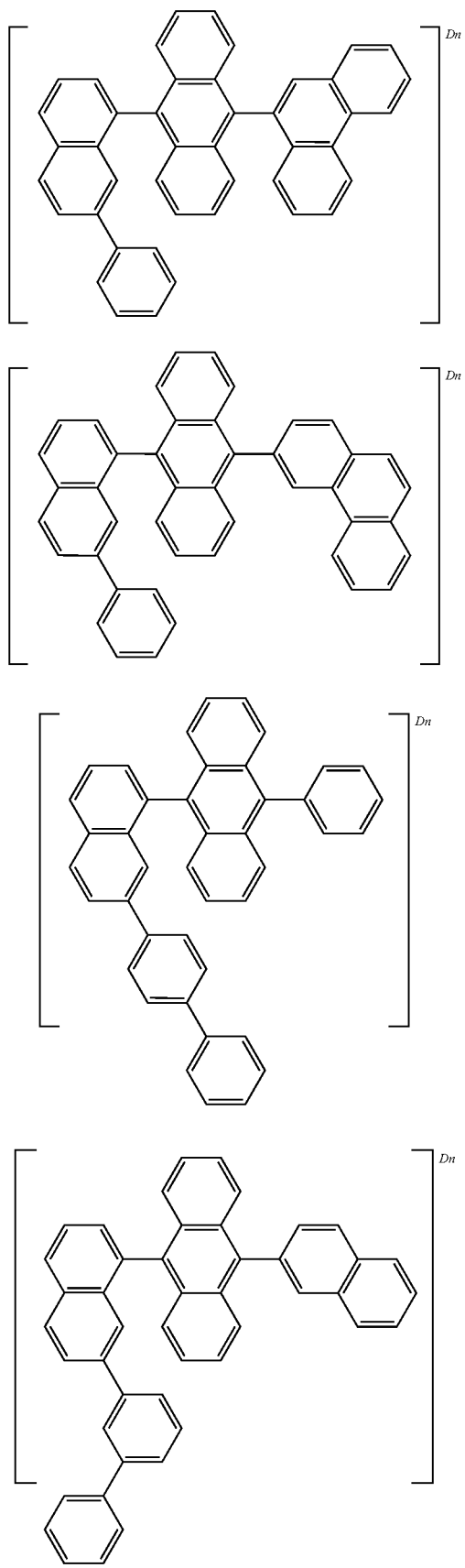
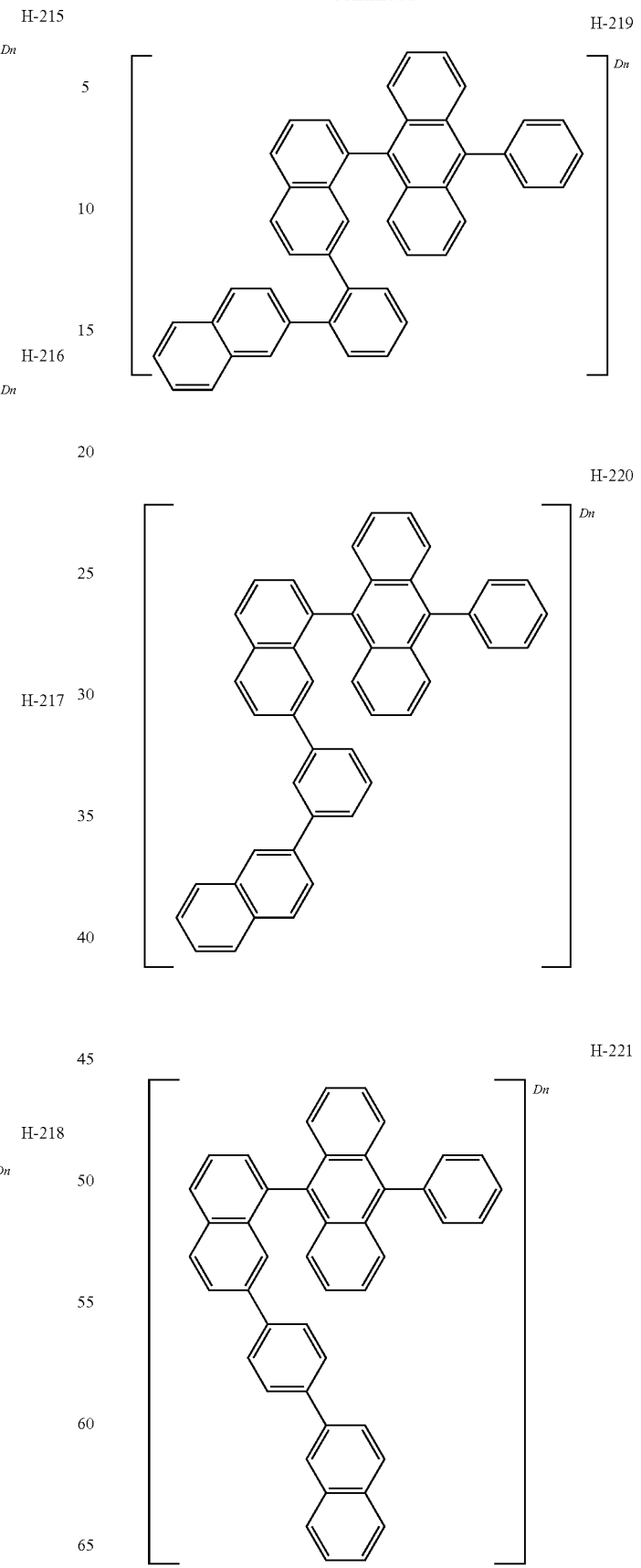

H-222
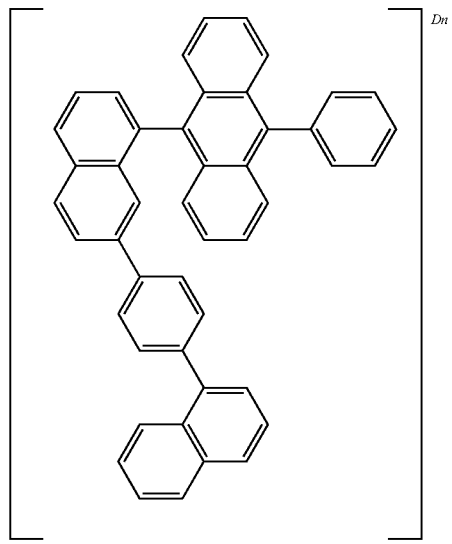
H-225
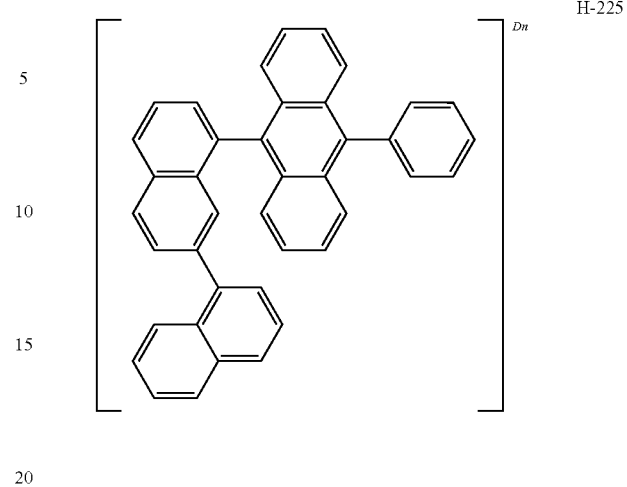
H-223
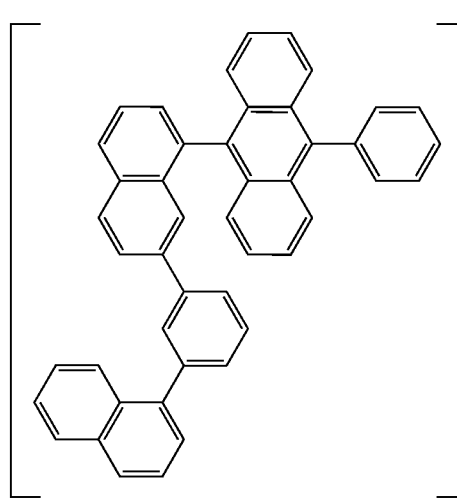
H-226
H-224
H-227
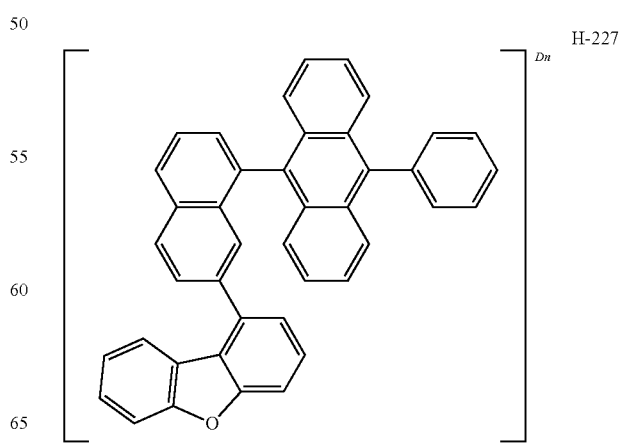

H-228
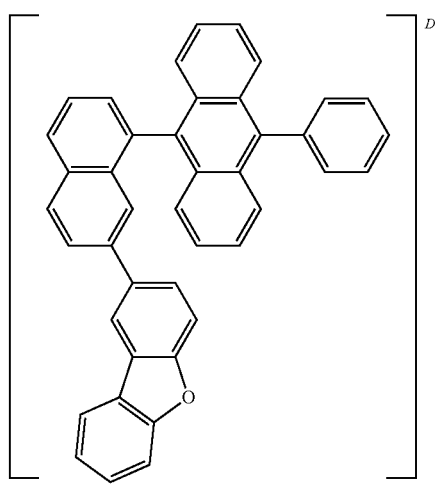
H-231
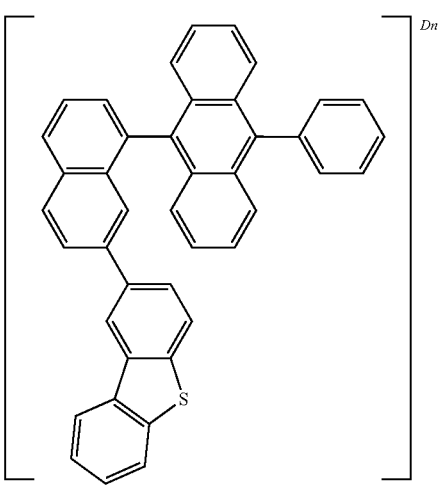
H-229
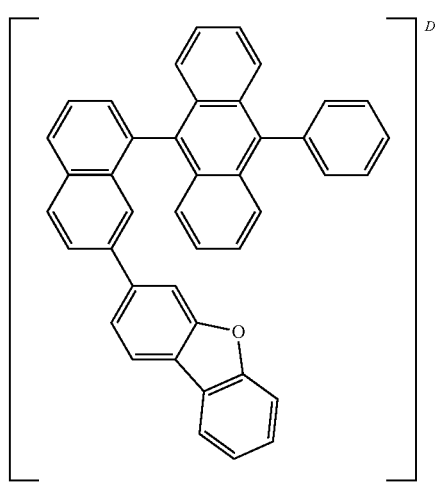
H-232
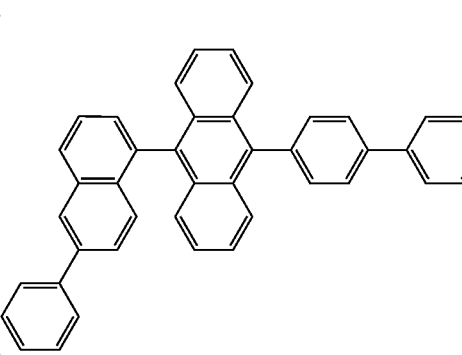
H-233
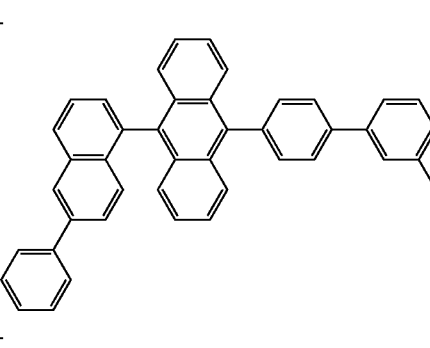
H-230
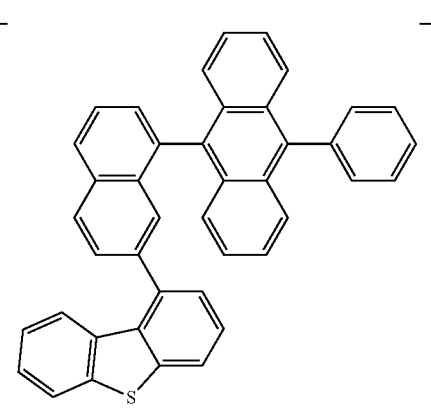
H-234

H-235
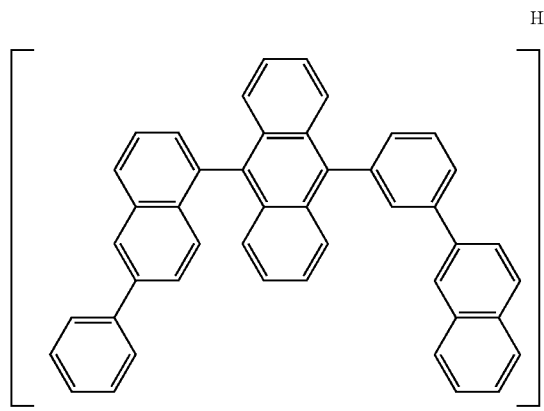
H-236
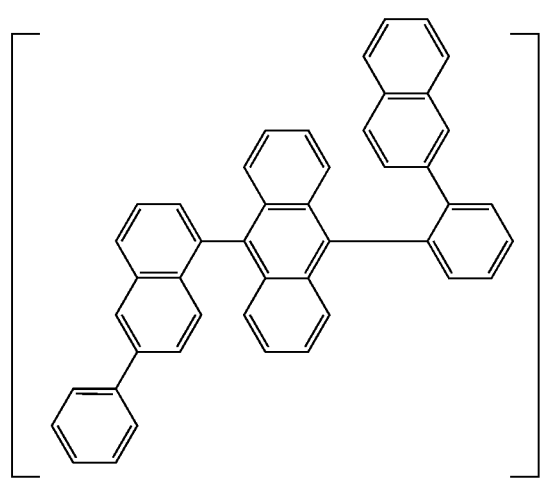
H-237
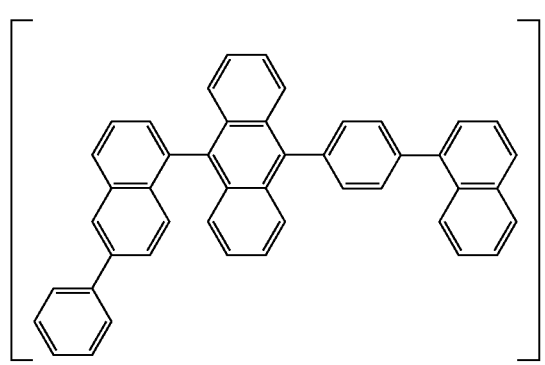
H-238
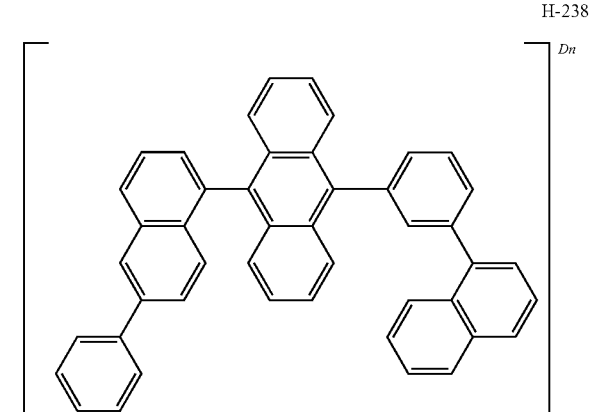
H-239
H-240
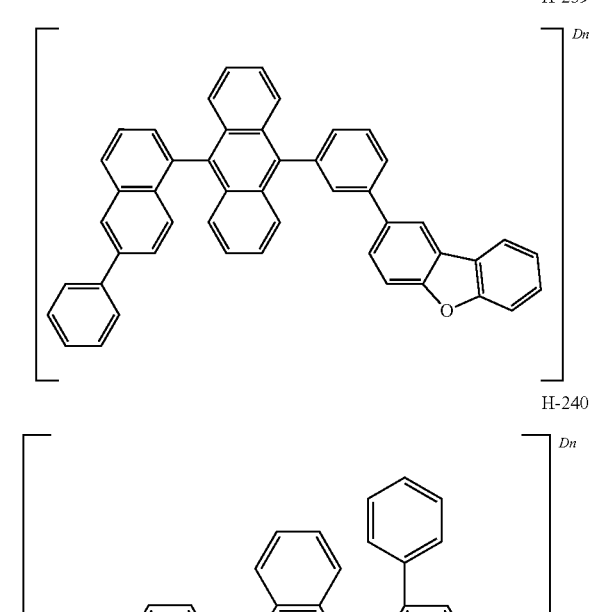
H-241
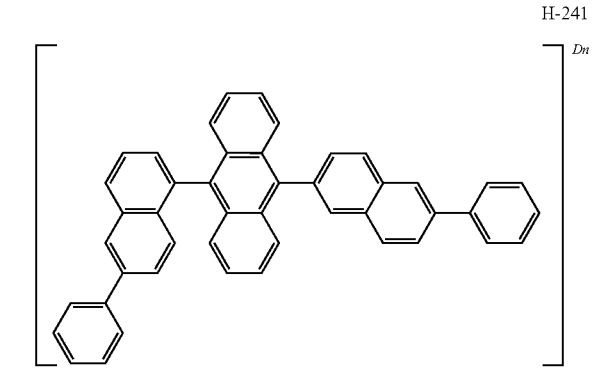

-continued
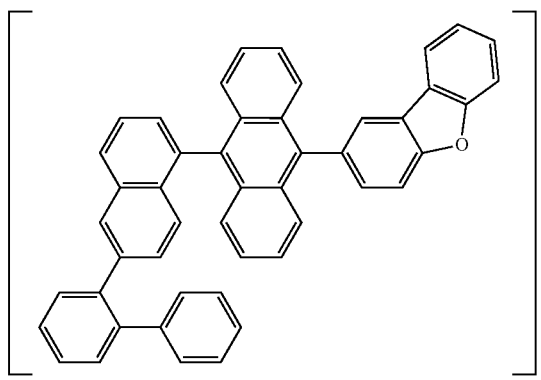
H-242
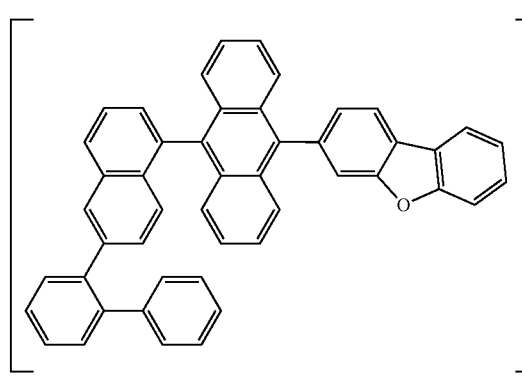
H-243
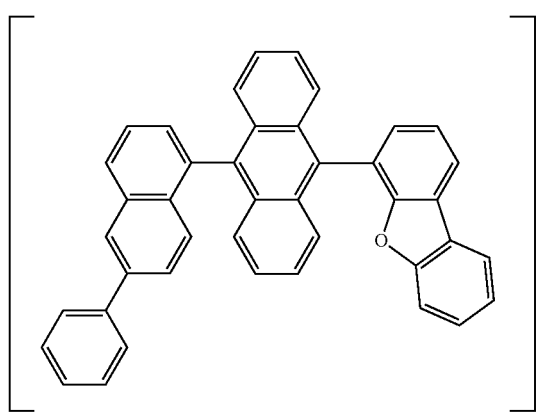
H-244
-continued
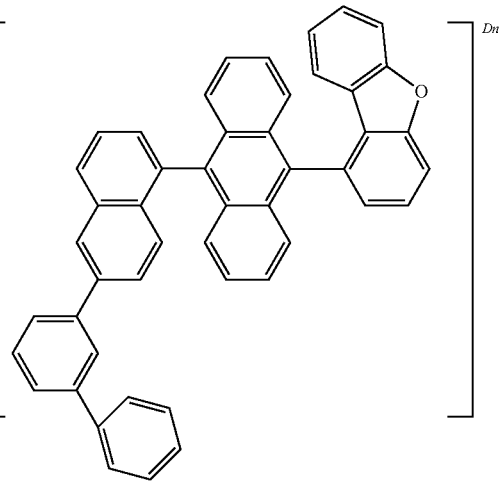
H-245
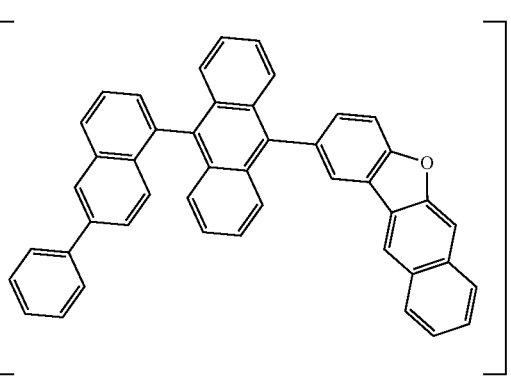
H-246
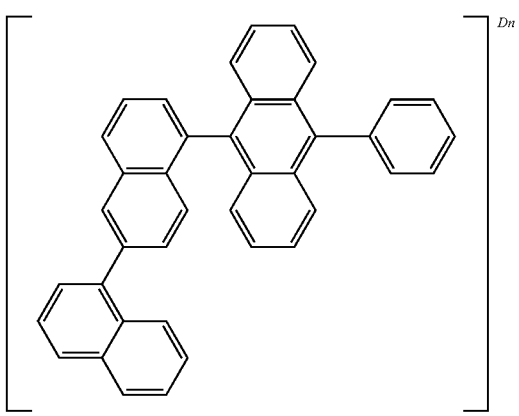
H-247

H-248
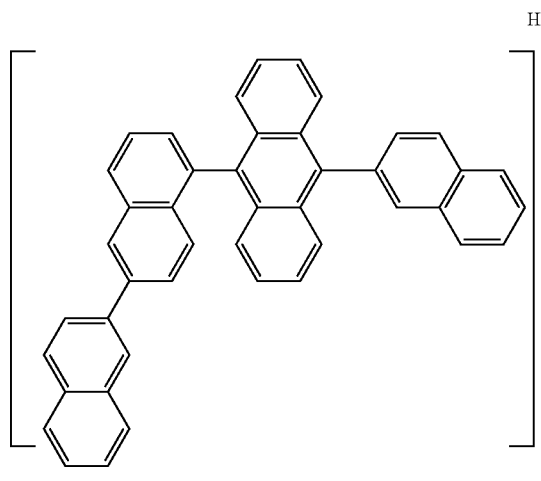
H-251
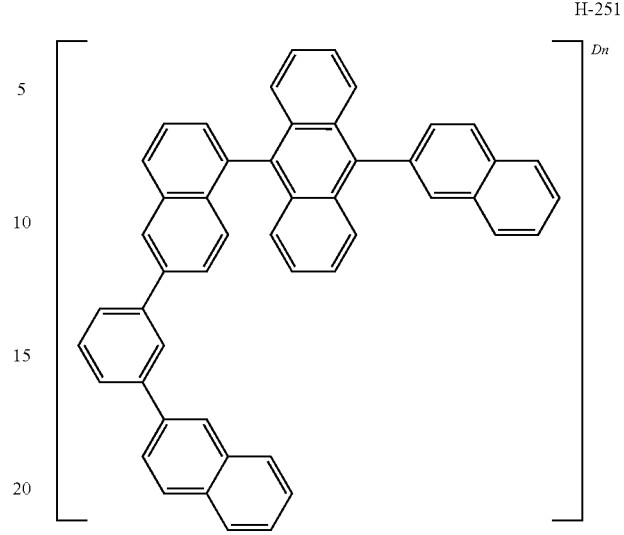
H-249
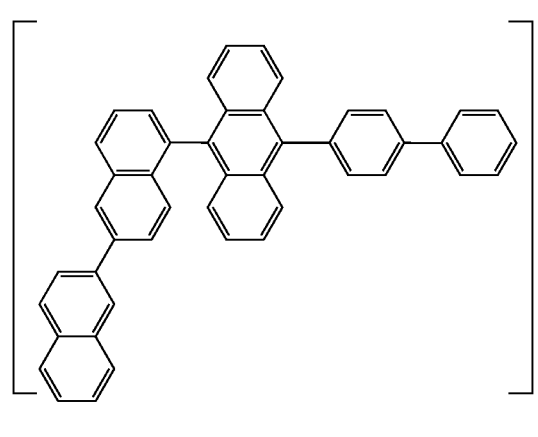
H-252
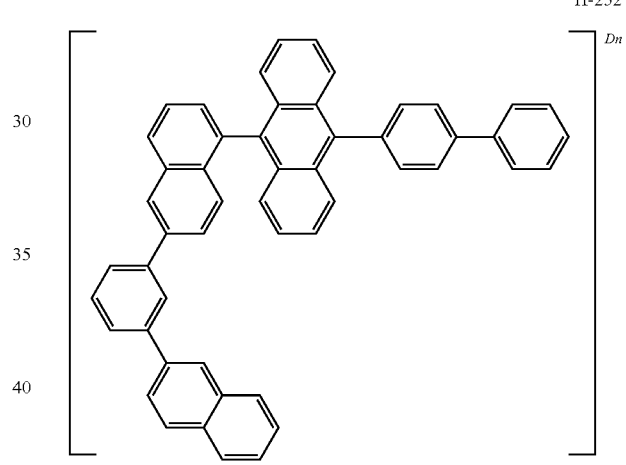
H-250
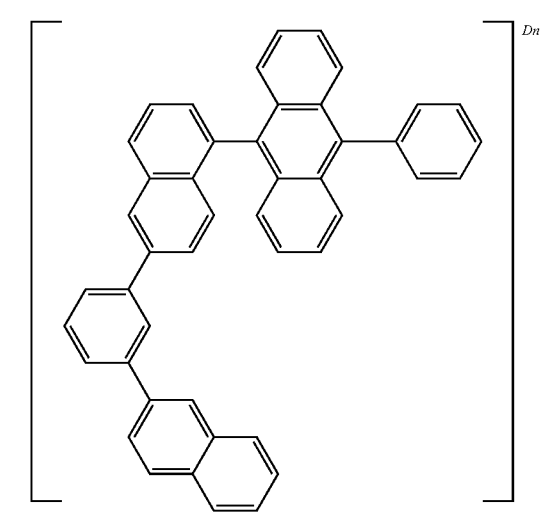
H-253
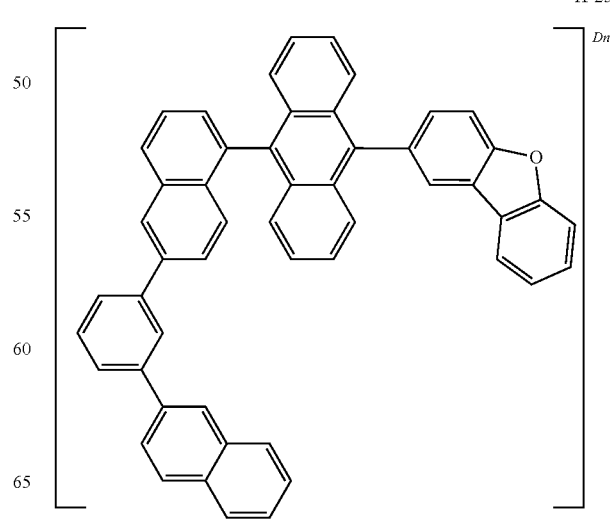

H-254
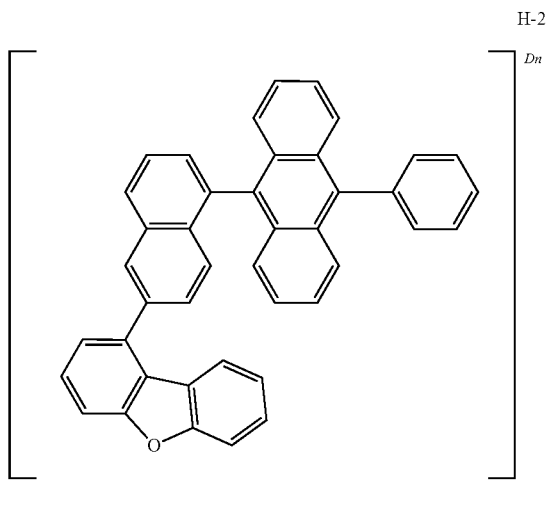
H-255
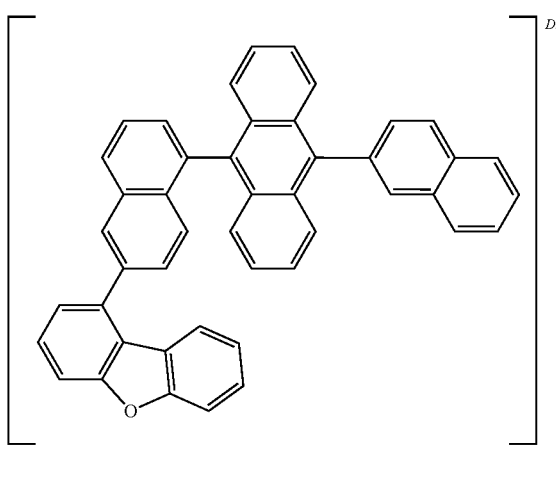
H-256
H-257
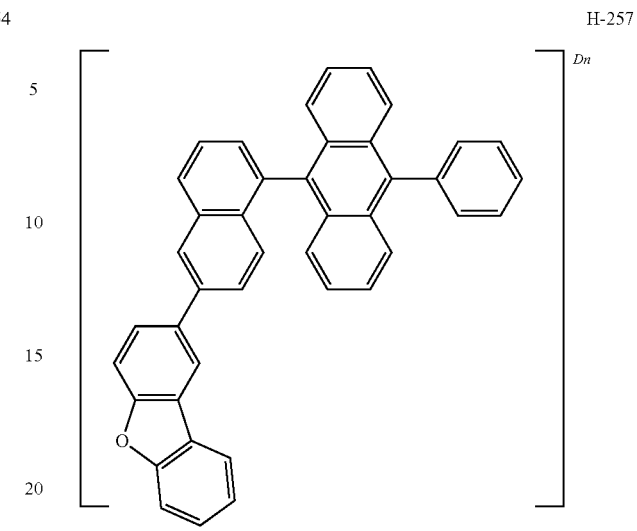
H-258
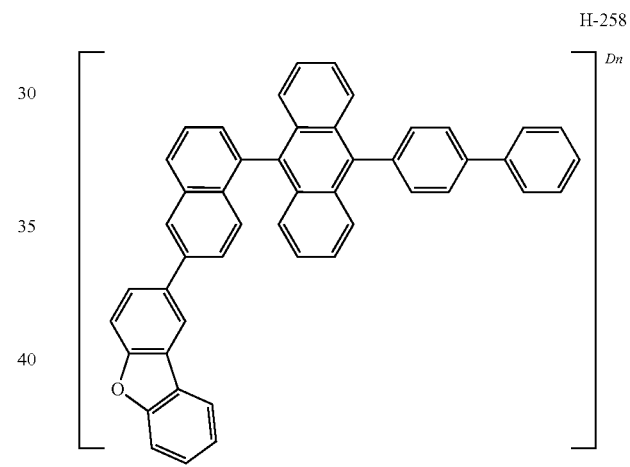
H-259
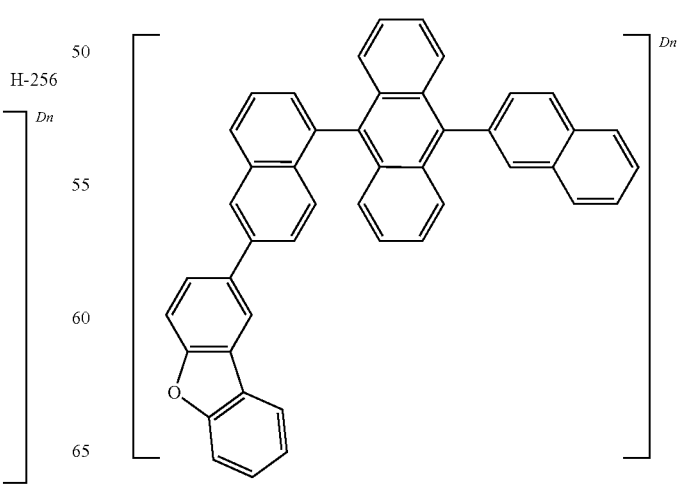

H-260

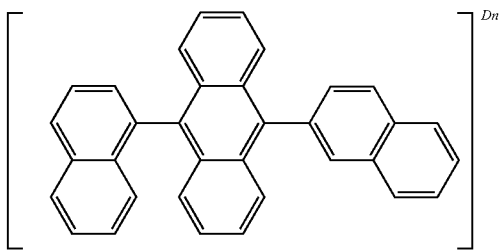

The light-emitting material according to one embodiment comprises at least one amine derivative represented by formula 2. For example, the compound represented by formula 2 may be a fluorescent dopant, e.g., a fluorescent blue dopant.

In formula 2, ring A, ring B, and ring C, each independently, represent a substituted or unsubstituted (C6-C30) aryl, or a substituted or unsubstituted (3- to 50-membered) heteroaryl. According to one embodiment of the present disclosure, ring A, ring B, and ring C, each independently, represent a substituted or unsubstituted (C6-C25)aryl, or a substituted or unsubstituted (5- to 40-membered)heteroaryl. According to another embodiment of the present disclosure, ring A represents a substituted or unsubstituted (C6-C18) aryl; and ring B and ring C, each independently, represent a substituted or unsubstituted (C6-C18)aryl, or a substituted or unsubstituted (5- to 36-membered)heteroaryl. For example, ring A may represent a substituted or unsubstituted benzene ring, an unsubstituted naphthalene ring, or an unsubstituted terphenyl ring. The substituents of the substituted benzene ring may be at least one selected from the group consisting of deuterium; a methyl unsubstituted or substituted with at least one deuterium; tert-butyl; a diphenylamino unsubstituted or substituted with at least one of deuterium, a methyl(s) and a tert-phenyl(s); a phenylnaphthylamino; a dinaphthylamino; a substituted or unsubstituted phenyl; a naphthyl; a biphenyl; a terphenyl; a triphenylenyl; a carbazolyl; a phenoxazinyl; a phenothiazinyl; a dimethylacridinyl; and a dimethylxantenyl, in which the substituents of the substituted phenyl may be at least one of deuterium, a methyl(s), a carbazolyl(s), a dibenzofuranyl(s), a diphenylamino(s), a phenoxazinyl(s), a phenothiazinyl(s) and a dimethylacridinyl(s). For example, ring B and ring C, each independently, may represent a substituted or unsubstituted benzene ring, an unsubstituted naphthalene ring, an unsubstituted biphenyl ring, an unsubstituted dibenzothiophene ring, an unsubstituted dibenzofuran ring, a carbazole ring substituted with at least one of a phenyl(s) and a diphenylamino(s), a boron- and nitrogen-containing (21-membered)hetero ring substituted with at least one of a methyl(s) and a phenyl(s), a boron- and nitrogen-containing (25-membered)hetero ring substituted with a phenyl(s), or a boron- and nitrogen-containing (36-membered)hetero ring substituted with a methyl(s). The substituents of the substituted benzene ring may be at least one selected from the group consisting of deuterium, a methyl, tert-butyl, a phenyl, a substituted or unsubstituted diphenylamino, a phenylnaphthylamino, and a phenylamino substituted with a phenylcarbazolyl(s) or a dibenzofuranyl(s). The substituents of the substituted diphenylamino may be a methyl(s) and/or a diphenylamino(s).

In formula 2, $Y_1$ represents B; and $X_1$ and each independently, represent NR. R represents hydrogen, deuterium, a halogen, a cyano, a substituted or unsubstituted (C1-C30) alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino; or R may be linked to at least one of ring A, ring B, and ring C to form a ring(s). According to one embodiment of the present disclosure, R represents hydrogen, deuterium, a substituted or unsubstituted (C1-C20)alkyl, a substituted or unsubstituted (C6-C25)aryl, a substituted or unsubstituted (3- to 25-membered)heteroaryl; or R may be linked to at least one of ring A, ring B, and ring C to form a ring(s). According to another embodiment of the present disclosure, R represents hydrogen, deuterium, an unsubstituted (C1-C10)alkyl, a (C6-C18)aryl unsubstituted or substituted with at least one of a (C1-C10)alkyl(s) and a di(C6-C18)arylamino(s), or a (5- to 20-membered)heteroaryl substituted with a (C6-C18)aryl(s); or R may be linked to at least one of ring A, ring B, and ring C to form a ring(s). For example, R may represent hydrogen, deuterium, a methyl, a phenyl unsubstituted or substituted with a methyl(s) and/or a tort-butyl(s), a naphthyl, a biphenyl unsubstituted or substituted with a diphenylamino(s), a triphenylenyl, or a carbazolyl substituted with a phenyl(s), or R may be linked to at least one of ring A, ring B, and ring C to form a ring(s).

According to one embodiment of the present disclosure; the formula 2 may be represented by the following formula 2-1.

(2-1)

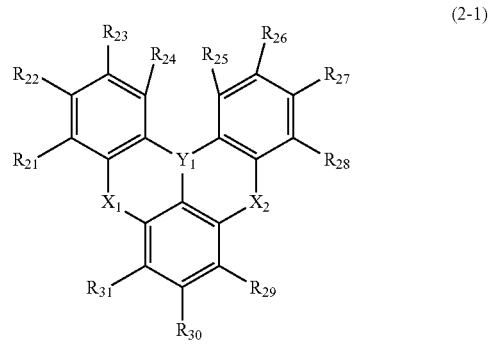

In formula 2-1, $Y_1$, $X_1$, and $X_2$, are each as defined in formula 2; and $R_{21}$ to $R_{31}$, each independently, represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30) cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30) arylamino, or a substituted or unsubstituted (C1-C30)alkyl (C6-C30)arylamino; or may be linked to an adjacent substituent to form a ring(s). According to one embodiment of the present disclosure, $R_{21}$ to $R_{31}$, each independently, represent hydrogen, deuterium, a substituted or unsubstituted (C1-C20)alkyl, a substituted or unsubstituted (C6-C25)aryl, a substituted or unsubstituted (5- to 20-membered)heteroaryl, or a substituted or unsubstituted mono- or di-(C6-C25)arylamino; or may be linked to an adjacent substituent to form a ring(s). According to another embodiment of the present disclosure, $R_{21}$ to $R_{31}$, each independently, represent hydrogen; deuterium; an unsubstituted (C1-C10)alkyl; a (C6-C18)aryl unsubstituted or substituted with at least one of a (C1-C10)alkyl(s), a (13- to 18-membered)heteroaryl(s), and a di(C6-C18)arylamino(s); a (5- to 18-membered)heteroaryl unsubstituted or substituted with a (C1-C10)alkyl(s); or a mono- or di-(C6-C18)arylamino unsubstituted or substituted with at least one of a (C1-C10) alkyl(s), a di(C6-C18)arylamino(s), and a (13- to 20-membered)heteroaryl(s); or may be linked to an adjacent substituent to form a ring(s). For example, $R_{21}$ to $R_{31}$, each independently, may represent hydrogen, methyl, a tert-butyl, a substituted or unsubstituted phenyl, a biphenyl, a terphenyl, a triphenylenyl, a carbazolyl, a phenoxazinyl, a phenothiazinyl, a dimethylacridinyl, a dimethylxantenyl, a diphenylamino unsubstituted or substituted with a methyl(s) or a diphenylamino(s), a phenylnaphthylamino, a dibiphenylamino, a phenylamine substituted with a phenylcarbazolyl(s) and/or a dibenzofuranyl(s), or a (17- to 21-membered)heteroaryl substituted with a methyl(s) and/or a phenyl(s); or may be linked to an adjacent substituent to form a benzene ring(s), an indole ring(s) substituted with a phenyl(s) and/or a diphenylamino(s), a benzofuran ring(s), a benzothiophene ring(s), or a (19-membered)hetero ring(s) substituted with a methyl(s). The substituents of the substituted phenyl may be at least one of a methyl(s), a carbazolyl(s), a dibenzofuranyl(s), a diphenylamino(s), a phenoxazinyl(s), a phenothiazinyl(s) and a dimethylacridinyl(s).

According to one embodiment of the present disclosure, the compound represented by formula 2 may be specifically exemplified by the following compounds, but is not limited thereto.

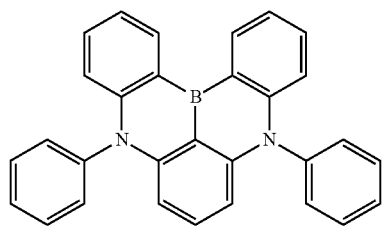

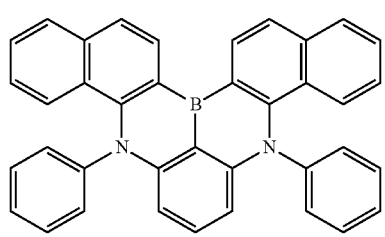

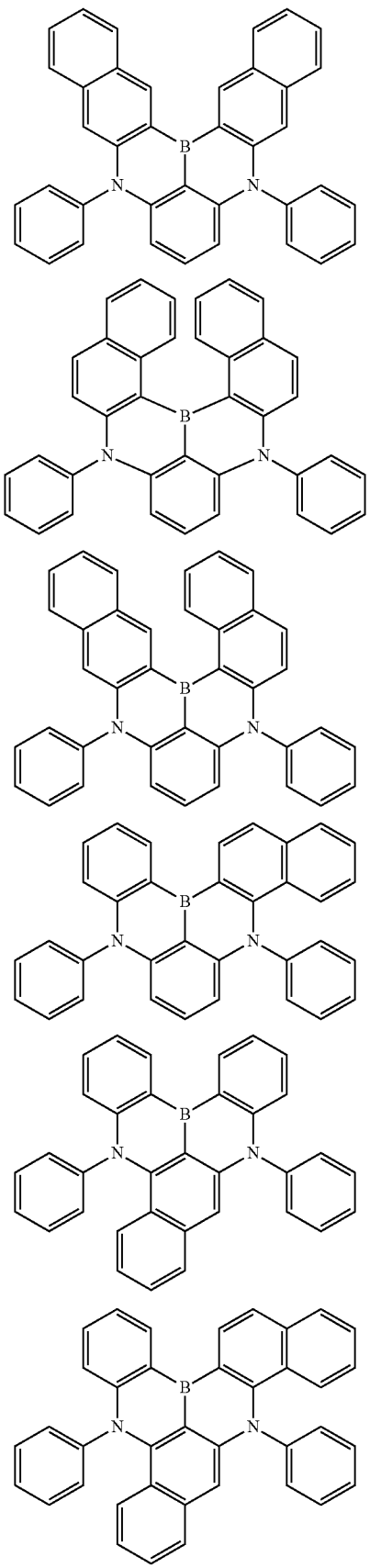

85
-continued
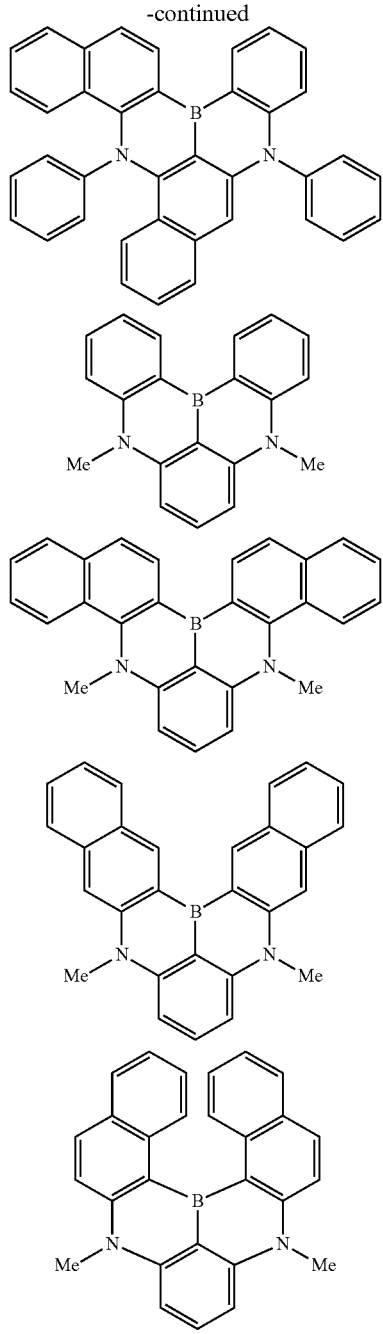
86
-continued
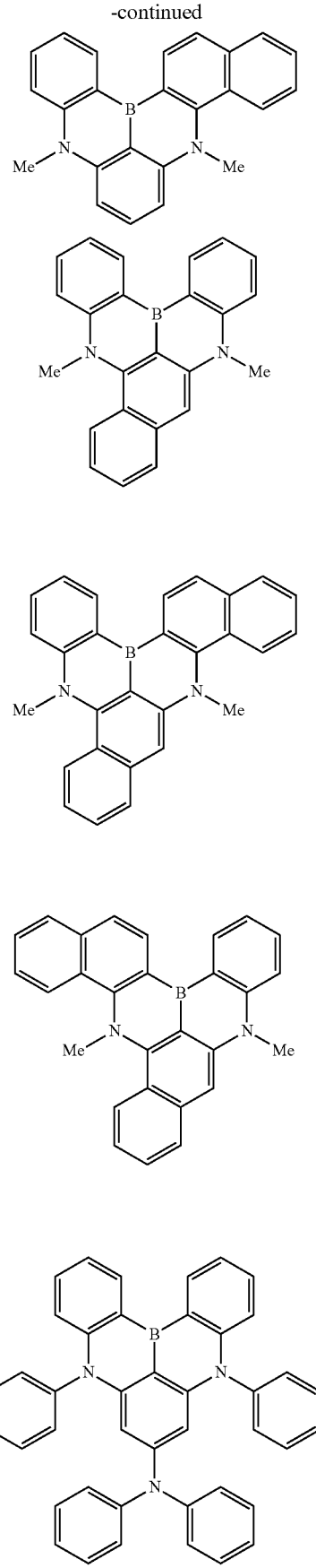

87
-continued
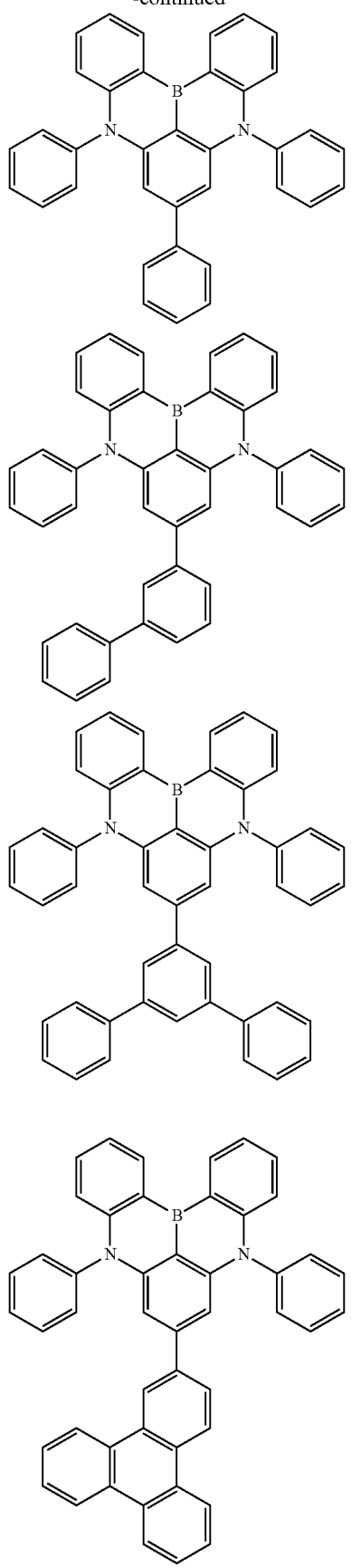
88
-continued
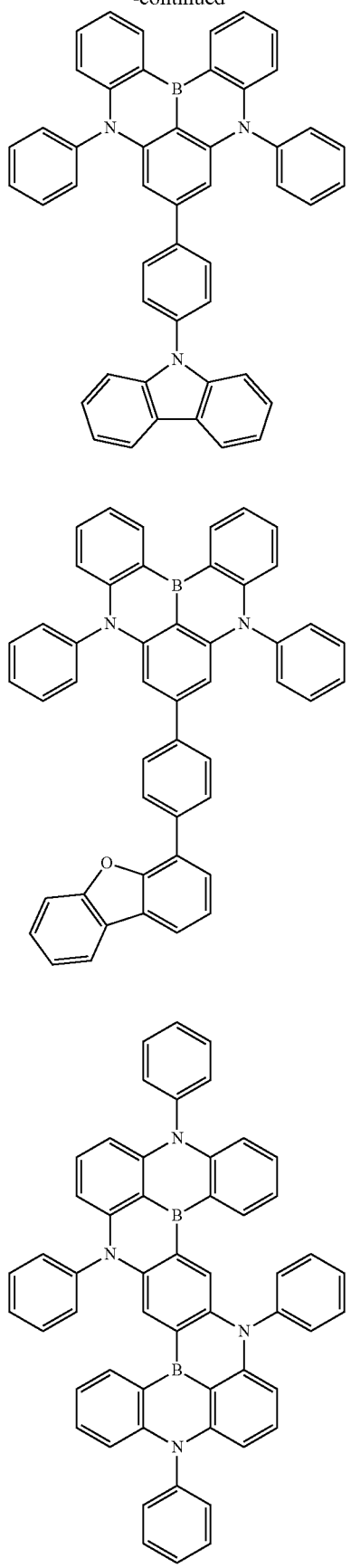

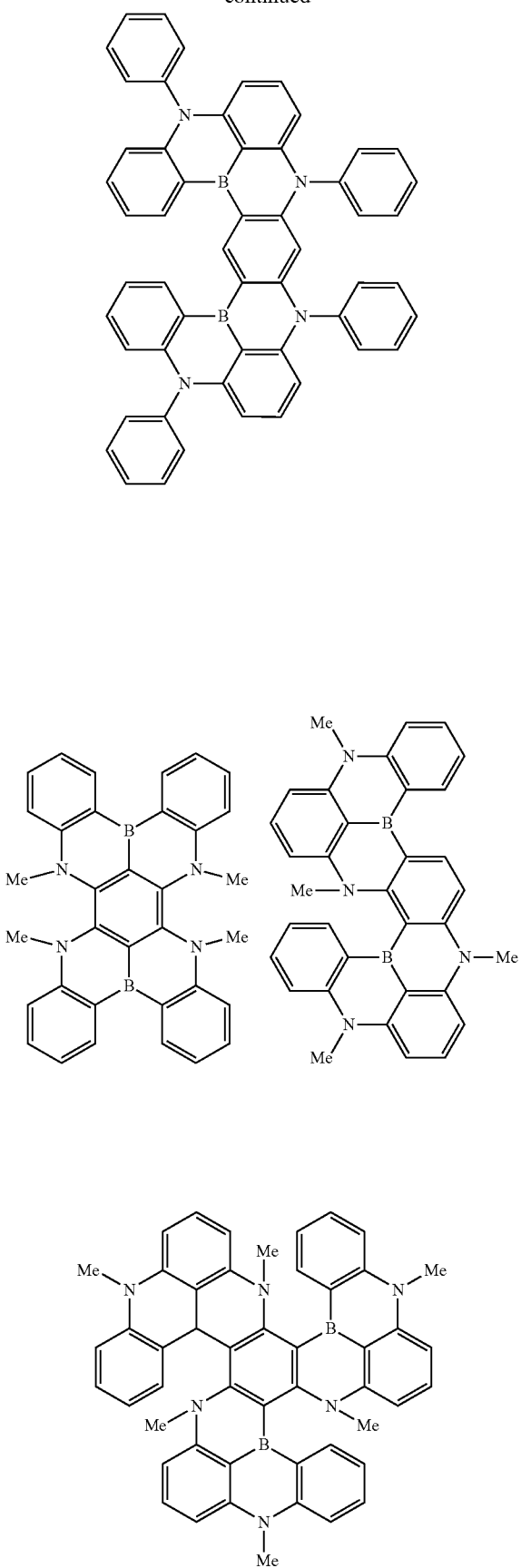

-continued
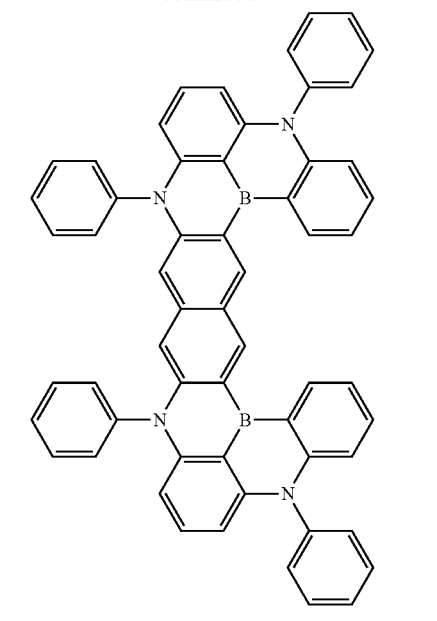
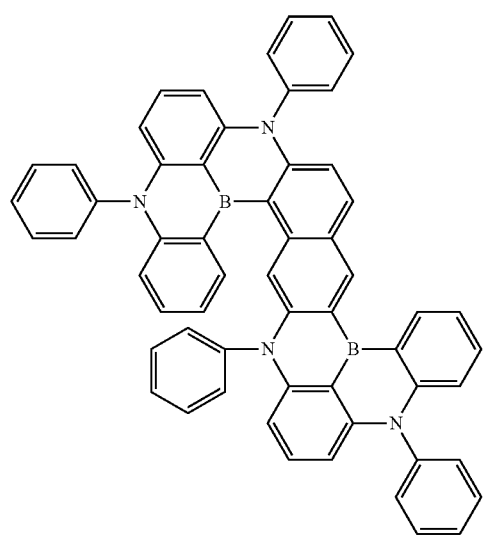
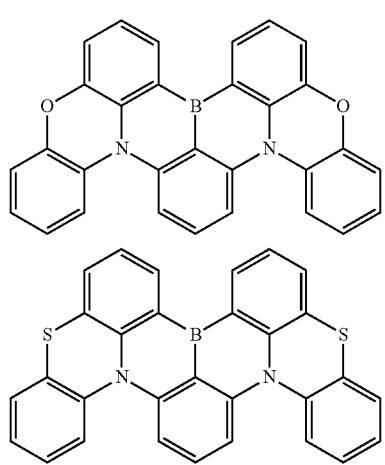
-continued
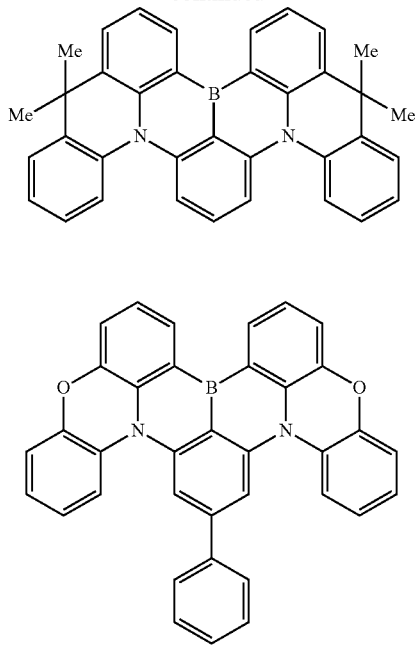
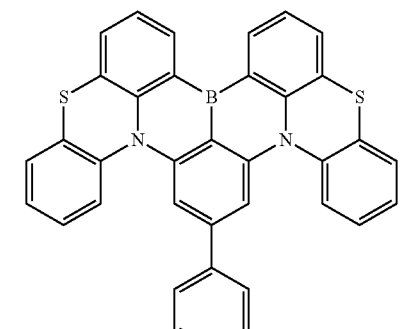
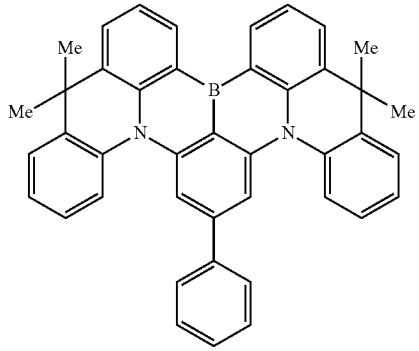
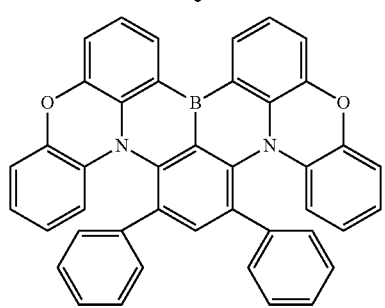

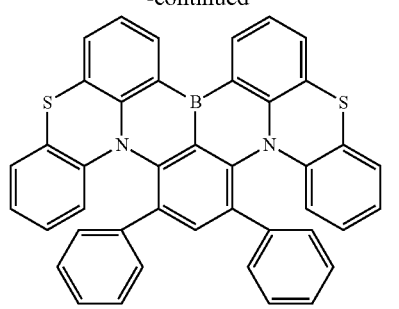
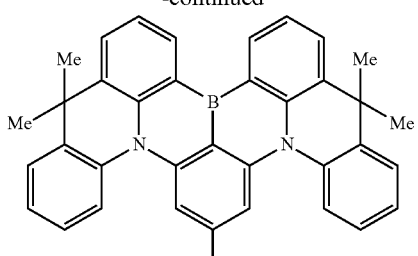
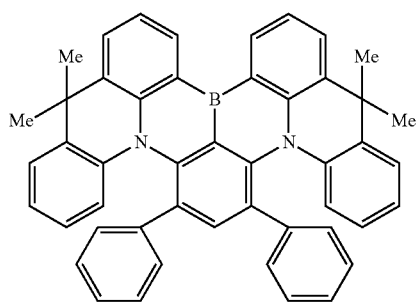
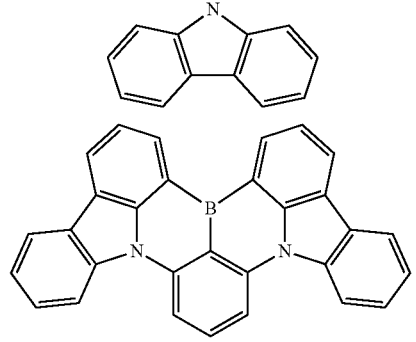
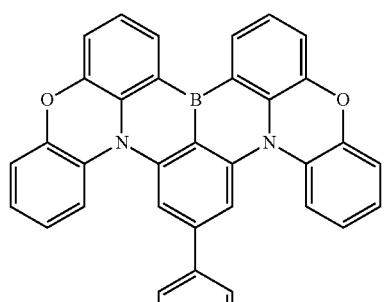
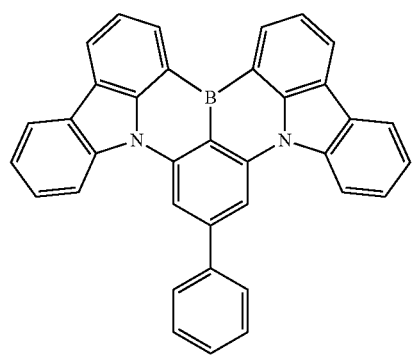
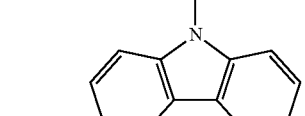
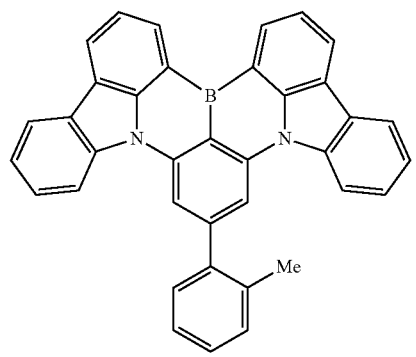
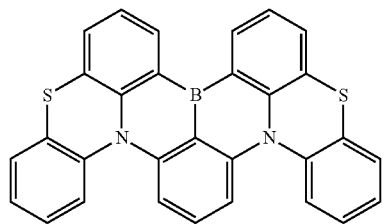
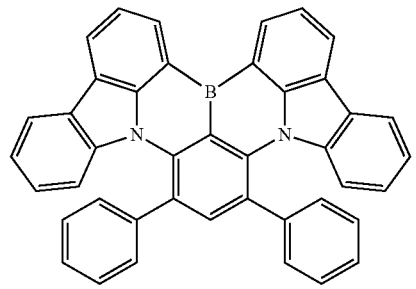

95
-continued
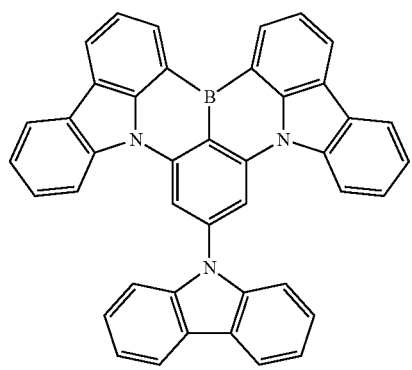
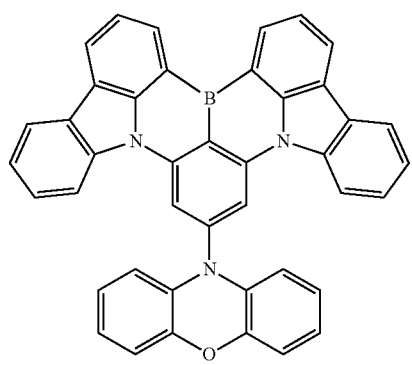
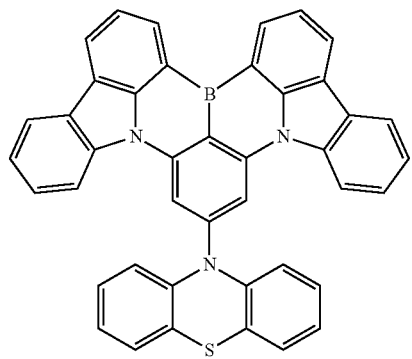
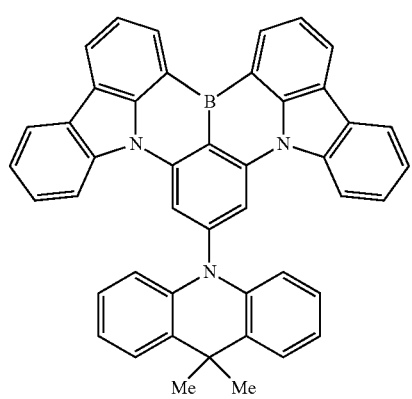
96
-continued
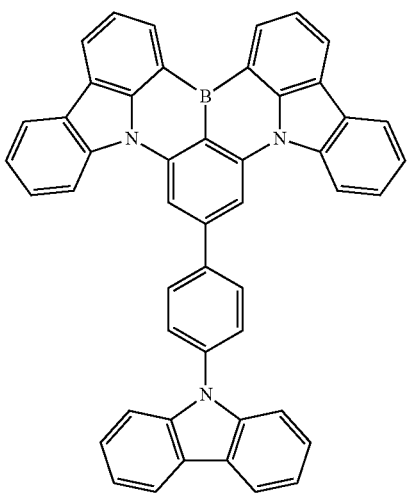
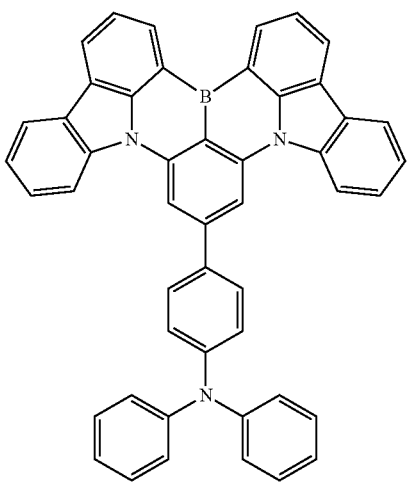
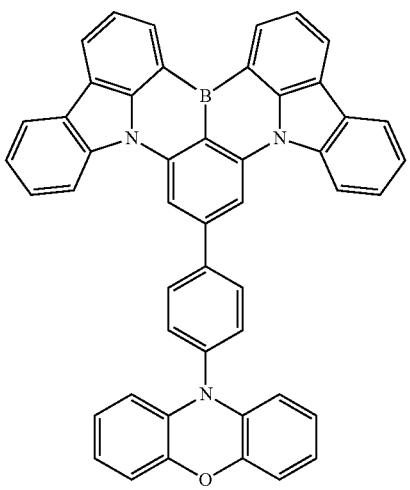

97
-continued
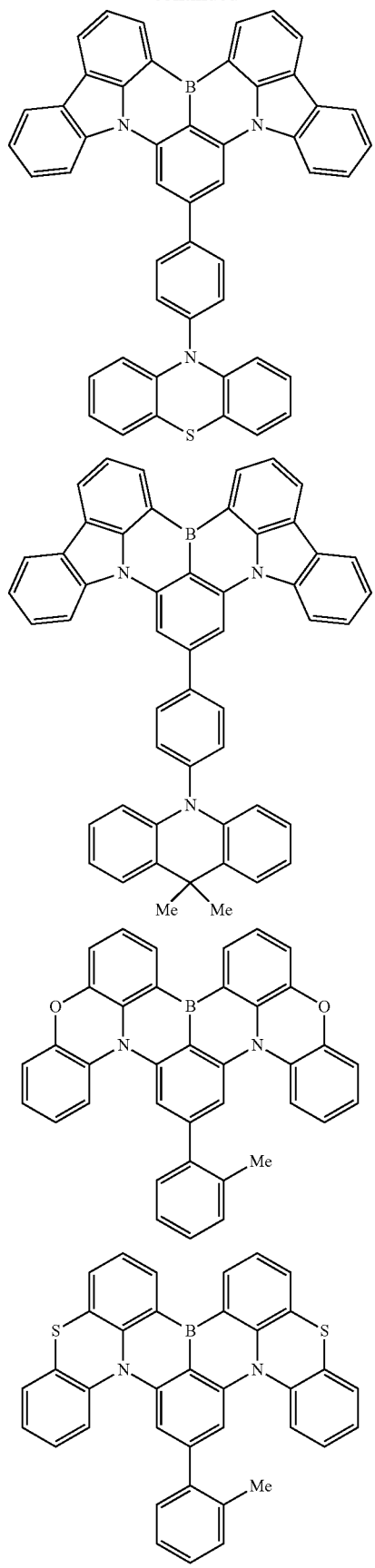
98
-continued
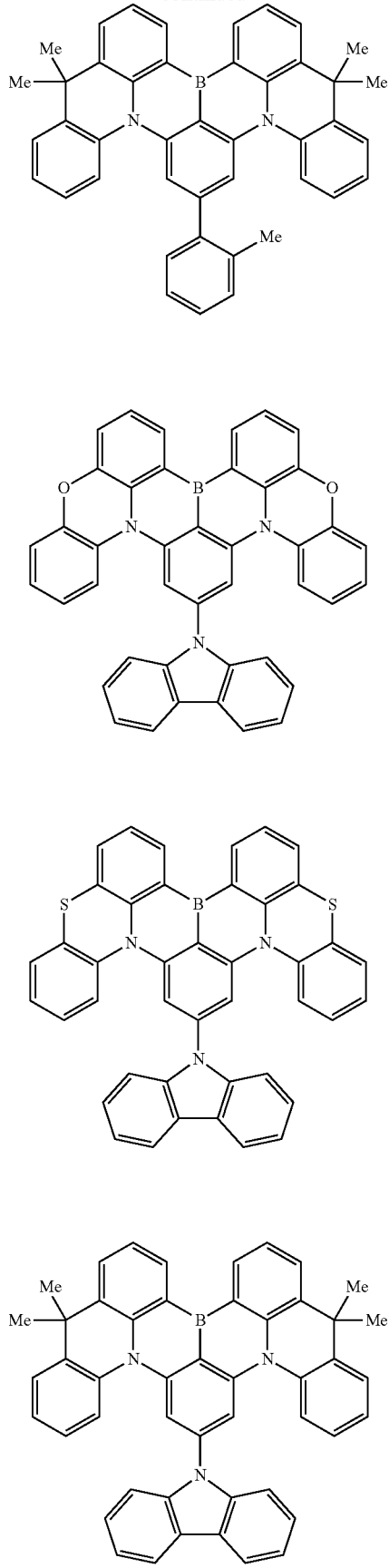

99
-continued
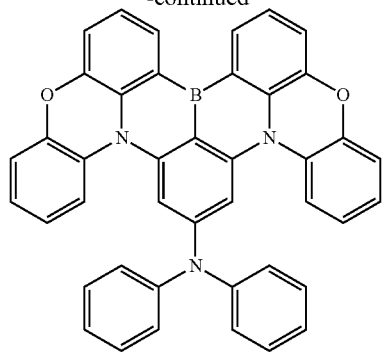
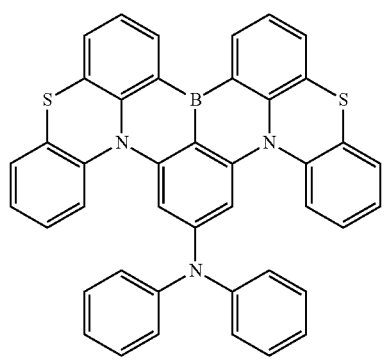
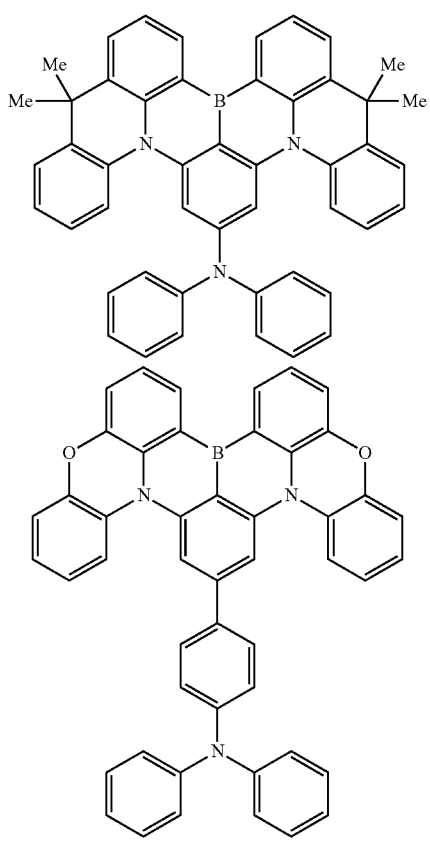
100
-continued
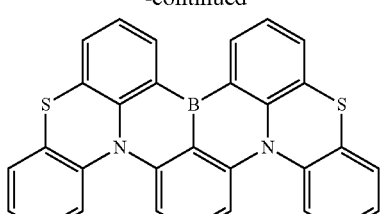
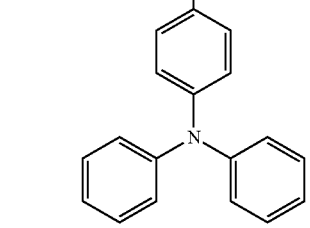
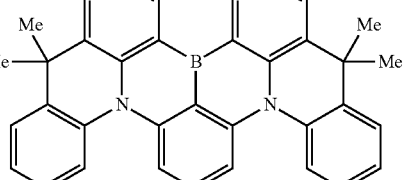
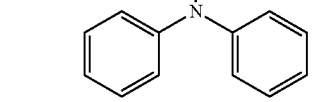
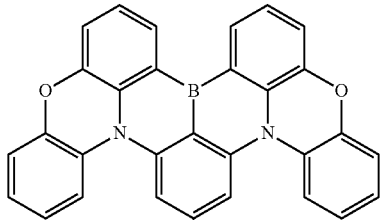
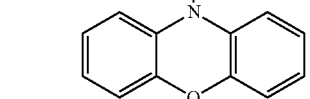
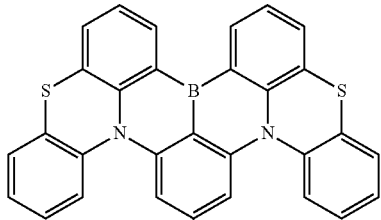
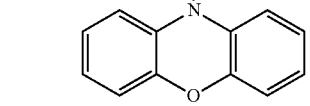

101
-continued
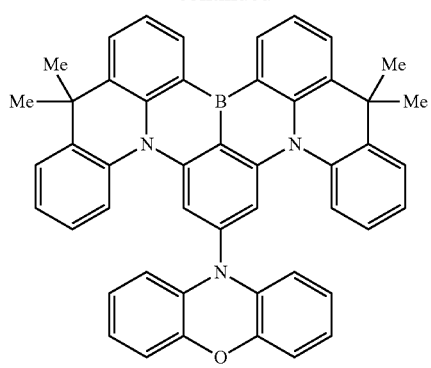
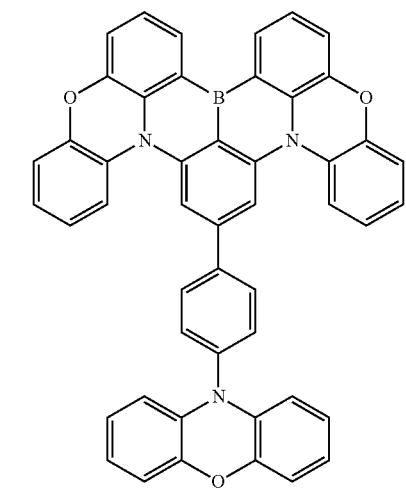
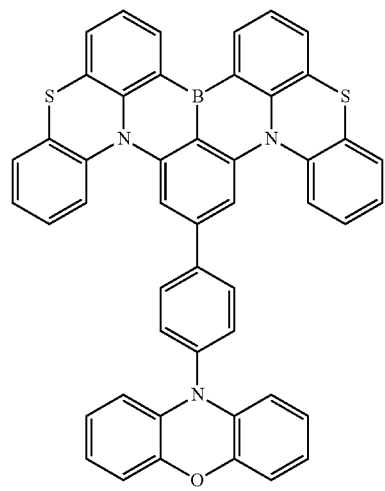
102
-continued
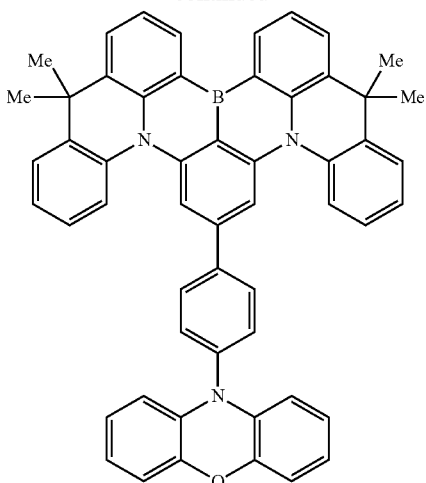
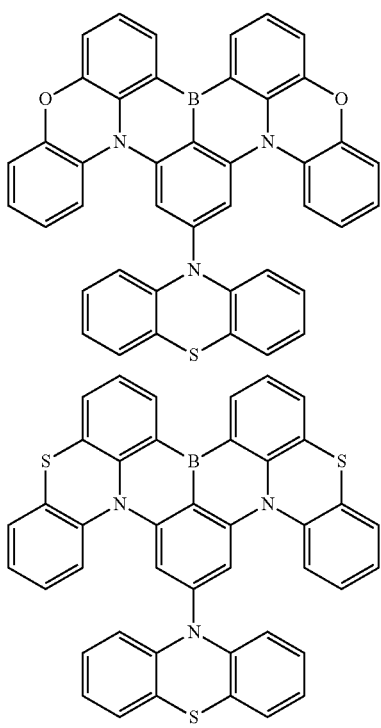
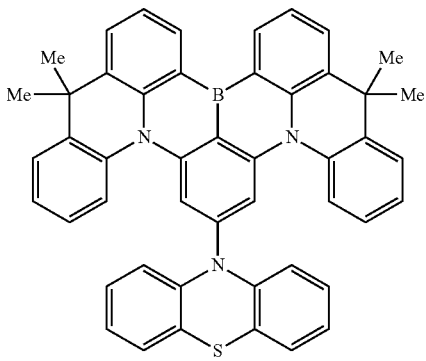

103
-continued
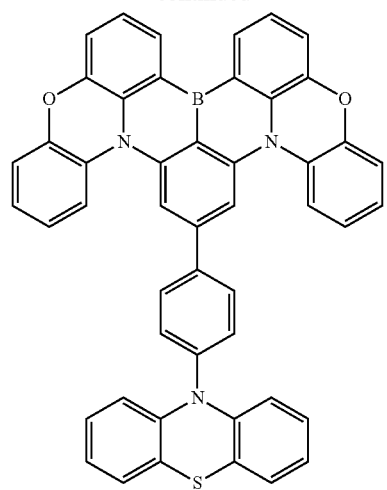
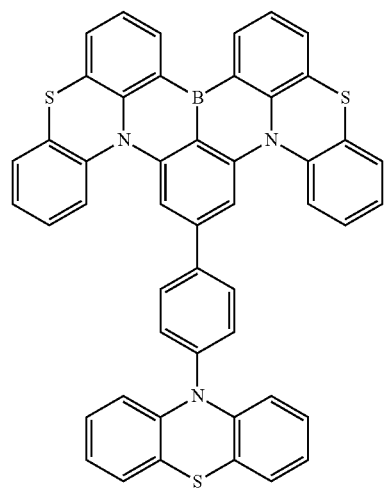
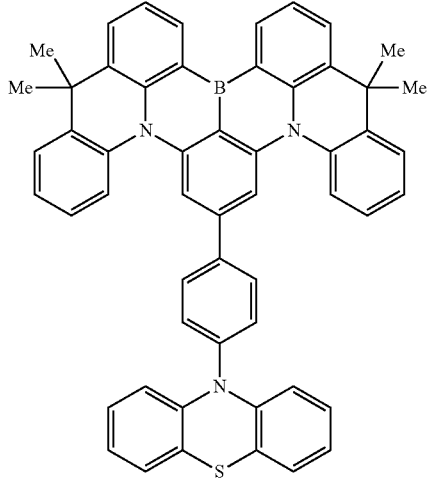
104
-continued
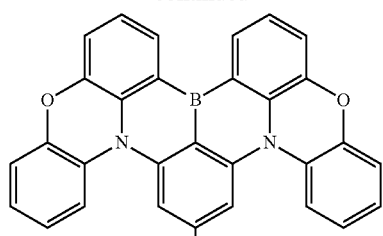
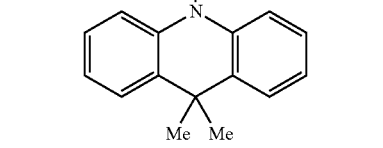
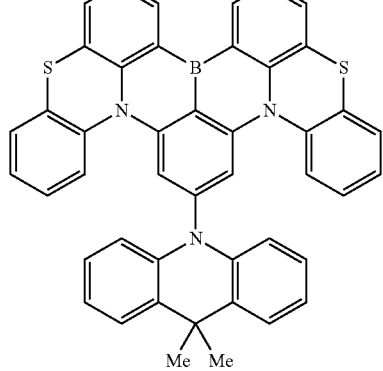
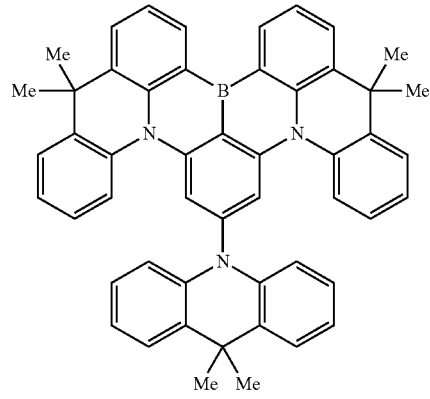
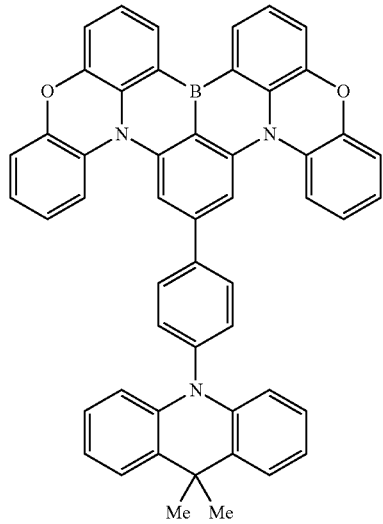

105
-continued
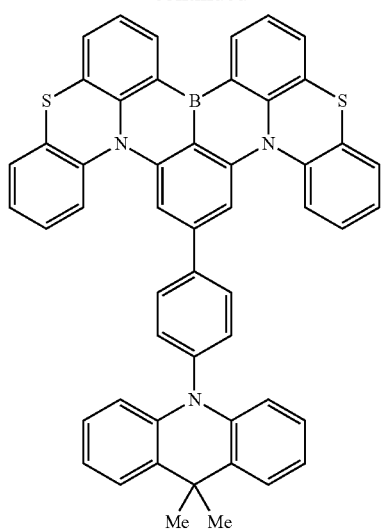
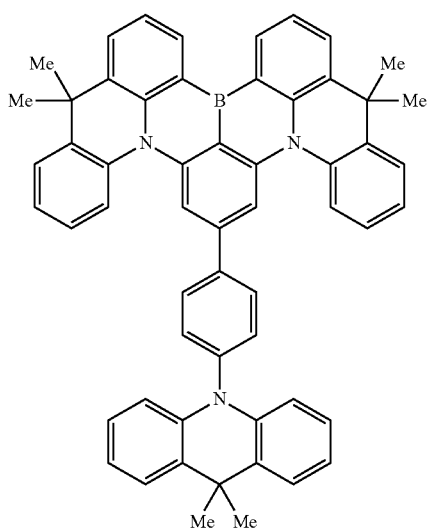
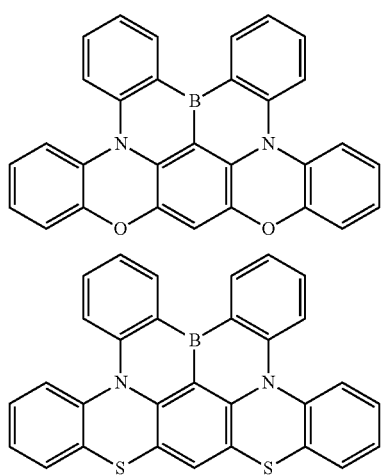
106
-continued
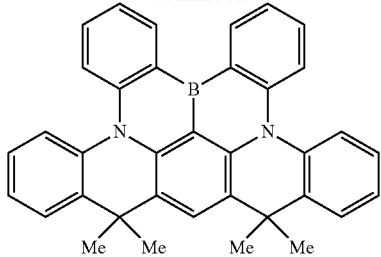
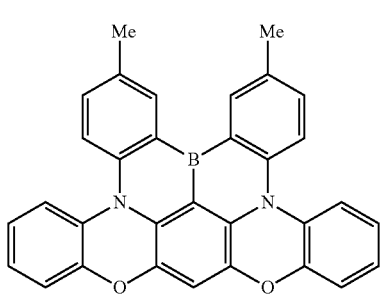
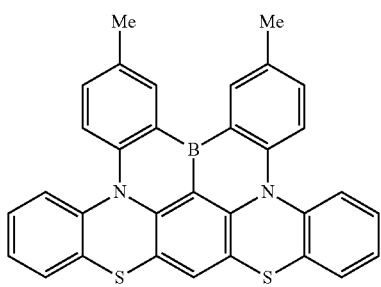
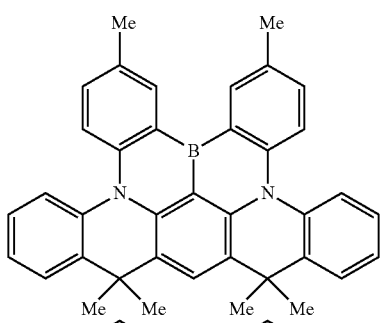
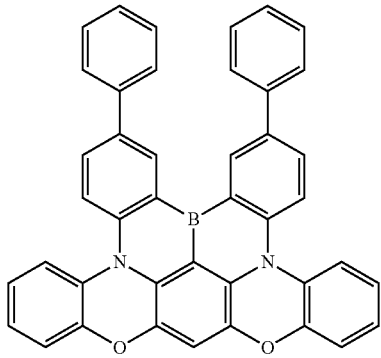

107
-continued
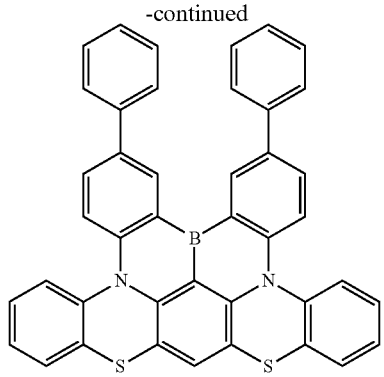
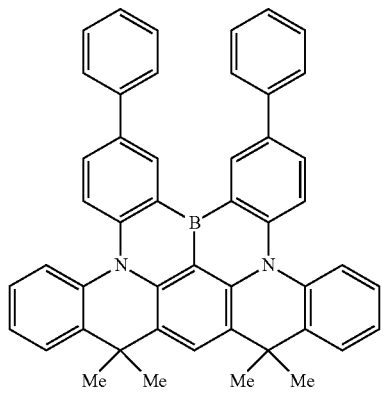
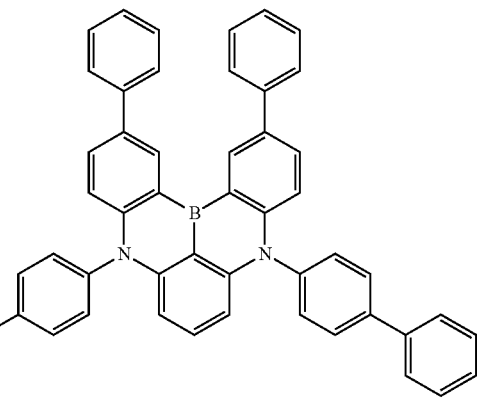
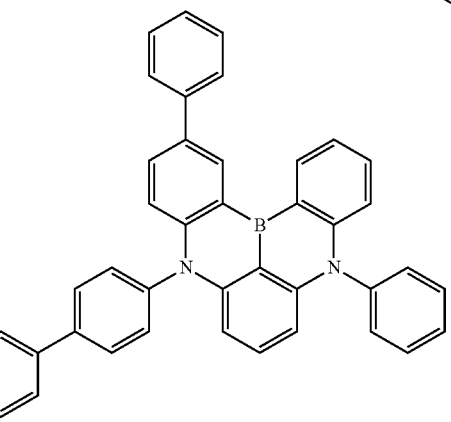
108
-continued
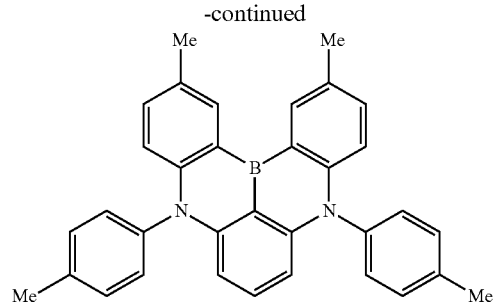
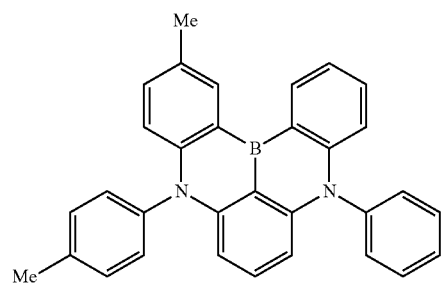
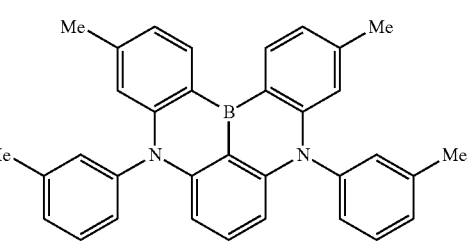
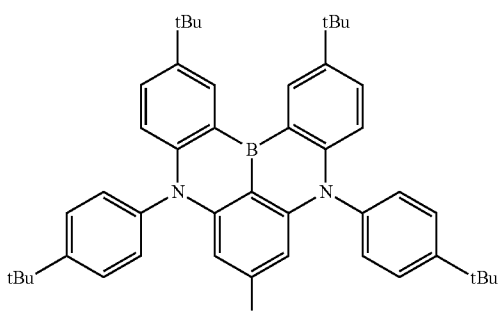
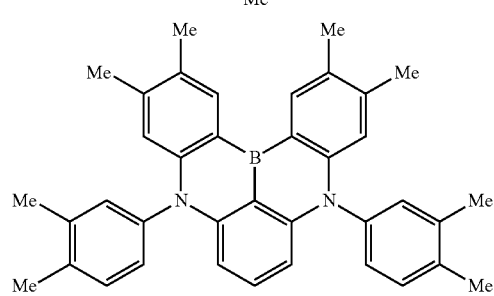

109
-continued
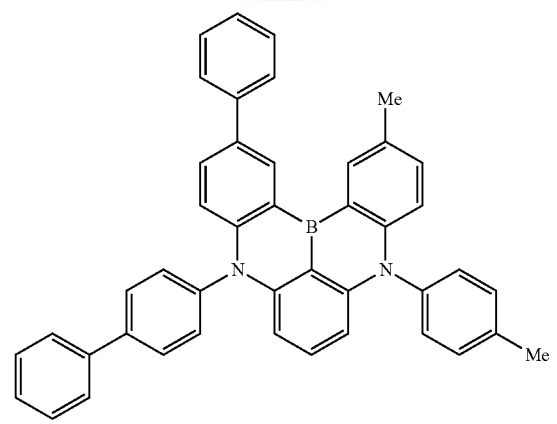
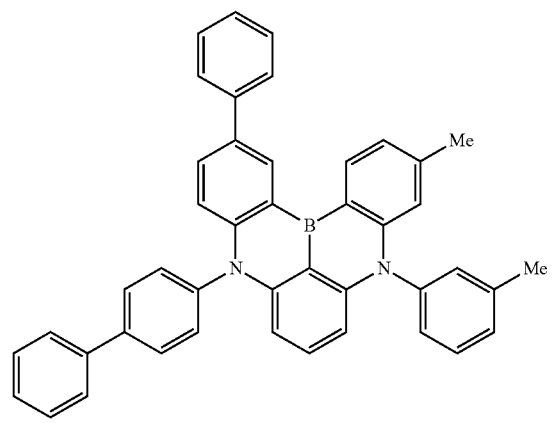
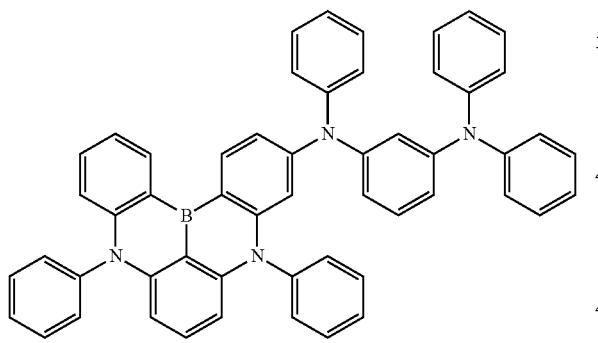
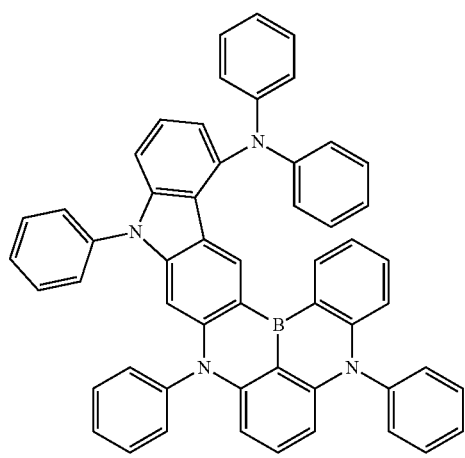
110
-continued
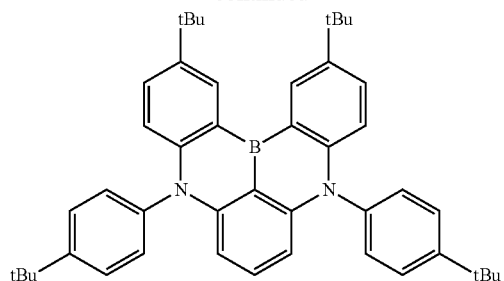
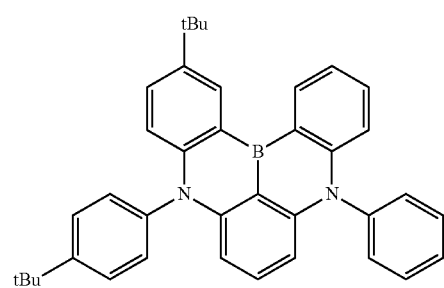
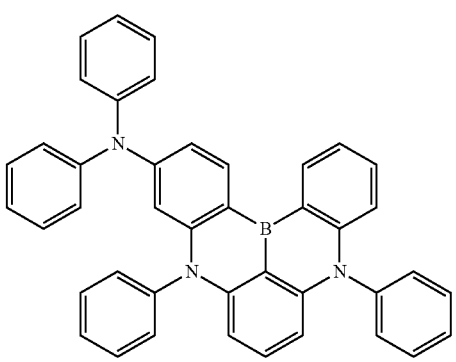
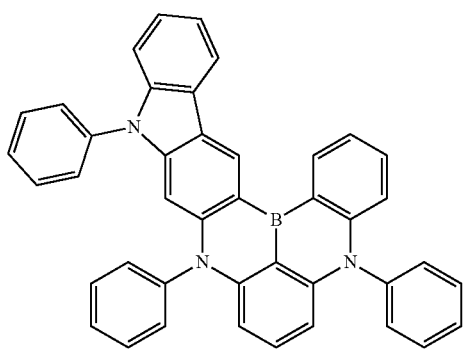
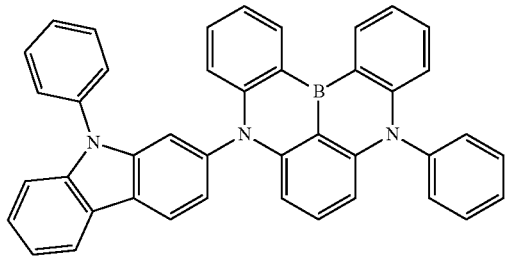

111
-continued
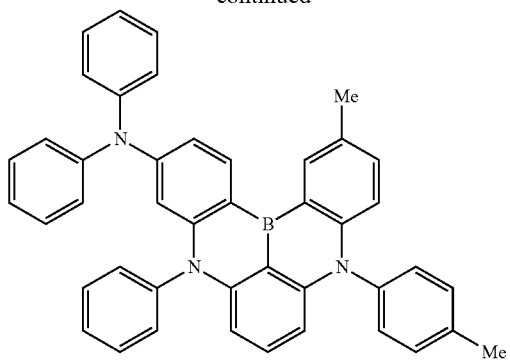
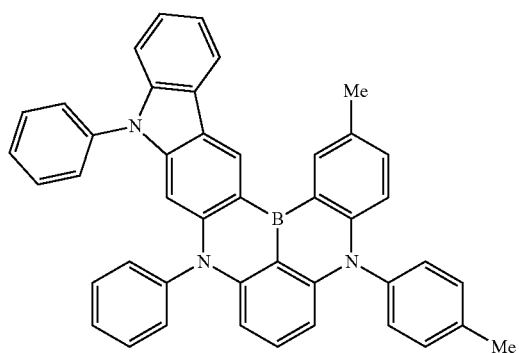
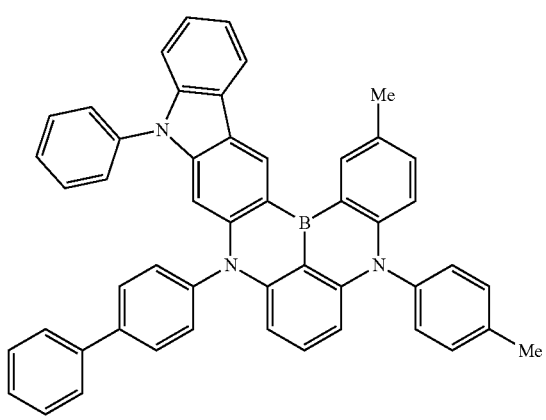
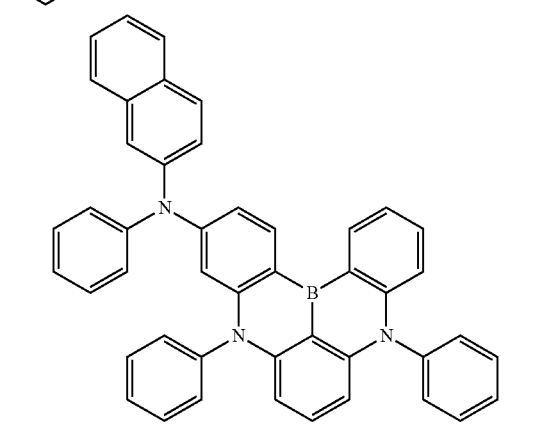
112
-continued
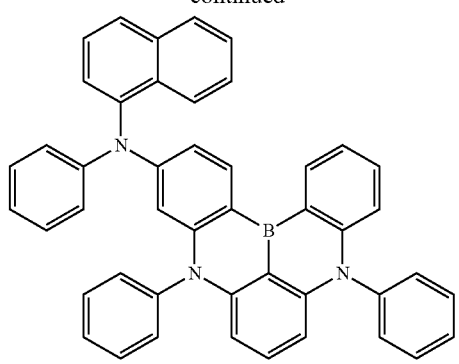
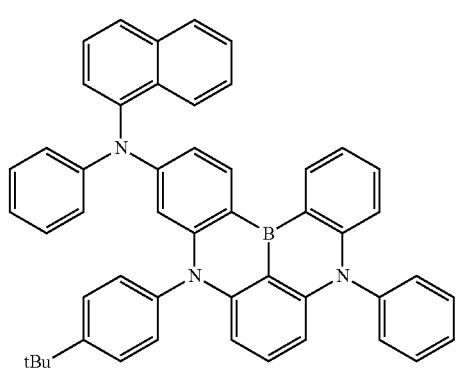
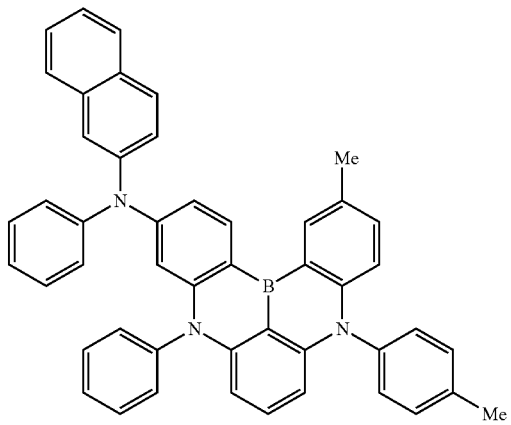
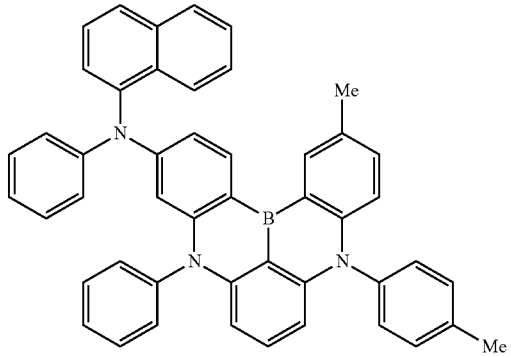

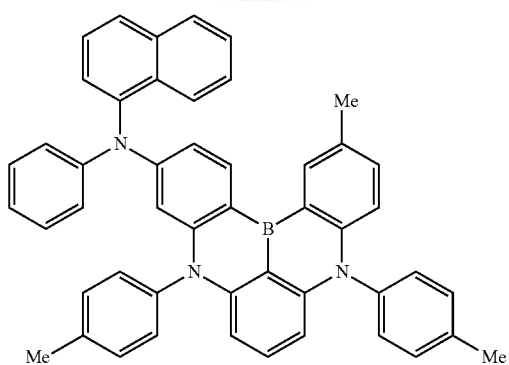
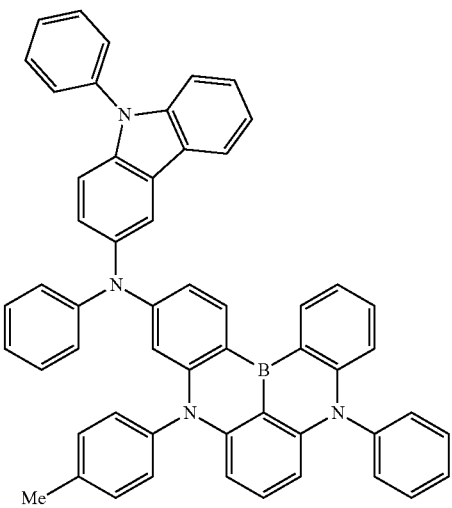
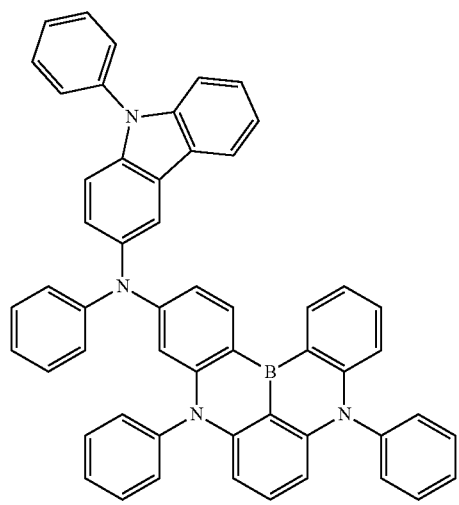
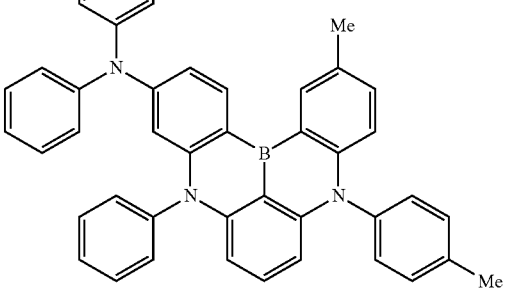
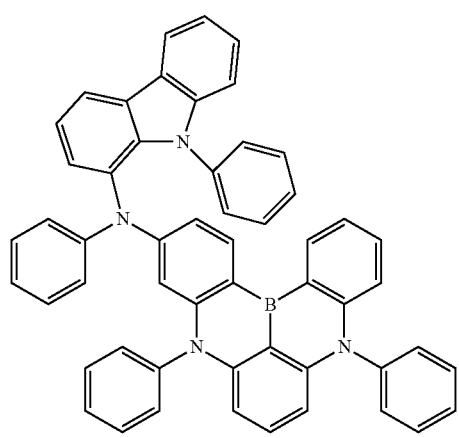
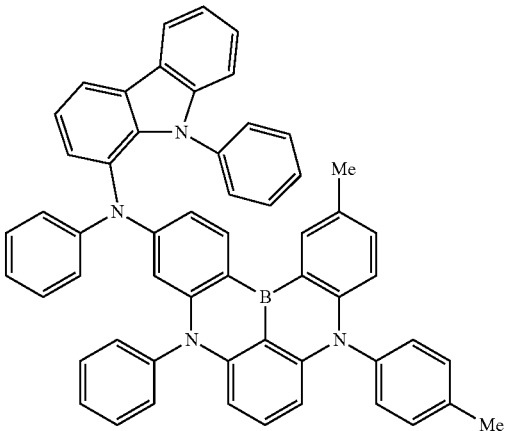

115
-continued
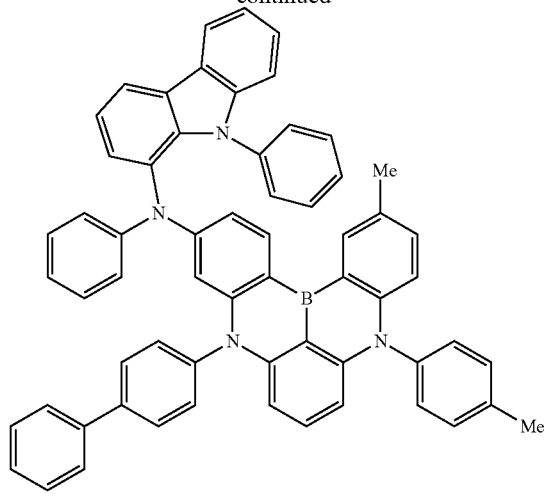
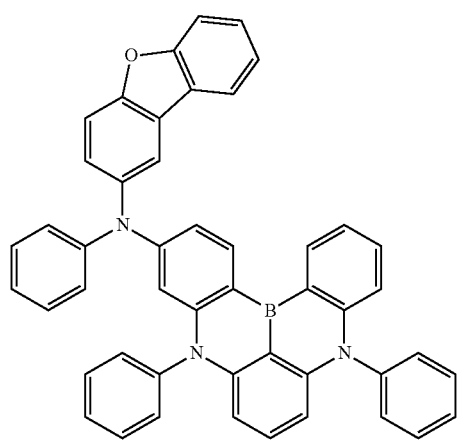
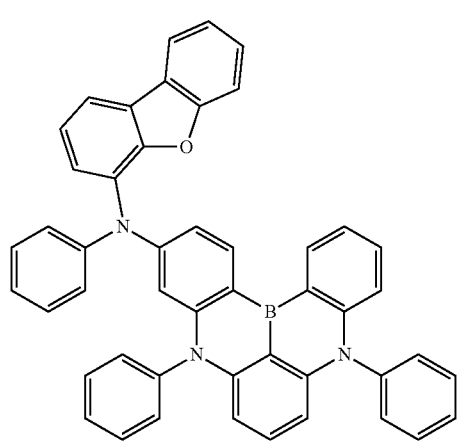
116
-continued
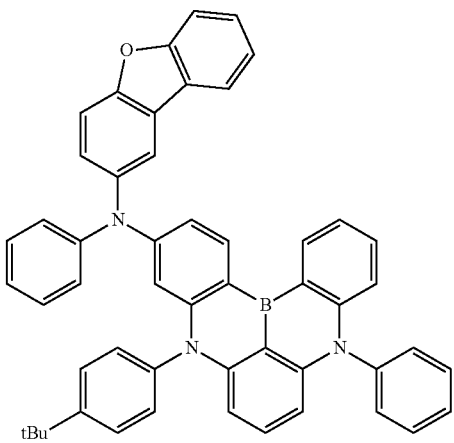
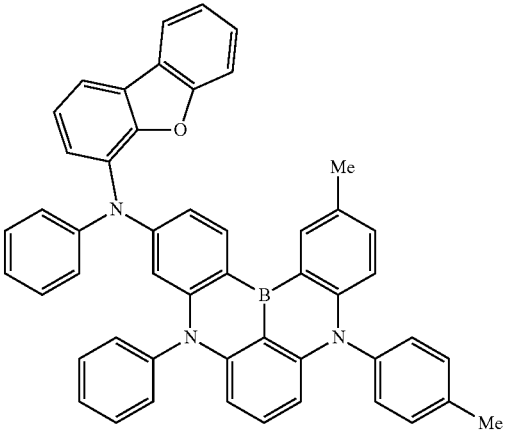

117
-continued
118
-continued
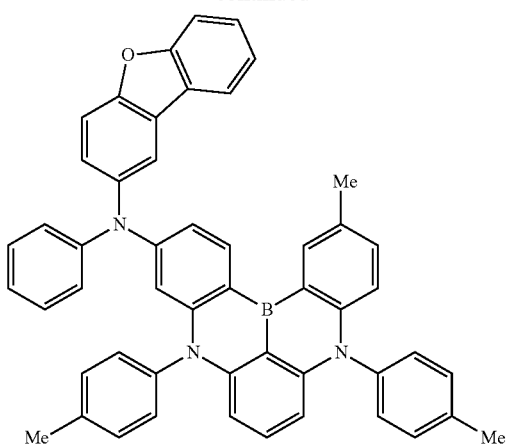
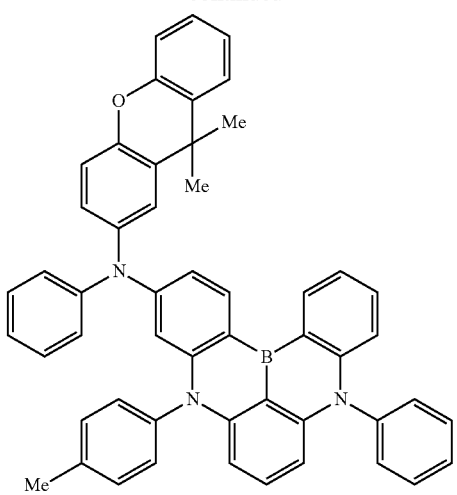
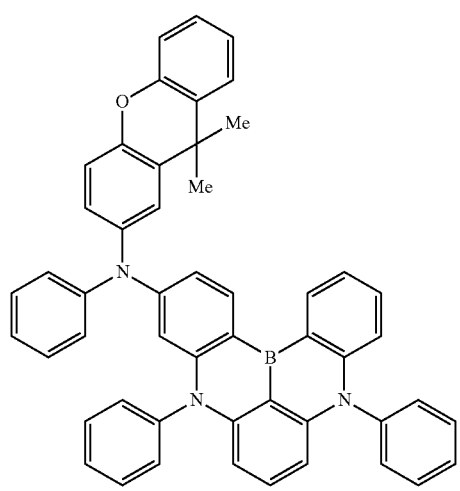
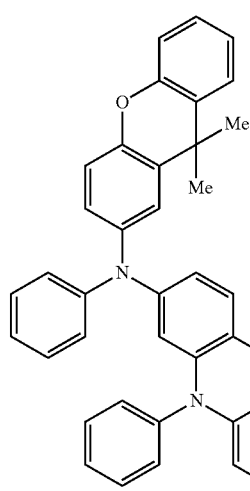
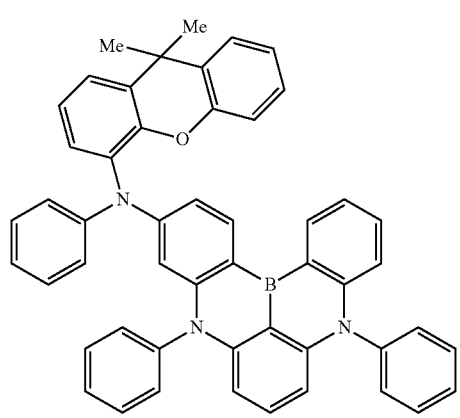
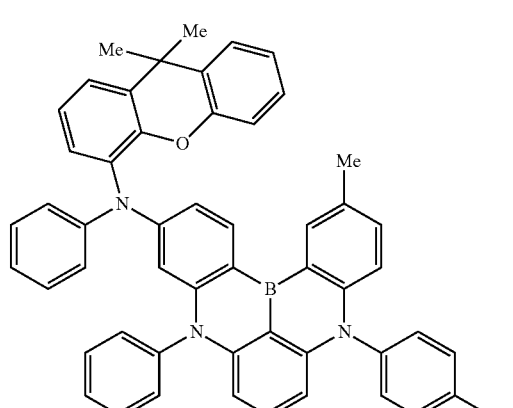

119
-continued
120
-continued
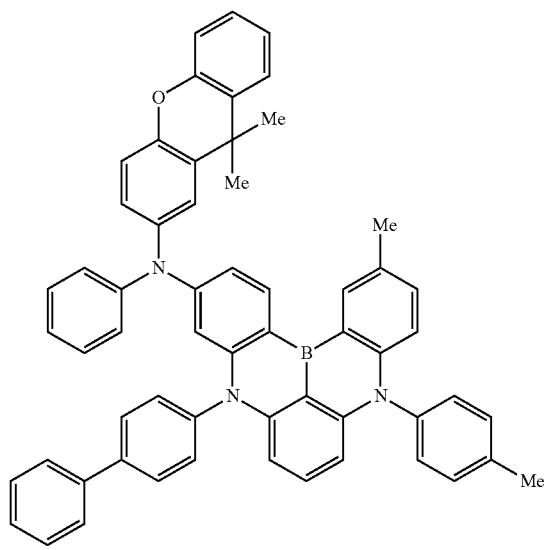
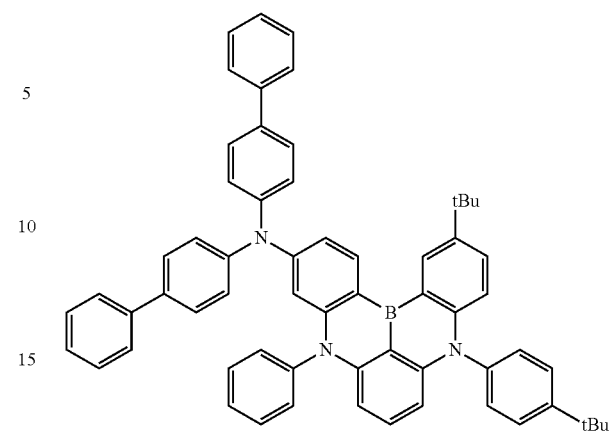
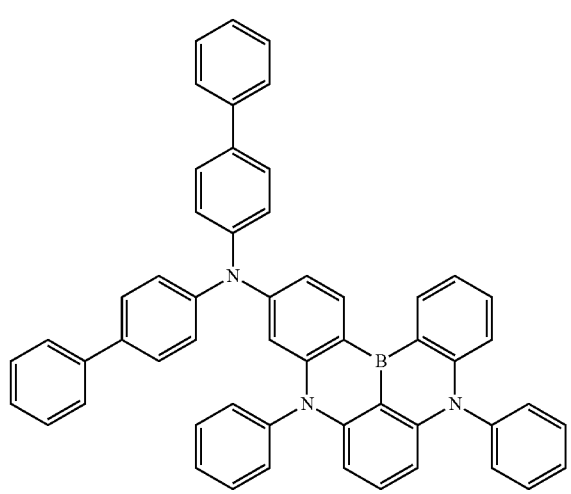
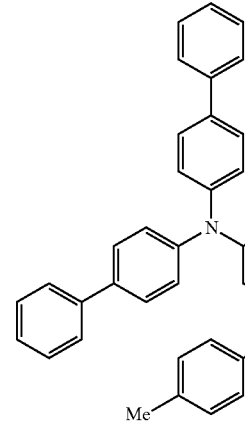
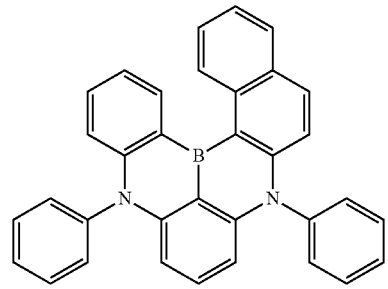
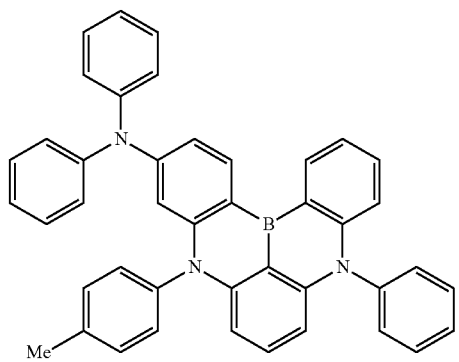

121
-continued
122
-continued
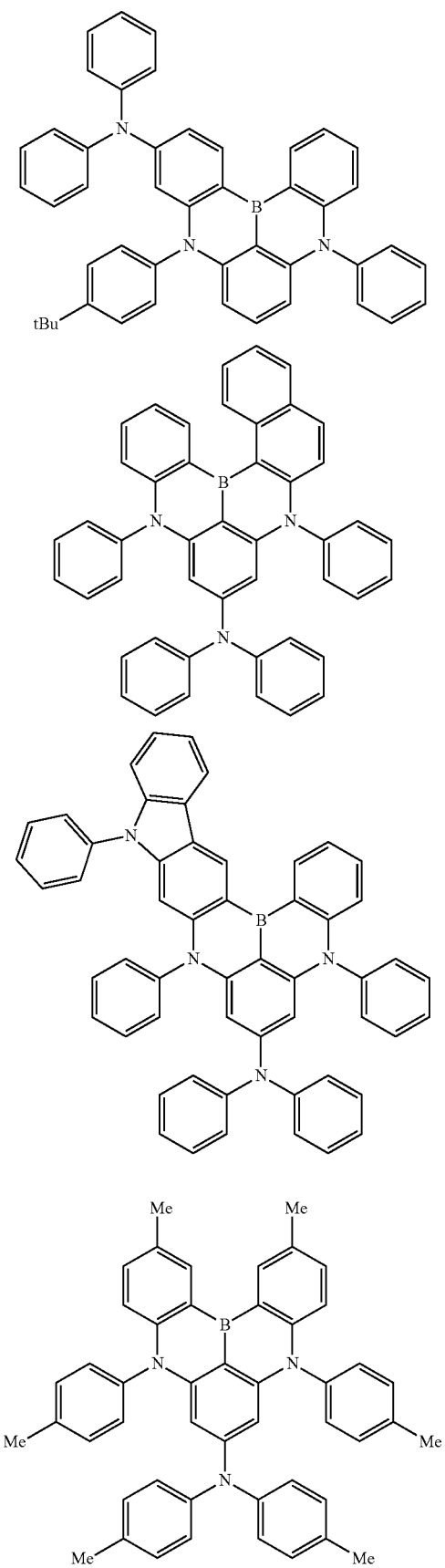
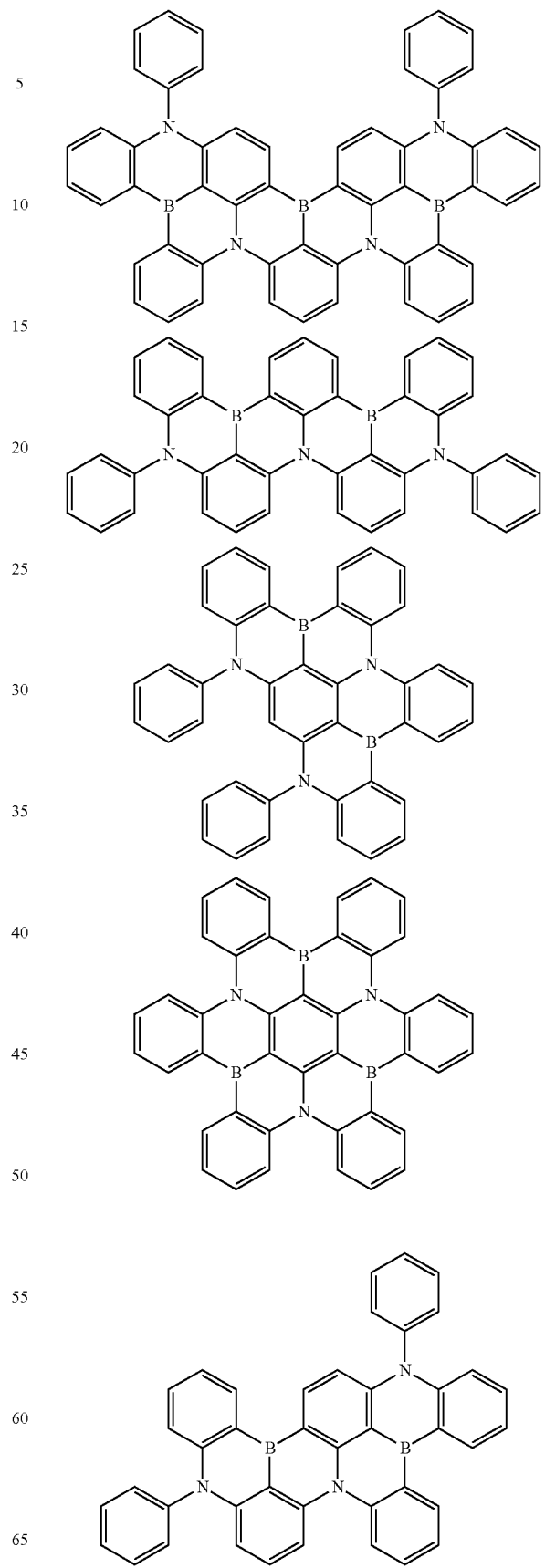

123
-continued
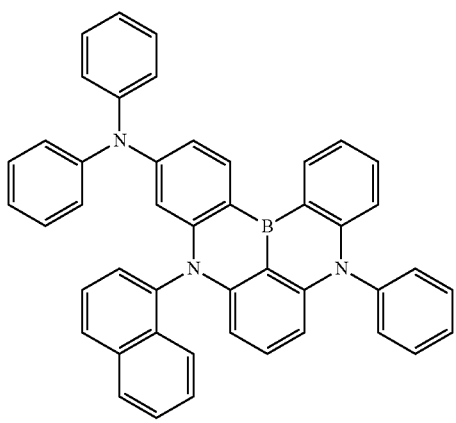
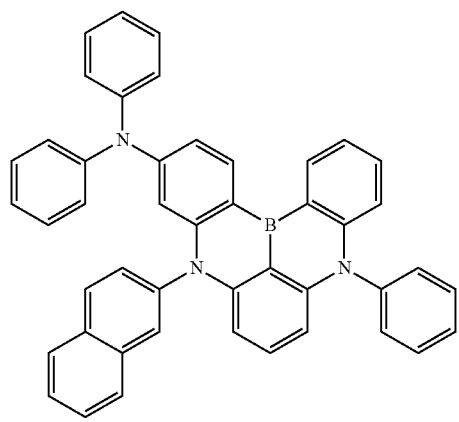
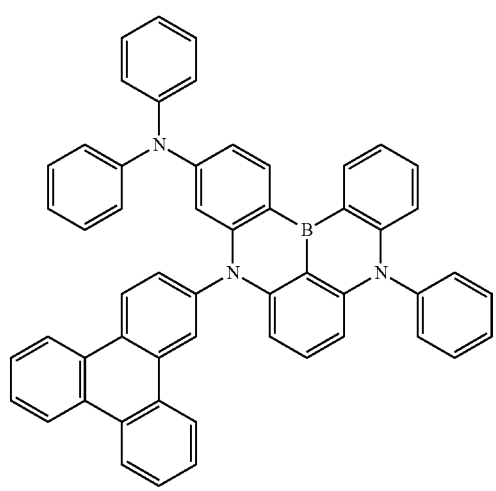
124
-continued
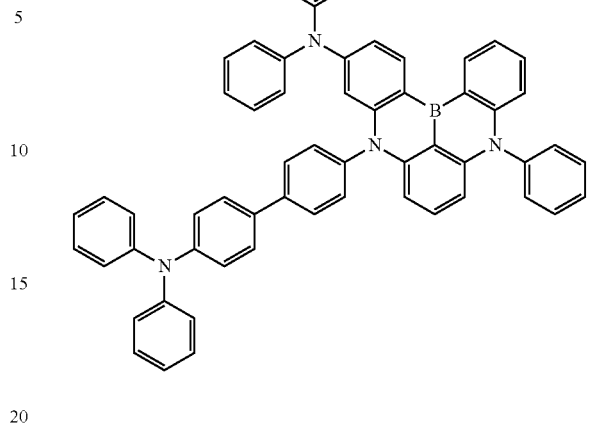
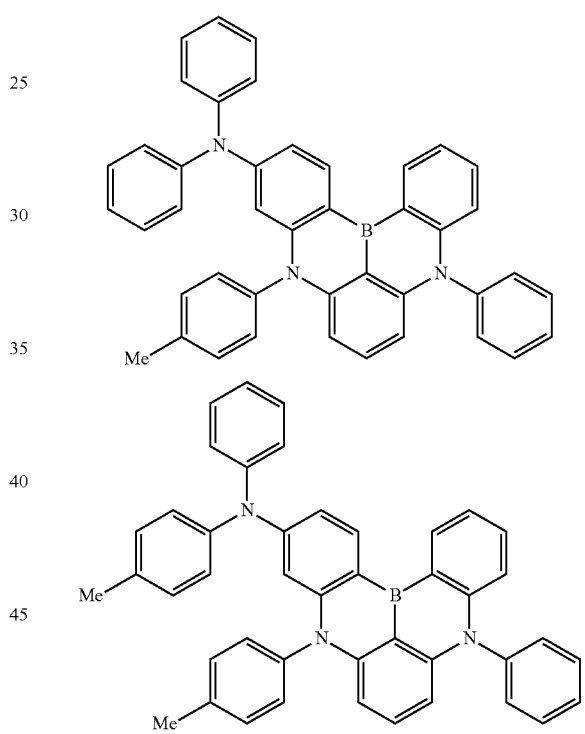
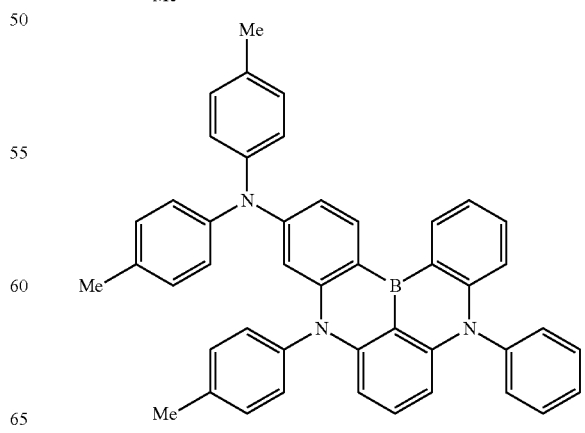

125
-continued
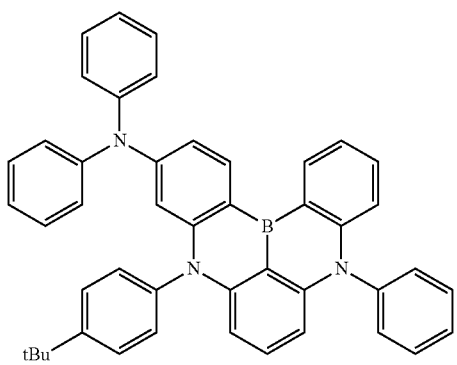
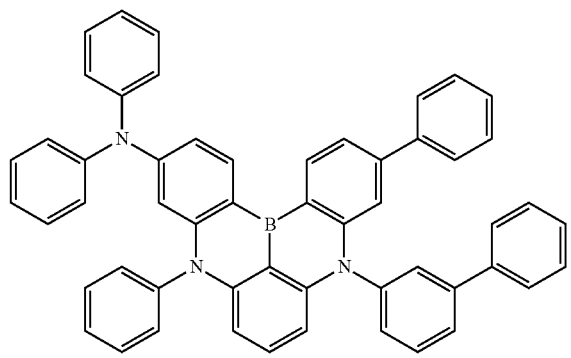
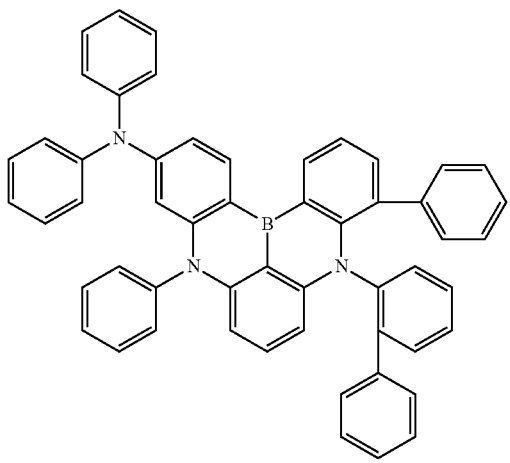
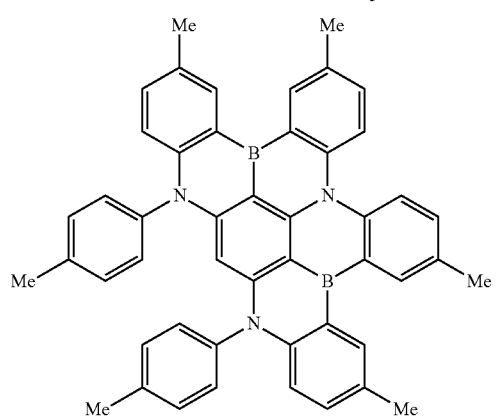
126
-continued
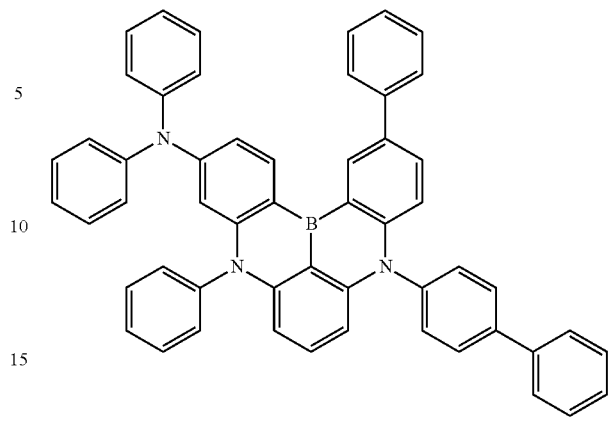
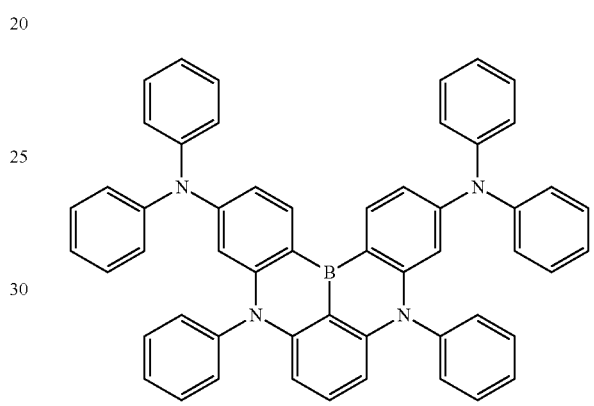
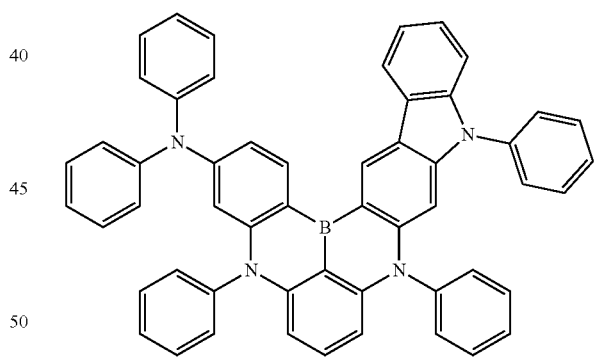
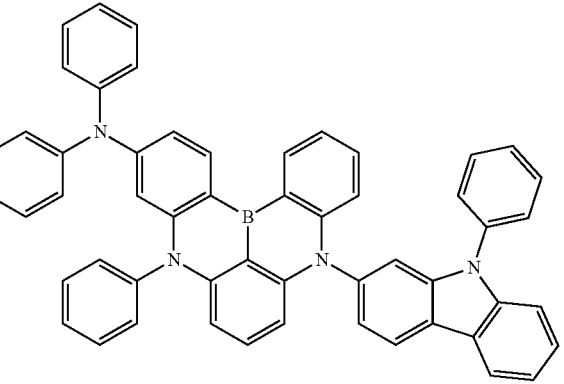

127
-continued
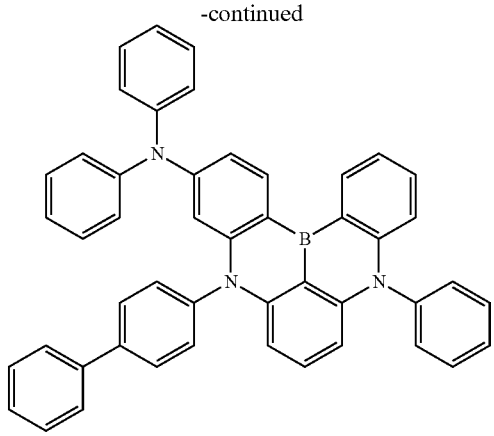
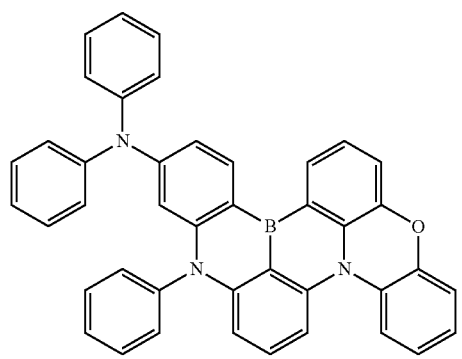
128
-continued
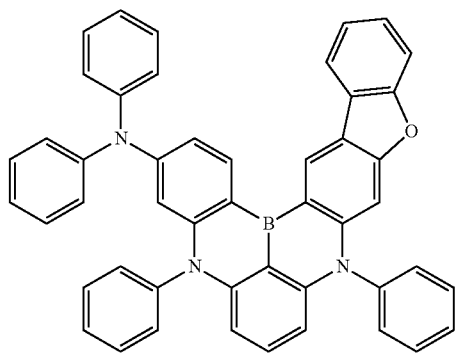
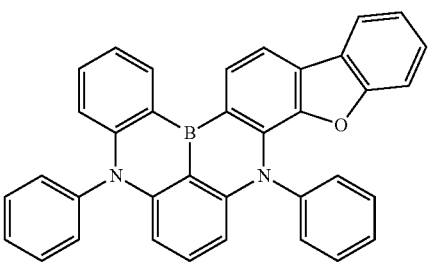
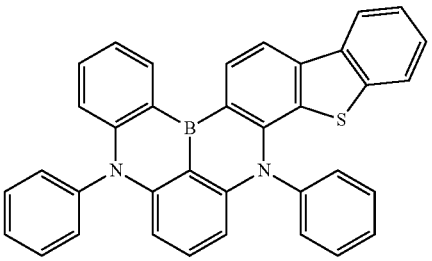
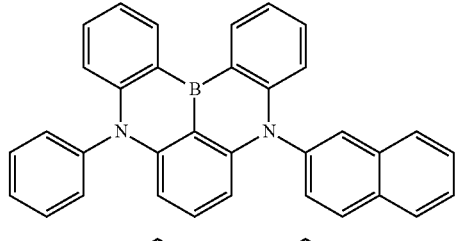
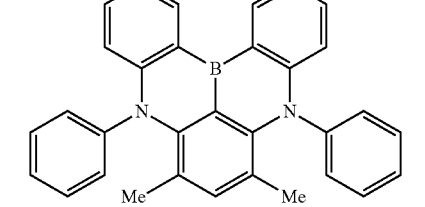
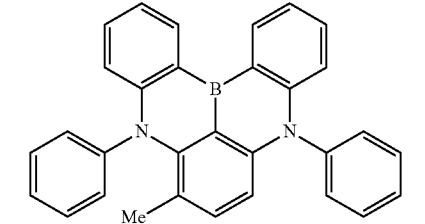

129
-continued
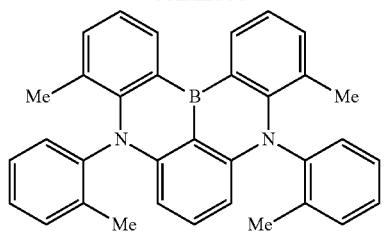
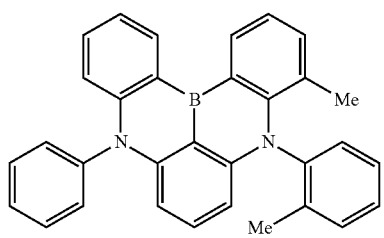
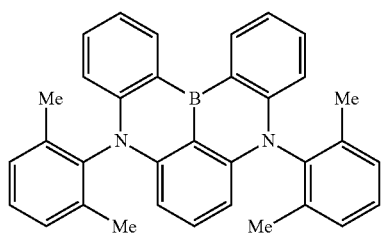
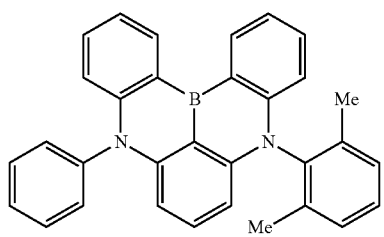
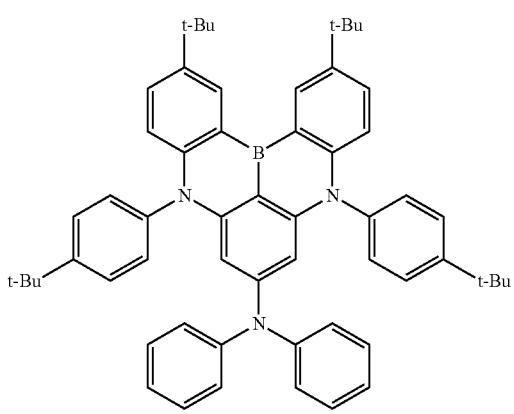
130
-continued
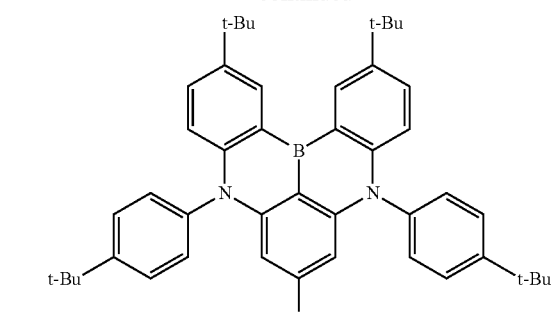
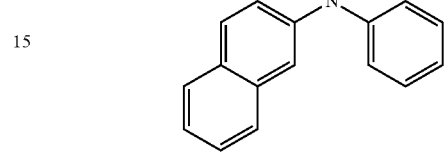
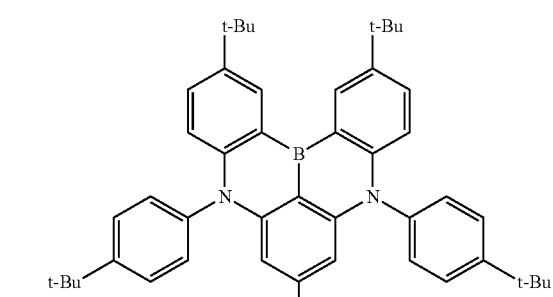
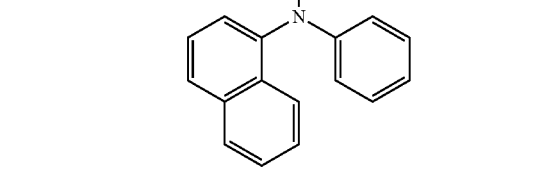
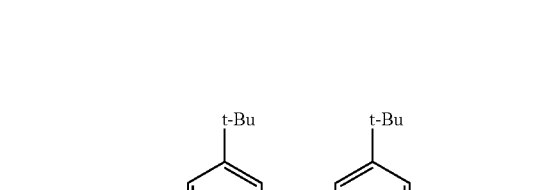
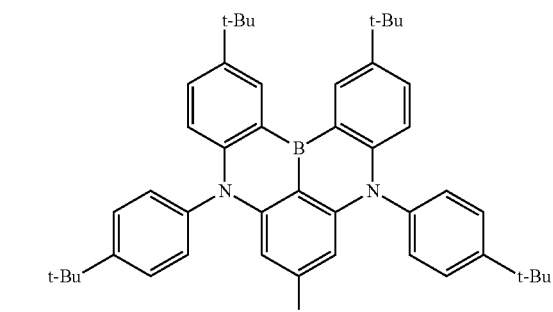
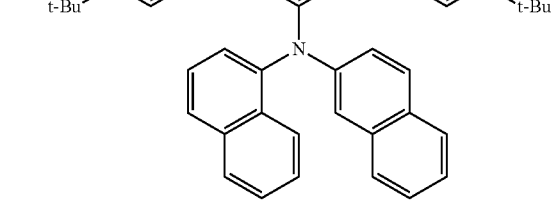

131
-continued
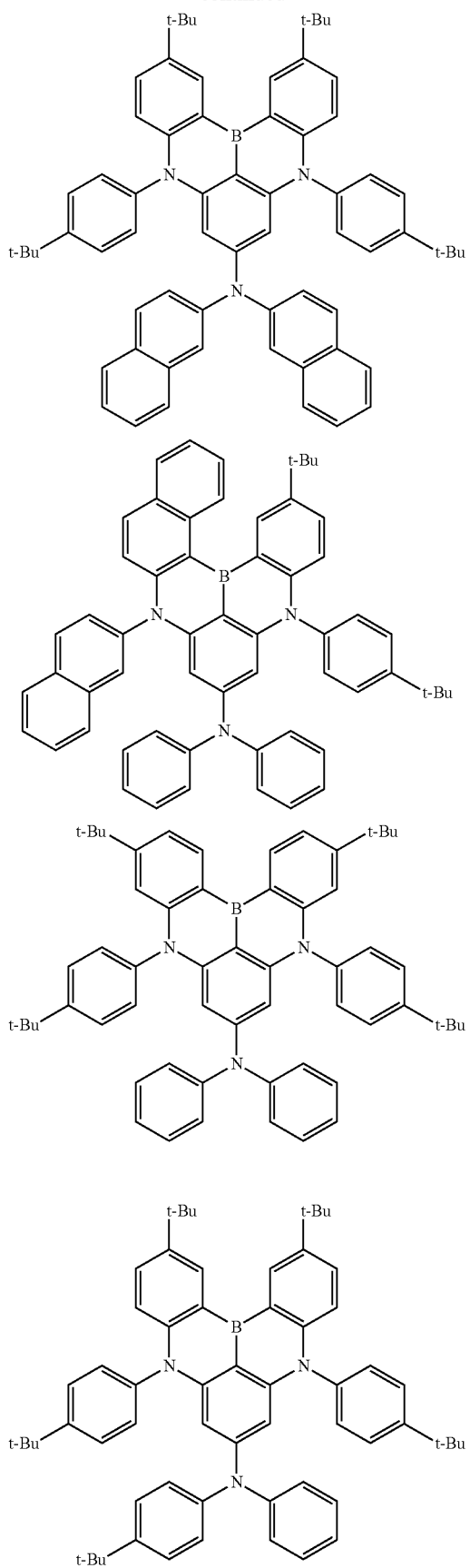
132
-continued
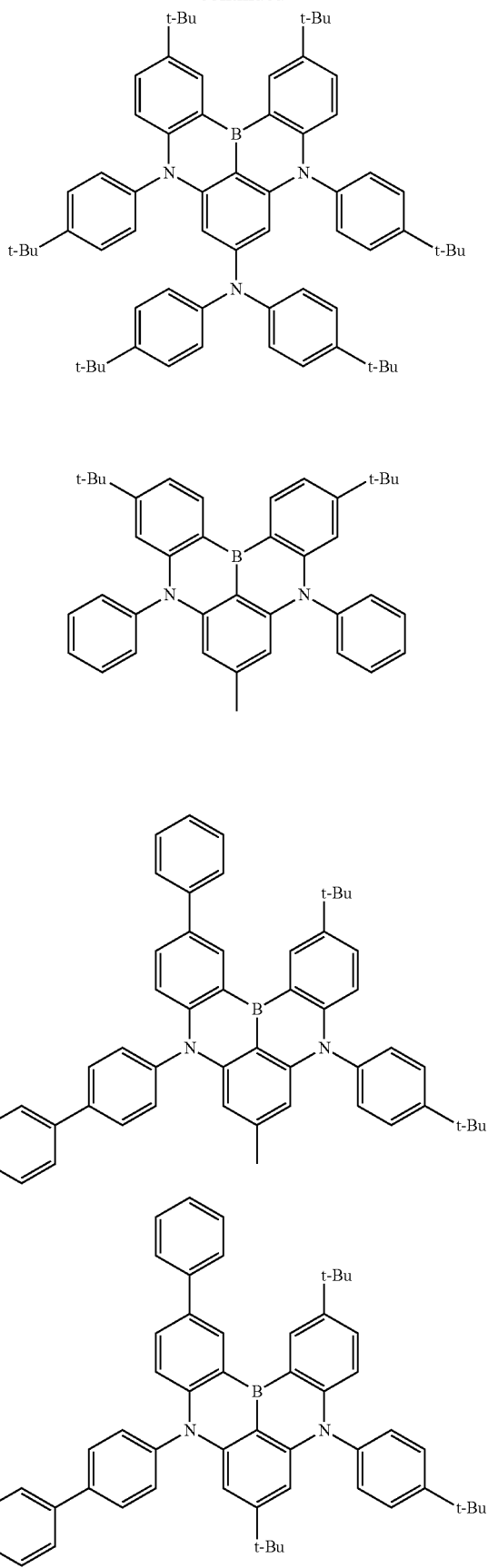

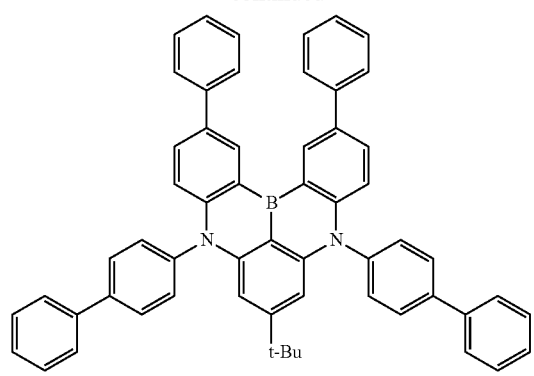
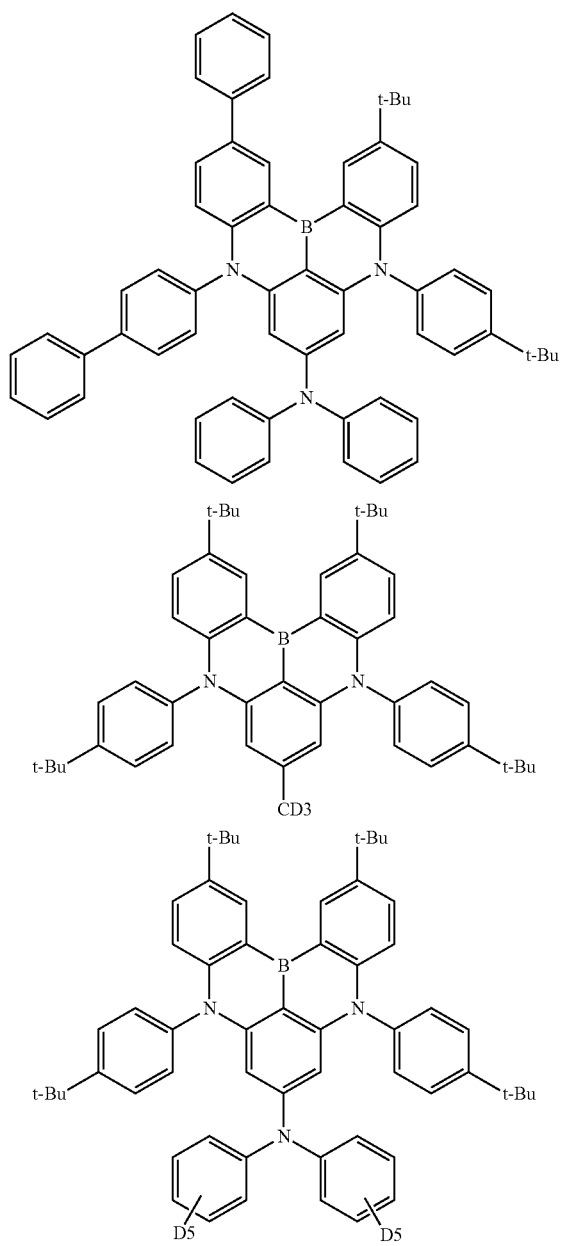
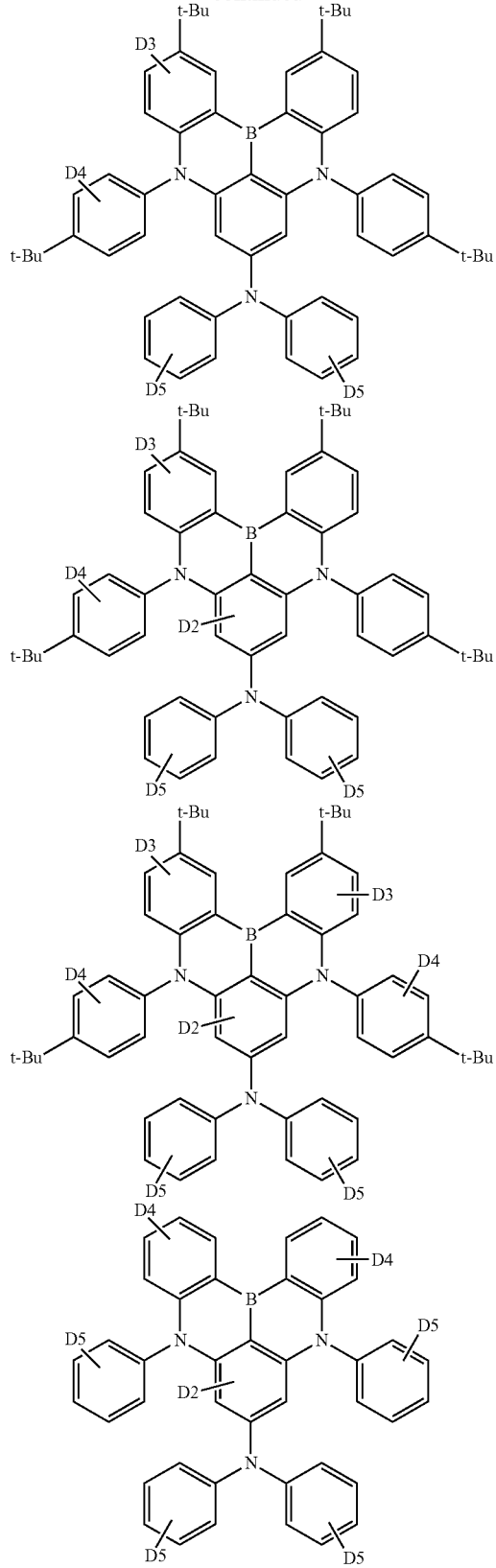
In the compounds above, D2 to D5 represent that 2 to 5 hydrogens are replaced with deuterium, respectively. For example, D5 means that the five substituents are deuterium.

According to one embodiment of the present disclosure, the compound represented by formula 1 may be represented by the following formula 1-1. In addition, according to one embodiment of the present disclosure, an organic electroluminescent compound represented by the following formula 1-1 may be provided.

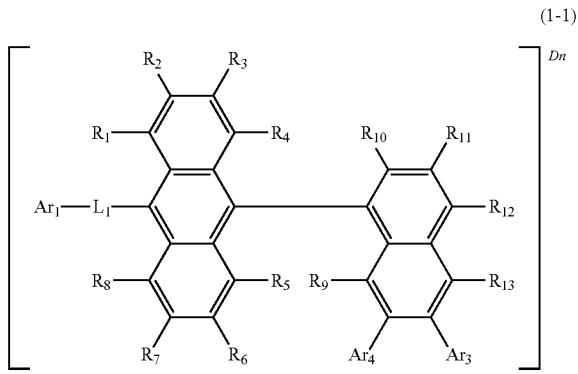

(1-1)

In formula 1-1, $L_1$ represents a single bond, a substituted or unsubstituted (C6-C30)arylene, or a substituted or unsubstituted (5- to 30-membered)heteroarylene. According to one embodiment of the present disclosure, $L_1$ represents a single bond, a substituted or unsubstituted (C6-C25)arylene, or a substituted or unsubstituted (5- to 25-membered)heteroarylene. According to another embodiment of the present disclosure, $L_1$ represents a single bond, or an unsubstituted (C6-C18)arylene. For example, $L_1$ represents a single bond, a phenylene, a naphthylene, or a biphenylene.

In formula 1-1, $Ar_1$ represents a substituted or unsubstituted (C6-C30)aryl, or a substituted or unsubstituted (5- to 30-membered)heteroaryl. According to one embodiment of the present disclosure, $Ar_1$ represents a substituted or unsubstituted (C6-C25)aryl, or a substituted or unsubstituted (5- to 25-membered)heteroaryl. According to another embodiment of the present disclosure, $Ar_1$ represents a (C6-C25)aryl unsubstituted or substituted with a (C1-C10)alkyl(s) and/or a (C6-C18)aryl(s), or a (5- to 20-membered)heteroaryl unsubstituted or substituted with a (C6-C18)aryl(s), For example, $Ar_1$ may represent a phenyl, a naphthyl, a biphenyl, a dimethylfluorenyl, a diphenylfluorenyl, a phenylfluorenyl, a phenanthrenyl, a dimethylbenzofluorenyl, a diphenylbenzofluorenyl, a terphenyl, a triphenylenyl, a spirobifluorenyl, a dibenzofuranyl, a dibenzothiophenyl, a carbazolyl, a phenylcarbazolyl, a benzonaphthofuranyl, or a benzonaphthothiophenyl.

In formula 1-1, $Ar_3$ and $Ar_4$, each independently, represent hydrogen, deuterium, a substituted or unsubstituted (C6-C30)aryl, or a substituted or unsubstituted (5- to 30-membered)heteroaryl, with a proviso that $Ar_3$ and $Ar_4$ are not simultaneously hydrogen. According to one embodiment of the present disclosure, any one of $Ar_3$ and $Ar_4$ may represent hydrogen or deuterium, and the other of $Ar_3$ and $Ar_4$ may represent a substituted or unsubstituted (C6-C30)aryl, or a substituted or unsubstituted (5- to 30-membered)heteroaryl. According to another embodiment of the present disclosure, one of $Ar_3$ and $Ar_4$ may represent a substituted or unsubstituted (C6-C25)aryl, or a substituted or unsubstituted (5- to 25-membered)heteroaryl, According to another embodiment of the present disclosure, any, one of $Ar_3$ and $Ar_4$ may represent an unsubstituted (C6-C18)aryl, or an unsubstituted (5- to 20-membered)heteroaryl. For example, any one of $Ar_3$ and $Ar_4$ may represent a phenyl, a naphthyl, a biphenyl, a phenanthrenyl, a naphthylphenyl, a dibenzofuranyl, or a dibenzothiophenyl.

In formula 1-1, $R_1$ to $R_{13}$, each independently, represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino. For example, $R_1$ to $R_{13}$, each independently, may represent hydrogen or deuterium.

In formula 1-1, $D_n$ represents that n hydrogens are replaced with deuterium; and n represents an integer of 8 or more. At least four of $R_1$ to $R_8$ may represent deuterium. The upper limit of n is determined by the number of hydrogens that can be substituted in each compound. Preferably, n represents an integer of 10 or more, and more preferably, an integer of 15 or more. When being deuterated to the number of the lower limit or more, the bond dissociation energy related to deuteration may increase to exhibit improved lifetime properties.

The compound represented by formula 1-1 may be specifically exemplified by the following compounds, but is not limited thereto.

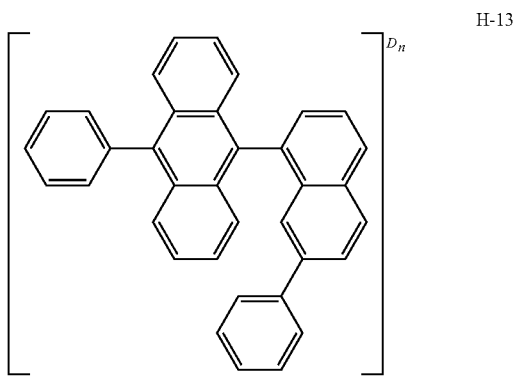

H-13

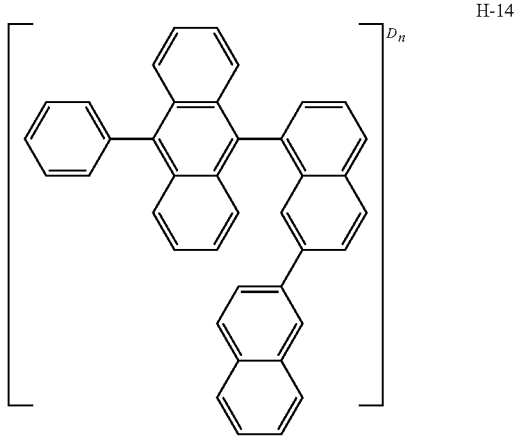

H-14

-continued
H-15
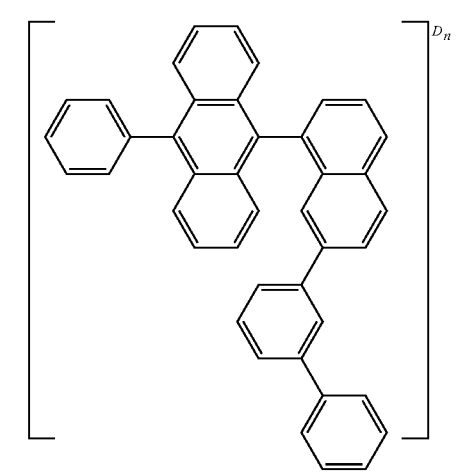
H-16
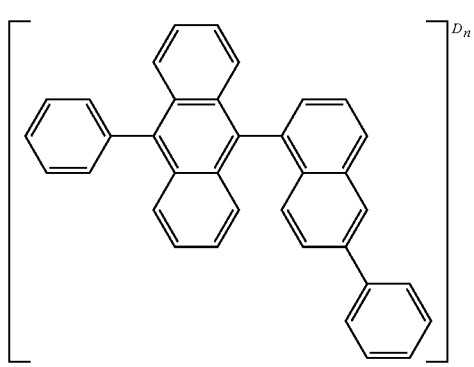
H-17
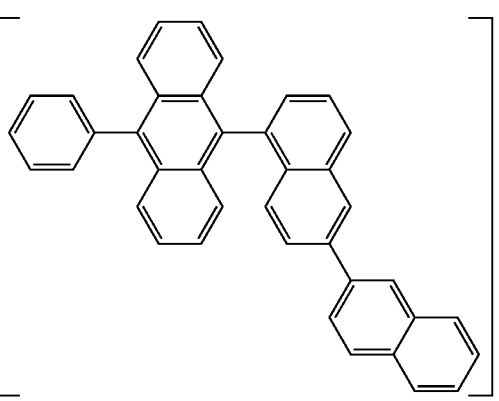
H-18
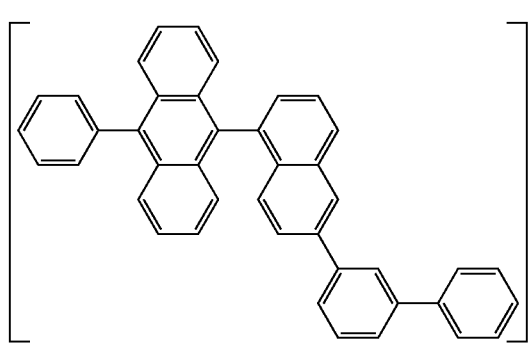
H-21
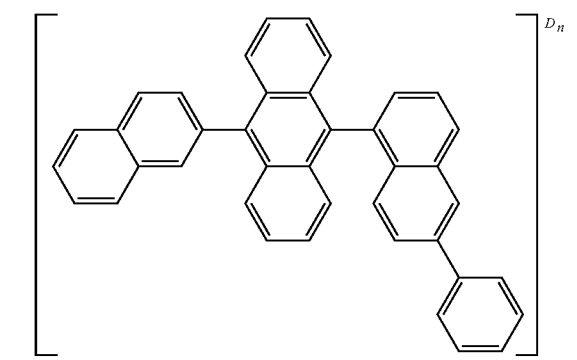
H-22
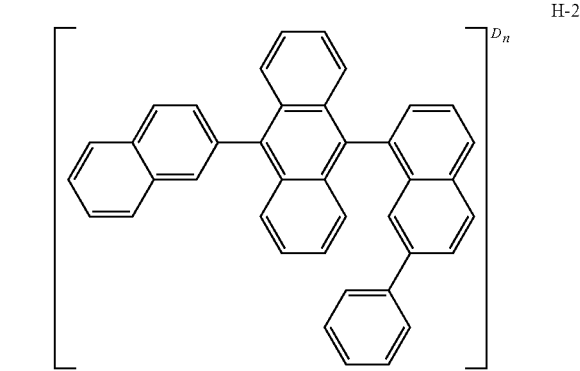
H-23
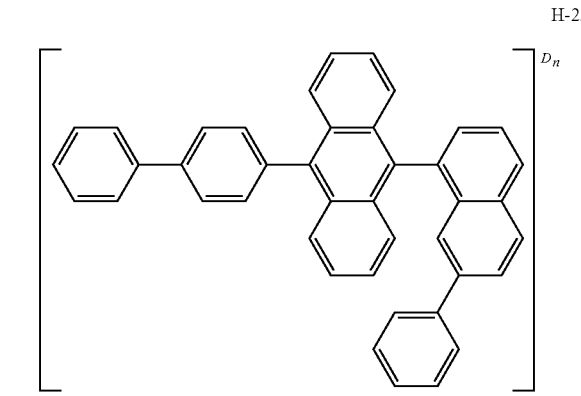
H-24
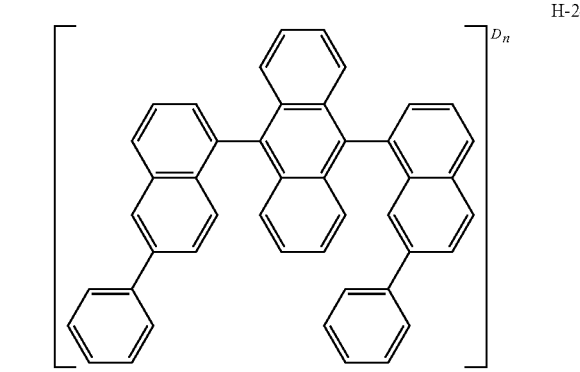

H-25
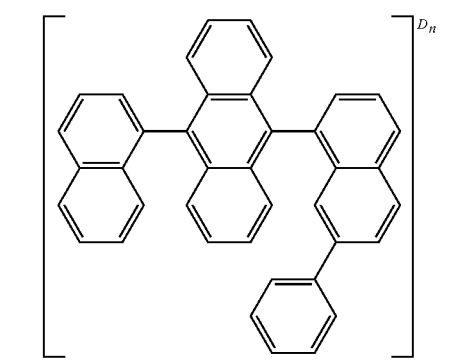
H-27
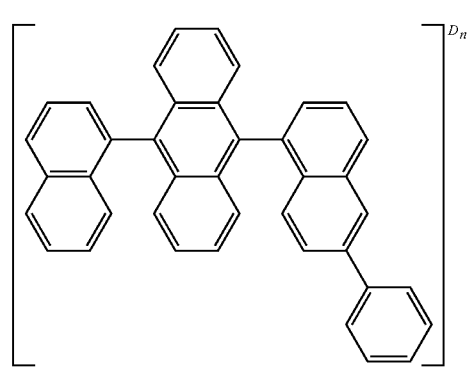
H-76
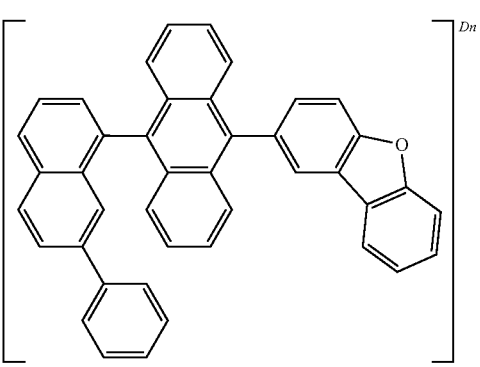
H-77
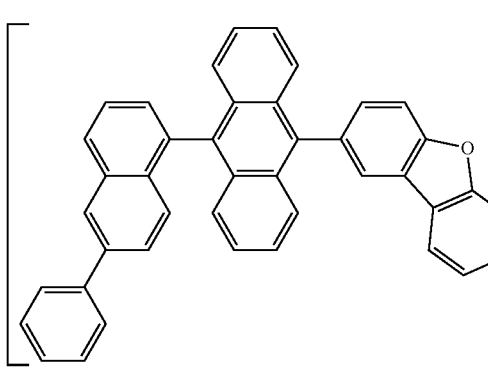
H-78
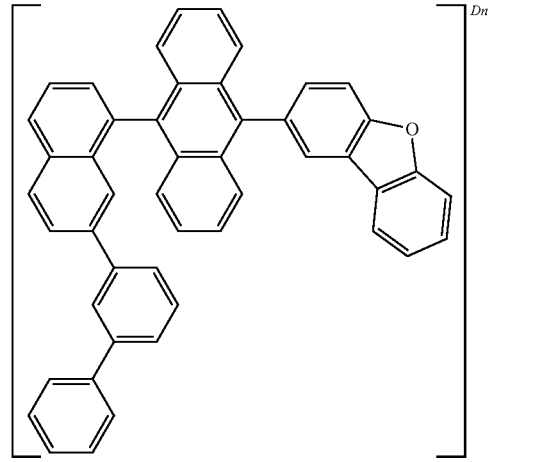
H-79
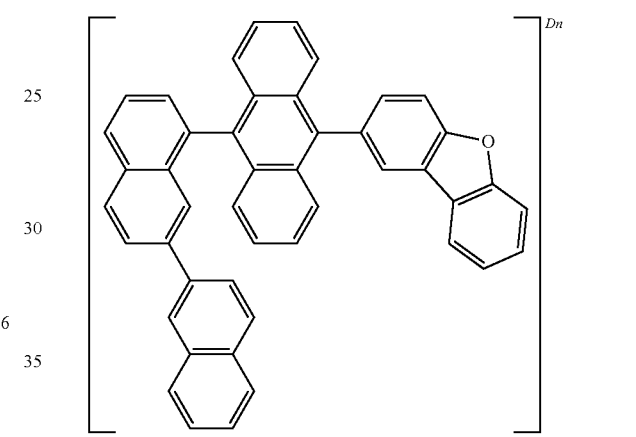
H-80
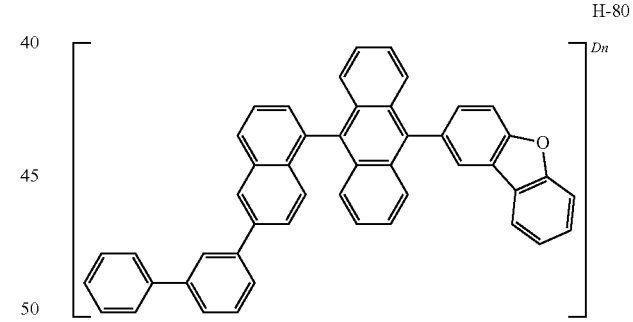
H-81
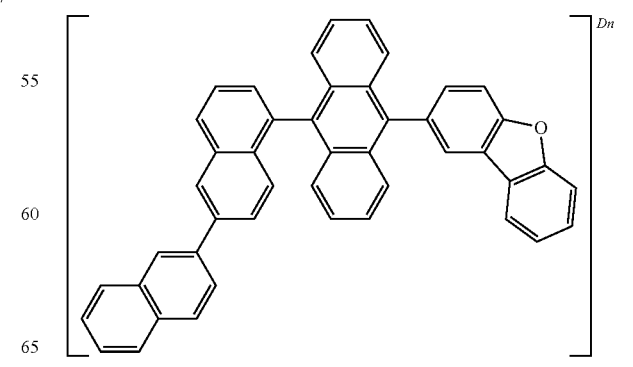

-continued
H-95
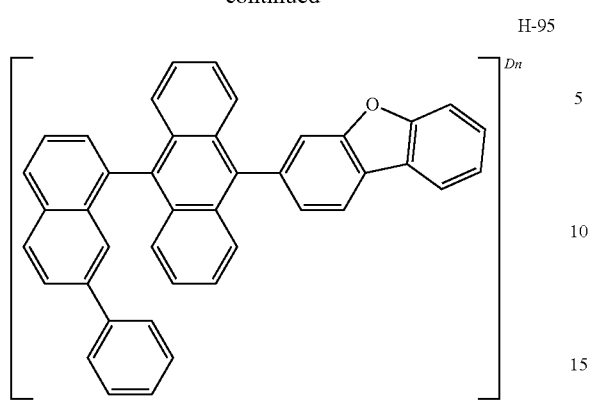
H-96
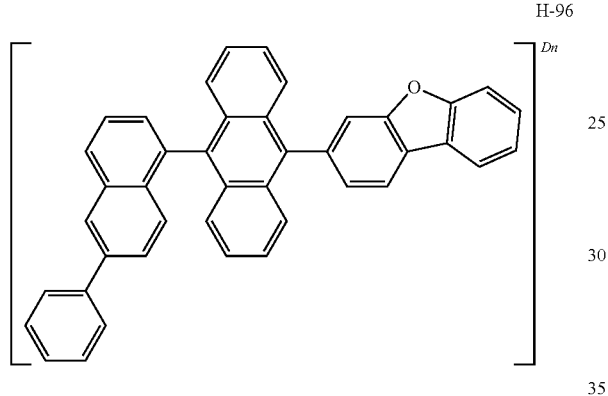
H-97
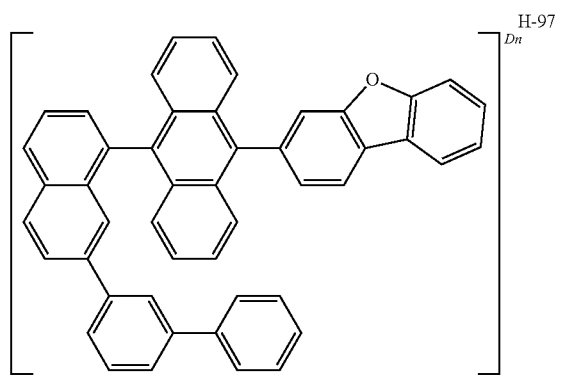
H-103
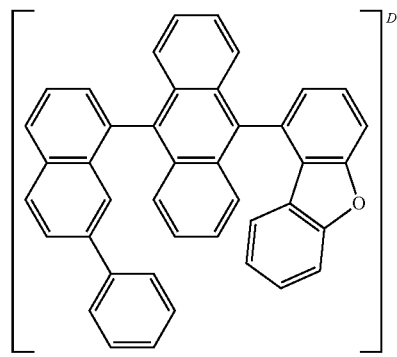
-continued
H-104
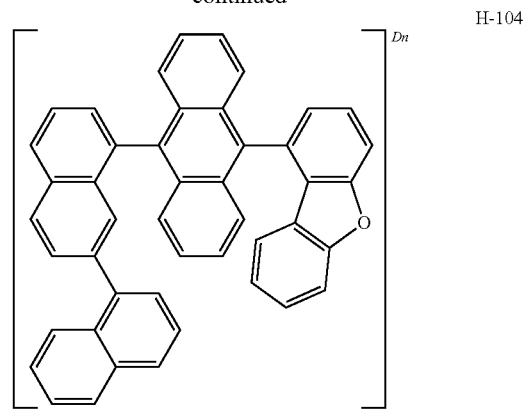
H-105
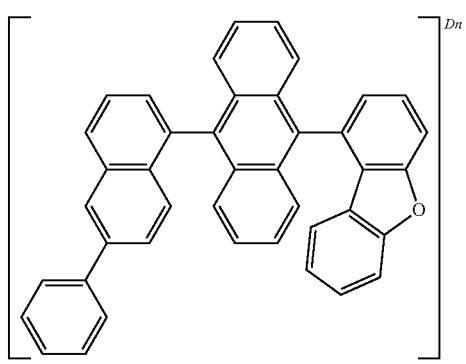
H-125
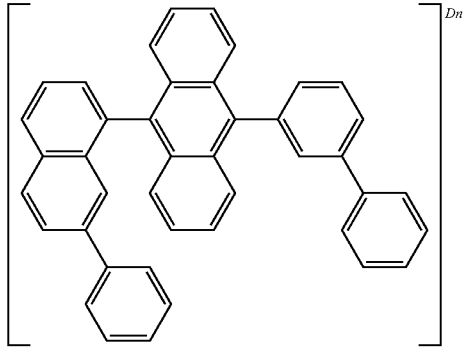
H-126
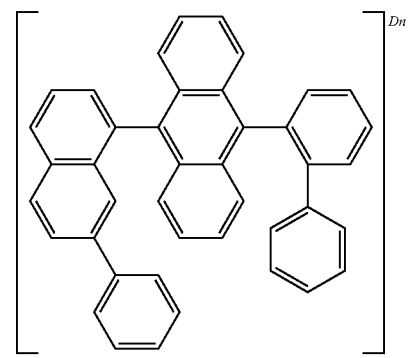

H-127
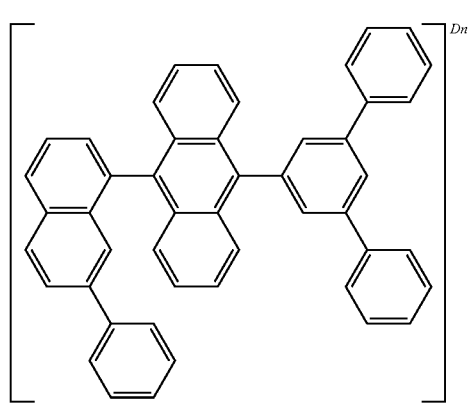
H-128
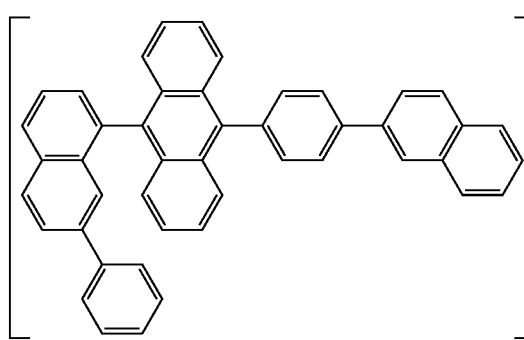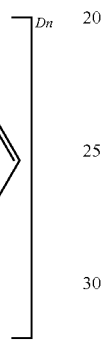
H-129
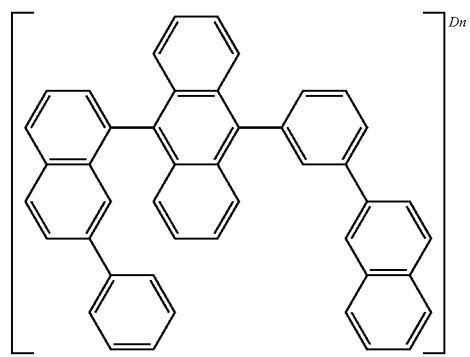
H-130
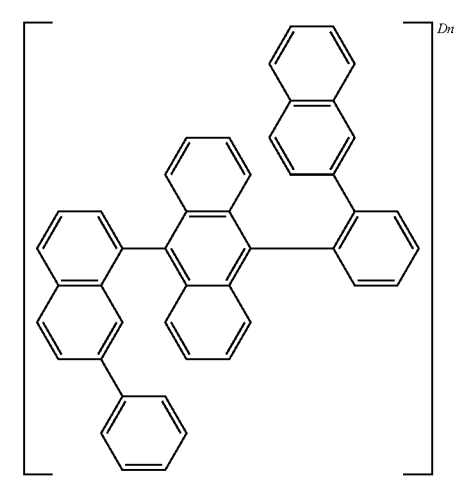
H-131
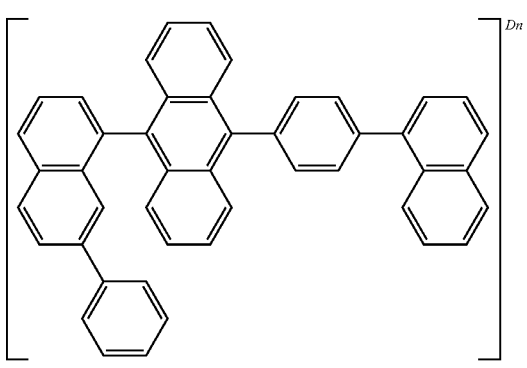
H-132
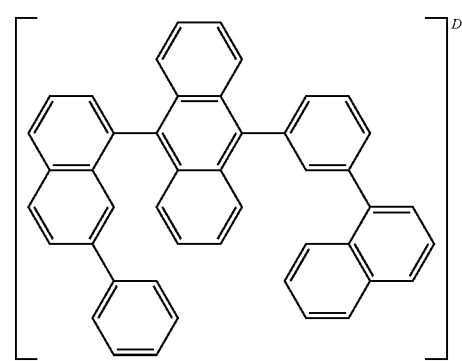
H-133
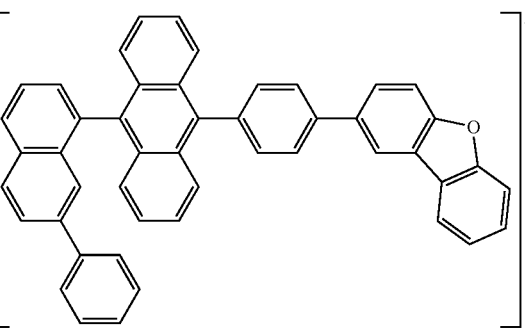
H-134
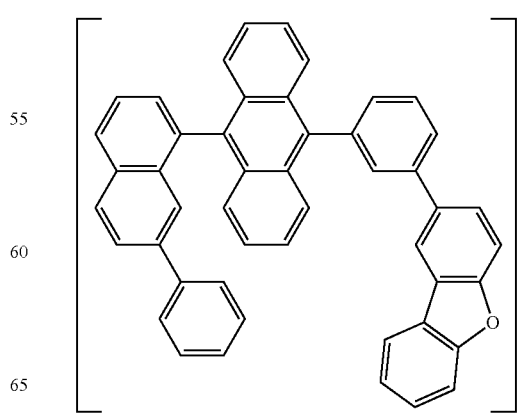

H-135
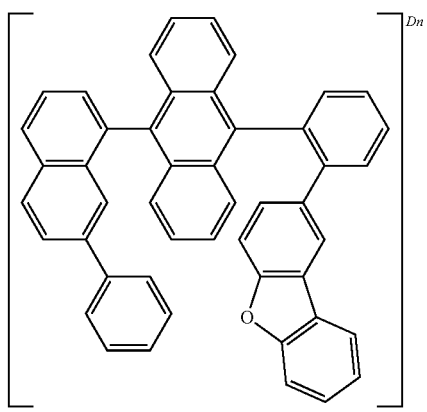
H-138
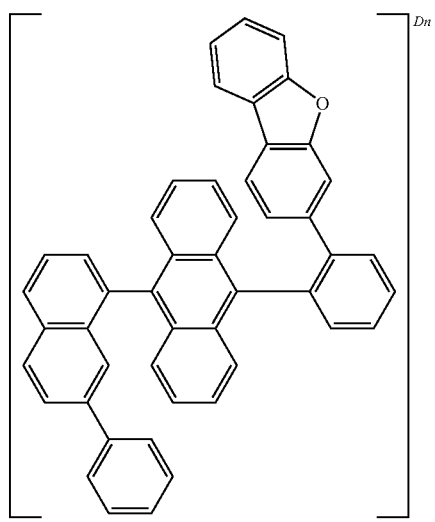
H-136
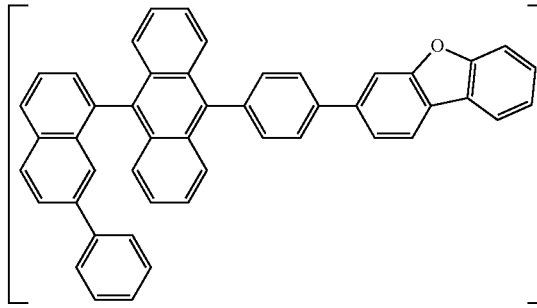
H-139
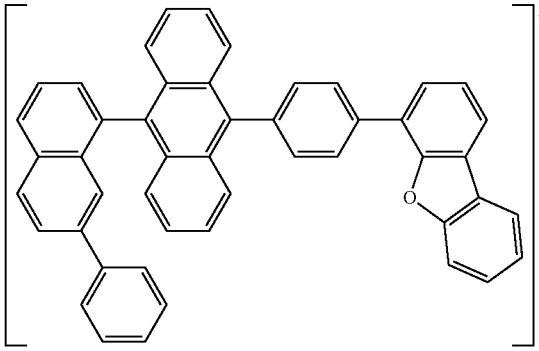
H-137
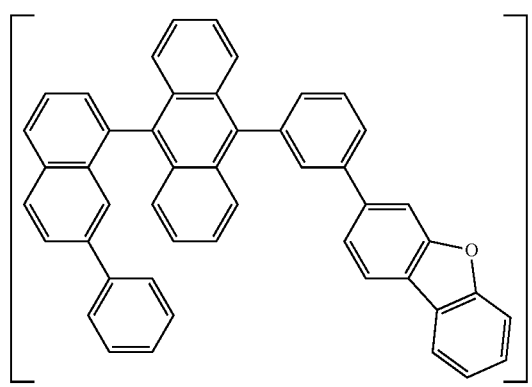
H-140
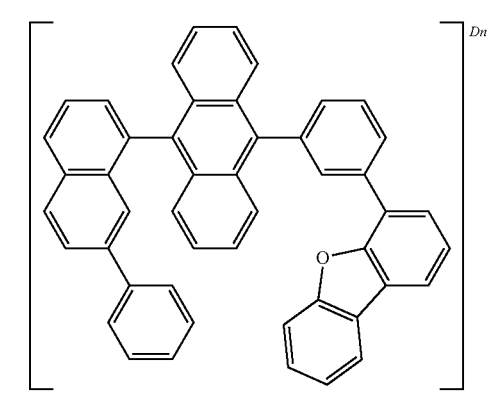

H-141
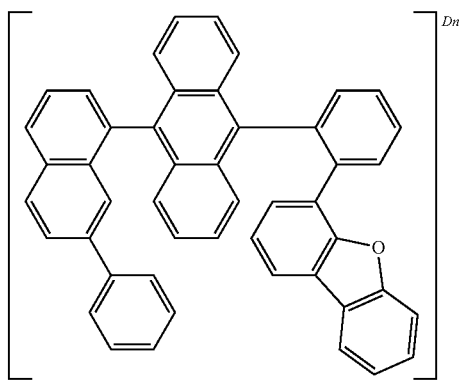
H-142
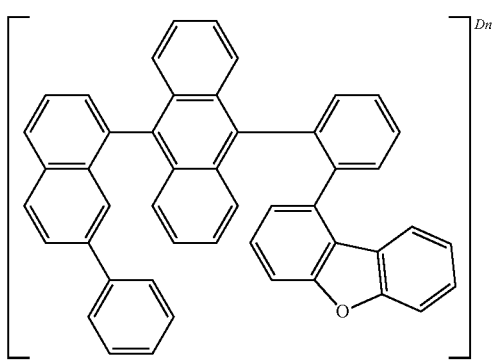
H-143
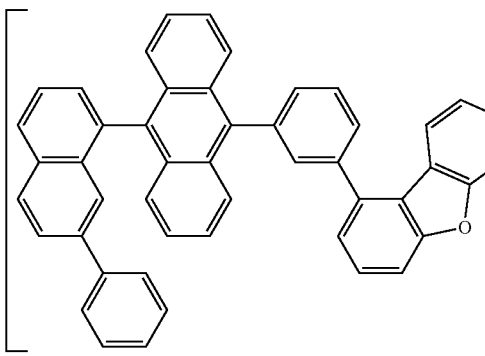
H-144
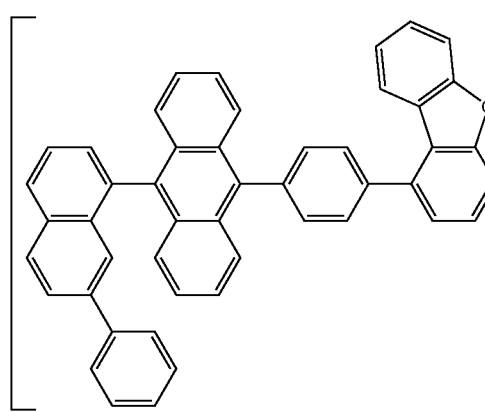
H-145
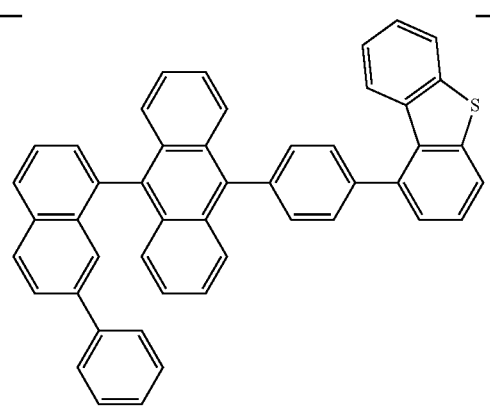
H-146
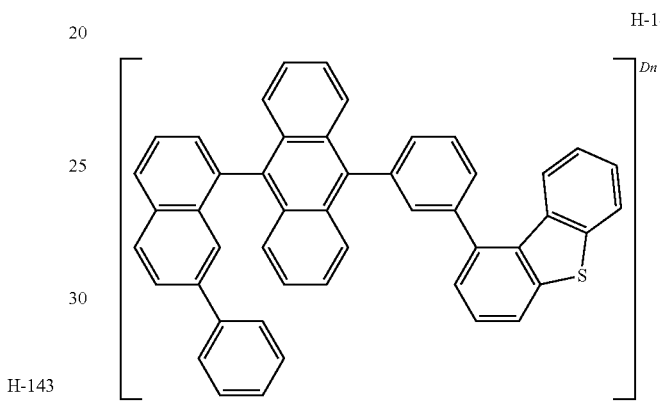
H-147
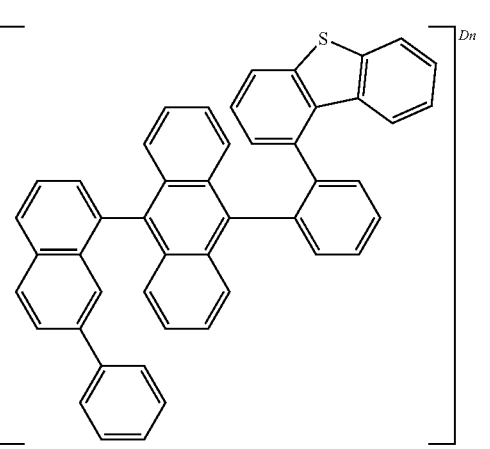
H-148
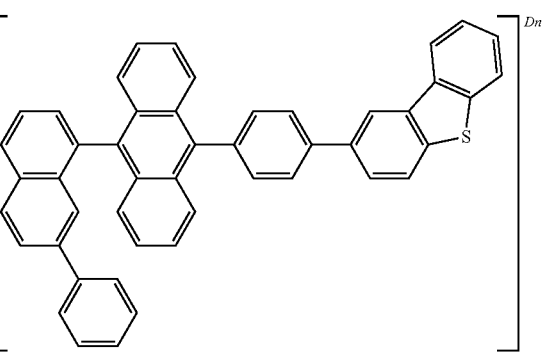

-continued
H-149
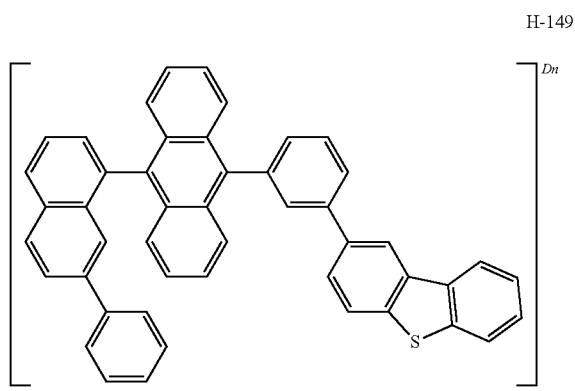
H-150
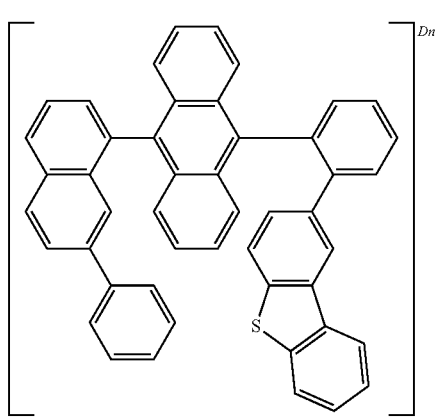
H-151
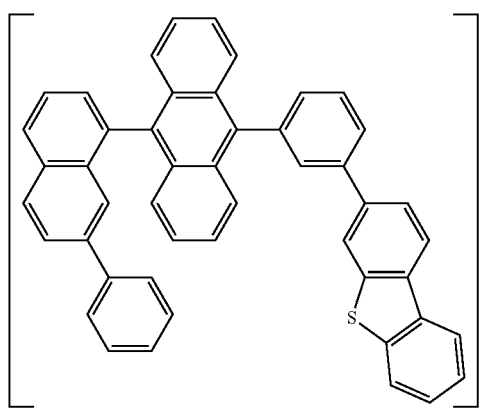
H-152
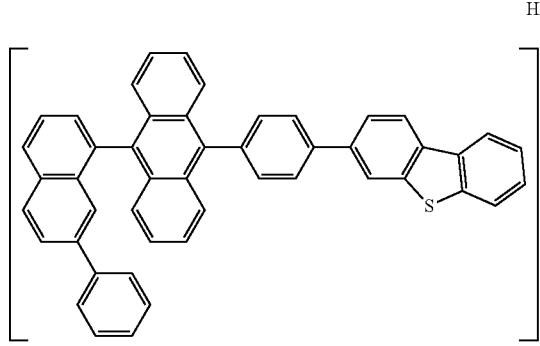
H-153
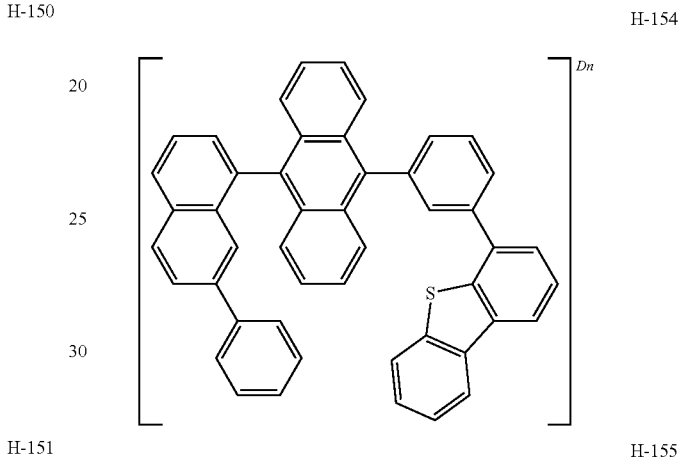
H-154
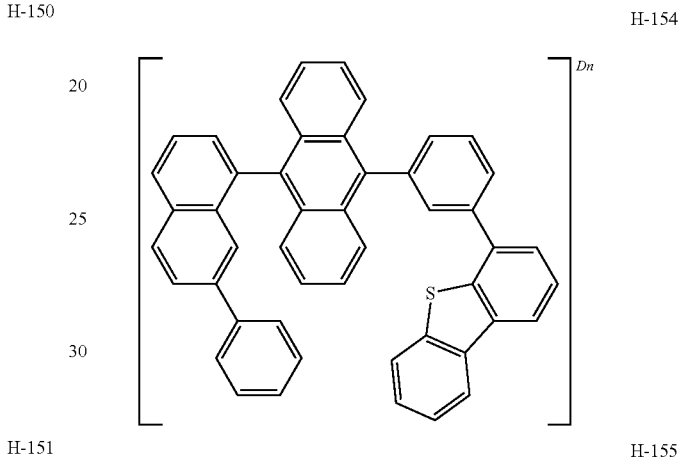
H-155
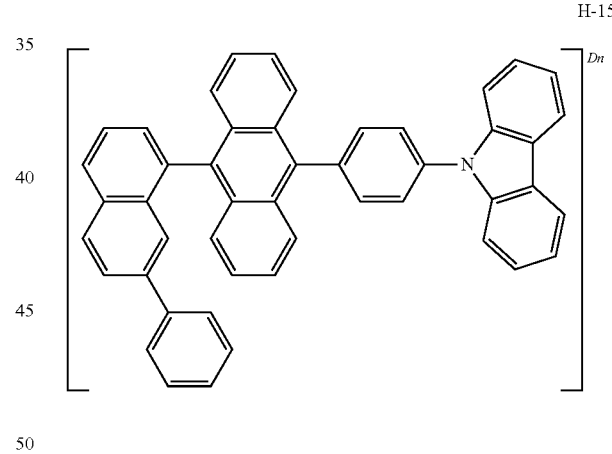
H-156
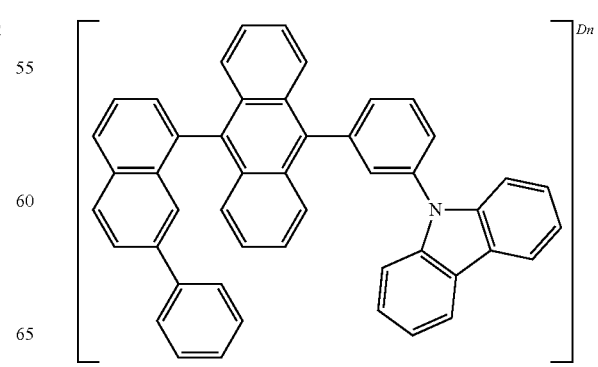

H-157
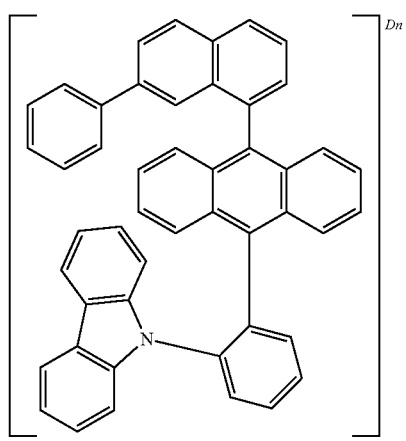
H-158
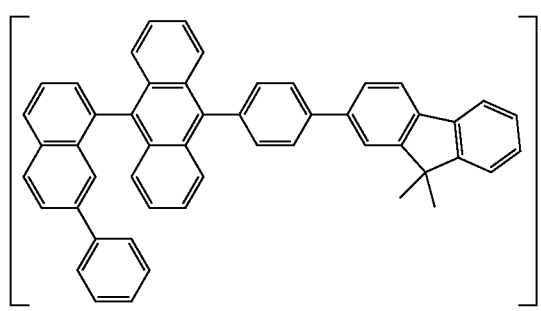
H-159
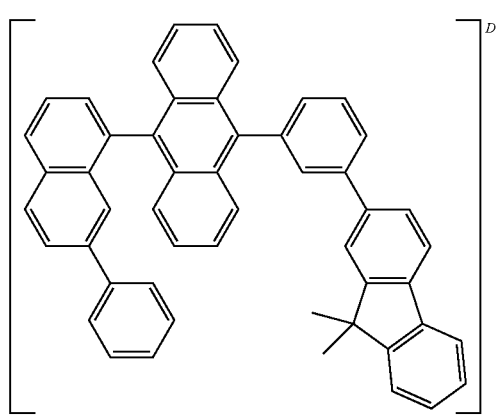
H-160
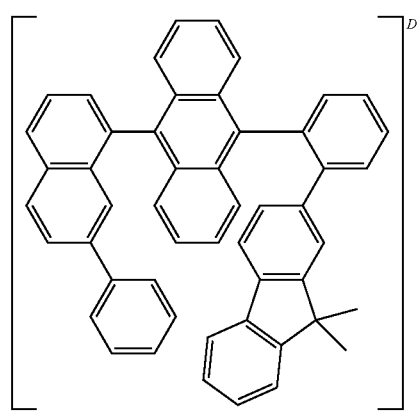
H-161
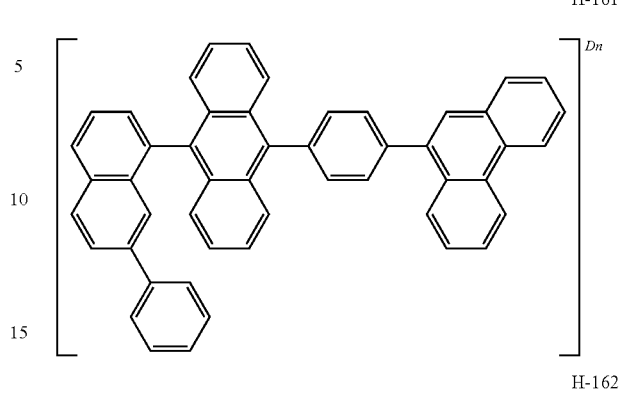
H-162
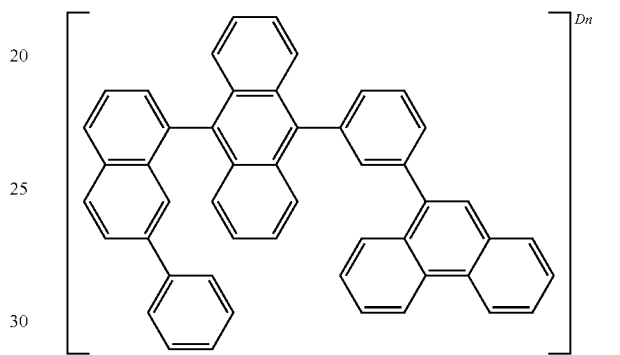
H-163
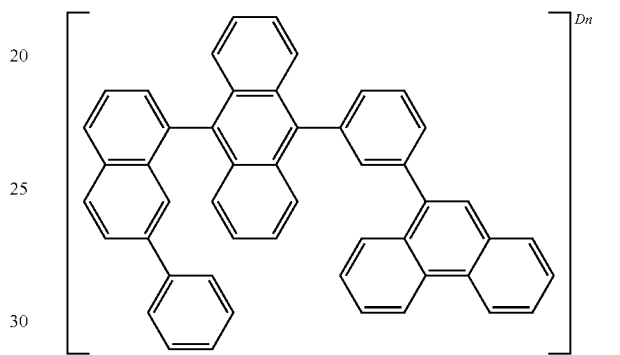
H-164
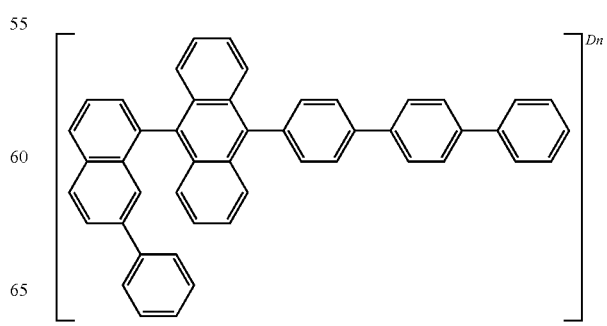

H-165
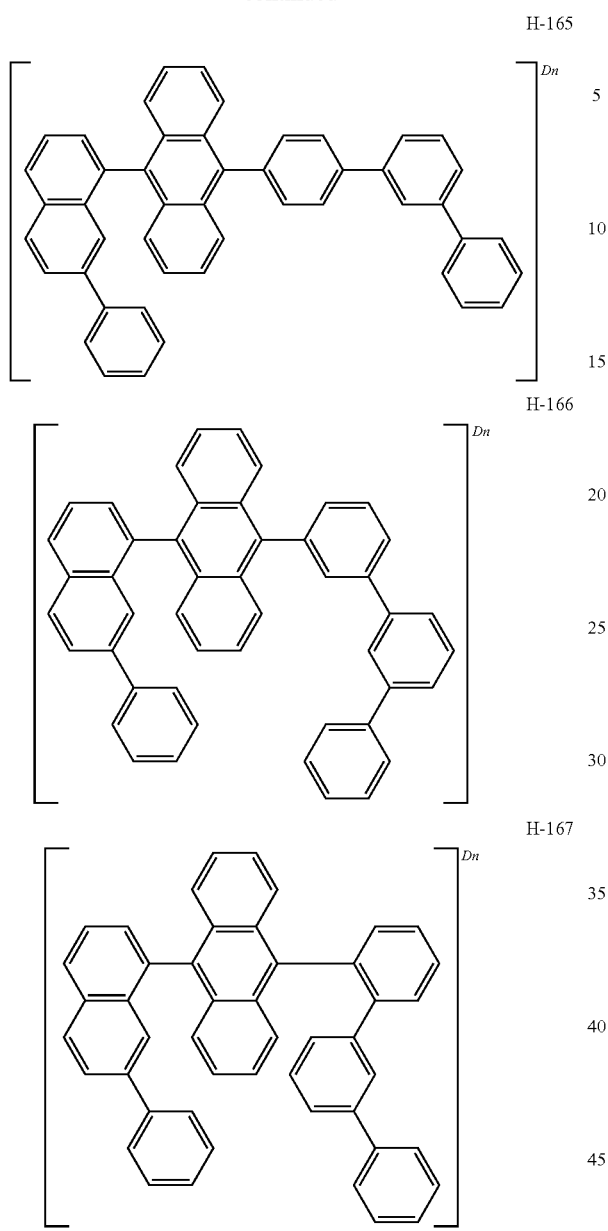
H-166
H-167
H-168
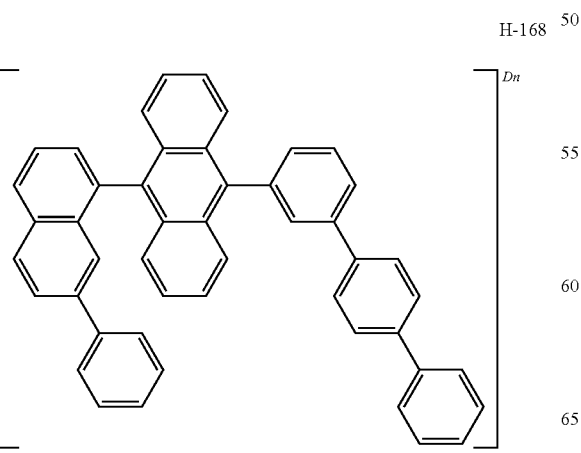
H-169
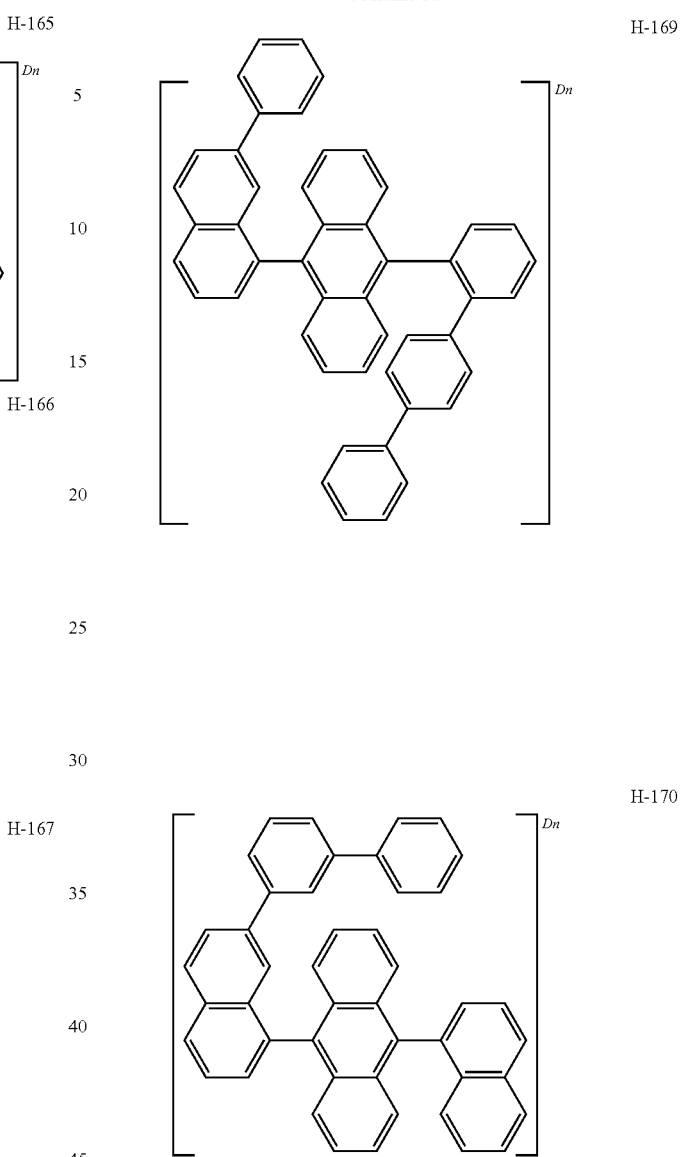
H-170
H-171
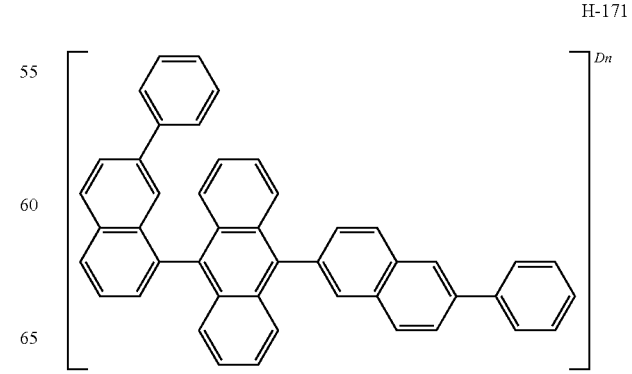

H-172
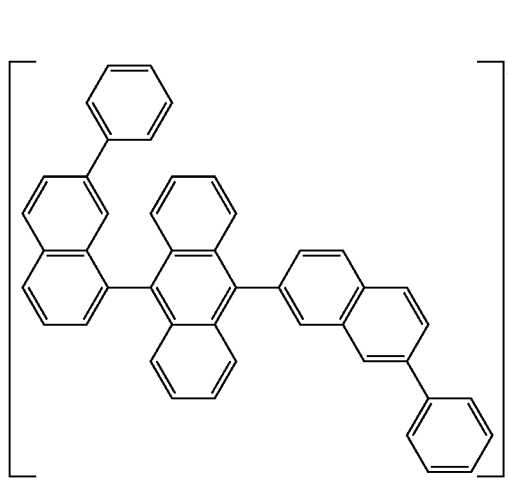
H-173
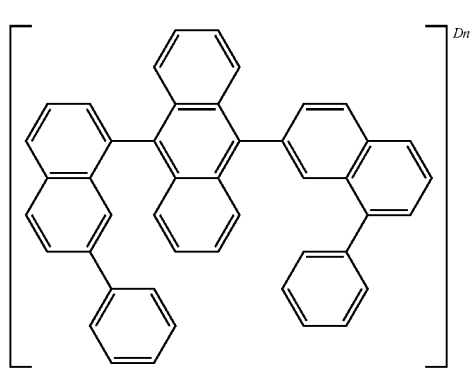
H-174
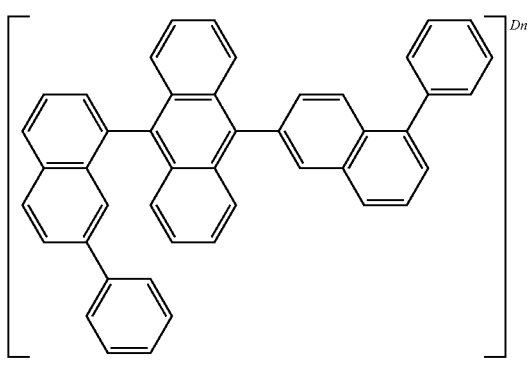
H-175
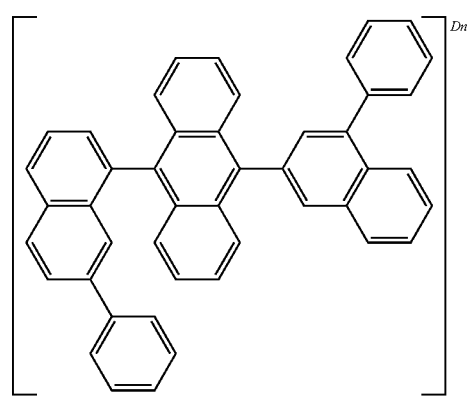
H-176
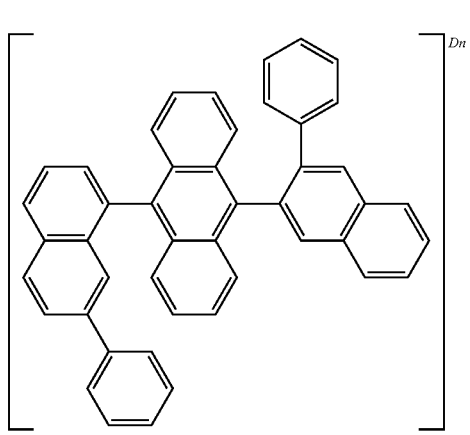
H-177
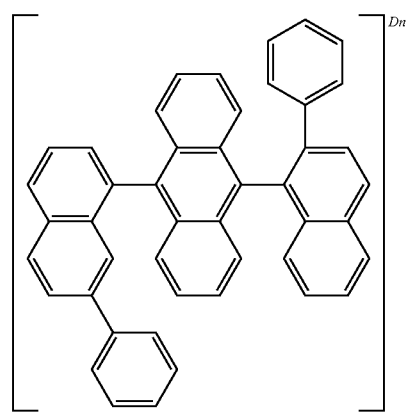
H-178
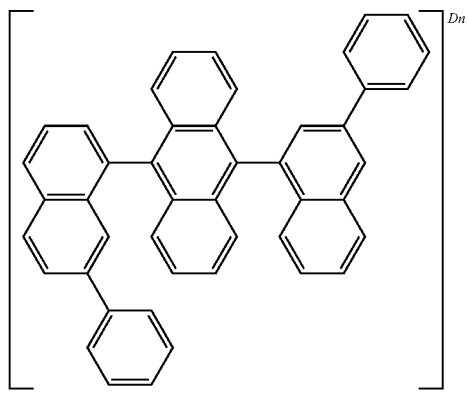
H-179
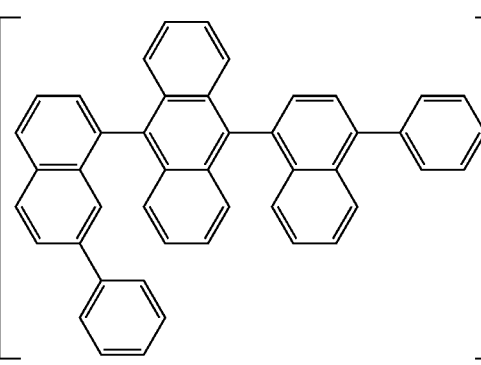

-continued
H-180
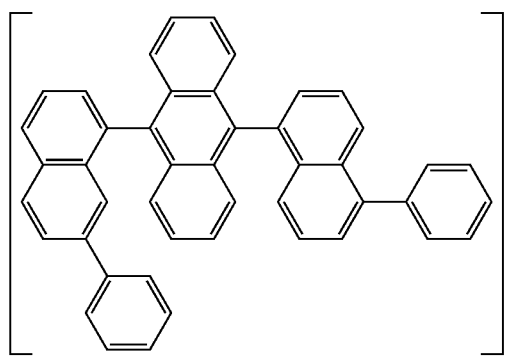
H-181
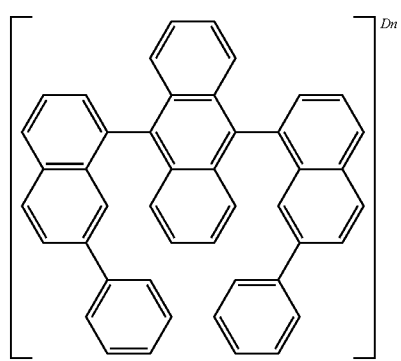
H-182
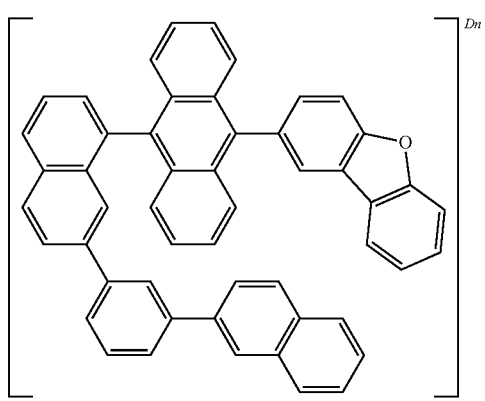
H-183
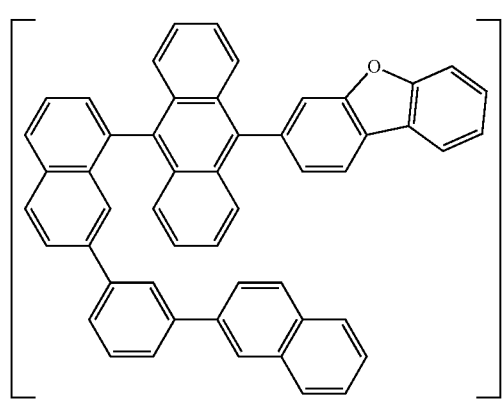
-continued
H-184
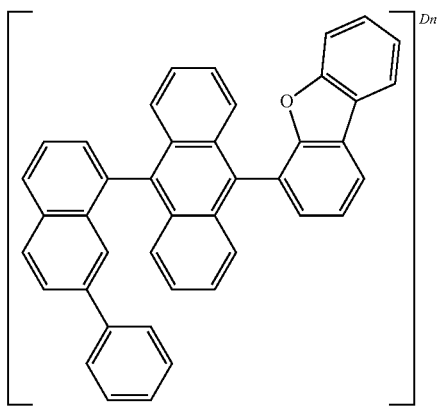
H-185
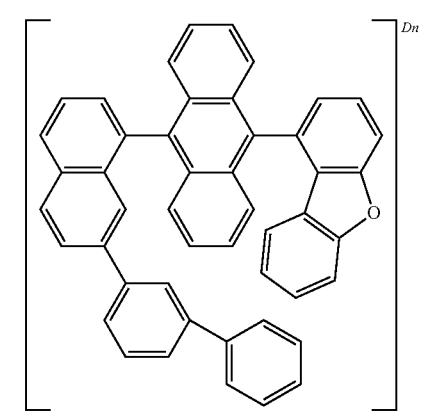
H-186
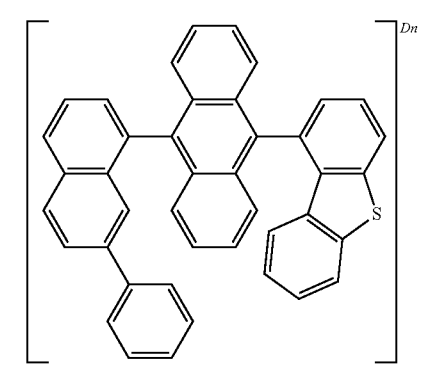
H-187
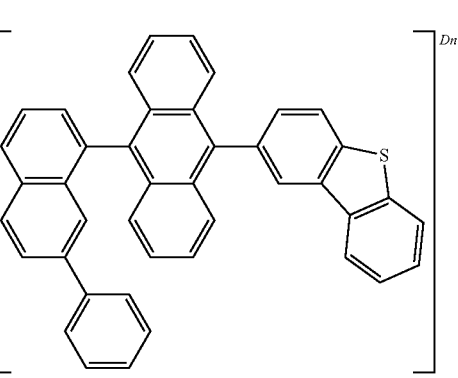

H-188
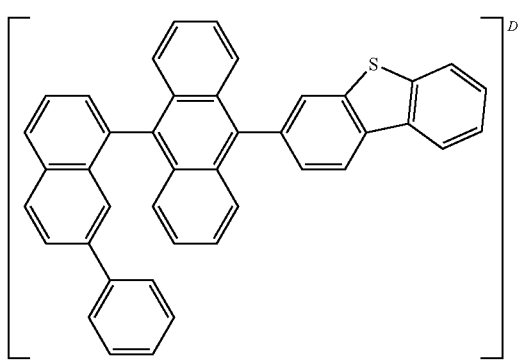
H-192
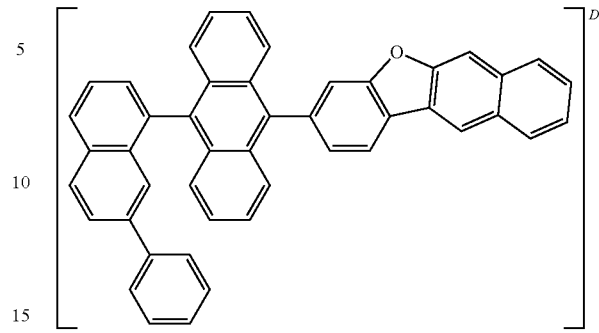
H-189
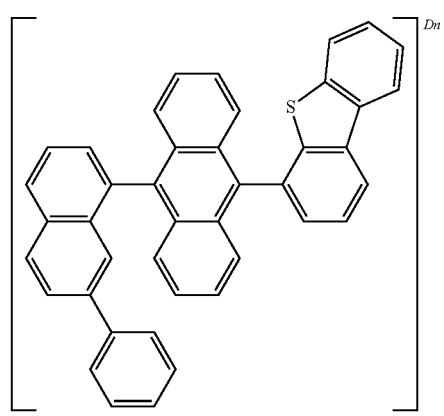
H-193
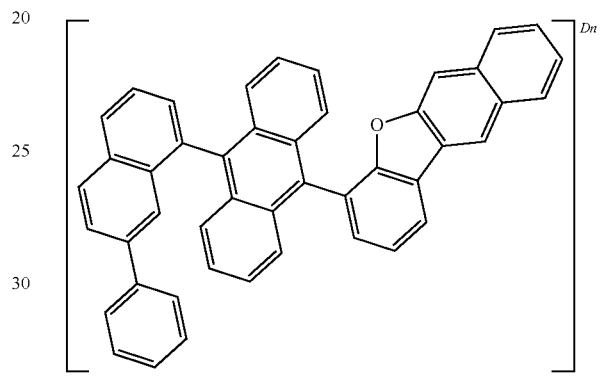
H-190
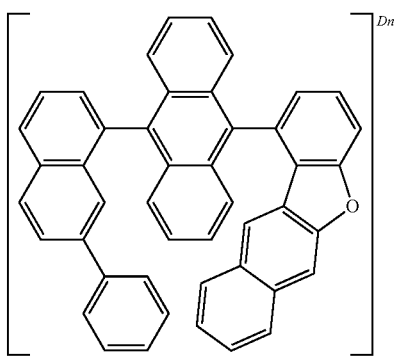
H-194
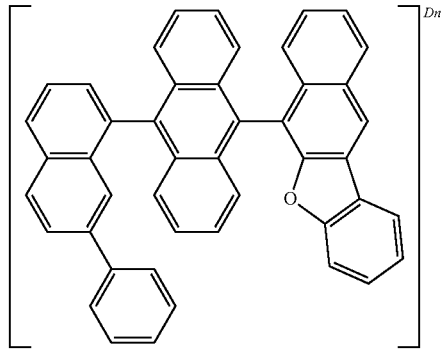
H-191
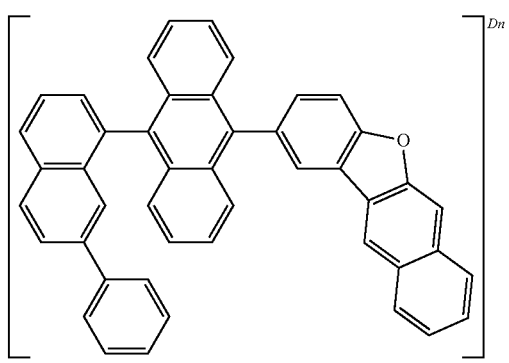
H-195
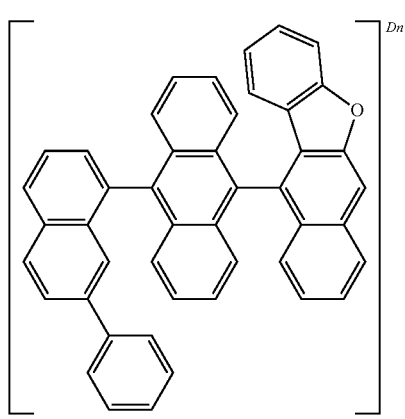

H-196
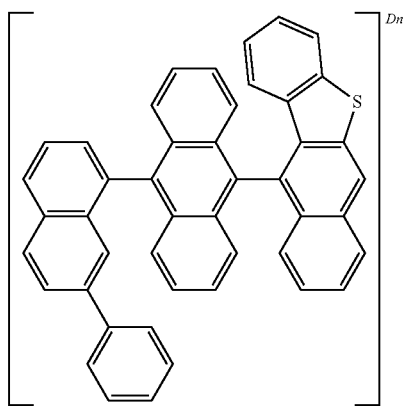
H-197
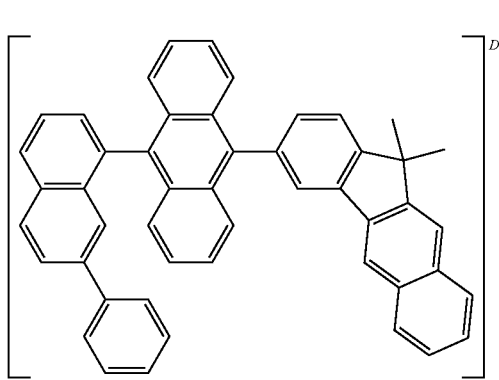
H-198
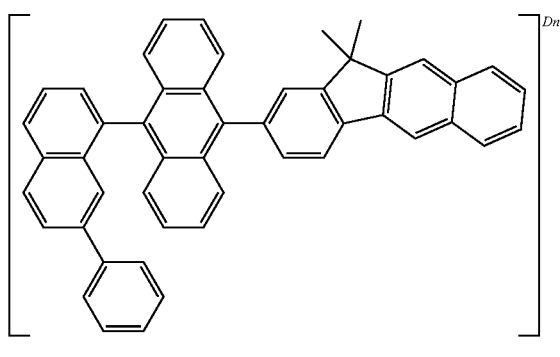
H-199
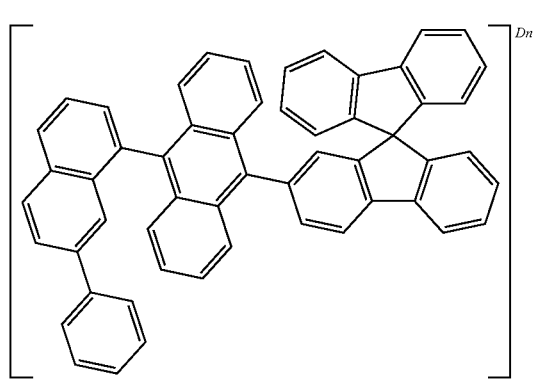
H-200
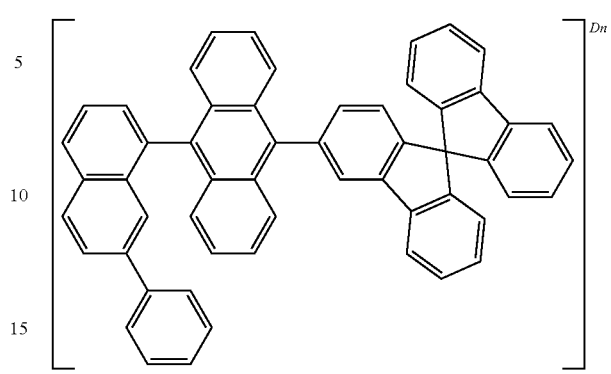
H-201
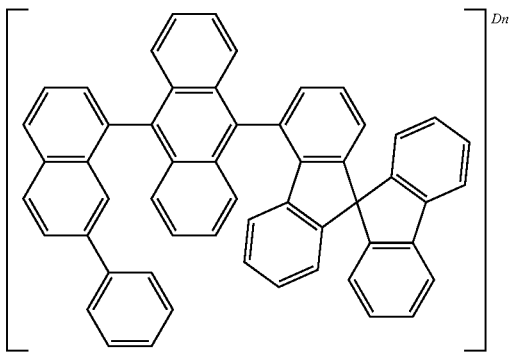
H-202
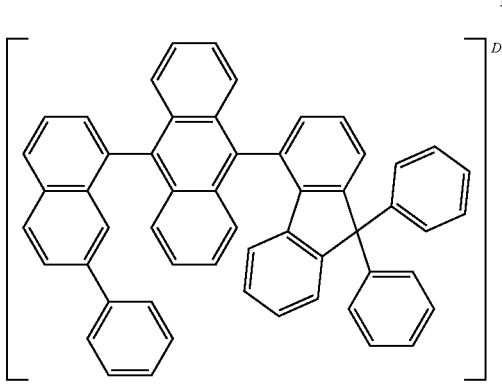
H-203
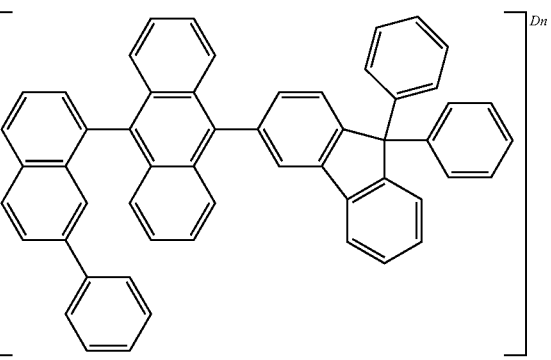

H-204
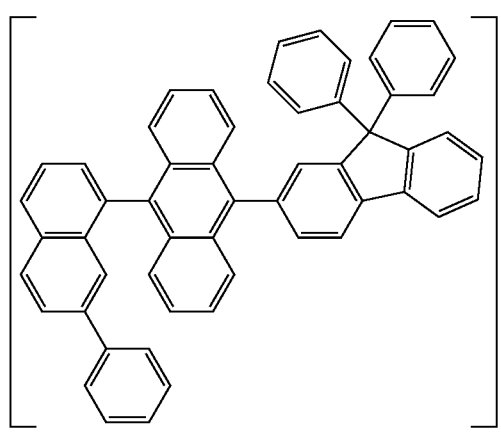
H-205
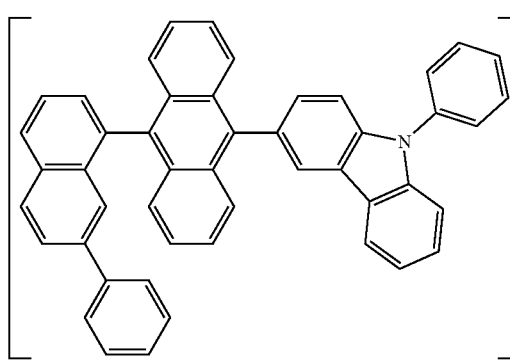
H-206
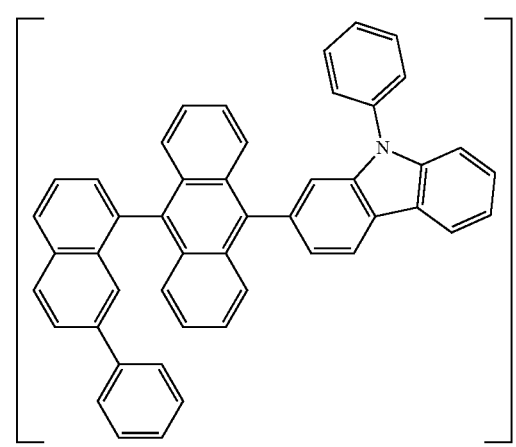
H-207
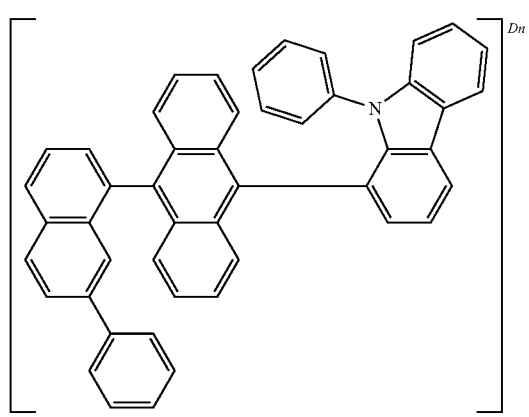
H-208
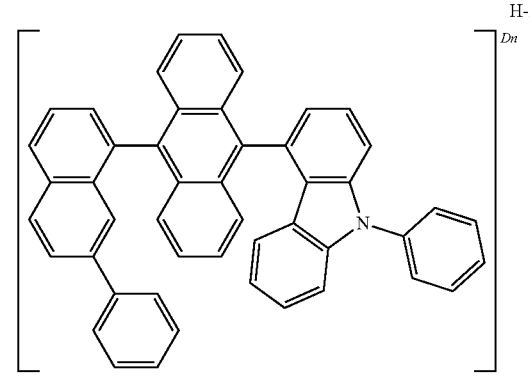
H-209
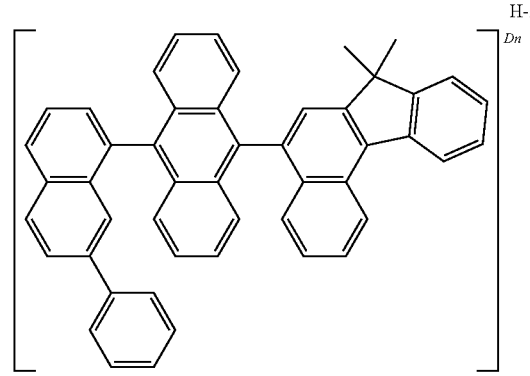
H-210
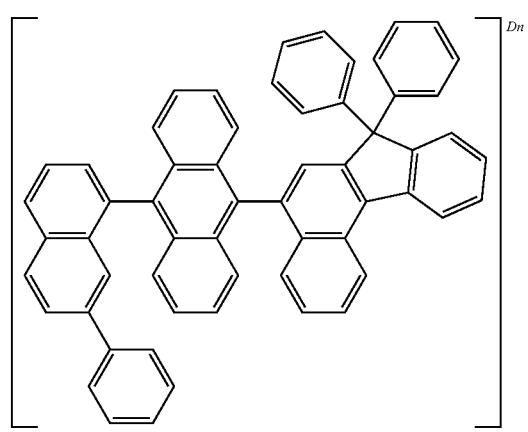

H-211
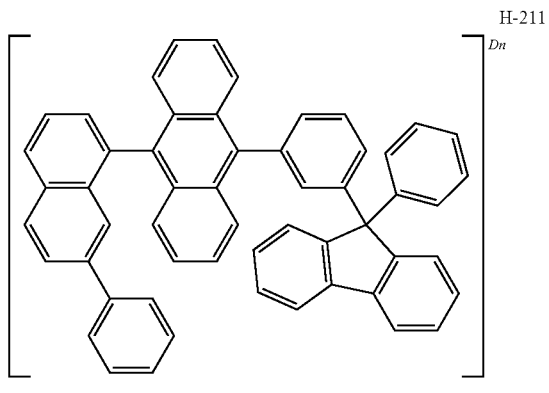
H-212
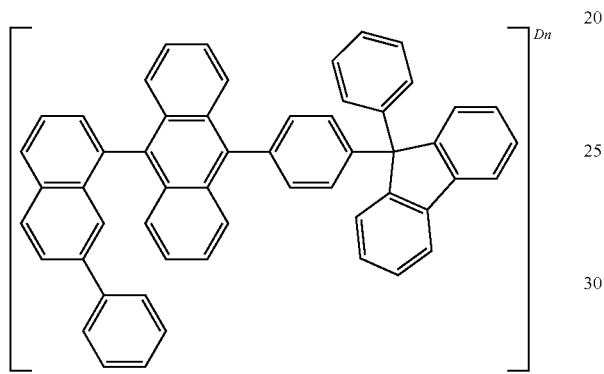
H-213
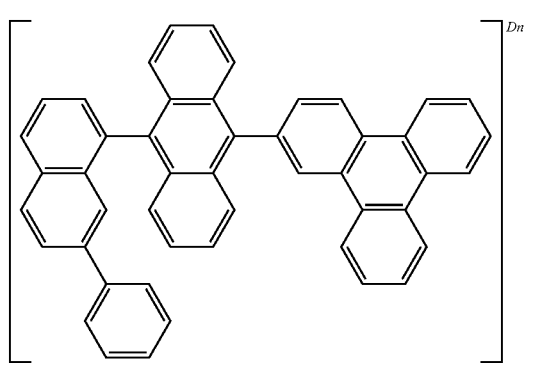
H-214
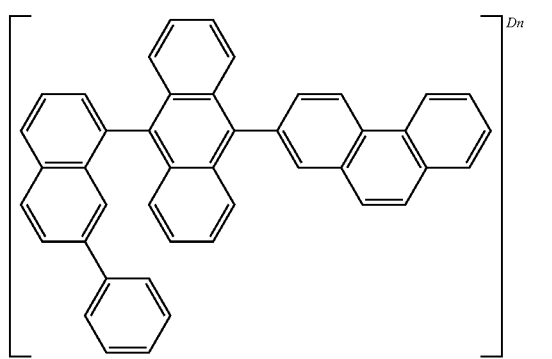
H-215
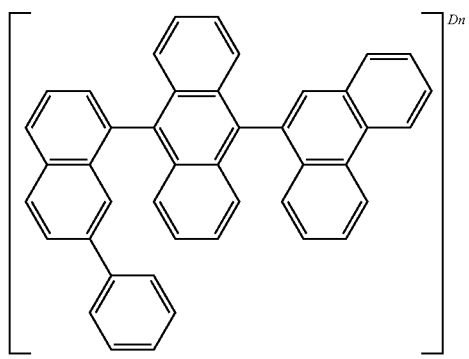
H-216
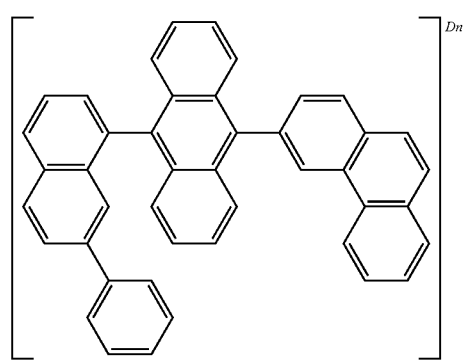
H-217
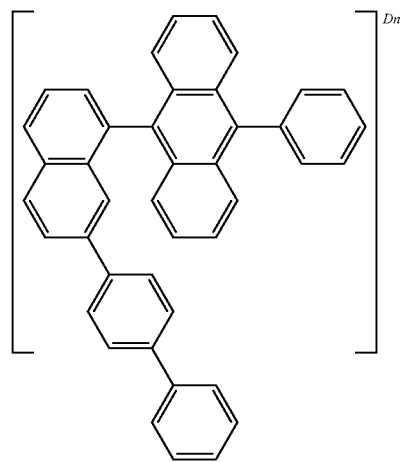

H-218
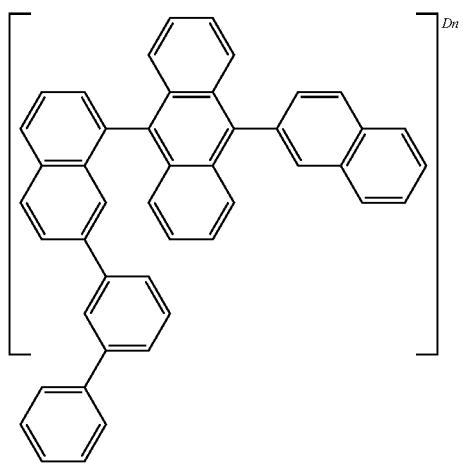
H-219
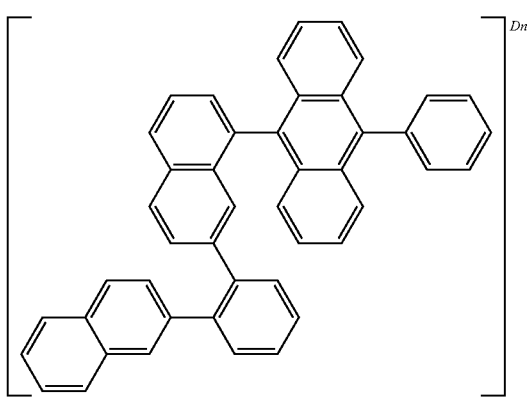
H-220
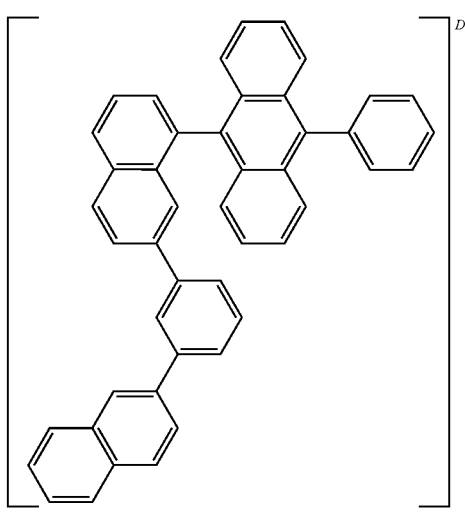
H-221
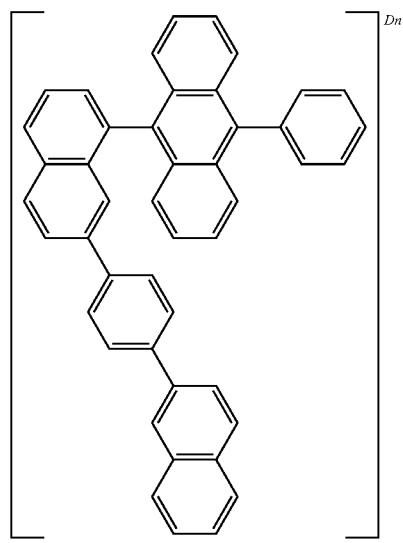
H-222
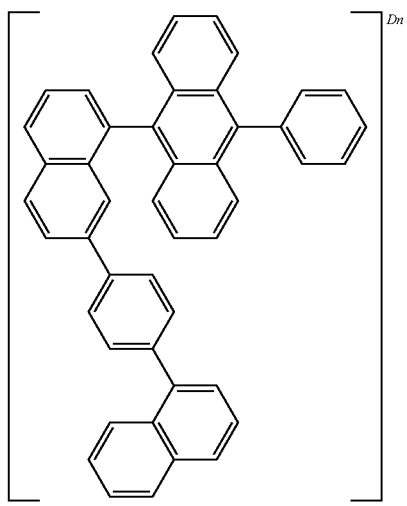
H-223
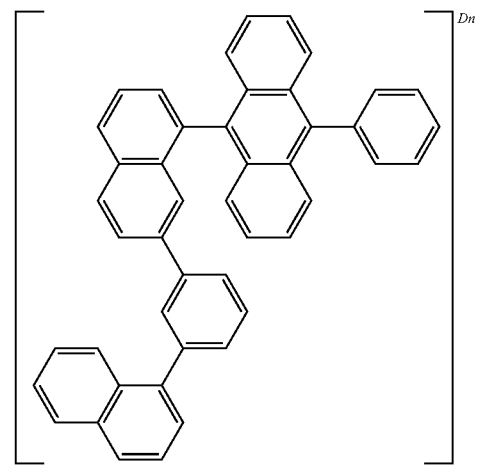

H-224
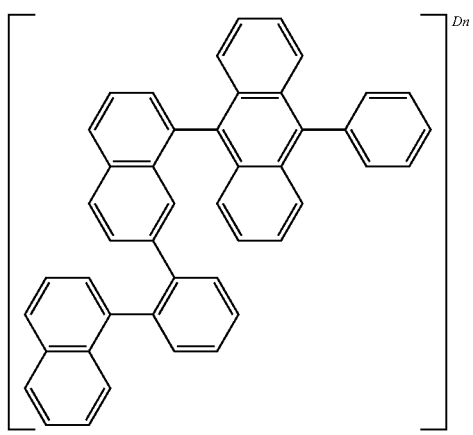
H-225
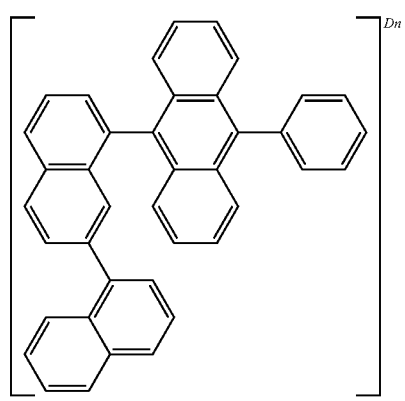
H-226
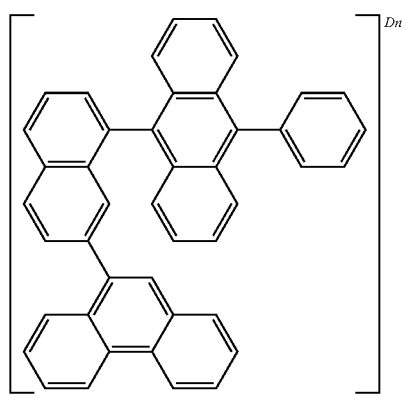
H-227
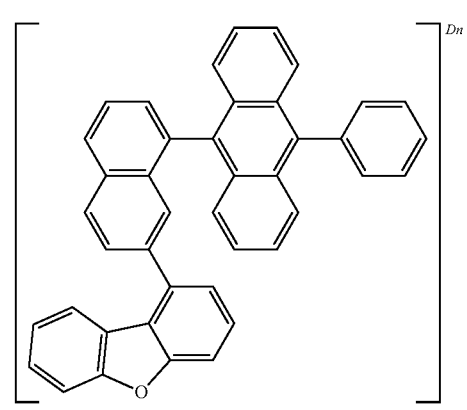
H-228
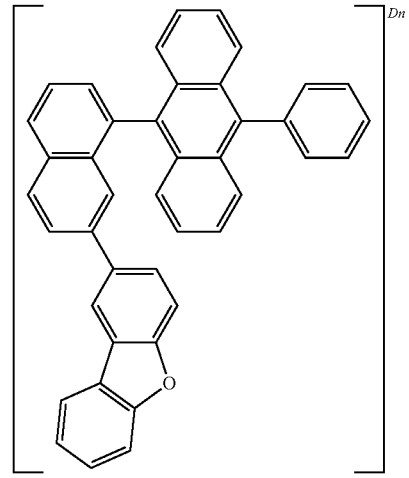
H-229
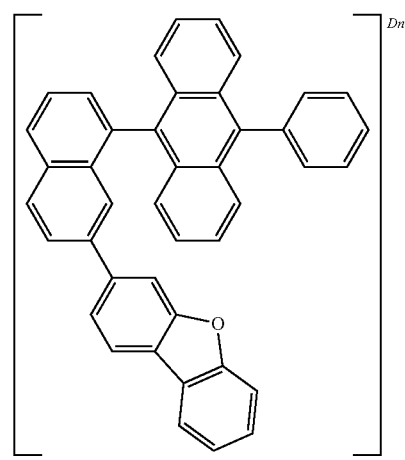
H-230
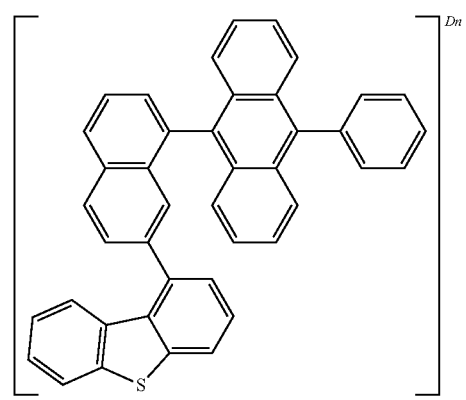

H-231
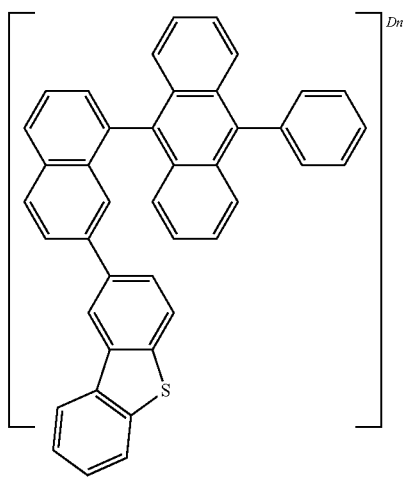
H-232
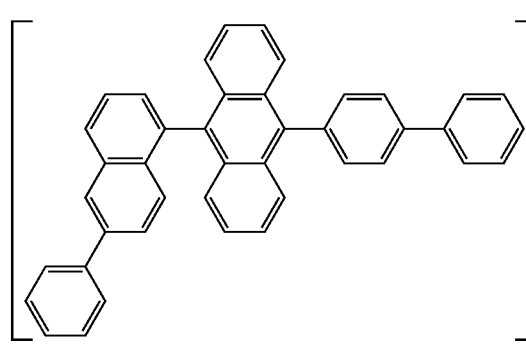
H-233
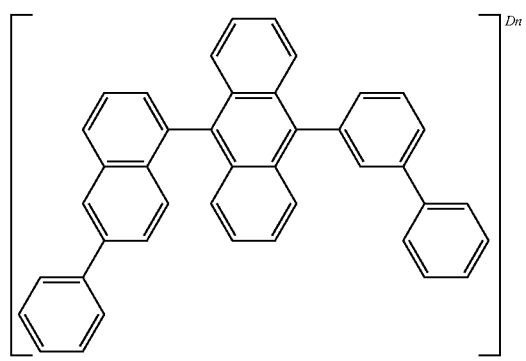
H-234
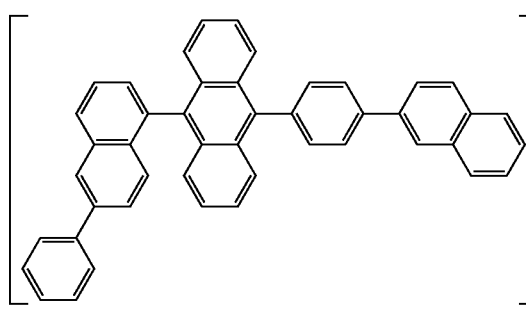
H-235
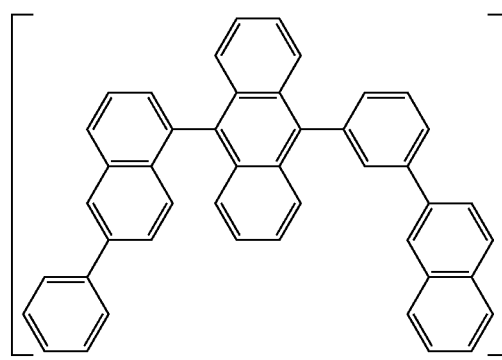
H-236
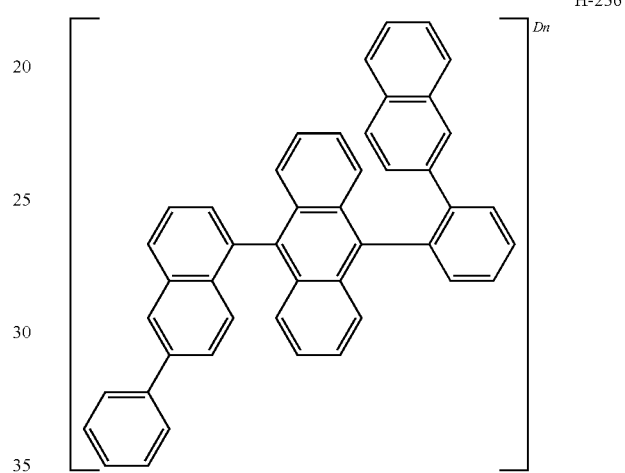
H-237
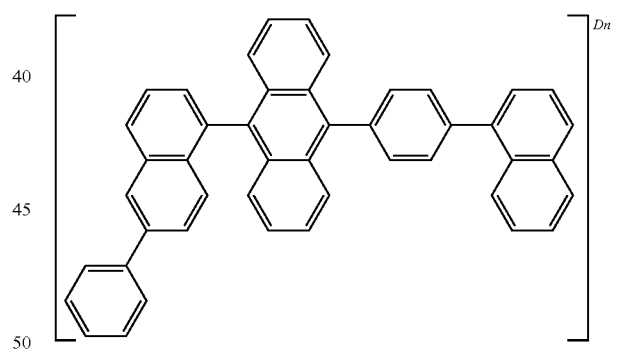
H-238
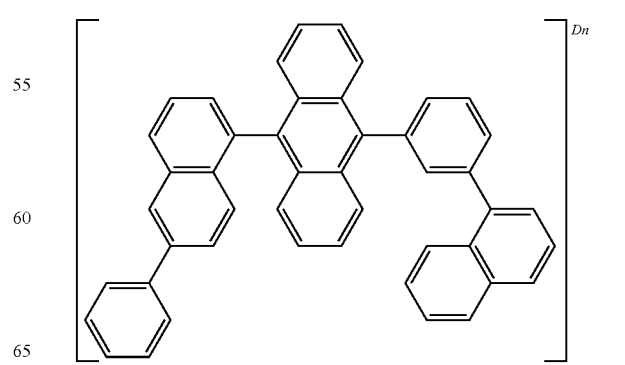

-continued
H-239
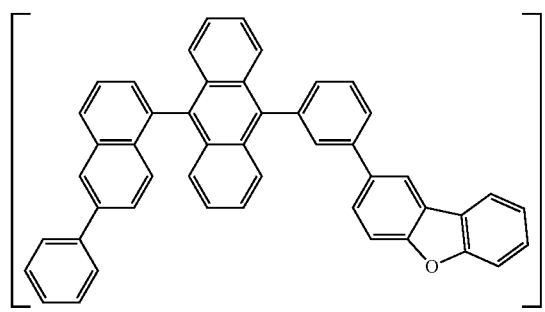
H-240
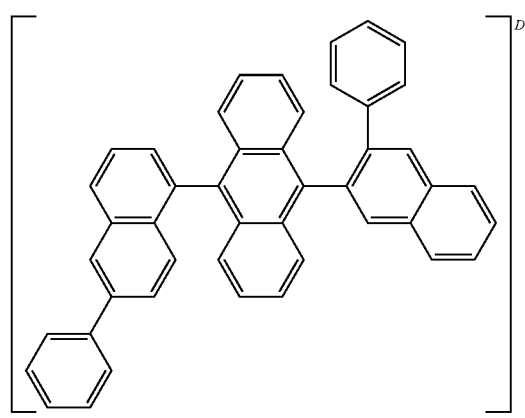
H-241
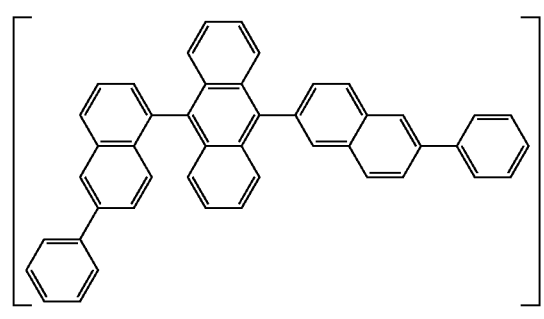
H-242
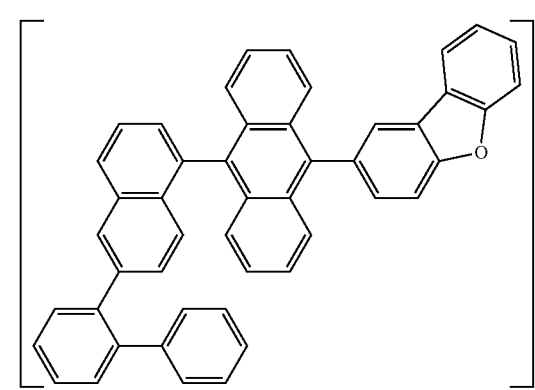
-continued
H-243
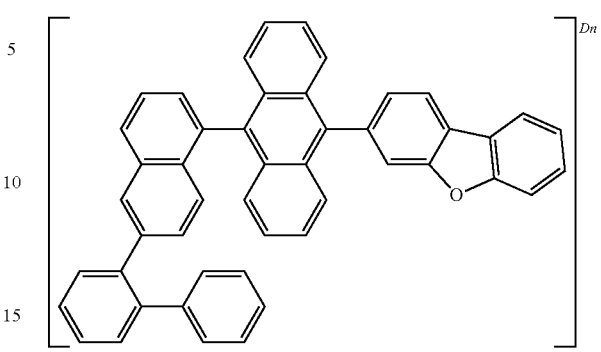
H-244
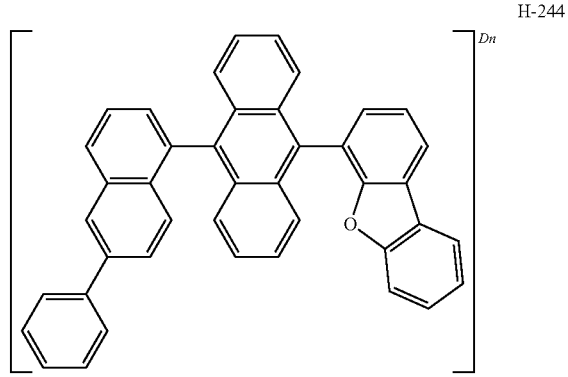
H-245
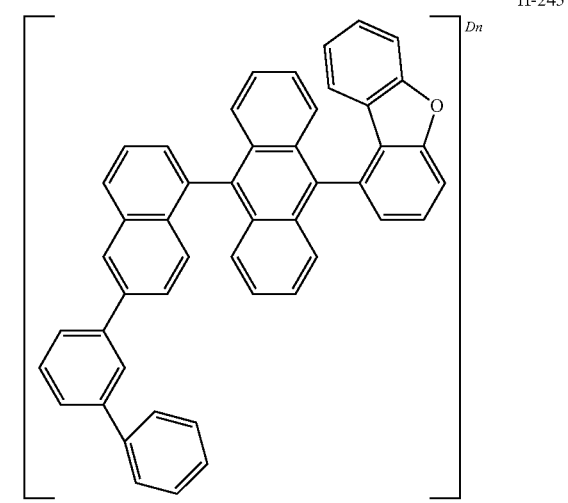
H-246
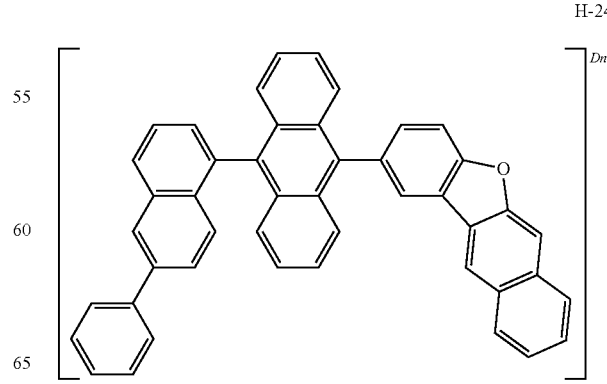

H-247
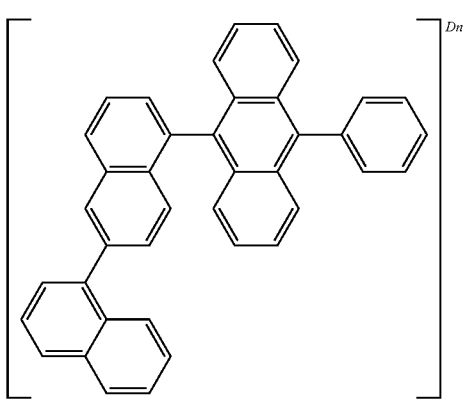
H-248
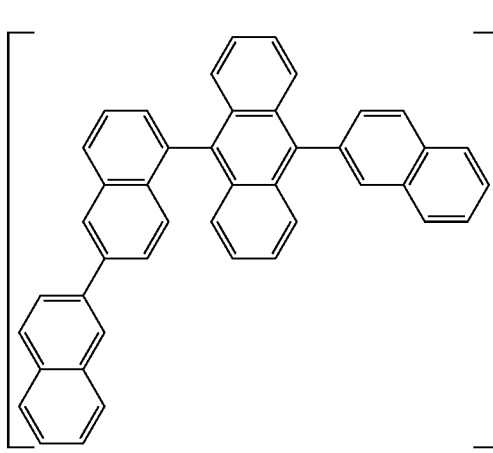
H-249
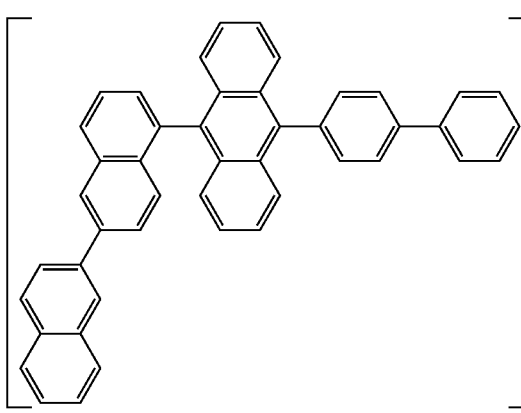
H-250
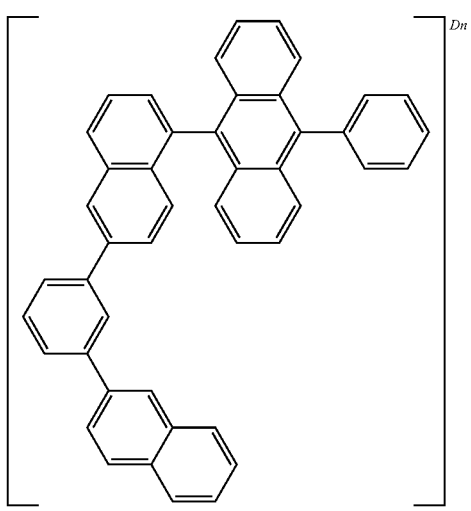
H-251
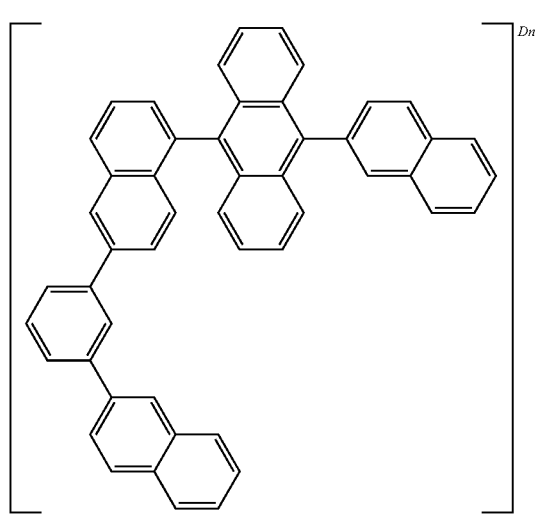
H-252
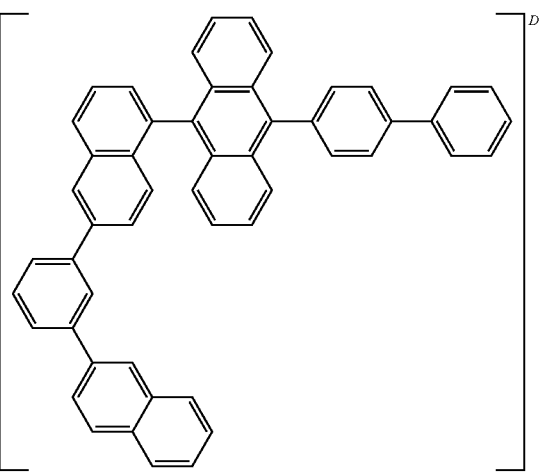

H-253
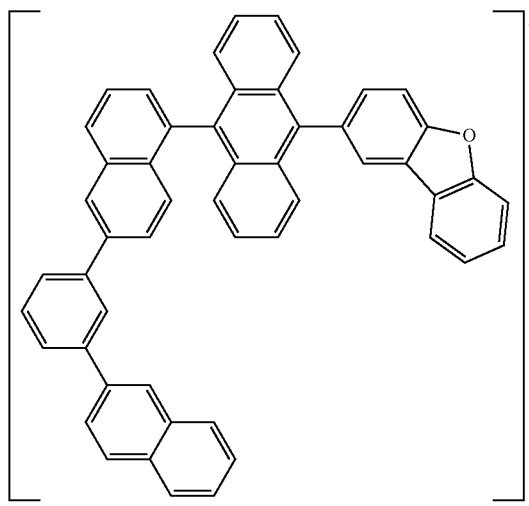
H-254
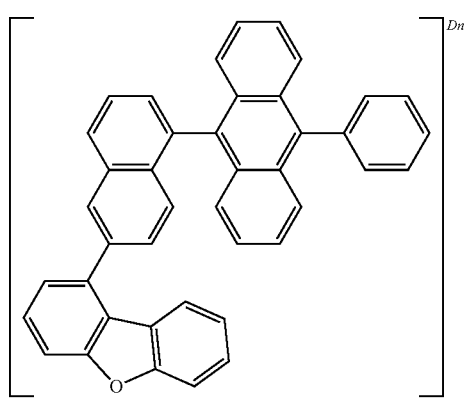
H-255
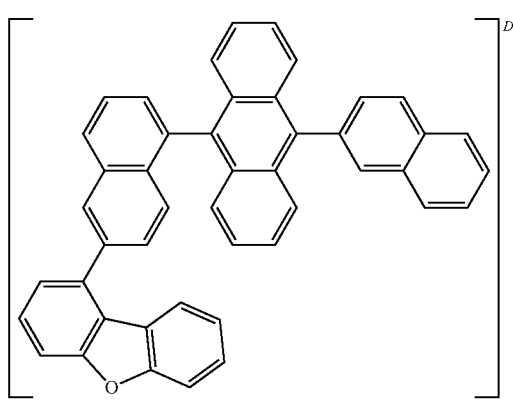
H-256
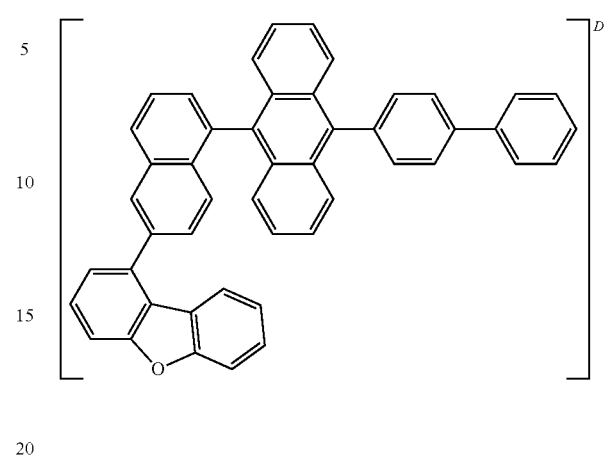
H-257
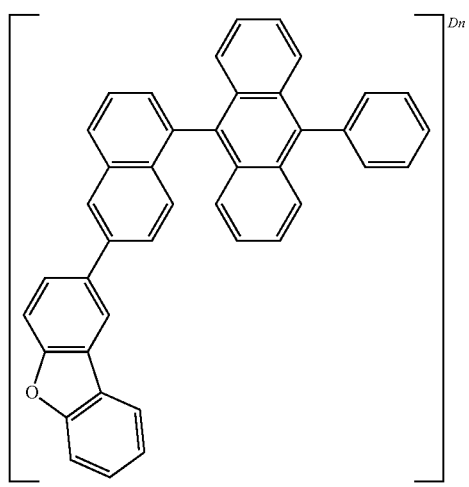
H-258
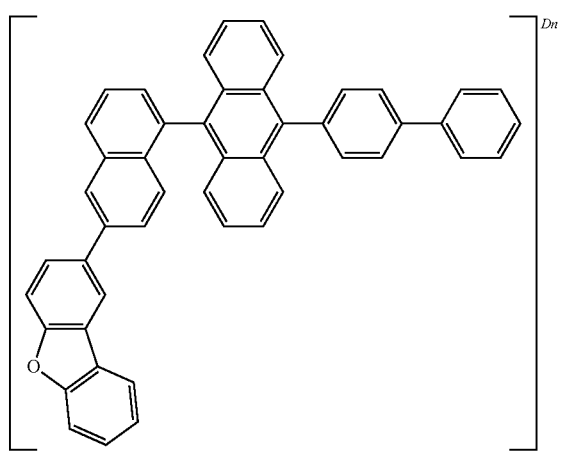

H-259

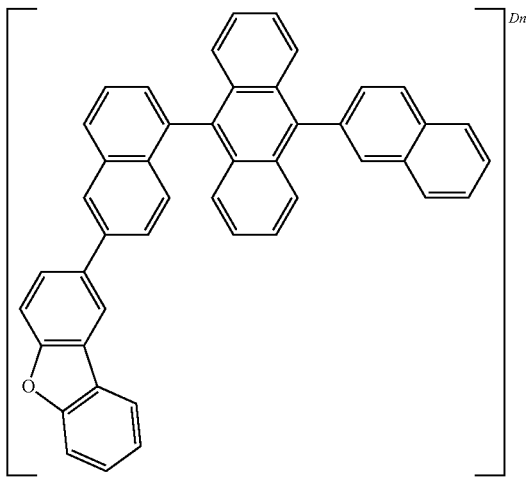

A compound represented by formula 1-1 may be used alone or in combination of two or more in the organic electroluminescent device.

A plurality of light-emitting materials according to one embodiment of the present disclosure comprises at least one of first compounds and at least one of second compounds, wherein the first compound is represented by formula 1-1, and the second compound is represented by formula 2.

The compound represented by formula 1 according to the present disclosure may be prepared by a synthetic method known to one skilled in the art. Specifically, the non-deuterated analogues of the compound represented by formula 1 can be prepared by known coupling and substitution reactions. For example, the non-deuterated analogues of the compound represented by formula 1-1 can be prepared by referring to Korean Patent Appl. Laid-Open No. 2015-0010016 (published on Jan. 28, 2015), but is not limited thereto. Also, the compound of formula 1 may be prepared in a similar manner by using deuterated precursor materials, or more generally may be prepared by treating the non-deuterated compound with a deuterated solvent or D6-benzene in the presence of an H/D exchange catalyst such as a Lewis acid, e.g., aluminum trichloride or ethyl aluminum chloride. In addition, the degree of deuteration can be controlled by changing the reaction conditions such as the reaction temperature. For example, the number of n in formula 1 can be controlled by adjusting the reaction temperature and time, the equivalent of the acid, etc.

The compound represented by formula 2 according to the present disclosure may be prepared by a synthetic method known to one skilled in the art. For example, the compound represented by formula 2 can be prepared by referring to Korean Patent No. 1876763 (published on Jul. 11, 2018), Japanese Patent No. 5935199 (published on May 20, 2016), and Korean Patent Appl. Laid-Open No. 2017-0130434 (published on Nov. 28, 2017), but is not limited thereto.

Hereinafter, an organic electroluminescent device comprising the aforementioned plurality of light-emitting materials will be described.

The organic electroluminescent device according to one embodiment of the present disclosure comprises a first electrode, a second electrode, and at least one organic layer between the first and second electrodes. The organic layer may comprise a light-emitting layer, and the light-emitting layer may include a light-emitting material(s) comprising at least one first compound represented by formula 1, and at least one second compound represented by formula 2. According to one embodiment of the present disclosure, the light-emitting layer may include the organic electroluminescent compound represented by formula 1-1, and the organic electroluminescent compound may be comprised in the light-emitting layer.

According to one embodiment, the host compound represented by formula 1 and the dopant compound represented by formula 2 may be included in the same organic layer, or may be included in different organic layers, respectively.

The organic electroluminescent device according to one embodiment of the present disclosure may comprise an anode, a cathode, and at least one organic layer between the two electrodes, in which the organic layer may comprise a light-emitting layer, and a hole transport zone disposed between the anode and the light-emitting layer. The light-emitting layer may comprise a plurality of light-emitting materials, and the plurality of light-emitting materials may comprise at least one of first compounds and at least one of second compounds, wherein the first compound is represented by formula 1, and the second compound is represented by formula 2. The hole transport zone may comprise a compound represented by the following formula 3. The first compound may be represented by formula 1-1. The hole transport zone may comprise at least one of a hole injection layer, a first hole transport layer, a second hole transport layer, an electron blocking layer, a hole auxiliary layer, and a charge generation layer. For example, the hole transport zone may comprise a hole transport layer(s) and a hole auxiliary layer(s).

(3)

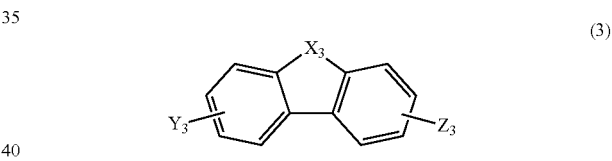

In formula 3, $X_3$ represents $NR_{101}$, O, S, or $CR_{102}R_{103}$, $Y_3$, $Z_3$ and $R_{101}$, each independently, represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino; and $R_{102}$ and $R_{103}$, each independently, represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino; or $R_{102}$ and $R_{103}$ may be linked to each other to form a ring(s).

The compound represented by formula 3 according to the present disclosure may be prepared by a synthetic method known to one skilled in the art. Specifically, the compound represented by formula 3 may be prepared by C—C coupling or C—N coupling.

The light-emitting layer is a layer comprising a host(s) and a dopant(s) from which light is emitted, and can be a single layer or a multi-layer in which two or more layers are stacked. Here, the host mainly has a function of promoting recombination of electrons and holes and confining excitons in the light-emitting layer, and the dopant has a function of efficiently emitting light of excitons obtained by recombination. The dopant compound of the light-emitting layer may be doped to less than 25% by weight, preferably less than 17% by weight based on the total amount of the host and dopant compounds.

One of the first and second electrodes may be an anode, and the other may be a cathode. The second electrode may be a transflective electrode or a reflective electrode, and may be a top emission type, a bottom emission type, or a both-sides emission type, depending on the materials. The organic layer may comprise at least one light-emitting layer, and may further comprise at least one layer selected from a hole injection layer, a hole transport layer, a hole auxiliary layer, a light-emitting auxiliary layer, an electron transport layer, an electron injection layer, an interlayer, a hole blocking layer, an electron blocking layer, and an electron buffer layer.

The organic layer may further comprise an amine-based compound and/or an azine-based compound in addition to the light-emitting material(s) of the present disclosure. Specifically, the hole injection layer, the hole transport layer, the hole auxiliary layer, the light-emitting layer, the light-emitting auxiliary layer, and/or the electron blocking layer may comprise an amine-based compound, e.g., an arylamine-based compound, a styrylarylamine-based compound, etc., as a hole injection material, a hole transport material, a hole auxiliary material, a light-emitting material, a light-emitting auxiliary material, and/or an electron blocking material. In addition, the electron transport layer, the electron injection layer, the electron buffer layer, and/or the hole blocking layer may comprise an azine-based compound as an electron transport material, an electron injection material, an electron buffer material, and/or a hole blocking material.

In addition, the organic layer may further comprise at least one metal selected from the group consisting of metals of Group 1, metals of Group 2, transition metals of the $4^{th}$ period, transition metals of the $5^{th}$ period, lanthanides and organic metals of d-transition elements of the Periodic Table, or at least one complex compound comprising said metal.

A hole injection layer, a hole transport layer, or an electron blocking layer, or a combination thereof may be used between the anode and the light-emitting layer. The hole injection layer may be multilayers in order to lower the hole injection barrier (or hole injection voltage) from the anode to the hole transport layer or the electron blocking layer, wherein each of the multilayers may use two compounds simultaneously. The electron blocking layer may be located between the hole transport layer (or the hole injection layer) and the light-emitting layer, and may block the overflow of electrons from the light-emitting layer to trap the excitons in the light-emitting layer to prevent light leakage. The hole transport layer or the electron blocking layer may be multilayers, wherein each of the multilayers may use a plurality of compounds.

An electron buffer layer, a hole blocking layer, an electron transport layer, or an electron injection layer, or a combination thereof may be used between the light-emitting layer and the cathode. The electron buffer layer may be multilayers in order to control the injection of the electrons and improve the interfacial properties between the light-emitting layer and the electron injection layer, wherein each of the multilayers may use two compounds simultaneously. The hole blocking layer or the electron transport layer may also be multilayers, wherein each of the multilayers may use a plurality of compounds.

A light-emitting auxiliary layer may be placed between the anode and the light-emitting layer, or between the cathode and the light-emitting layer. When the light-emitting auxiliary layer is placed between the anode and the light-emitting layer, it can be used for promoting the hole injection and/or the hole transport, or for preventing the overflow of electrons. When the light-emitting auxiliary layer is placed between the cathode and the light-emitting layer, it can be used for promoting the electron injection and/or the electron transport, or for preventing the overflow of holes.

In addition, the hole auxiliary layer may be placed between the hole transport layer (or hole injection layer) and the light-emitting layer, and may be effective to promote or block the hole transport rate (or the hole injection rate), thereby enabling the charge balance to be controlled. When an organic electroluminescent device includes two or more hole transport layers, the hole transport layer, which is further included, may be used as a hole auxiliary layer or an electron blocking layer. The light-emitting auxiliary layer, the hole auxiliary layer or the electron blocking layer may have an effect of improving the efficiency and/or the lifetime of the organic electroluminescent device.

In the organic electroluminescent device of the present disclosure, at least one layer selected from a chalcogenide layer, a metal halide layer and a metal oxide layer (hereinafter, "a surface layer") may be preferably placed on an inner surface(s) of one or both electrodes. Specifically, a chalcogenide (including oxides) layer of silicon or aluminum is preferably placed on an anode surface of an electroluminescent medium layer, and a metal halide layer or a metal oxide layer is preferably placed on a cathode surface of an electroluminescent medium layer. Such a surface layer may provide operation stability for the organic electroluminescent device. Preferably, the chalcogenide includes $SiO_X$ ($1 \leq X \leq 2$), $AlO_X$ ($1 \leq X \leq 1.5$), SiON, SiAlON, etc.; the metal halide includes LiF, $CaF_2$, a rare earth metal fluoride, etc.; and the metal oxide includes $Cs_2O$, $Li_2O$, MgO, SrO, BaO, CaO, etc.

In the organic electroluminescent device of the present disclosure, a mixed region of an electron transport compound and a reductive dopant, or a mixed region of a hole transport compound and an oxidative dopant is preferably placed on at least one surface of a pair of electrodes. In this case, the electron transport compound is reduced to an anion, and thus it becomes easier to inject and transport electrons from the mixed region to an electroluminescent medium. Further, the hole transport compound is oxidized to a cation, and thus it becomes easier to inject and transport holes from the mixed region to the electroluminescent medium. Preferably, the oxidative dopant includes various Lewis acids and acceptor compounds; and the reductive dopant includes alkali metals, alkali metal compounds, alkaline earth metals, rare-earth metals, and mixtures thereof. A reductive dopant layer may be used as a charge-generating layer to prepare an organic electroluminescent device having two or more light-emitting layers and emitting white light.

Various structures have been proposed for the white organic electroluminescent device, for example, a side-by-side structure or a stacking structure depending on the arrangement of R (red), G (green) or YG (yellow green), and B (blue) light emitting parts, or a color conversion material (CCM) method, etc. The plurality of light-emitting materials of the present disclosure may also be applied to such white organic electroluminescent device.

The plurality of light-emitting materials according to one embodiment of the present disclosure may also be applied to the organic electroluminescent device comprising a QD (quantum dot).

The present disclosure may provide a display system by using a plurality of light-emitting materials according to one embodiment of the present disclosure. That is, it is possible to produce a display system or a lighting system by using the compounds of the present disclosure. Specifically, it is possible to produce a display system, e.g., a display system for smartphones, tablets, notebooks, PCs, TVs, or cars, or a lighting system, e.g., an outdoor or indoor lighting system, by using the compounds of the present disclosure.

In order to form each layer of the organic electroluminescent device of the present disclosure, dry film-forming methods such as vacuum evaporation, sputtering, plasma and ion plating methods, or wet film-forming methods such as ink jet printing, nozzle printing, slot coating, spin coating, dip coating, and flow coating methods may be used. When using a wet film-forming method, a thin film may be formed by dissolving or diffusing materials forming each layer into any suitable solvent such as ethanol, chloroform, tetrahydrofuran, dioxane, etc. The solvent may be any solvent where the materials forming each layer can be dissolved or diffused, and where there are no problems in film-formation capability.

The dopant and host compounds of the present disclosure may be co-evaporated or mixture-evaporated. The co-evaporation is a mixed deposition method in which two or more isomer materials are placed in a respective individual crucible source and a current is applied to both cells at the same time to evaporate the materials. The mixture-evaporation is a mixed deposition method in which two or more isomer materials are mixed in one crucible source before evaporating them, and a current is applied to the cell to evaporate the materials.

Hereinafter, the preparation method of the compound according to the present disclosure and the properties thereof will be explained in detail. However, the present disclosure is not limited to the following examples.

Example 1: Preparation of Compound H-13

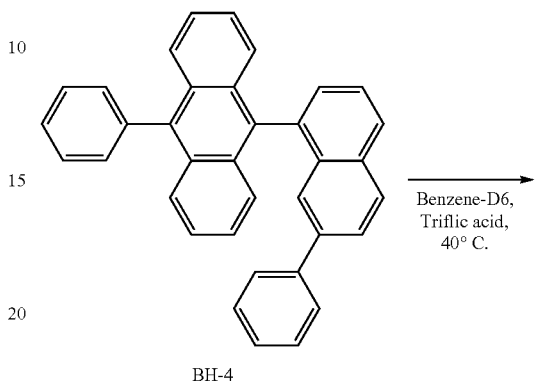

In a flask, 7 g of compound BH-4 (15.34 mmol) and 210 r L of benzene-D6 were added and heated to dissolve all of compound BH-4. The reaction product was cooled to 40° C., and 7 mL of triflic acid (79.29 mmol) was added. The mixture was stirred at 40° C. for 3 hours and 30 minutes, and then 14 mL of heavy water were added. The mixture was stirred for 10 minutes, and then neutralized with $K_3PO_4$ aqueous solution. The organic layer was extracted with dichloromethane, and residual moisture was removed using magnesium sulfate. The obtained organic layer was distilled under reduced pressure and separated by column chromatography to obtain 1.5 g of compound H-13 (yield: 41.3%).

|  | MW | M.P. |
| --- | --- | --- |
| H-13 | 478.3 | 241° C. |

Example 2: Preparation of Compound H-58

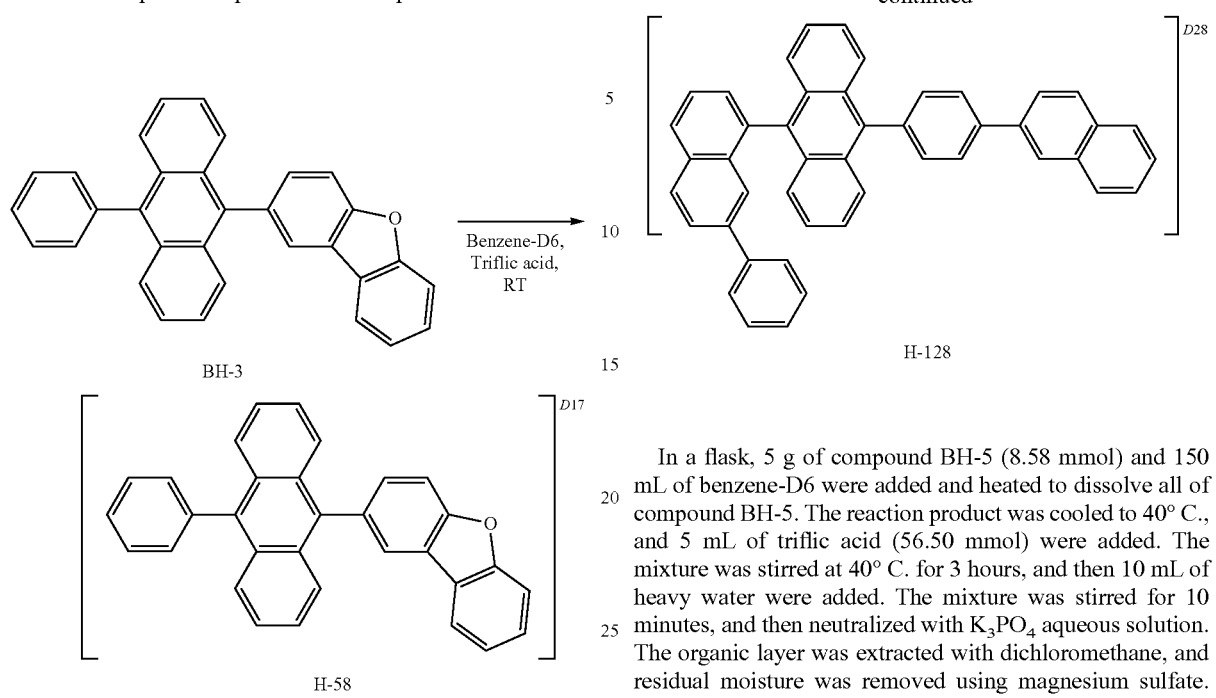

In a flask, 0.5 g of compound BH-3 (8.3 mmol) and 100 mL of benzene-D6 were added and heated to dissolve all of compound BH-3. The reaction product was cooled to room temperature, and 4.4 mL of triflic acid (49.8 mmol) were added. The mixture was stirred for 2 hours and 30 minutes, and then 20 mL of heavy water were added. The mixture was stirred for 10 minutes, and then neutralized with $K_3PO_4$ aqueous solution. The organic layer was extracted with dichloromethane, and residual moisture was removed using magnesium sulfate. The obtained organic layer was distilled under reduced pressure and separated by column chromatography to obtain 1.5 g of compound H-58 (yield: 41.3%).

|      | MW     | M.P.     |
|------|--------|----------|
| H-58 | 437.61 | 279.2° C.|

Example 3: Preparation of Compound H-128

In a flask, 5 g of compound BH-5 (8.58 mmol) and 150 mL of benzene-D6 were added and heated to dissolve all of compound BH-5. The reaction product was cooled to 40° C., and 5 mL of triflic acid (56.50 mmol) were added. The mixture was stirred at 40° C. for 3 hours, and then 10 mL of heavy water were added. The mixture was stirred for 10 minutes, and then neutralized with $K_3PO_4$ aqueous solution. The organic layer was extracted with dichloromethane, and residual moisture was removed using magnesium sulfate. The obtained organic layer was distilled under reduced pressure and separated by column chromatography to obtain 3.5 g of compound H-128 (yield: 66.8%).

|       | MW     | M.P.    |
|-------|--------|---------|
| H-128 | 610.75 | 262° C. |

Example 4: Preparation of Compound H-22

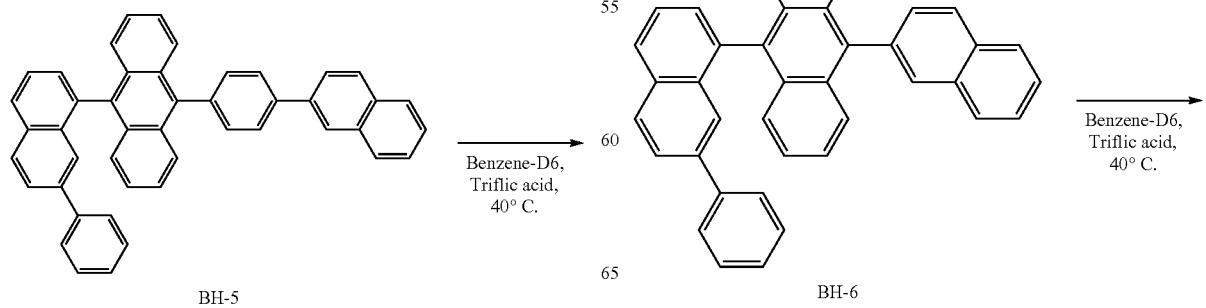

-continued

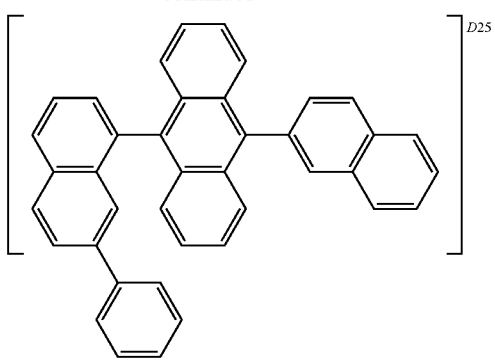

H-22

-continued

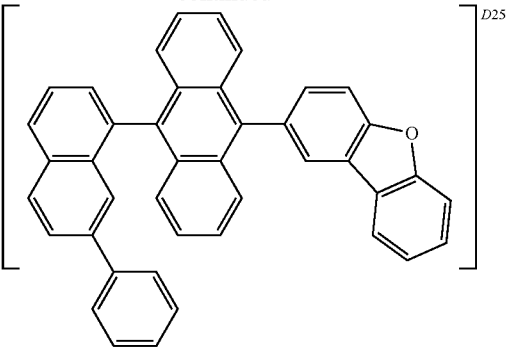

H-76

In a flask, 7 g of compound BH-6 (13.82 mmol) and 210 mL of benzene-D6 were added and heated to dissolve all of compound BH-6. The reaction product was cooled to 40° C., and 5 mL of triflic acid (79.11 mmol) were added. The mixture was stirred at 40° C. for 3 hours, and then 14 mL of heavy water were added. The mixture was stirred for 10 minutes, and then neutralized with $K_3PO_4$ aqueous solution. The organic layer was extracted with dichloromethane, and residual moisture was removed using magnesium sulfate. The obtained organic layer was distilled under reduced pressure and separated by column chromatography to obtain 1.8 g of compound M-22 (yield: 24.5%).

In a flask, 9.1 g of compound BH-9 (16.64 mmol) and 333 mL of benzene-D6 were added and heated to dissolve all of compound BH-9. The reaction product was cooled to 40° C., and 9.1 mL of triflic acid (102.84 mmol) were added. The mixture was stirred at 40° C. for 3 hours, and then 18.2 mL of heavy water were added. The mixture was stirred for 10 minutes, and then neutralized with $K_3PO_4$ aqueous solution. The organic layer was extracted with dichloromethane, and residual moisture was removed using magnesium sulfate. The obtained organic layer was distilled under reduced pressure and separated by column chromatography to obtain 5.1 g of compound H-76 (yield: 53.6%).

|  | MW | M.P. |
|---|---|---|
| H-76 | 531.2 | 269° C. |

Example 6: Preparation of Compound H-11

|  | MW | M.P. |
|---|---|---|
| H-22 | 531.2 | 598° C. |

Example 5: Preparation of Compound H-76

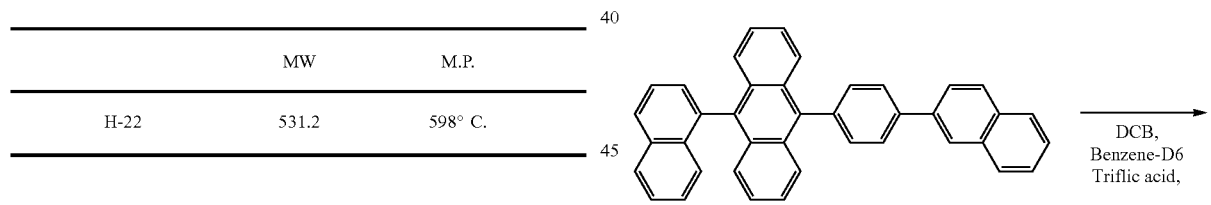

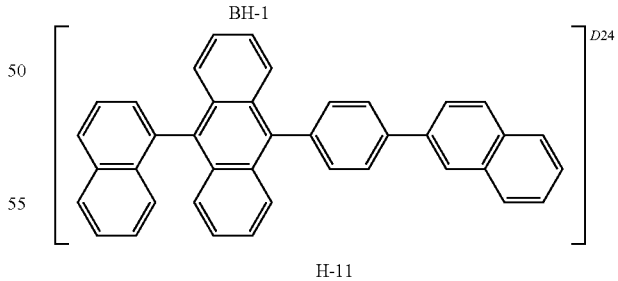

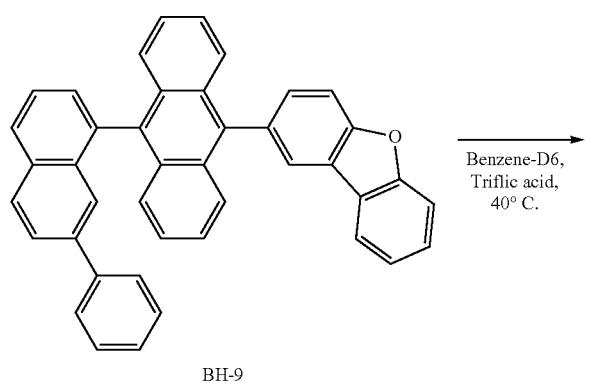

BH-9

In a flask, 15 g of compound BH-1 (29.60 mmol) and 900 mL of benzene-D6 were added and heated to 70° C. to dissolve all of compound BH-1. 12 mL of triflic acid (135.1 mmol) were added to a liquid composition in which compound BH-1 was completely dissolved, and the mixture was stirred at 70° C. for 3 hours. 15 mL of heavy water were added thereto, and stirred for 10 minutes. The mixture was neutralized with $K_3PO_4$ aqueous solution. The organic layer was extracted with dichloromethane, and residual moisture was removed using magnesium sulfate. The obtained organic layer was distilled under reduced pressure and separated by column chromatography to obtain 12.6 g of compound H-11 (yield: 80.3%).

|      | MW    | M.P.    |
|------|-------|---------|
| H-11 | 530.6 | 274° C. |

Hereinafter, a method of producing an OLED comprising the compound according to the present disclosure and the properties thereof will be explained in detail. However, the following examples merely illustrate the properties of an OLED according to the present disclosure in detail, but the present disclosure is not limited to the following examples.

Device Example 1: Producing an OLEO Using the Compound According to the Present Disclosure A blue light-emitting OLED was produced using the organic electroluminescent compound according to the present disclosure, as follows: A transparent electrode indium tin oxide (ITO) thin film (10 Ω/sq) on a glass substrate for an OLED (GEOMATEC CO., LTD., Japan) was subjected to an ultrasonic washing with acetone, ethanol and distilled water, sequentially, and then was stored in isopropanol. The ITO substrate was mounted on a substrate holder of a vacuum vapor deposition apparatus. Compound HI-1 was introduced into a cell of the vacuum vapor deposition apparatus, and the pressure in the chamber of the apparatus was then controlled to $10^{-6}$ torr. Thereafter, an electric current was applied to the cell to evaporate the above-introduced material, thereby forming a first hole injection layer having a thickness of 60 nm on the ITO substrate. Next, compound HI-2 was introduced into another cell of the vacuum vapor deposition apparatus and was evaporated by applying an electric current to the cell, thereby forming a second hole injection layer having a thickness of 5 nm on the first hole injection layer. Compound HT-1 was then introduced into another cell of the vacuum vapor deposition apparatus and was evaporated by applying an electric current to the cell, thereby forming a first hole transport layer having a thickness of 20 nm on the second hole injection layer. Compound HT-2 was then introduced into another cell of the vacuum vapor deposition apparatus and was evaporated by applying an electric current to the cell, thereby forming a second hole transport layer having a thickness of 5 nm on the first hole transport layer. After forming the hole injection layers and the hole transport layers, a light-emitting layer was formed thereon as follows: Compound H-260 was introduced into a cell of the vacuum vapor deposition apparatus as a host and compound BD-1 was introduced into another cell as a dopant. The two materials were evaporated and the dopant was deposited in a doping amount of 2 wt % based on the total amount of the host and dopant to form a light-emitting layer having a thickness of 20 nm on the second hole transport layer. Next, compound ET-1 and compound EI-1 were evaporated at a rate of 1:1 in two other cells to deposit an electron transport layer having a thickness of 35 nm on the light-emitting layer. After depositing compound EI-1 as an electron injection layer having a thickness of 2 nm on the electron transport layer, an Al cathode having a thickness of 80 nm was deposited on the electron injection layer by another vacuum vapor deposition apparatus. Thus, an OLED was produced.

Device Examples 2 to 4: Producing an OLED Using the Compound According to the Present Disclosure An OLED was produced in the same manner as in Device Example 1, except that the compound shown in Table 1 was used instead of compound H-260 as the host material of the light-emitting layer.

Comparative Examples 1 to 4: Producing an OLED Using a Conventional Compound An OLED was produced in the same manner as in Device Example 1, except that the compound shown in Table 1 was used instead of compound H-260 as the host material of the light-emitting layer.

Table 1 shows the minimum time taken to be reduced from 100% to 90% of the luminance (lifetime; T90) based on a luminance of 2,000 nit of the OLEO produced above.

TABLE 1

|                       | Host  | T90 [hr] |
|-----------------------|-------|----------|
| Device Example 1      | H-260 | 131      |
| Device Example 2      | H-58  | 145      |
| Device Example 3      | H-13  | 134      |
| Device Example 4      | H-22  | 156      |
| Comparative Example 1 | BH-1  | 78       |
| Comparative Example 2 | BH-2  | 80       |
| Comparative Example 3 | BH-3  | 90       |
| Comparative Example 4 | BH-4  | 88       |

Device Example 5: Producing an OLED Using the Compound According to the Present Disclosure An OLEO was produced using the light-emitting material according to the present disclosure, as follows: A transparent electrode indium tin oxide (ITO) thin film (10 Ω/sq) on a glass substrate for an OLED (GEOMATEC CO., LTD., Japan) was subjected to an ultrasonic washing with acetone, ethanol and distilled water, sequentially, and then was stored in isopropanol. The ITO substrate was mounted on a substrate holder of a vacuum vapor deposition apparatus. Compound HT-1 was introduced into a cell of the vacuum vapor deposition apparatus, compound HI-3 was introduced into another cell, and the pressure in the chamber of the apparatus was then controlled to $10^{-6}$ torr. The two materials were evaporated and compound HI-3 was deposited in a doping amount of 3 wt % based on the total amount of compound HT-1 and compound HI-3 to form a hole injection layer having a thickness of 10 nm on the ITO substrate. Next, compound HT-1 was introduced into a cell of the vacuum vapor deposition apparatus and was evaporated by applying an electric current to the cell, thereby forming a first hole transport layer having a thickness of 75 nm on the hole injection layer. Compound HT-3 was then introduced into another cell of the vacuum vapor deposition apparatus and was evaporated by applying an electric current to the cell, thereby forming a second hole transport layer having a thickness of 5 nm on the first hole transport layer. After forming the hole injection layer and the hole transport layers; a light-emitting layer was formed thereon as follows: Compound H-11 was introduced into one cell of the vacuum vapor deposition apparatus as a host and compound BD-1 was introduced into another cell as a dopant. The two materials were evaporated and the dopant was deposited in a doping amount of 2 wt % based on the total amount of the host and dopant to form a light-emitting layer having a thickness of 20 nm on the second hole transport layer. Next, compound ET-2 was deposited as a hole blocking layer having a thickness of 5 nm. Subsequently, compound ET-1 and compound EI-1 were evaporated at a rate of 1:1 in two other cells to deposit an electron transport layer having a thickness of 30 nm. After depositing compound EI-1 as an electron injection layer having a thickness of 2 nm on the electron transport layer, an Al cathode having a thickness of 80 nm was deposited on the electron injection layer by another vacuum vapor deposition apparatus. Thus, an OLED was produced.

As a result, the minimum time taken to be reduced from 100% to 90% of the luminance based on a luminance of 2,000 nit was approximately 148 hours.

Device Example 6: Producing an OLED Using the Compound According to the Present Disclosure An OLED was produced in the same manner as in Device Example 5, except that compound H-128 was used as a host material of the light-emitting layer. As a result, the minimum time taken to be reduced from 100% to 90% of the luminance based on a luminance of 2,000 nit was approximately 195 hours.

From the Device Examples and the Comparative Examples, it can be seen that an OLED comprising the compound according to the present disclosure as a plurality of light-emitting materials has improved lifetime properties compared to an OLED using a conventional compound. In particular, the lifetime of a blue organic electroluminescent device can be improved significantly by comprising the compound represented by formula 1-1 of the present disclosure.

The compounds used in the Device Examples and the Comparative Examples are as follows.

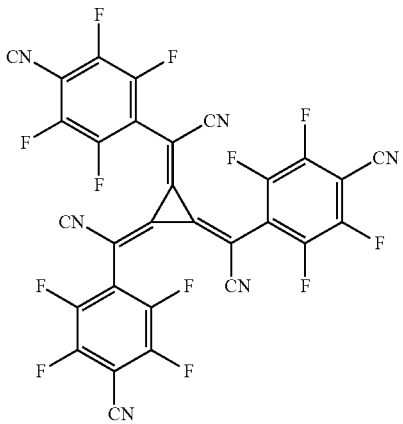
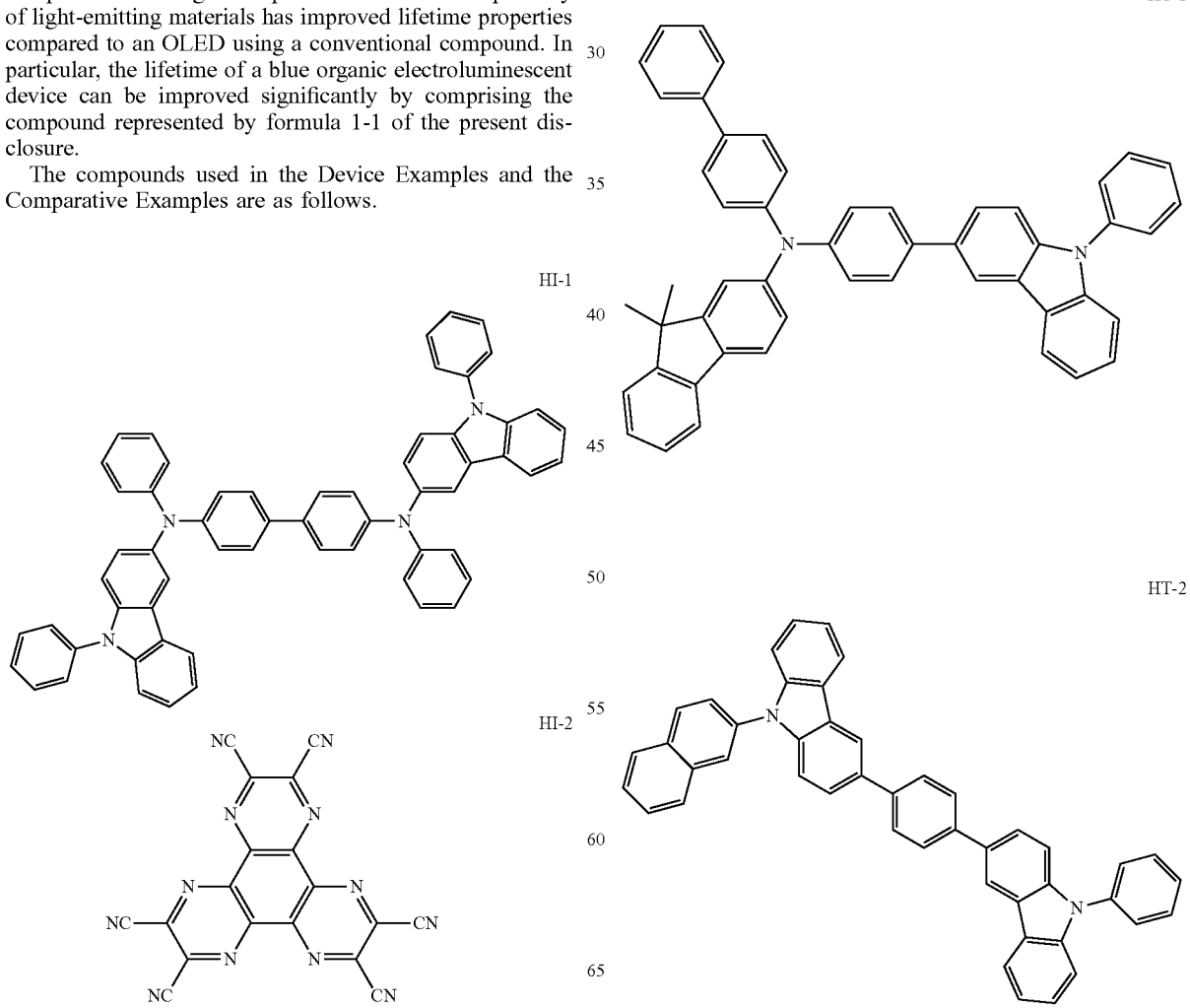

HT-3
BD-1
ET-1
ET-2
EI-1 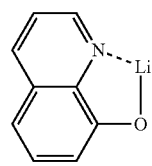
BH-1
BH-2
BH-3
BH-4
H-13

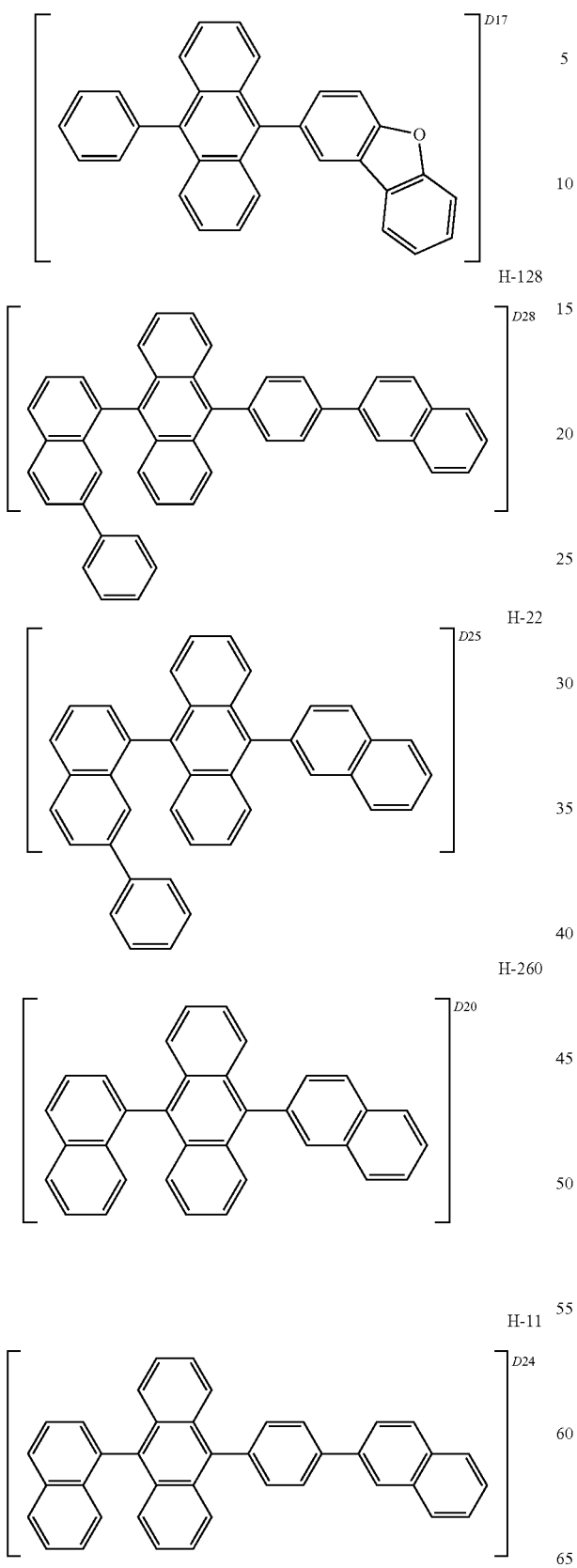

The invention claimed is:
1. A plurality of light-emitting materials comprising at least one of first compound and at least one of second compound, wherein the first compound is represented by the following formula 1:

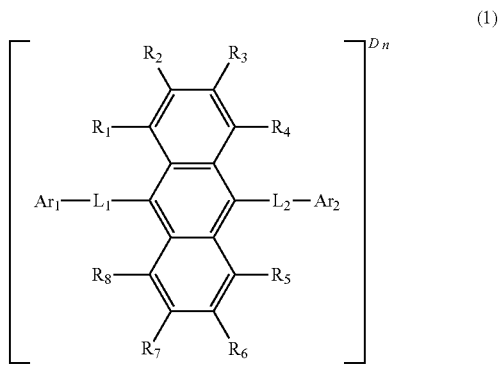

(1)

wherein,
$L_1$ and $L_2$, each independently, represent a single bond, a substituted or unsubstituted (C6-C30)arylene, or a substituted or unsubstituted (5- to 30-membered)heteroarylene;
$Ar_1$ and $Ar_2$, each independently, represent a substituted or unsubstituted (C6-C30)aryl, or a substituted or unsubstituted (5- to 30-membered)heteroaryl;
$R_1$ to $R_8$, each independently, represent hydrogen, deuterium, a halogen, a cyano, a substituted or unsubstituted (C1-C30)alkyl, a substituted or unsubstituted (C6-C30)aryl, a substituted or unsubstituted (3- to 30-membered) heteroaryl, a substituted or unsubstituted (C3-C30) cycloalkyl, a substituted or unsubstituted (C1-C30) alkoxy, a substituted or unsubstituted tri(C1-C30) alkylsilyl, a substituted or unsubstituted di(C1-C30) alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl (C6-C30)arylamino;
$D_n$ represents that n hydrogens are replaced with deuterium;
n represents an integer of 8 or more; and
the second compound is represented by the following formula 2:

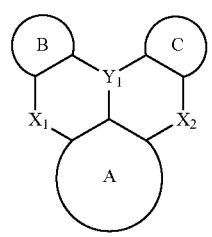

(2)

wherein,
ring A, ring B, and ring C, each independently, represent a substituted or unsubstituted (C6-C30)aryl, or a substituted or unsubstituted (3- to 50-membered)heteroaryl;

Y₁ represents B;

X₁ and X₂, each independently, represent NR; and

R represents hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino; or R may be linked to at least one of ring A, ring B and ring C to form a ring(s).

2. The plurality of light-emitting materials according to claim 1, wherein the substituent of the substituted alkyl, the substituted aryl(ene), the substituted heteroaryl(ene), the substituted cycloalkyl, the substituted alkoxy, the substituted trialkylsilyl, the substituted dialkylarylsilyl, the substituted alkyldiarylsilyl, the substituted triarylsilyl, the substituted mono- or di-alkylamino, the substituted mono- or di-arylamino, or the substituted alkylarylamino, each independently, is at least one selected from the group consisting of deuterium; a halogen; a cyano; a carboxyl; a nitro; a hydroxyl; a (C1-C30)alkyl; a halo(C1-C30)alkyl; a (C2-C30)alkenyl; a (C2-C30)alkynyl; a (C1-C30)alkoxy; a (C1-C30)alkylthio; a (C3-C30)cycloalkyl; a (C3-C30)cycloalkenyl; a (3- to 7-membered)heterocycloalkyl; a (C6-C30)aryloxy; a (C6-C30)arylthio; a (5- to 30-membered)heteroaryl unsubstituted or substituted with at least one of a (C1-C30)alkyl(s), a (C6-C30)aryl(s) and a di(C6-C30)arylamino(s); a (C6-C30)aryl unsubstituted or substituted with at least one of a (C1-C30)alkyl(s), a (5- to 30-membered)heteroaryl(s) and a di(C6-C30)arylamino(s); a tri(C1-C30)alkylsilyl; a tri(C6-C30)arylsilyl; a di(C1-C30)alkyl(C6-C30)arylsilyl; a (C1-C30)alkyldi(C6-C30)arylsilyl; an amino; a mono- or di-(C1-C30)alkylamino; a mono- or di-(C6-C30)arylamino unsubstituted or substituted with at least one of a (C1-C30)alkyl(s), a (5- to 30-membered)heteroaryl(s) and a di(C6-C30)arylamino(s); a (C1-C30)alkyl(C6-C30)arylamino; a (C1-C30)alkylcarbonyl; a (C1-C30)alkoxycarbonyl; a (C6-C30)arylcarbonyl; a di(C6-C30)arylboronyl; a di(C1-C30)alkylboronyl; a (C1-C30)alkyl(C6-C30)arylboronyl; a (C6-C30)aryl(C1-C30)alkyl; and a (C1-C30)alkyl(C6-C30)aryl.

3. The plurality of light-emitting materials according to claim 1, wherein L₁ and L₂ in the formula 1, each independently, represent a single bond, or any one selected from the following Group 1:

[Group 1]

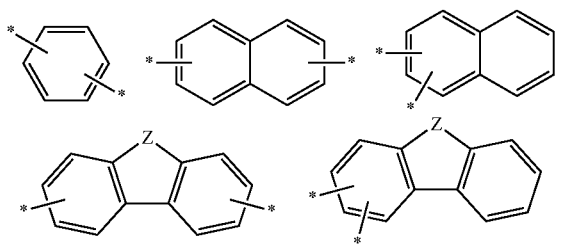

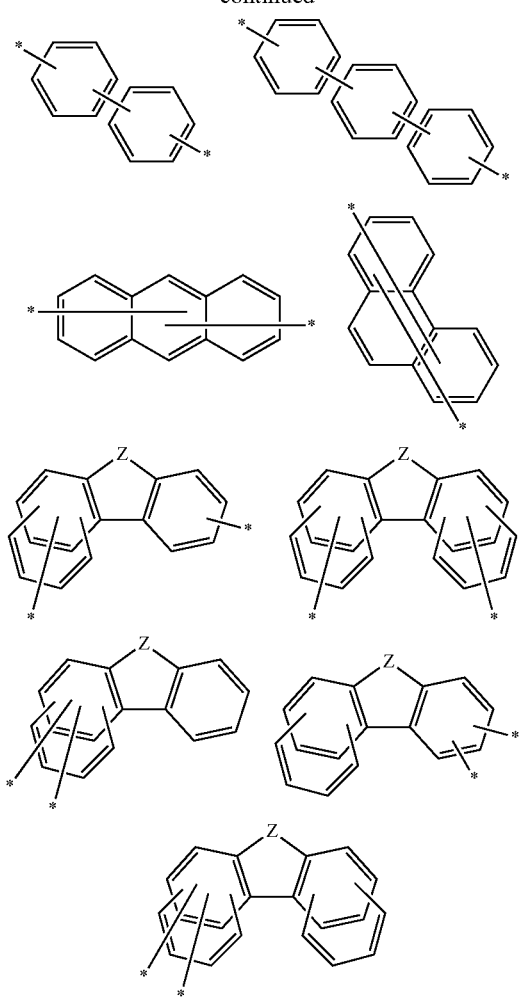

wherein,

Z represents O, S, NR₁₀₁, CR₁₀₂R₁₀₃, or SiR₁₀₄R₁₀₅;

R₁₀₁ to R₁₀₅, each independently, represent a substituted or unsubstituted (C1-C30)alkyl, a substituted or unsubstituted (C6-C30)aryl, or a substituted or unsubstituted (3- to 30-membered)heteroaryl; or may be linked to an adjacent substituent to form a ring(s); and two *'s in any one of Group 1 represent a bonding site with anthracene backbone, and a bonding site with Ar₁ or Ar₂, respectively.

4. The plurality of light-emitting materials according to claim 1, wherein Ar₁ and Ar₂ in the formula 1, each independently, represent any one selected from the following Group 2:

[Group 2]

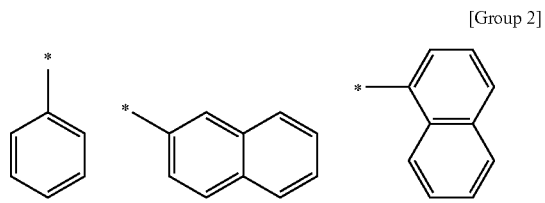

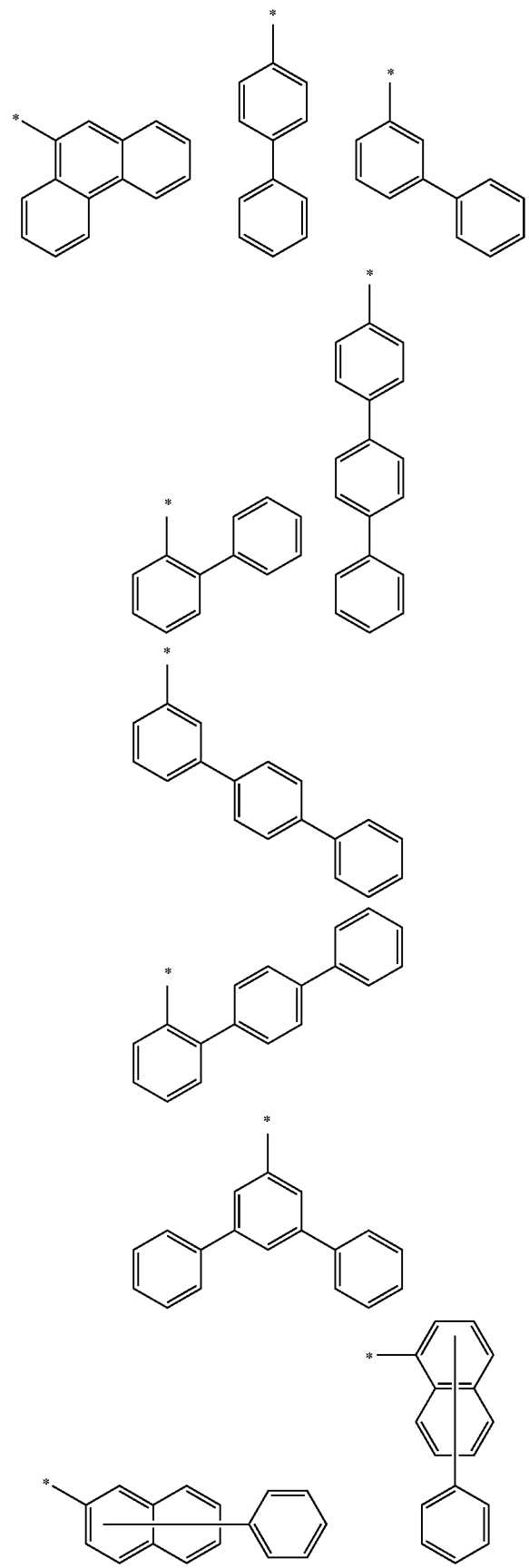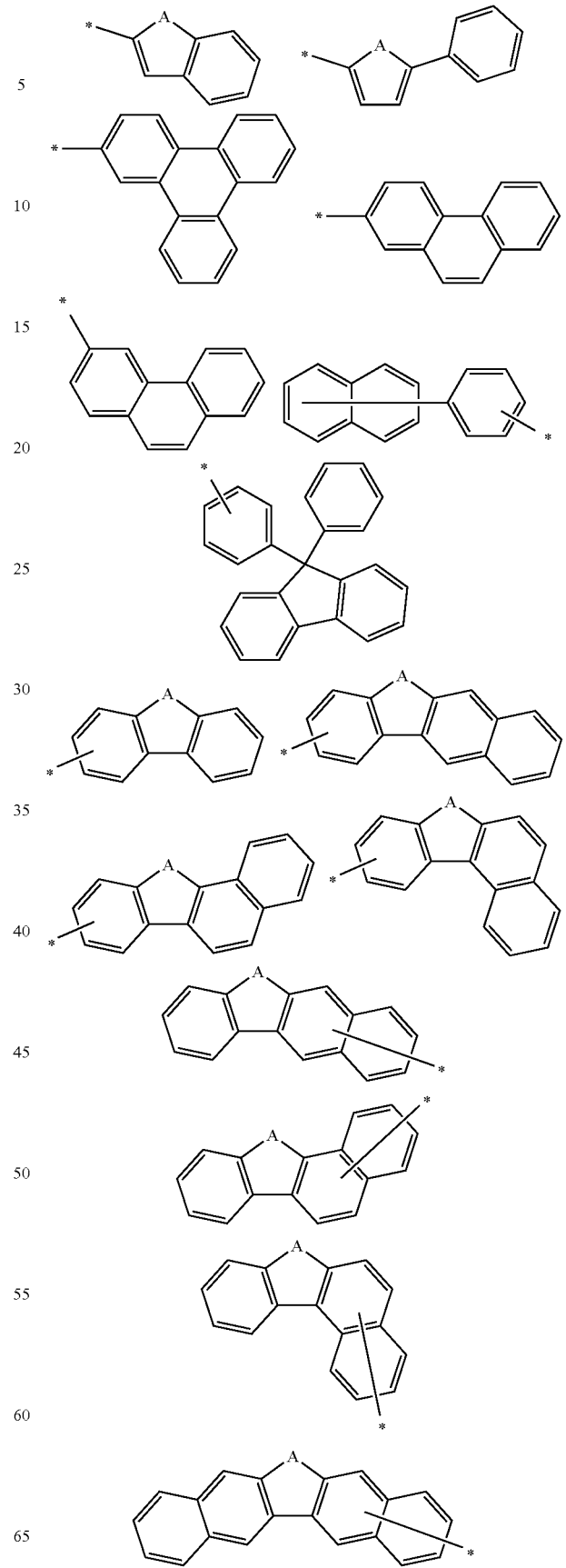

-continued
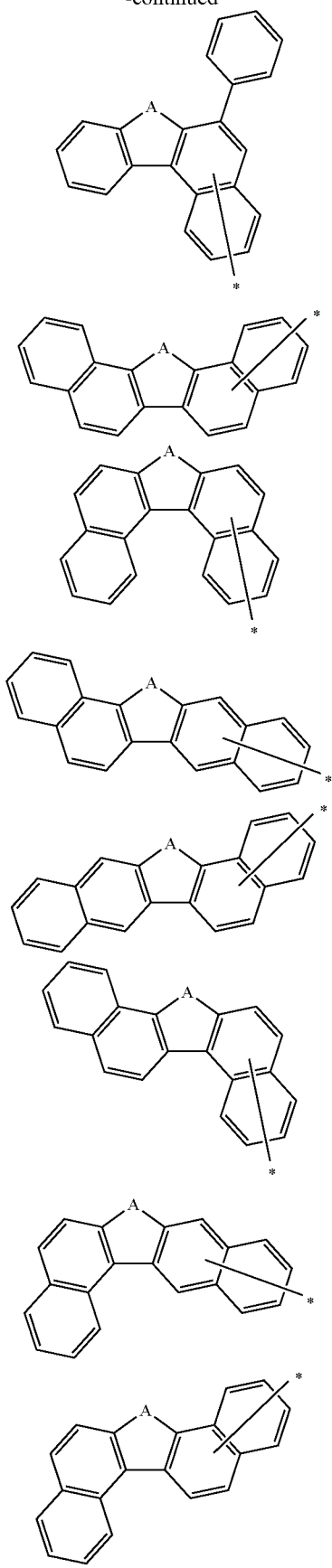
-continued
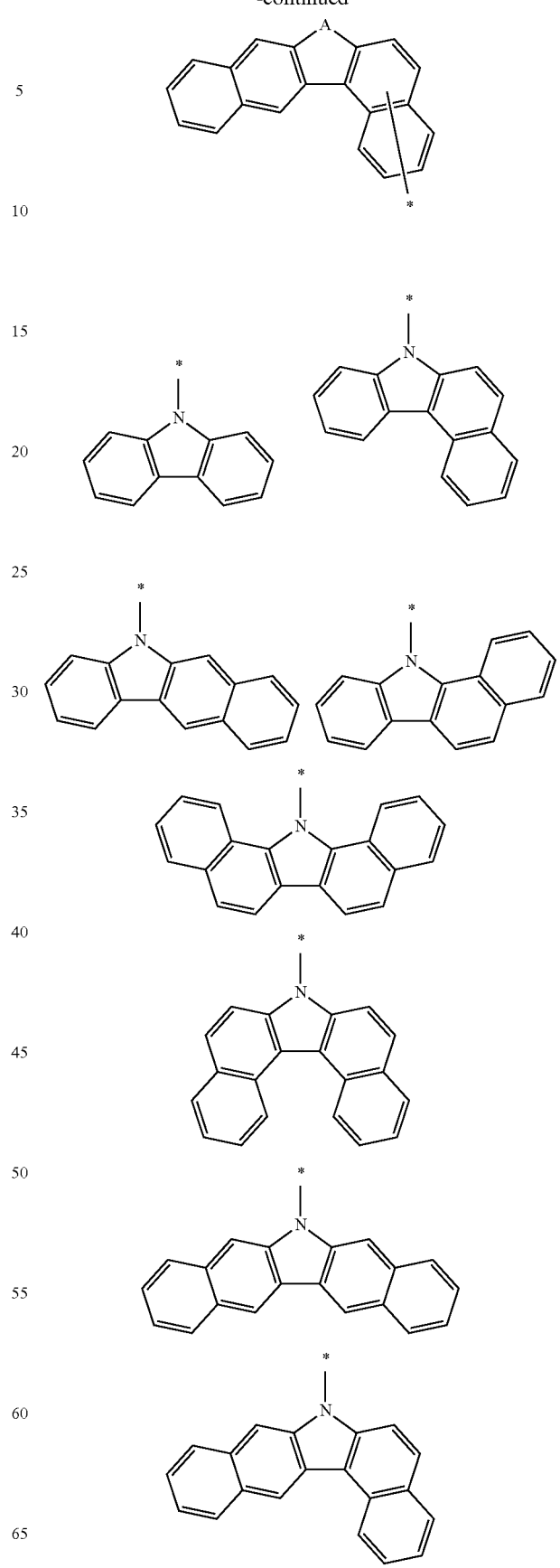

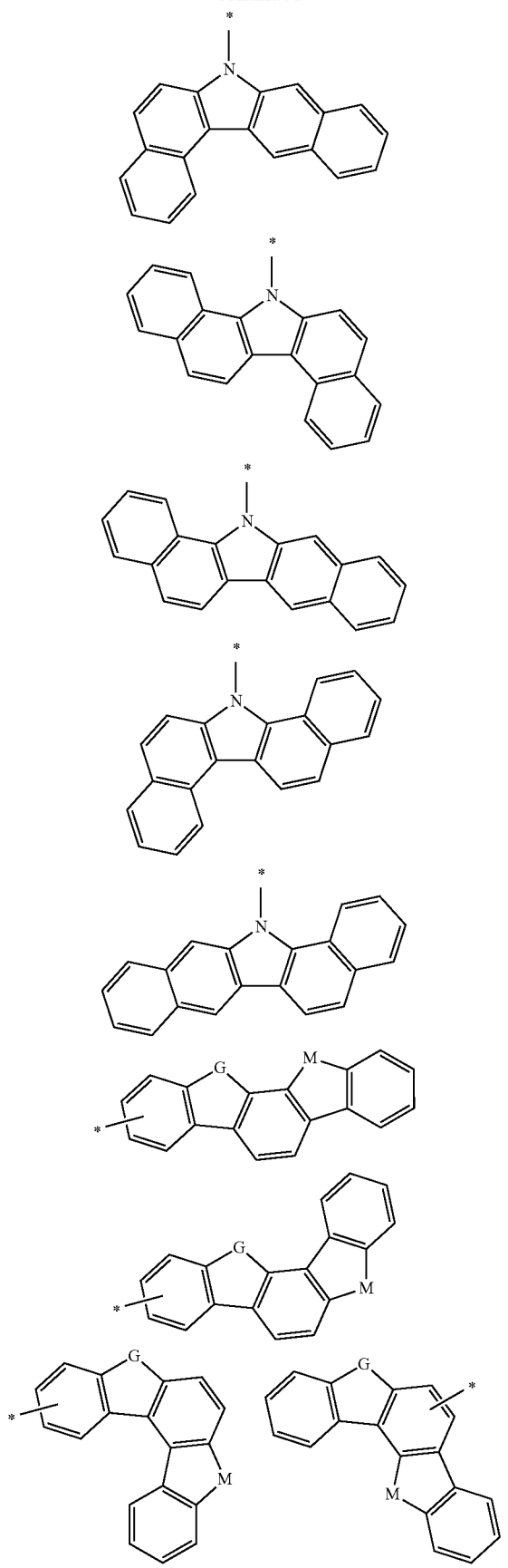
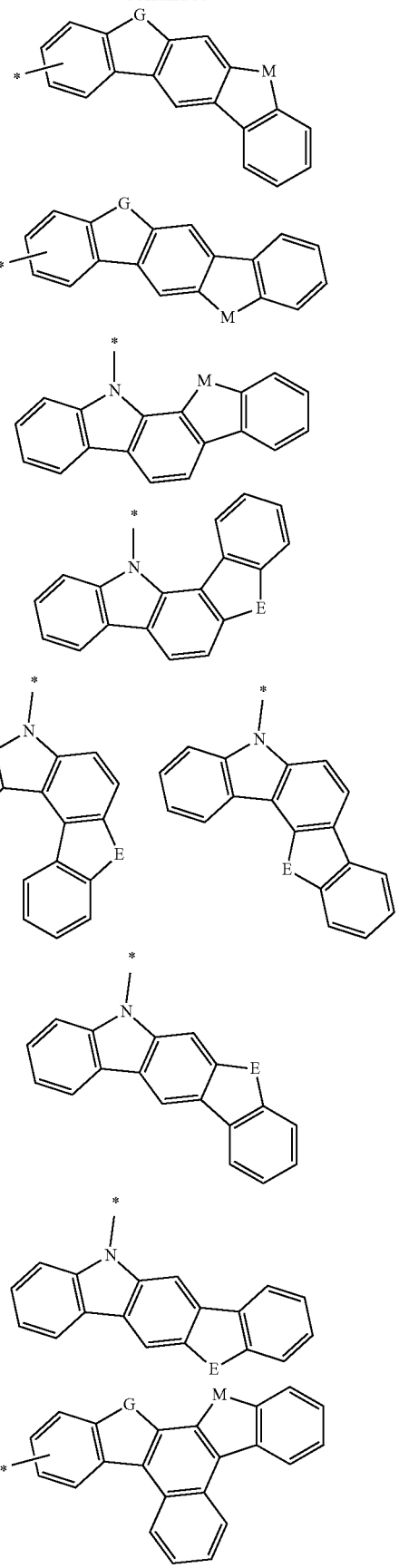

-continued

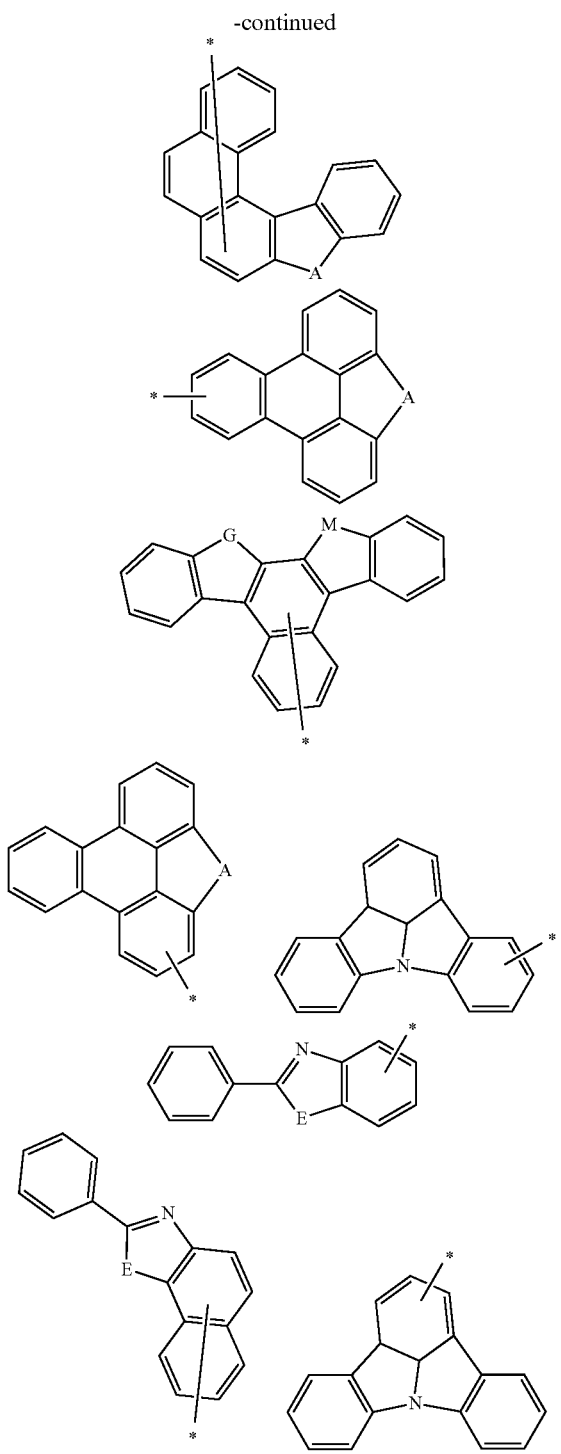

wherein,

A, G, E, and M, each independently, represent O, S, NR$_{106}$, CR$_{107}$R$_{108}$, or SiR$_{109}$R$_{110}$;

R$_{106}$ to R$_{110}$, each independently, represent a substituted or unsubstituted (C1-C30)alkyl, a substituted or unsubstituted (C6-C30)aryl, or a substituted or unsubstituted (3- to 30-membered)heteroaryl; or may be linked to an adjacent substituent to form a ring(s); and

* represents a bonding site with anthracene backbone, L$_1$ or L$_2$.

5. The plurality of light-emitting materials according to claim 1, wherein at least four of R$_1$ to R$_8$ in formula 1 represent deuterium.

6. The plurality of light-emitting materials according to claim 5, wherein L$_2$ represents a single bond, and Ar$_2$ represents a naphthyl unsubstituted or substituted with deuterium or a (C6-C30)aryl(s).

7. The plurality of light-emitting materials according to claim 1, wherein the formula 1 is represented by the following formula 1-1:

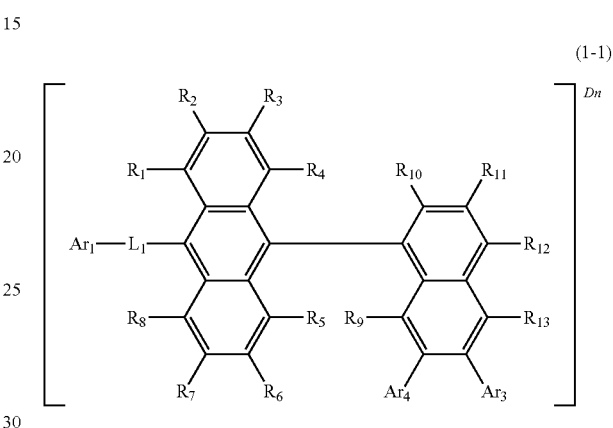

(1-1)

wherein, L$_1$ represents a single bond, a substituted or unsubstituted (C6-C30)arylene, or a substituted or unsubstituted (5- to 30-membered)heteroarylene;

Ar$_1$ represents a substituted or unsubstituted (C6-C30)aryl, or a substituted or unsubstituted (5- to 30-membered)heteroaryl;

Ar$_3$ and Ar$_4$, each independently, represent hydrogen, deuterium, a substituted or unsubstituted (C6-C30)aryl, or a substituted or unsubstituted (5- to 30-membered)heteroaryl, with a proviso that Ar$_3$ and Ar$_4$ are not simultaneously hydrogen;

R$_1$ to R$_{13}$, each independently, represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl (C6-C30)arylamino;

D$_n$ represents that n hydrogens are replaced with deuterium; and n represents an integer of 8 or more.

8. The plurality of light-emitting materials according to claim 1, wherein the formula 2 is represented by the following formula 2-1:

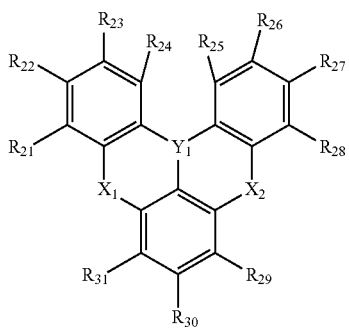

(2-1)

wherein,

Y₁, X₁, and X₂, are each as defined in claim 1; and

R₂₁ to R₃₁, each independently, represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino; or may be linked to an adjacent substituent to form a ring(s).

9. The plurality of light-emitting materials according to claim 1, wherein the compound represented by formula 1 is selected from the group consisting of the following compounds:

H-1

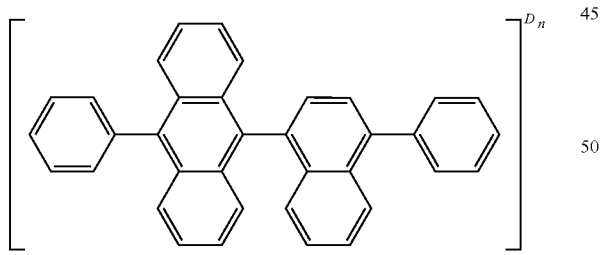

H-2

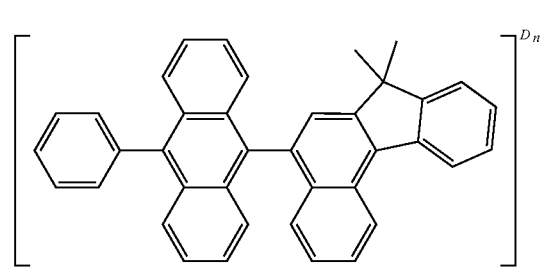

H-3

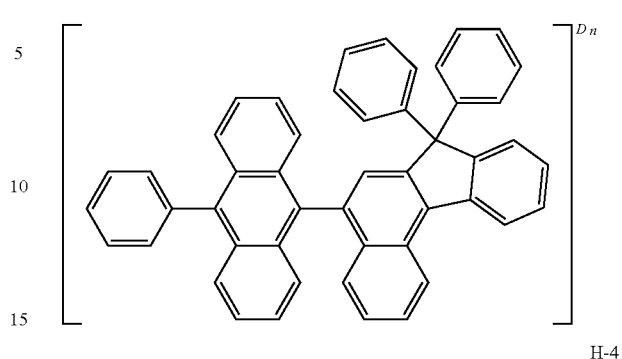

H-4

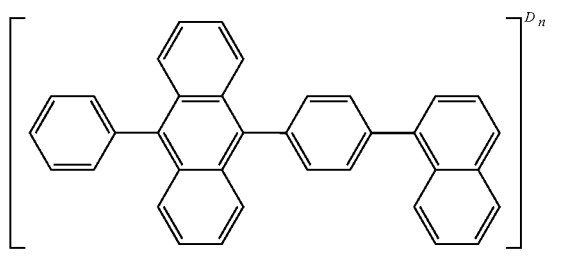

H-5

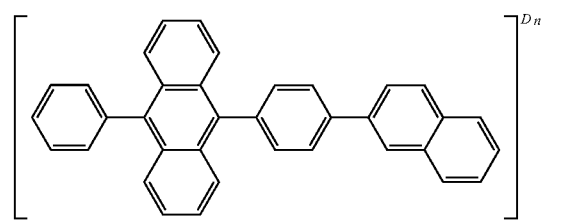

H-6

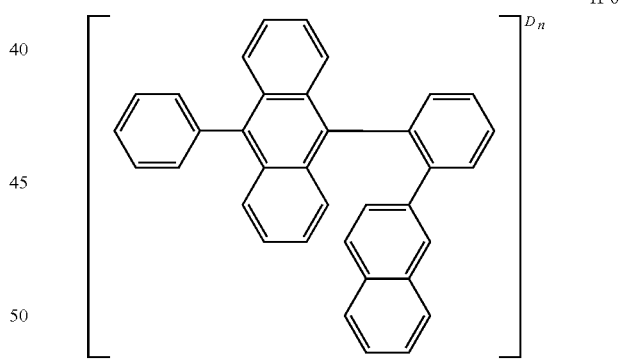

H-7

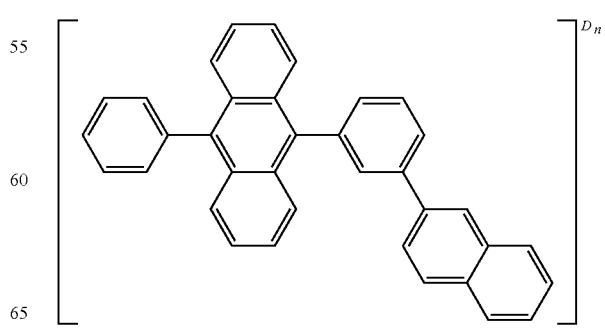

H-8
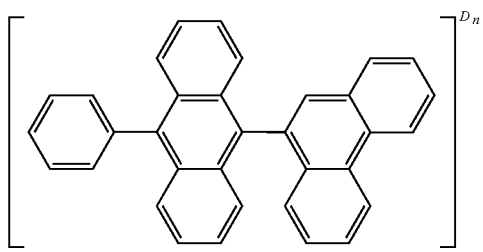
H-9
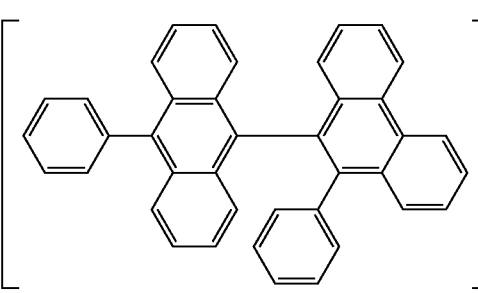
H-10
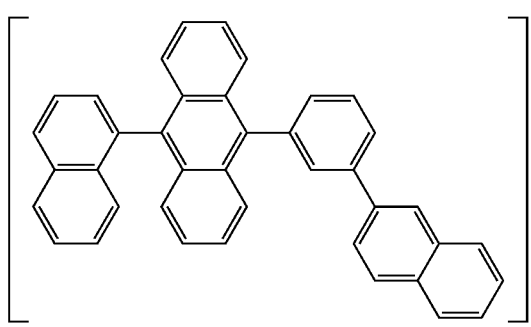
H-11
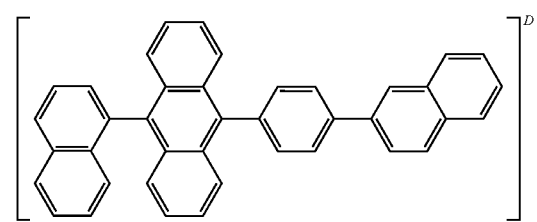
H-12
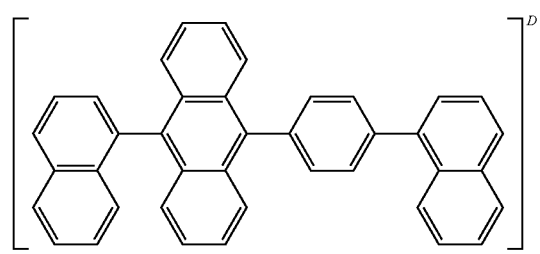
H-13
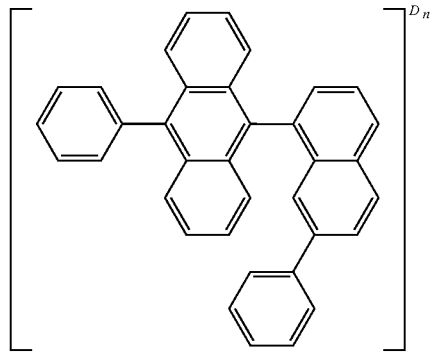
H-14
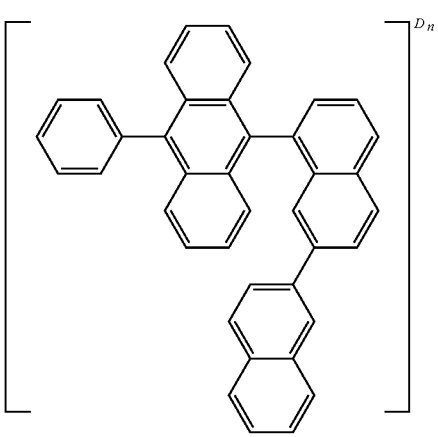
H-15
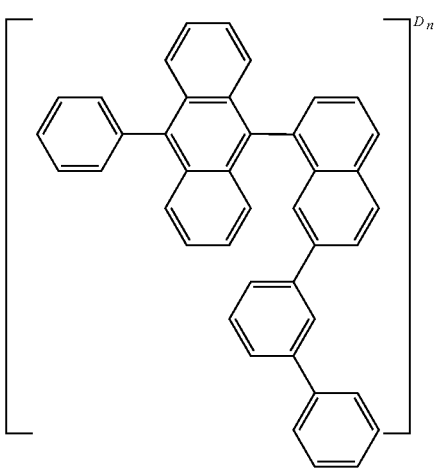
H-16
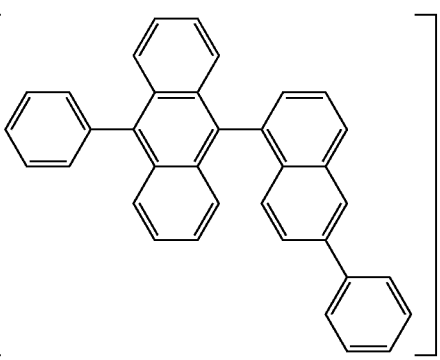

H-17
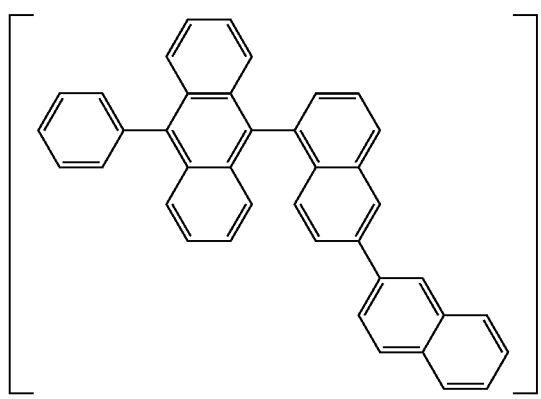
H-18
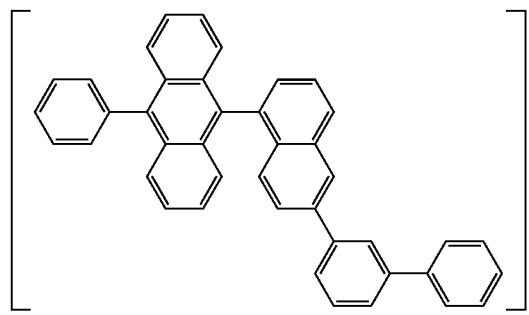
H-19
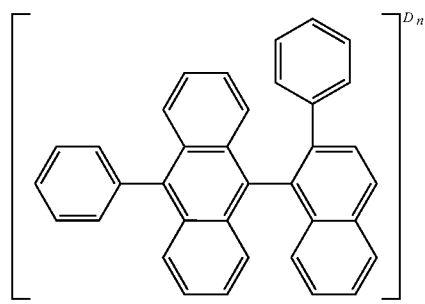
H-20
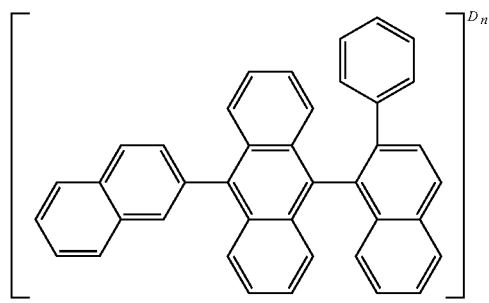
H-21
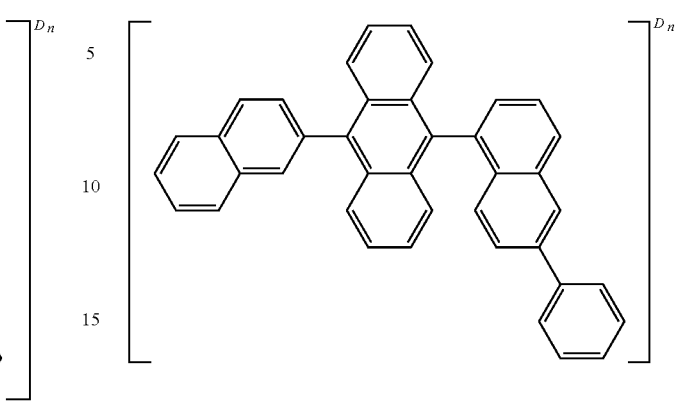
H-22
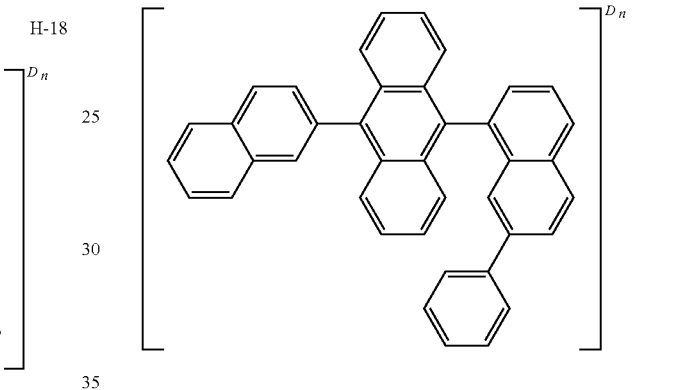
H-23
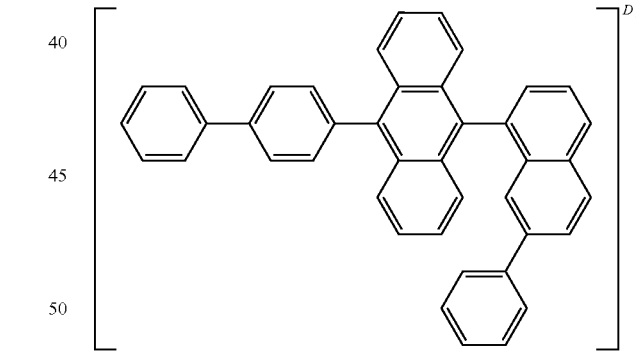
H-24
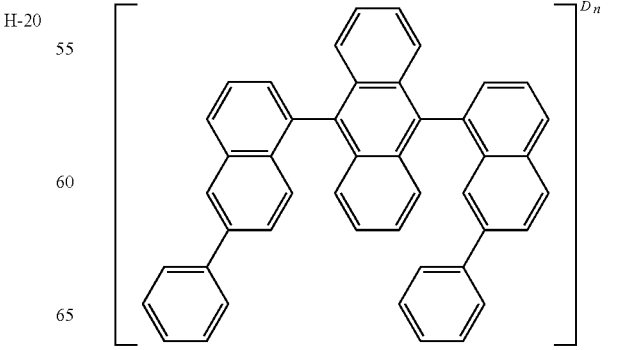

H-25
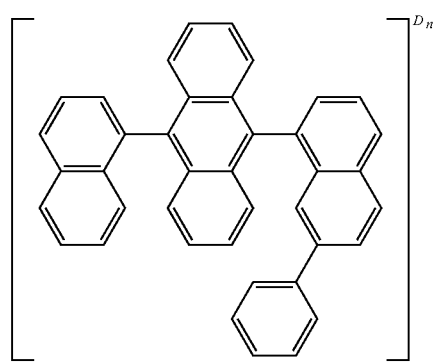
H-26
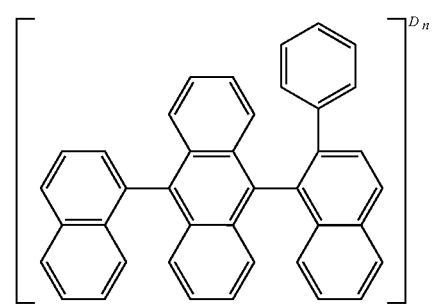
H-27
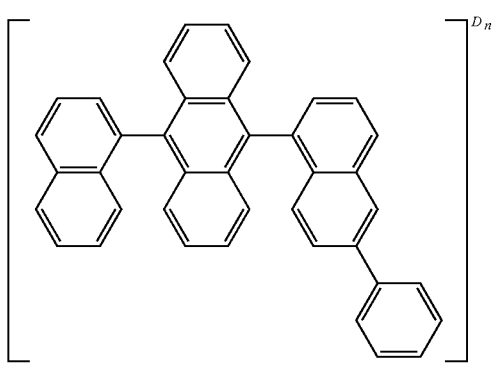
H-28
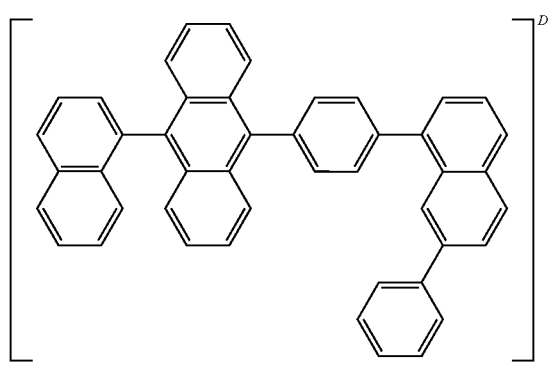
H-29
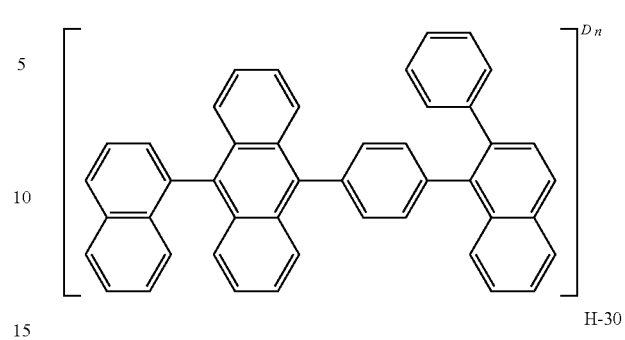
H-30
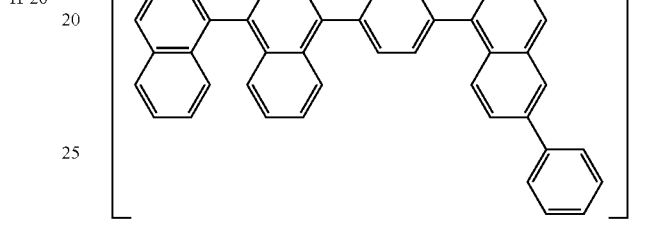
H-31
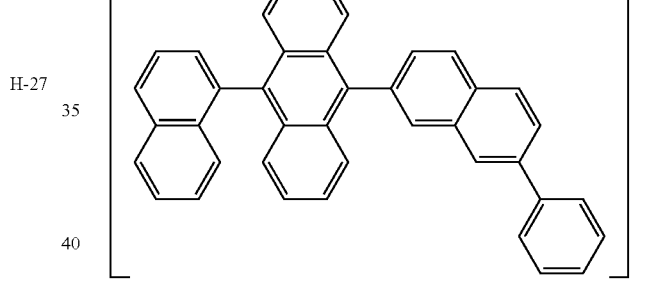
H-32
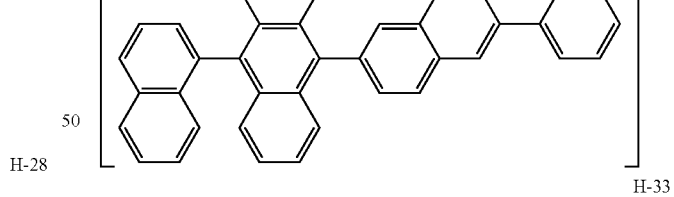
H-33
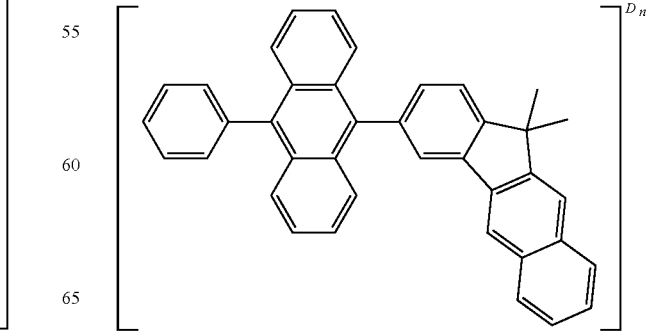

H-34
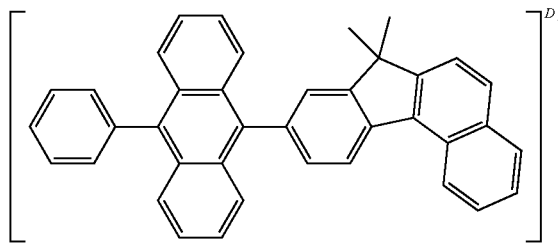
H-39
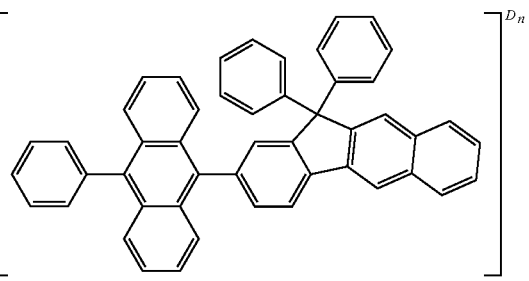
H-35
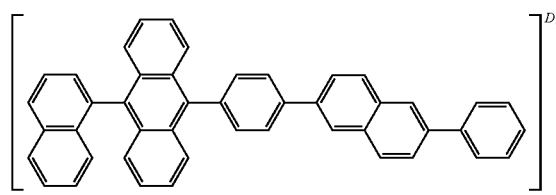
H-40
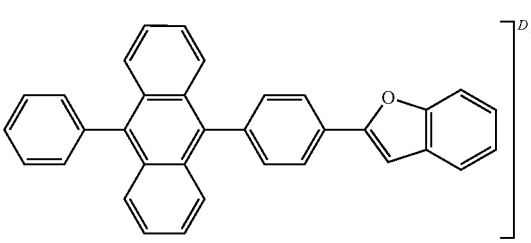
H-36
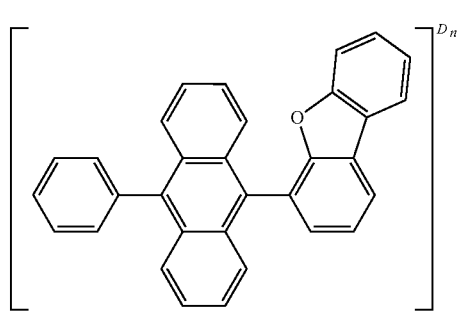
H-41
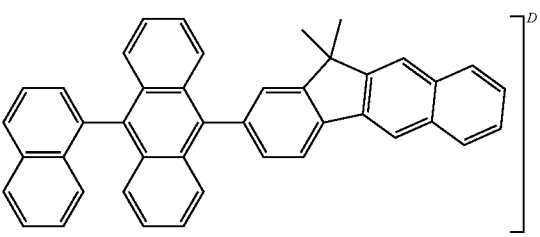
H-37
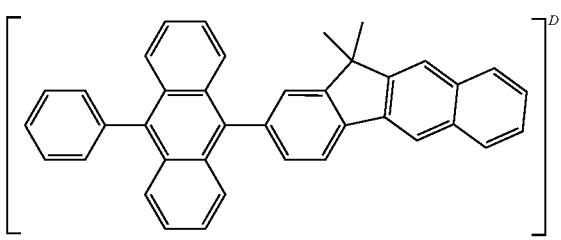
H-42
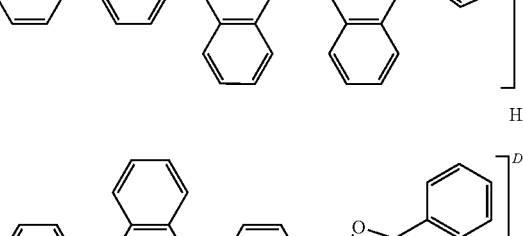
H-38
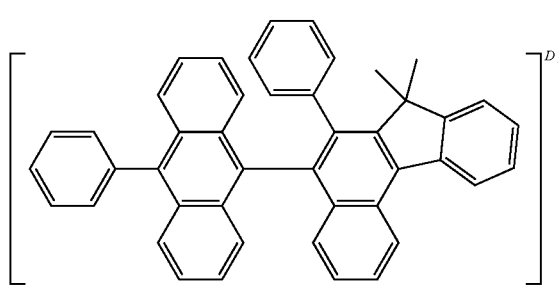
H-43
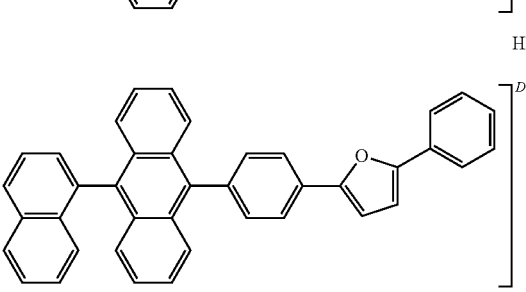
H-44

H-45
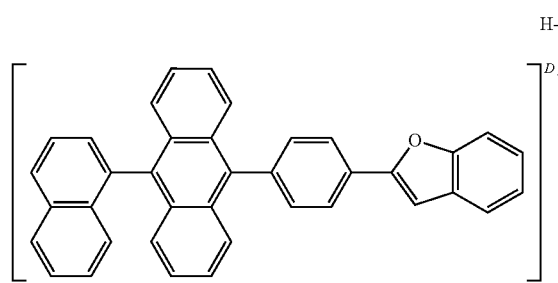
H-46
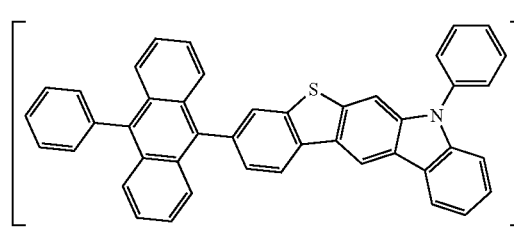
H-47
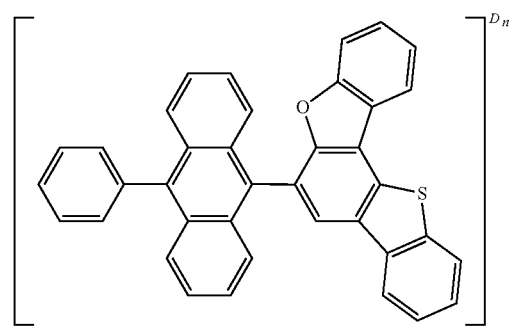
H-48
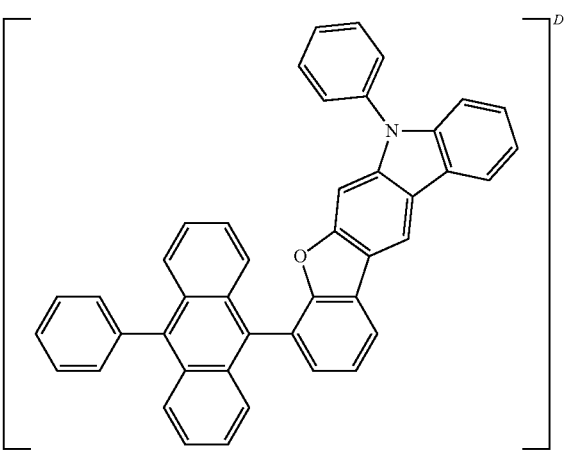
H-49
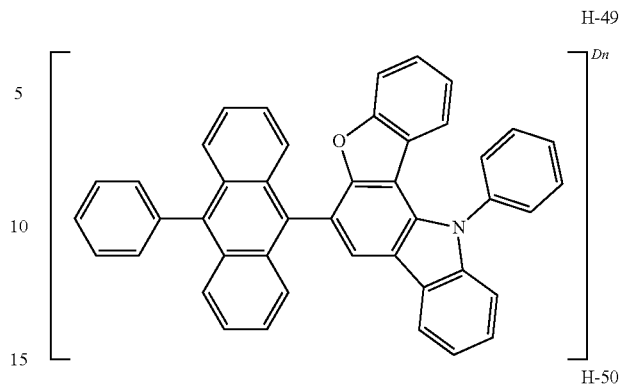
H-50
H-51
H-52
H-53
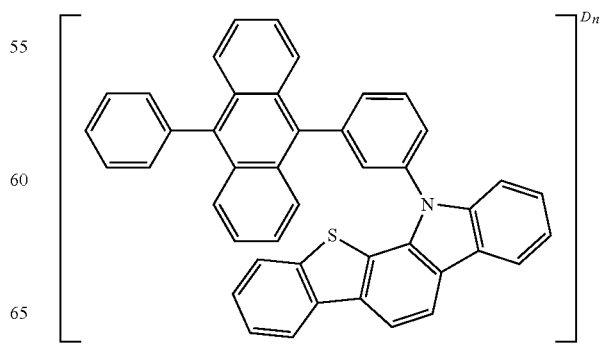

-continued
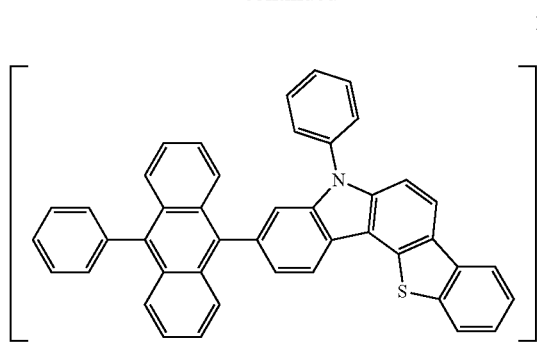
H-54
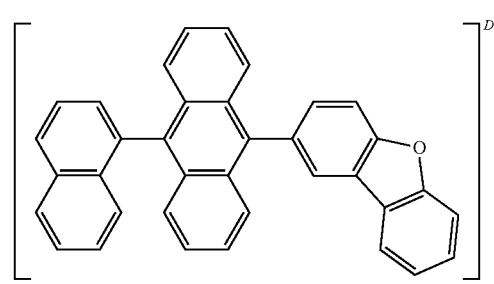
H-59
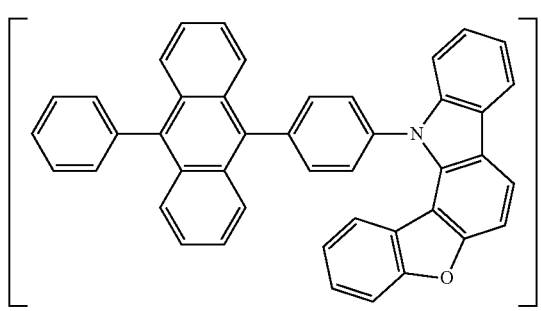
H-55
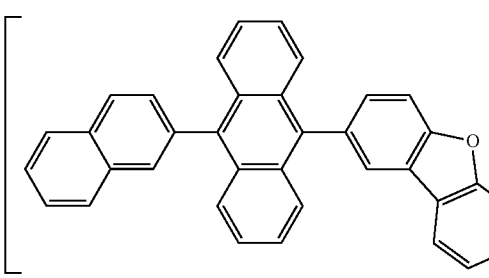
H-60
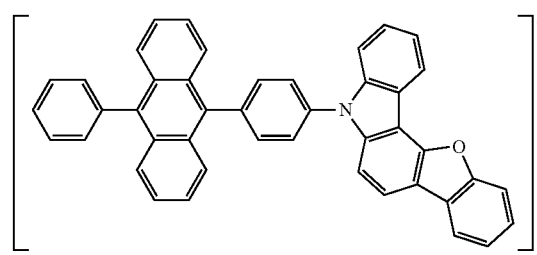
H-56
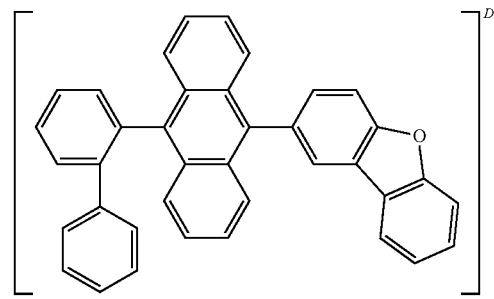
H-61
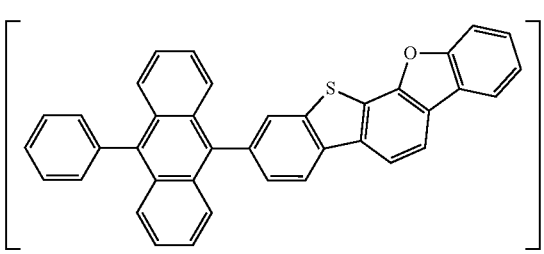
H-57
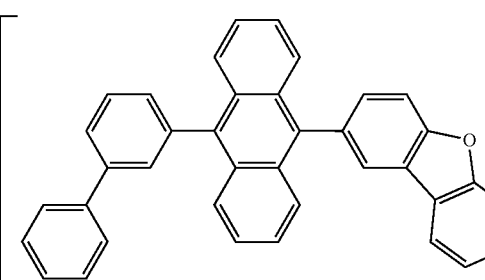
H-62
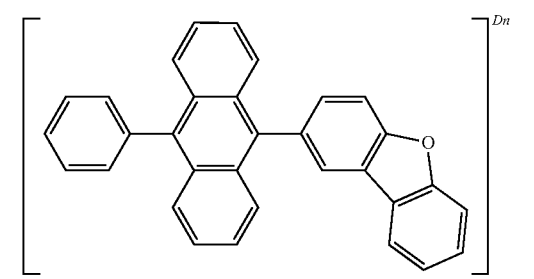
H-58
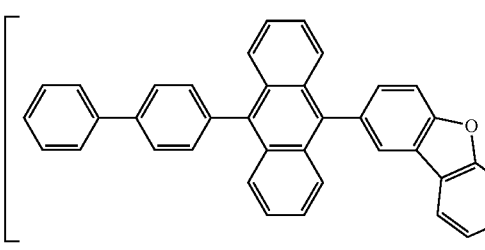
H-63

H-64
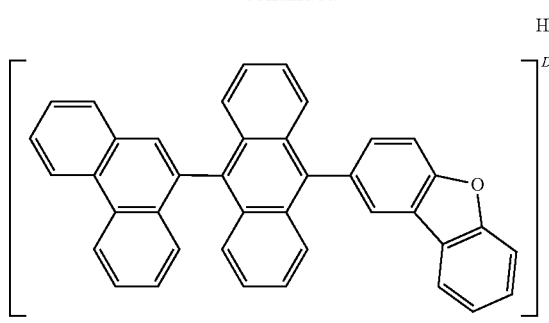
H-65
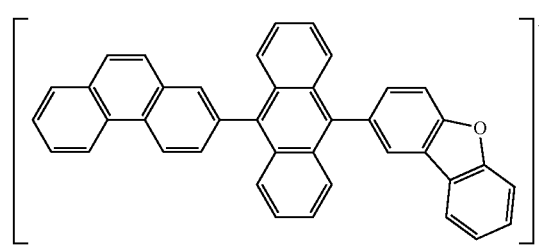
H-66
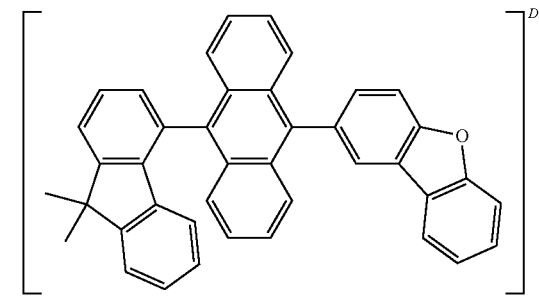
H-67
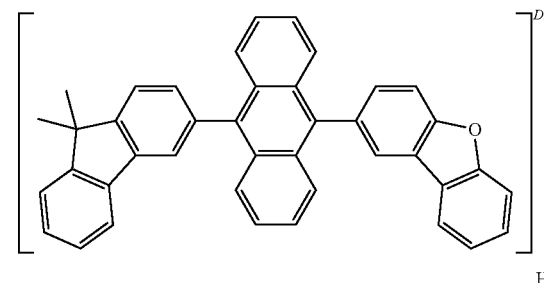
H-68
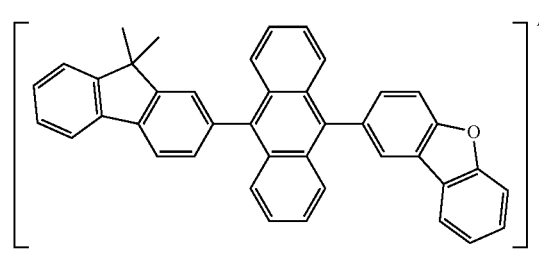
H-69
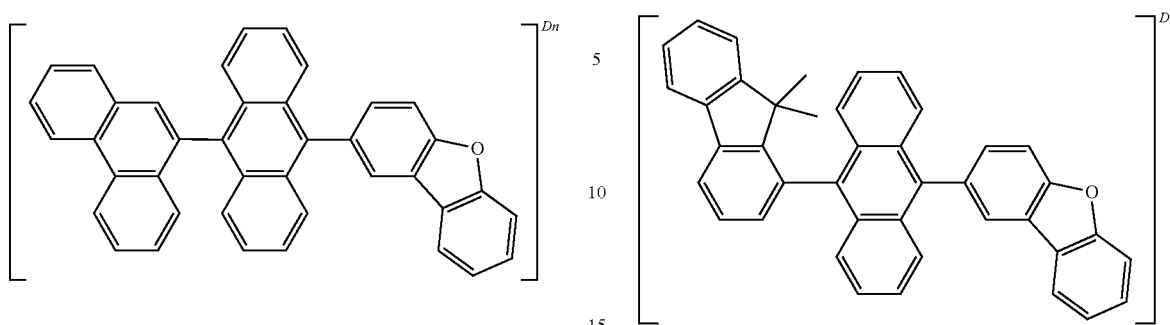
H-70
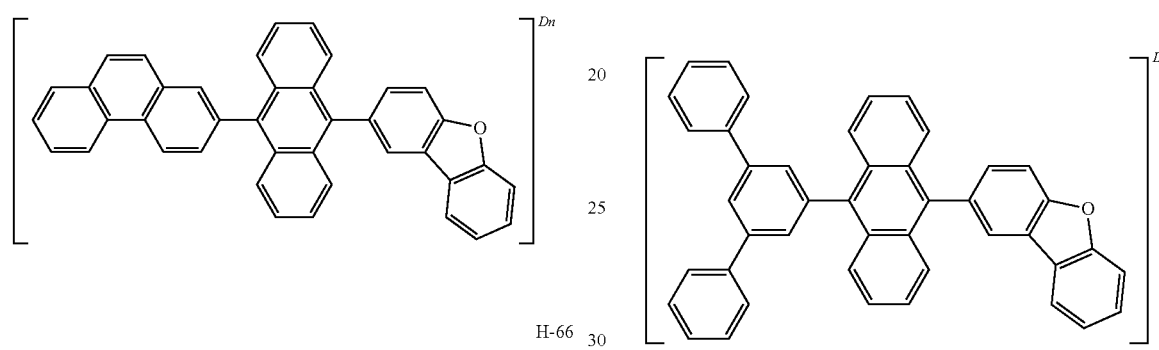
H-71
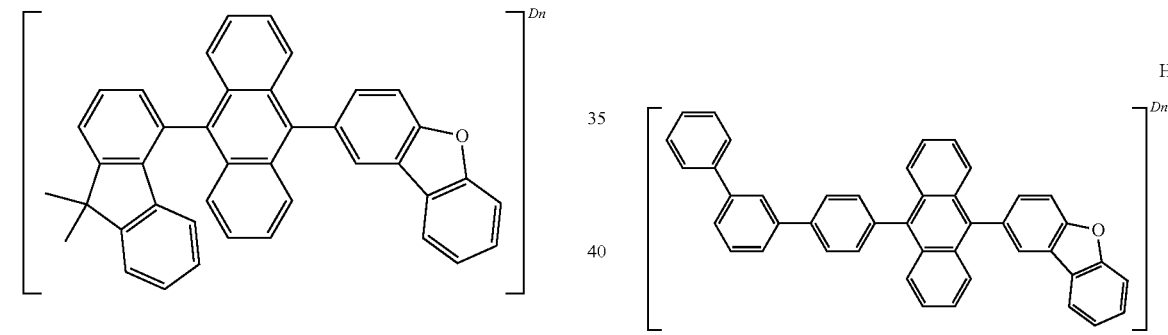
H-72
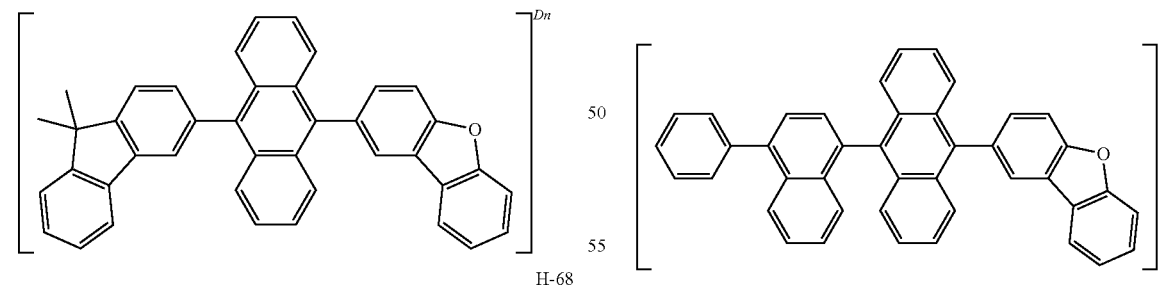
H-73
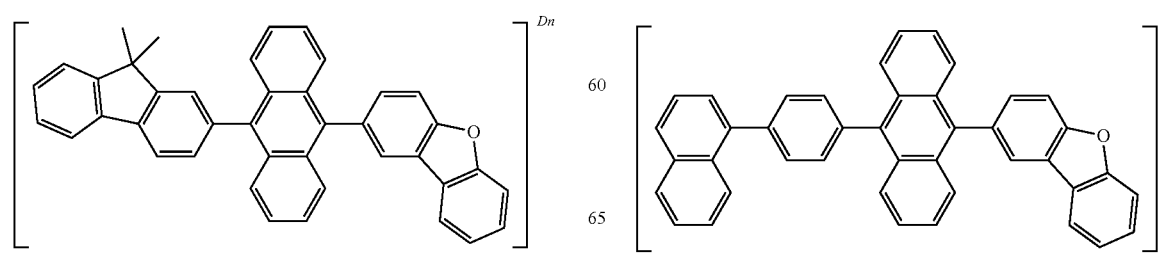

H-74
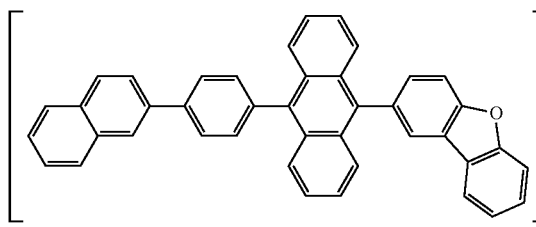
H-75
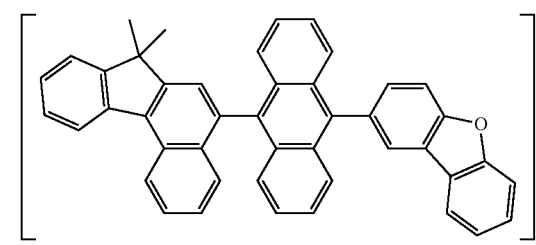
H-76
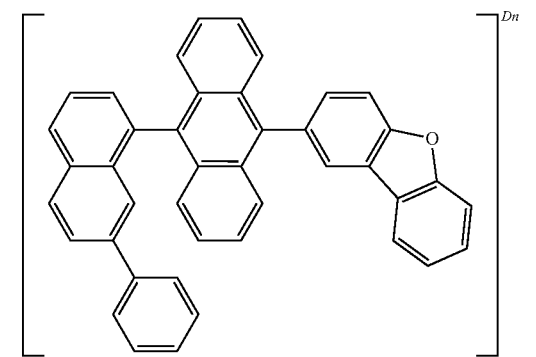
H-77
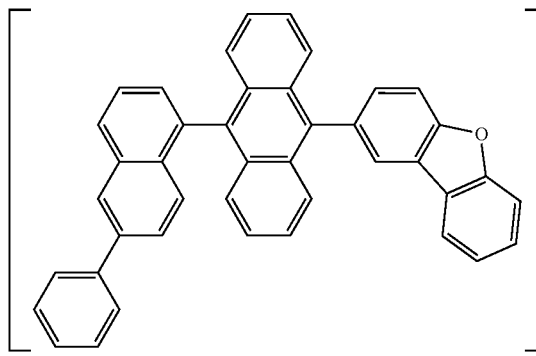
H-78
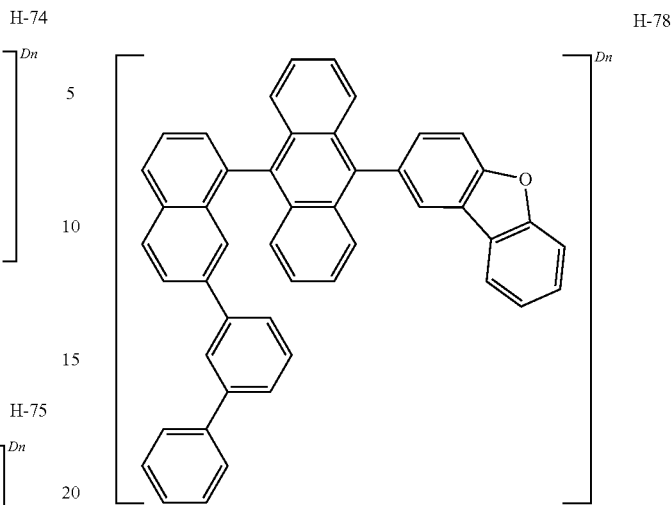
H-79
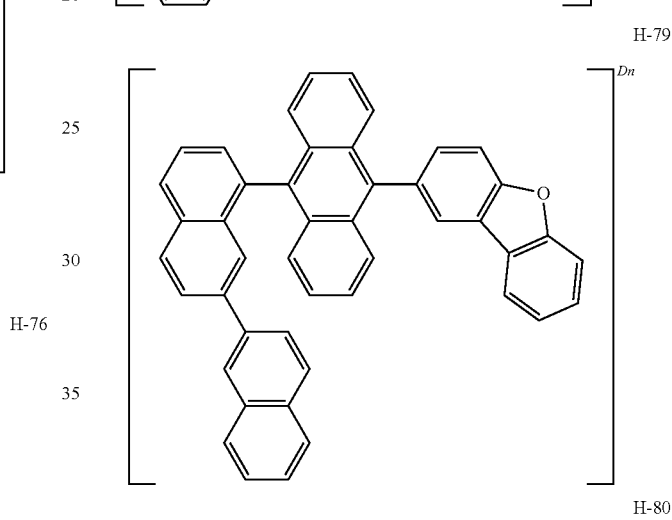
H-80
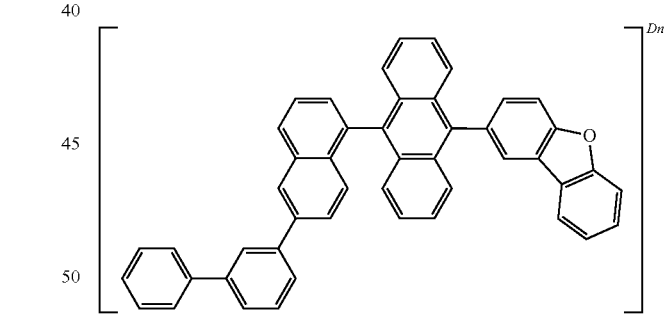
H-81
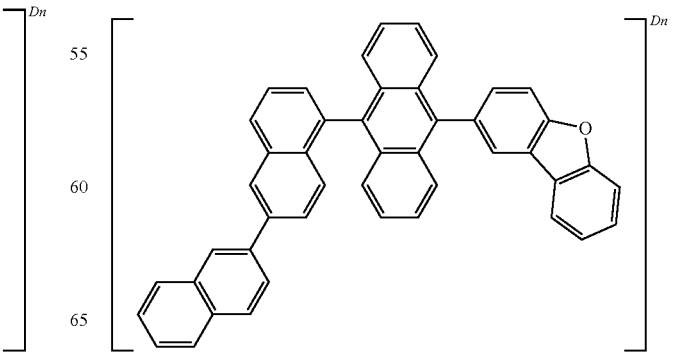

H-82
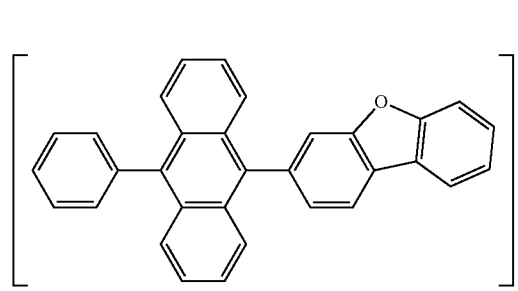
H-83
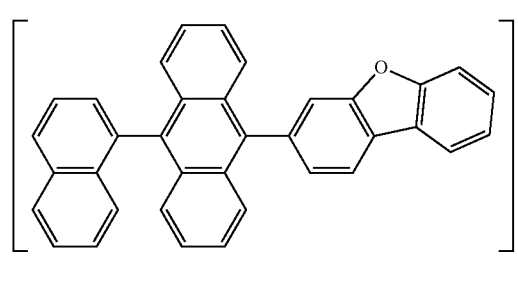
H-84
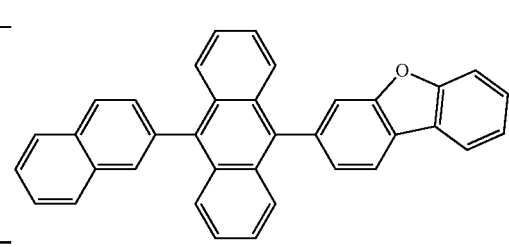
H-85
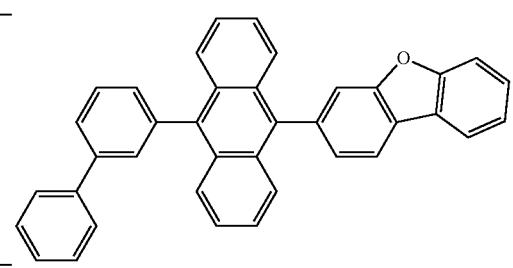
H-86
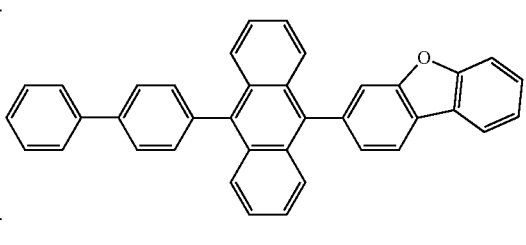
H-87
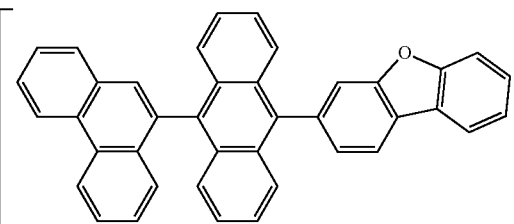
H-88
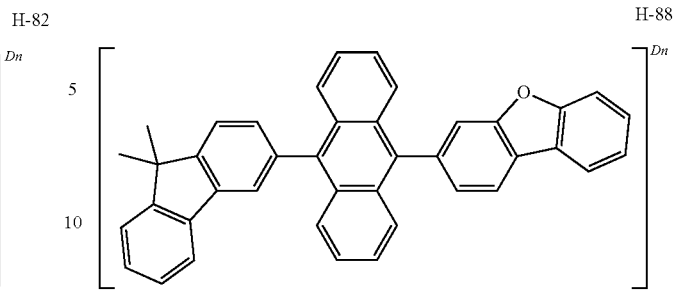
H-89
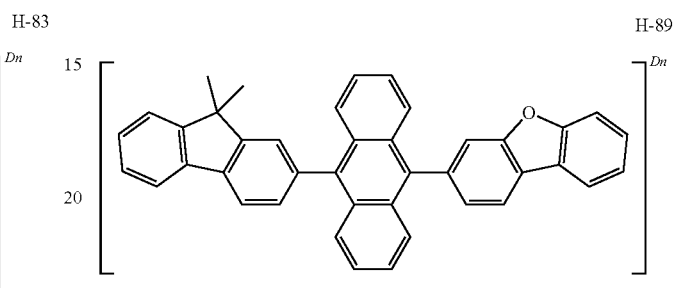
H-90
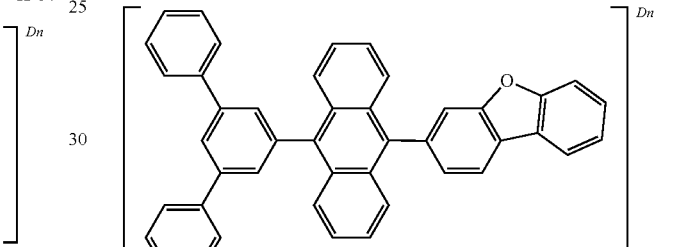
H-91
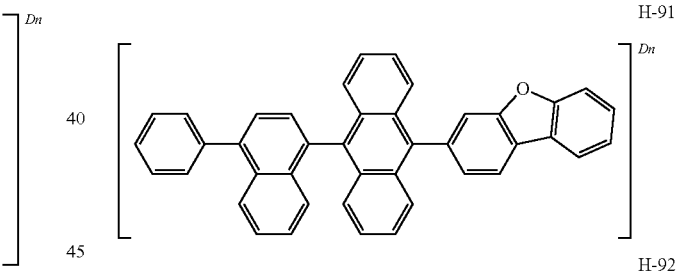
H-92
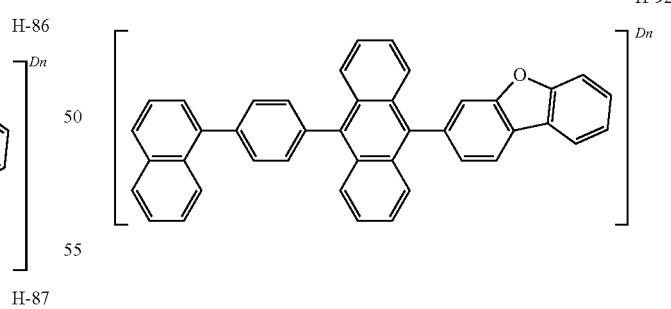
H-93
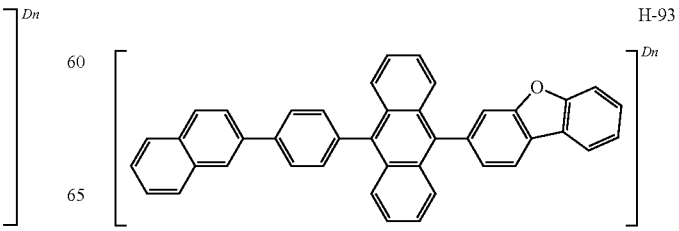

H-94
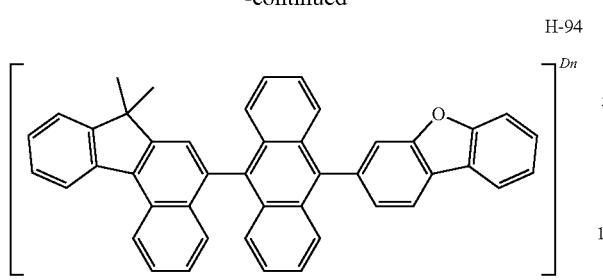
H-98
H-95
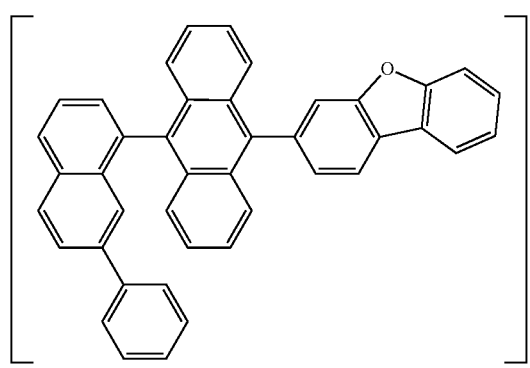
H-99
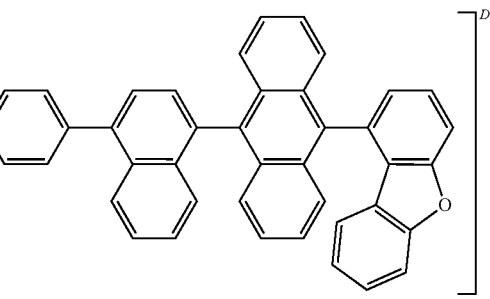
H-96
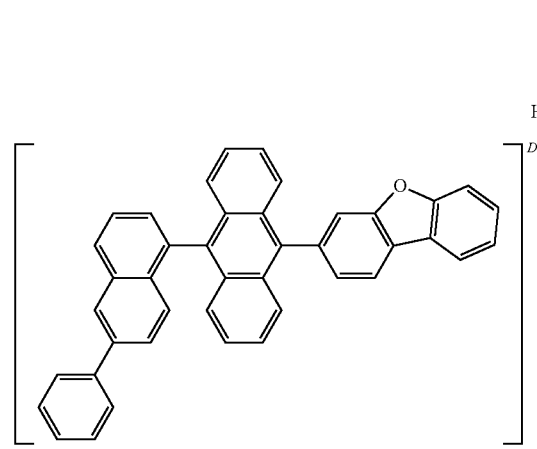
H-100
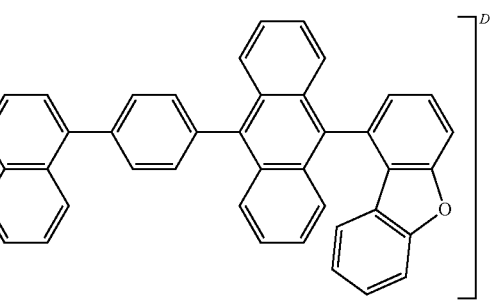
H-101
H-97
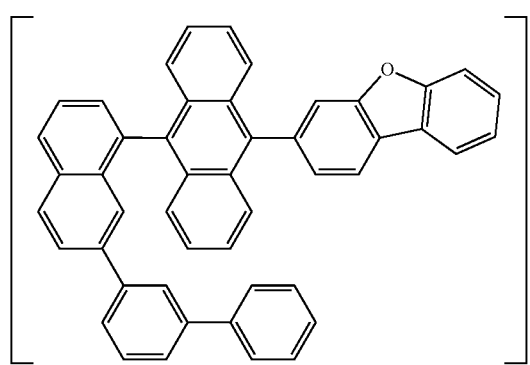
H-102
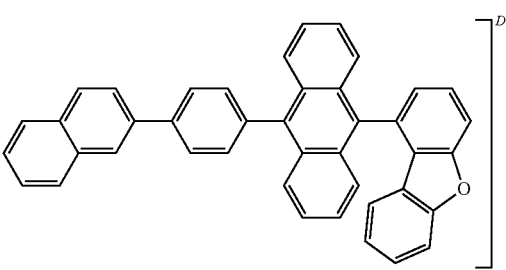

H-103
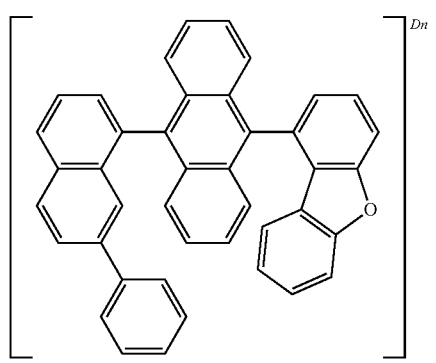
H-104
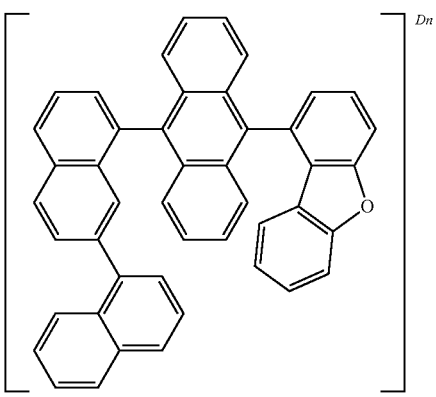
H-105
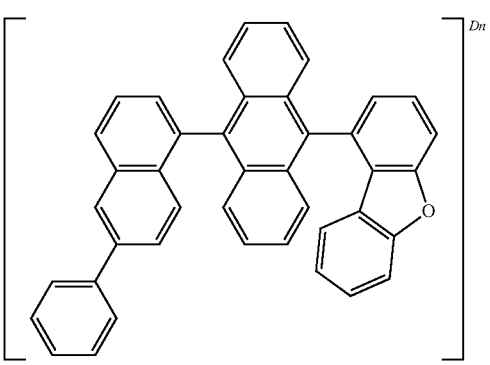
H-106
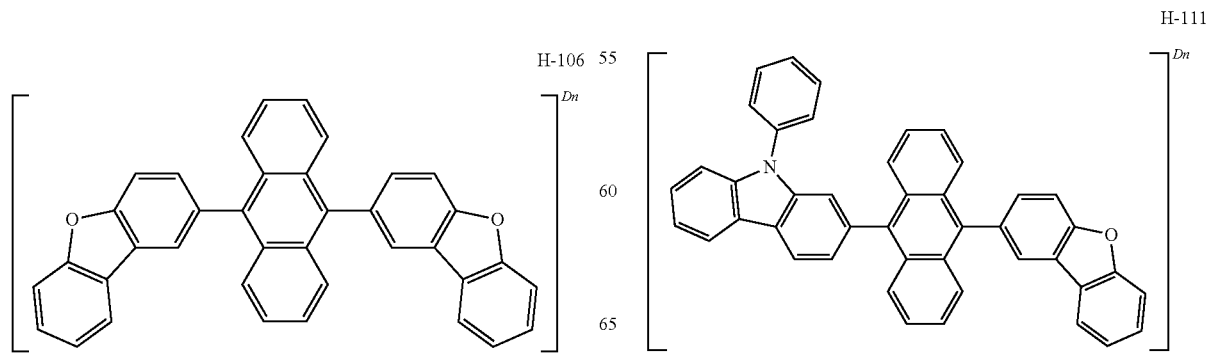
H-107
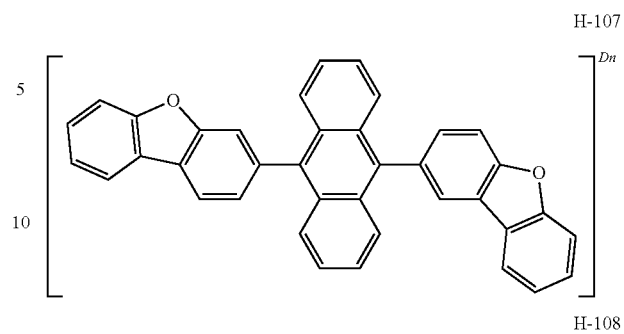
H-108
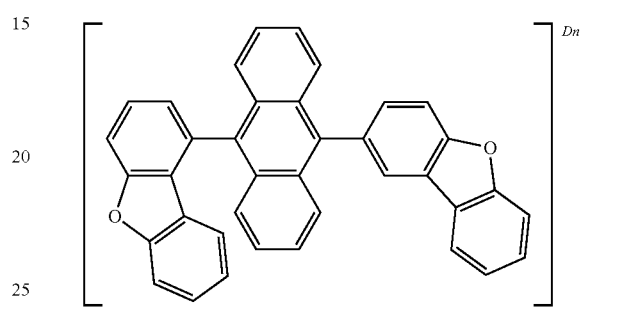
H-109
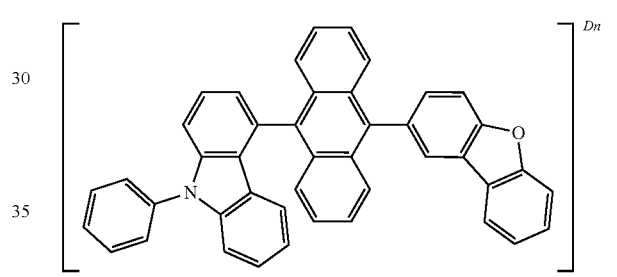
H-110
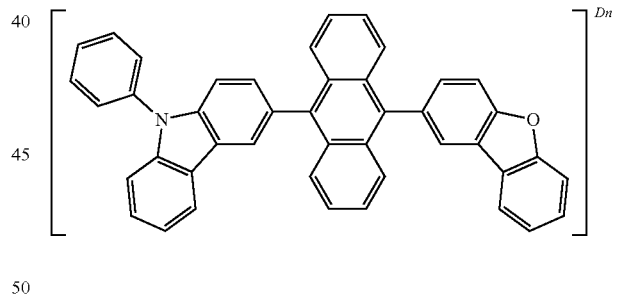
H-111
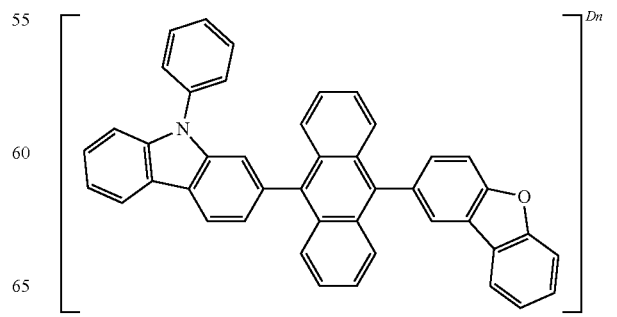

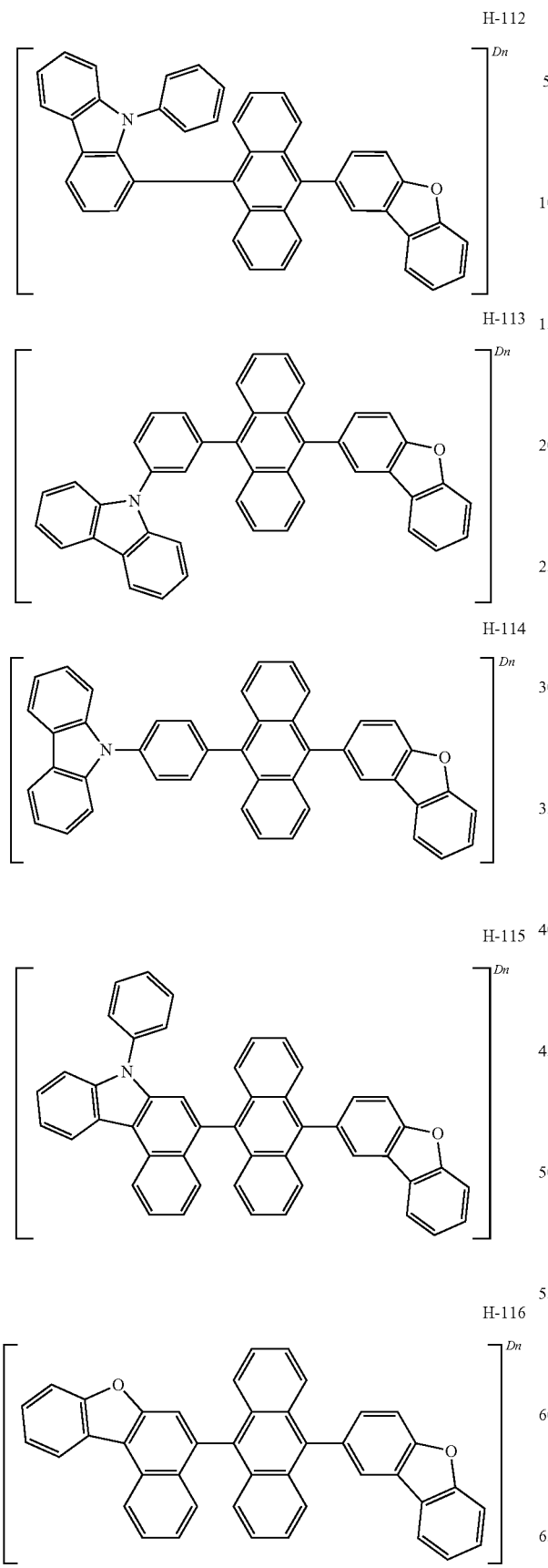
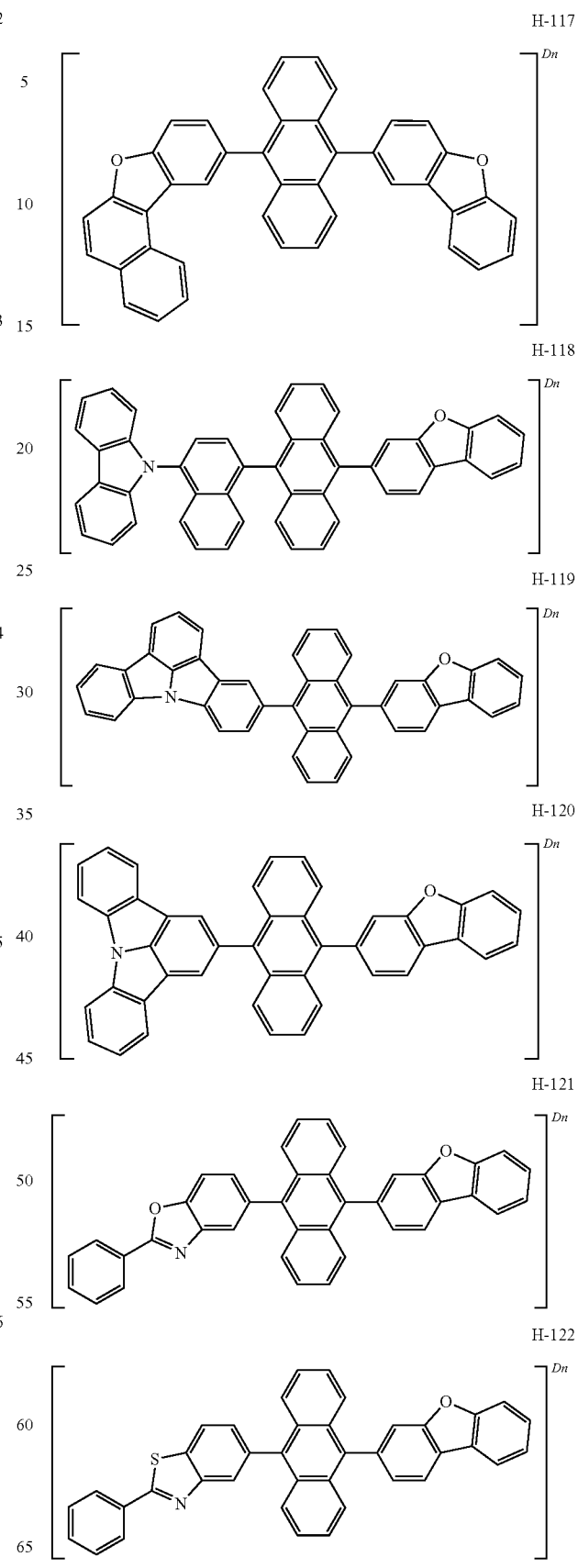

-continued
H-123
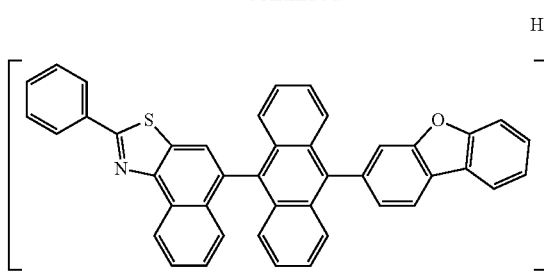
H-124
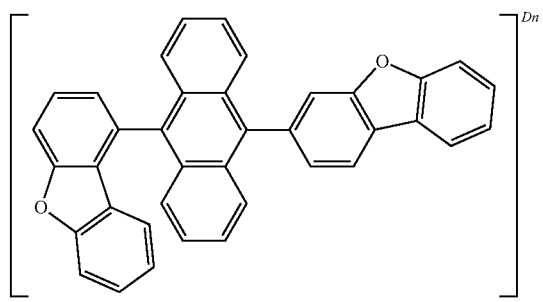
H-125
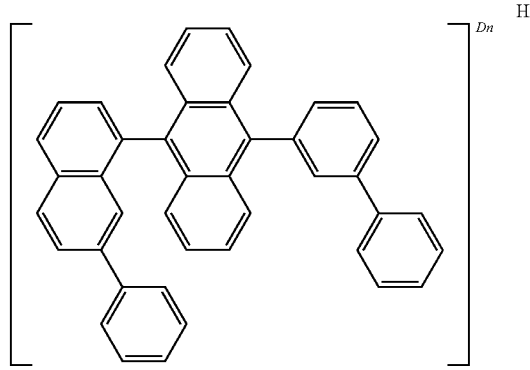
H-126
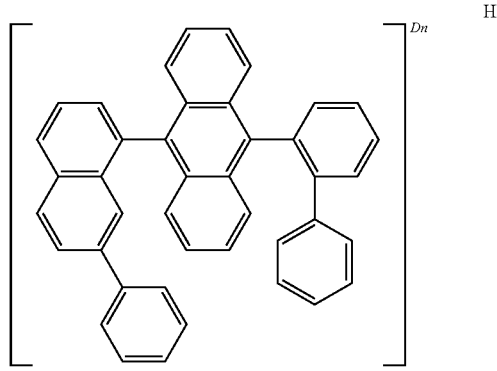
-continued
H-127
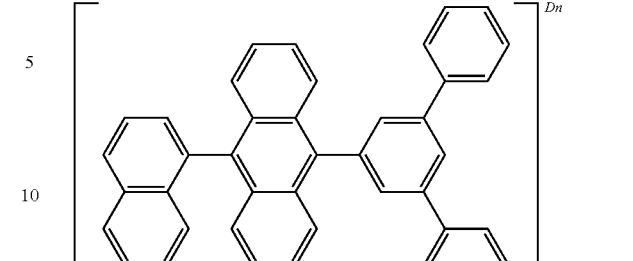
H-128
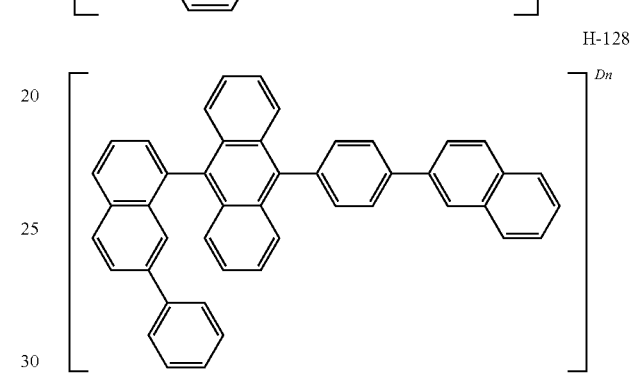
H-129
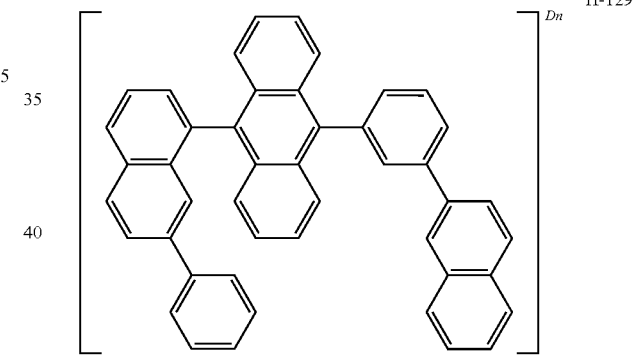
H-130
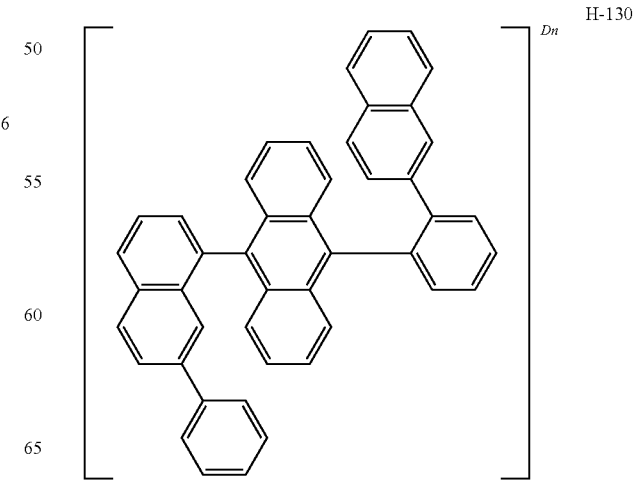

H-131
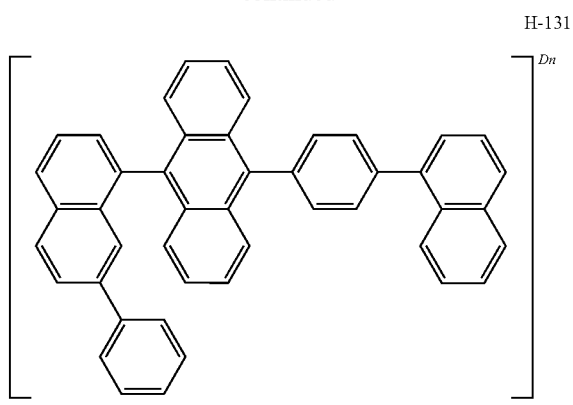
H-132
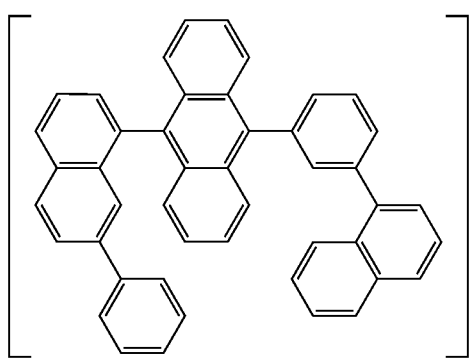
H-133
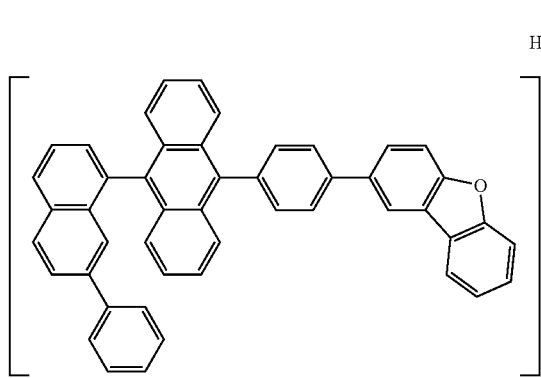
H-134
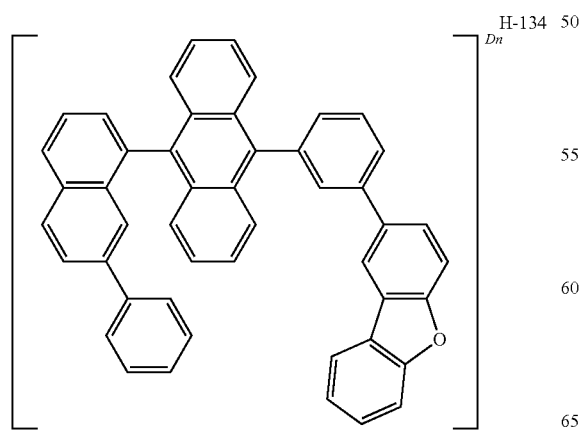
H-135
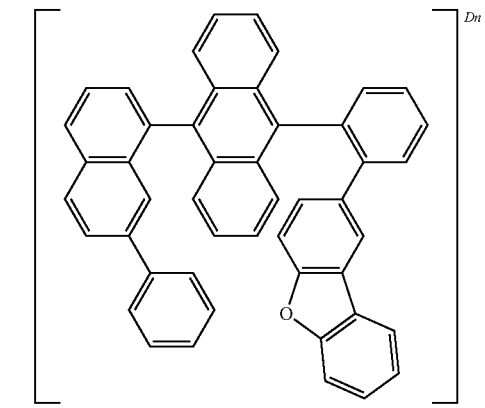
H-136
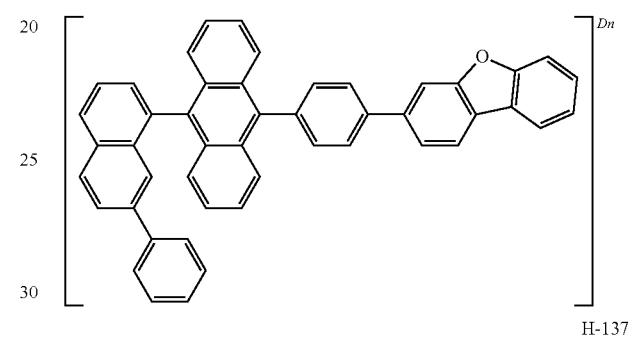
H-137
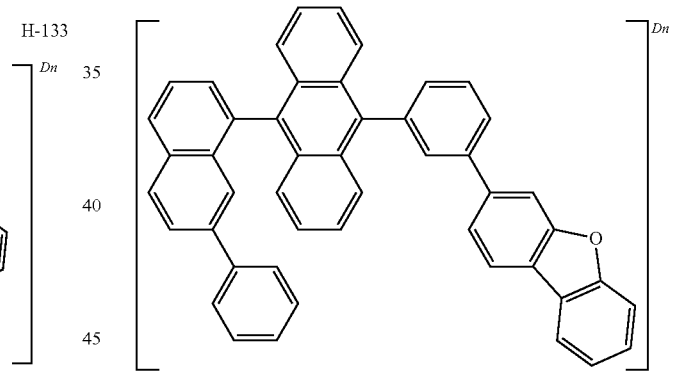
H-138
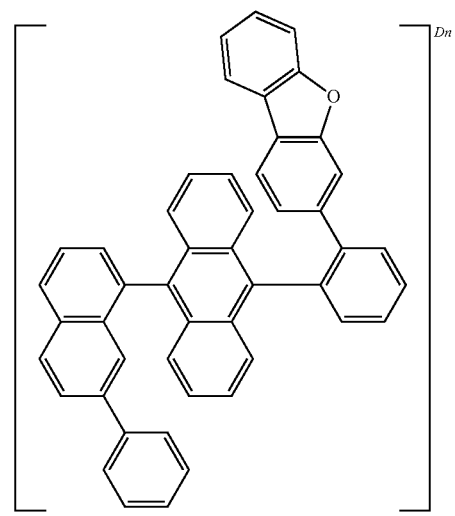

H-139
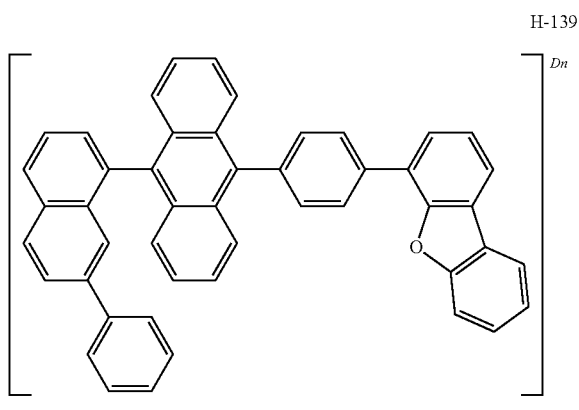
H-140
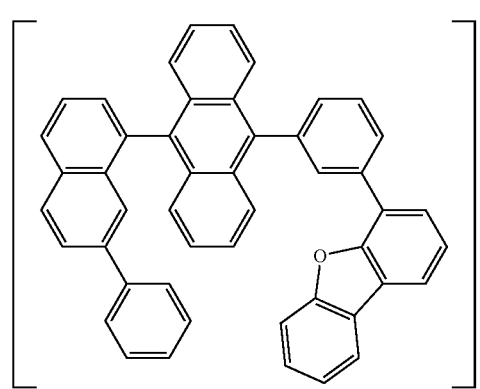
H-141
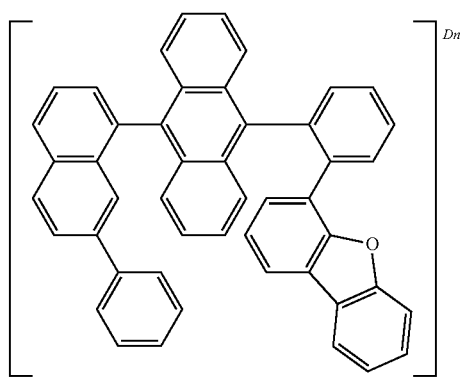
H-142
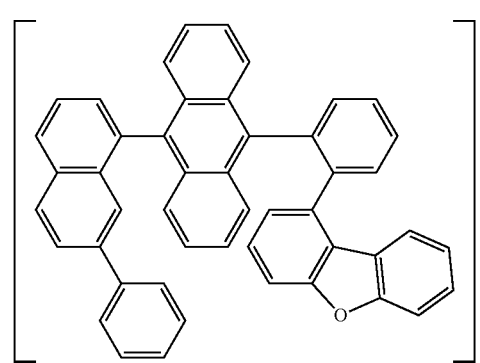
H-143
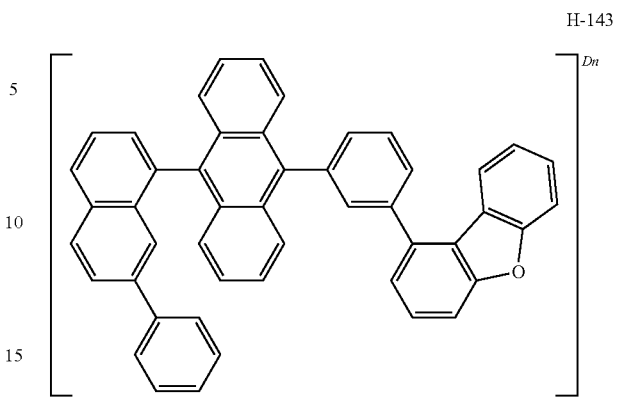
H-144
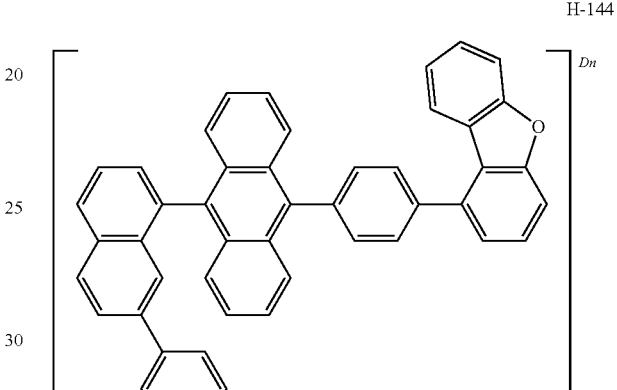
H-145
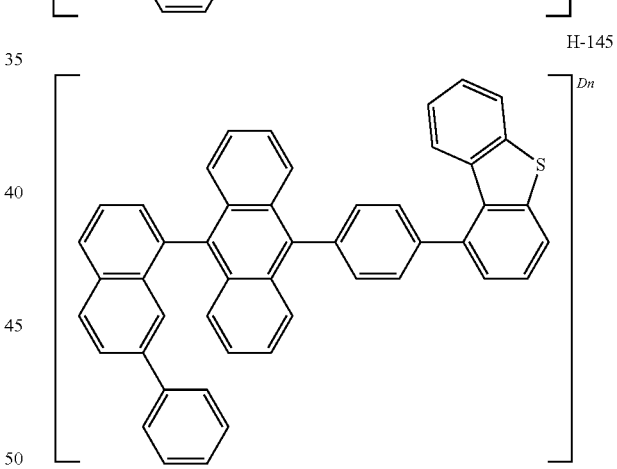
H-146
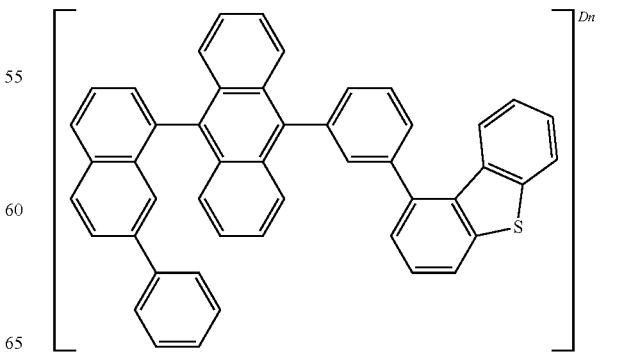

-continued
H-147
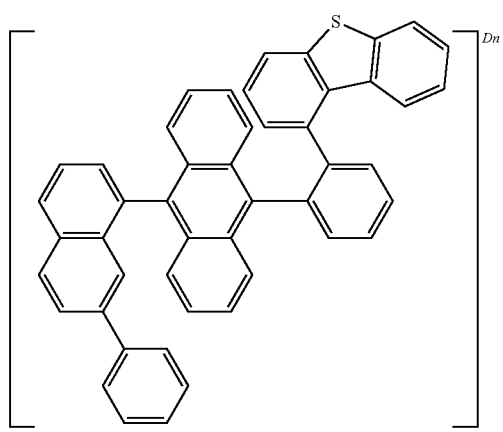
H-148
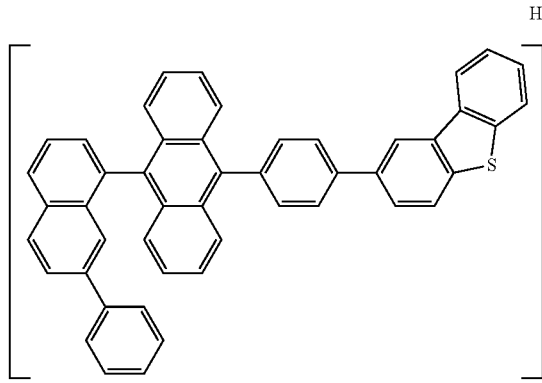
H-149
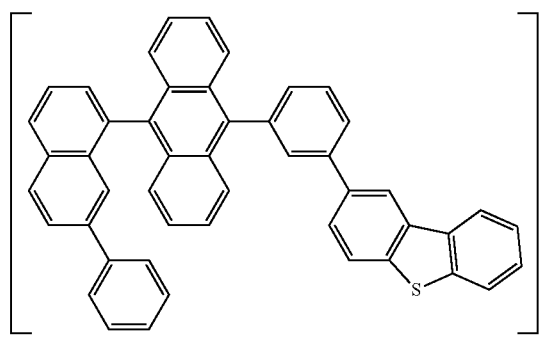
H-150
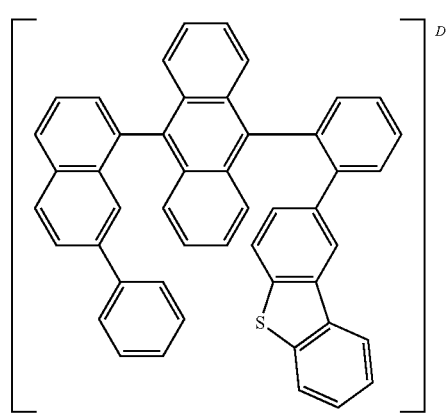
-continued
H-151
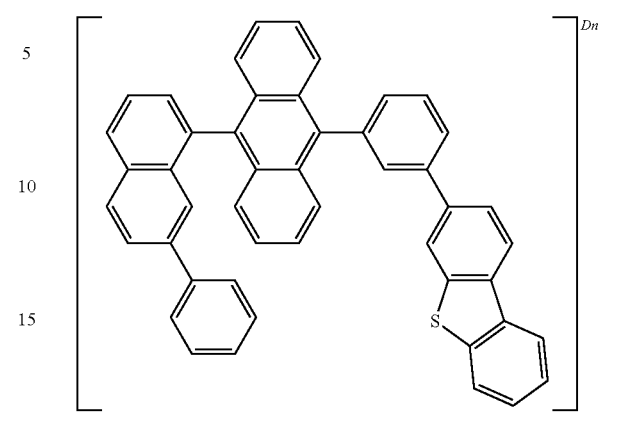
H-152
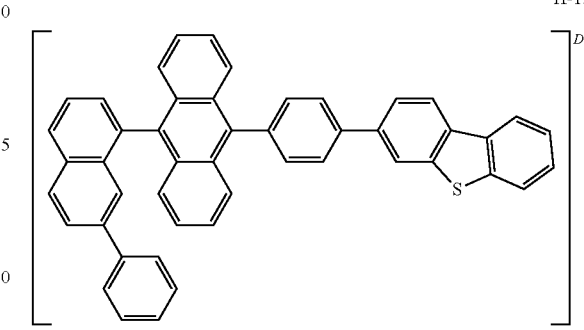
H-153
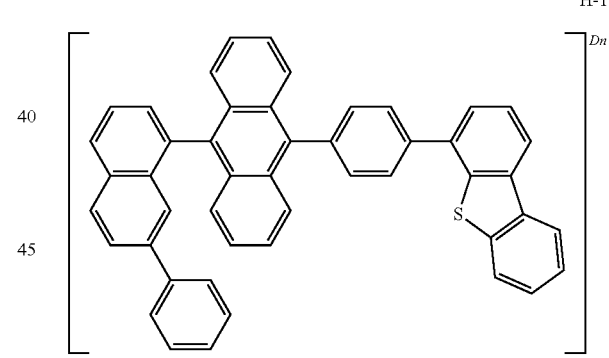
H-154
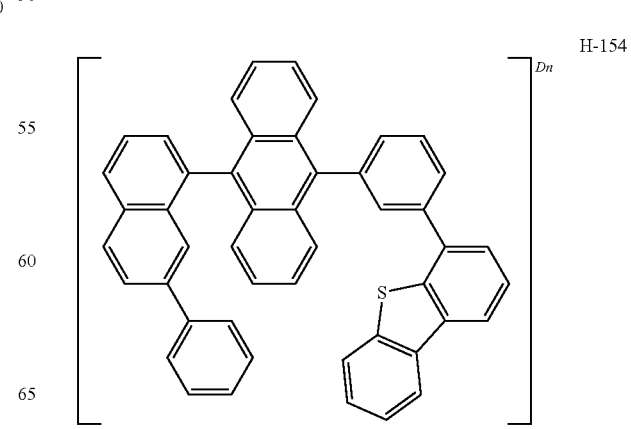

H-155
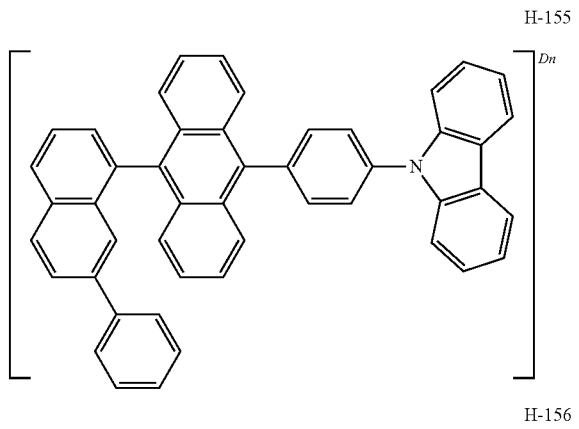
H-156
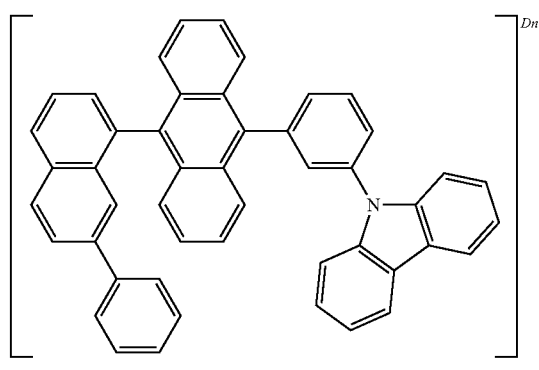
H-157
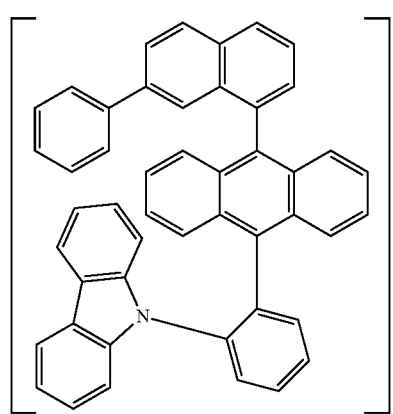
H-158
H-159
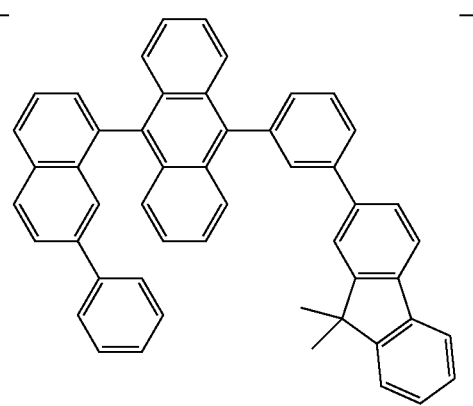
H-160
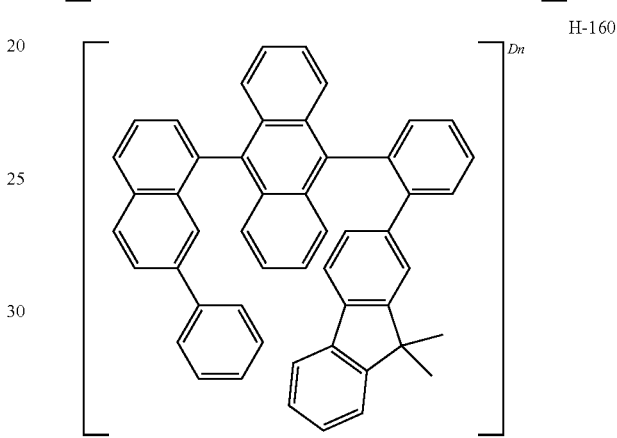
H-161
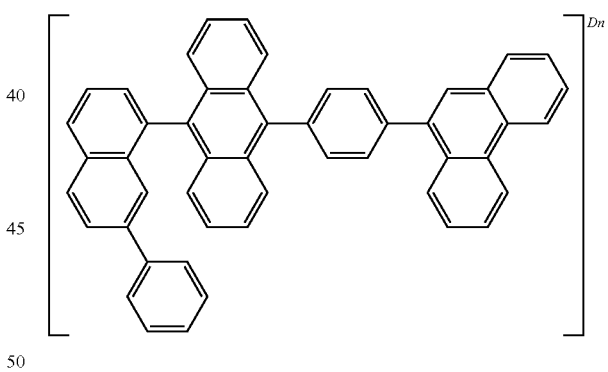
H-162
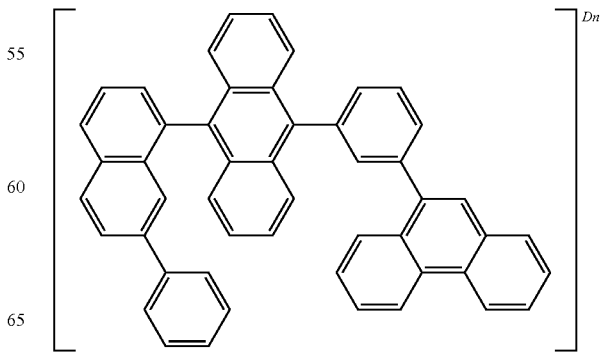

-continued
H-163
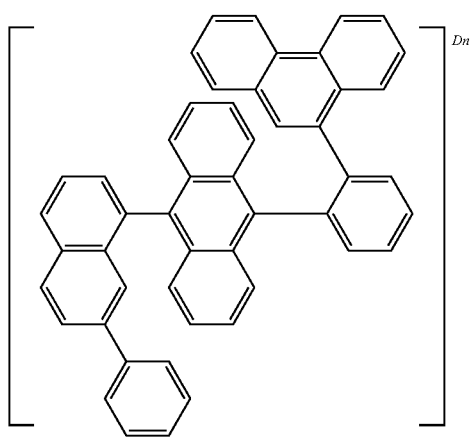
H-164
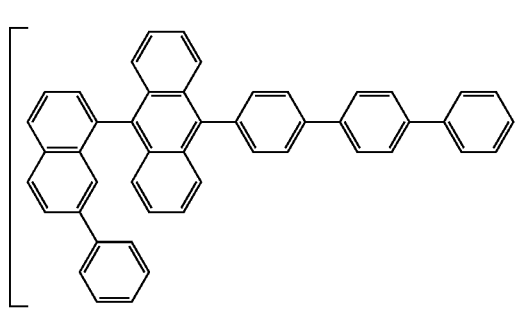
H-165
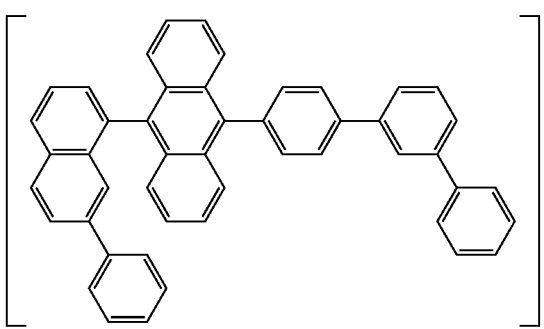
H-166
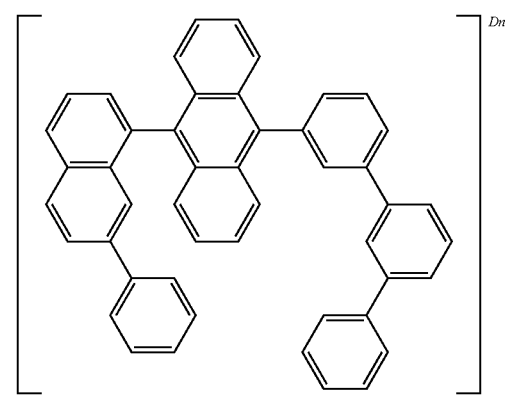
-continued
H-167
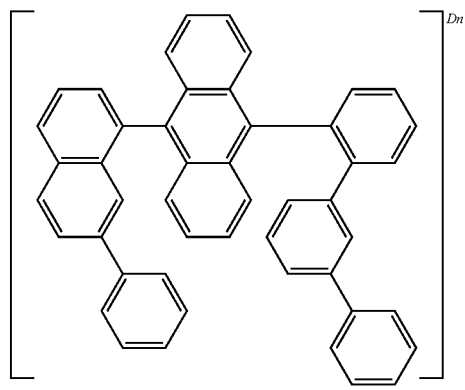
H-168
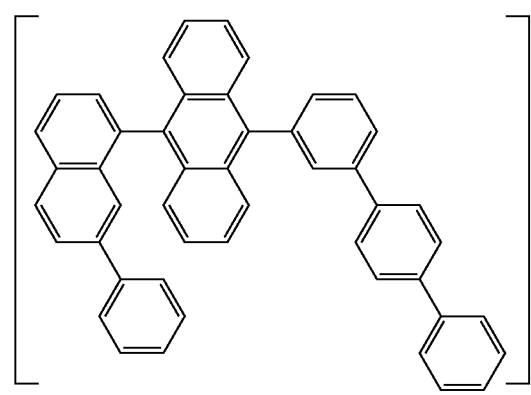
H-169
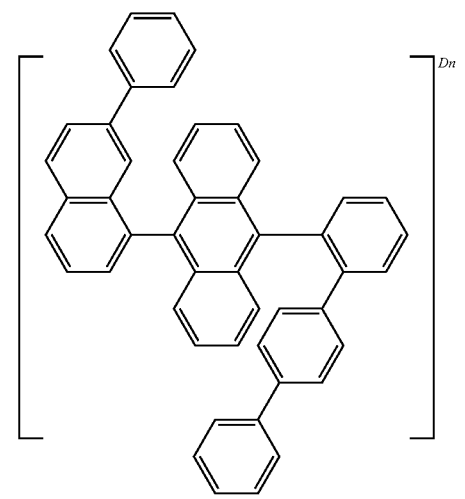
H-170
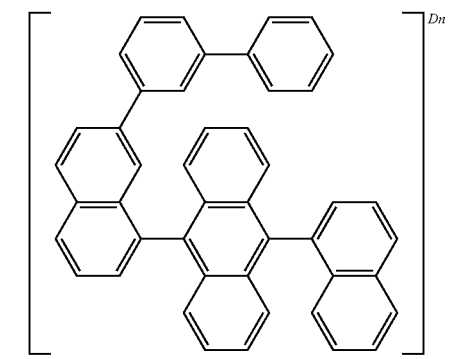

H-171
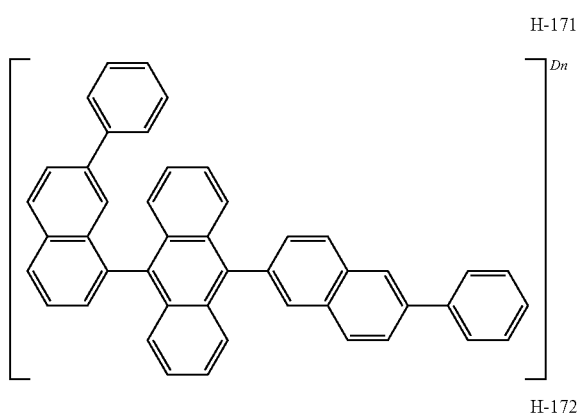
H-172
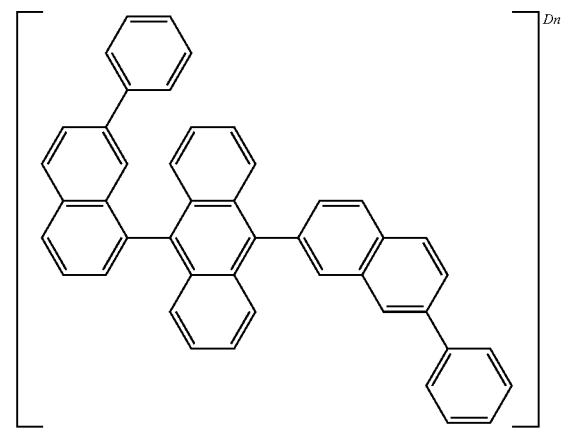
H-173
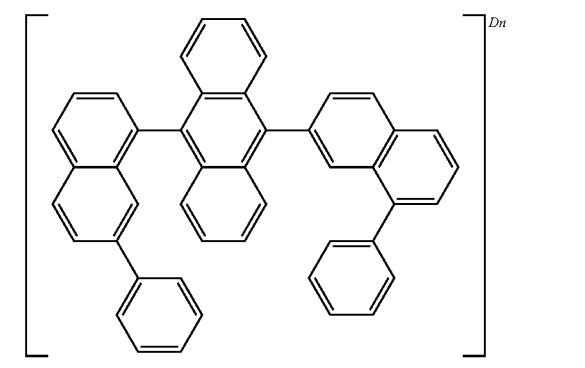
H-174
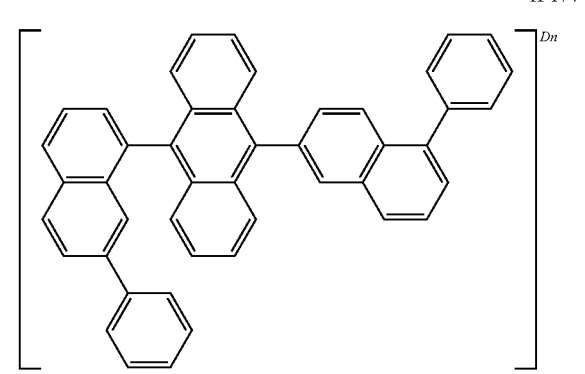
H-175
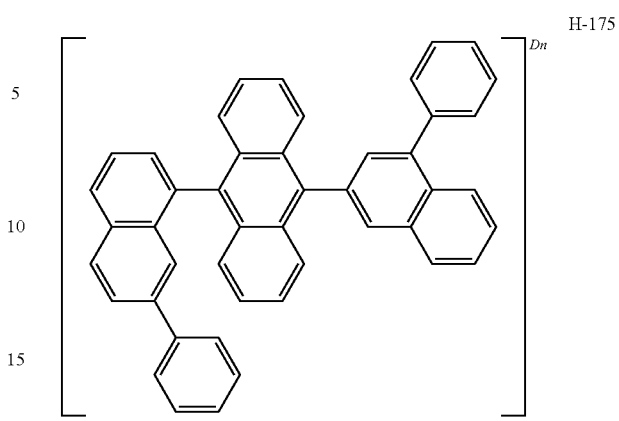
H-176
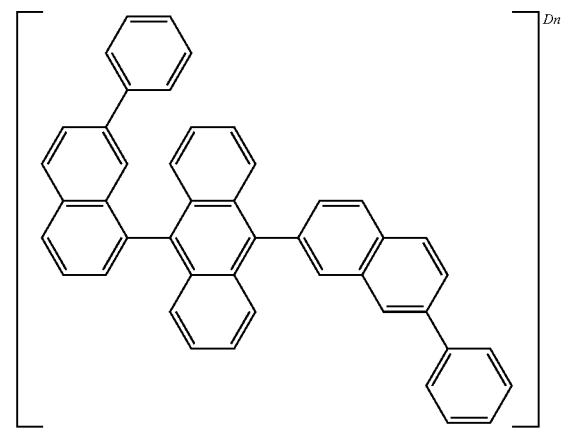
H-177
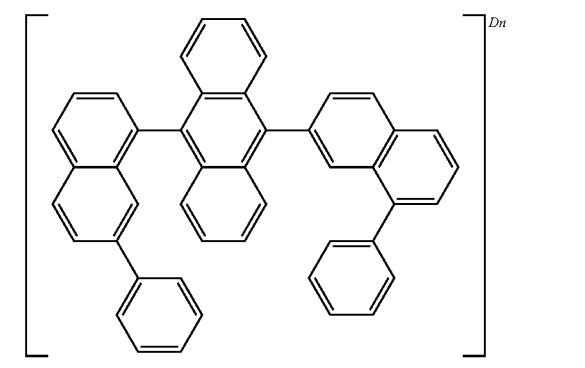
H-178
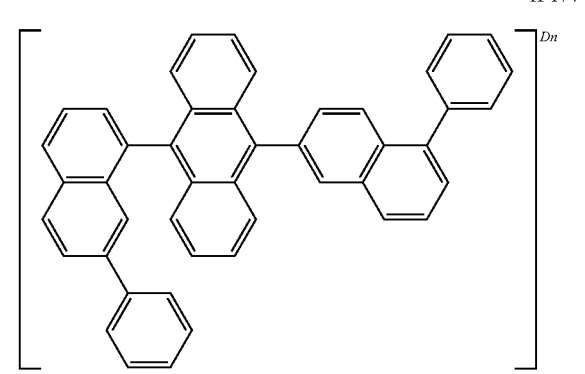

-continued
H-179
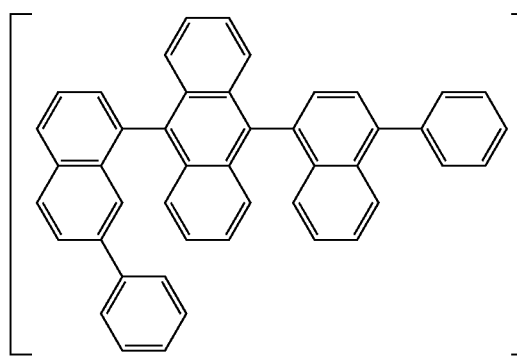
H-180
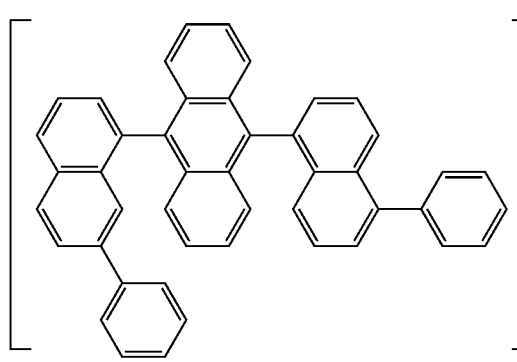
H-181
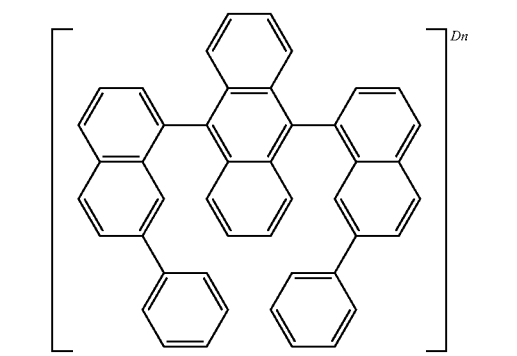
H-182
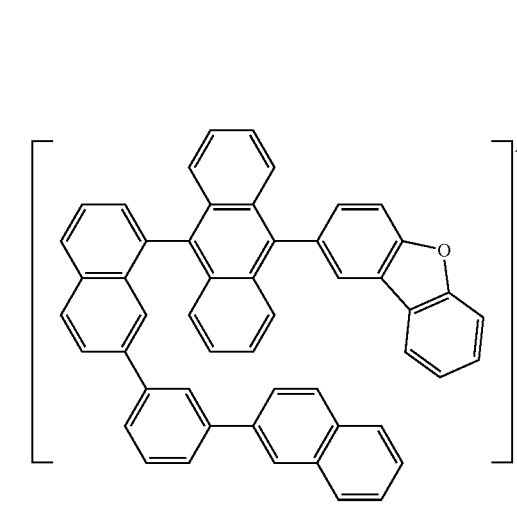
-continued
H-183
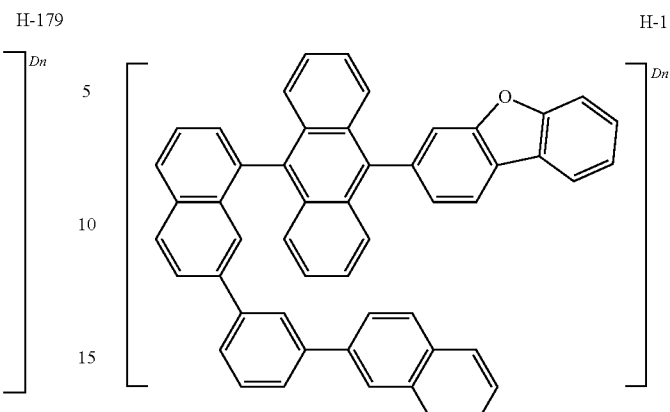
H-184
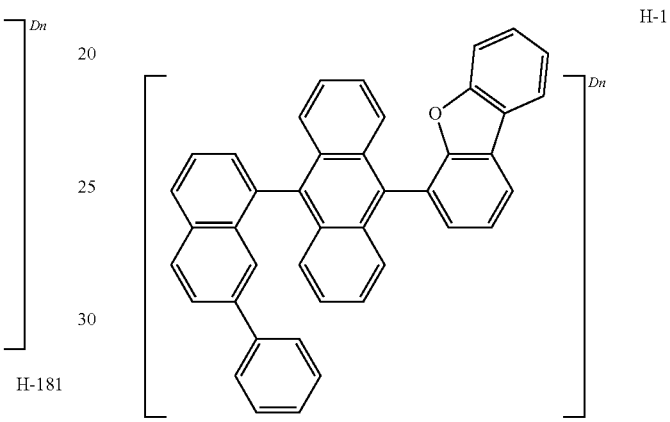
H-185
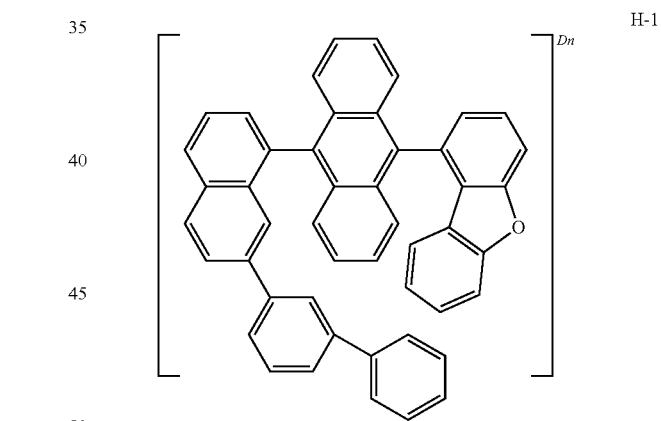
H-186
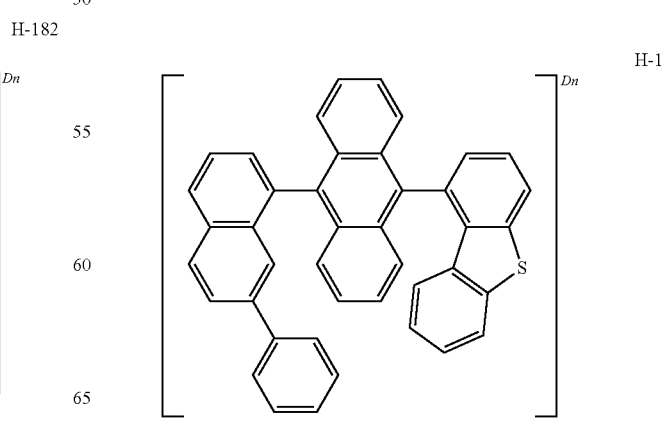

-continued
H-187
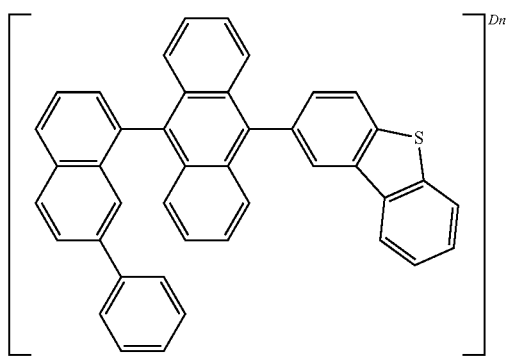
H-188
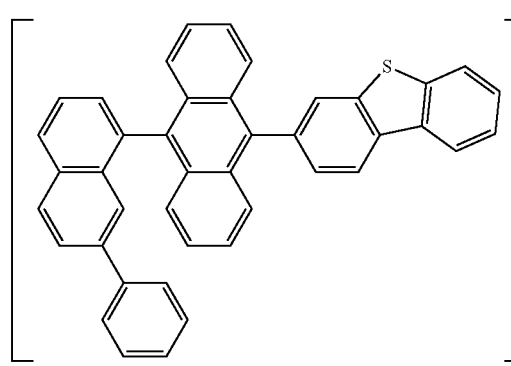
H-189
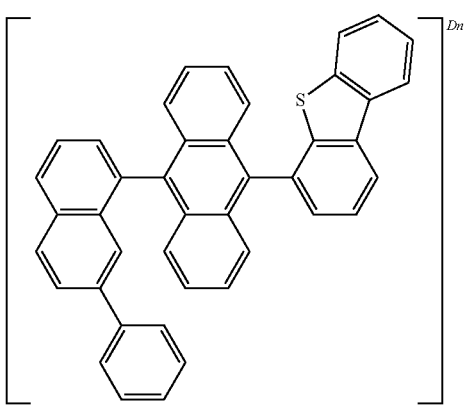
H-190
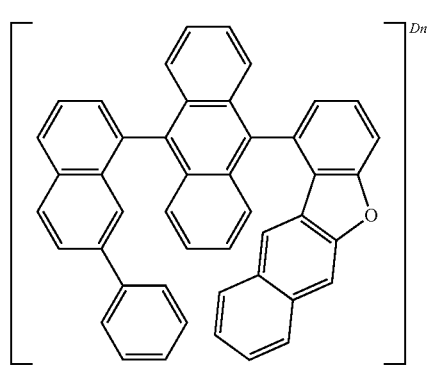
-continued
H-191
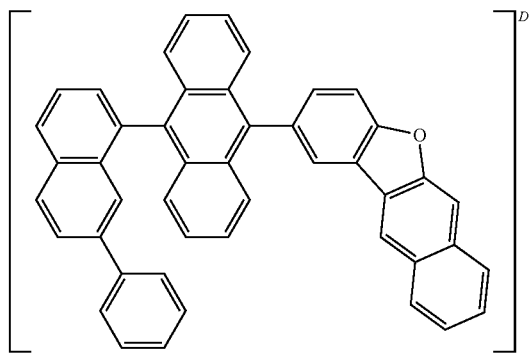
H-192
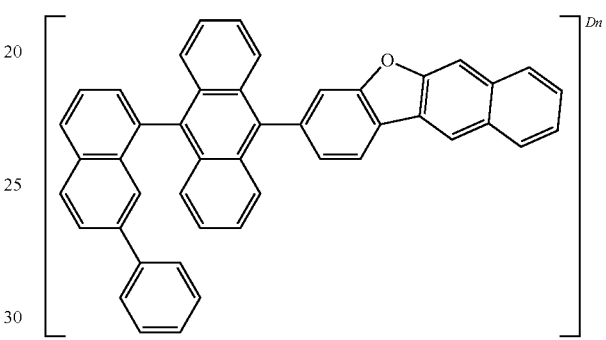
H-193
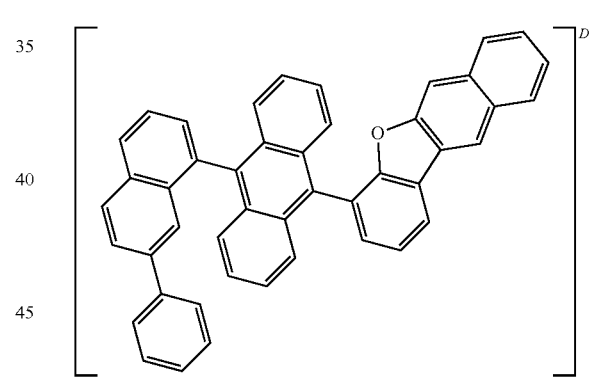
H-194
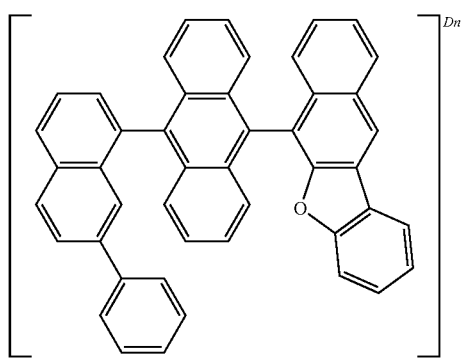

H-195
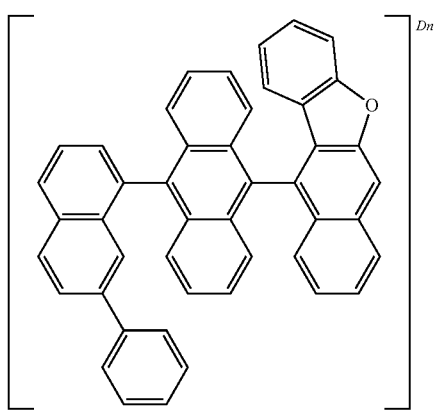
H-196
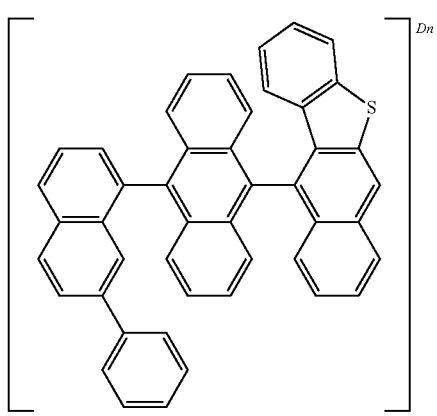
H-197
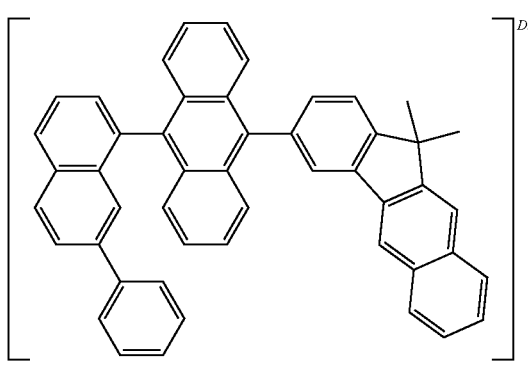
H-198
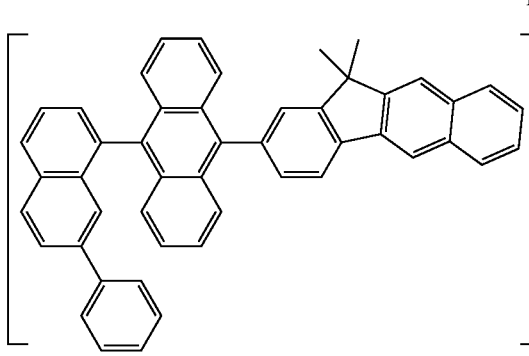
H-199
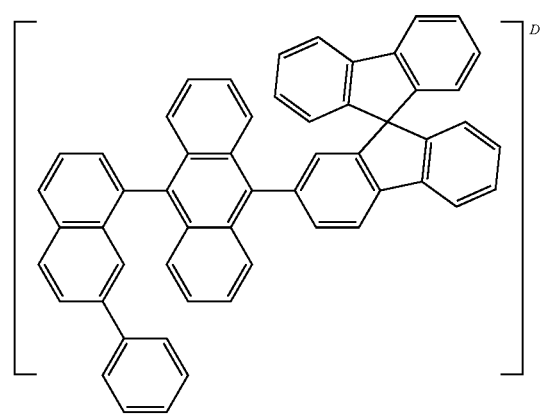
H-200
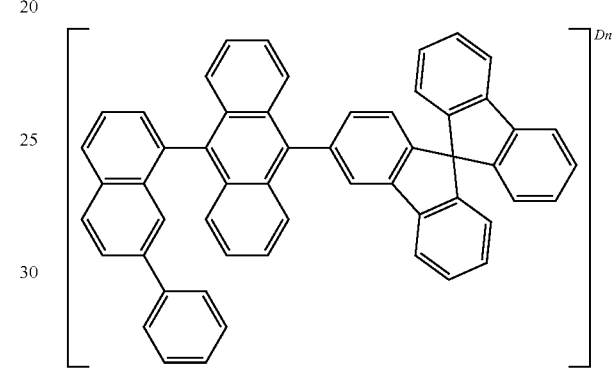
H-201
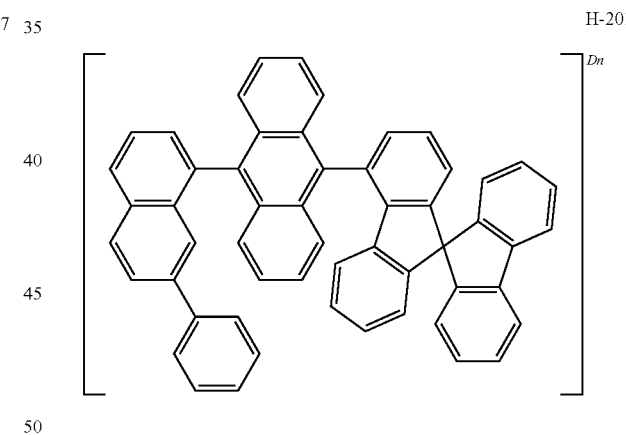
H-202
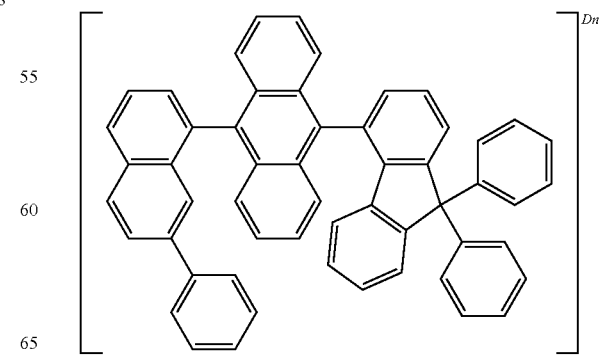

-continued
H-203
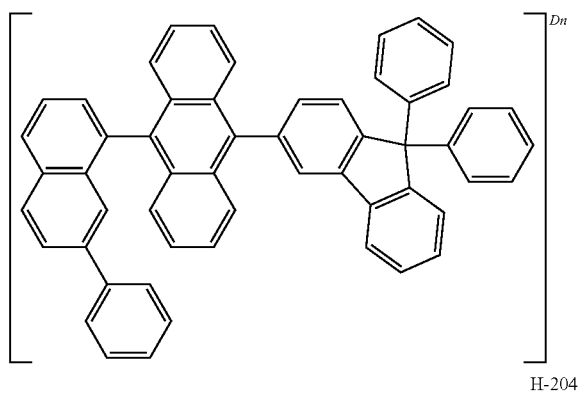
H-204
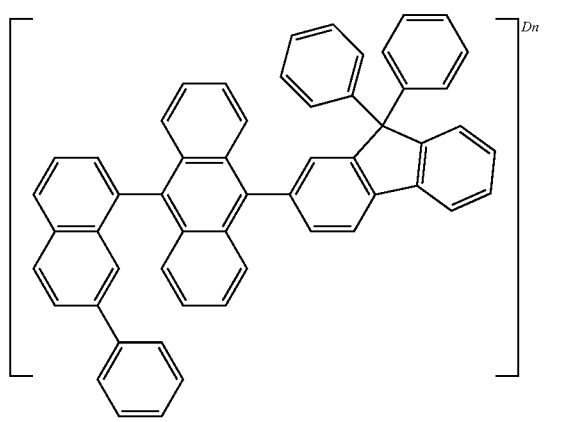
H-205
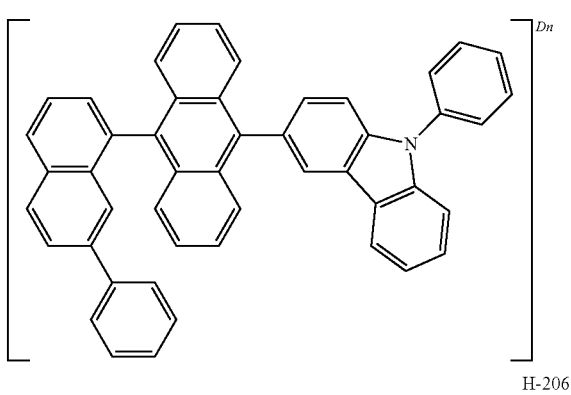
H-206
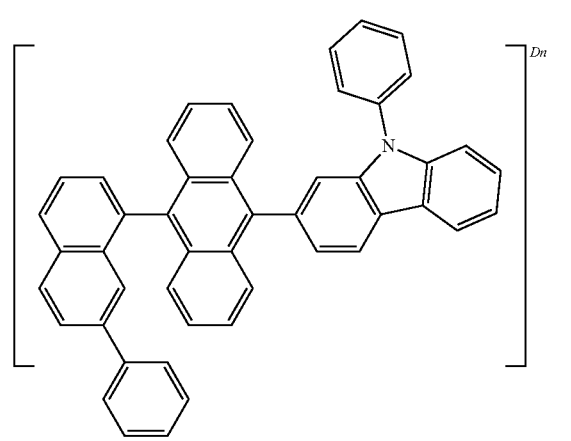
-continued
H-207
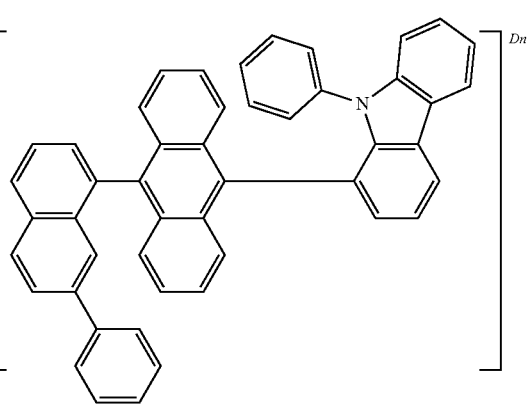
H-208
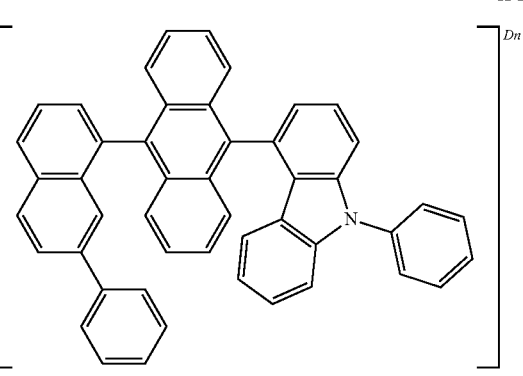
H-209
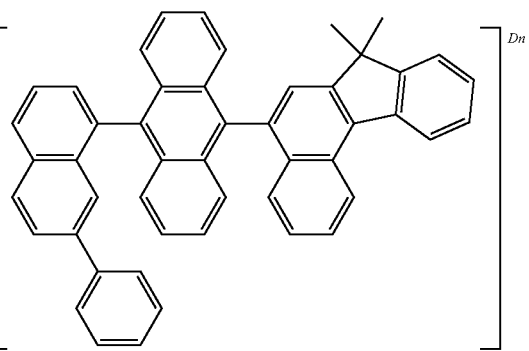
H-210
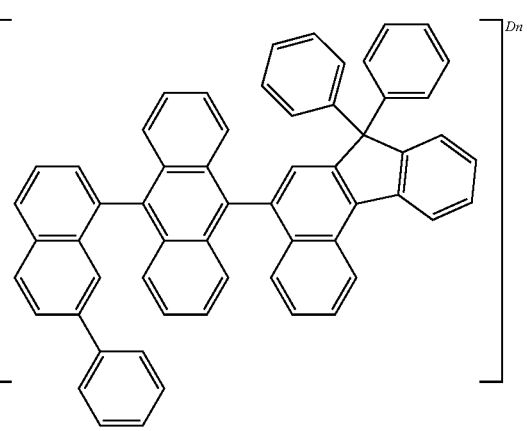

H-211
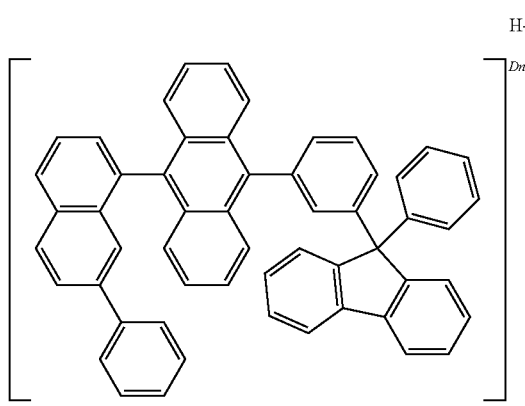
H-212
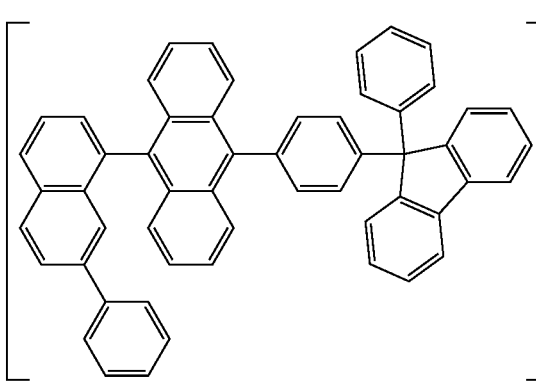
H-213
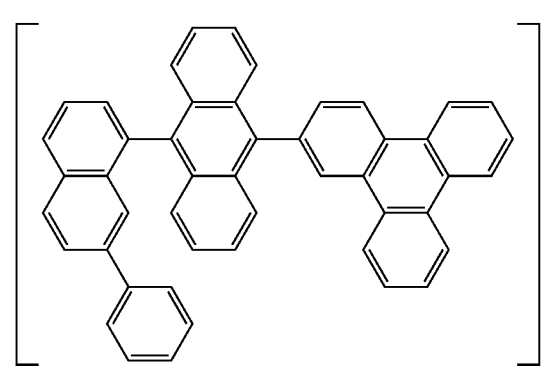
H-214
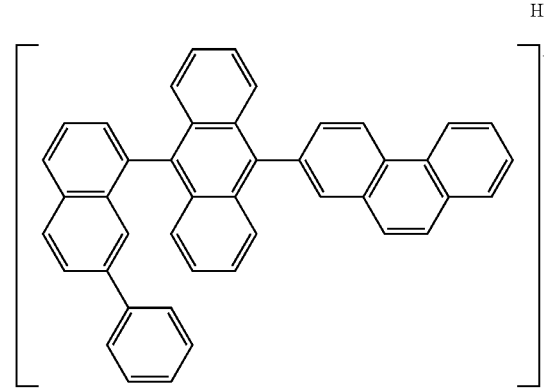
H-215
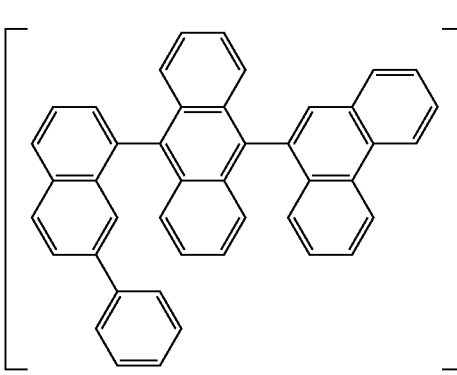
H-216
H-217
H-218
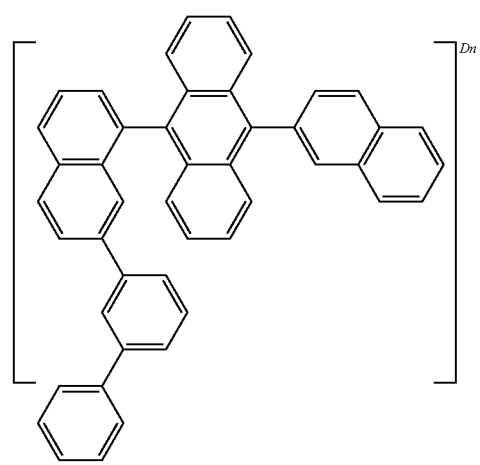

-continued
H-219
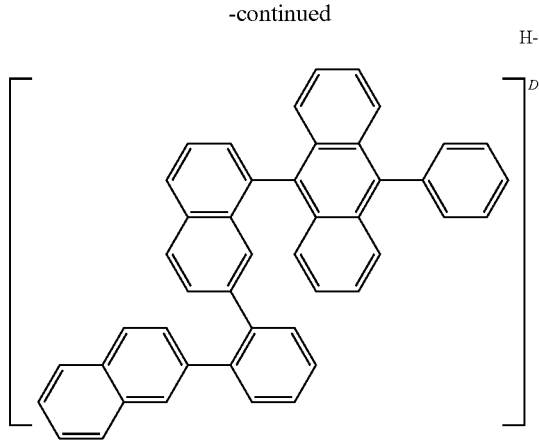
H-220
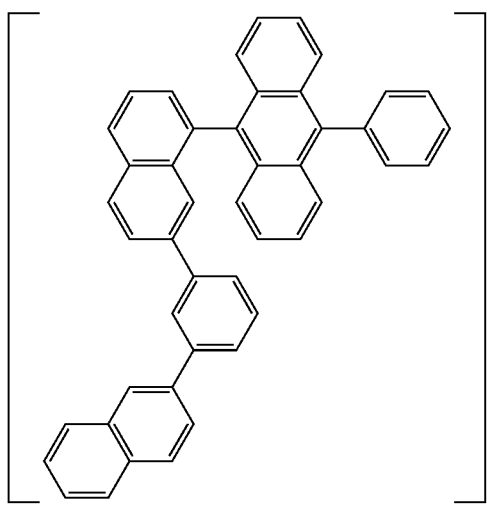
H-221
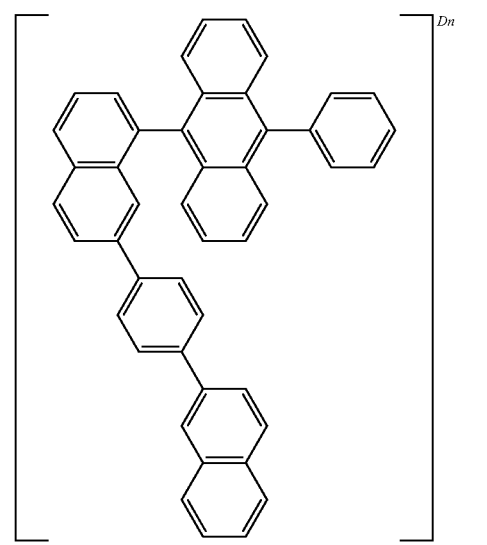
-continued
H-222
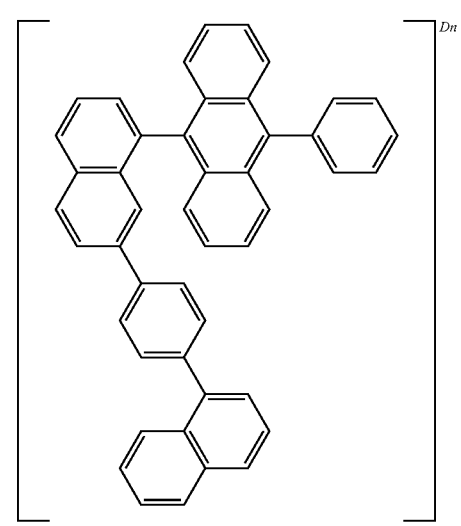
H-223
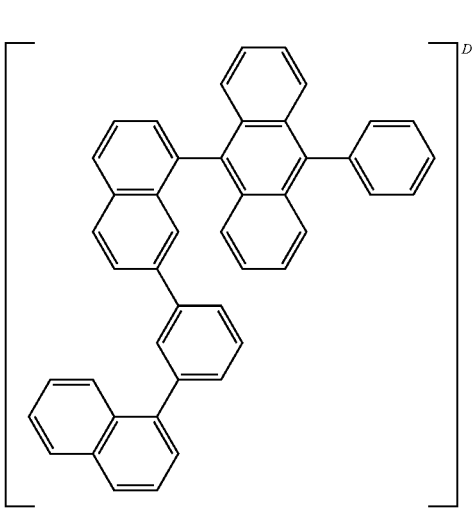
H-224
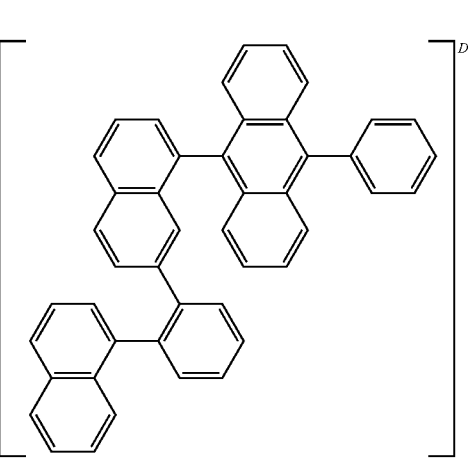

H-225
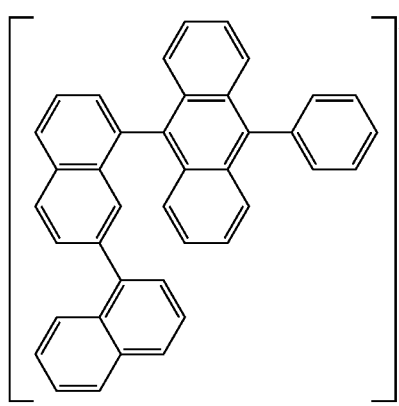
H-228
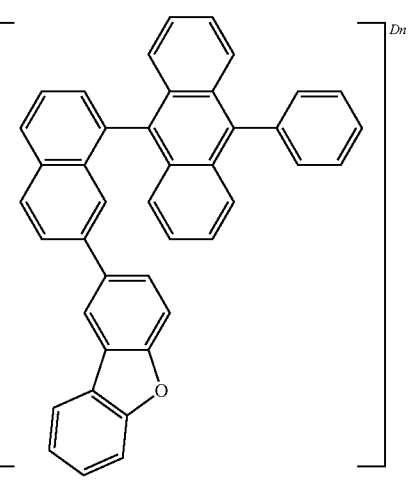
H-226
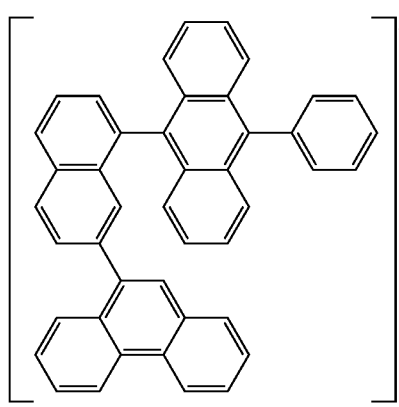
H-229
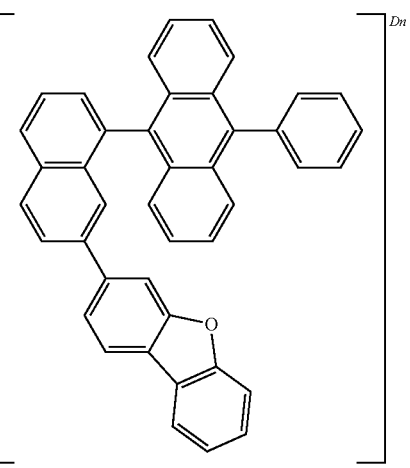
H-227
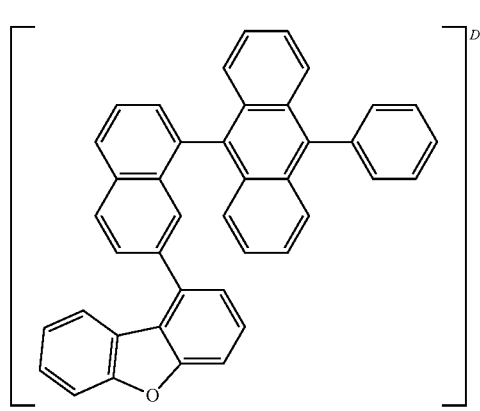
H-230
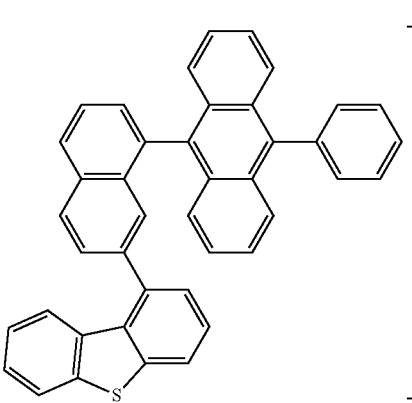

H-231
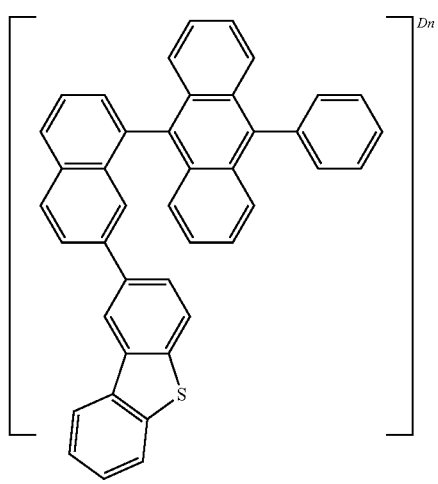
H-235
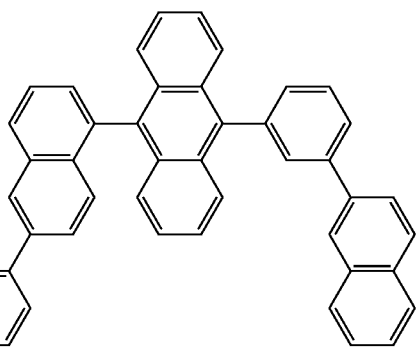
H-232
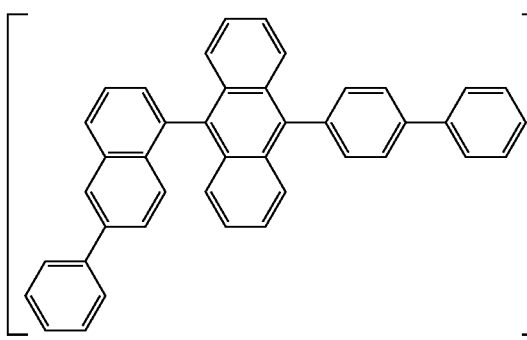
H-236
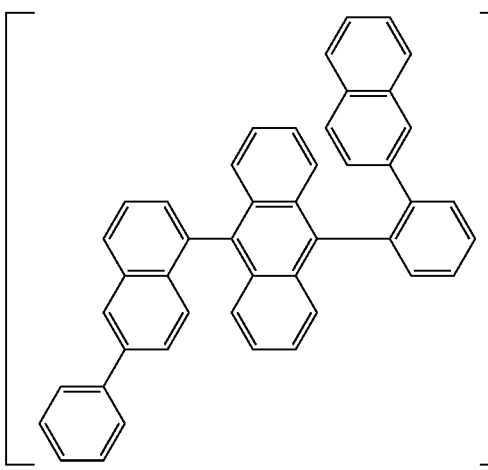
H-233
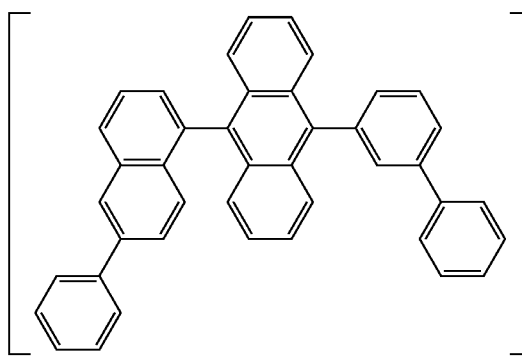
H-237
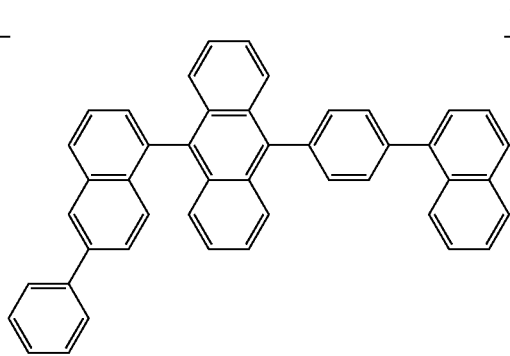
H-234
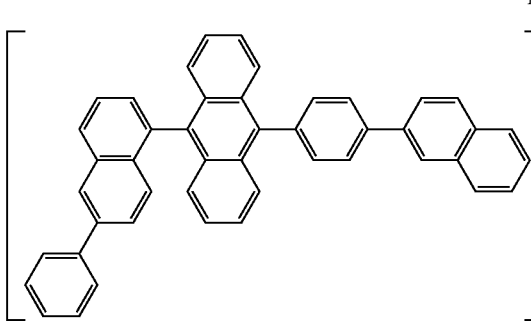
H-238
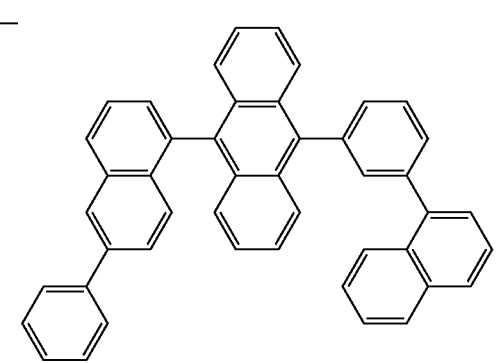

H-239
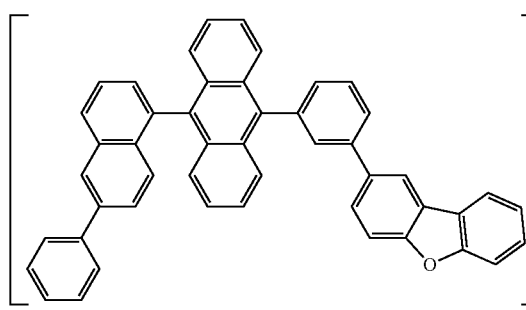
H-240
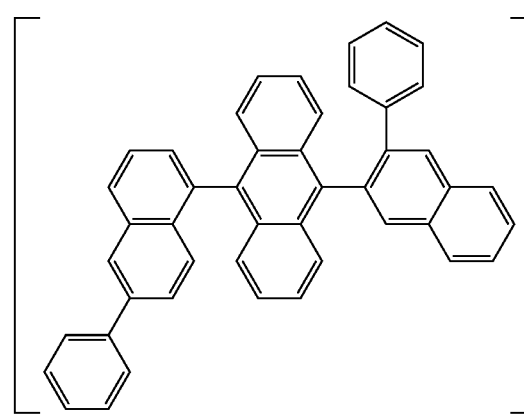
H-241
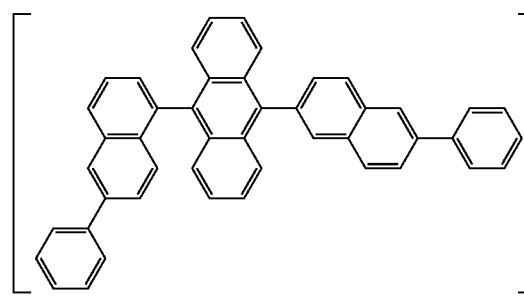
H-242
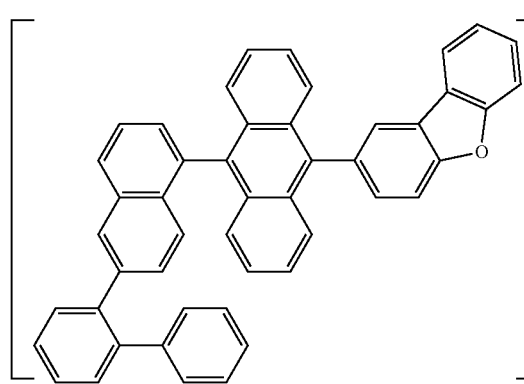
H-243
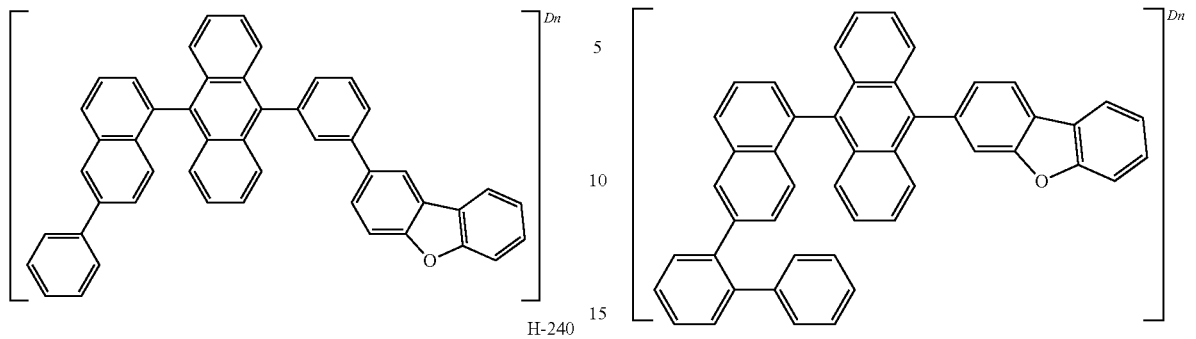
H-244
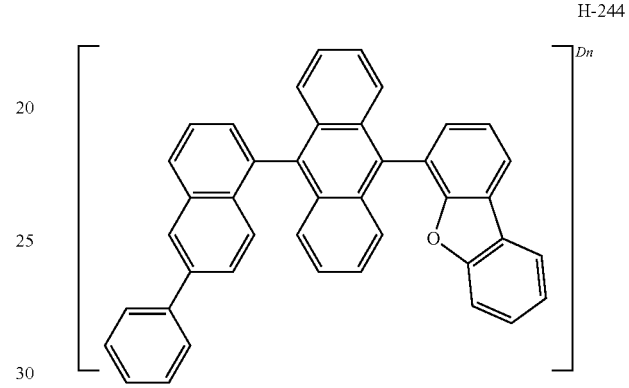
H-245
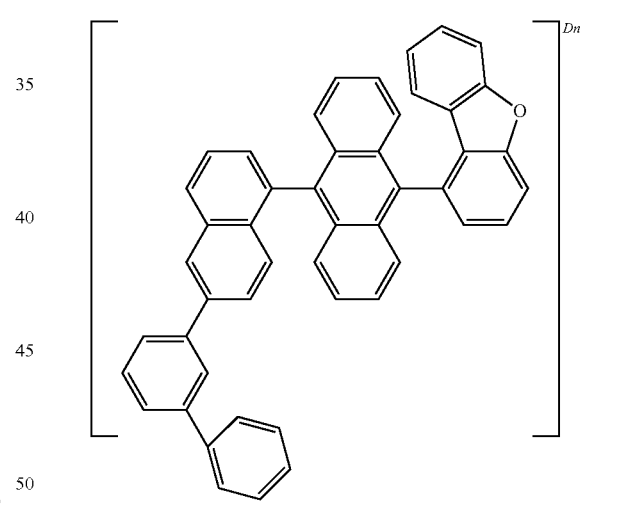
H-246

-continued
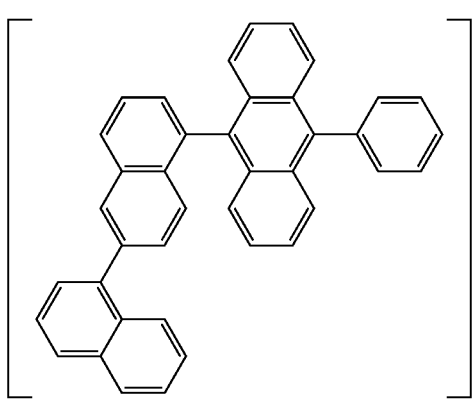
H-247
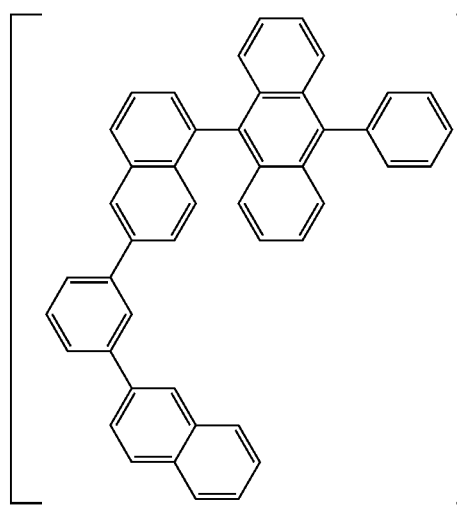
H-250
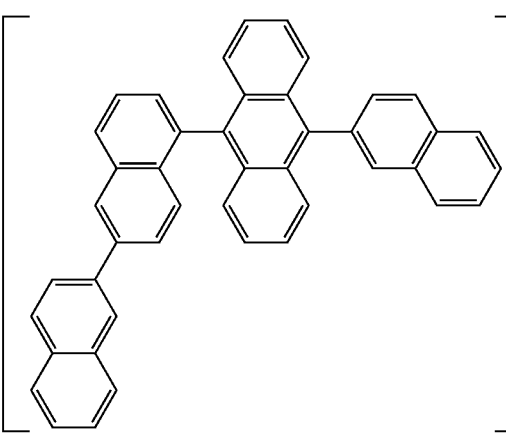
H-248
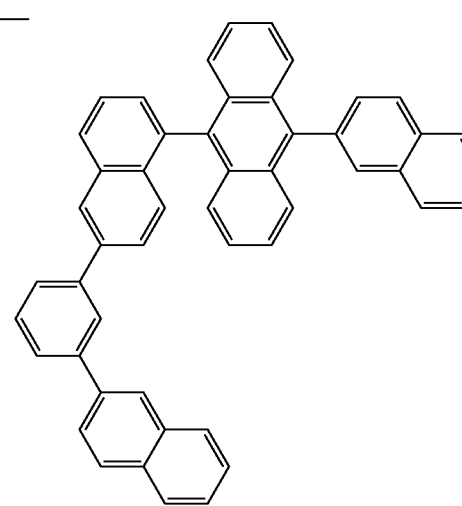
H-251
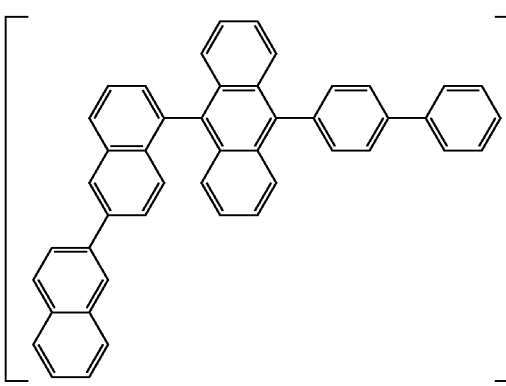
H-249
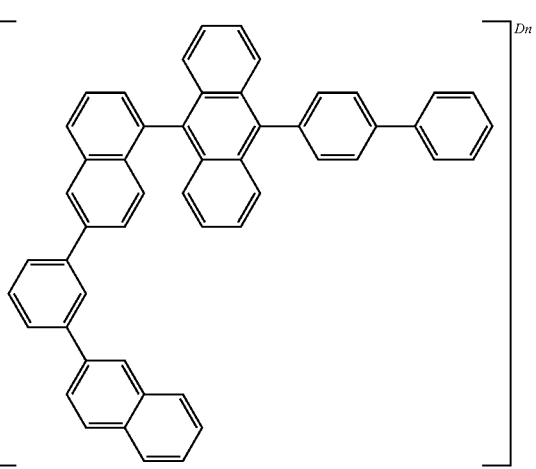
H-252

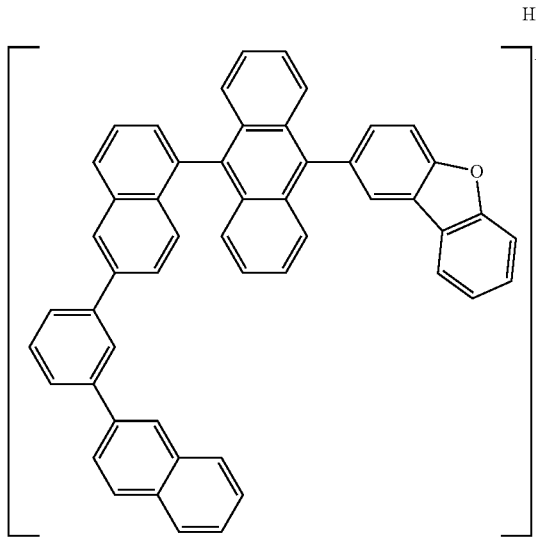
H-253
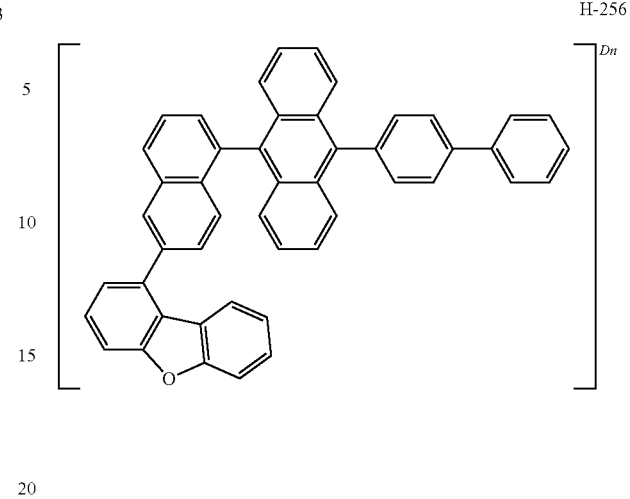
H-256
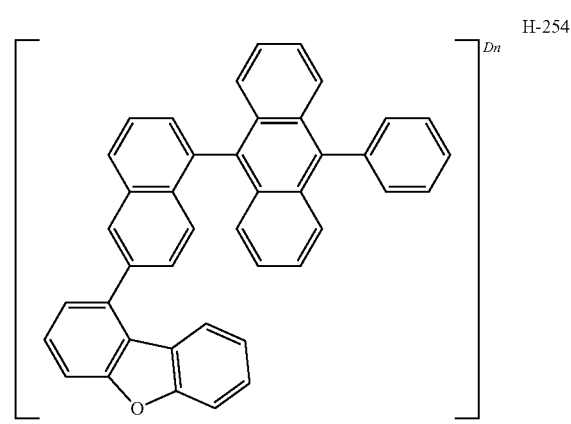
H-254
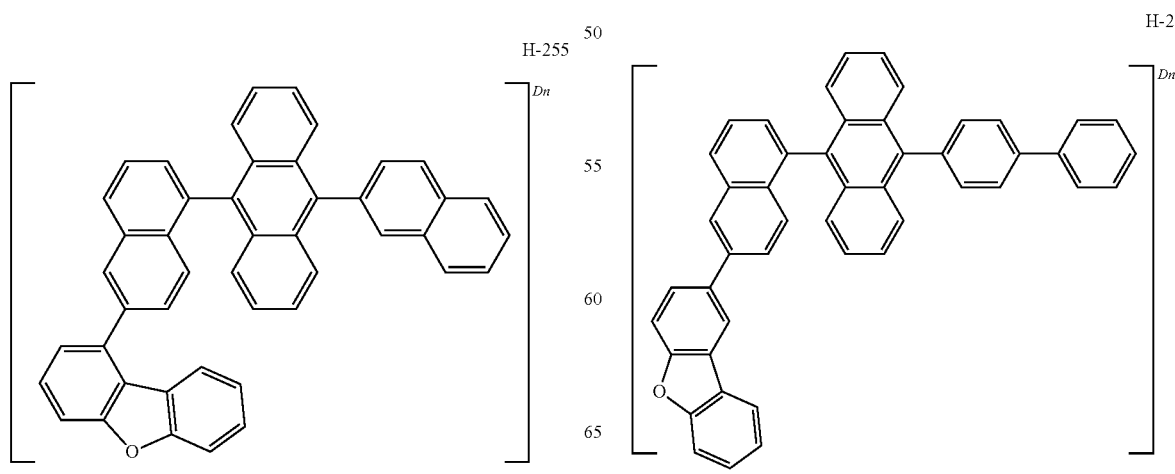
H-255
H-257
H-258

H-259
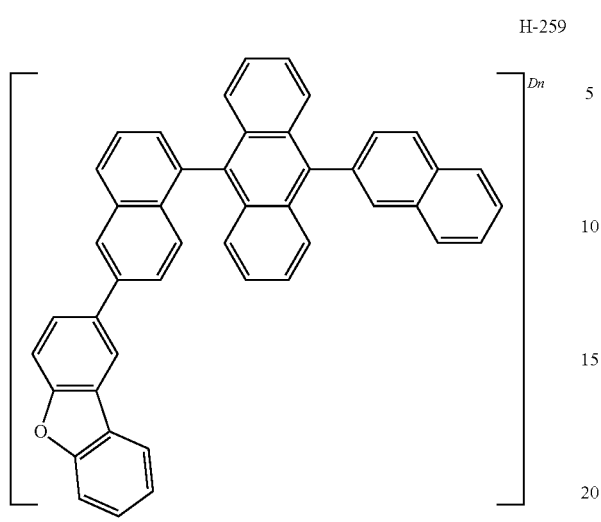
and
H-260
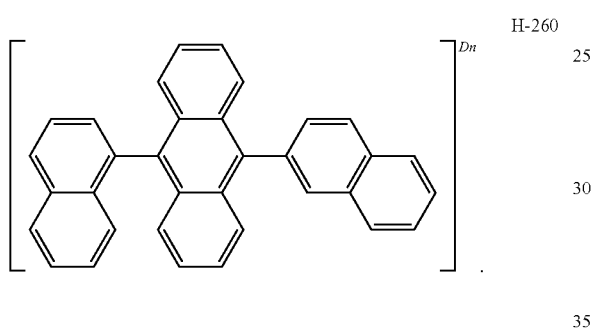
10. The plurality of light-emitting materials according to claim 1, wherein the compound represented by formula 2 is selected from the group consisting of the following compounds:
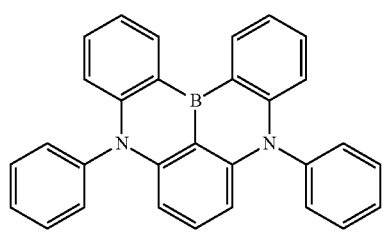
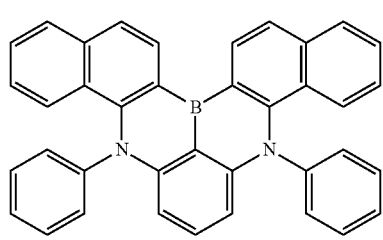
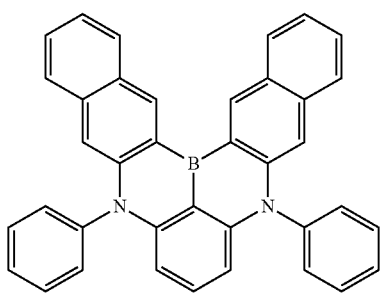
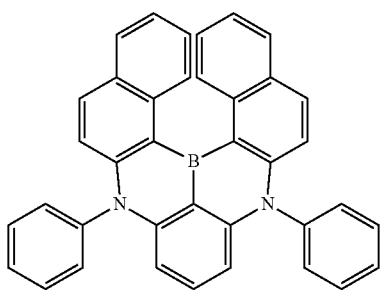
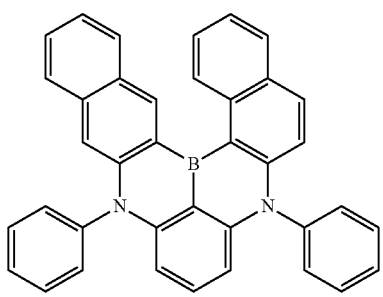
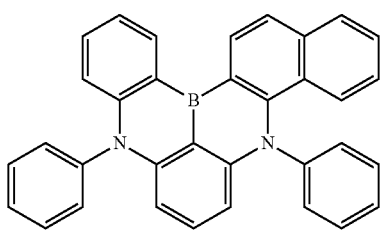
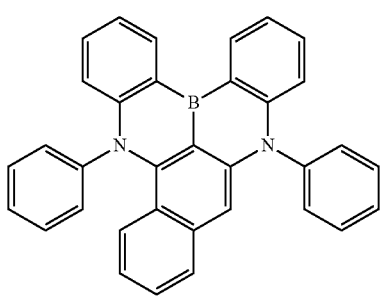
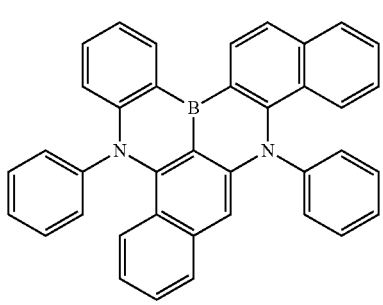

271
-continued
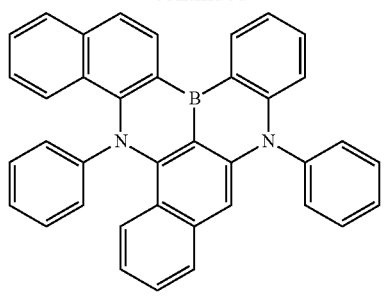
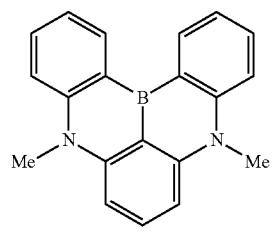
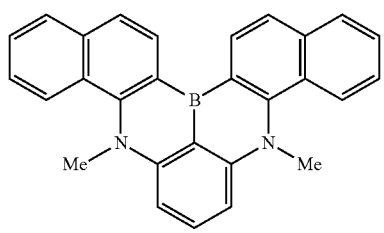
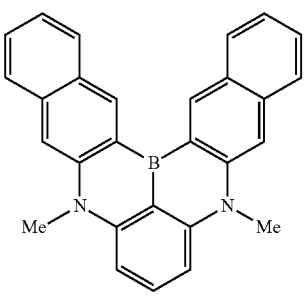
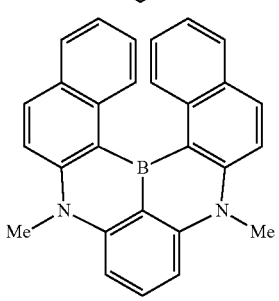
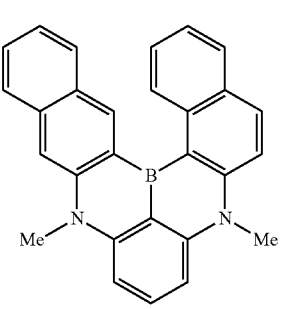
272
-continued
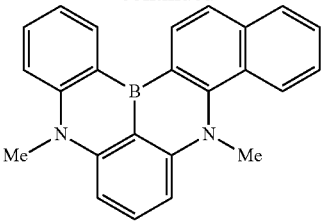
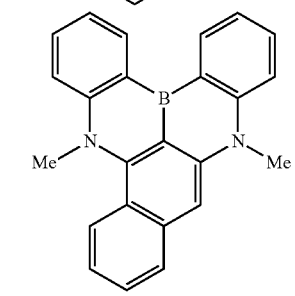
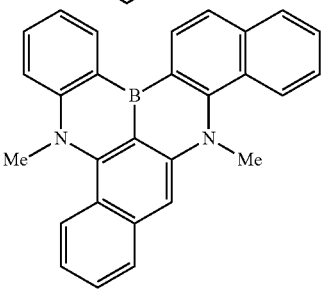
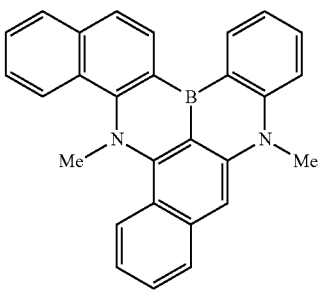
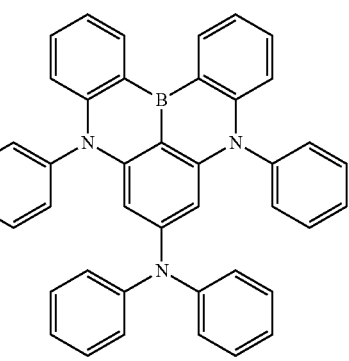

273
-continued
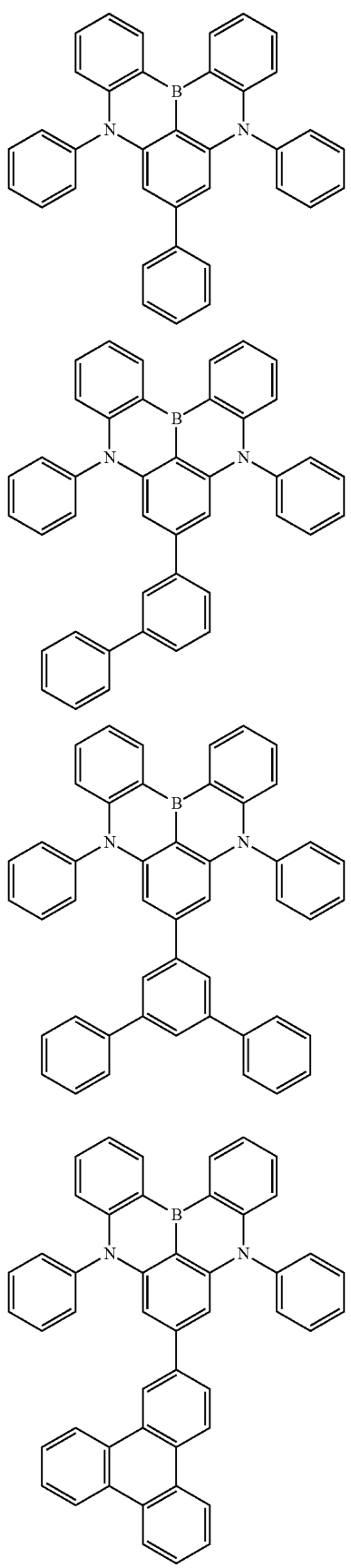
274
-continued
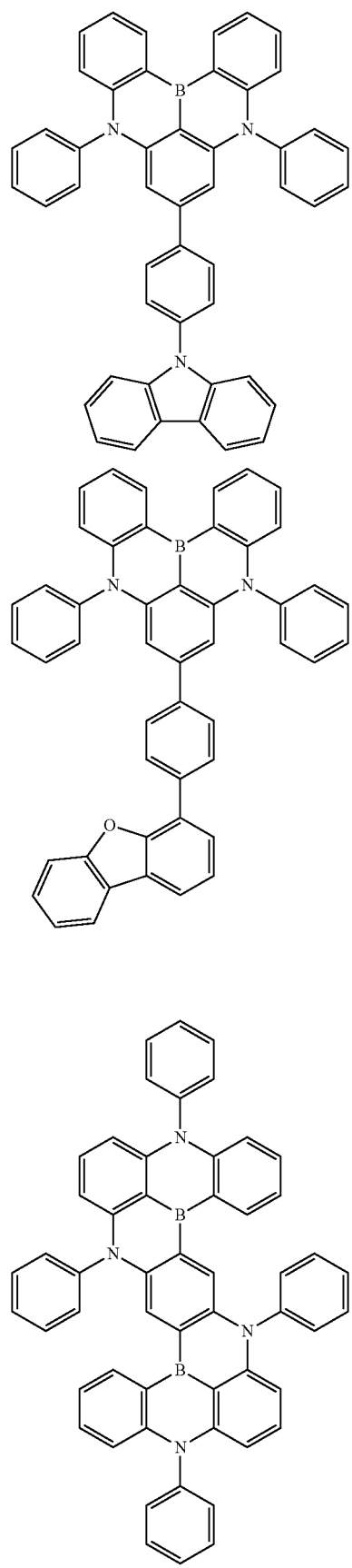

275
-continued
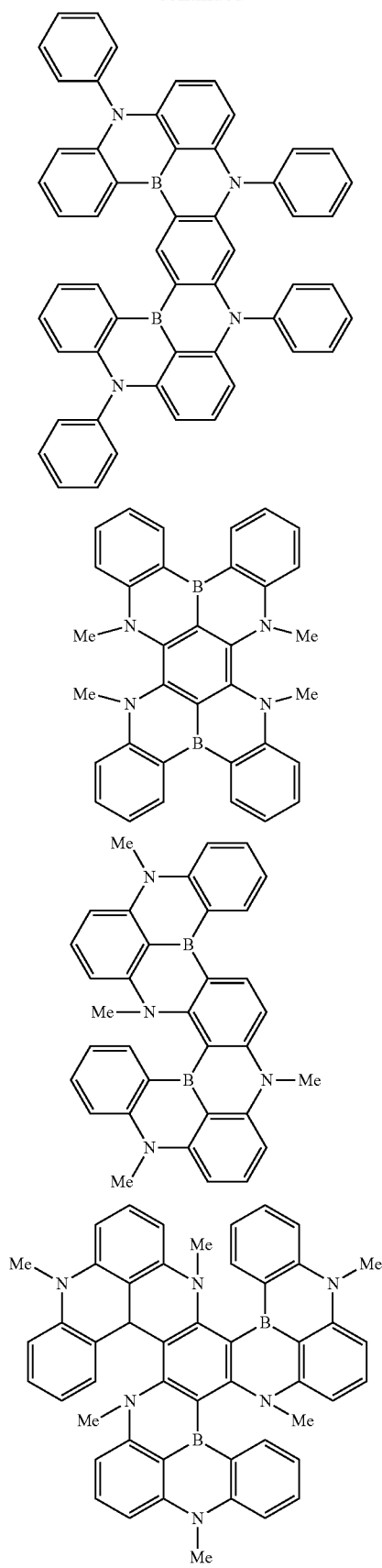
276
-continued
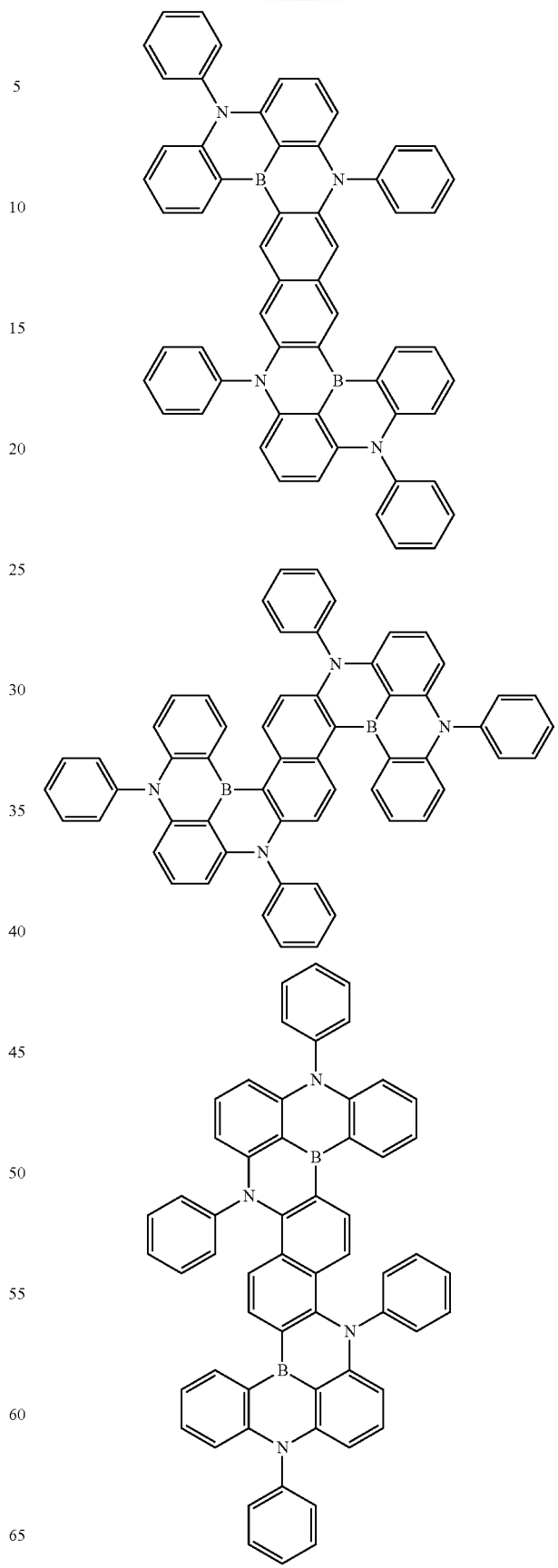

277
-continued
278
-continued
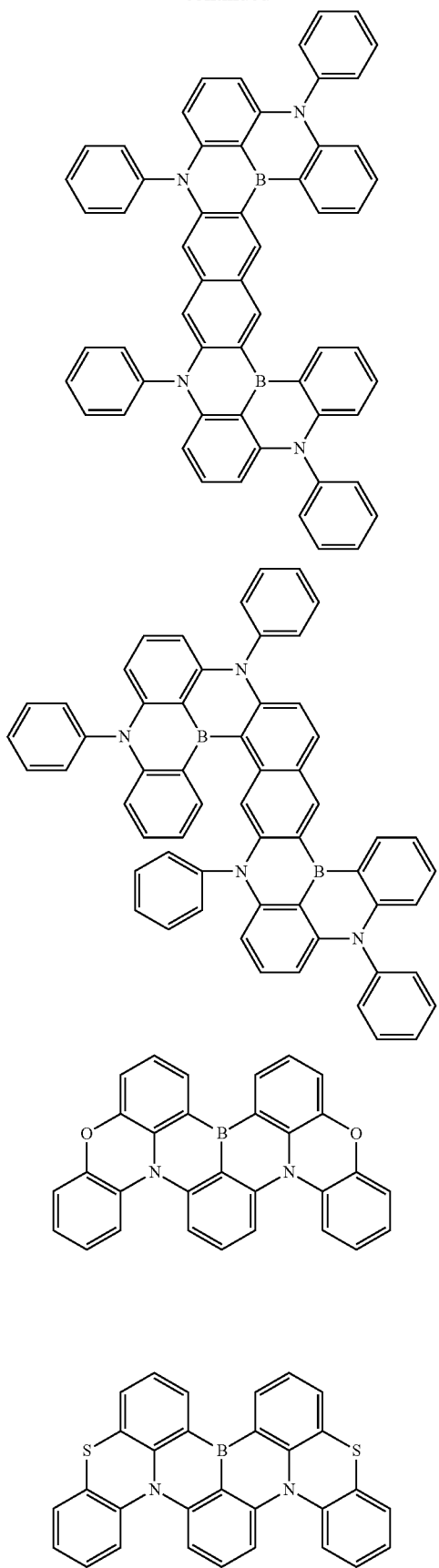
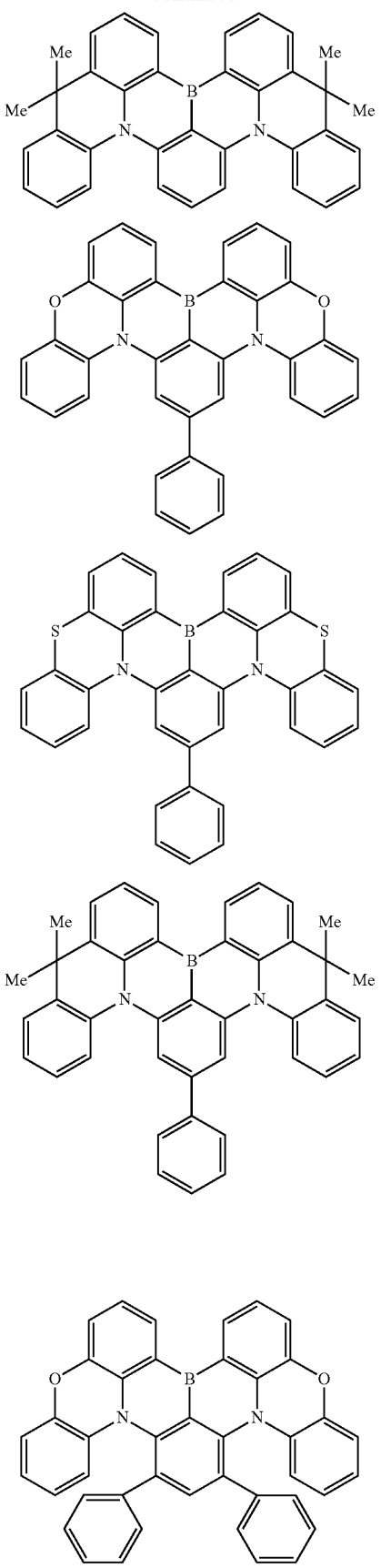

279
-continued
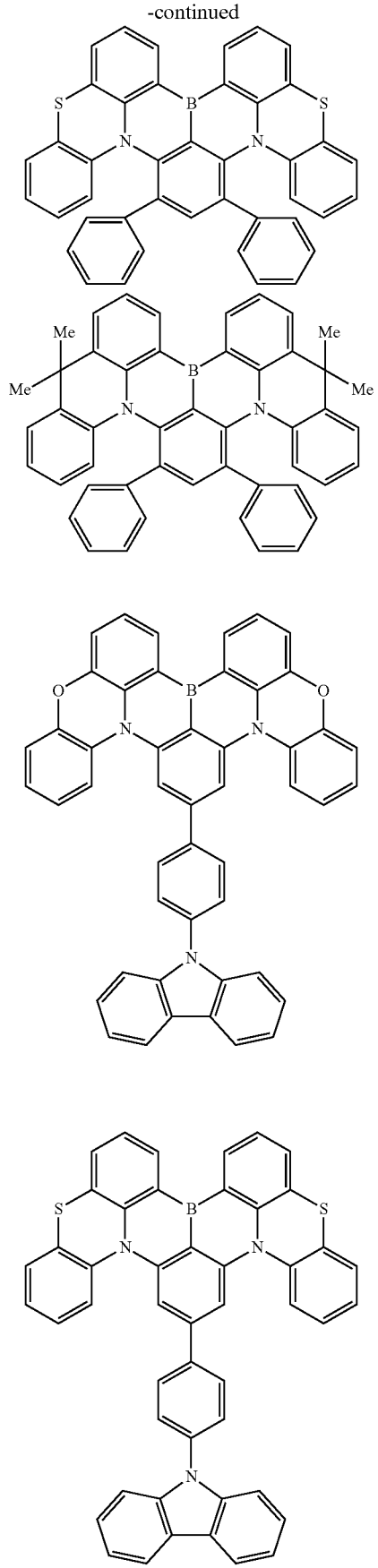
280
-continued
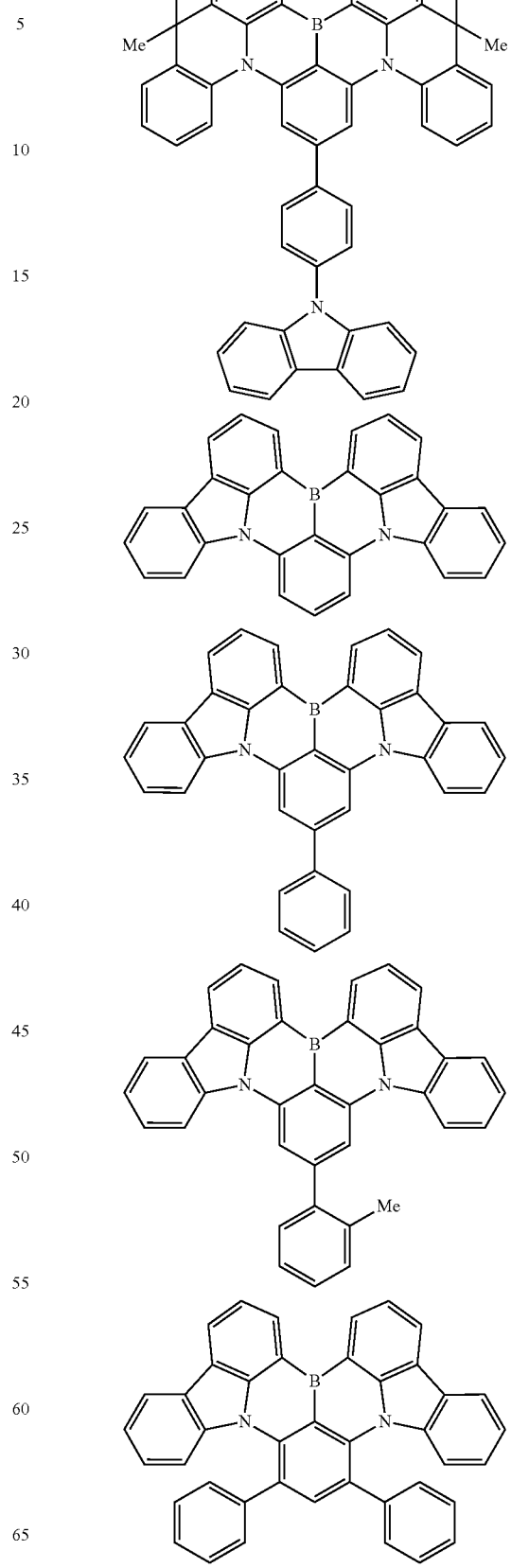

281
-continued

282
-continued

283
-continued
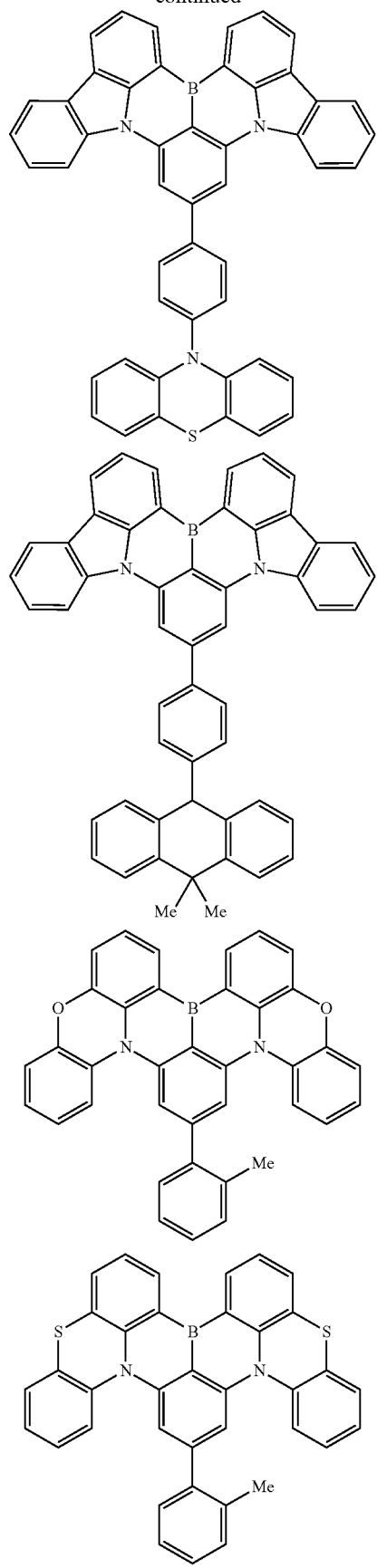
284
-continued
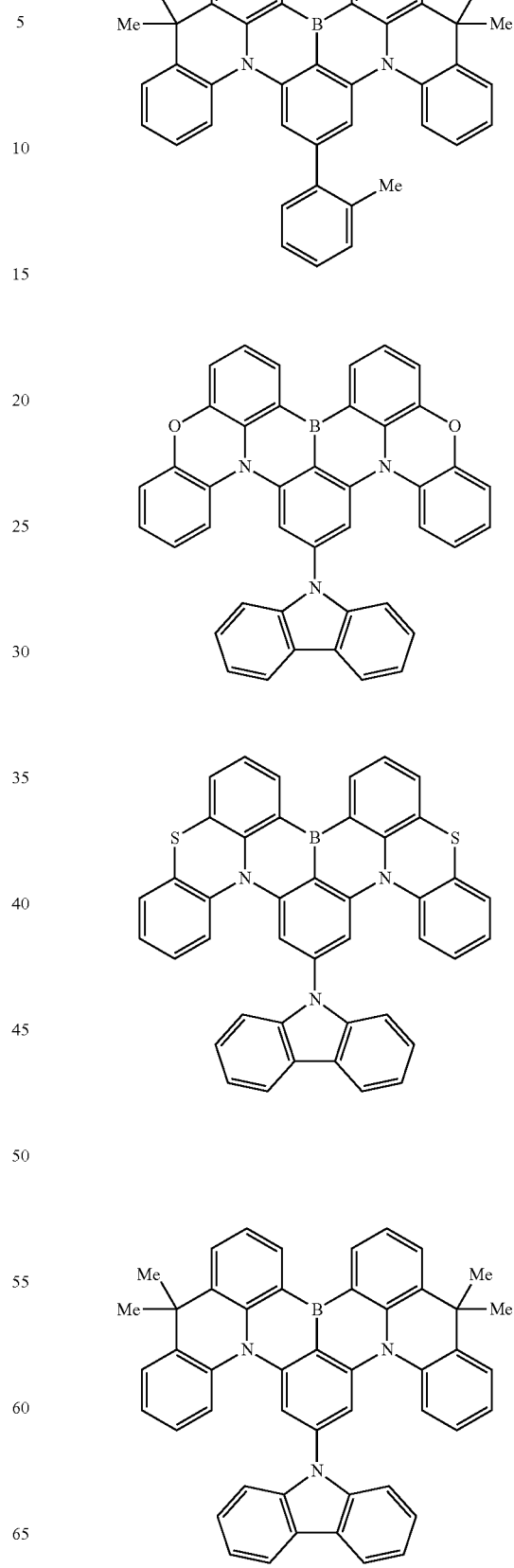

285
-continued
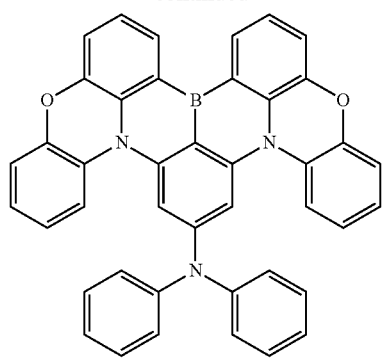
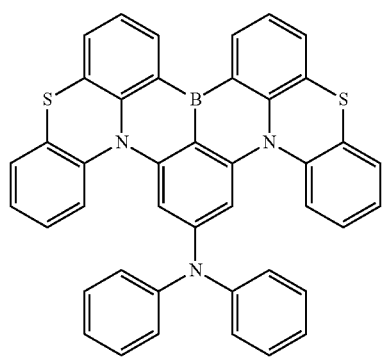
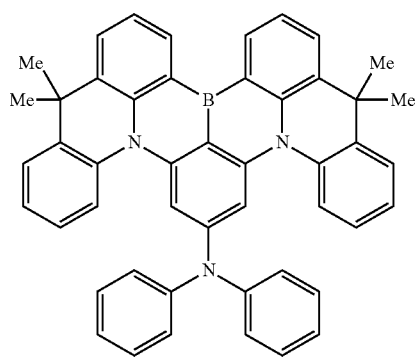
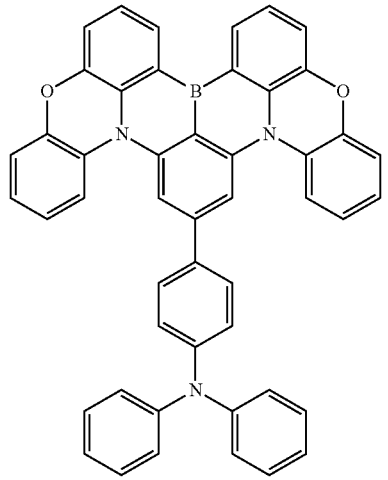
286
-continued
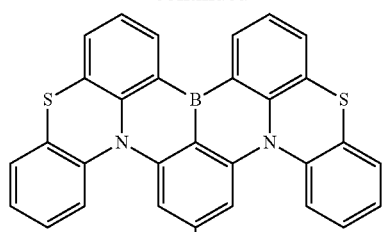
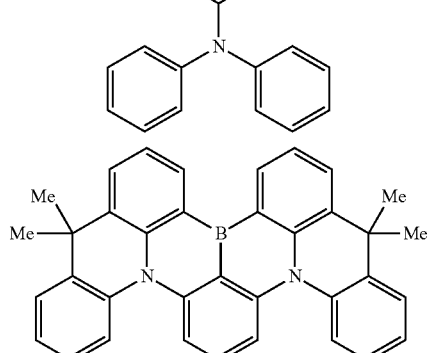
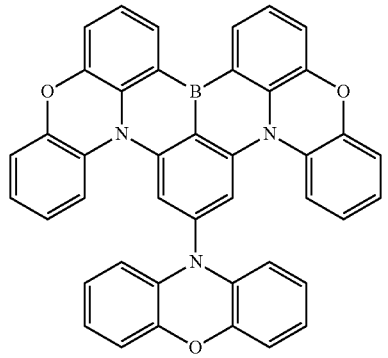
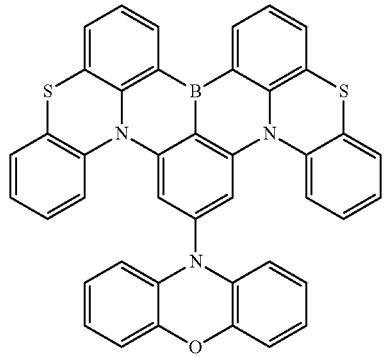

287
-continued
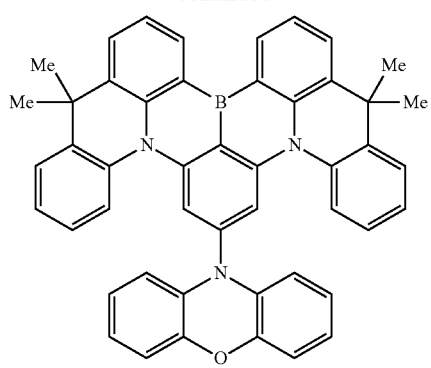
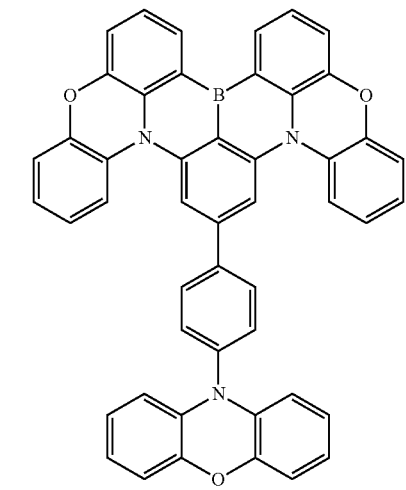
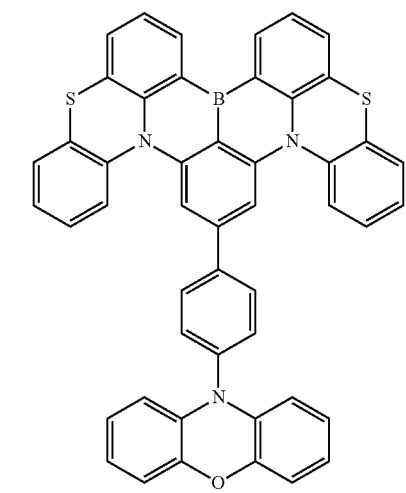
288
-continued
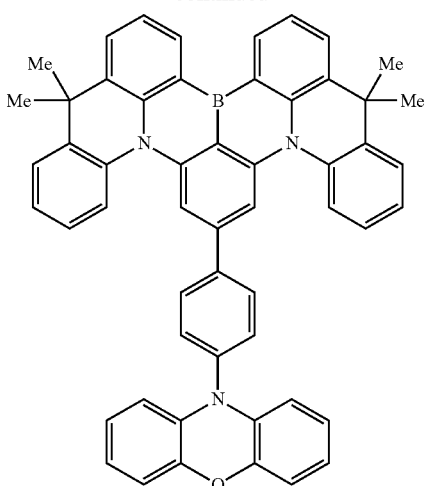
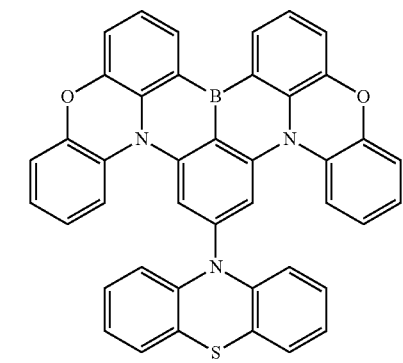
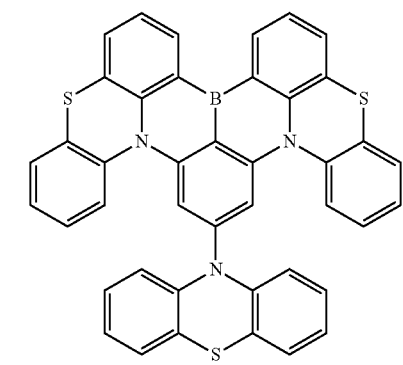
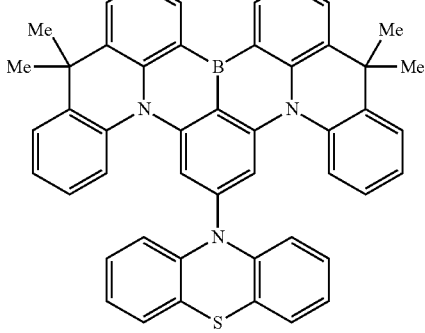

289
-continued
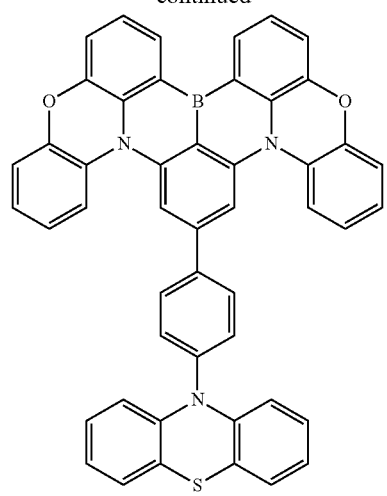
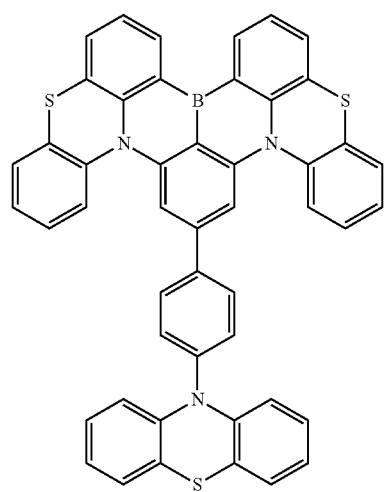
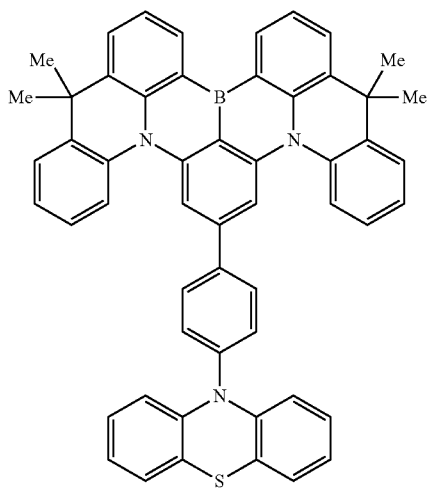
290
-continued
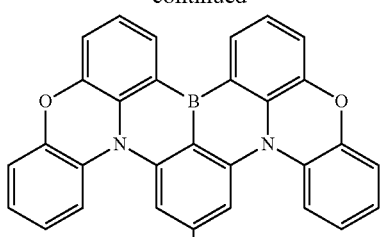
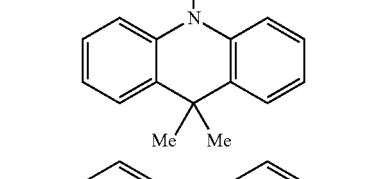
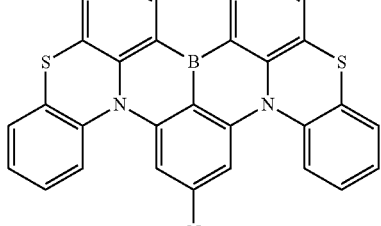
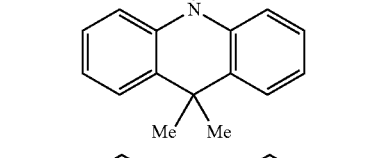

291
-continued
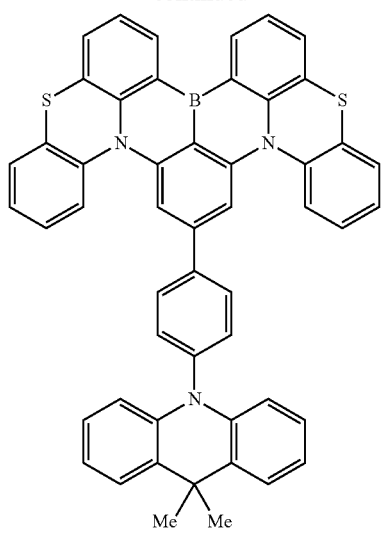
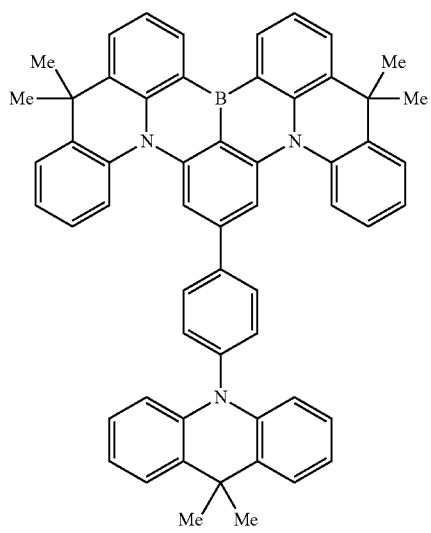
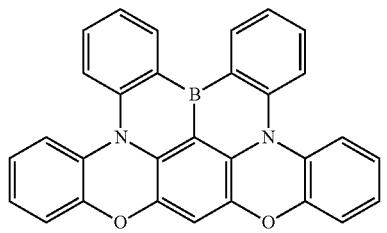
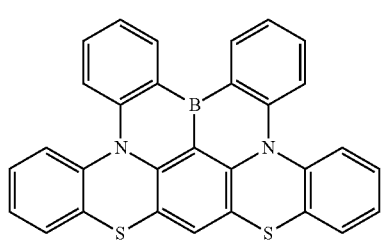
292
-continued
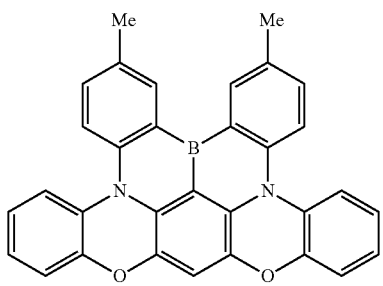
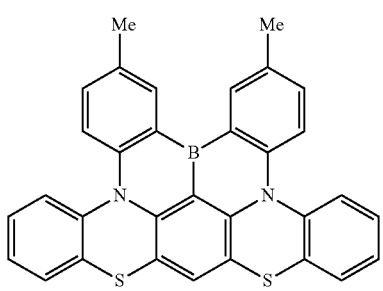
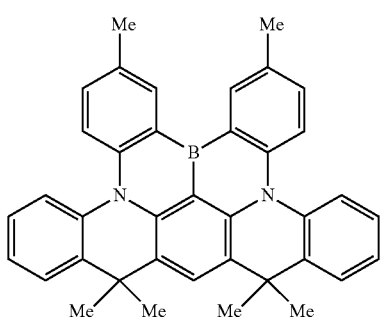
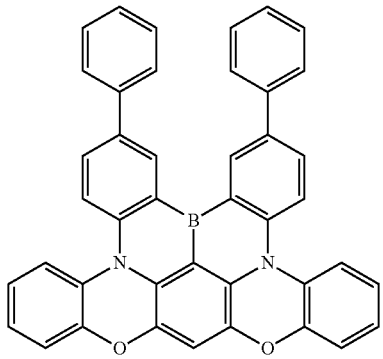

293
-continued
294
-continued
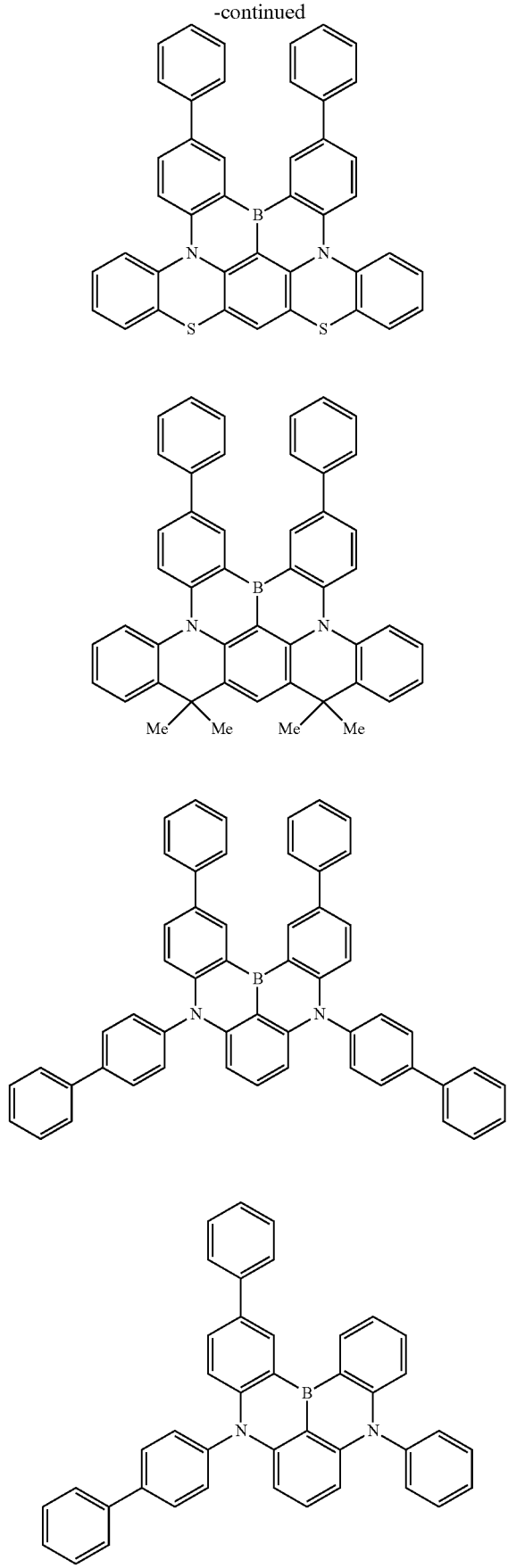
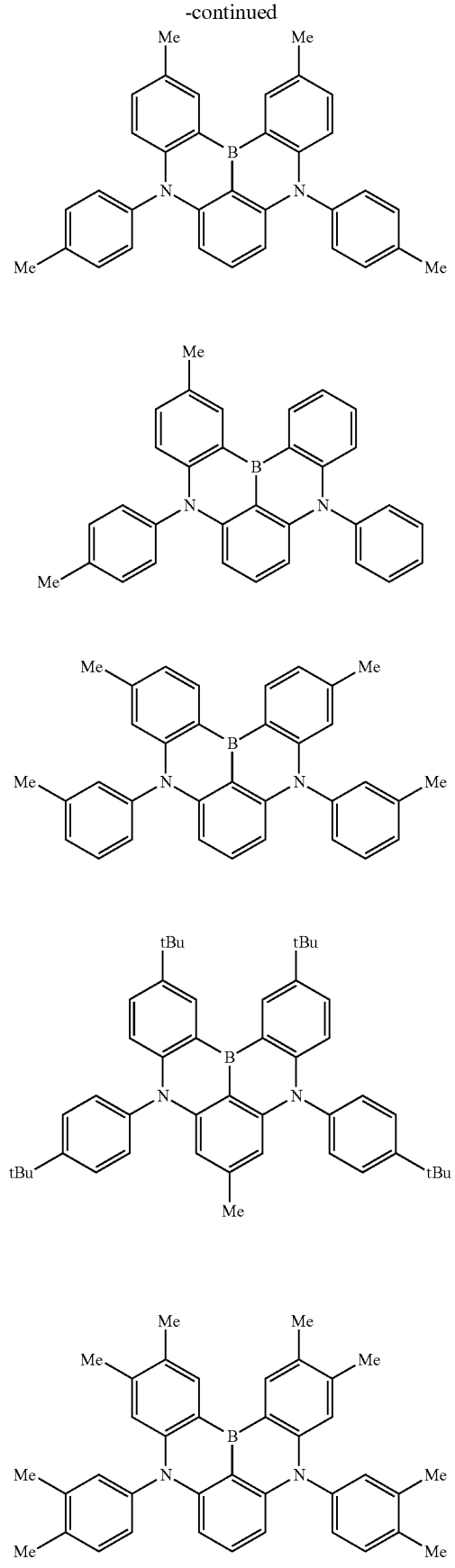

-continued
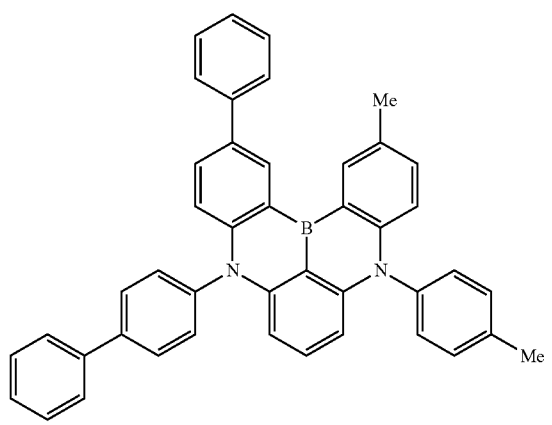
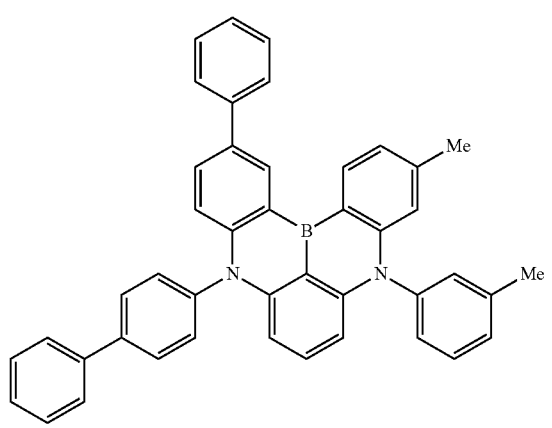
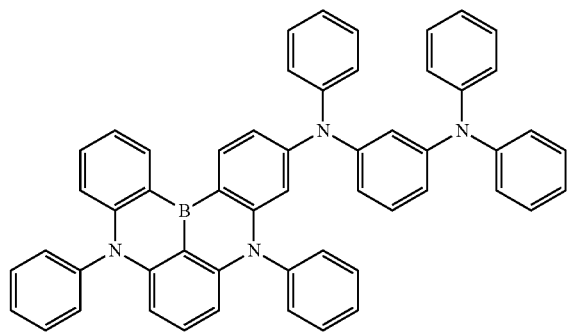 [SMILES: c1ccc(N(c2ccccc2)c2cccc(N(c3ccccc3)c3ccc4c(c3)N(c3ccccc3)c3cccc5c3B4c3ccccc3N5c3ccccc3)c2)cc1]
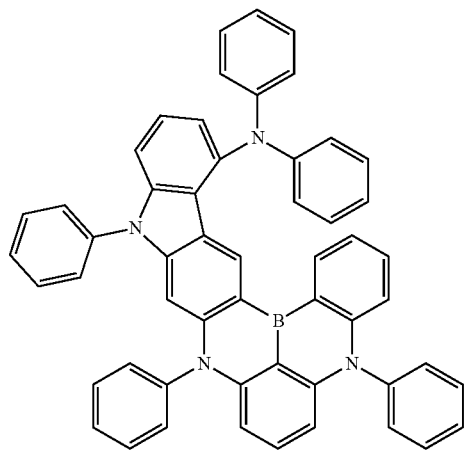
-continued
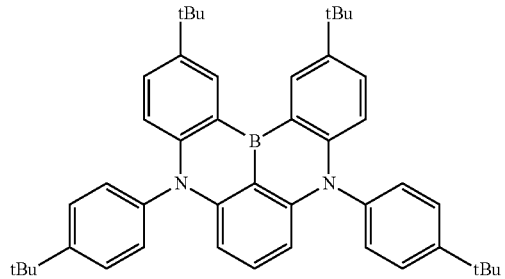
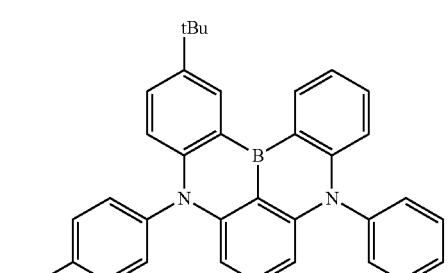
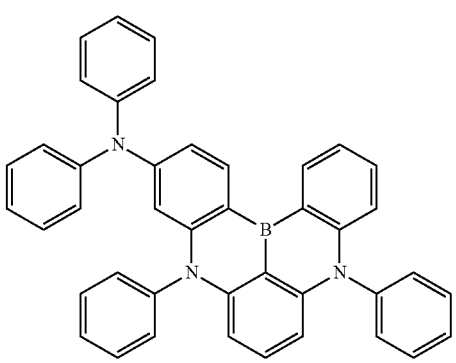
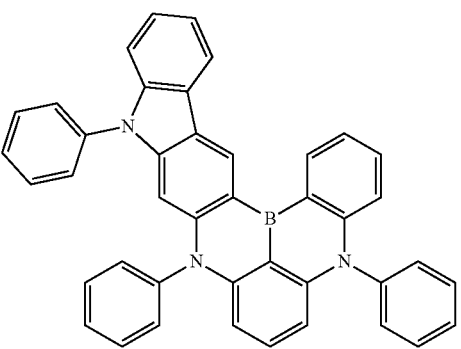
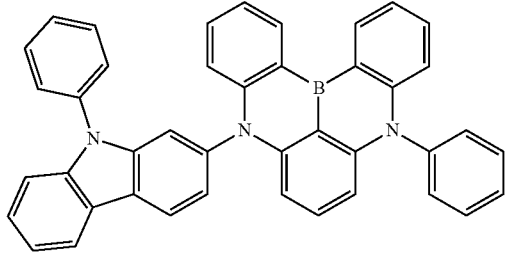

297
-continued
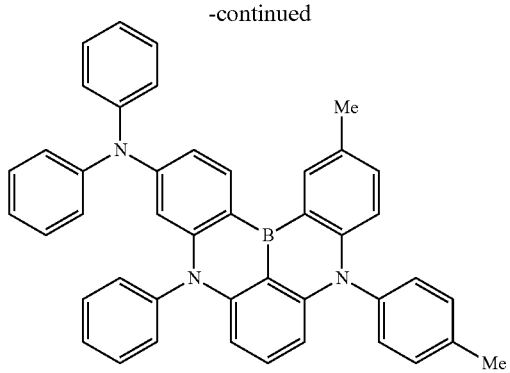
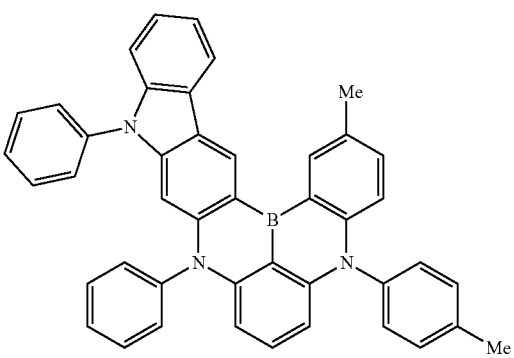
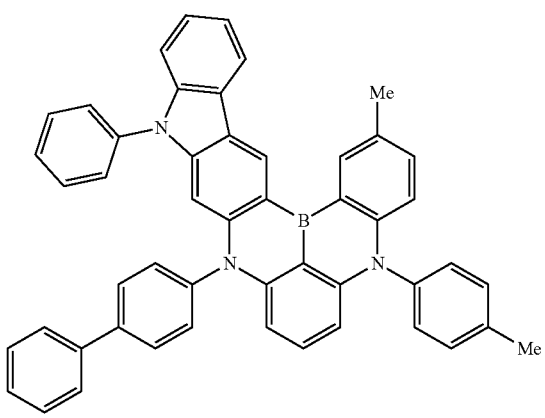
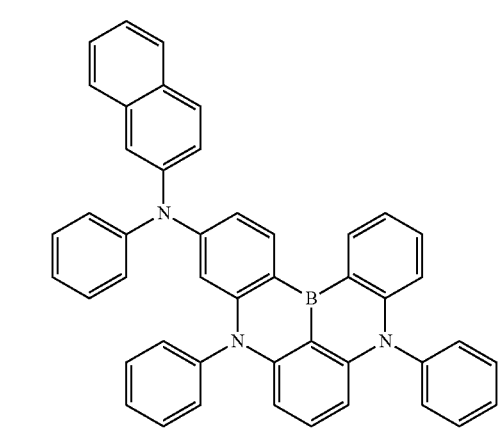
298
-continued
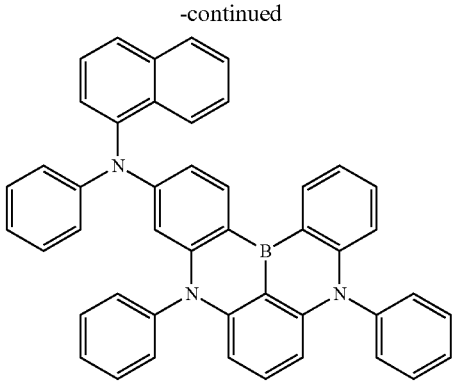
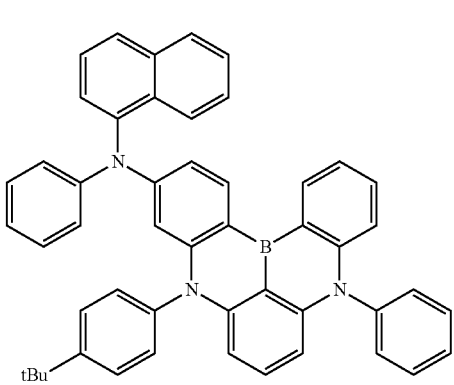
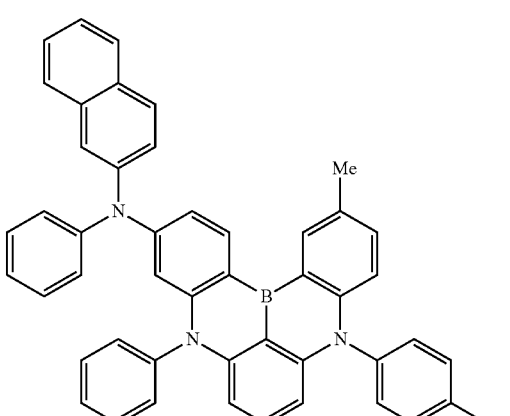
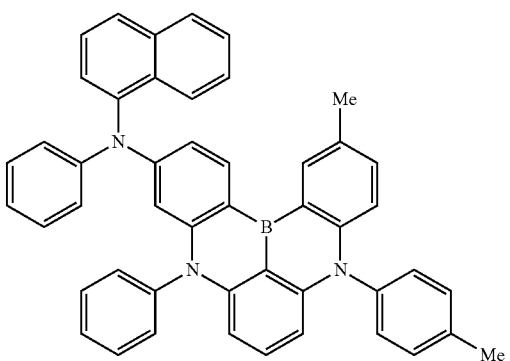

299
-continued
300
-continued
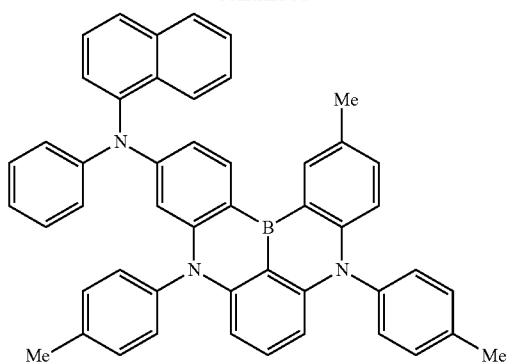
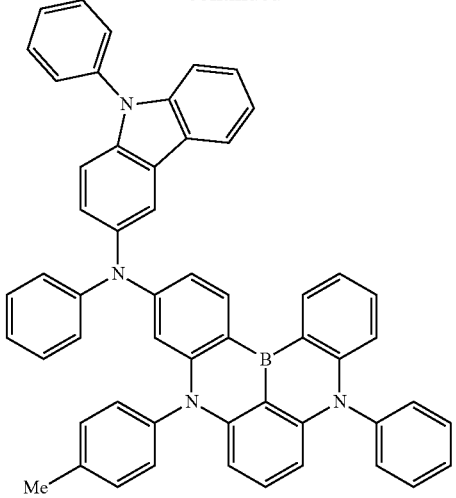
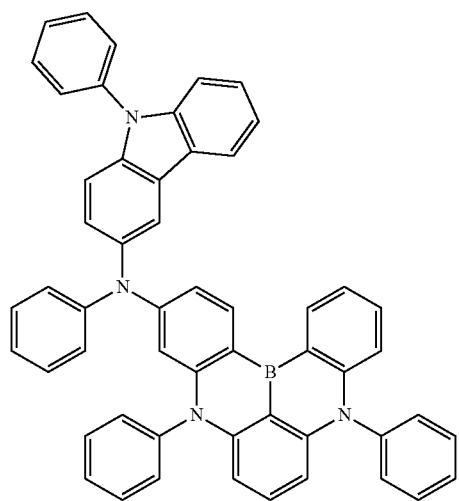
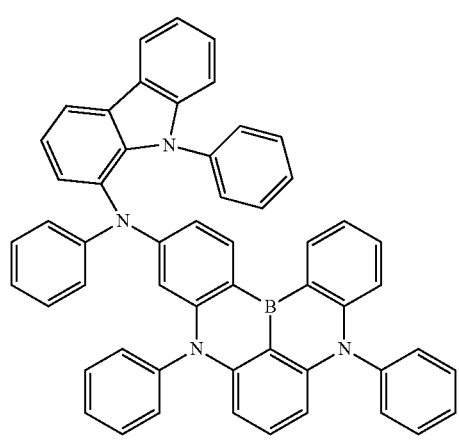
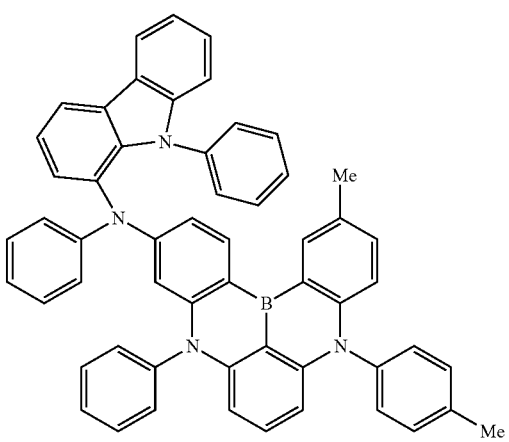

301
-continued
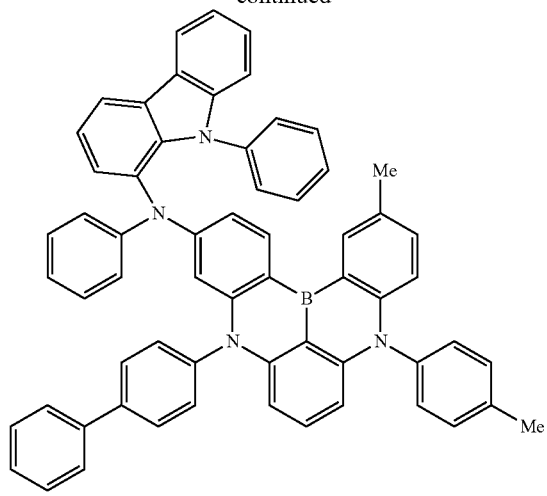
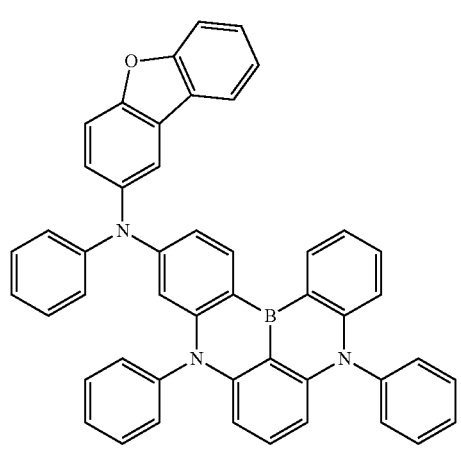
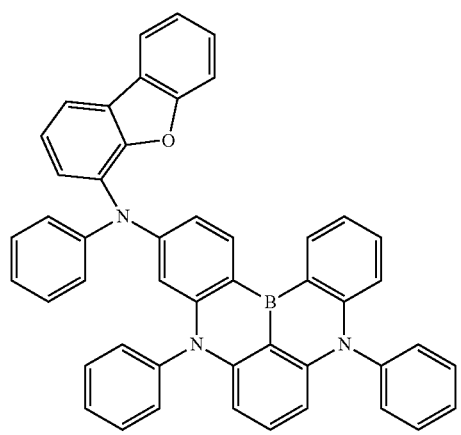
302
-continued
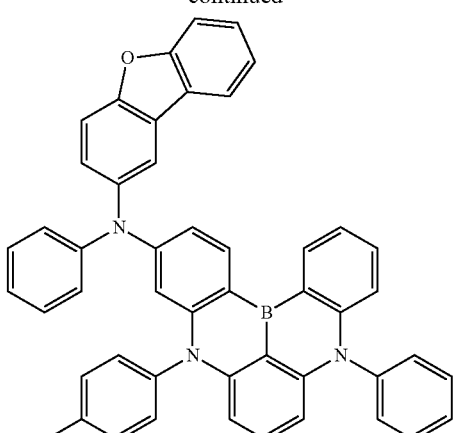
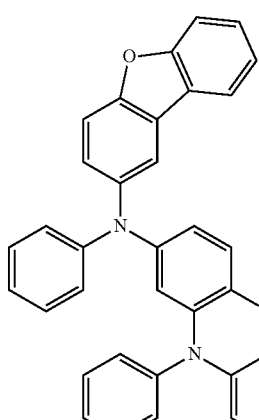
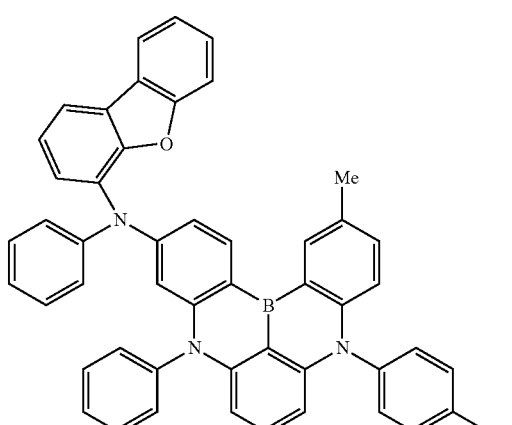

303
-continued
304
-continued
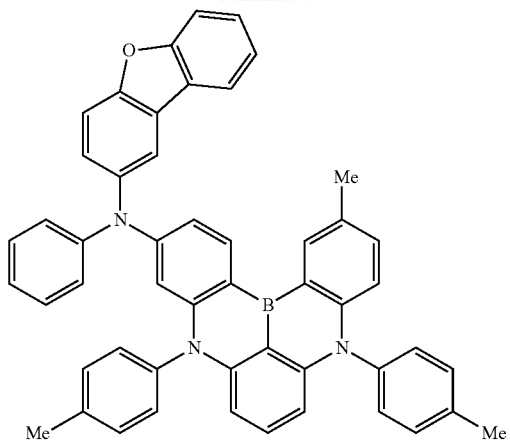
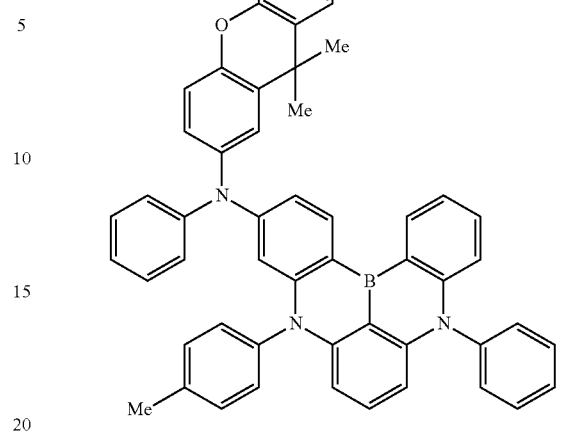
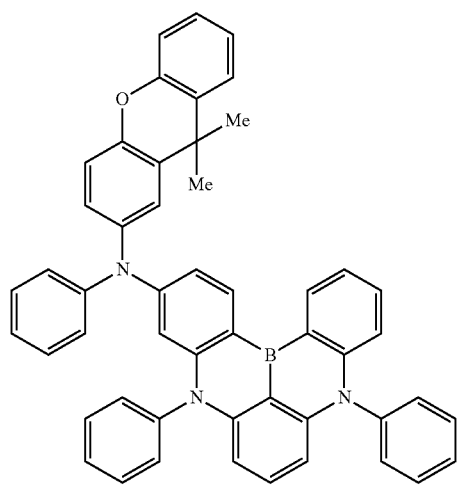
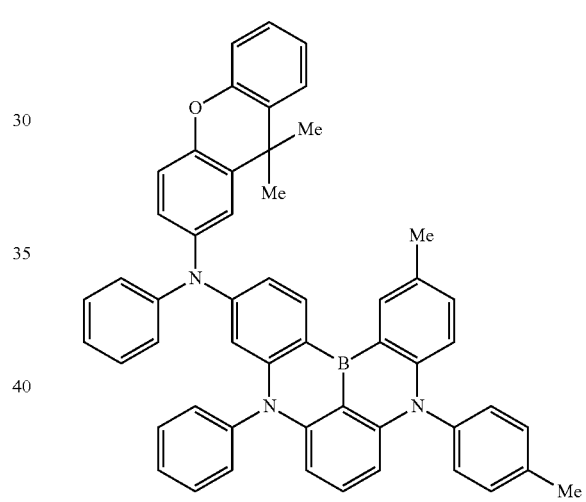
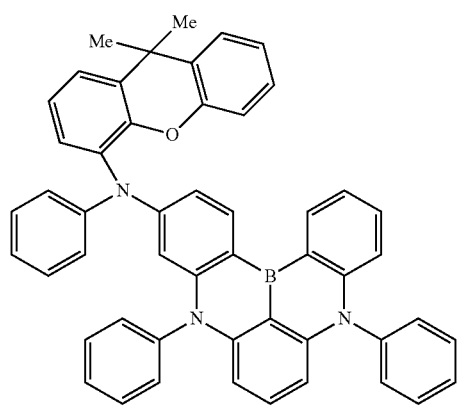
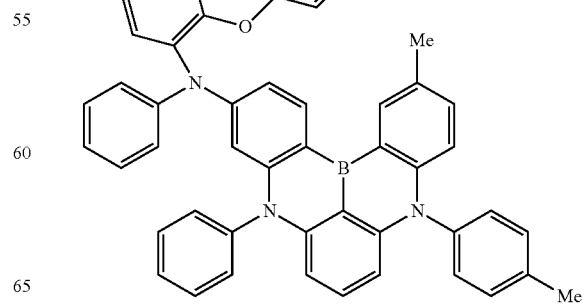

305
-continued
306
-continued
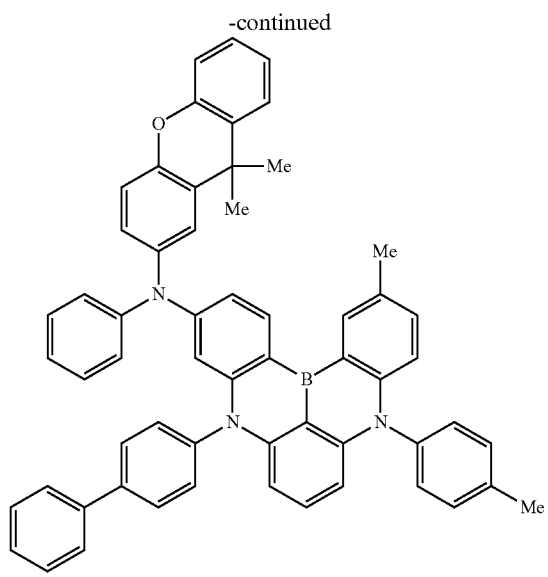
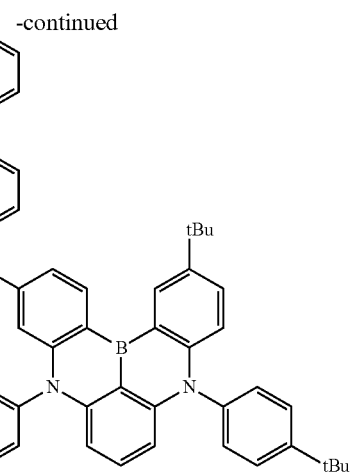
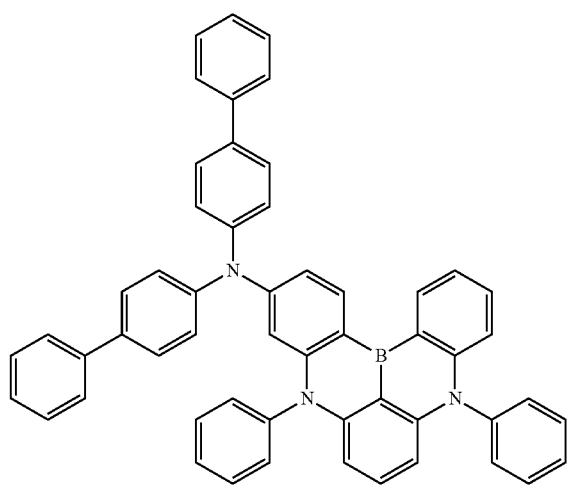
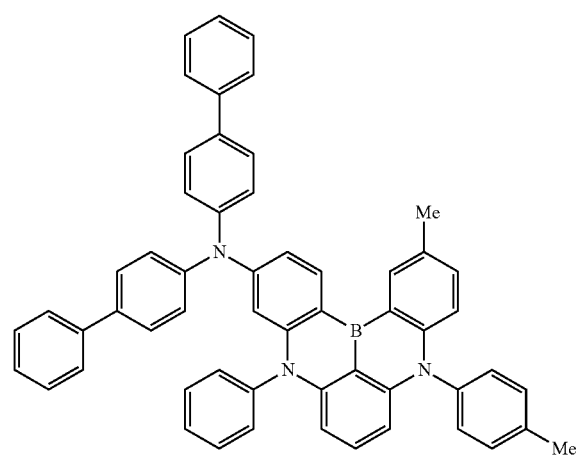
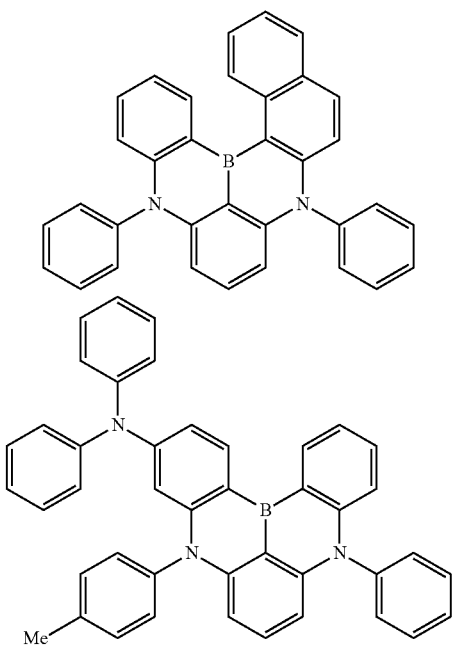

307
-continued
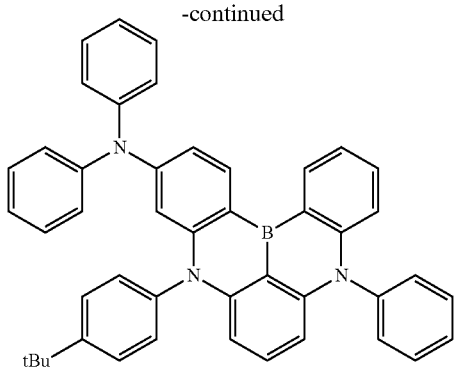
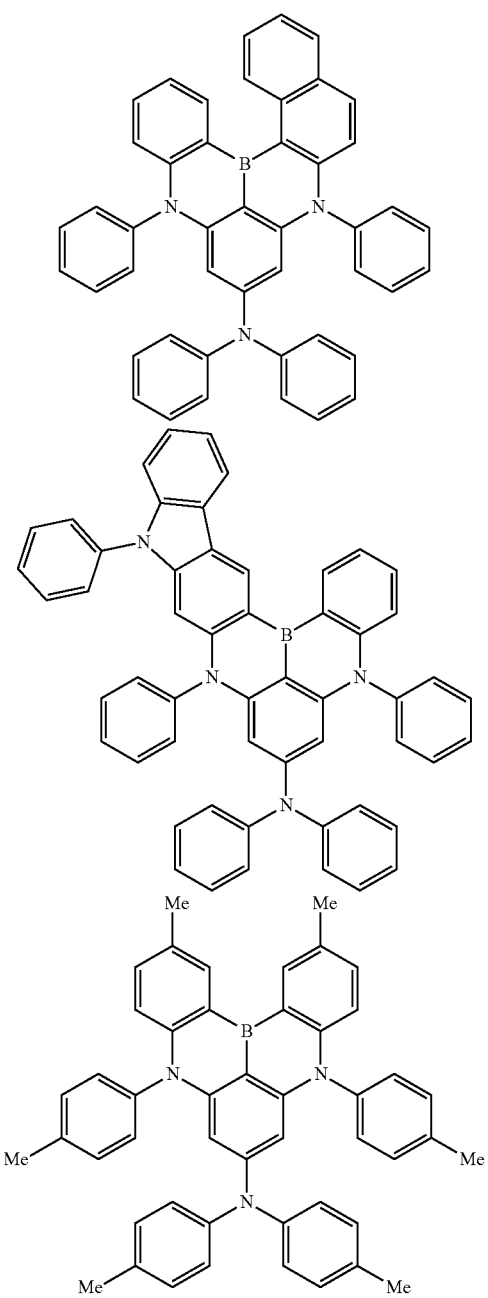
308
-continued
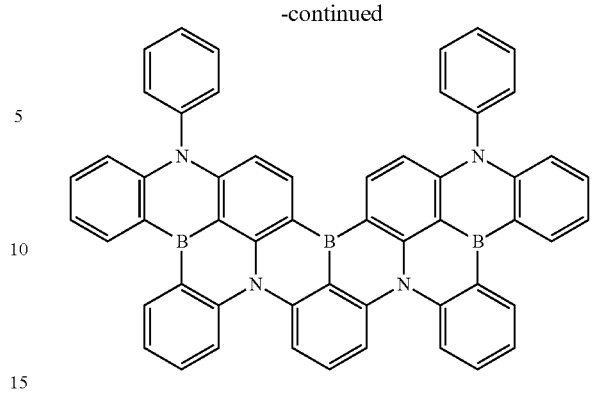
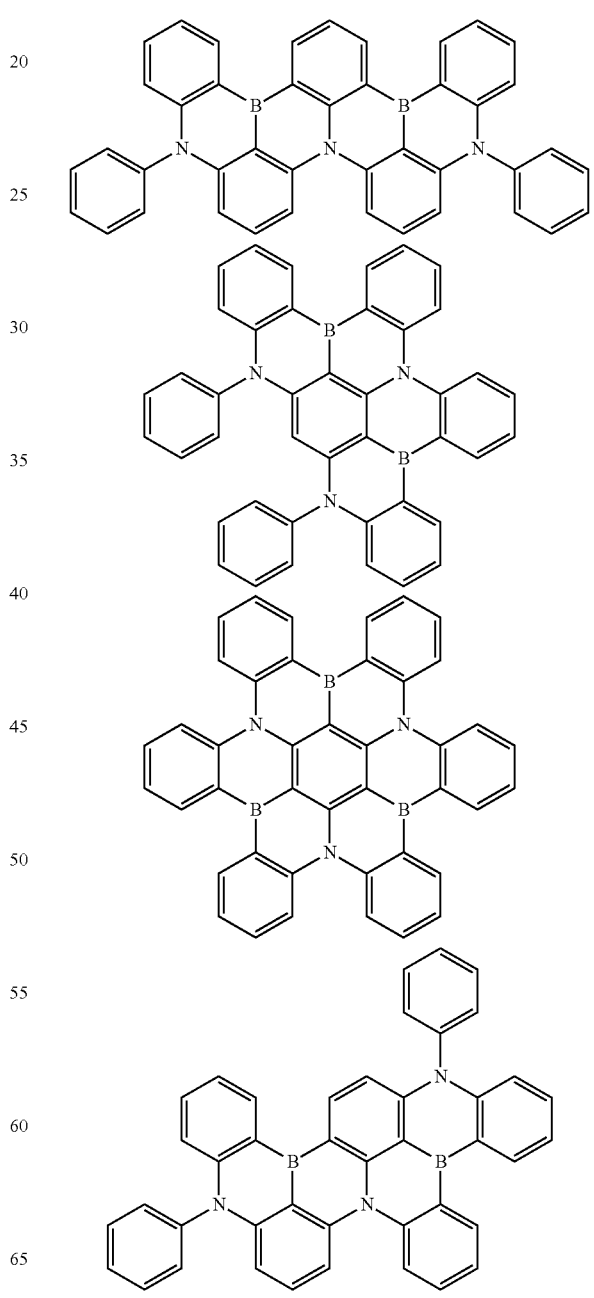

309
-continued
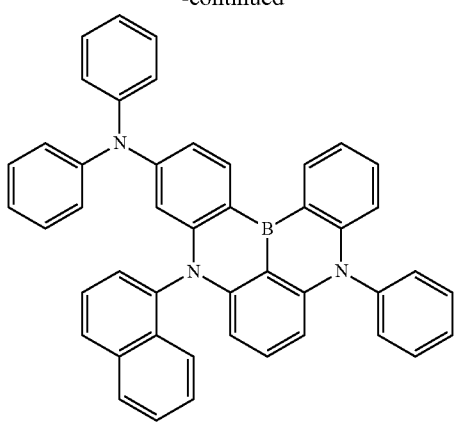
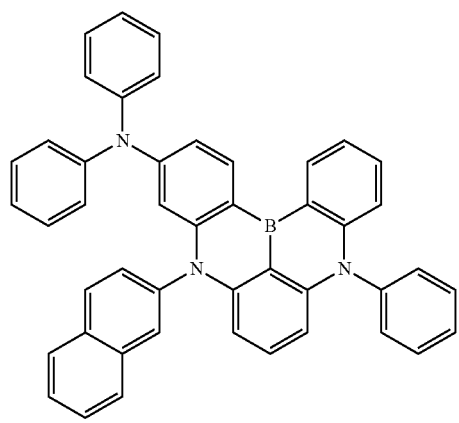
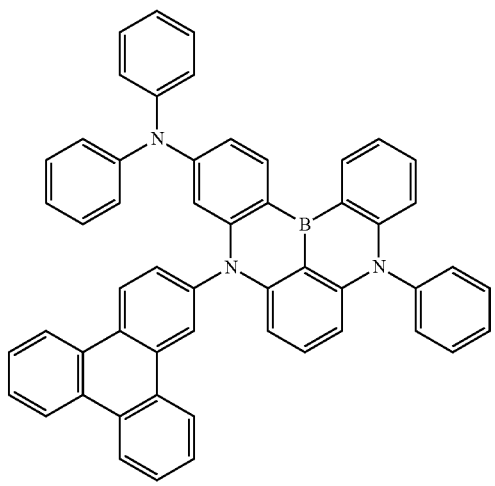
310
-continued
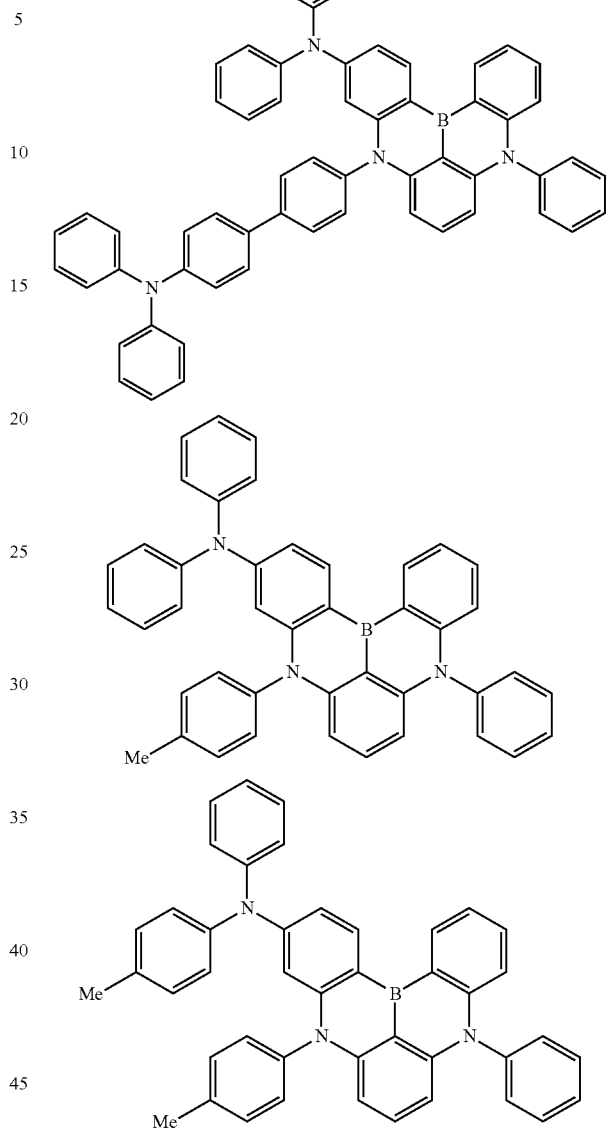

311
-continued
312
-continued
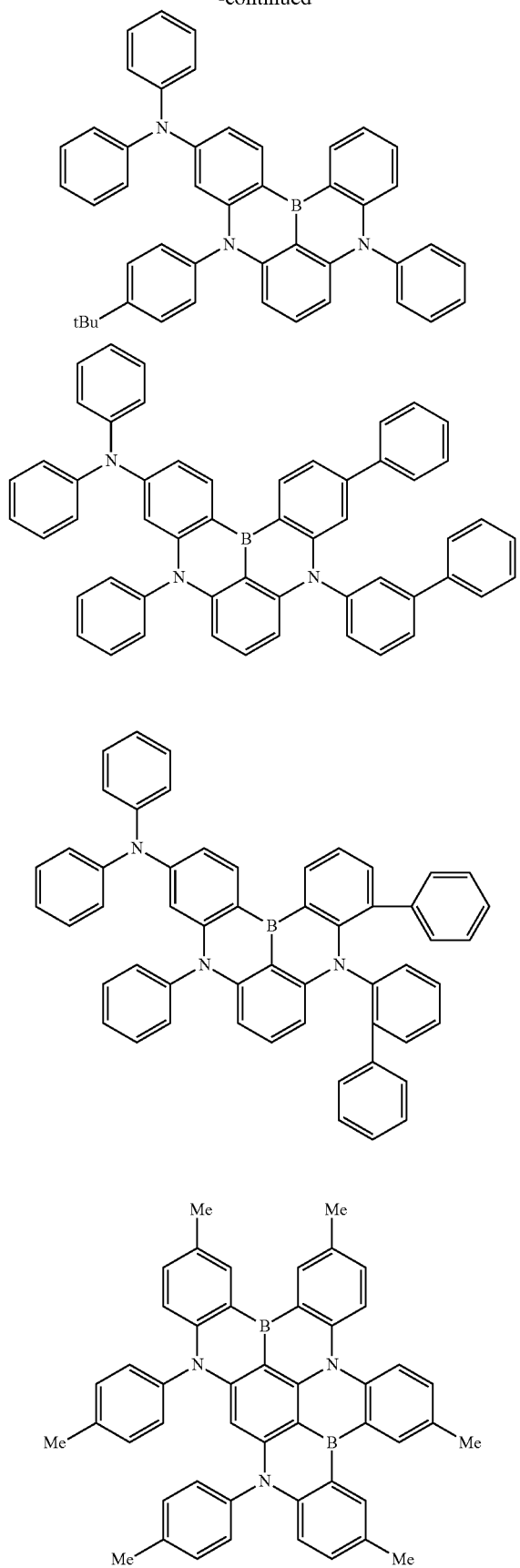
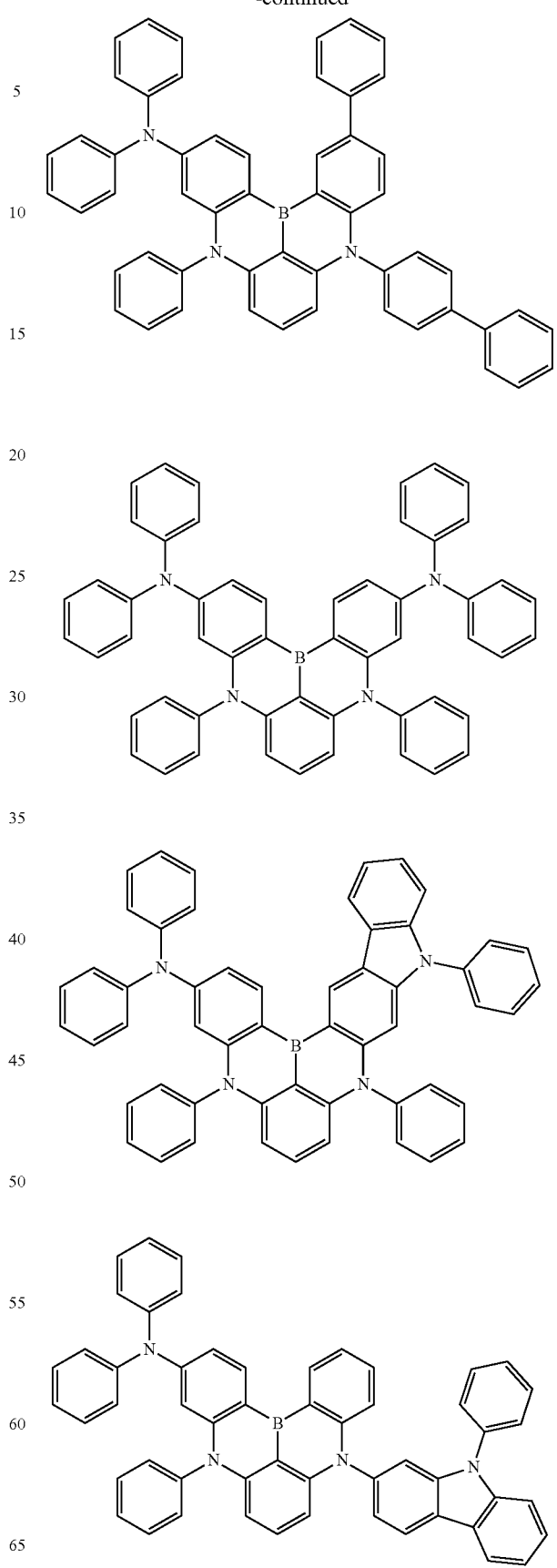

313
-continued
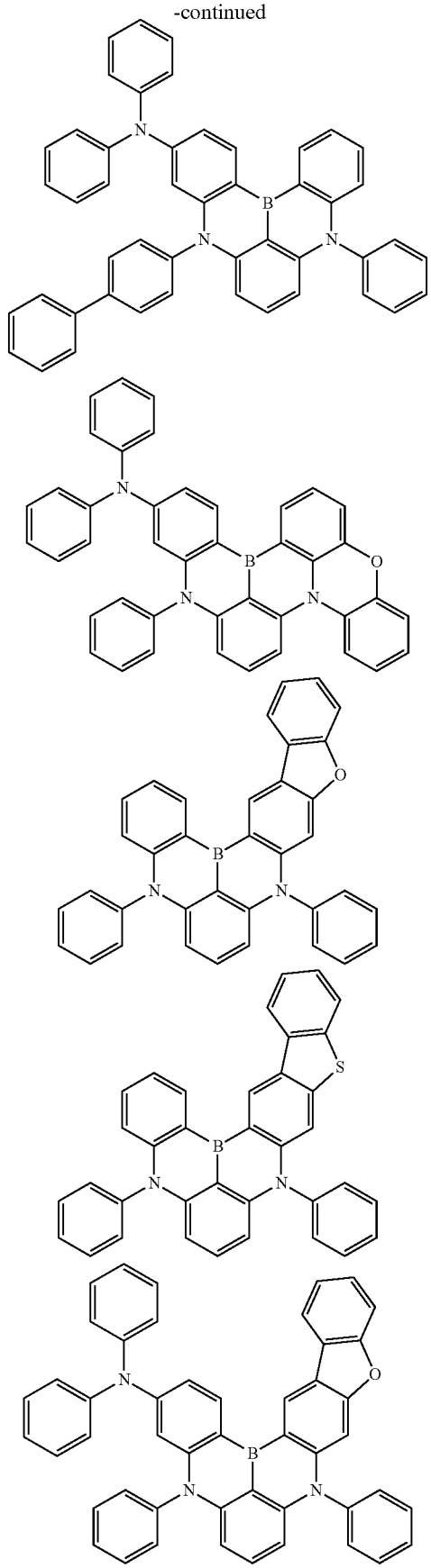
314
-continued
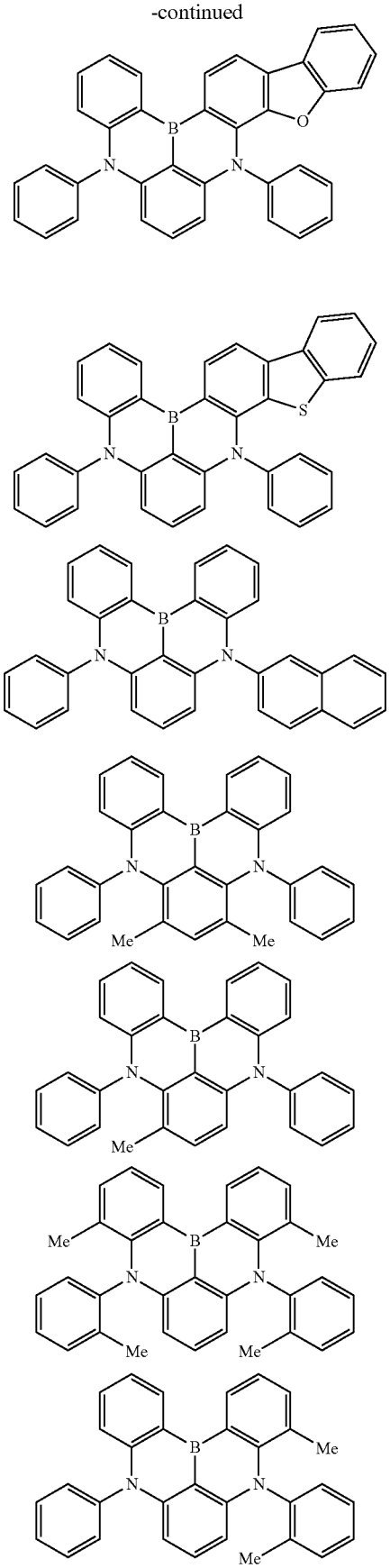

315
-continued
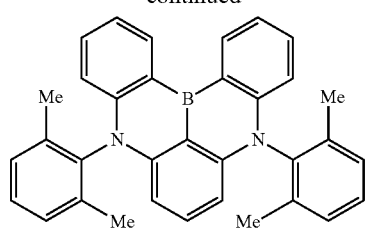
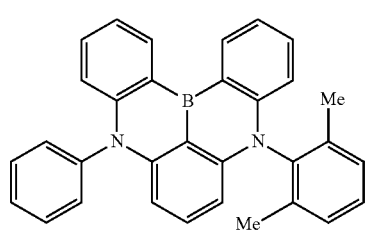
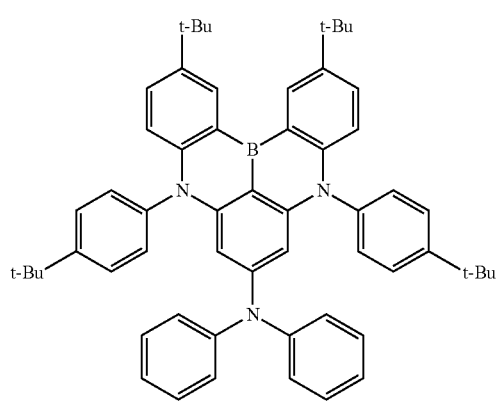
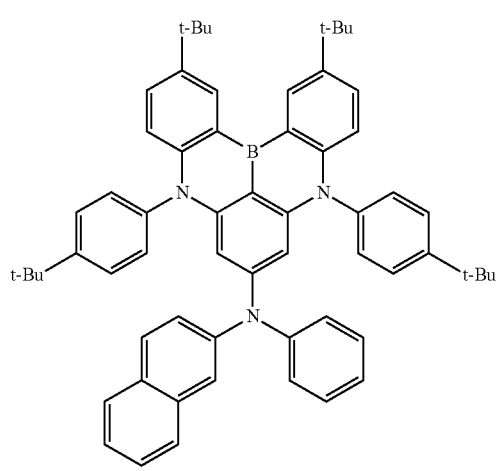
316
-continued
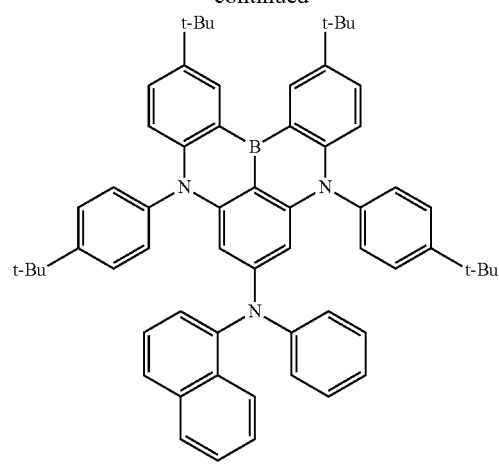
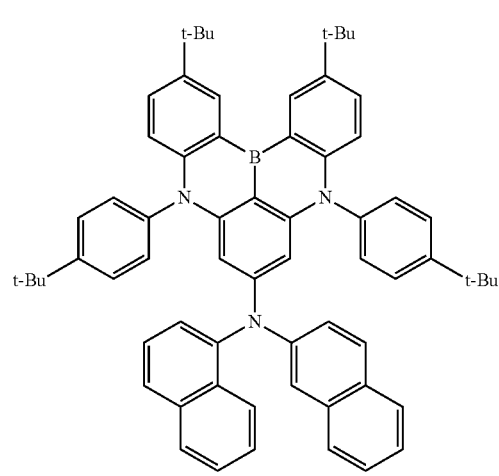
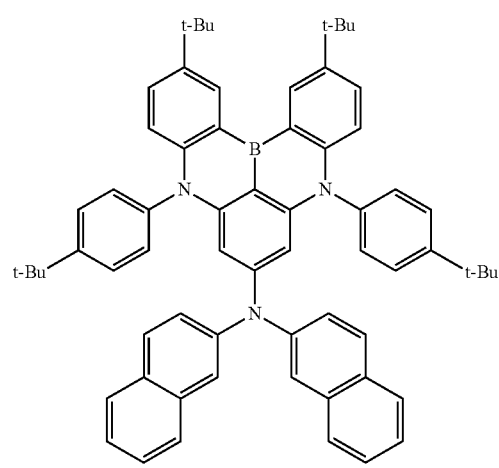

317
-continued
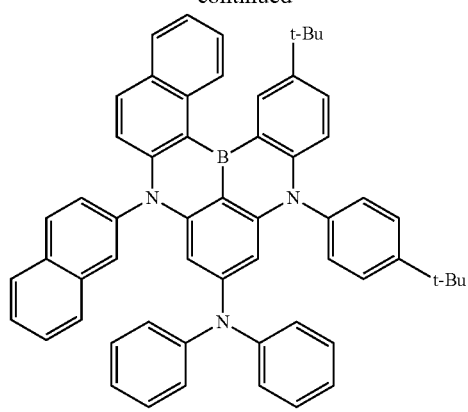
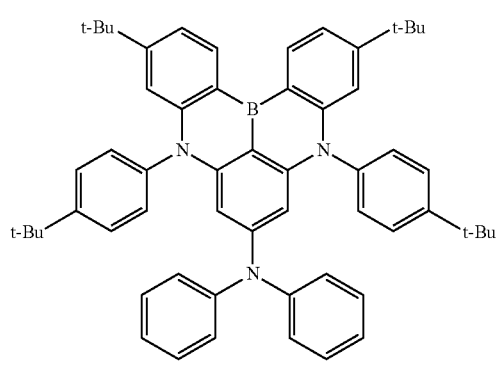
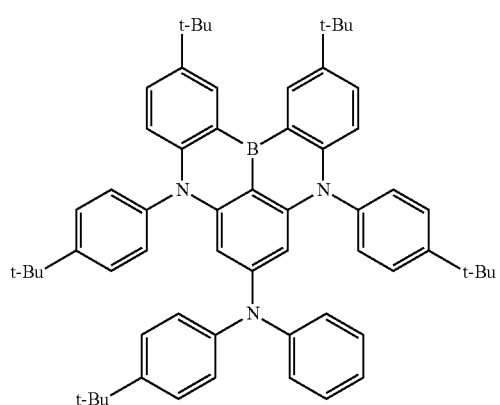
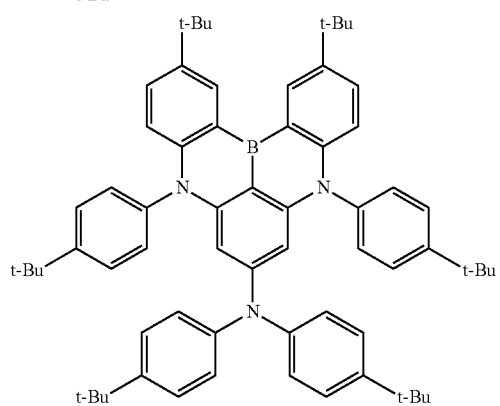
318
-continued
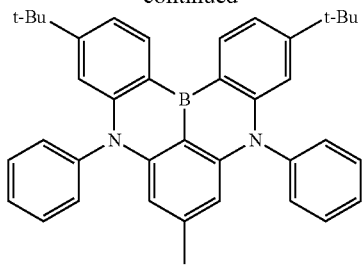
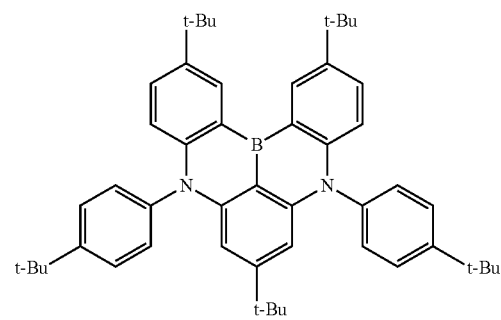
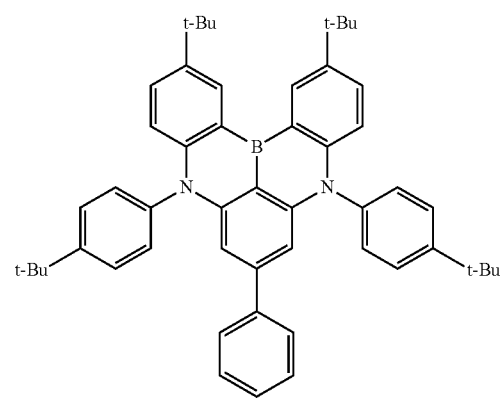
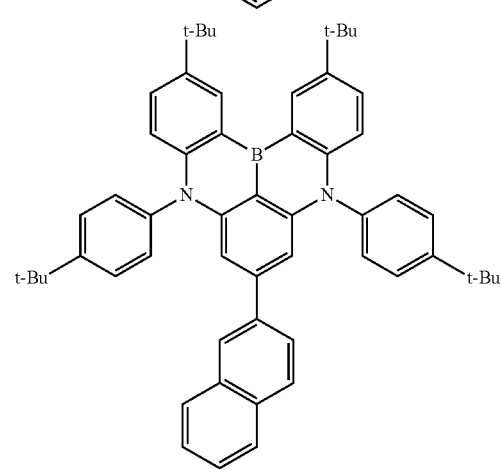

319
-continued
320
-continued
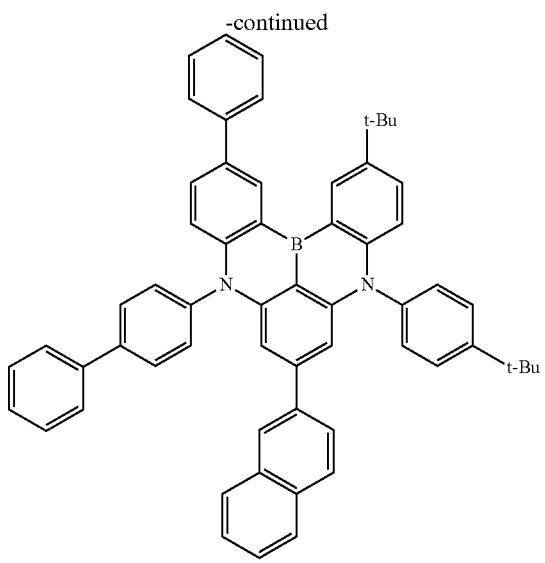
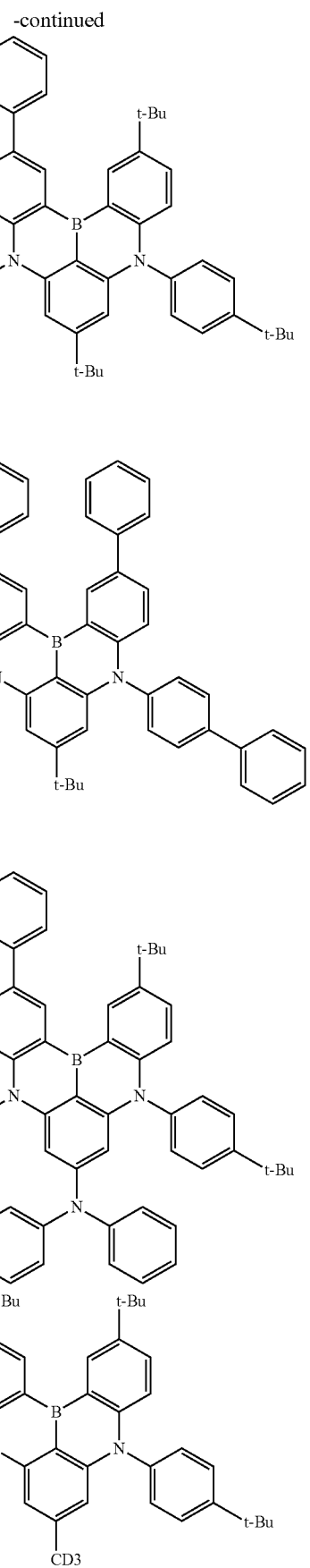

-continued
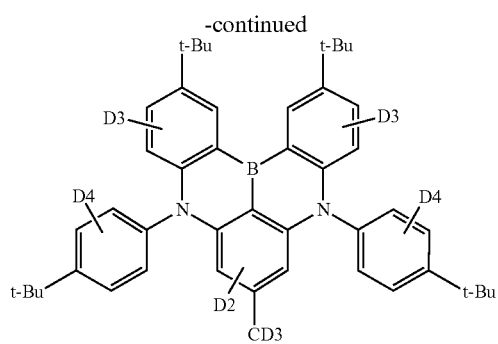
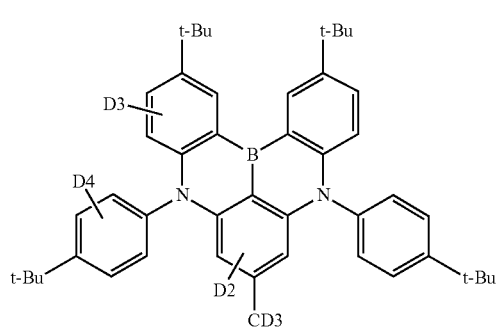
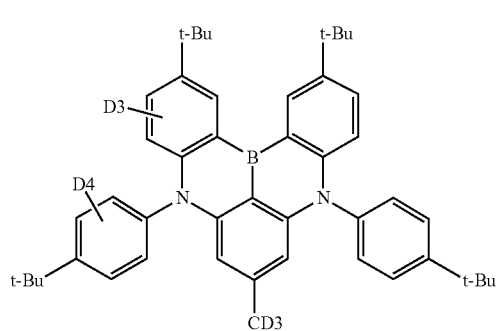
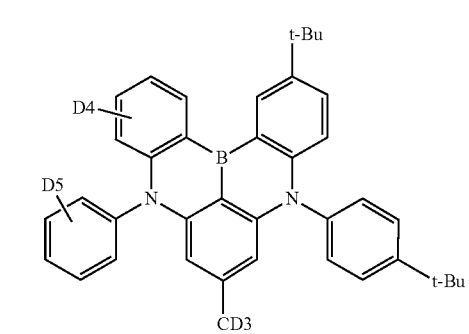
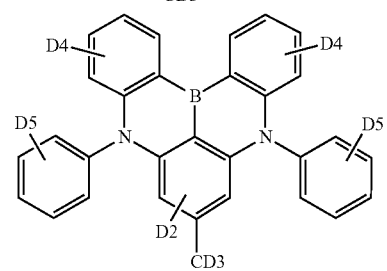
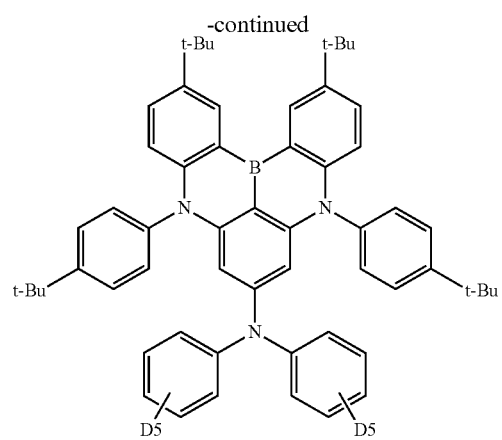
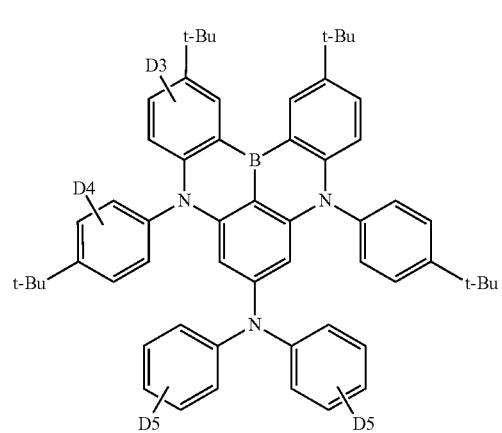
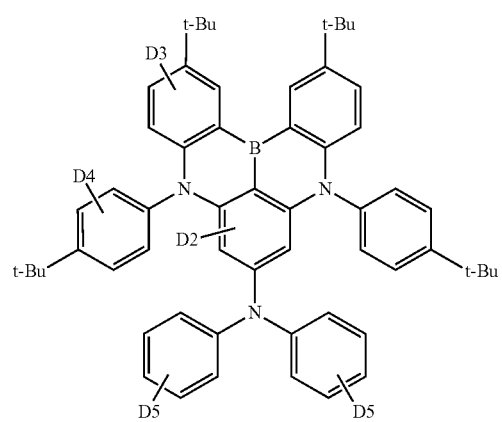
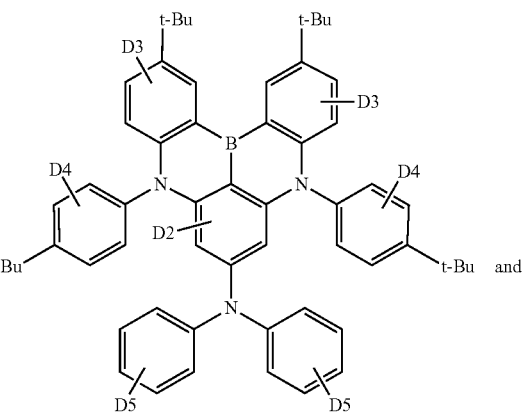 and -continued

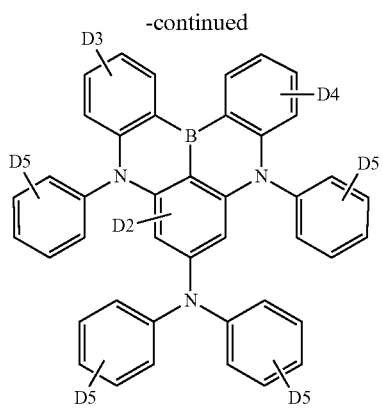

wherein, D2 to D5 represent that 2 to 5 hydrogens are replaced with deuterium, respectively.

11. The plurality of light-emitting materials according to claim 1, wherein the compound represented by formula 1 is a host material, and the compound represented by formula 2 is a dopant material.

12. An organic electroluminescent device comprising an anode, a cathode, and an organic layer(s) between the anode and the cathode, wherein the organic layer comprises at least one light-emitting layer, and the light-emitting layer comprises the plurality of light-emitting materials according to claim 1 or 7.

13. The organic electroluminescent device according to claim 12, wherein the organic layer comprises a hole transport zone disposed between the anode and the light-emitting layer, and the hole transport zone comprises a compound represented by the following formula 3:

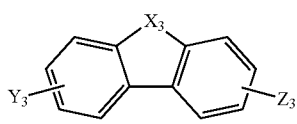

wherein, $X_3$ represents $NR_{101}$, O, S, or $CR_{102}R_{103}$;

$Y_3$, $Z_3$ and $R_{101}$, each independently, represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino; and $R_{102}$ and $R_{103}$, each independently, represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino; or $R_{102}$ and $R_{103}$ may be linked to each other to form a ring(s).

14. An organic electroluminescent compound represented by the following formula 1-1:

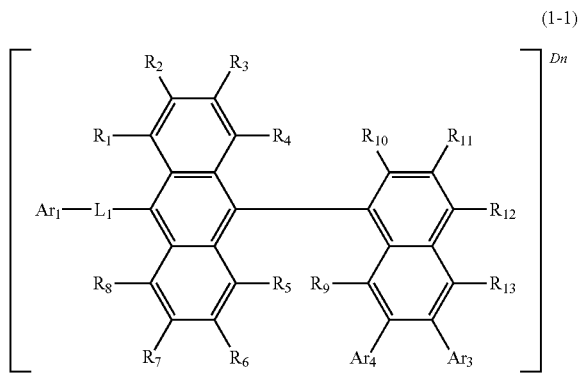

(1-1)

wherein, $L_1$ represents a single bond, a substituted or unsubstituted (C6-C30)arylene, or a substituted or unsubstituted (5- to 30-membered)heteroarylene;

$Ar_1$ represents a substituted or unsubstituted (C6-C30)aryl, or a substituted or unsubstituted (5- to 30-membered)heteroaryl;

$Ar_3$ and $Ar_4$, each independently, represent hydrogen, deuterium, a substituted or unsubstituted (C6-C30)aryl, or a substituted or unsubstituted (5- to 30-membered) heteroaryl, with a proviso that $Ar_3$ and $Ar_4$ are not simultaneously hydrogen;

$R_1$ to $R_{13}$, each independently, represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino;

$D_n$ represents that n hydrogens are replaced with deuterium; and n represents an integer of 8 or more.

15. The organic electroluminescent compound according to claim 14, wherein at least four of $R_1$ to $R_8$ represent deuterium.

16. The organic electroluminescent compound according to claim 14, wherein the compound represented by formula 1-1 is selected from the group consisting of the following compounds:

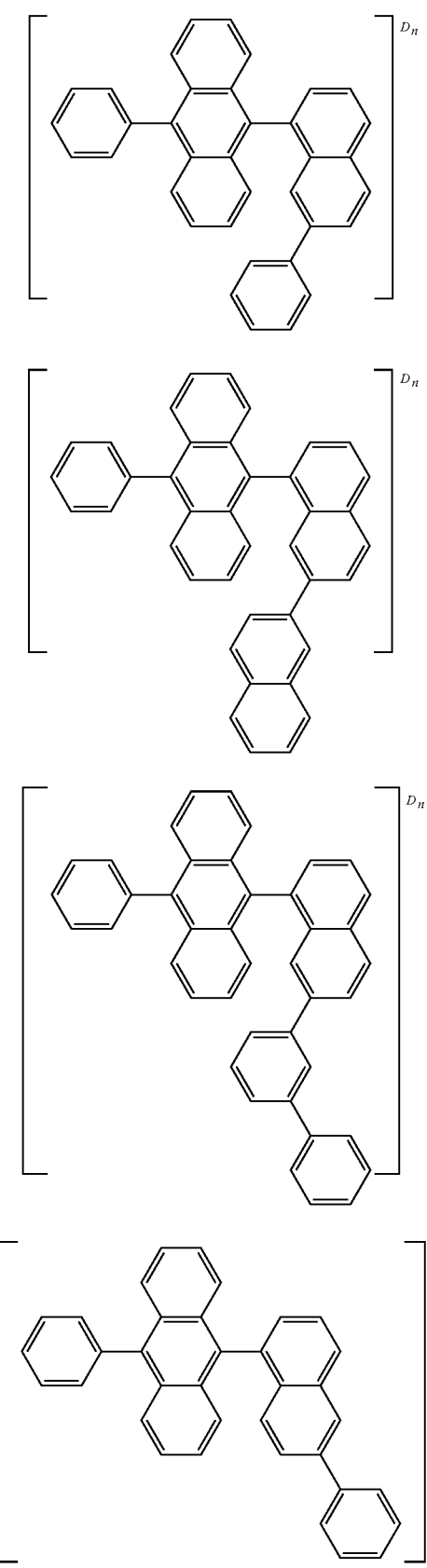
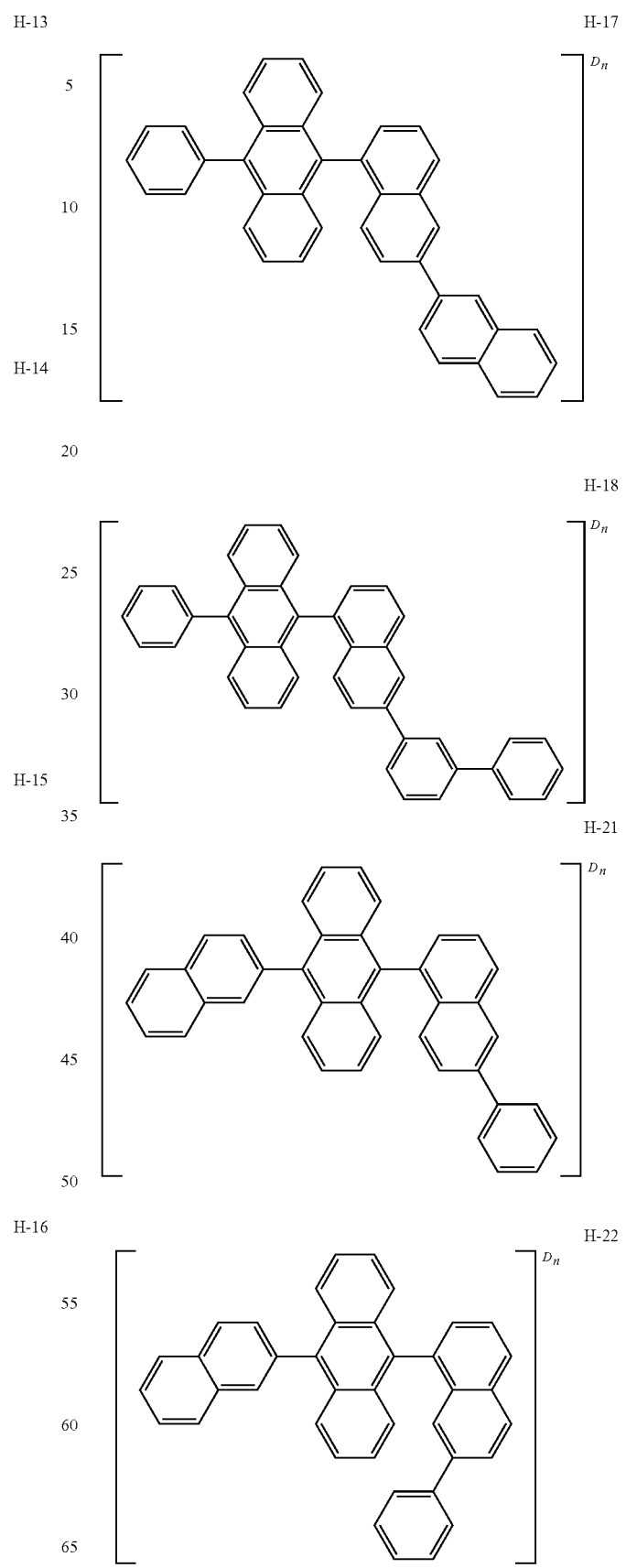

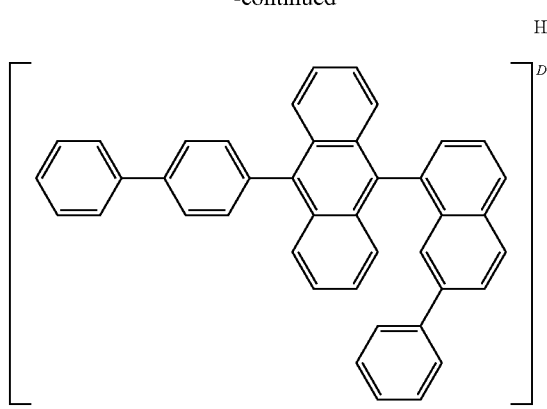
H-23
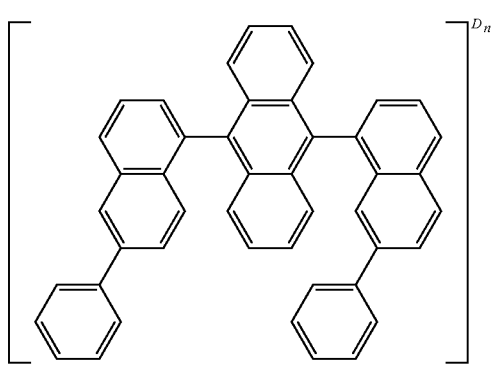
H-24
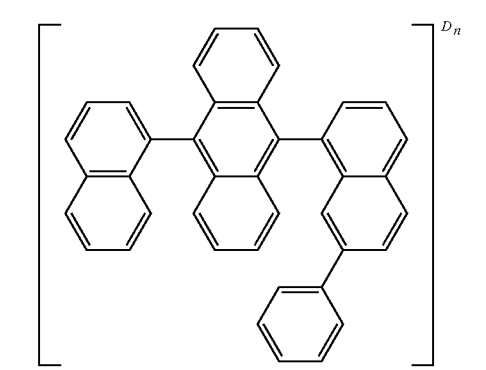
H-25
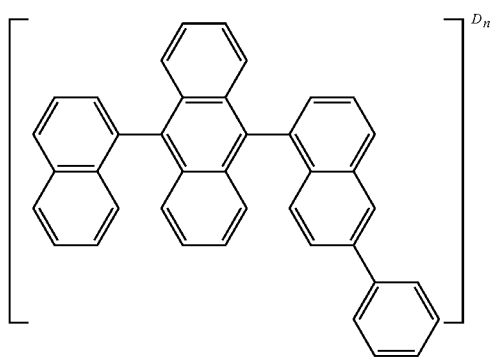
H-27
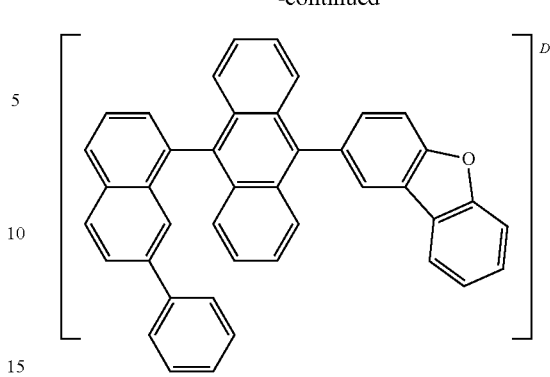
H-76
H-77
H-78
H-79

H-80
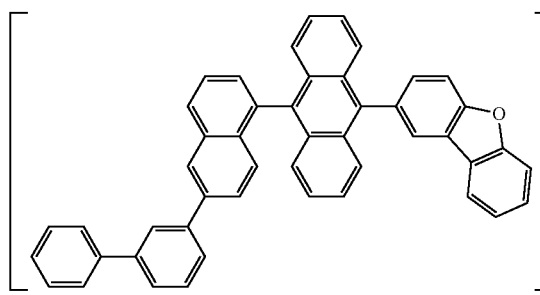
H-97
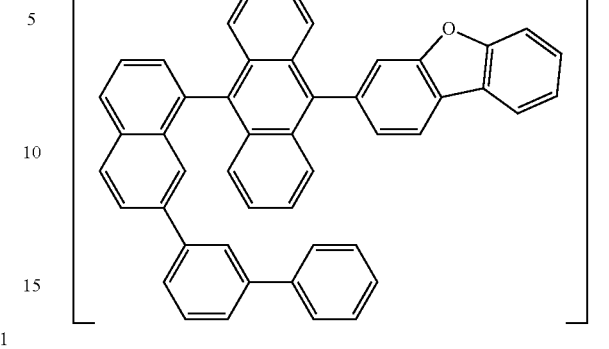
H-81
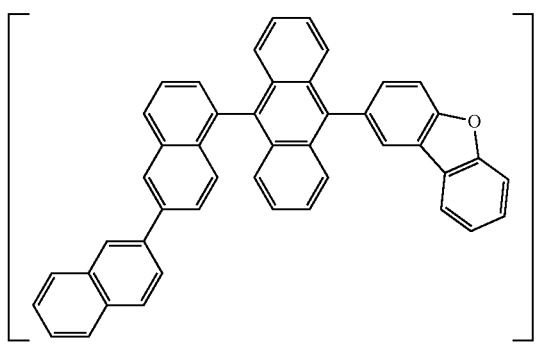
H-103
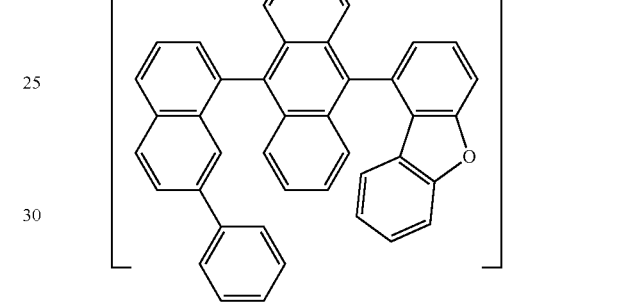
H-95
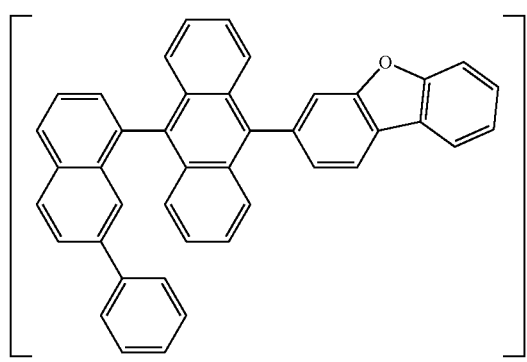
H-104
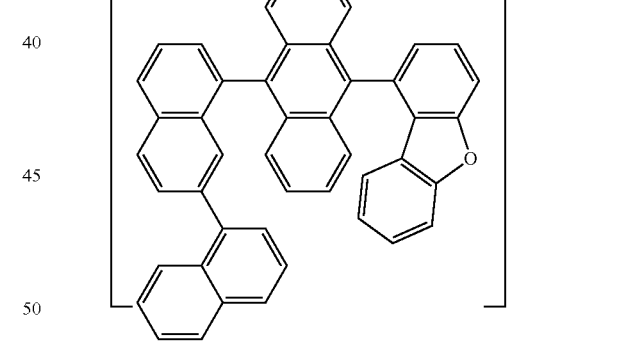
H-96
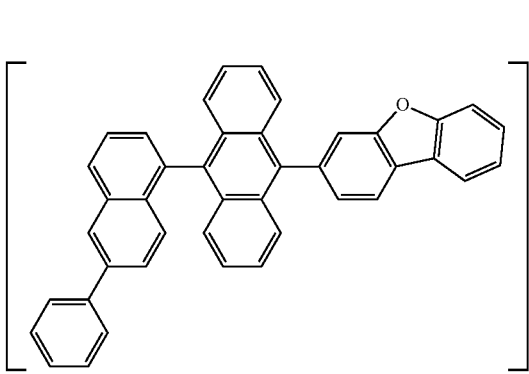
H-105
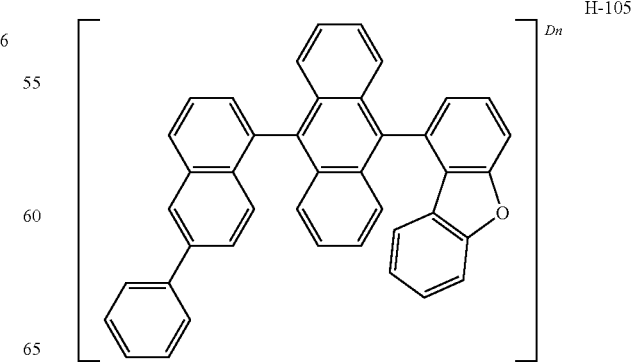

H-125 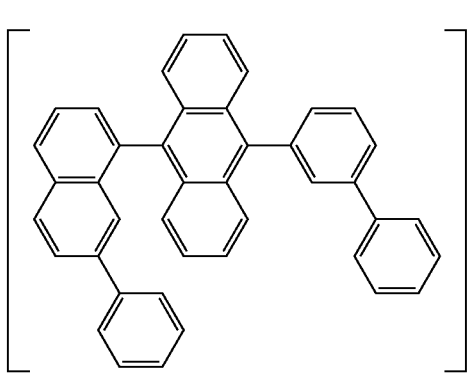
H-129 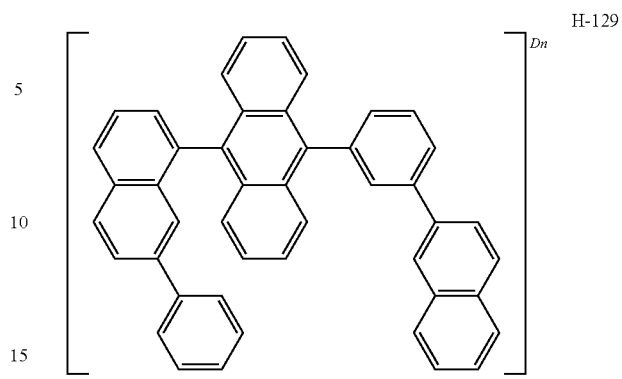
H-126 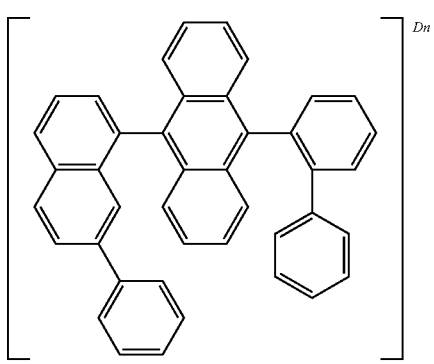
H-130 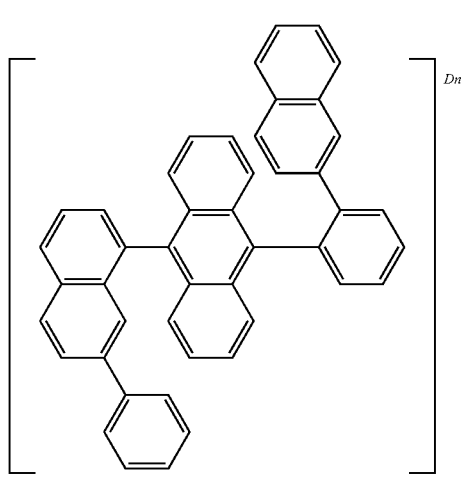
H-127 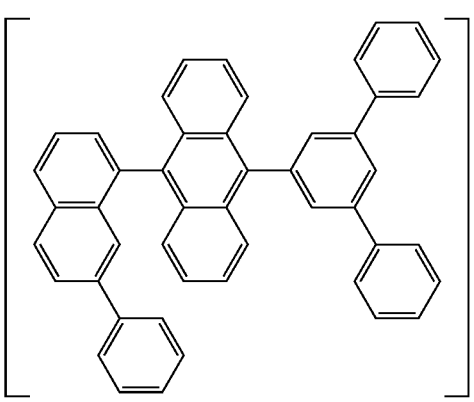
H-131 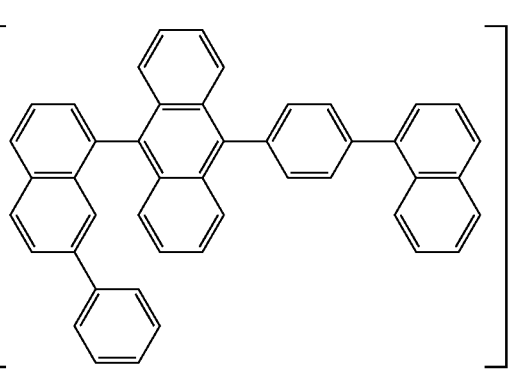
H-128 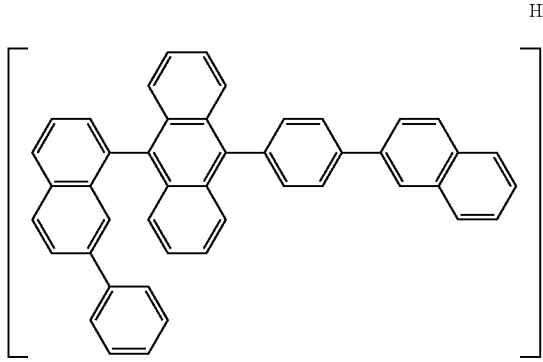
H-132 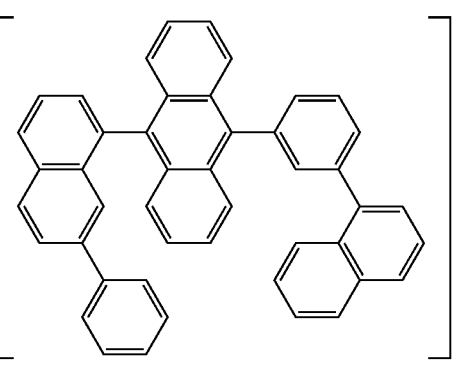

-continued
H-133
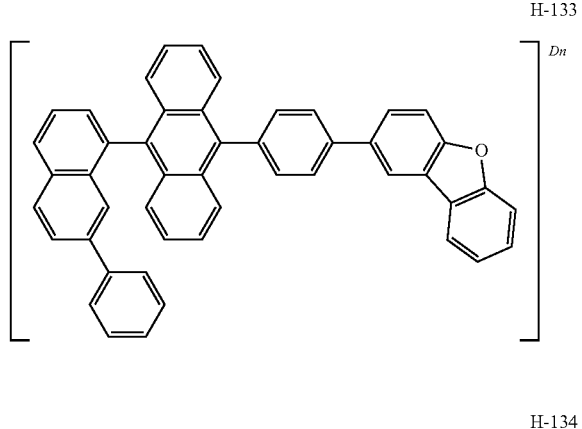
H-134
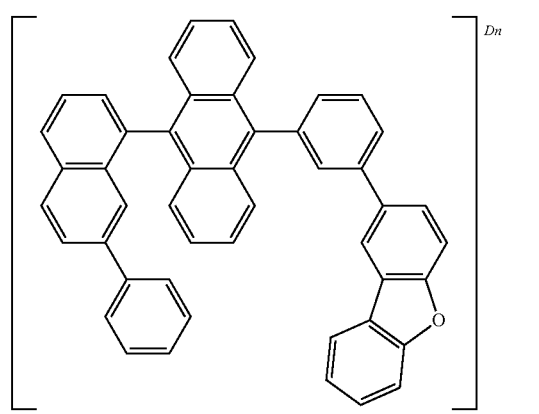
H-135
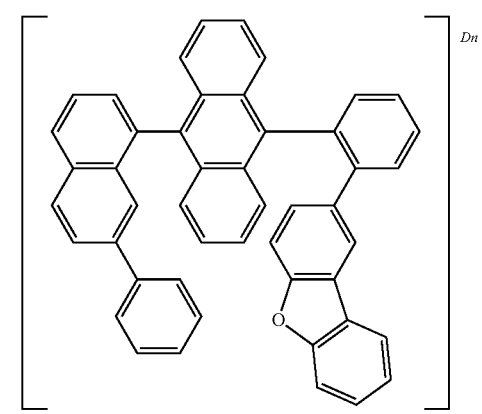
H-136
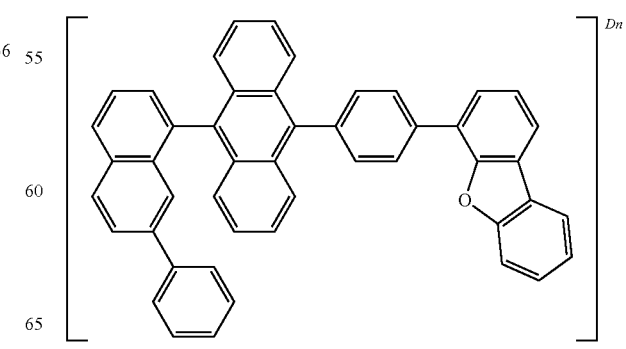
-continued
H-137
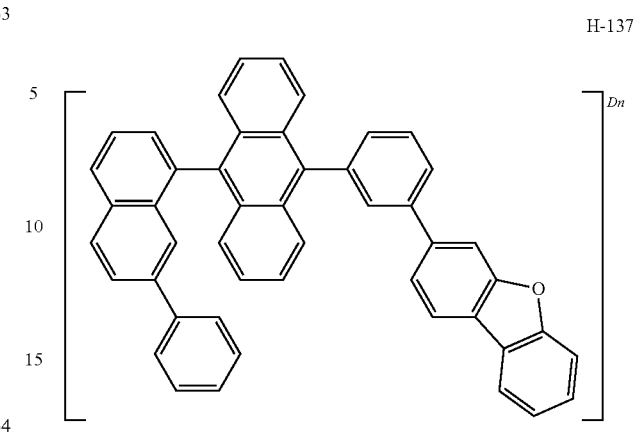
H-138
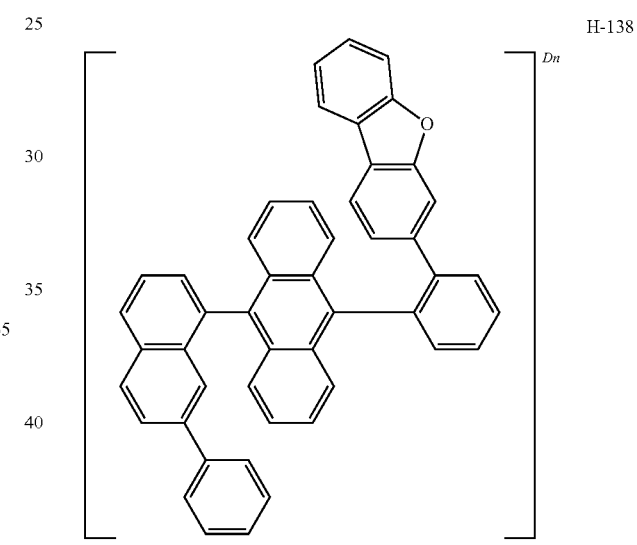
H-139

H-140
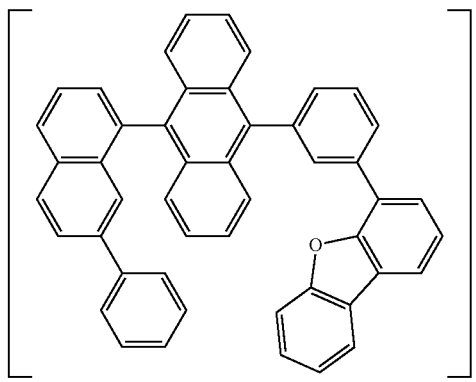
H-141
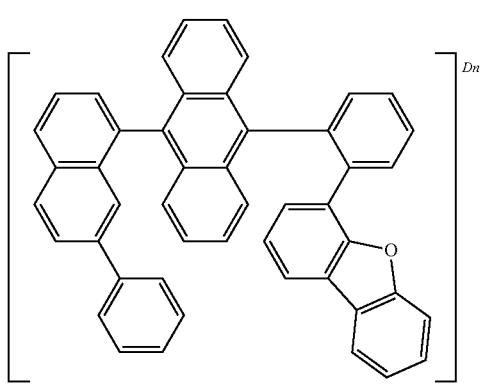
H-142
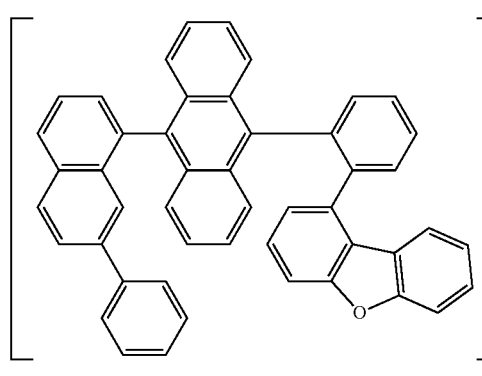
H-143
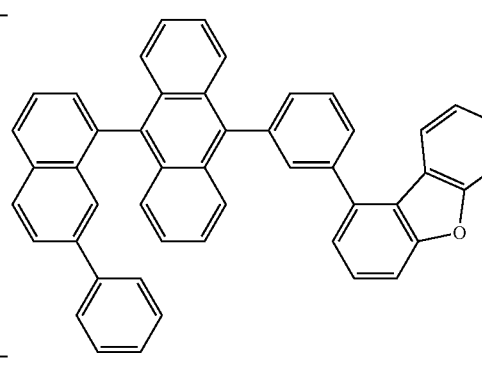
H-144
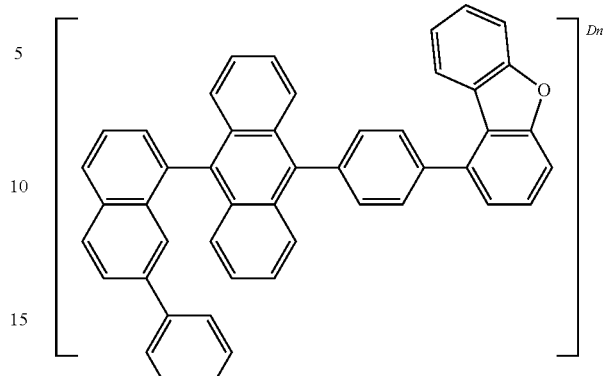
H-145
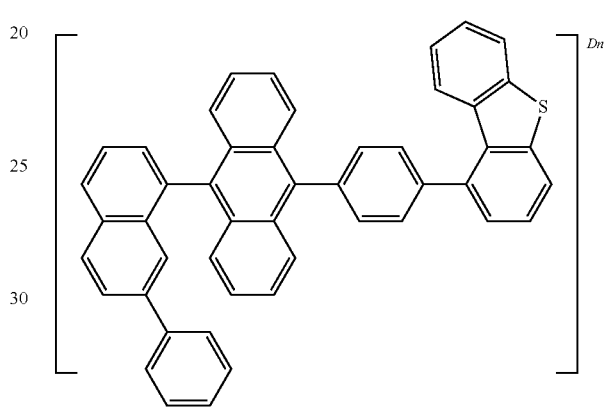
H-146
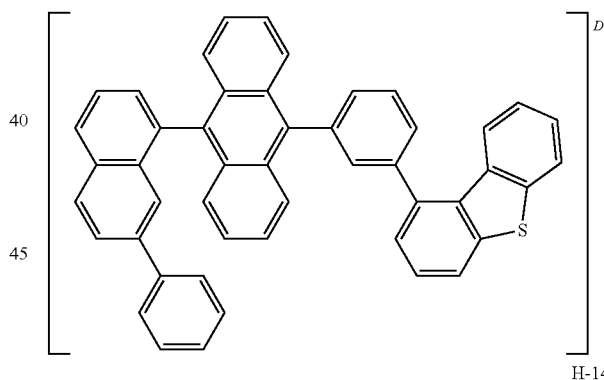
H-147
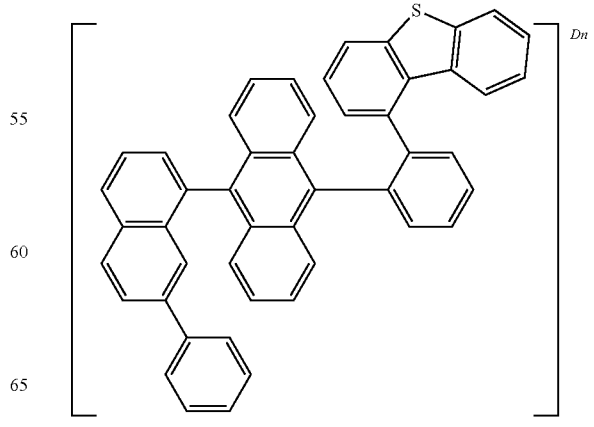

H-148
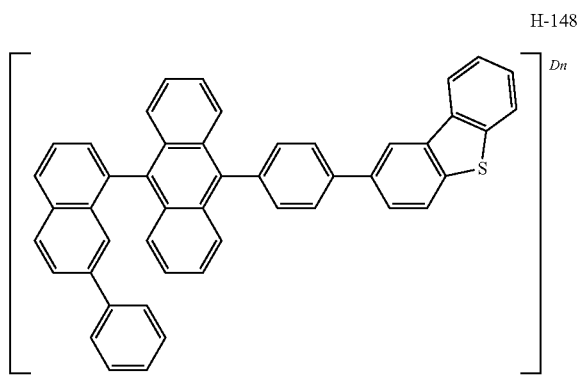
H-152
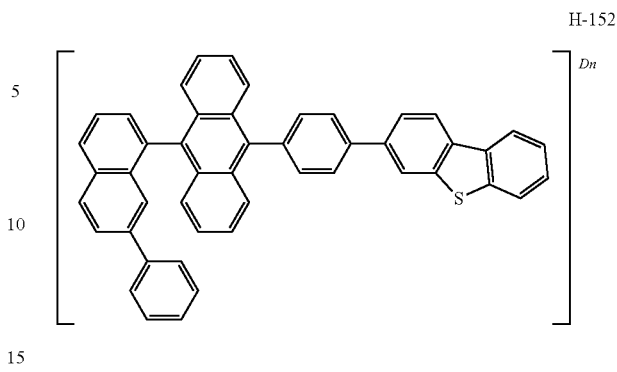
H-149
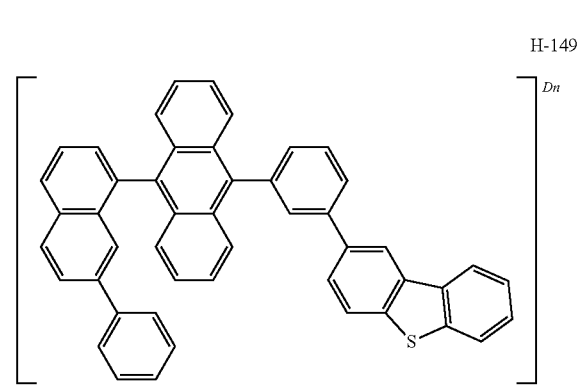
H-153
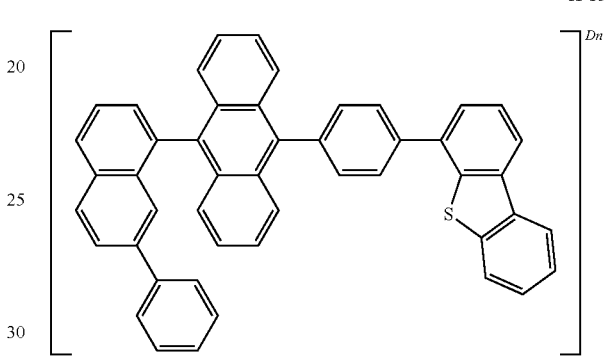
H-150
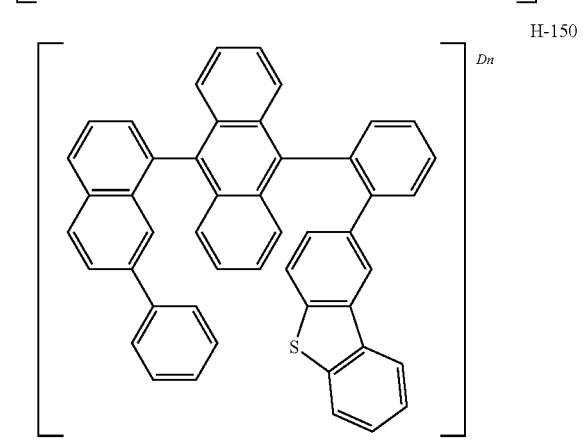
H-154
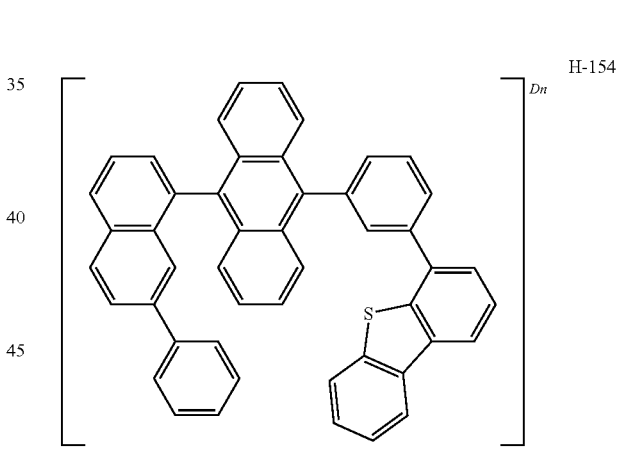
H-151
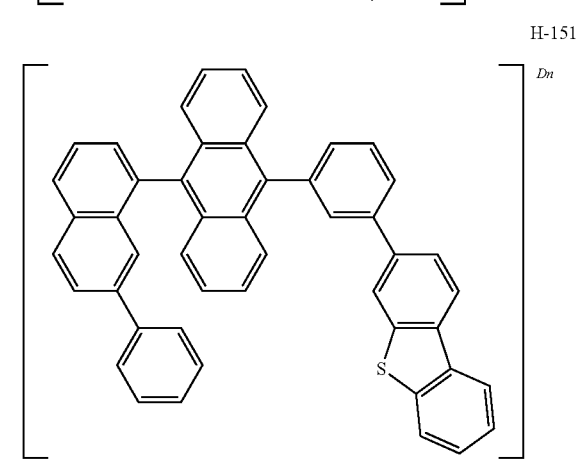
H-155
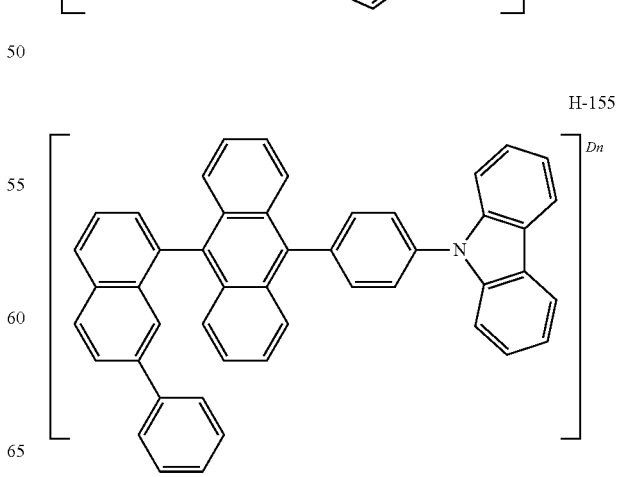

H-156
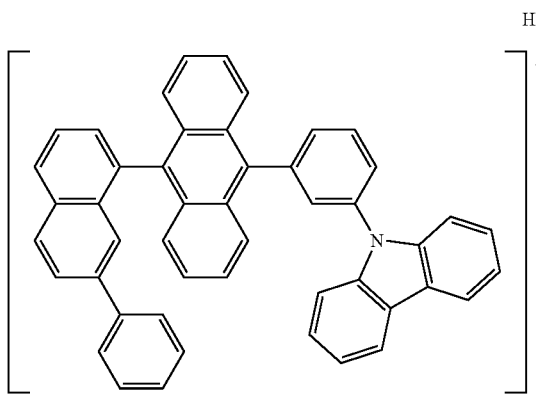
H-157
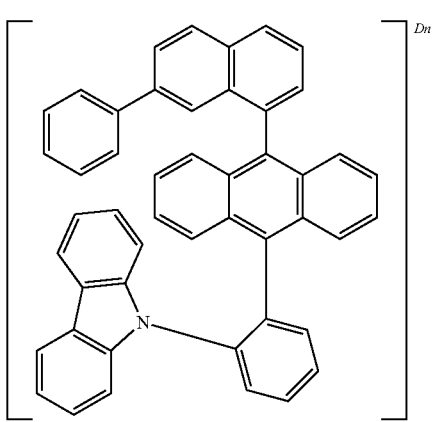
H-158
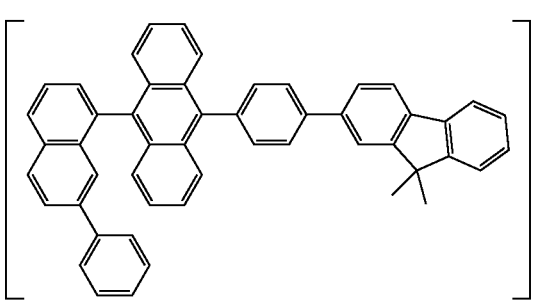
H-159
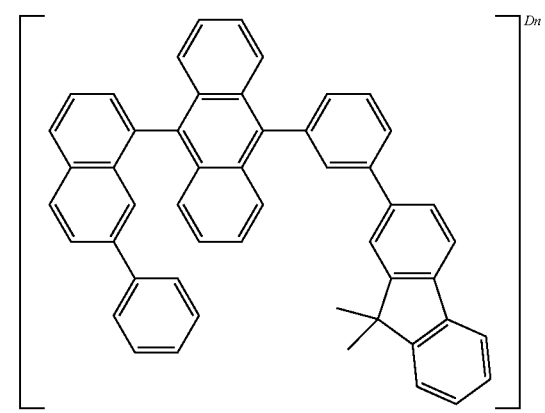
H-160
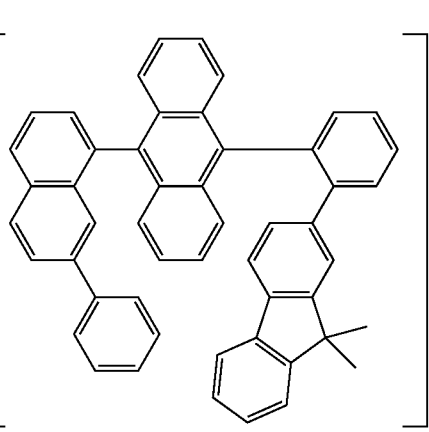
H-161
H-162
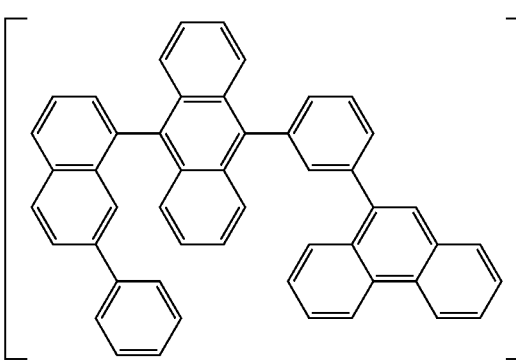
H-163
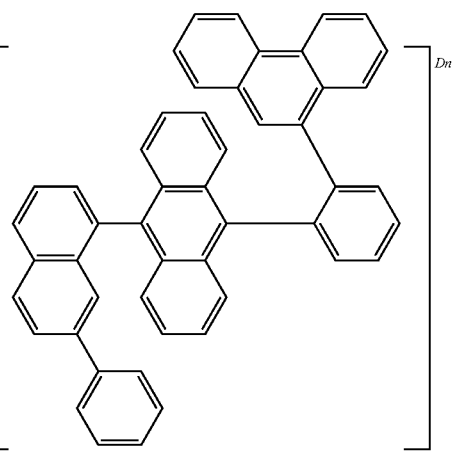

H-164
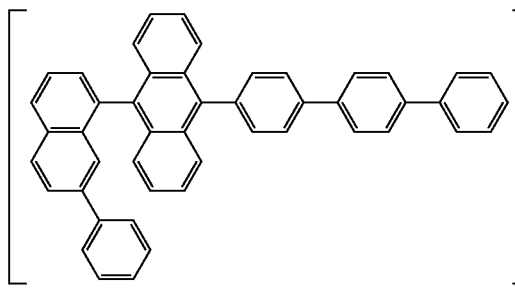
H-165
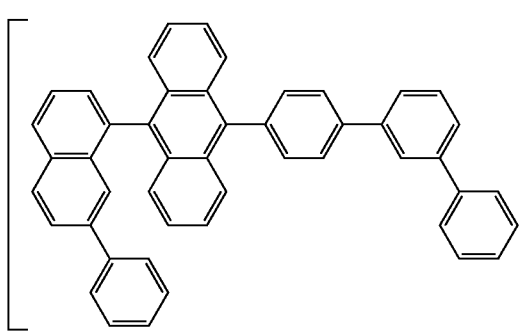
H-166
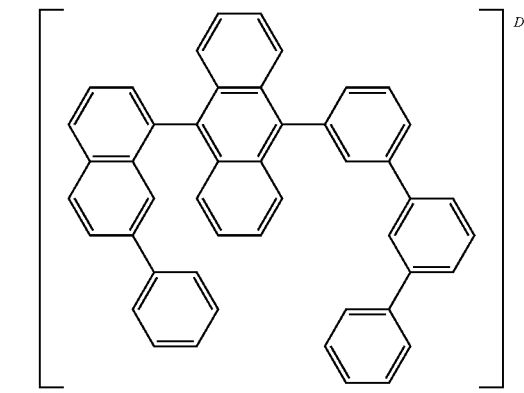
H-167
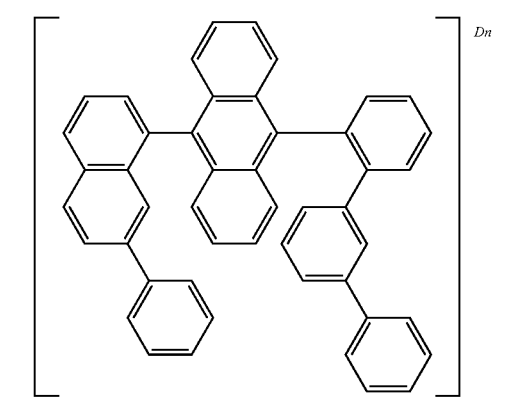
H-168
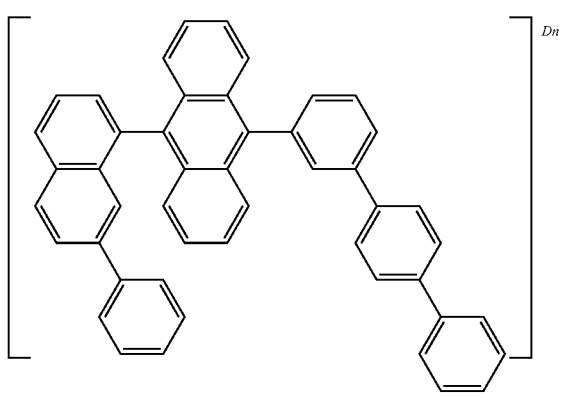
H-169
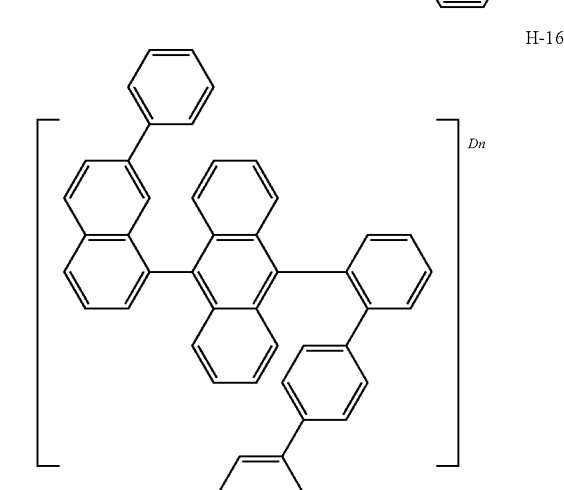
H-170
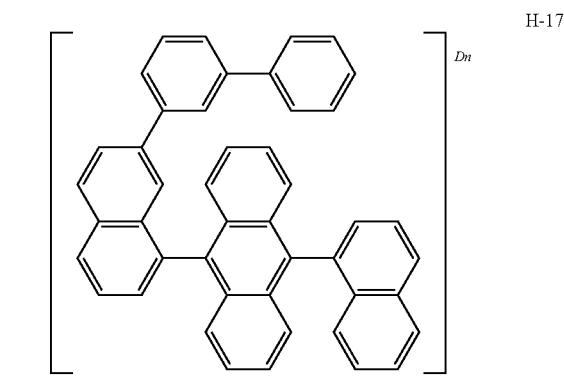
H-171
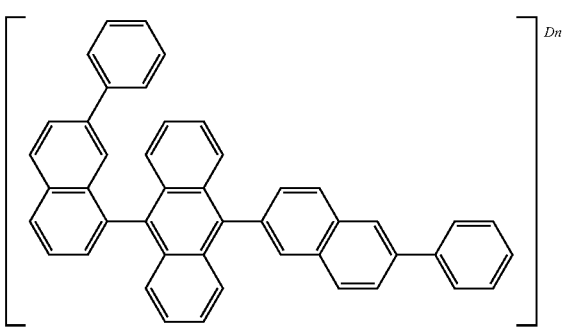

H-172
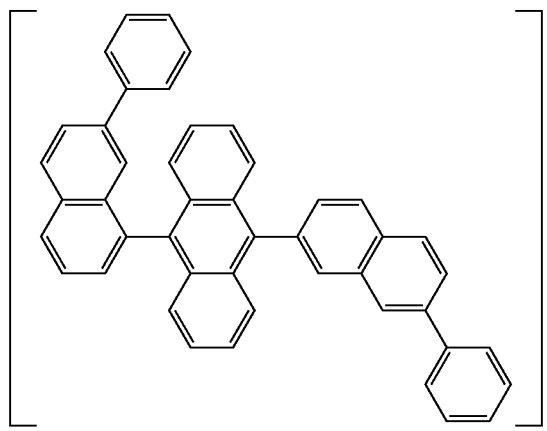
H-173
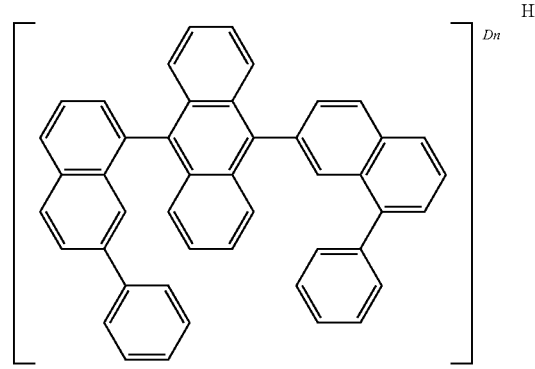
H-174
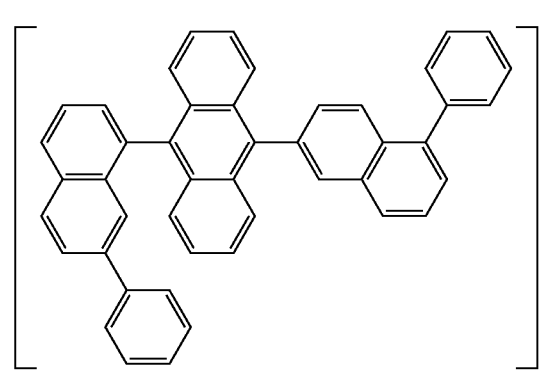
H-175
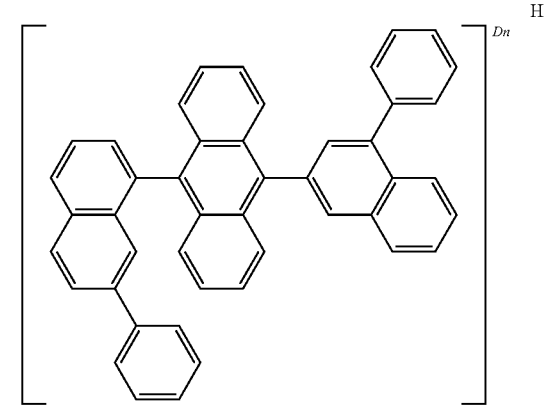
H-176
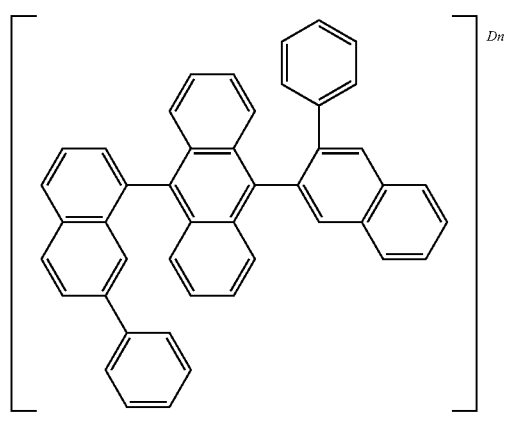
H-177
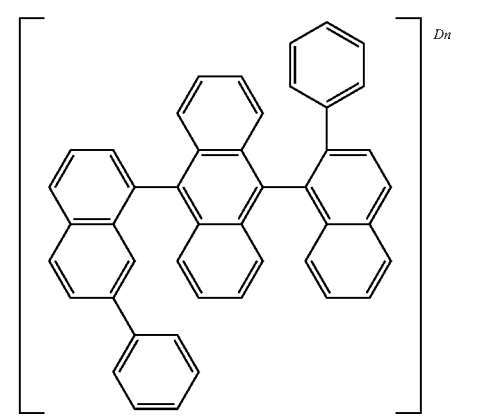
H-178
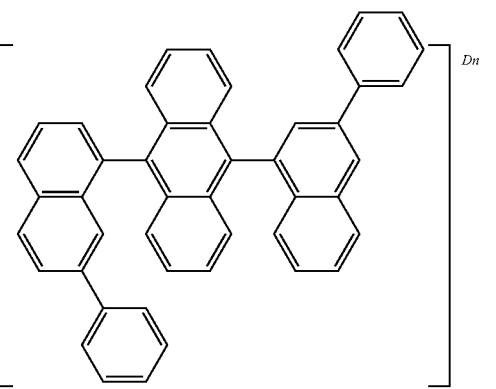
H-179
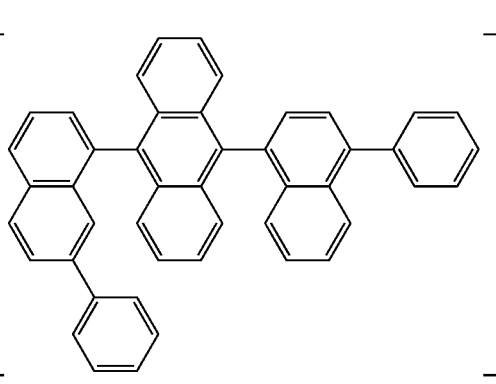

H-180
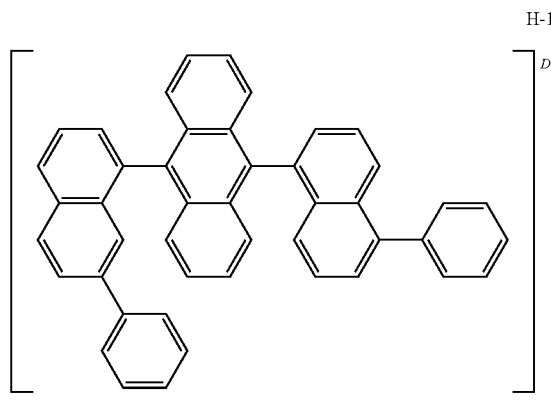
H-184
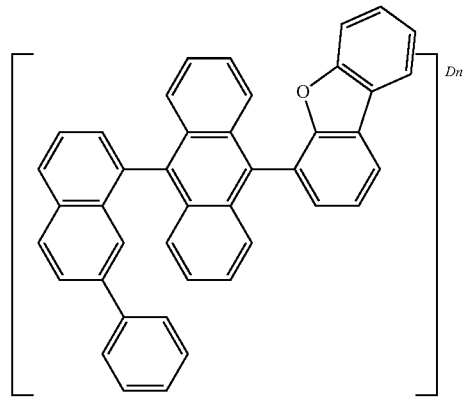
H-181
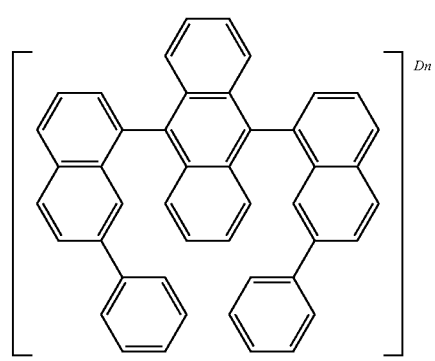
H-185
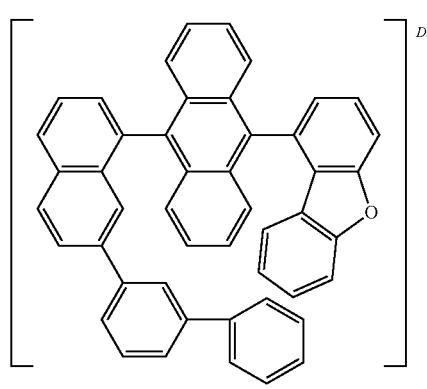
H-182
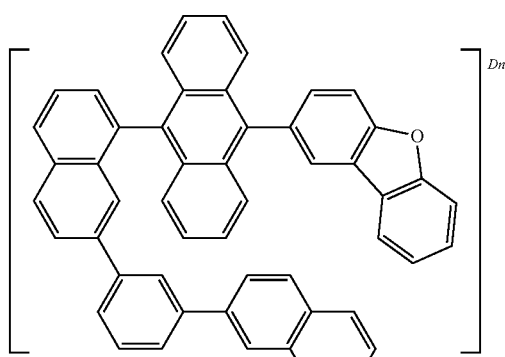
H-186
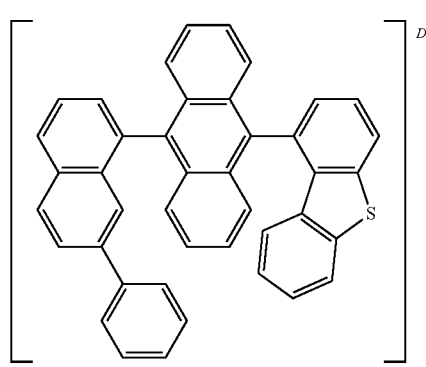
H-183
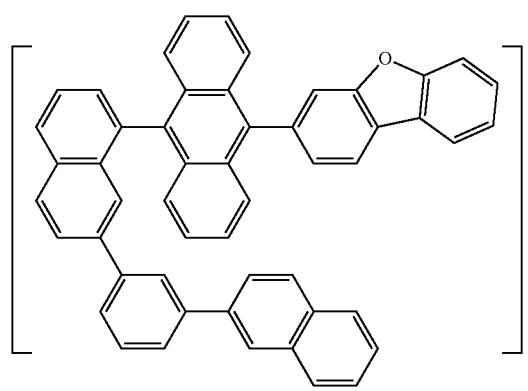
H-187
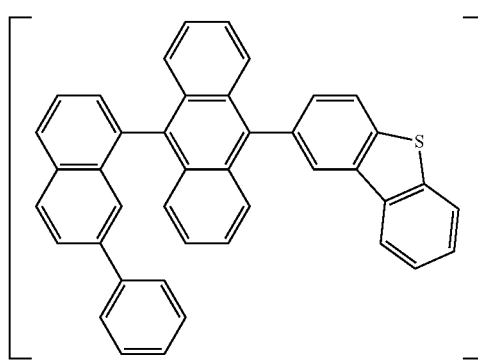

H-188
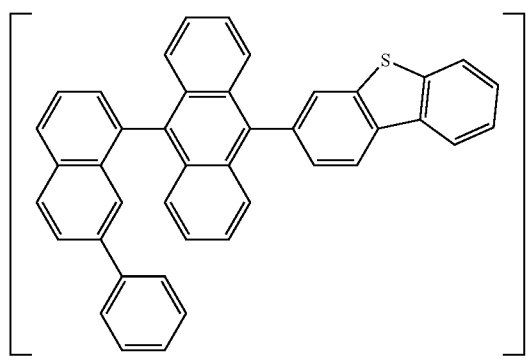
H-192
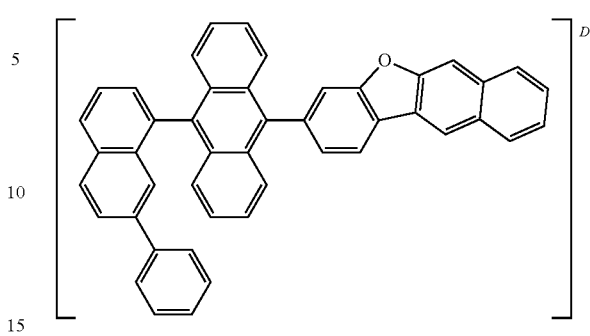
H-189
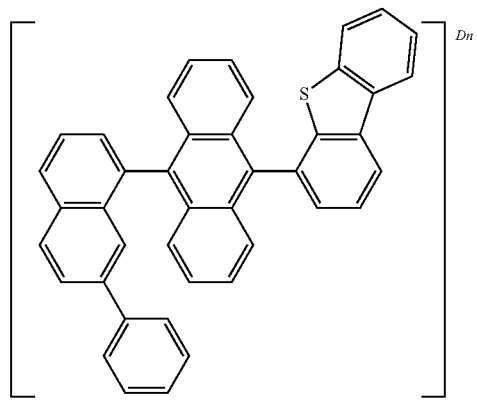
H-193
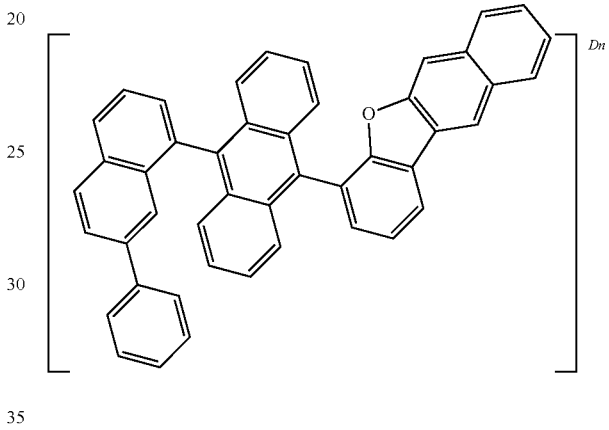
H-190
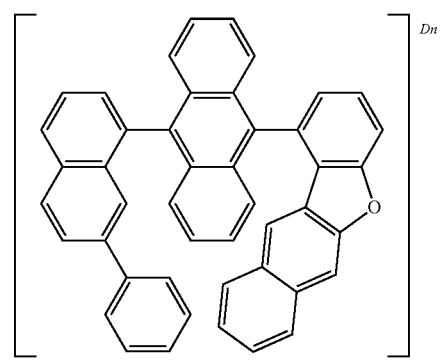
H-194
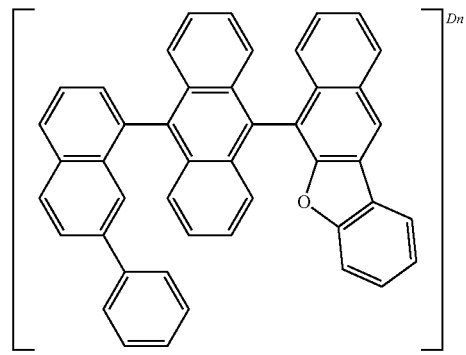
H-191
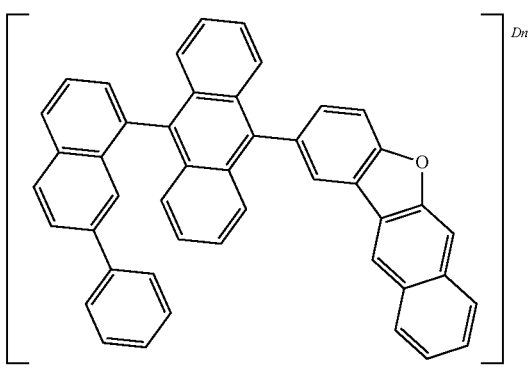
H-195
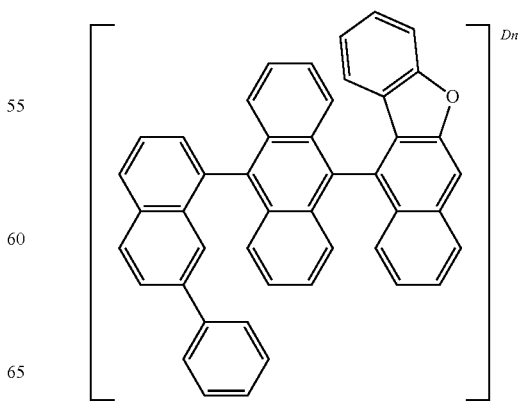

H-196
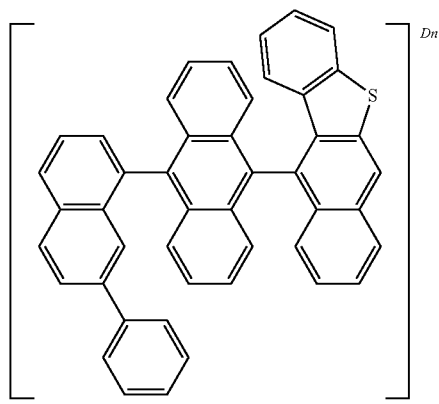
H-200
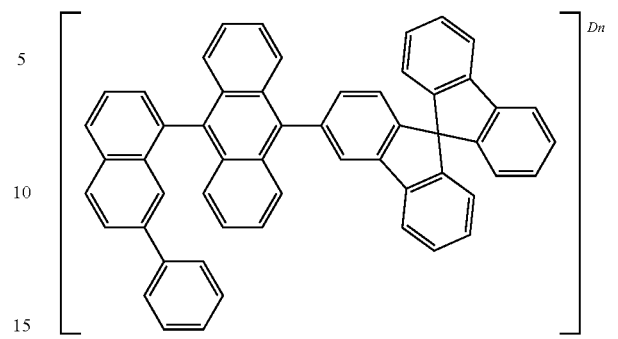
H-197
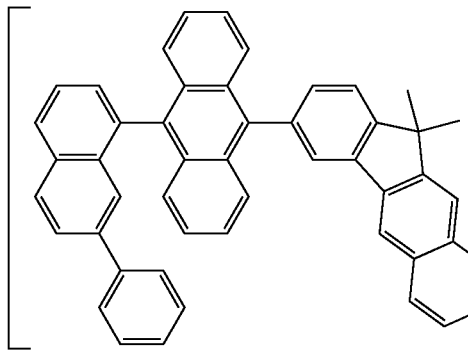
H-201
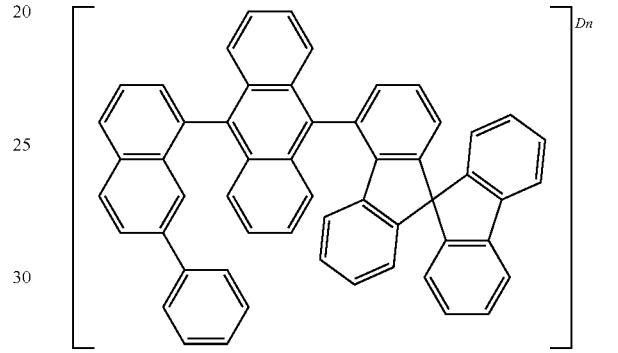
H-198
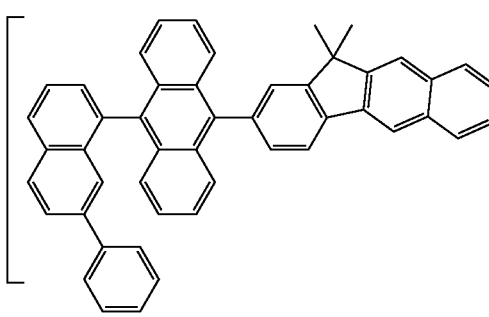
H-202
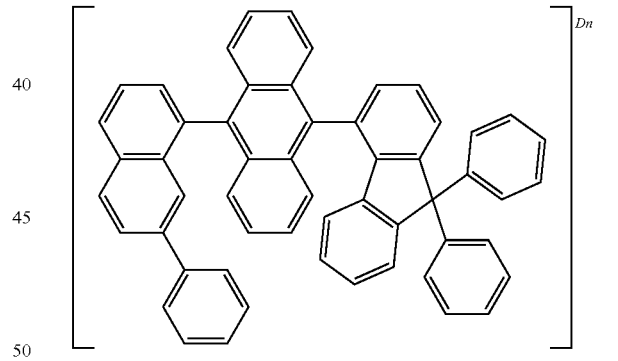
H-199
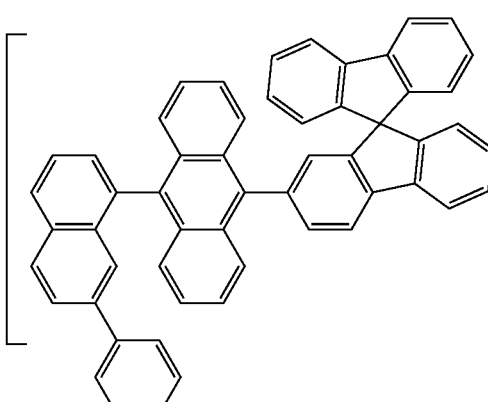
H-203
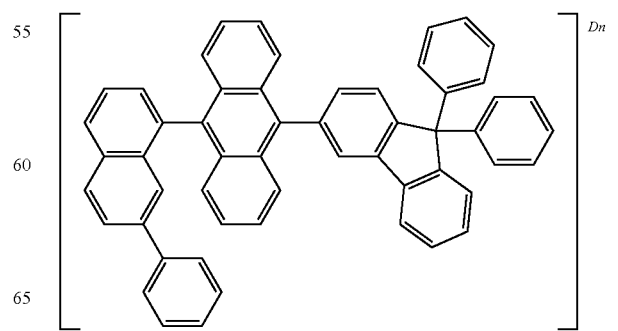

H-204
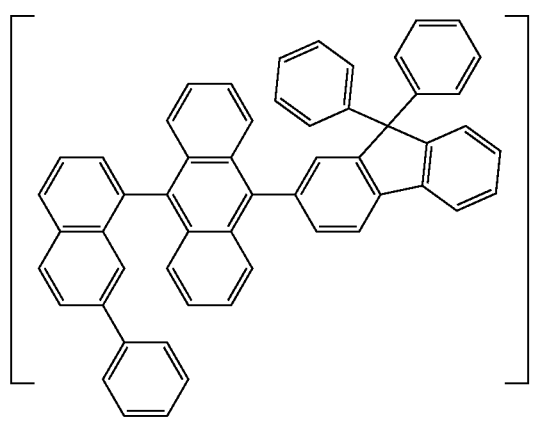
H-205
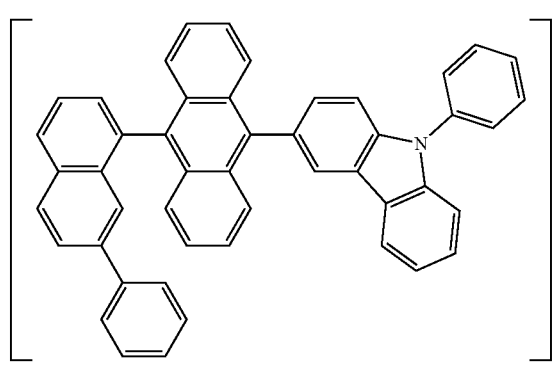
H-206
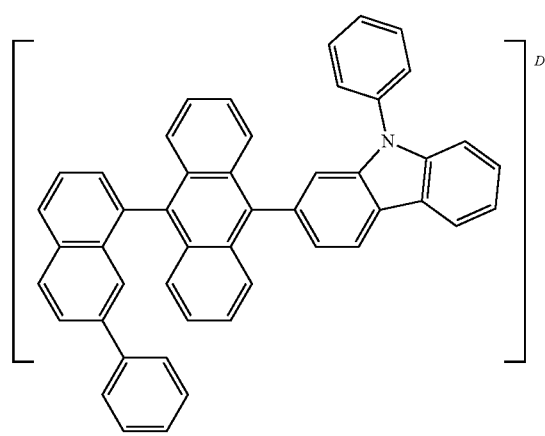
H-207
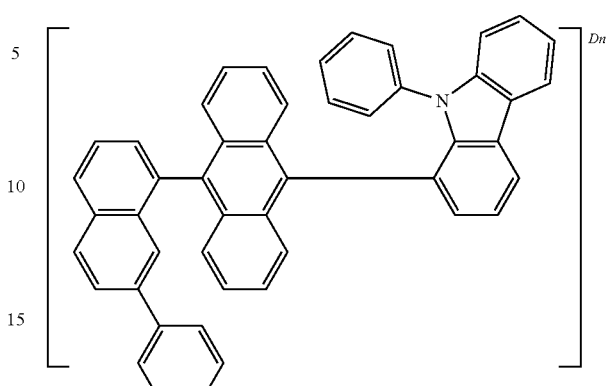
H-208
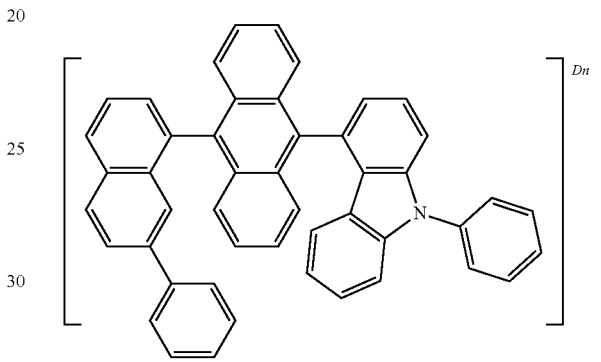
H-209
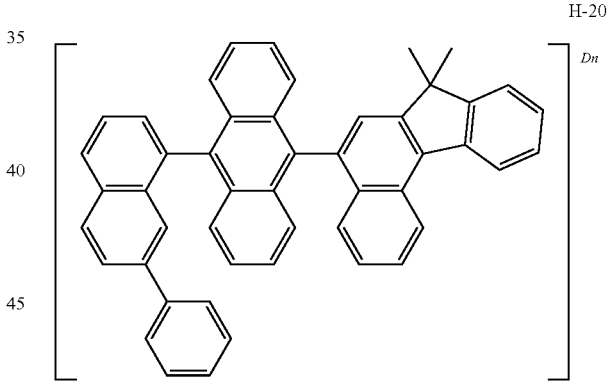
H-210
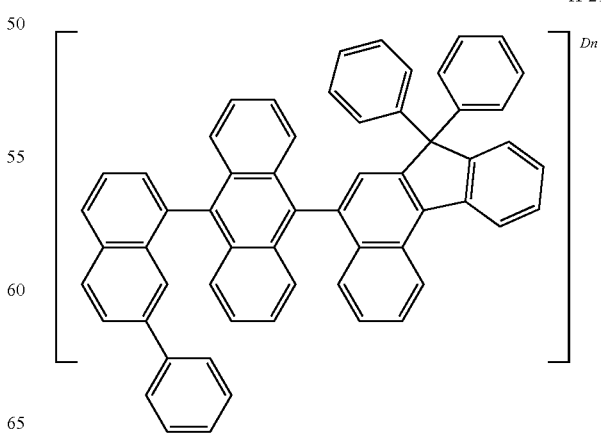

H-211
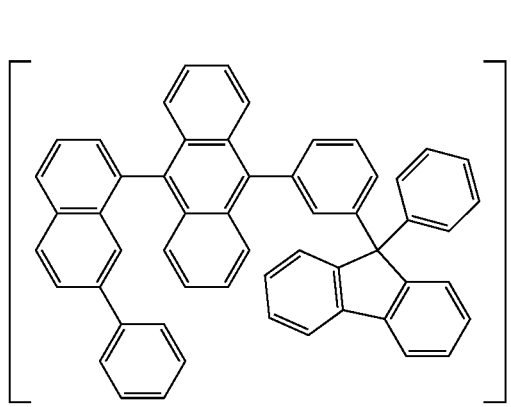
H-215
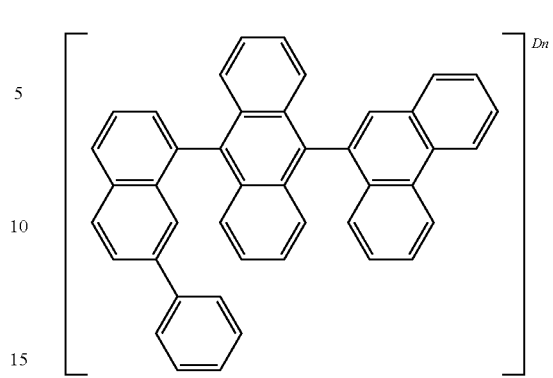
H-212
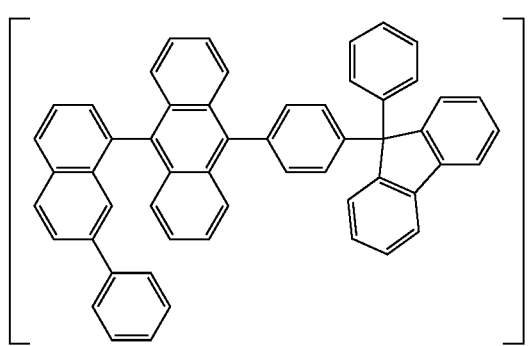
H-216
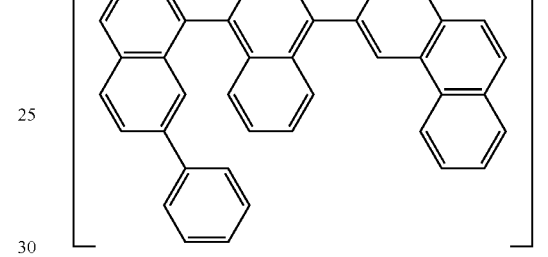
H-213
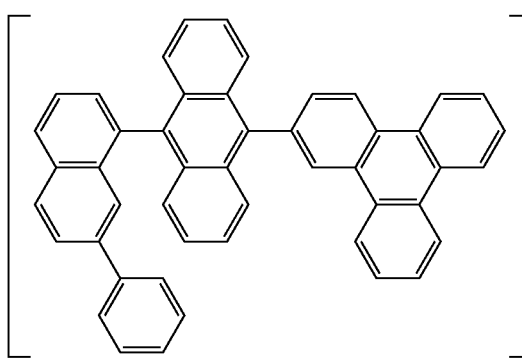
H-217
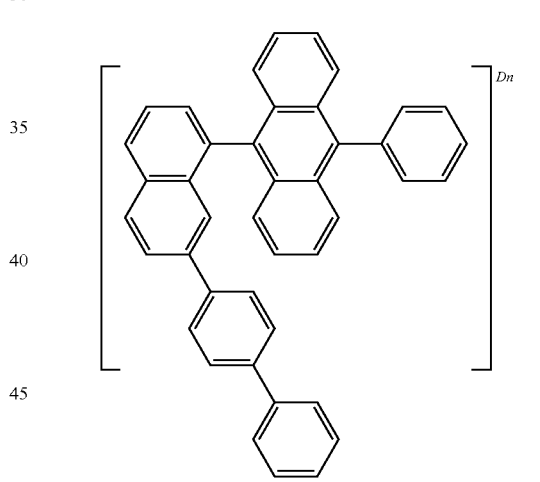
H-214
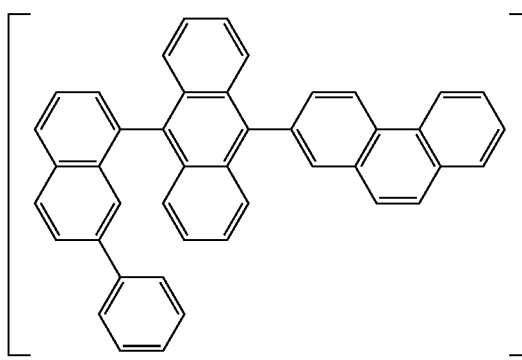
H-218
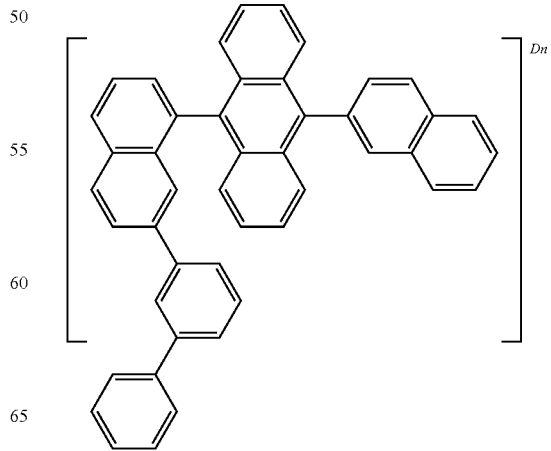

H-219
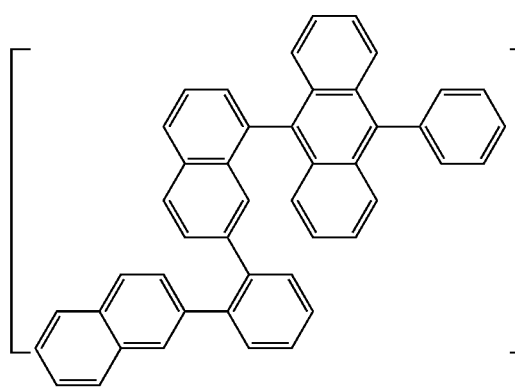
H-220
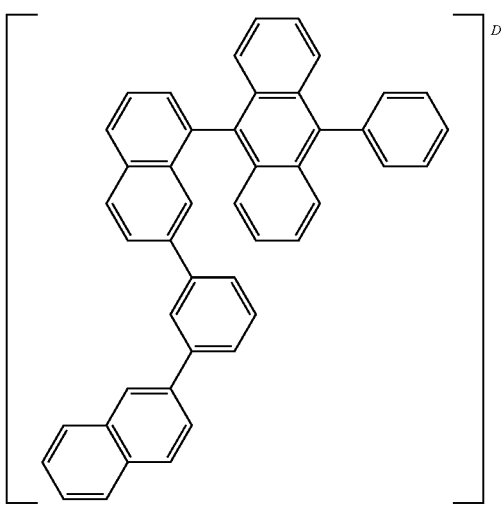
H-221
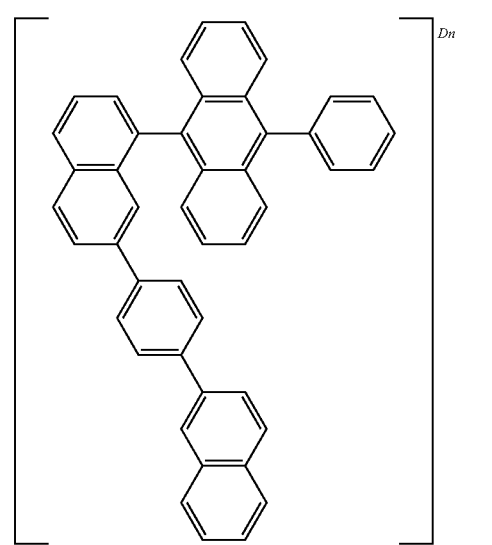
H-222
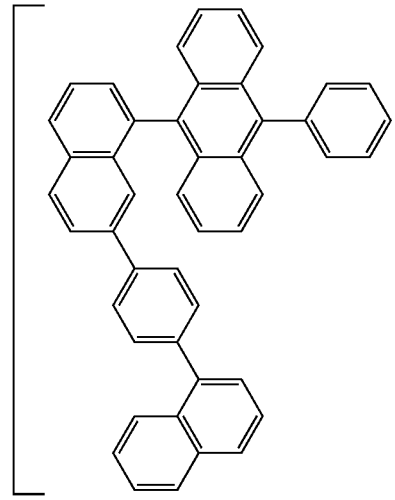
H-223
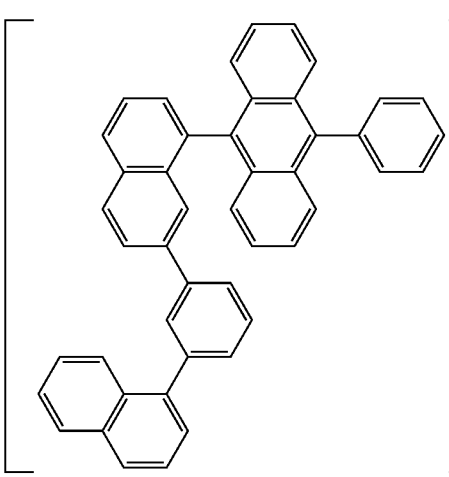
H-224

H-225
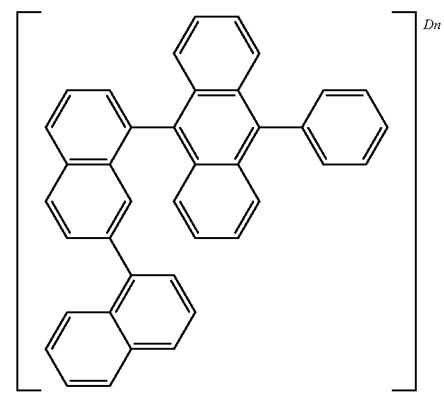
H-226
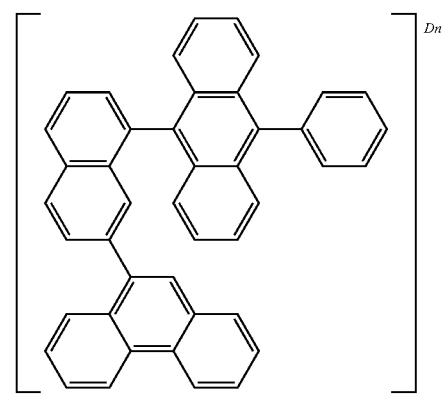
H-227
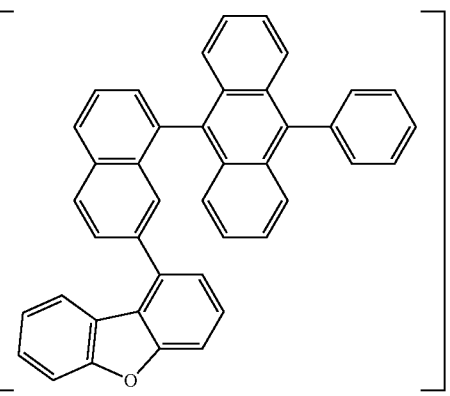
H-228
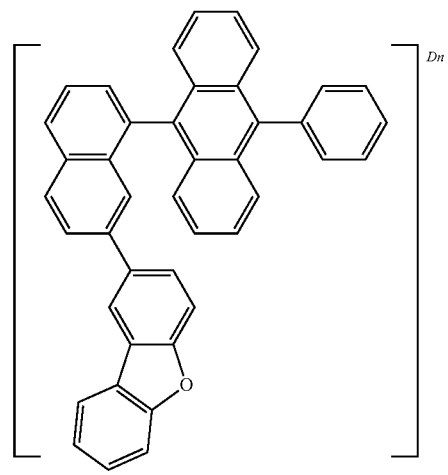
H-229
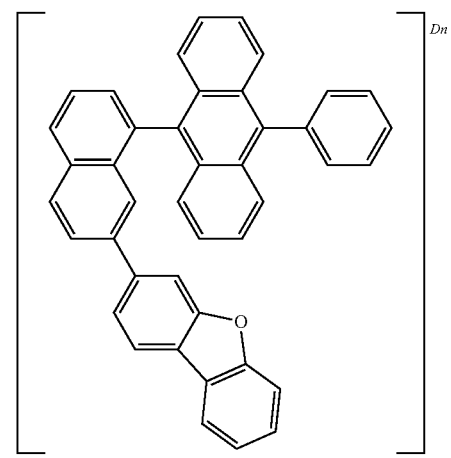
H-230
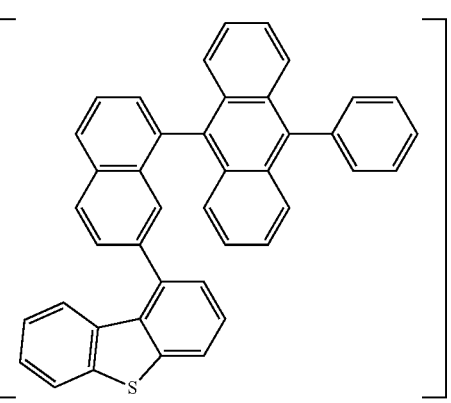
H-231
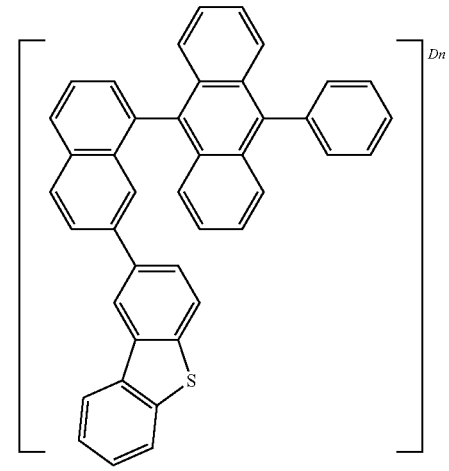
H-232
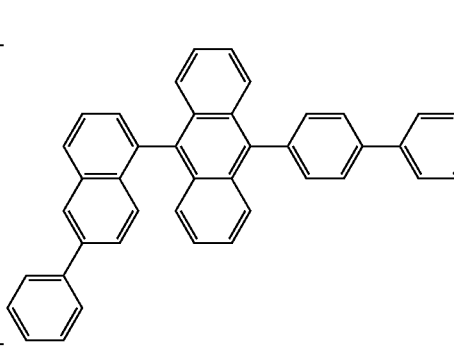

H-233
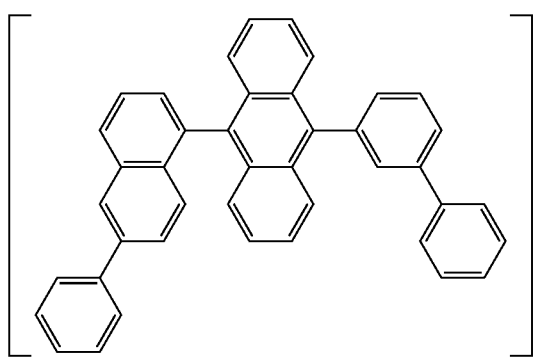
H-237
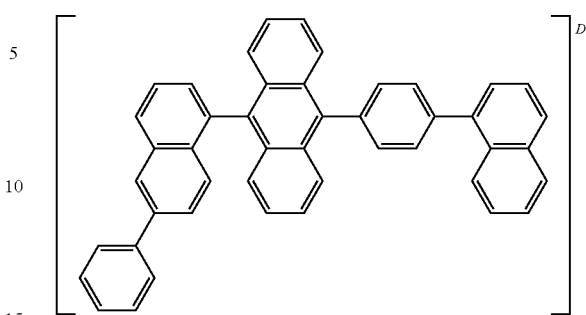
H-234
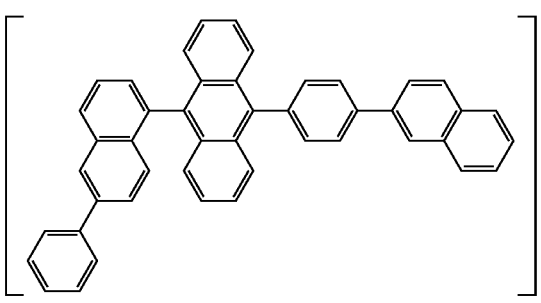
H-238
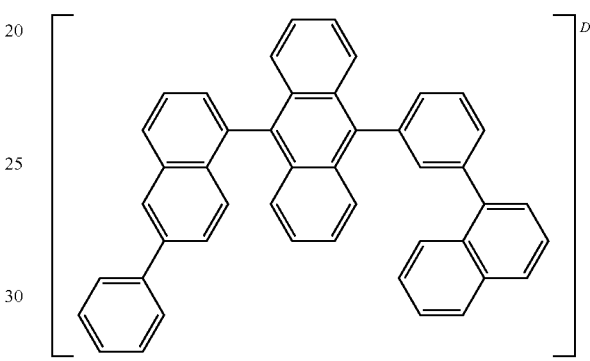
H-235
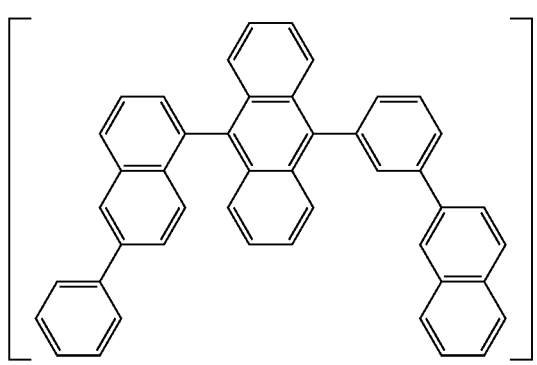
H-239
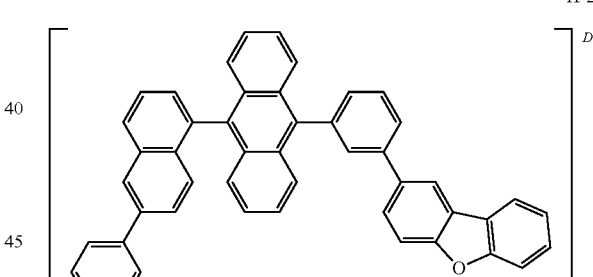
H-236
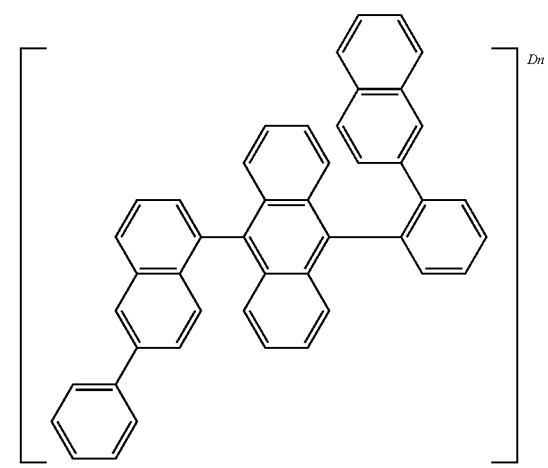
H-240
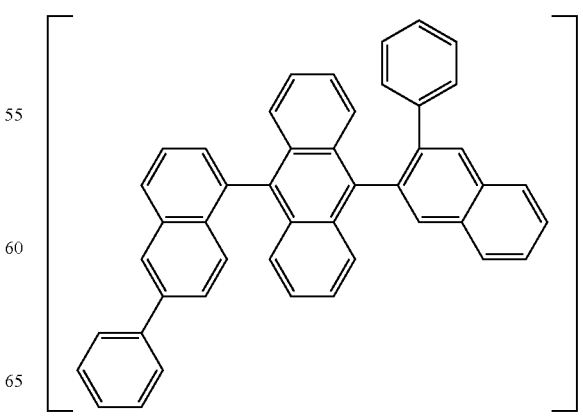

H-241
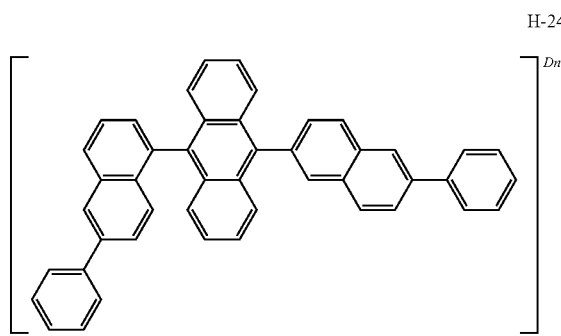
H-242
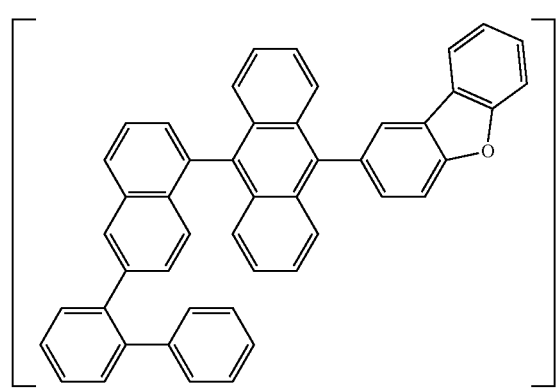
H-243
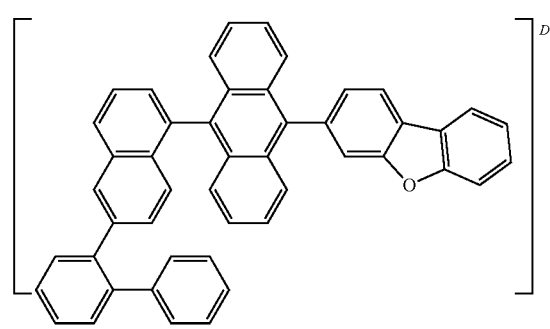
H-244
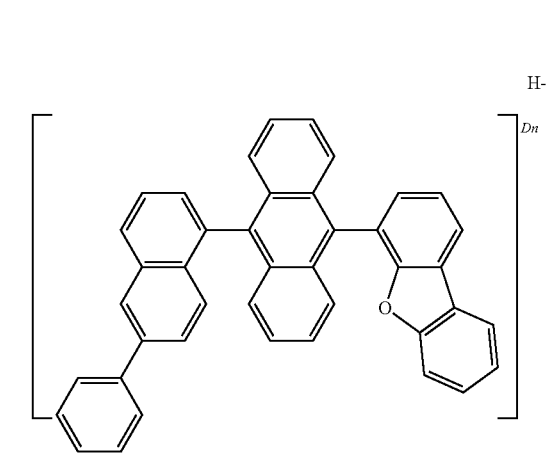
H-245
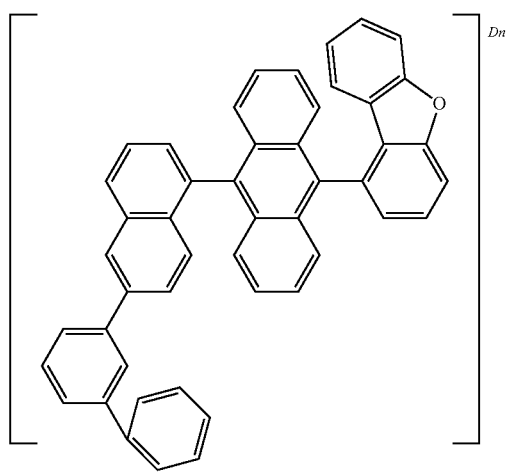
H-246
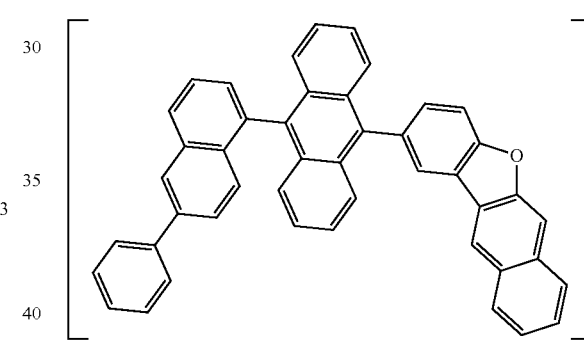
H-247
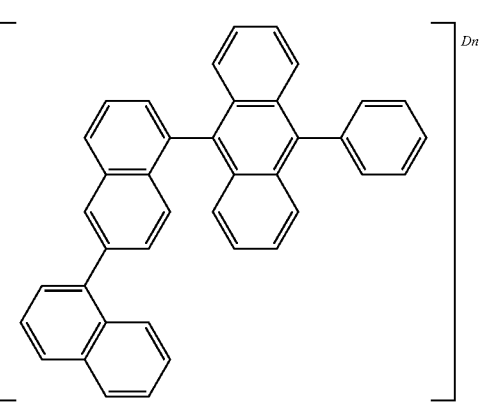

H-248
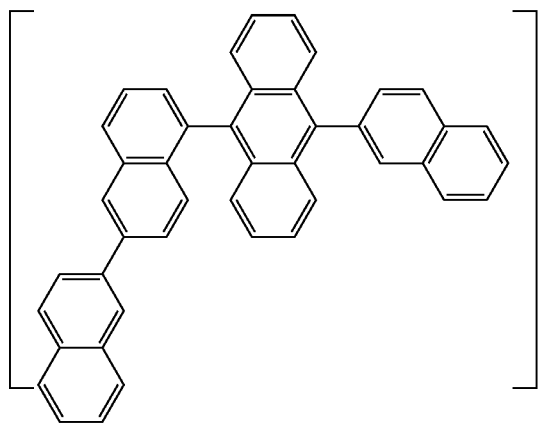
H-249
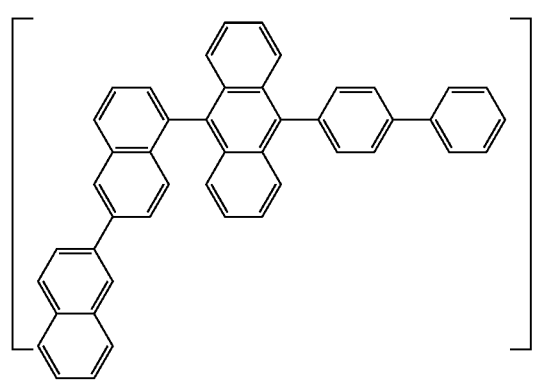
H-250
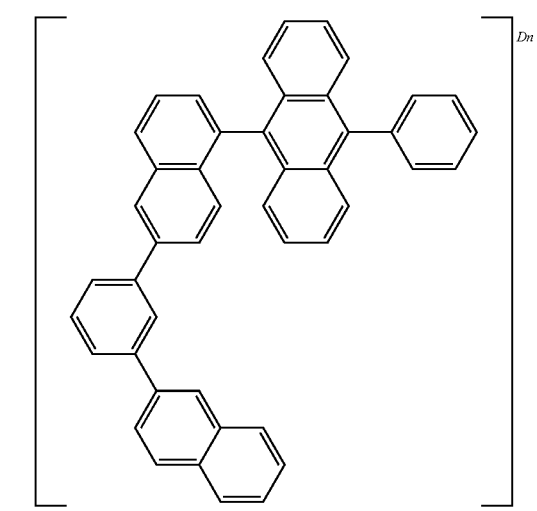
H-251
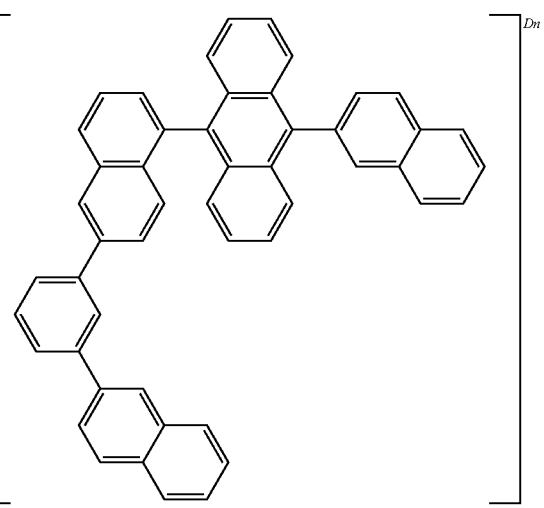
H-252
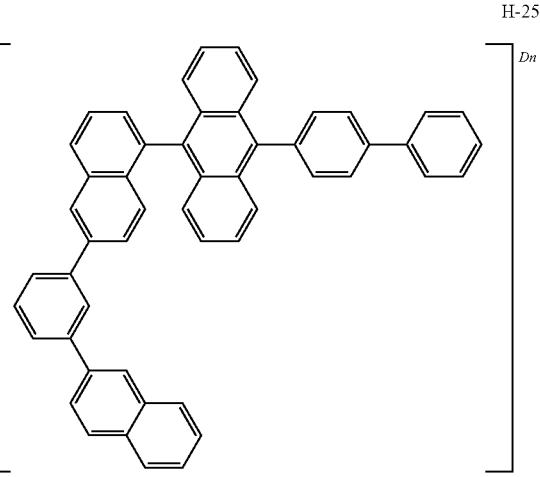
H-253
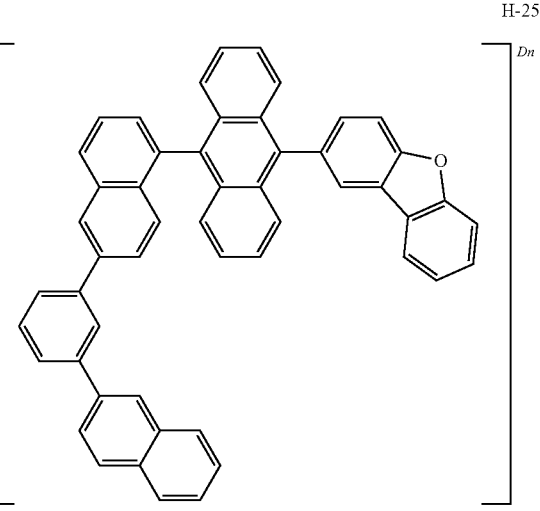

H-254
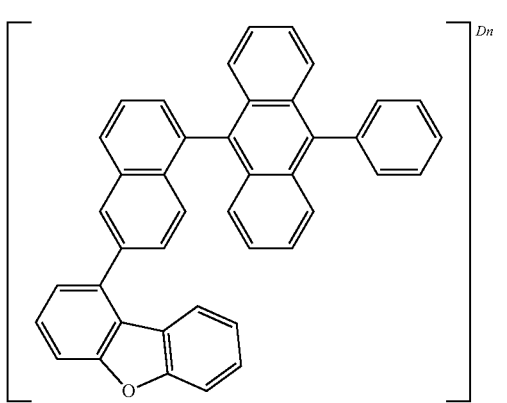
H-255
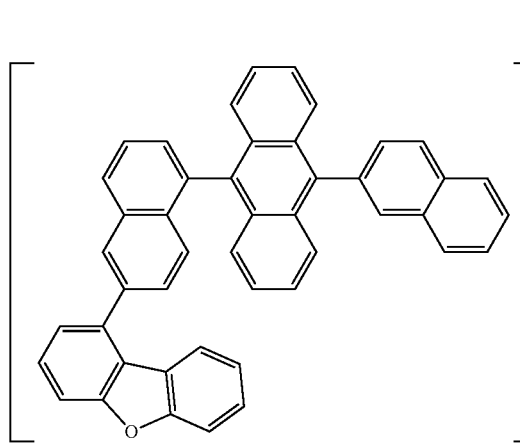
H-256
H-257
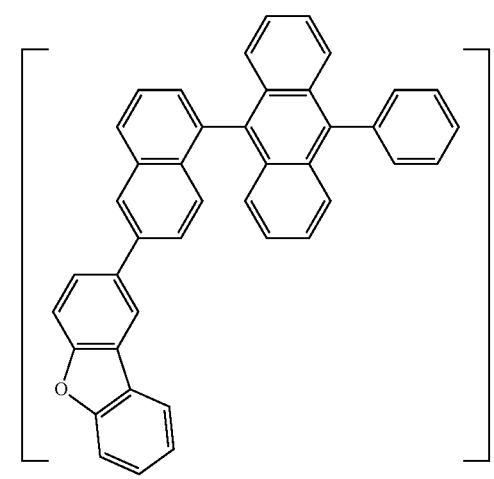
H-258
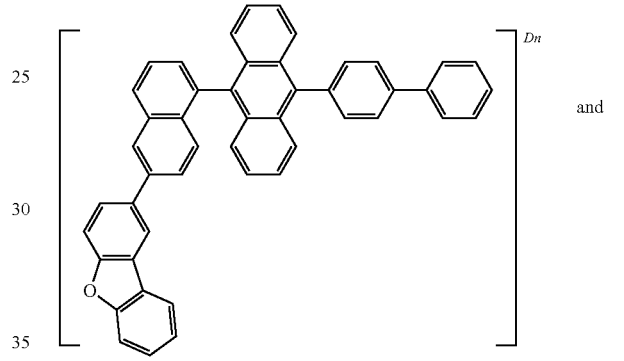
and
H-259
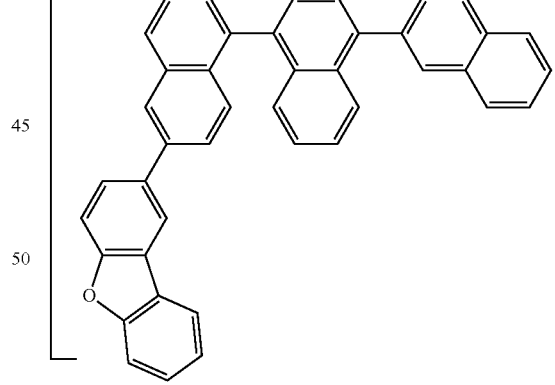
17. An organic electroluminescent device comprising the organic electroluminescent compound according to claim 14.
18. The organic electroluminescent device according to claim 17, wherein the organic electroluminescent compound is comprised in a light-emitting layer.
* * * * *